US009923147B2

(12) United States Patent
Kim et al.

(10) Patent No.: US 9,923,147 B2
(45) Date of Patent: Mar. 20, 2018

(54) ORGANIC LIGHT EMITTING DEVICE

(71) Applicant: Samsung Display Co., Ltd., Yongin-si, Gyeonggi-do (KR)

(72) Inventors: Haejin Kim, Yongin-si (KR); Mieun Jun, Yongin-si (KR); Youngkook Kim, Yongin-si (KR); Seokhwan Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 43 days.

(21) Appl. No.: 15/141,712

(22) Filed: Apr. 28, 2016

(65) Prior Publication Data

US 2016/0329501 A1 Nov. 10, 2016

(30) Foreign Application Priority Data

Apr. 29, 2015 (KR) ........................ 10-2015-0060720

(51) Int. Cl.
*H01L 51/00* (2006.01)
*H01L 51/50* (2006.01)

(52) U.S. Cl.
CPC ...... *H01L 51/0061* (2013.01); *H01L 51/0073* (2013.01); *H01L 51/0058* (2013.01);
(Continued)

(58) Field of Classification Search
CPC ............. H01L 51/0061; H01L 51/0094; H01L 51/0058; H01L 51/0073; H01L 51/0074;
(Continued)

(56) References Cited

U.S. PATENT DOCUMENTS 7,053,255 B2 5/2006 Ikeda et al.
7,233,019 B2 6/2007 Ionkin et al.
(Continued)

FOREIGN PATENT DOCUMENTS

KR 10-2005-0019907 A 3/2005
KR 10-2006-0006760 A 1/2006
(Continued)

*Primary Examiner* — Michael M Bernshteyn
(74) *Attorney, Agent, or Firm* — Lewis Roca Rothgerber Christie LLP

(57) ABSTRACT

An organic light-emitting device includes: a first electrode; a second electrode facing the first electrode; and an organic layer between the first electrode and the second electrode, the organic layer including an emission layer, wherein the organic layer includes: a condensed cyclic compound represented by Formula 1; and at least one selected from a first compound represented by Formula 11, a second compound represented by Formula 12, and a third compound represented by Formula 13:

Formula 1

(Continued)

-continued

Formula 2

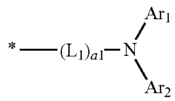

Formula 11

$$R_{301}—L_{301}—An_1—(L_{310})_{xb1}—An_2—L_{302}—R_{302}$$

Formula 12

$$R_{303}—L_{303}—An_3—L_{304}—R_{304}$$

Formula 13

$$Ar_{311}—\left[(L_{311})_{xb11}—R_{311}\right]_{xb20}.$$

22 Claims, 1 Drawing Sheet

(52) U.S. Cl.
CPC ...... *H01L 51/0074* (2013.01); *H01L 51/0081* (2013.01); *H01L 51/5012* (2013.01); *H01L 51/5056* (2013.01); *H01L 2251/308* (2013.01)

(58) Field of Classification Search
CPC ............ H01L 51/0081; H01L 51/5115; H01L 51/5056; H01L 2251/308
USPC ........................................................ 428/690
See application file for complete search history.

(56) References Cited

U.S. PATENT DOCUMENTS

2005/0064233 A1 3/2005 Matsuura et al.
2005/0156164 A1 7/2005 Sotoyama
2011/0006289 A1 1/2011 Mizuki et al.
2012/0181520 A1* 7/2012 Kim ..................... C07B 59/001 257/40
2013/0009137 A1* 1/2013 Brown .................... C08L 65/00 257/40
2013/0306958 A1 11/2013 Ito et al.

FOREIGN PATENT DOCUMENTS

KR 10-2010-0097182 A 9/2010
KR 10-2012-0135501 A 12/2012
KR 10-2013-0040133 A 4/2013
KR 10-2016-0041156 A 4/2016
WO WO 2012045710 A1 * 4/2012 ........... C07D 307/77
WO WO 2012/070226 A1 5/2012
WO WO 2013055132 A2 * 4/2013 ............ C09K 11/06

* cited by examiner

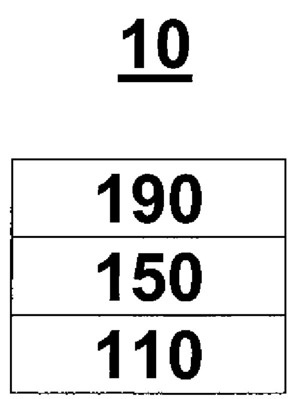
10
190
150
110

ORGANIC LIGHT EMITTING DEVICE

CROSS-REFERENCE TO RELATED APPLICATION

This application claims priority to and the benefit of Korean Patent Application No. 10-2015-0060720, filed on Apr. 29, 2015, in the Korean Intellectual Property Office, the entire content of which is incorporated herein by reference.

BACKGROUND

1. Field

One or more aspects of example embodiments of the present disclosure relate to an organic light-emitting device.

2. Description of the Related Art

Organic light-emitting devices (OLEDs) are self-emission devices that have wide viewing angles, high contrast ratios, and short response times. In addition, the OLEDs exhibit high luminance, driving voltage, and response speed characteristics, and produce full-color images.

An OLED may include a first electrode positioned on a substrate, and a hole transport region, an emission layer, an electron transport region, and a second electrode, which are sequentially positioned on the first electrode. Holes provided from the first electrode may move toward the emission layer through the hole transport region, and electrons provided from the second electrode may move toward the emission layer through the electron transport region. The holes and the electrons are recombined in the emission layer to produce excitons. These excitons change from an excited state to a ground state to thereby generate light.

SUMMARY

One or more aspects of example embodiments of the present disclosure are directed toward an organic light-emitting device having a low-driving voltage, high efficiency, high luminance, and long lifespan.

Additional aspects will be set forth in part in the description which follows and, in part, will be apparent from the description, or may be learned by practice of the presented embodiments.

According to one or more example embodiments, an organic light-emitting device includes a first electrode; a second electrode facing the first electrode; and an organic layer between the first electrode and the second electrode and including an emission layer, wherein the organic layer includes i) a condensed cyclic compound represented by Formula 1; and ii) at least one selected from a first compound represented by Formula 11, a second compound represented by Formula 12, and a third compound represented by Formula 13:

Formula 1

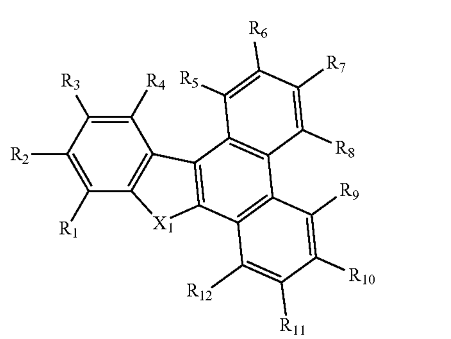

-continued

Formula 2

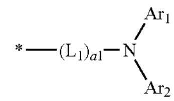

Formula 11

$$R_{301}—L_{301}—An_1—(L_{310})_{xb1}—An_2—L_{302}—R_{302}$$

Formula 12

$$R_{303}—L_{303}—An_3—L_{304}—R_{304}$$

Formula 13

$$Ar_{311}—\left[(L_{311})_{xb11}—R_{311}\right]_{xb20},$$

wherein, in Formulae 1, 2, and 11 to 13, $X_1$ may be O or S, $L_1$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{301}$ to $L_{304}$, $L_{310}$, and $L_{311}$ may each independently be selected from a substituted or unsubstituted $C_3$-$C_{10}$ cycloalkylene group, a substituted or unsubstituted $C_3$-$C_{10}$ cycloalkenylene group, a substituted or unsubstituted $C_6$-$C_{60}$ arylene group, a substituted or unsubstituted divalent non-aromatic condensed polycyclic group, a substituted or unsubstituted thiophenylene group, a substituted or unsubstituted furanylene group, a substituted or unsubstituted pyrrolylene group, a substituted or unsubstituted benzothiophenylene group, a substituted or unsubstituted benzofuranylene group, a substituted or unsubstituted indolylene group, a substituted or unsubstituted dibenzothiophenylene group, a substituted or unsubstituted dibenzofuranylene group, and a substituted or unsubstituted carbazolylene group, a1, xb1, and xb11 may each independently be selected from 0, 1, 2, and 3, wherein when a1 is 2 or more, a plurality of $L_1$(s) may be identical to or different from each other, when xb1 is 2 or more, a plurality of $L_{310}$(s) may be identical to or different from each other, and when xb11 is 2 or more, a plurality of $L_{311}$(s) may be identical to or different from each other, $An_1$ to $An_3$ may each independently be a substituted or unsubstituted anthracenylene group, $Ar_{311}$ may be selected from a substituted or unsubstituted aromatic ring and a substituted or unsubstituted non-aromatic condensed polycyclic ring, $Ar_1$ and $Ar_2$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, $R_1$ to $R_{12}$ may each independently be selected from groups represented by Formula 2, hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), and —B($Q_4$)($Q_5$), at least two selected from $R_1$ to $R_{12}$ may each independently be a group represented by Formula 2, $R_{301}$ to $R_{304}$, and $R_{311}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted monovalent non-aromatic condensed polycyclic group, a substituted or unsubstituted thiophenyl group, a substituted or unsubstituted furanyl group, a substituted or unsubstituted pyrrolyl group, a substituted or unsubstituted benzothiophenyl group, a substituted or unsubstituted benzofuranyl group, a substituted or unsubstituted indolyl group, a substituted or unsubstituted dibenzothiophenyl group, a substituted or unsubstituted dibenzofuranyl group, a substituted or unsubstituted carbazolyl group, —Si($Q_1$)($Q_2$)($Q_3$), —B($Q_4$)($Q_5$), and —N($Q_6$)($Q_7$), xb20 may be an integer selected from 1 to 10, at least one substituent of the substituted anthracenylene group, substituted aromatic ring, substituted non-aromatic condensed polycyclic ring, substituted thiophenylene group, substituted furanylene group, substituted pyrrolylene group, substituted benzothiophenylene group, substituted benzofuranylene group, substituted indolylene group, substituted dibenzothiophenylene group, substituted dibenzofuranylene group, substituted carbazolylene group, substituted thiophenyl group, substituted furanyl group, substituted pyrrolyl group, substituted benzothiophenyl group, substituted benzofuranyl group, substituted indolyl group, substituted dibenzothiophenyl group, substituted dibenzofuranyl group, substituted carbazolyl group, substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), and —B($Q_{14}$)($Q_{15}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), and —B($Q_{24}$)($Q_{25}$); and —Si($Q_{31}$)($Q_{32}$)($Q_{33}$) and —B($Q_{34}$)($Q_{35}$), wherein $Q_1$ to $Q_7$, $Q_{11}$ to $Q_{15}$, $Q_{21}$ to $Q_{25}$, and $Q_{31}$ to $Q_{35}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

BRIEF DESCRIPTION OF THE DRAWINGS

These and/or other aspects will become apparent and more readily appreciated from the following description of the example embodiments, taken in conjunction with the accompanying drawing, which is a schematic view illustrating an organic light-emitting device according to an example embodiment of the present disclosure.

DETAILED DESCRIPTION

Reference will now be made in more detail to example embodiments, examples of which are illustrated in the accompanying drawing, wherein like reference numerals refer to like elements throughout. In this regard, the present example embodiments may have different forms and should not be construed as being limited to the descriptions set forth herein. Accordingly, the example embodiments are merely described below, by referring to the drawing, to explain aspects of the present description. As used herein, the term "and/or" includes any and all combinations of one or more of the associated listed items. Expressions such as "at least one of," "one of," "at least one selected from," and "one selected from," when preceding a list of elements, modify the entire list of elements and do not modify the individual elements of the list. Further, the use of "may" when describing embodiments of the present invention may refer to "one or more embodiments of the present invention."

Hereinafter, with reference to the drawing, an organic light-emitting device according to an example embodiment of the present disclosure will be described in more detail.

The drawing is a schematic cross-sectional view illustrating an organic light-emitting device 10 according to an example embodiment. The organic light-emitting device 10 includes a first electrode 110, an organic layer 150, and a second electrode 190.

Hereinafter, with reference to the drawing, the structure of the organic light-emitting device according to an example embodiment and a method of manufacturing the same will be described.

Referring to the drawing, a substrate may be additionally positioned under a first electrode 110 or on a second electrode 190. The substrate may be a glass substrate or transparent plastic substrate, each with excellent mechanical strength, thermal stability, transparency, surface smoothness, ease of handling, and/or water resistance.

The first electrode 110 may be formed by depositing or sputtering a material for forming the first electrode on the substrate. When the first electrode 110 is an anode, the material for the first electrode may be selected from materials with a high work function so as to make holes be easily injected. The first electrode 110 may be a reflective electrode, a semi-transmissive electrode, or a transmissive electrode. The material for forming the first electrode may be a transparent and highly conductive material. Non-limiting examples of such material include indium tin oxide (ITO), indium zinc oxide (IZO), tin oxide ($SnO_2$), and zinc oxide (ZnO). When the first electrode 110 is a semi-transmissive electrode or a reflective electrode, as a material for forming the first electrode, at least one selected from magnesium (Mg), aluminum (Al), aluminum-lithium (Al—Li), calcium (Ca), magnesium-indium (Mg—In), and magnesium-silver (Mg—Ag) may be used.

The first electrode 110 may have a single-layer structure, or a multi-layer structure including a plurality of layers. For example, the first electrode 110 may have a triple-layer structure of ITO/Ag/ITO, but embodiments of the present disclosure are not limited thereto.

The organic layer 150 may be positioned on the first electrode 110. The organic layer 150 may include an emission layer.

The organic layer 150 may further include a hole transport region between the first electrode 110 and the emission layer and an electron transport region between the emission layer and the second electrode 190.

The hole transport region may include at least one selected from a hole injection layer (HIL), a hole transport layer (HTL), a buffer layer, and an electron blocking layer (EBL), and the electron transport region may include at least one selected from a hole blocking layer (HBL), an electron transport layer (ETL), and an electron injection layer (EIL), but embodiments of the present disclosure are not limited thereto.

The hole transport region may have a single-layered structure formed of a single material, a single-layered structure formed of a plurality of different materials, or a multi-layered structure having a plurality of layers formed of a plurality of different materials.

For example, the hole transport region may have a single-layered structure formed of a plurality of different materials, or a structure of hole injection layer/hole transport layer, a structure of hole injection layer/hole transport layer/buffer layer, a structure of hole injection layer/buffer layer, a structure of hole transport layer/buffer layer, or a structure of hole injection layer/hole transport layer/electron blocking layer, wherein the layers of each structure are sequentially stacked from the first electrode 110 in the stated order, but embodiments of the present disclosure are not limited thereto.

When the hole transport region includes a hole injection layer, the hole injection layer may be formed on the first electrode 110 by using one or more suitable methods, such as vacuum-deposition, spin coating, casting, Langmuir-Blodgett (LB) method, ink-jet printing, laser-printing, and/or laser-induced thermal imaging (LITI).

When the hole injection layer is formed by vacuum-deposition, for example, the vacuum-deposition may be performed at a temperature of about 100° C. to about 500° C., at a vacuum degree of about $10^{-8}$ Torr to about $10^{-3}$ Torr, and at a vacuum-deposition rate in a range of about 0.01 Å/sec to about 100 Å/sec depending on the compound for forming the hole injection layer to be deposited, and the structure of the hole injection layer to be formed.

When a hole injection layer is formed by spin coating, the spin coating may be performed at a coating rate of about 2000 rpm to about 5000 rpm, and at a temperature of about 80° C. to 200° C. depending on the compound for forming the hole injection layer to be deposited, and the structure of the hole injection layer to be formed.

When the hole transport region includes a hole transport layer, the hole transport layer may be formed on the first electrode 110 or the hole injection layer by using one or more suitable methods, such as vacuum-deposition, spin coating, casting, LB method, ink-jet printing, laser-printing, and/or LITI. When the hole transport layer is formed by vacuum-deposition and/or spin coating, conditions for vacuum-deposition and coating may be similar to the vacuum-deposition and coating conditions for forming the hole injection layer.

The hole transport region may include a condensed-cyclic compound represented by Formula 1. In some embodiments, the hole transport region may include a hole transport layer, and the hole transport layer may include the condensed-cyclic compound represented by Formula 1.

In some embodiments, the hole transport region may include at least one selected from m-MTDATA, TDATA, 2-TNATA, NPB, β-NPB, TPD, a spiro-TPD, a spiro-NPB, methylated NPB, TAPC, HMTPD, 4,4',4"-tris(N-carbazolyl) triphenylamine (TCTA), polyaniline/dodecylbenzenesulfonic acid (Pani/DBSA), poly(3,4-ethylenedioxythiophene)/poly(4-styrenesulfonate) (PEDOT/PSS), polyaniline/camphor sulfonicacid (Pani/CSA), (polyaniline)/poly(4-styrenesulfonate) (PANI/PSS), a compound represented by Formula 201, and a compound represented by Formula 202:

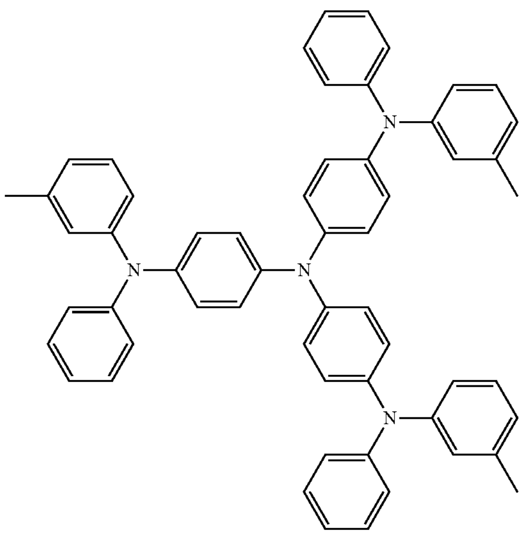

m-MTDATA

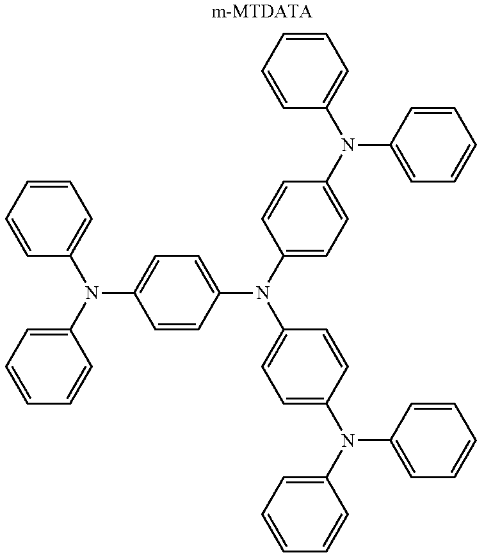

TDATA

-continued

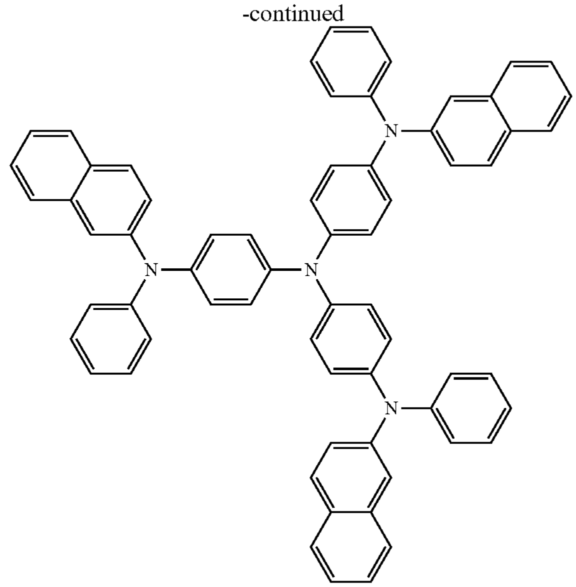

2-TNATA

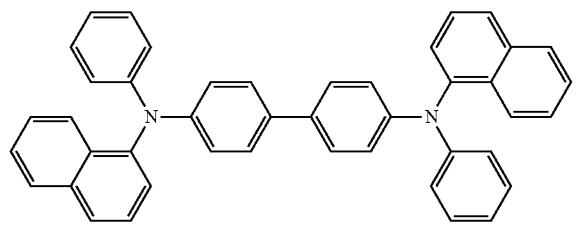

NPB

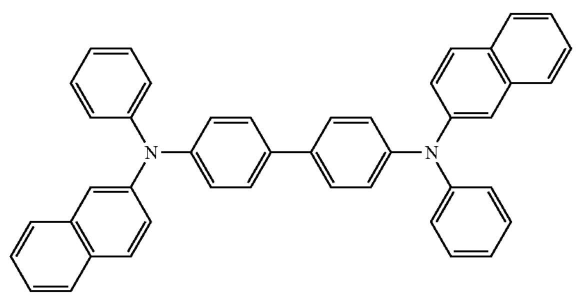

β-NPB

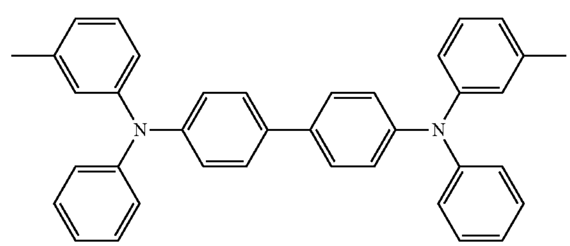

TPD

-continued

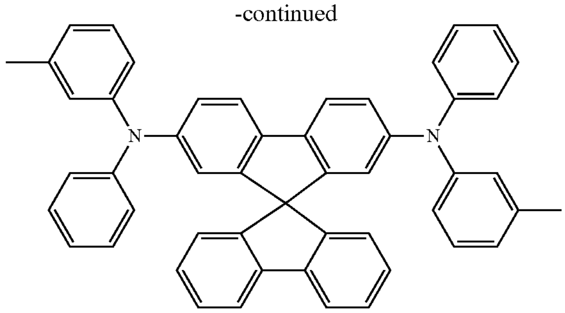

Spiro-TPD

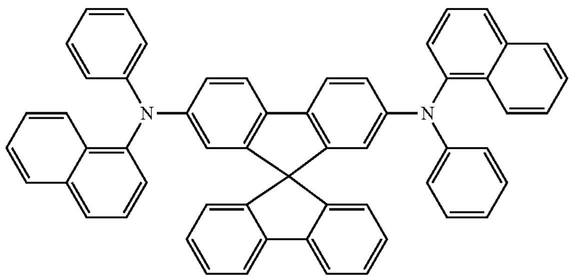

Spiro-NPB

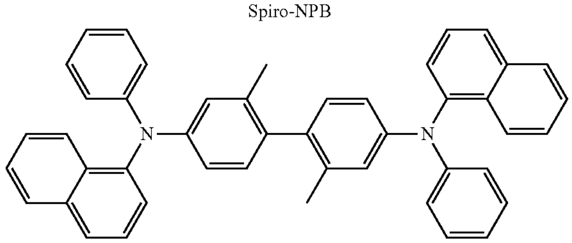

methylated NPB

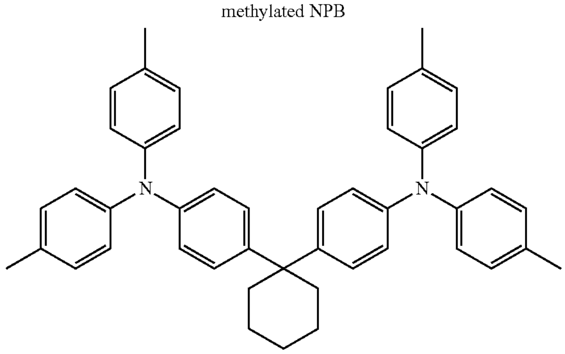

TAPC

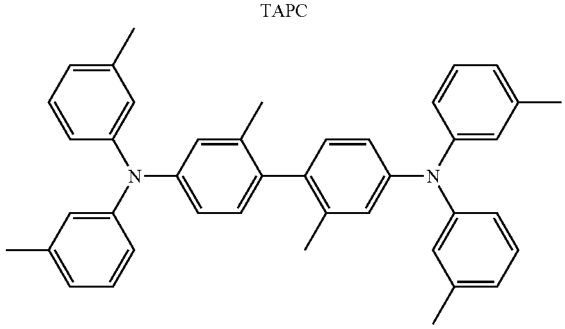

HMTPD

Formula 201

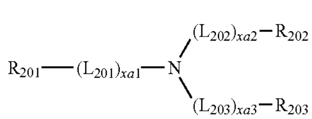

-continued

Formula 202

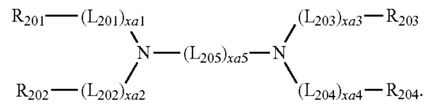

In Formulae 201 and 202, $L_{201}$ to $L_{205}$ may each independently be defined the same as $L_1$ described herein;

xa1 to xa4 may be each independently selected from 0, 1, 2, and 3; and xa5 may be selected from 1, 2, 3, 4, and 5; and $R_{201}$ to $R_{204}$ may be each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In some embodiments, in Formulae 201 and 202, $L_{201}$ to $L_{205}$ may be each independently selected from:

a phenylene group, a naphthylene group, a fluorenylene group, a spirobifluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthylene group, a fluorenylene group, a spirobifluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spirobifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, an isoindolyl group, a quinolinyl group, an isoquinolinyl group, a quinoxalinyl group, a quinazolinyl group, a carbazolyl group, and a triazinyl group, xa1 to xa4 may be each independently selected from 0, 1, and 2;

xa5 may be selected from 1, 2, and 3;

$R_{201}$ to $R_{204}$ may be each independently selected from:

a phenyl group, a naphthyl group, a fluorenyl group, a spirobifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spirobifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an azulenyl group, a fluorenyl group, a spirobifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, but embodiments of the present disclosure are not limited thereto.

The compound represented by Formula 201 may be represented by Formula 201A:

Formula 201A

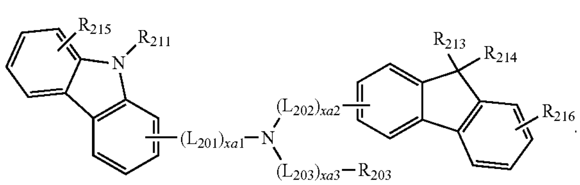

In some embodiments, the compound represented by Formula 201 may be represented by Formula 201A-1, but embodiments of the present disclosure are not limited thereto:

Formula 201A-1

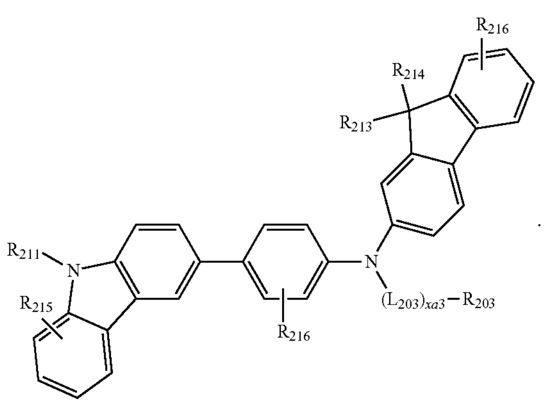

In some embodiments, the compound represented by Formula 202 may be represented by Formula 202 Å, but embodiments of the present disclosure are not limited thereto:

Formula 202A

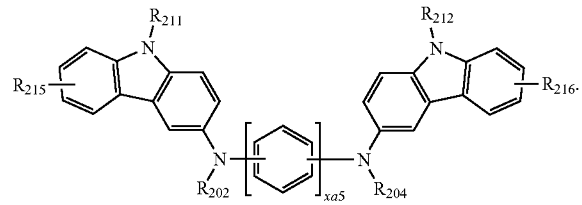

In Formulae 201 Å, 201A-1, and 202 Å, descriptions for $L_{201}$ to $L_{203}$, xa1 to xa3, xa5, and $R_{202}$ to $R_{204}$ may be each independently understood by referring to the descriptions thereof provided herein, $R_{211}$ and $R_{212}$ may be each independently defined the same as $R_{203}$, and $R_{213}$ to $R_{216}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

The compound represented by Formula 201 and the compound represented by Formula 202 may each independently include Compounds HT1 to HT20, but embodiments of the present disclosure are not limited thereto:

HT1

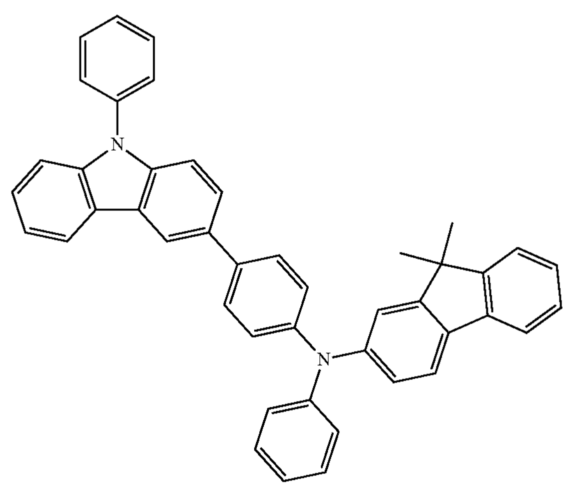

-continued
HT2
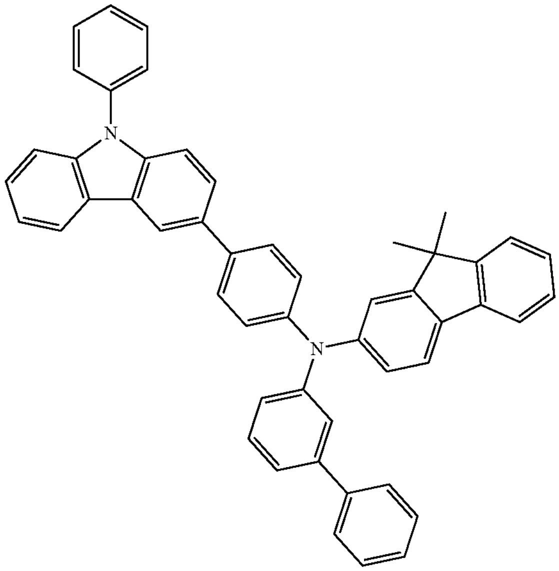
HT3
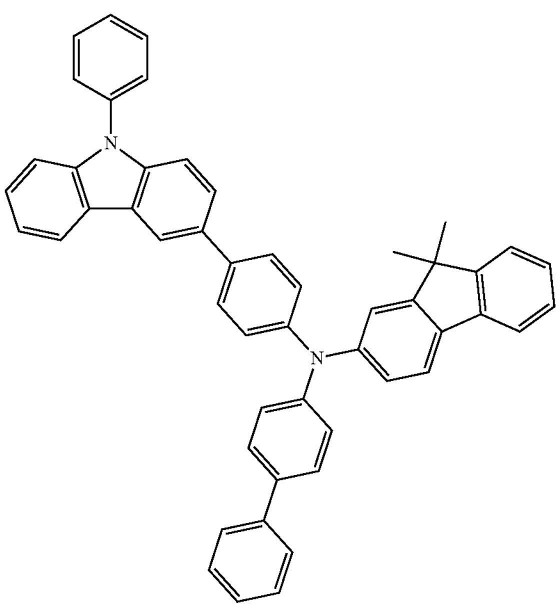
-continued
HT4
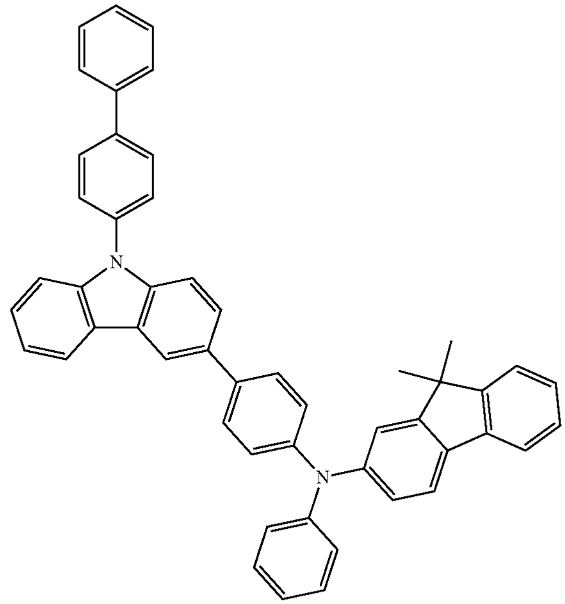
HT5
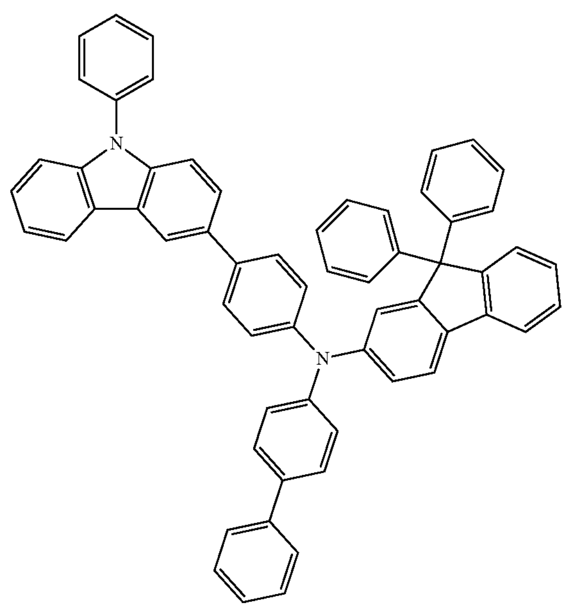

-continued
HT6
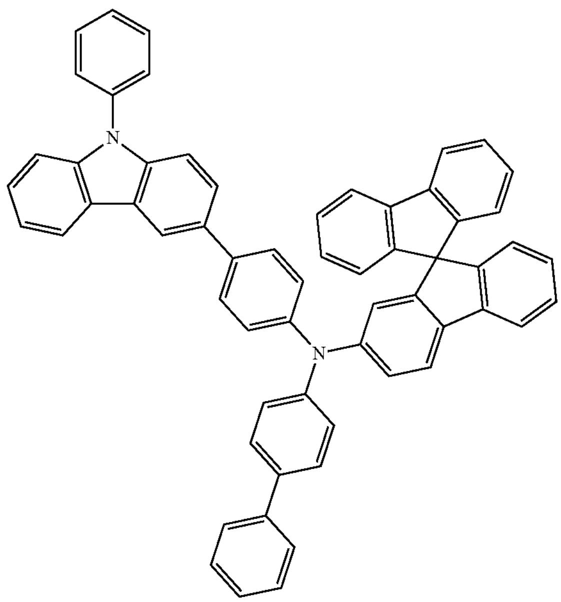
HT7
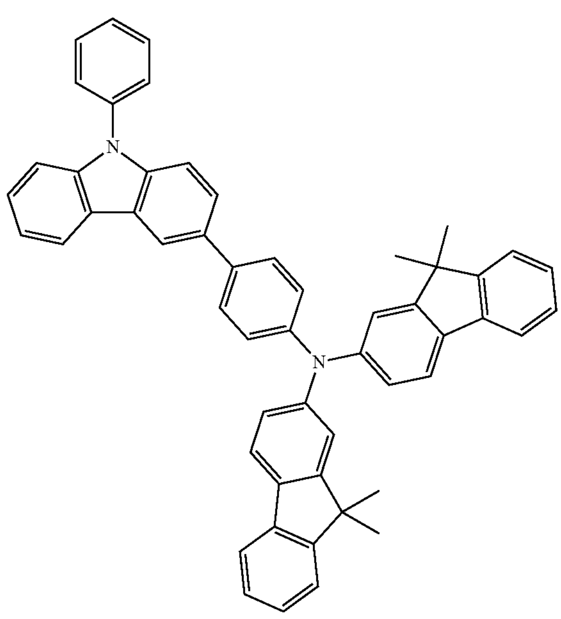
-continued
HT8
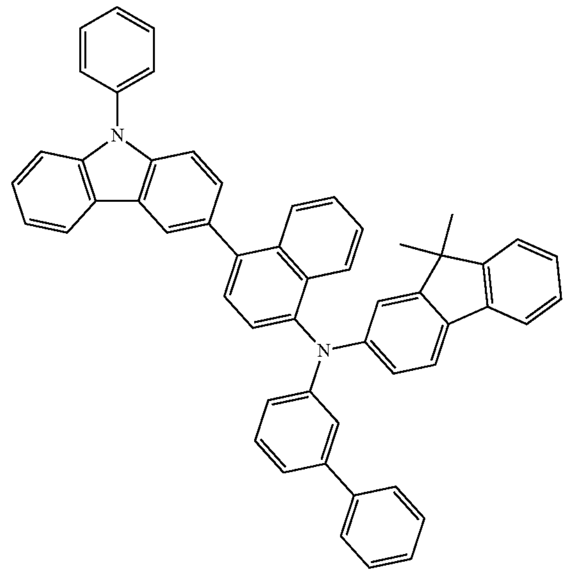
HT9
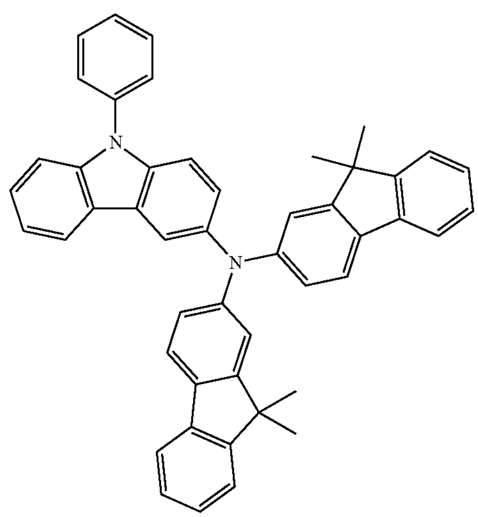

-continued
HT10
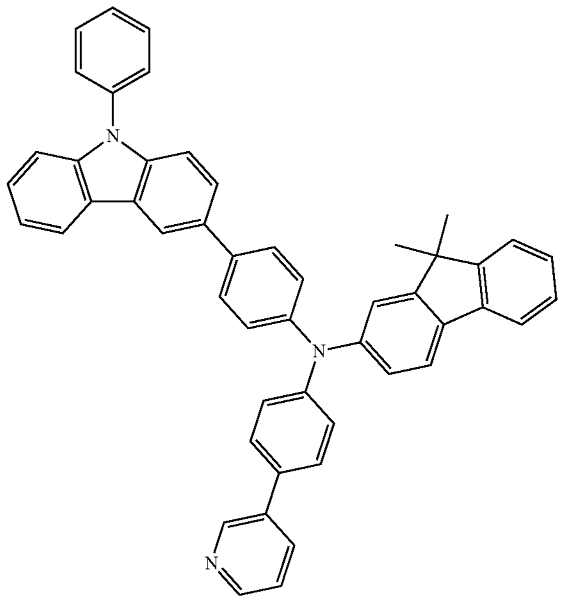
HT11
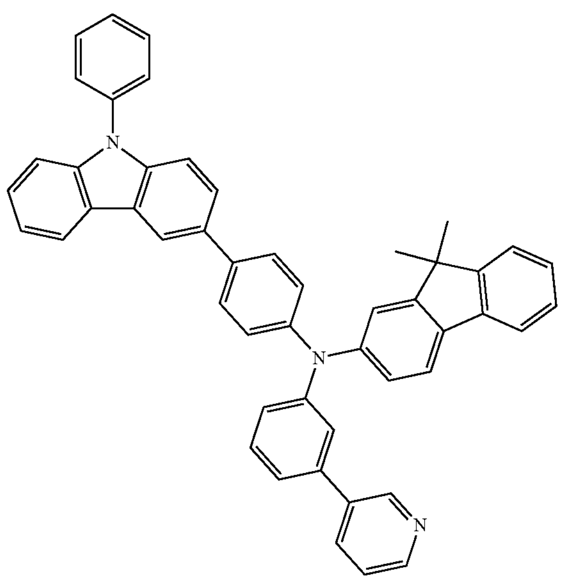
-continued
HT12
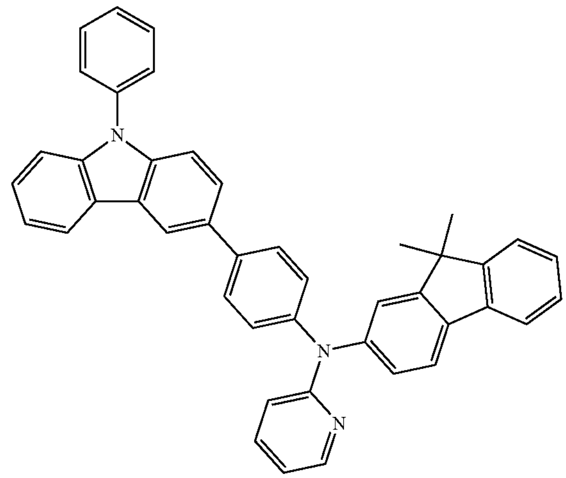
HT13
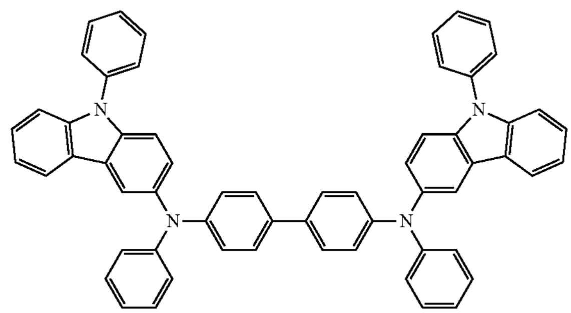
HT14
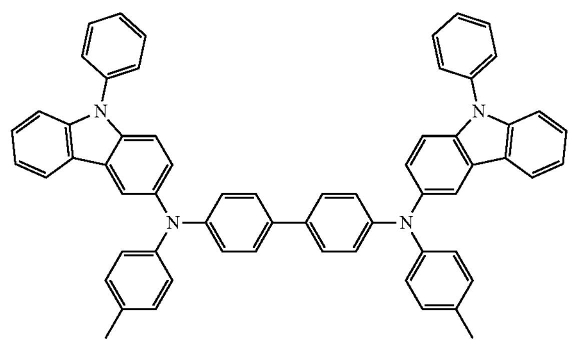
HT15
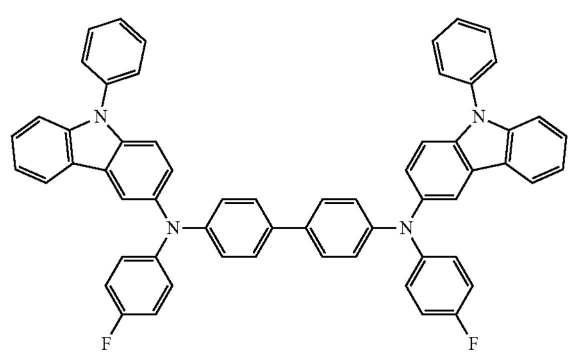

-continued

HT16

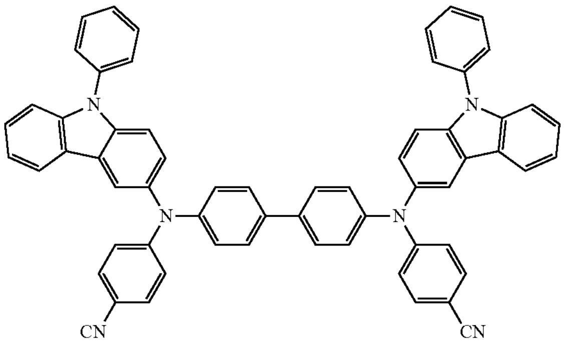

HT17

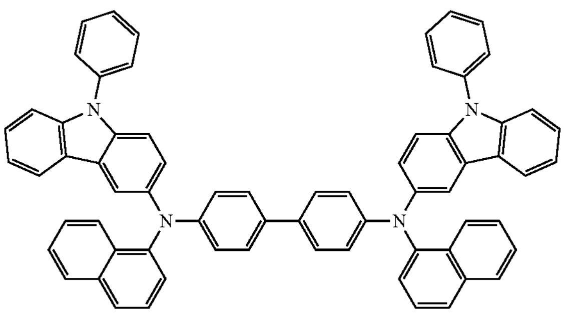

HT18

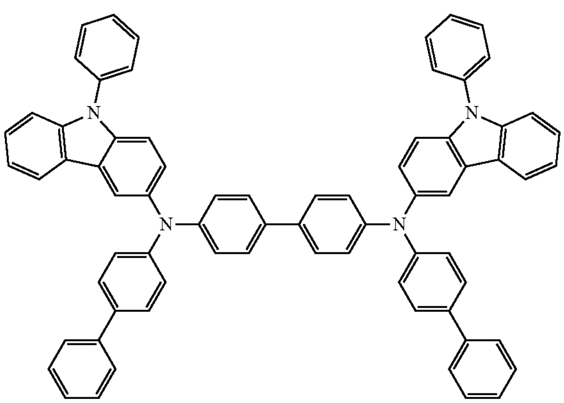

HT19

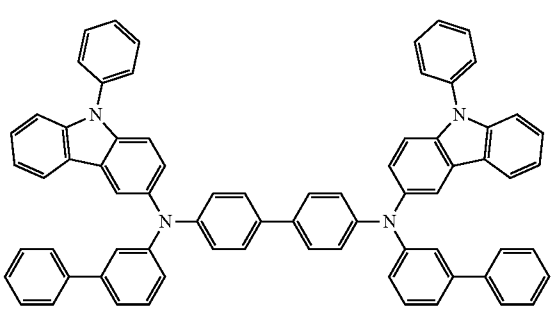

-continued

HT20

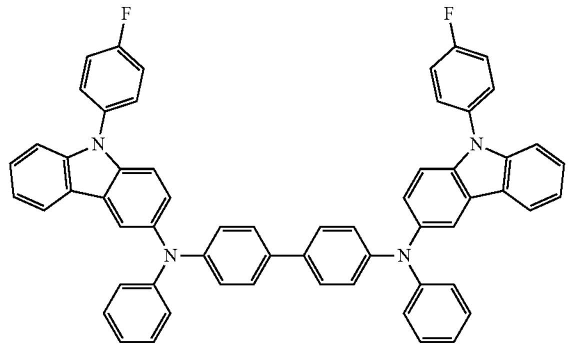

The thickness of the hole transport region may be in a range of about 100 Å to about 10000 Å, for example, about 100 Å to about 1000 Å. When the hole transport region includes a hole injection layer and a hole transport layer, the thickness of the hole injection layer may be in a range of about 100 Å to about 10000 Å, and for example, about 100 Å to about 1000 Å, and the thickness of the hole transport layer may be in a range of about 50 Å to about 2000 Å, and for example, about 100 Å to about 1500 Å. When the thicknesses of the hole transport region, the hole injection layer, and the hole transport layer are within any of these ranges, excellent hole transport characteristics may be obtained without a substantial increase in driving voltage.

The hole transport region may further include, in addition to the materials mentioned above, a charge-generating material to improve conductive properties. The charge-generating material may be homogeneously or non-homogeneously dispersed throughout the hole transport region.

The charge-generating material may be, for example, a p-dopant. The p-dopant may be selected from a quinone derivative, a metal oxide, and a cyano group-containing compound, but embodiments of the present disclosure are not limited thereto. Non-limiting examples of the p-dopant include quinone derivatives, such as tetracyanoquinonedimethane (TCNQ) and/or 2,3,5,6-tetrafluoro-tetracyano-1,4-benzoquinonedimethane (F4-TCNQ); metal oxides, such as tungsten oxide and/or molybdenum oxide, and Compound HT-D1 illustrated below:

Compound HT-D1

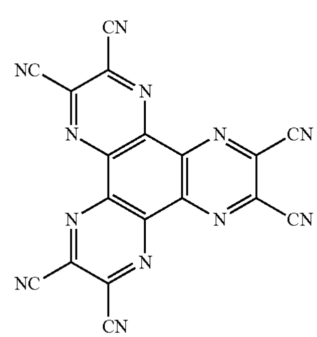

-continued

F4-TCNQ

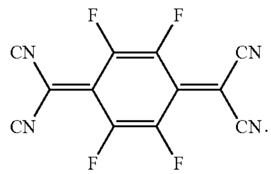

The hole transport region may further include, in addition to the hole injection layer and the hole transport layer, at least one selected from a buffer layer and an electron blocking layer. Since the buffer layer may compensate for an optical resonance distance according to a wavelength of light emitted from the emission layer, light-emission efficiency of the formed organic light-emitting device may be improved. As a material included in the buffer layer, any of the materials that are included in the hole transport region may be used. The electron blocking layer may prevent or reduce the injection of electrons from the electron transport region.

An emission layer may be formed on the hole transport region by using one or more suitable methods, such as vacuum-deposition, spin coating, casting, LB method, ink-jet printing, laser-printing, and/or LITI. When the emission layer is formed by vacuum-deposition and/or spin coating, deposition and coating conditions for the emission layer may be similar to the deposition and coating conditions for the hole injection layer.

When the organic light-emitting device 10 is a full color organic light-emitting device, the emission layer may be patterned into a red emission layer, a green emission layer, or a blue emission layer, according to a sub pixel. In some embodiments, the emission layer may have a stacked structure of a red emission layer, a green emission layer, and a blue emission layer, or may include a red-light emission material, a green-light emission material, and a blue-light emission material, which are mixed with each other in a single layer, to emit white light.

The emission layer may include i) a condensed cyclic compound represented by Formula 1 and ii) at least one selected from a first compound represented by Formula 11, a second compound represented by Formula 12, and a third compound represented by Formula 13:

Formula 1

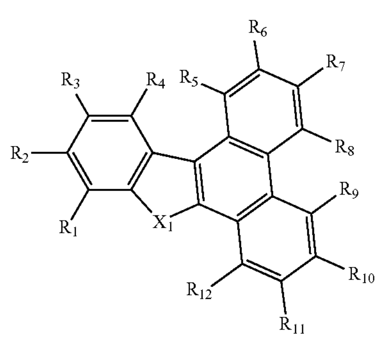

Formula 2

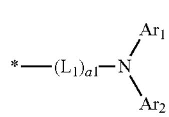

Formula 11

$$R_{301}—L_{301}—An_1—(L_{310})_{xb1}—An_2—L_{302}—R_{302}$$

-continued

Formula 12

$$R_{303}—L_{303}—An_3—L_{304}—R_{304}$$

Formula 13

$$Ar_{311}—\left[(L_{311})_{xb11}—R_{311}\right]_{xb20}.$$

In Formula 1, $X_1$ may be O or S. In some embodiments, in Formula 1, $X_1$ may be O, but embodiments of the present disclosure are not limited thereto.

In Formula 1, $R_1$ to $R_{12}$ may be each independently selected from groups represented by Formula 2, hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, and —$B(Q_4)(Q_5)$.

In Formula 1, at least two selected from $R_1$ to $R_{12}$ may be each independently groups represented by Formula 2:

Formula 2

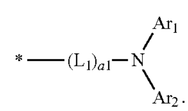

In Formula 2, $L_1$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group.

In some embodiments, in Formula 2, $L_1$ may be selected from:

a phenylene group, a pentalenylene group, an indenylene group, a naphthylene group, an azulenylene group, a heptalenylene group, an indacenylene group, an acenaphthylene group, a fluorenylene group, a spirobifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, a thiadiazolylene group, an imidazopyridinylene group, and an imidazopyrimidinylene group; and a phenylene group, a pentalenylene group, an indenylene group, a naphthylene group, an azulenylene group, a heptalenylene group, an indacenylene group, an acenaphthylene group, a fluorenylene group, a spirobifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, a thiadiazolylene group, an imidazopyridinylene group, and an imidazopyrimidinylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spirobifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, an imidazopyrimidinyl group, a biphenyl, a terphenyl, and —Si($Q_{31}$)($Q_{32}$)($Q_{33}$), where $Q_{31}$ to $Q_{33}$ may be each independently selected from a $C_1$-$C_{10}$ alkyl group, a $C_1$-$C_{10}$ alkoxy group, a phenyl group, a naphthyl group, a fluorenyl group, a spirobifluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, an oxadiazolyl group, a triazinyl group, a dibenzofuranyl group, a dibenzothiophenyl group, a benzocarbazolyl group, a dibenzocarbazolyl group, a dibenzosilolyl group, a thiadiazolyl group, an imidazopyridinyl group, an imidazopyrimidinyl group, a biphenyl group, and a terphenyl group.

In Formulae 11 to 13, $L_{301}$ to $L_{304}$, $L_{310}$, and $L_{311}$ may be each independently selected from a substituted or unsubstituted $C_3$-$C_{10}$ cycloalkylene group, a substituted or unsubstituted $C_3$-$C_{10}$ cycloalkenylene group, a substituted or unsubstituted $C_6$-$C_{60}$ arylene group, a substituted or unsubstituted divalent non-aromatic condensed polycyclic group, a substituted or unsubstituted thiophenylene group, a substituted or unsubstituted furanylene group, a substituted or unsubstituted pyrrolylene group, a substituted or unsubstituted benzothiophenylene group, a substituted or unsubstituted benzofuranylene group, a substituted or unsubstituted indolylene group, a substituted or unsubstituted dibenzothiophenylene group, a substituted or unsubstituted dibenzofuranylene group, and a substituted or unsubstituted carbazolylene group.

In some embodiments, in Formulae 11 to 13, $L_{301}$ to $L_{304}$, $L_{310}$, and $L_{311}$ may be each independently selected from:

a phenylene group, a pentalenylene group, an indenylene group, a naphthylene group, an azulenylene group, a heptalenylene group, an indacenylene group, an acenaphthylene group, a fluorenylene group, a spirobifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an indolylene group, a benzothiophenylene group, a benzofuranylene group, a carbazolylene group, a dibenzothiophenylene group, and a dibenzofuranylene group; and a phenylene group, a pentalenylene group, an indenylene group, a naphthylene group, an azulenylene group, a heptalenylene group, an indacenylene group, an acenaphthylene group, a fluorenylene group, a spirobifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an indolylene group, a benzothiophenylene group, a benzofuranylene group, a carbazolylene group, a dibenzothiophenylene group, and a dibenzofuranylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spirobifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an indolyl group, a benzothiophenyl group, a benzofuranyl group, a carbazolyl group, a dibenzothiophenyl group, a dibenzofuranyl group, a diphenylethenyl group, a biphenyl group, a terphenyl group, and —Si($Q_{31}$)($Q_{32}$)($Q_{33}$), where $Q_{31}$ to $Q_{33}$ may be each independently selected from a $C_1$-$C_{10}$ alkyl group, a $C_1$-$C_{10}$ alkoxy group, a phenyl group, a naphthyl group, a fluorenyl group, a spirobifluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, an oxadiazolyl group, a triazinyl group, a dibenzofuranyl group, a dibenzothiophenyl group, a benzocarbazolyl group, a dibenzocarbazolyl group, a dibenzosilolyl group, a thiadiazolyl group, an imidazopyridinyl group, an imidazopyrimidinyl group, a biphenyl group, and a terphenyl group, but embodiments of the present disclosure are not limited thereto.

In some embodiments, in Formula 2, $L_1$ may be selected from groups represented by Formulae 3-1 to 3-35, and in Formulae 11 to 13, $L_{301}$ to $L_{304}$, $L_{310}$, and $L_{311}$ may be each independently selected from groups represented by Formulae 3-1 to 3-9, 3-25 to 3-27, and 3-31 to 3-35:

Formula 3-1

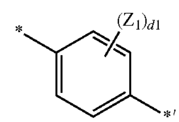

Formula 3-2

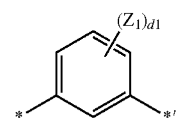

Formula 3-3

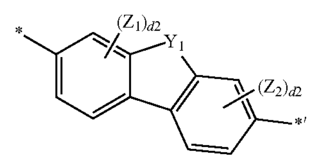

Formula 3-4

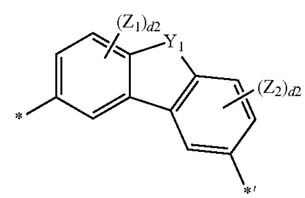

Formula 3-5

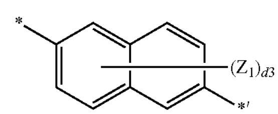

Formula 3-6

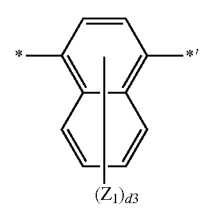

Formula 3-7

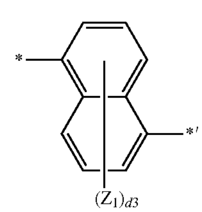

-continued
Formula 3-8
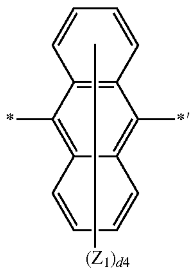
Formula 3-9
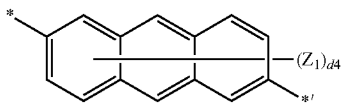
Formula 3-10
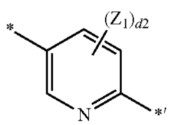
Formula 3-11
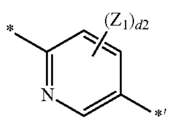
Formula 3-12
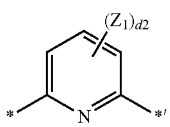
Formula 3-13
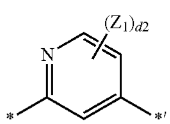
Formula 3-14
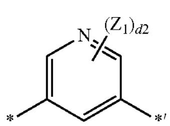
Formula 3-15
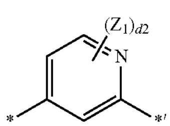
Formula 3-16
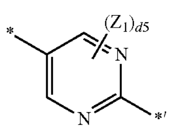
Formula 3-17
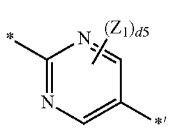
Formula 3-18
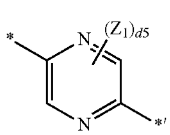
-continued
Formula 3-19
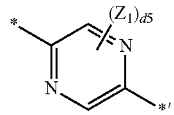
Formula 3-20
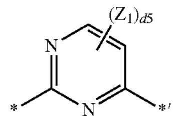
Formula 3-21
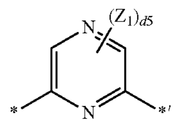
Formula 3-22
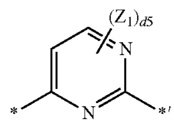
Formula 3-23
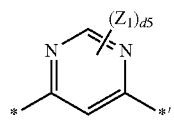
Formula 3-24
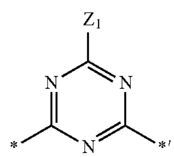
Formula 3-25
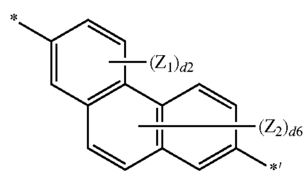
Formual 3-26
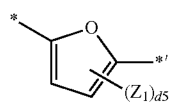
Formula 3-27
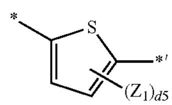
Formula 3-28
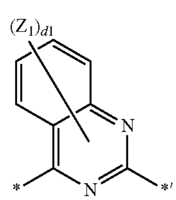
Formula 3-29
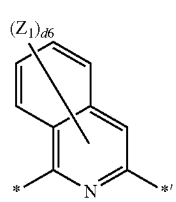

-continued

Formula 3-30

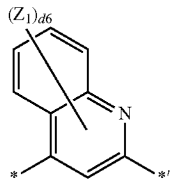

Formula 3-31

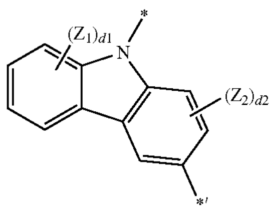

Formula 3-32

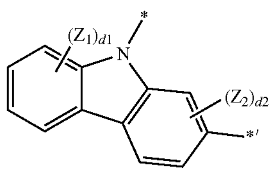

Formula 3-33

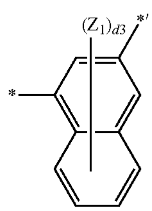

Formula 3-34

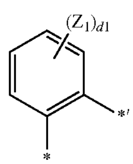

Formula 3-35

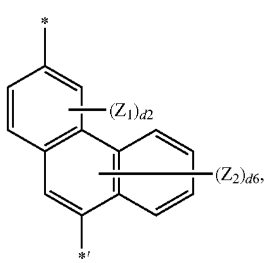

where, in Formulae 3-1 to 3-35, $Y_1$ may be selected from O, S, $C(Z_3)(Z_4)$, $N(Z_5)$, and $Si(Z_6)(Z_7)$;

$Z_1$ to $Z_7$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spirobifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a diphenylethenyl group, a biphenyl group, a terphenyl group, and —$Si(Q_{31})(Q_{32})(Q_{33})$, where $Q_{31}$ to $Q_{33}$ may be each independently selected from a $C_1$-$C_{10}$ alkyl group, a $C_1$-$C_{10}$ alkoxy group, a phenyl group, a naphthyl group, a pyridinyl group, a pyrimidinyl group, a triazinyl group, a biphenyl group, and a terphenyl group;

d1 may be an integer selected from 1 to 4;

d2 may be an integer selected from 1 to 3;

d3 may be an integer selected from 1 to 6;

d4 may be an integer selected from 1 to 8;

d5 may be 1 or 2;

d6 may be an integer selected from 1 to 5; and

* and *' each indicate a binding site to an adjacent atom.

In some embodiments, in Formula 2, $L_1$ may be selected from:

a phenylene group, a naphthylene group, a pyridinylene group, a dibenzofuranylene group, and a dibenzothiophenylene group; and a phenylene group, a naphthylene group, a pyridinylene group, a dibenzofuranylene group, and a dibenzothiophenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a phenyl group, a naphthyl group, a pyridinyl group, a pyrimidinyl group, and a triazinyl group, but embodiments of the present disclosure are not limited thereto.

In some embodiments, in Formula 2, $L_1$ may be selected from groups represented by Formulae 4-1 to 4-28, and in Formulae 11 to 13, $L_{301}$ to $L_{304}$, $L_{310}$, and $L_{311}$ may be each independently selected from groups represented by Formulae 4-1, 4-3, 4-5 to 4-8, 4-10 to 4-17, 4-20, 4-21, and 4-24 to 4-28, but embodiments of the present disclosure are not limited thereto:

Formula 4-1

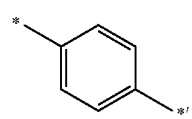

Formula 4-2

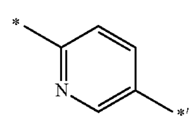

Formula 4-3

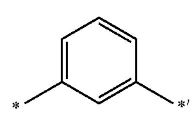

Formula 4-4

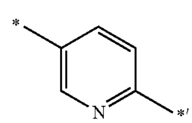

Formula 4-5

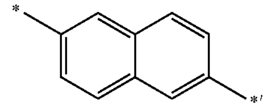

-continued
Formula 4-6
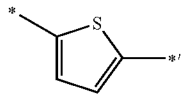
Formula 4-7
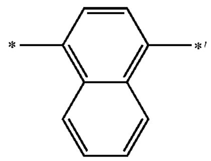
Formula 4-8
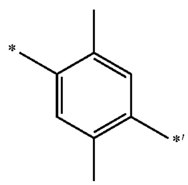
Formula 4-9
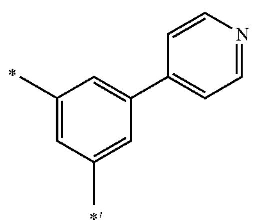
Formula 4-10
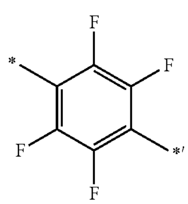
Formula 4-11
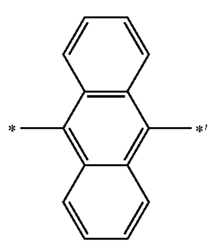
Formula 4-12
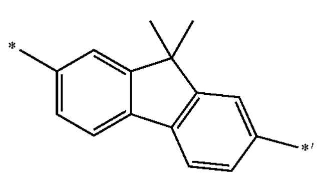
Formula 4-13
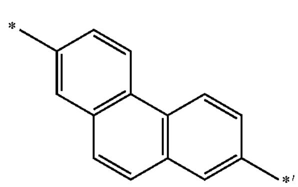
-continued
Formula 4-14
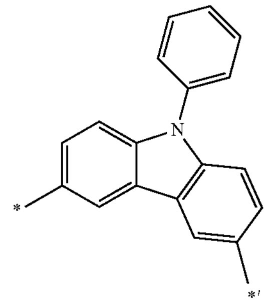
Formula 4-15
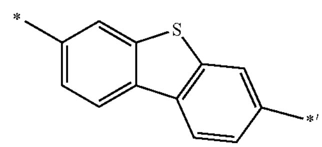
Formula 4-16
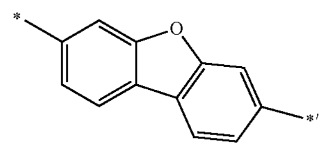
Formula 4-17
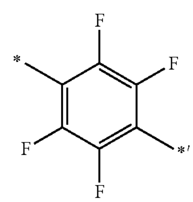
Formula 4-18
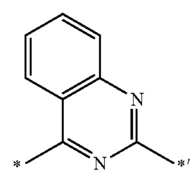
Formula 4-19
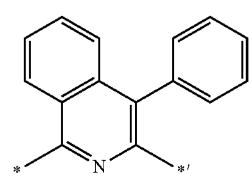
Formula 4-20
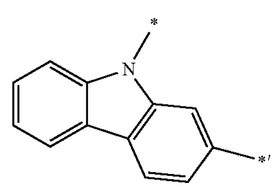
Formula 4-21
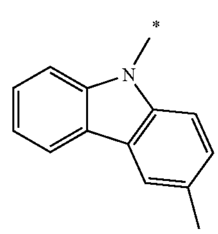

-continued

Formula 4-22

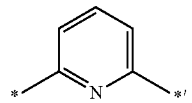

Formula 4-23

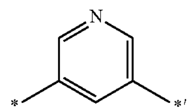

Formula 4-24

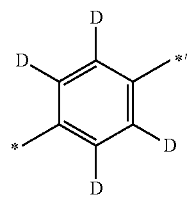

Formula 4-25

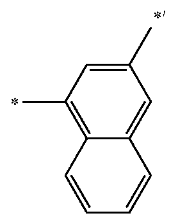

Formula 4-26

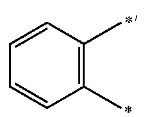

Formula 4-27

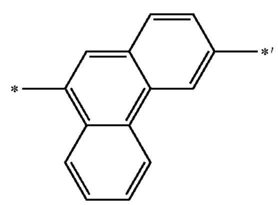

Formula 4-28

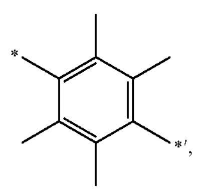

where, in Formulae 4-1 to 4-28, * and *' each indicate a binding site to an adjacent atom, and "D" may represent deuterium.

In Formulae 2 and 11 to 13, a1, xb1, and xb11 may be each independently selected from 0, 1, 2, and 3. a1 in Formula 2 indicates the number of $L_1$. When a1 is 2 or more, a plurality of $L_1$(s) may be identical to or different from each other. When a1 is 0, *-$(L_1)_{a1}$-*' may be a single bond. In some embodiments, a1 may be selected from 0, 1, and 2. In some embodiments, a1 may be selected from 0 or 1. Descriptions for xb1 and xb11 may be understood by referring to the descriptions for a1 and Formulae 11 to 13.

In Formulae 11 and 12, $An_1$ to $An_3$ may be each independently selected from a substituted or unsubstituted anthracenylene group.

In some embodiments, in Formulae 11 and 12, $An_1$ to $An_3$ may be each independently selected from:

an anthracenylene group; and an anthracenylene group substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spirobifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an indolyl group, a benzothiophenyl group, a benzofuranyl group, a carbazolyl group, a dibenzothiophenyl group, a dibenzofuranyl group, a diphenylethenyl group, a biphenyl group, a terphenyl group, and —Si($Q_{31}$)($Q_{32}$)($Q_{33}$), where $Q_{31}$ to $Q_{33}$ may be each independently selected from a $C_1$-$C_{10}$ alkyl group, a $C_1$-$C_{10}$ alkoxy group, a phenyl group, a naphthyl group, a pyridinyl group, a pyrimidinyl group, a triazinyl group, a biphenyl group, and a terphenyl group, but embodiments of the present disclosure are not limited thereto.

In Formula 13, $Ar_{311}$ may be a substituted or unsubstituted aromatic ring or a substituted or unsubstituted non-aromatic condensed polycyclic ring.

In some embodiments, in Formula 13, $Ar_{311}$ may be selected from:

a benzene, a pentalene, an indene, a naphthalene, an azulene, a heptalene, an indacenylene, an acenaphthylene, a fluorene, a spirobifluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, a hexacene, a pentacene, a rubicene, a coronene, and an ovalene;

a benzene, a pentalene, an indene, a naphthalene, an azulene, a heptalene, an indacenylene, an acenaphthylene, a fluorene, a spirobifluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, a hexacene, a pentacene, a rubicene, a coronene, and an ovalene, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spirobifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an indolyl group, a benzothiophenyl group, a benzofuranyl group, a carbazolyl group, a dibenzothiophenyl group, a dibenzofuranyl group, a diphenylethenyl group, a biphenyl group, a terphenyl group, and —Si($Q_{31}$)($Q_{32}$)($Q_{33}$), where $Q_{31}$ to $Q_{33}$ may be each independently selected from a $C_1$-$C_{10}$ alkyl group, a $C_1$-$C_{10}$ alkoxy group, a phenyl group, a naphthyl group, a pyridinyl group, a pyrimidinyl group, a triazinyl group, a biphenyl group, and a terphenyl group, but embodiments of the present disclosure are not limited thereto.

In some embodiments, in Formula 13, $Ar_{311}$ may be selected from:

a benzene, a naphthalene, a fluorene, a spirobifluorene, a benzofluorene, a dibenzofluorene, a phenanthrene, an anthracene, a pyrene, a triphenylene, and a chrysene; and a benzene, a naphthalene, a fluorene, a spirobifluorene, a benzofluorene, a dibenzofluorene, a phenanthrene, an anthracene, a pyrene, a triphenylene, and a chrysene, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spirobifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an indolyl group, a benzothiophenyl group, a benzofuranyl group, a carbazolyl group, a dibenzothiophenyl group, a dibenzofuranyl group, a diphenylethenyl group, a biphenyl group, a terphenyl group, and —Si($Q_{31}$)($Q_{32}$)($Q_{33}$), where $Q_{31}$ to $Q_{33}$ may be each independently selected from a $C_1$-$C_{10}$ alkyl group, a $C_1$-$C_{10}$ alkoxy group, a phenyl group, a naphthyl group, a pyridinyl group, a pyrimidinyl group, a triazinyl group, a biphenyl group, and a terphenyl group, but embodiments of the present disclosure are not limited thereto.

In Formula 2, $Ar_1$ and $Ar_2$ may be each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In some embodiments, in Formula 2, $Ar_1$ and $Ar_2$ may be each independently selected from:

a phenyl group, a pentalenyl group, an indenyl group, a naphthyl group, an azulenyl group, a heptalenyl group, an indacenyl group, an acenaphthyl group, a fluorenyl group, a spirobifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group a dibenzosilolyl group, a thiadiazolyl group, an imidazopyridinyl group, and an imidazopyrimidinyl group; and a phenyl group, a pentalenyl group, an indenyl group, a naphthyl group, an azulenyl group, a heptalenyl group, an indacenyl group, an acenaphthyl group, a fluorenyl group, a spirobifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a dibenzosilolyl group, a thiadiazolyl group, an imidazopyridinyl group, and an imidazopyrimidinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spirobifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, an imidazopyrimidinyl group, a diphenylethenyl group, a biphenyl group, a terphenyl group, and —Si($Q_{31}$)($Q_{32}$)($Q_{33}$), where $Q_{31}$ to $Q_{33}$ may be each independently selected from a $C_1$-$C_{10}$ alkyl group, a $C_1$-$C_{10}$ alkoxy group, a phenyl group, a naphthyl group, a fluorenyl group, a spirobifluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, an oxadiazolyl group, a triazinyl group, a dibenzofuranyl group, a dibenzothiophenyl group, a benzocarbazolyl group, a dibenzocarbazolyl group, a dibenzosilolyl group, a thiadiazolyl group, an imidazopyridinyl group, an imidazopyrimidinyl group, a biphenyl group, and a terphenyl group.

In some embodiments, in Formula 2, $Ar_1$ and $Ar_2$ may be each independently selected from:

a phenyl group, a naphthyl group, a fluorenyl group, a spirobifluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, and an imidazopyrimidinyl group; and a phenyl group, a naphthyl group, a fluorenyl group, a spirobifluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, and an imidazopyrimidinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a phenyl group, a naphthyl group, a fluorenyl group, a spirobifluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, an imidazopyrimidinyl group, a diphenylethenyl group, a biphenyl group, a terphenyl group, and —Si($Q_{31}$)($Q_{32}$)($Q_{33}$), where $Q_{31}$ to $Q_{33}$ may be each independently selected from a $C_1$-$C_{10}$ alkyl group, a $C_1$-$C_{10}$ alkoxy group, a phenyl group, a naphthyl group, a biphenyl group, and a terphenyl group, but embodiments of the present disclosure are not limited thereto.

In some embodiments, in Formula 2, $Ar_1$ and $Ar_2$ may be each independently selected from:

a phenyl group, a naphthyl group, a fluorenyl group, a phenanthrenyl group, a pyridinyl group, a pyrimidinyl group, a triazinyl group, a dibenzofuranyl group, and a dibenzothiophenyl group; and a phenyl group, a naphthyl group, a fluorenyl group, a phenanthrenyl group, a pyridinyl group, a pyrimidinyl group, a triazinyl group, a dibenzofuranyl group, and a dibenzothiophenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a phenyl group, a naphthyl group, a fluorenyl group, a phenanthrenyl group, a pyridinyl group, a pyrimidinyl group, a triazinyl group, a dibenzofuranyl group, a dibenzothiophenyl group, a diphenylethenyl group, a biphenyl group, a terphenyl group, and —Si($Q_{31}$)($Q_{32}$)($Q_{33}$), where $Q_{31}$ to $Q_{33}$ may be each independently selected from a $C_1$-$C_{10}$ alkyl group, a $C_1$-$C_{10}$ alkoxy group, a phenyl group, a naphthyl group, a biphenyl group, and a terphenyl group.

In Formula 1, $R_1$ to $R_{12}$ may be each independently selected from:

groups represented by Formula 2, hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a phenyl group, a naphthyl group, a fluorenyl group, a spirobifluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, and an imidazopyrimidinyl group;

a phenyl group, a naphthyl group, a fluorenyl group, a spirobifluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, and an imidazopyrimidinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a phenyl group, a naphthyl group, a fluorenyl group, a spirobifluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, an imidazopyrimidinyl group, and —Si($Q_{31}$)($Q_{32}$)($Q_{33}$); and —Si($Q_1$)($Q_2$)($Q_3$), where $Q_1$ to $Q_3$ and $Q_{31}$ to $Q_{33}$ may be each independently selected from a $C_1$-$C_{10}$ alkyl group, a $C_1$-$C_{10}$ alkoxy group, a phenyl group, and a naphthyl group.

In some embodiments, in Formula 1, $R_1$ to $R_{12}$ may be each independently selected from:

groups represented by Formula 2, hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group;

a phenyl group, a naphthyl group, a pyridinyl group, a pyrimidinyl group, and a triazinyl group;

a phenyl group, a naphthyl group, a pyridinyl group, a pyrimidinyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a phenyl group, a naphthyl group, a pyridinyl group, a pyrimidinyl group, a triazinyl group, a diphenylethenyl group, a biphenyl group, a terphenyl group, and —Si($Q_{31}$)($Q_{32}$)($Q_{33}$); and —Si($Q_1$)($Q_2$)($Q_3$), where $Q_1$ to $Q_3$ and $Q_{31}$ to $Q_{33}$ may be each independently selected from a $C_1$-$C_{10}$ alkyl group, a $C_1$-$C_{10}$ alkoxy group, a phenyl group, a naphthyl group, a biphenyl group, and a terphenyl group, but embodiments of the present disclosure are not limited thereto.

In Formula 1, at least two selected from $R_1$ to $R_{12}$ may be each independently a group represented by Formula 2.

In Formulae 11 to 13, $R_{301}$ to $R_{304}$, and $R_{311}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted monovalent non-aromatic condensed polycyclic group, a substituted or unsubstituted thiophenyl group, a substituted or unsubstituted furanyl group, a substituted or unsubstituted pyrrolyl group, a substituted or unsubstituted benzothiophenyl group, a substituted or unsubstituted benzofuranyl group, a substituted or unsubstituted indolyl group, a substituted or unsubstituted dibenzothiophenyl group, a substituted or unsubstituted dibenzofuranyl group, a substituted or unsubstituted carbazolyl group, —Si($Q_1$)($Q_2$)($Q_3$), —B($Q_4$)($Q_5$), and —N($Q_6$)($Q_7$), where $Q_1$ to $Q_7$ are as defined herein.

In some embodiments, in Formulae 11 to 13, $R_{301}$ to $R_{304}$ and $R_{311}$ may be each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_2$-$C_{10}$ alkenyl group, and a $C_1$-$C_{10}$ alkoxy group;

a $C_1$-$C_{20}$ alkyl group, a $C_2$-$C_{10}$ alkenyl group, and a $C_1$-$C_{10}$ alkoxy group, each substituted with at least one selected from a phenyl group, a naphthyl group, and an anthracenyl group;

a phenyl group, a naphthyl group, a fluorenyl group, a spirobifluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an indolyl group, a benzothiophenyl group, a benzofuranyl group, a carbazolyl group, a dibenzothiophenyl group and a dibenzofuranyl group, a phenoxy group, and a naphthoxy group;

a phenyl group, a naphthyl group, a fluorenyl group, a spirobifluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an indolyl group, a benzothiophenyl group, a benzofuranyl group, a carbazolyl group, a dibenzothiophenyl group, a dibenzofuranyl group, a phenoxy group, and a naphthoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_2$-$C_{10}$ alkenyl group, a $C_1$-$C_{10}$ alkoxy group, a phenyl group, a naphthyl group, a fluorenyl group, a spirobifluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an indolyl group, a benzothiophenyl group, a benzofuranyl group, a carbazolyl group, a dibenzothiophenyl group, a dibenzofuranyl group, a phenoxy group, a naphthoxy group, a diphenylethenyl group, a biphenyl group, a terphenyl group, and —$Si(Q_{31})(Q_{32})(Q_{33})$; and —$Si(Q_1)(Q_2)(Q_3)$ and —$N(Q_6)(Q_7)$, where $Q_1$ to $Q_3$, $Q_6$, $Q_7$, and $Q_{31}$ to $Q_{33}$ may be each independently selected from a $C_1$-$C_{10}$ alkyl group, a $C_1$-$C_{10}$ alkoxy group, a phenyl group, a naphthyl group, a biphenyl group, and a terphenyl group, but embodiments of the present disclosure are not limited thereto.

In some embodiments, in Formula 2, $Ar_1$ and $Ar_2$ may be each independently selected from groups represented by Formulae 5-1 to 5-43, in Formula 1, $R_1$ to $R_{12}$ may be each independently selected from groups represented by Formula 2, hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, —$Si(C)_1)(Q_2)(Q_3)$, and groups represented by Formulae 5-1 to 5-43, in Formulae 11 to 13, $R_{301}$ to $R_{304}$ and $R_{311}$ may be each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_2$-$C_{10}$ alkenyl group, and a $C_1$-$C_{10}$ alkoxy group;

a $C_1$-$C_{20}$ alkyl group, a $C_2$-$C_{10}$ alkenyl group, and a $C_1$-$C_{10}$ alkoxy group, each substituted with at least one selected from a phenyl group, a naphthyl group, and an anthracenyl group;

a phenoxy group and a naphthoxy group;

groups represented by Formulae 5-1 to 5-20; and

—$Si(Q_1)(Q_2)(Q_3)$ and —$N(Q_6)(Q_7)$;

where $Q_1$ to $Q_3$, $Q_6$, and $Q_7$ may be each independently selected from a $C_1$-$C_{10}$ alkyl group, a $C_1$-$C_{10}$ alkoxy group, a phenyl group, a naphthyl group, a biphenyl group, and a terphenyl group:

Formula 5-1

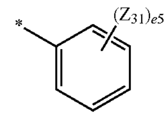

Formula 5-2

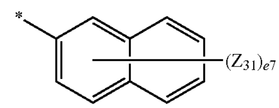

Formula 5-3

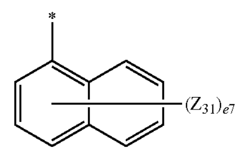

Formula 5-4

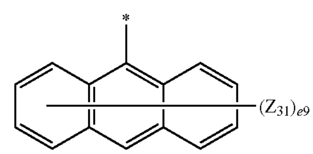

Formula 5-5

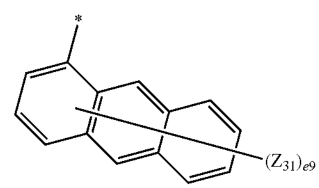

Formula 5-6

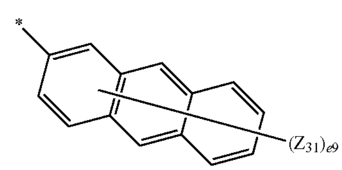

Formula 5-7

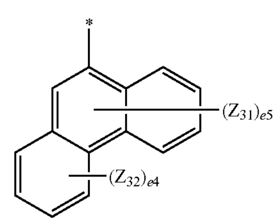

Formula 5-8

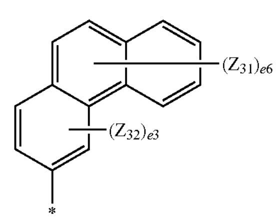

-continued
Formula 5-9
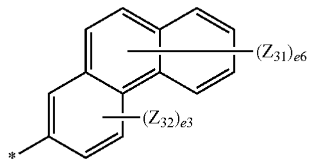
Formula 5-10
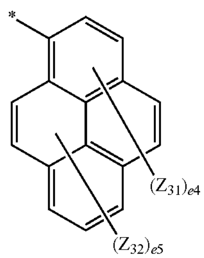
Formula 5-11
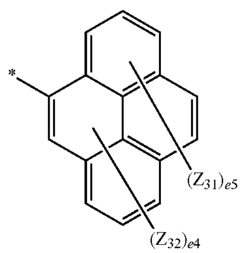
Formula 5-12
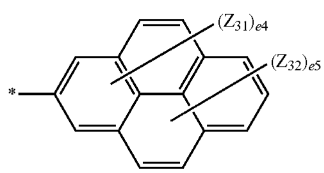
Formula 5-13
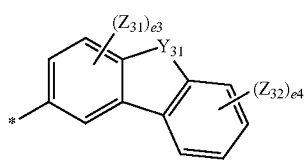
Formula 5-14
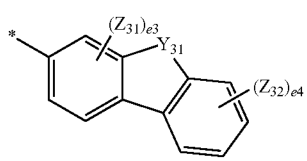
Formula 5-15
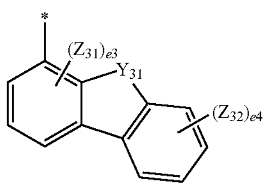
Formula 5-16
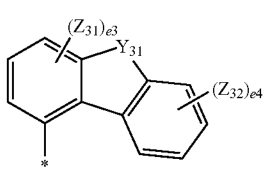
-continued
Formula 5-17
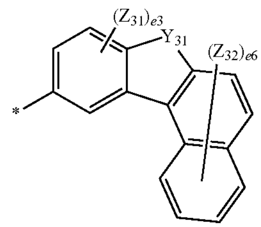
Formula 5-18
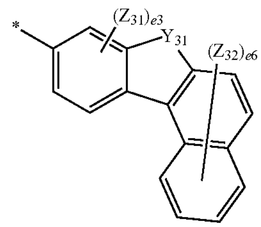
Formula 5-19
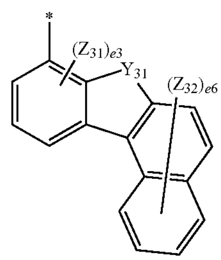
Formula 5-20
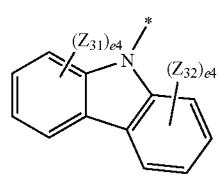
Formula 5-21
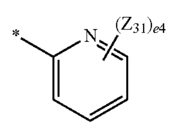
Formula 5-22
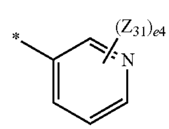
Formula 5-23
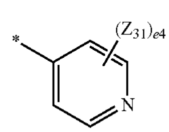
Formula 5-24
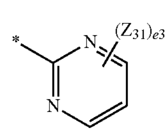
Formula 5-25
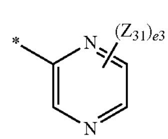

-continued

Formula 5-26

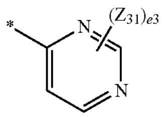

Formula 5-27

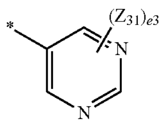

Formula 5-28

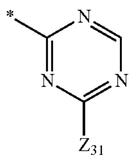

Formula 5-29

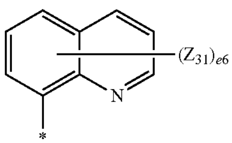

Formula 5-30

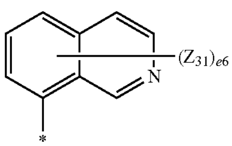

Formula 5-31

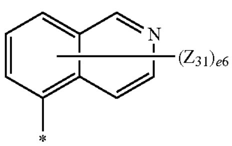

Formula 5-32

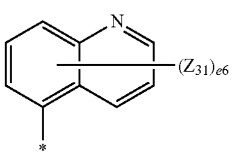

Formula 5-33

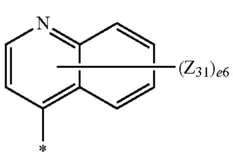

Formula 5-34

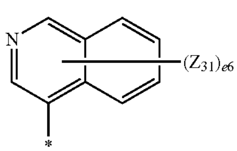

Formula 5-35

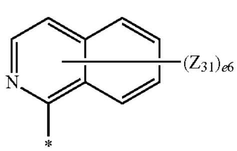

Formula 5-36

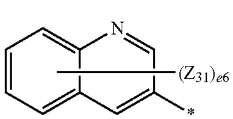

-continued

Formula 5-37

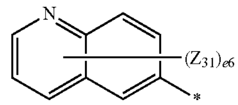

Formula 5-38

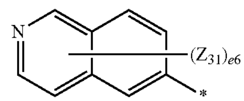

Formula 5-39

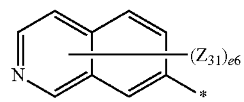

Formula 5-40

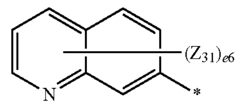

Formula 5-41

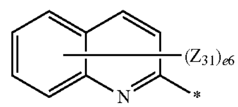

Formula 5-42

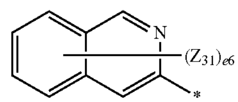

Formula 5-43

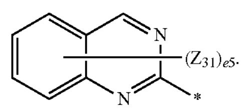

In Formulae 5-1 to 5-43, $Y_{31}$ may be selected from O, S, $C(Z_{33})(Z_{34})$, $N(Z_{35})$, and $Si(Z_{36})(Z_{37})$;

$Z_{31}$ to $Z_{37}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spirobifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a diphenylethenyl group, a biphenyl group, a terphenyl group, and $—Si(Q_{31})(Q_{32})(Q_{33})$, where $Q_{31}$ to $Q_{33}$ may be each independently selected from a $C_1$-$C_{10}$ alkyl group, a $C_1$-$C_{10}$ alkoxy group, a phenyl group, a naphthyl group, a biphenyl group, and a terphenyl group, e2 may be 1 or 2, e3 may be an integer selected from 1 to 3, e4 may be an integer selected from 1 to 4;

e5 may be an integer selected from 1 to 5;

e6 may be an integer selected from 1 to 6;

e7 may be an integer selected from 1 to 7;

e9 may be an integer selected from 1 to 9; and

* indicates a binding site to an adjacent atom.

In some embodiments, in Formula 2, $Ar_1$ and $Ar_2$ may be each independently selected from groups represented by Formulae 6-1 to 6-41, in Formula 1, $R_1$ to $R_{12}$ may be each independently selected from groups represented by Formula 2, hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, —Si($Q_1$)($Q_2$)($Q_3$), a phenyl group, a naphthyl group, a pyridinyl group, a pyrimidinyl group, a triazinyl group, a biphenyl group, and a terphenyl group, where $Q_1$ to $Q_3$ may be each independently selected from a $C_1$-$C_{10}$ alkyl group, a $C_1$-$C_{10}$ alkoxy group, a phenyl group, a naphthyl group, a biphenyl group, and a terphenyl group, but embodiments of the present disclosure are not limited thereto:

Formula 6-1

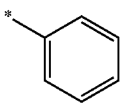

Formula 6-2

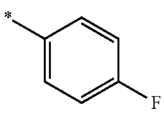

Formula 6-3

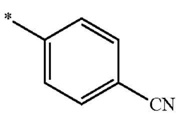

Formula 6-4

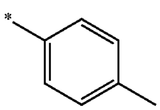

Formula 6-5

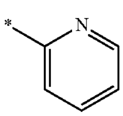

Formula 6-6

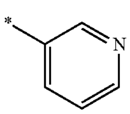

Formula 6-7

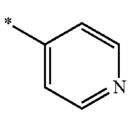

Formula 6-8

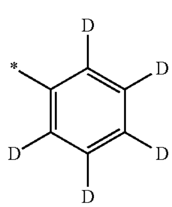

Formula 6-9

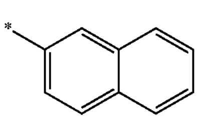

-continued

Formula 6-10

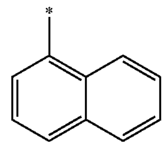

Formula 6-11

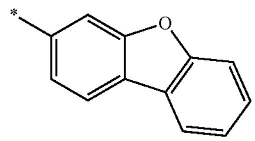

Formula 6-12

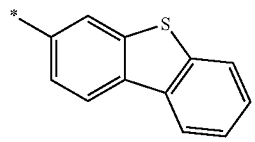

Formula 6-13

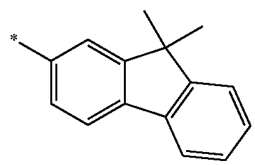

Formula 6-14

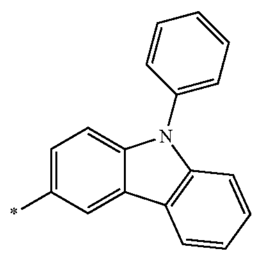

Formula 6-15

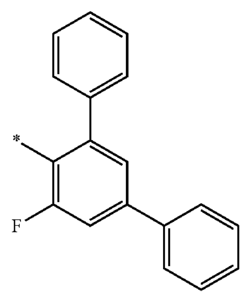

Formula 6-16

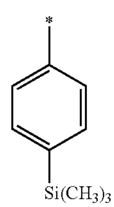

Formula 6-17

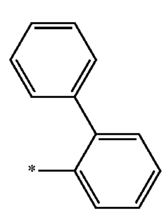

-continued
Formula 6-18
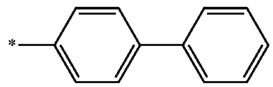
Formula 6-19
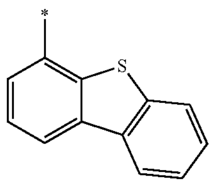
Formula 6-20
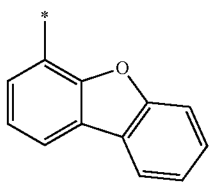
Formula 6-21
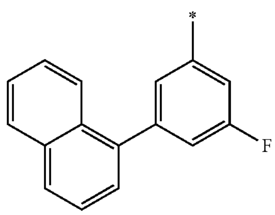
Formula 6-22
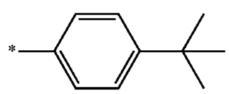
Formula 6-23
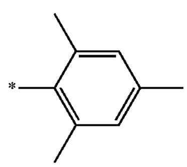
Formula 6-24
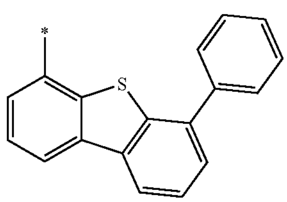
Formula 6-25
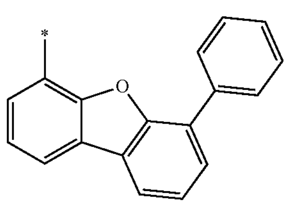
Formula 6-26
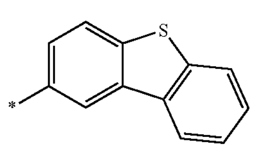
-continued
Formula 6-27
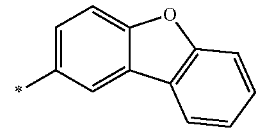
Formula 6-28
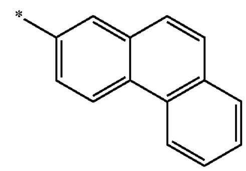
Formula 6-29
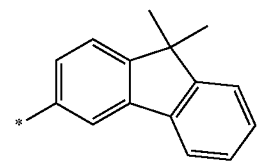
Formula 6-30
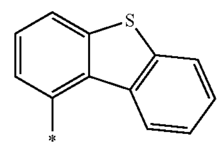
Formula 6-31
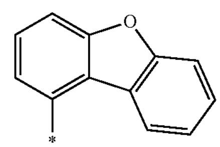
Formula 6-32
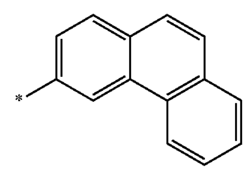
Formula 6-33
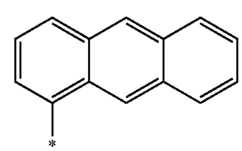
Formula 6-34
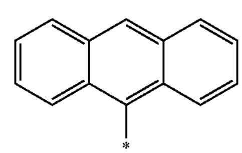
Formula 6-35
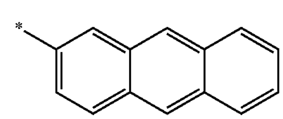

-continued

Formula 6-36

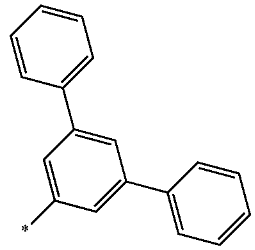

Formula 6-37

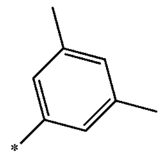

Formula 6-38

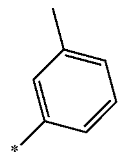

Formula 6-39

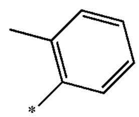

Formula 6-40

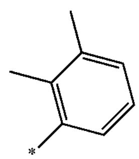

Formula 6-41

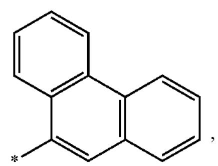

where, in Formulae 6-1 to 6-41, * indicates a binding site to an adjacent atom, and "D" may represent "deuterium.

In some embodiments, in Formula 1, $R_5$ may not be hydrogen.

In some embodiments, in Formula 1, $R_5$ may be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a pyridinyl group, a pyrimidinyl group, and a triazinyl group, but embodiments of the present disclosure are not limited thereto.

In Formula 1, any of at least two selected from $R_1$ to $R_{12}$ may be a group represented by Formula 2.

In Formula 13, xb20 may be an integer selected from 1 to 10. In some embodiments, xb20 may be an integer selected from 1 to 6, but embodiments of the present disclosure are not limited thereto.

In some embodiments, the condensed cyclic compound represented by Formula 1 may be represented by one of Formulae 1-1 to 1-4:

Formula 1-1

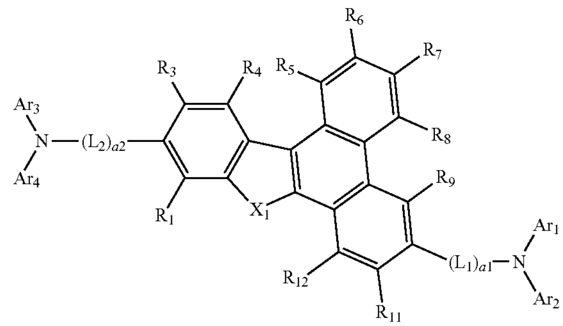

Formula 1-2

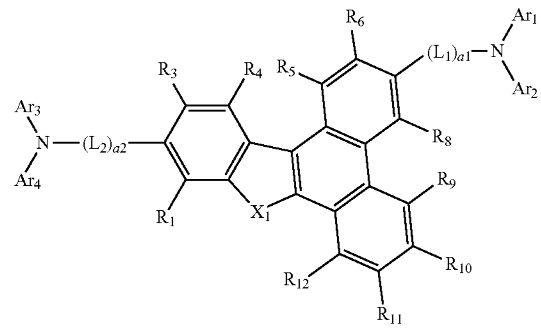

Formula 1-3

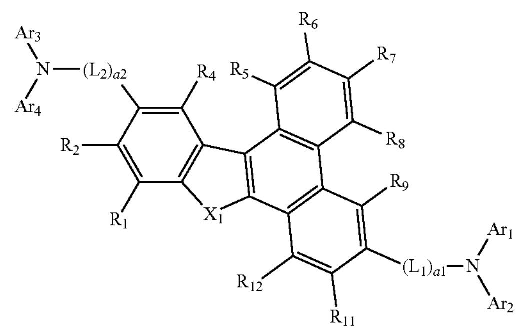

Formula 1-4

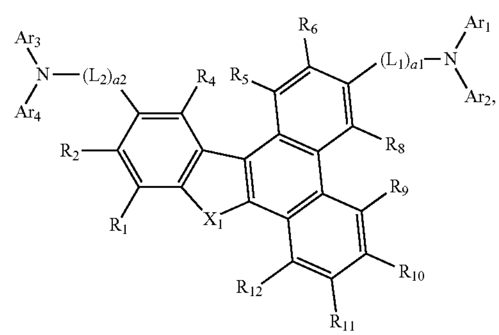

where, in Formulae 1-1 to 1-4, descriptions for $X_1$, $L_1$, a1, $Ar_1$, $Ar_2$, and $R_1$ to $R_{12}$ are as provided herein, and descriptions for $L_2$, $a_2$, $Ar_3$, and $Ar_4$ are the same as those provided in connection with $L_1$, a1, $Ar_1$, and $Ar_2$, respectively.

In some embodiments, in Formulae 1-1 to 1-4, a1 and a2 may both be 0;

a1 may be 0, and a2 may be 1 or 2;

a1 may be 1 or 2, and a2 may be 0;

a1 and a2 may both be 1;

a1 may be 1, and a2 may be 2;

a1 may be 2, and a2 may be 1; or a1 and a2 may both be 2.

In some embodiments, in Formulae 1-1 to 1-4, a1 and a2 may both be 0;

a1 may be 0, and a2 may be 1;

a1 may be 1, and a2 may be 0; or a1 and a2 may both be 1, but embodiments of the present disclosure are not limited thereto.

In Formulae 1-1 to 1-4, $Ar_1$, $Ar_2$, $Ar_3$, and $Ar_4$ may each be the same ($Ar_1=Ar_2=Ar_3=Ar_4$);

$Ar_1$ and $Ar_3$ may be the same, $Ar_2$ and $Ar_4$ may be the same, and $Ar_2$ and $Ar_3$ may be different from each other ($Ar_1=Ar_3$, $Ar_2=Ar_4$, and $Ar_2\neq Ar_3$);

$Ar_1$ and $Ar_3$ may be the same, $Ar_2$ and $Ar_4$ may be different from each other, and $Ar_2$ and $Ar_3$ may be different from each other ($Ar_1=Ar_3$, $Ar_2\neq Ar_4$, and $Ar_2\neq Ar_3$); or $Ar_1$, $Ar_2$, $Ar_3$, and $Ar_4$ may be different from each other ($Ar_1\neq Ar_2\neq Ar_3\neq Ar_4$).

In some embodiments, the condensed-cyclic compound represented by Formula 1 may be represented by one of Formulae 1-1(1) to 1-1(4), but embodiments of the present disclosure are not limited thereto:

Formula 1-1(1)

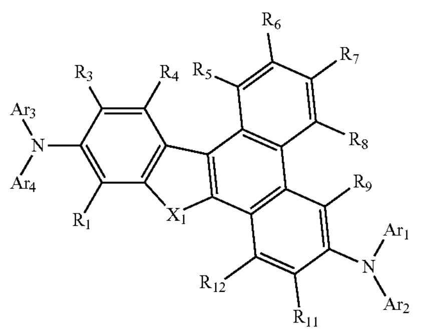

Formula 1-1(2)

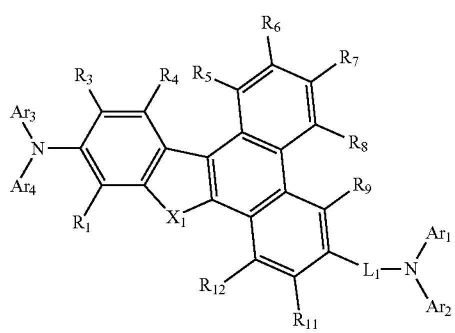

Formula 1-1(3)

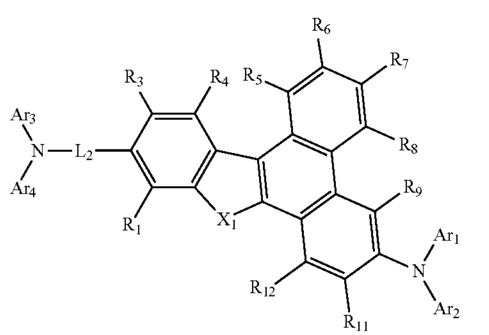

-continued

Formula 1-1(4)

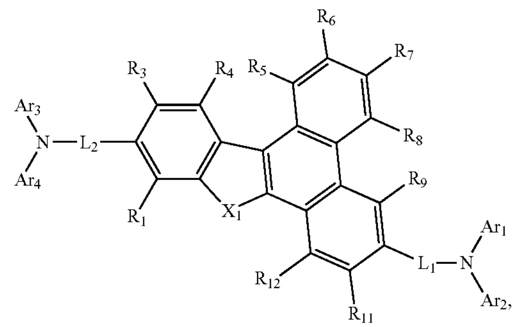

where, in Formulae 1-1(1) to 1-1(4), $X_1$, $L_1$, $Ar_1$, $Ar_2$, $R_1$, $R_3$ to $R_9$, and $R_{11}$ to $R_{12}$ are as defined herein, and descriptions for $L_2$, $Ar_3$, and $Ar_4$ are the same as those provided in connection with $L_1$, $Ar_1$, and $Ar_2$, respectively.

In some embodiments, in Formula 1, $R_5$ may not be hydrogen. For example, in Formula 1, $R_5$ may be a $C_1$-$C_{10}$ alkyl group, but embodiments of the present disclosure are not limited thereto.

The first compound may be represented by one of Formulae 11-1 to 11-7, the second compound may be represented by one of Formulae 12-1 to 12-3, and the third compound may be represented by one of Formulae 13-1 to 13-11:

Formula 11-1

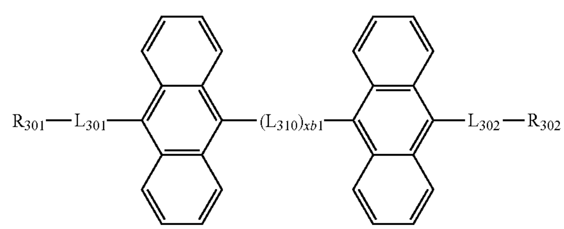

Formula 11-2

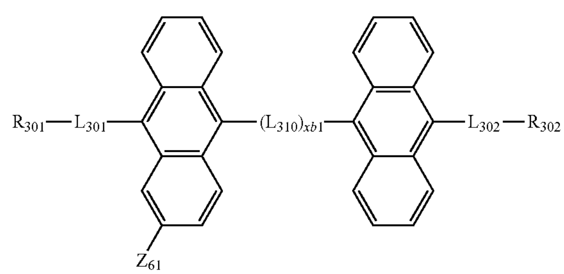

Formula 11-3

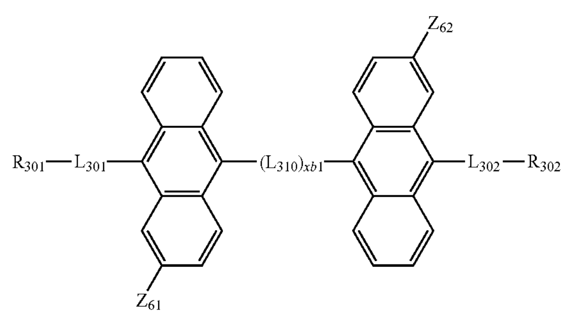

-continued
Formula 11-4
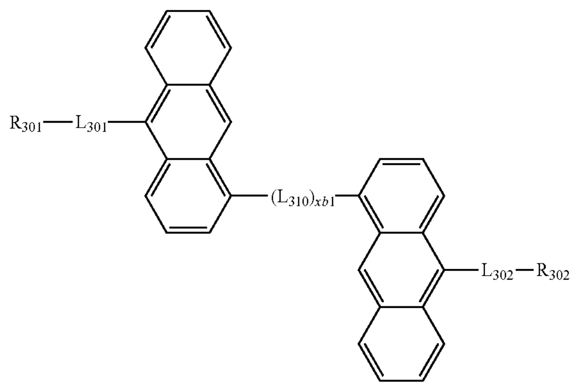
Formula 11-5
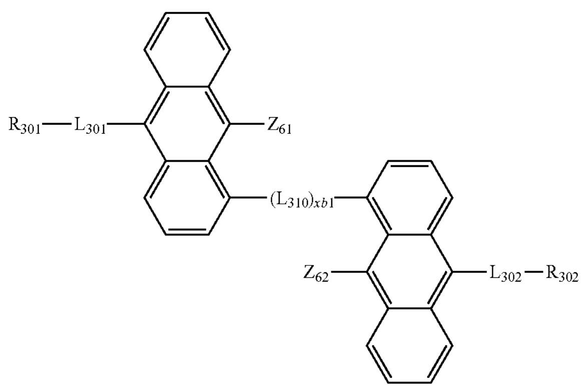
Formula 11-6
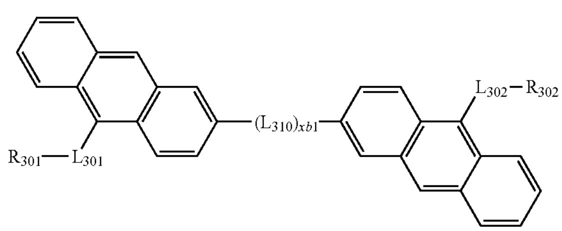
Formula 11-7
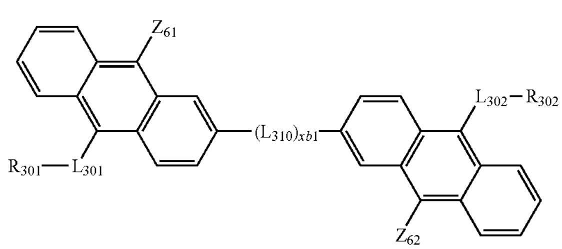
Formula 12-1
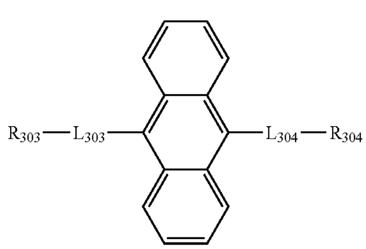
-continued
Formula 12-2
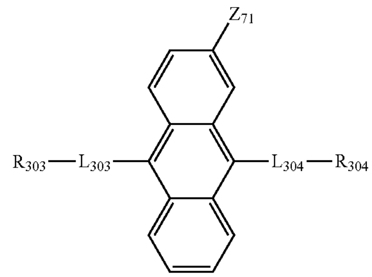
Formula 12-3
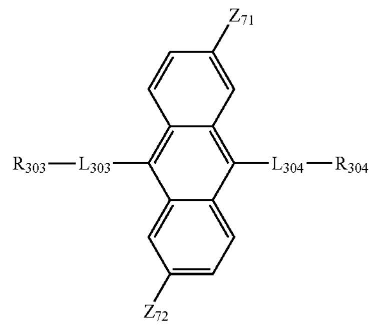
Formula 13-1
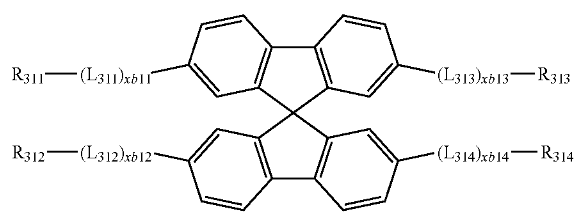
Formula 13-2
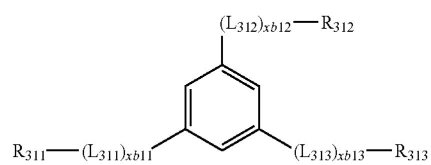
Formula 13-3
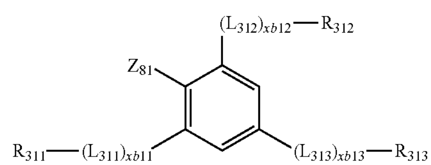
Formula 13-4
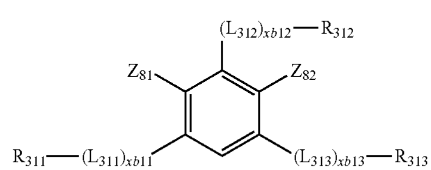
Formula 13-5
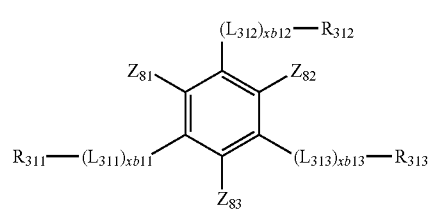

-continued

Formula 13-6

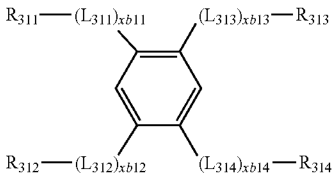

Formula 13-7

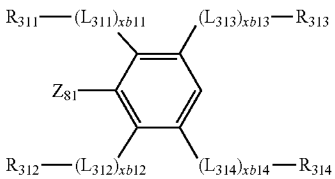

Formula 13-8

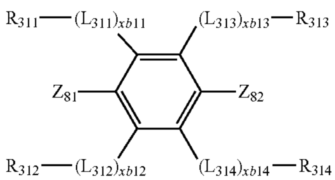

Formula 13-9

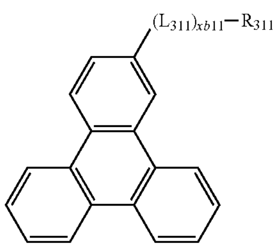

Formula 13-10

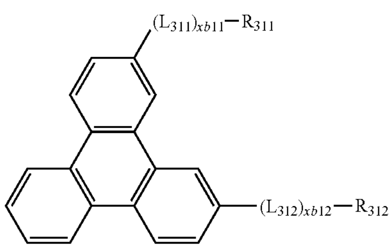

Formula 13-11

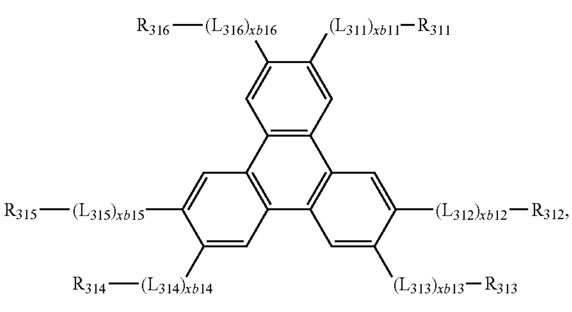

where, in Formulae 11-1 to 11-7, 12-1 to 12-3, and 13-1 to 13-11, descriptions for $L_{301}$ to $L_{304}$, $L_{310}$, $L_{311}$, xb1, xb11, $R_{301}$ to $R_{304}$, and $R_{311}$ may be the same as defined herein, descriptions for $L_{312}$ to $L_{316}$ may each independently be the same as that of $L_{311}$, descriptions for xb12 to xb16 may each independently be the same as that of xb11, descriptions for $R_{312}$ to $R_{316}$ may each independently be the same as that of $R_{311}$, and $Z_{61}$, $Z_{62}$, $Z_{71}$, $Z_{72}$, and $Z_{81}$ to $Z_{83}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spirobifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an indolyl group, a benzothiophenyl group, a benzofuranyl group, a carbazolyl group, a dibenzothiophenyl group, a dibenzofuranyl group, a diphenylethenyl group, a biphenyl group, a terphenyl group, and —Si($Q_{31}$)($Q_{32}$)($Q_{33}$), where $Q_{31}$ to $Q_{33}$ may be each independently selected from a $C_1$-$C_{10}$ alkyl group, a $C_1$-$C_{10}$ alkoxy group, a phenyl group, a naphthyl group, a pyridinyl group, a pyrimidinyl group, a triazinyl group, a biphenyl group, and a terphenyl group.

In some embodiments, the condensed cyclic compound represented by Formula 1 may be one selected from Compounds 1 to 248 and 1A to 249A, but embodiments of the present disclosure are not limited thereto:

1

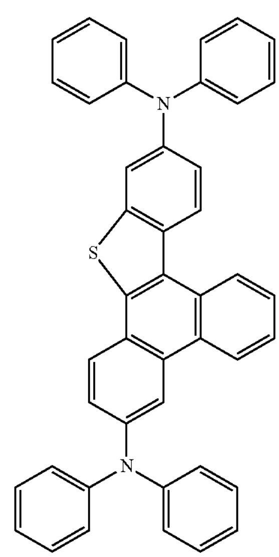

-continued
2
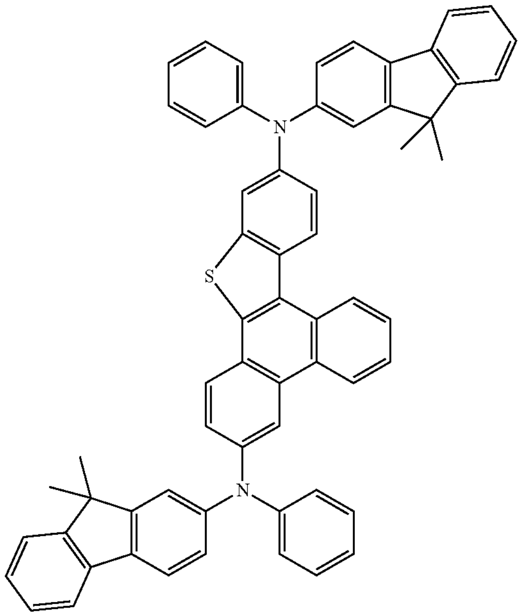
3
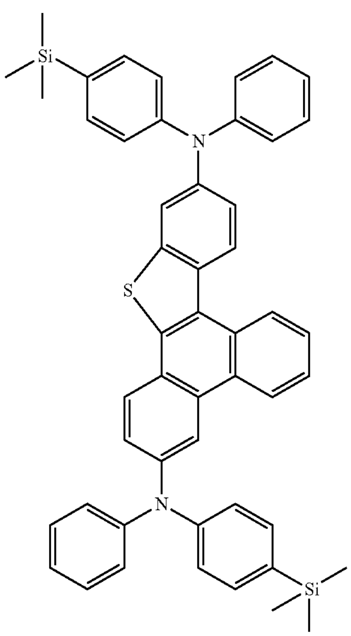
-continued
4
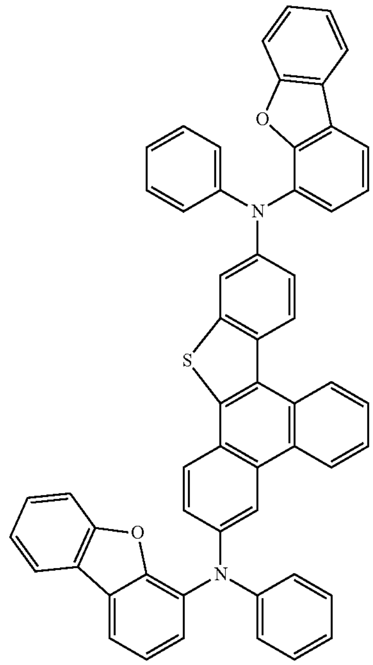
5
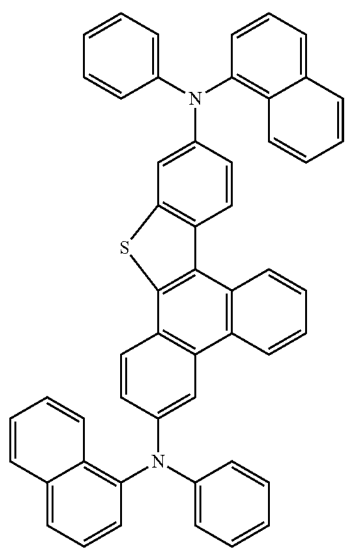

6
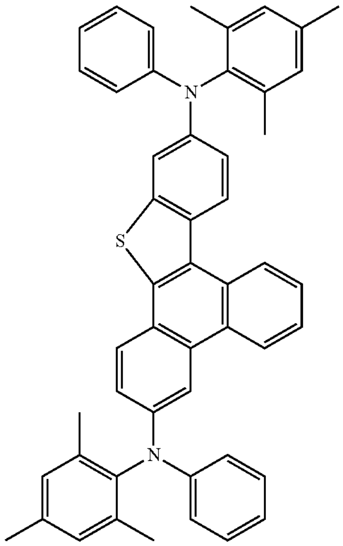
7
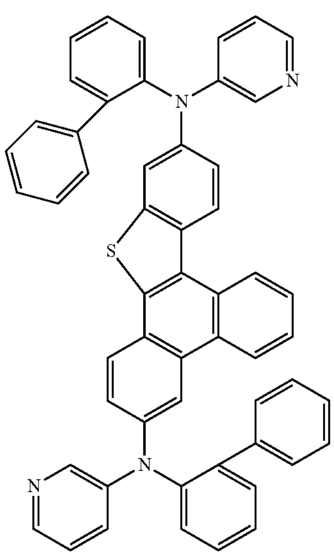
8
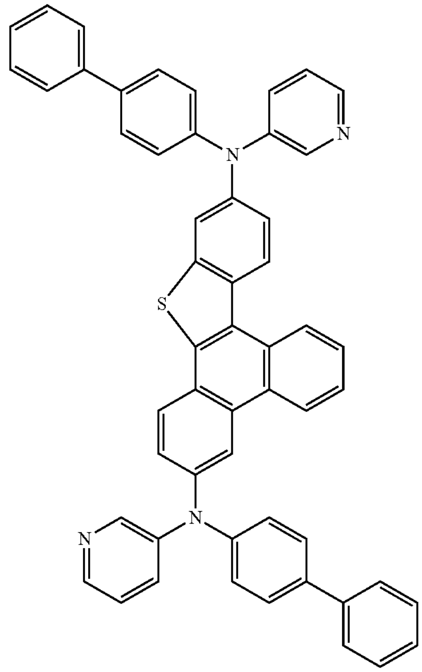
9
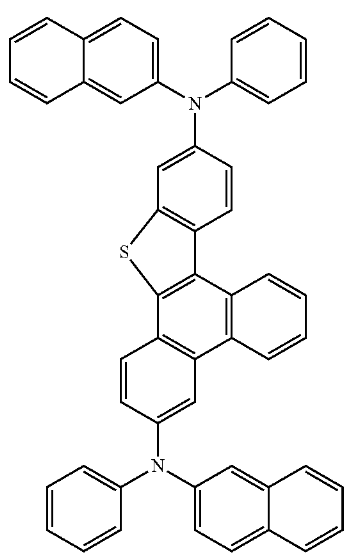

10
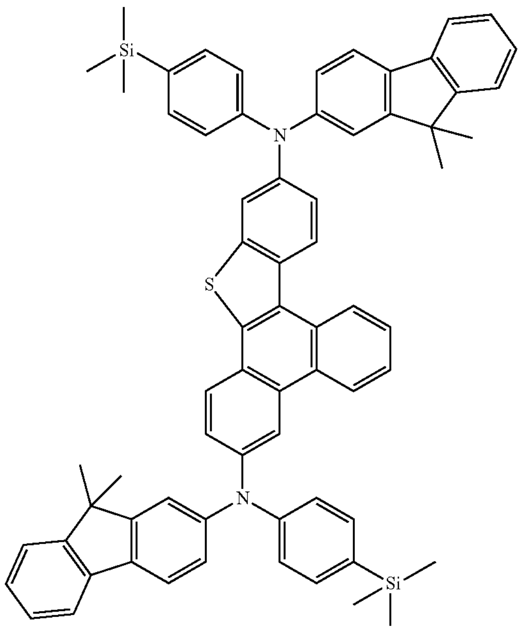
11
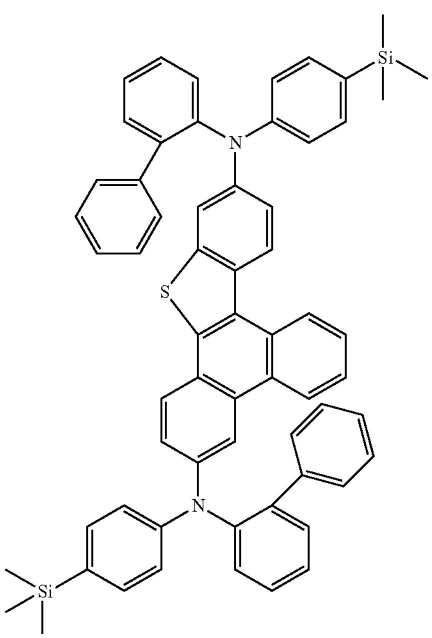
12
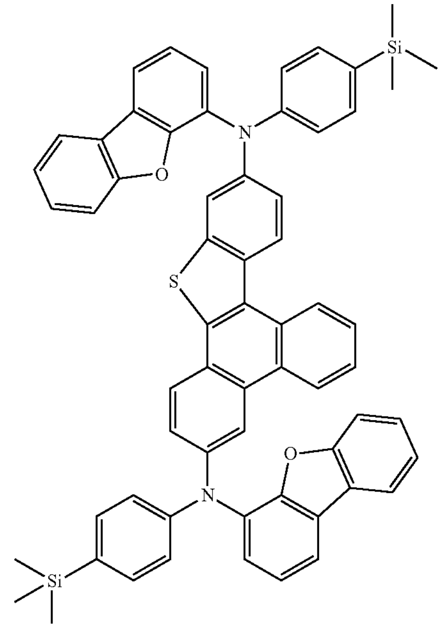
13
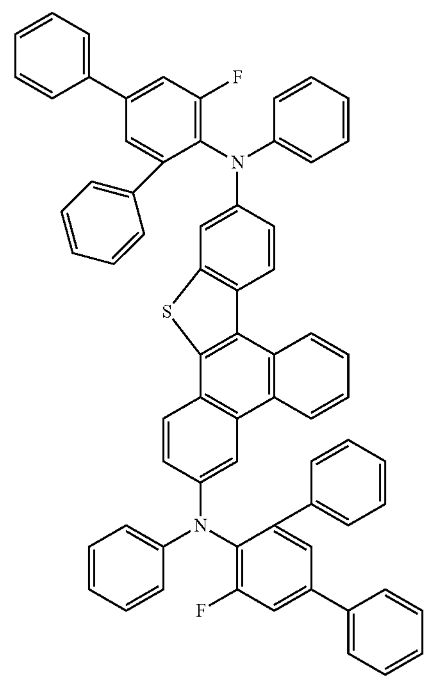

-continued
14
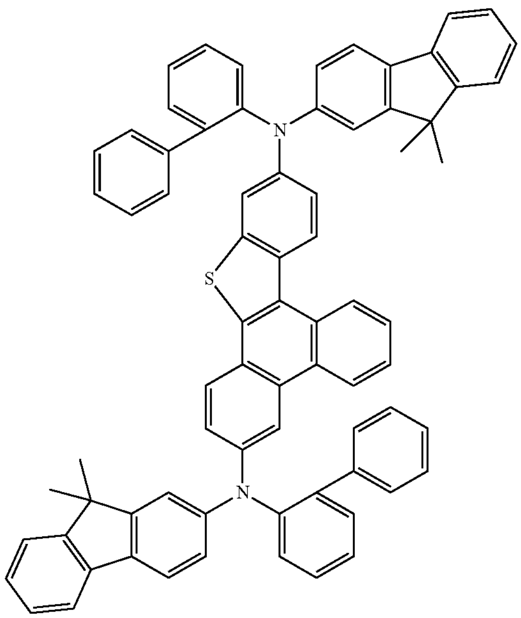
15
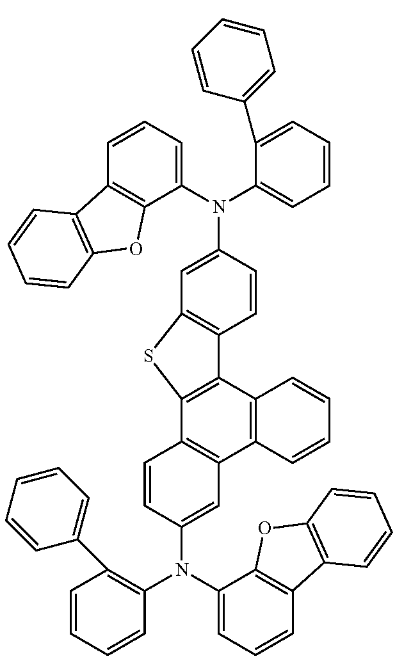
-continued
16
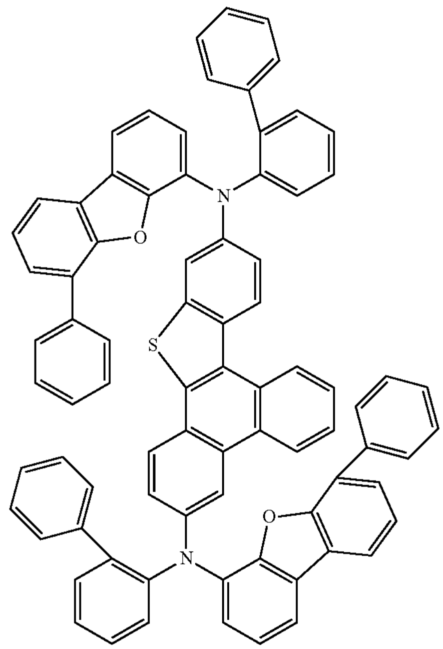
17
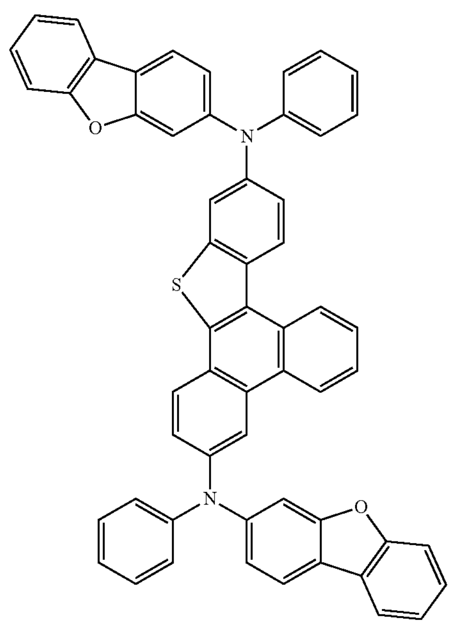

-continued
18
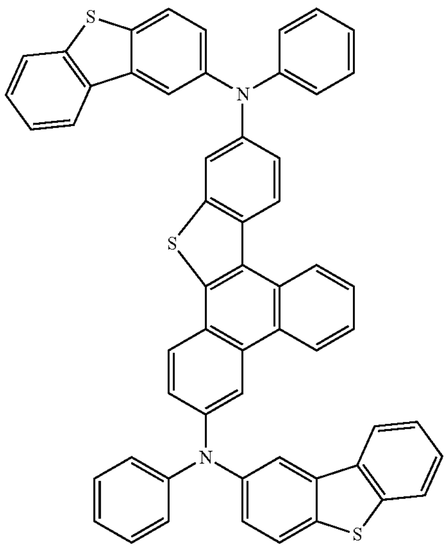
19
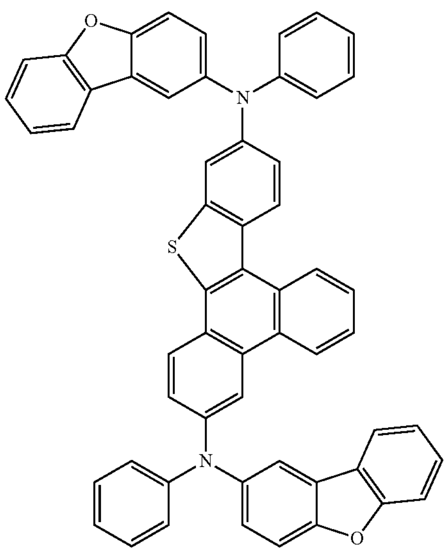
20
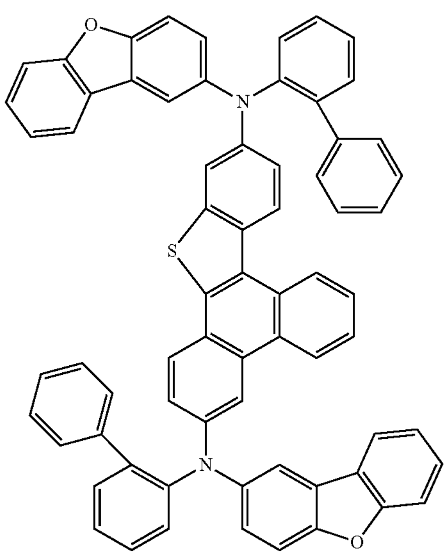
-continued
21
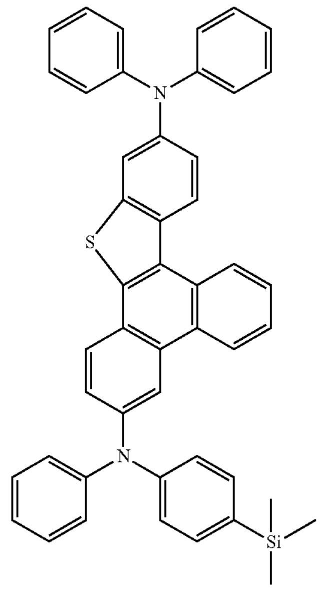
22
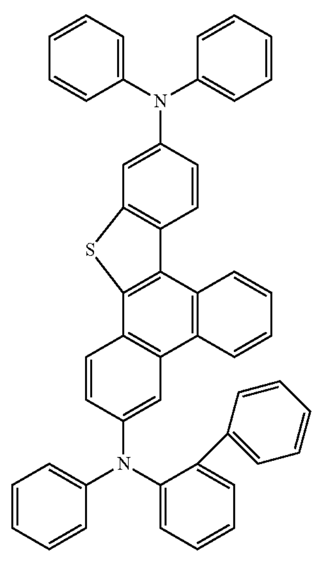

-continued
23
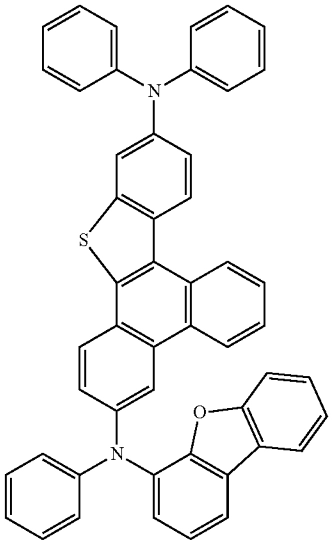
24
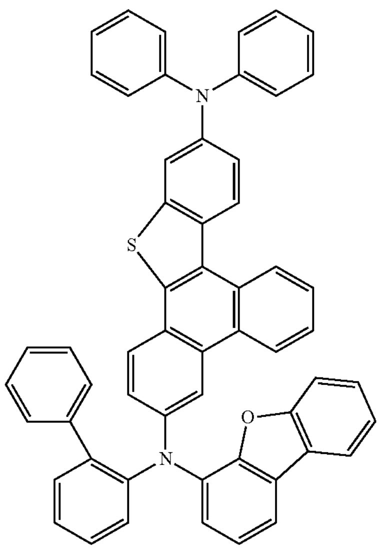
25
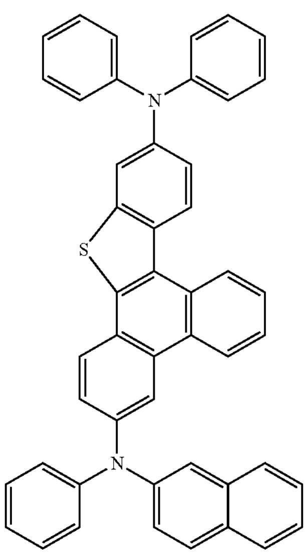
-continued
26
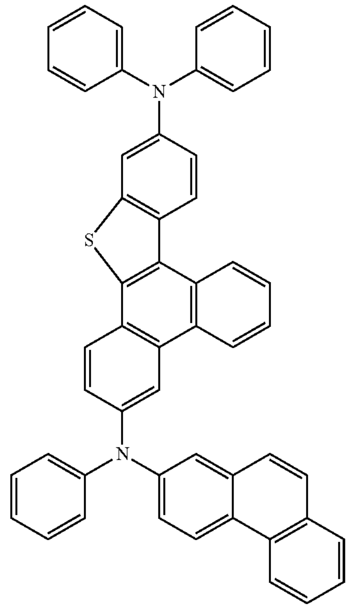
27
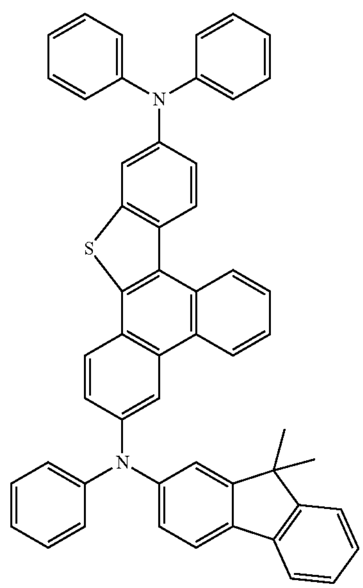

28
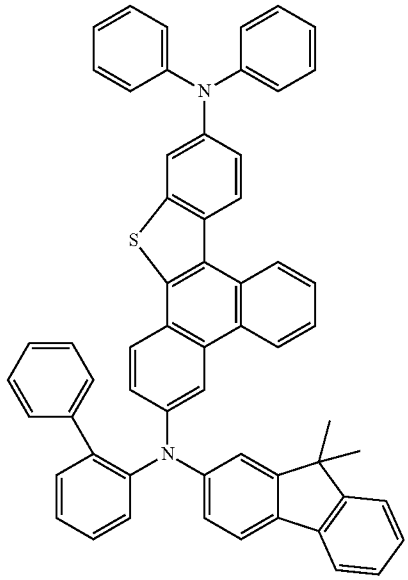
29
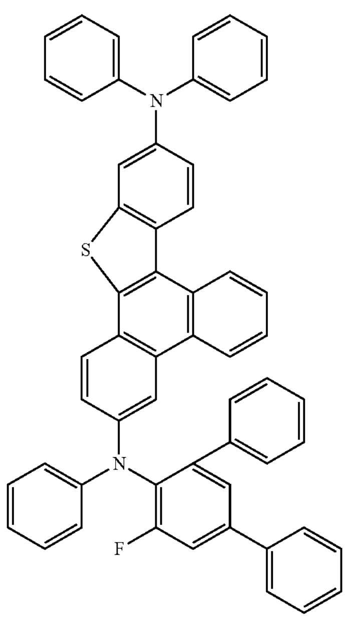
30
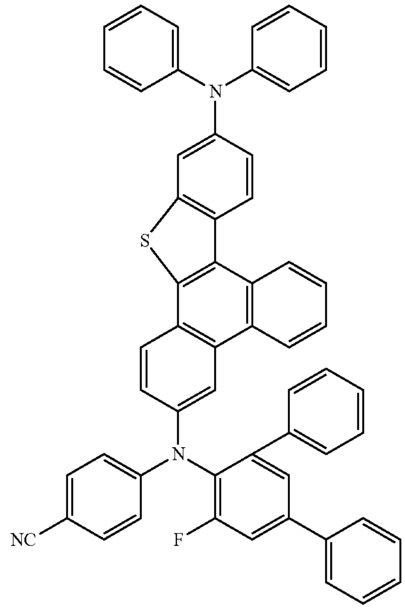
31
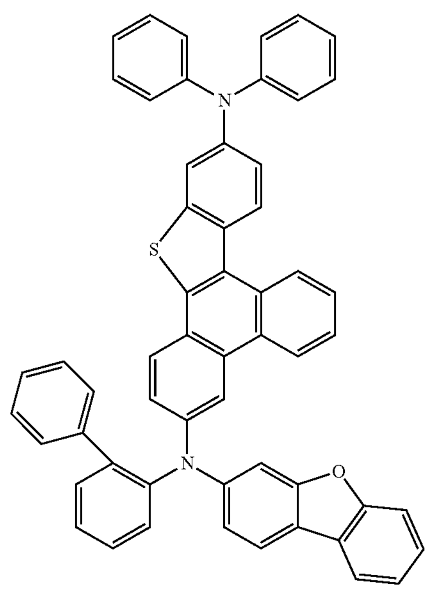

32
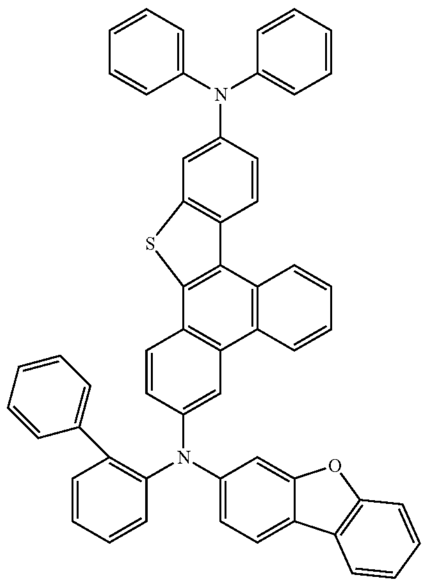
33
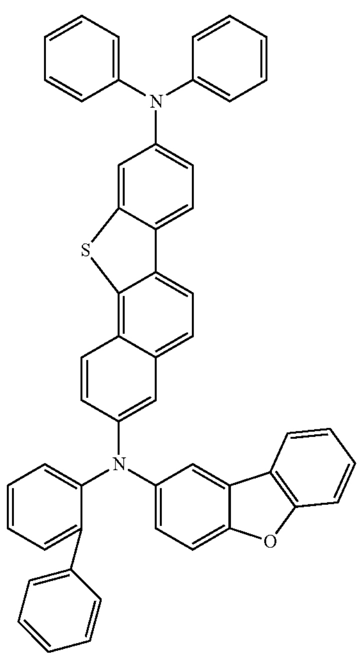
34
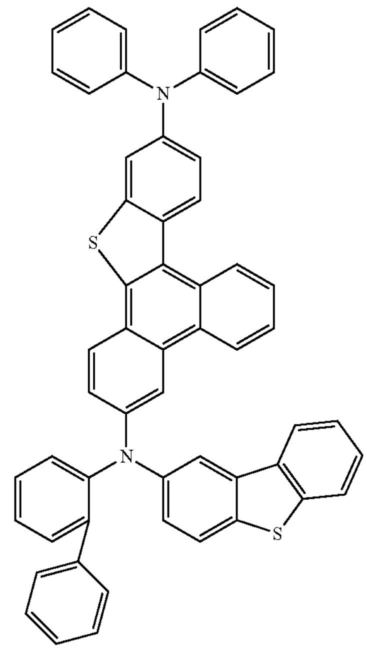
35
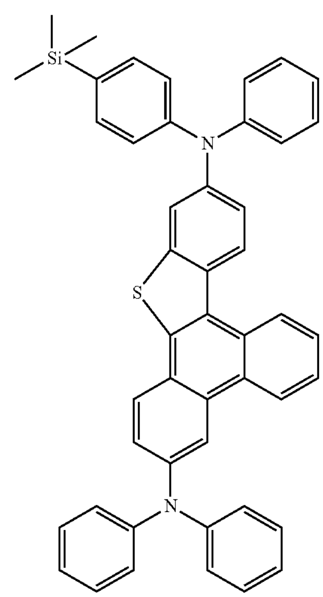

36
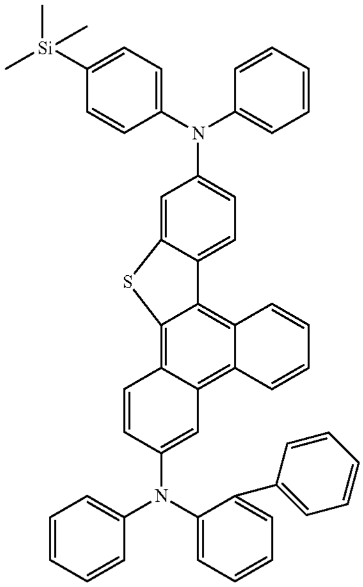
37
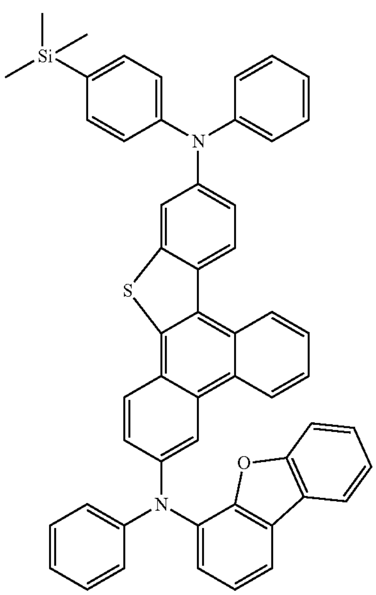
38
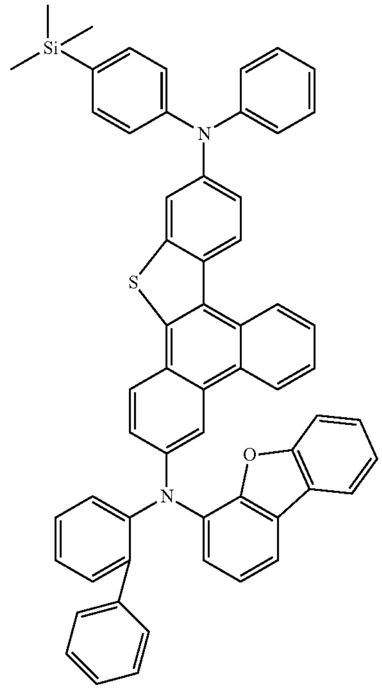
39
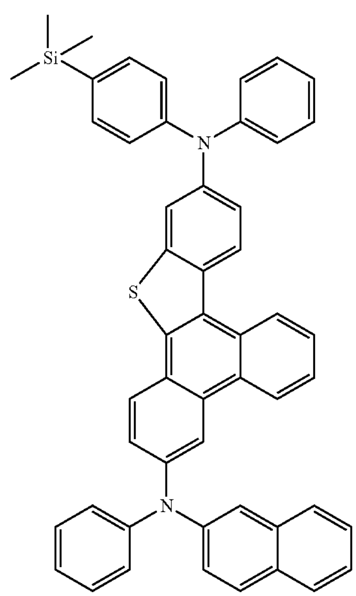

-continued
40
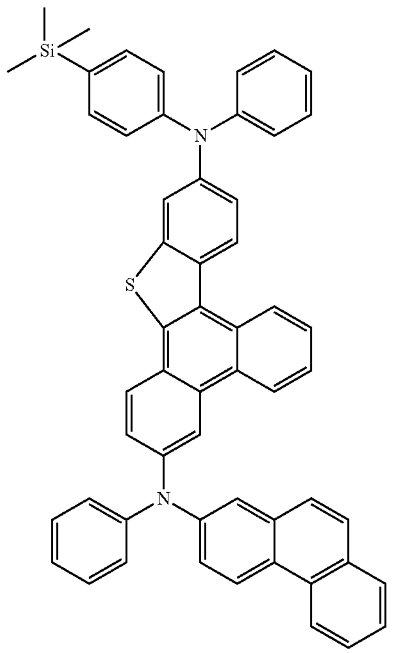
41
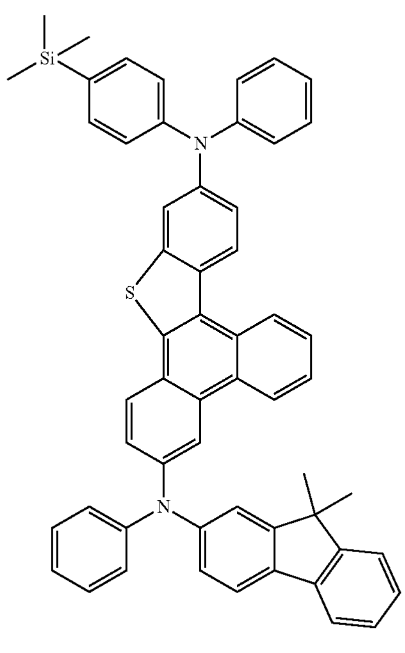
-continued
42
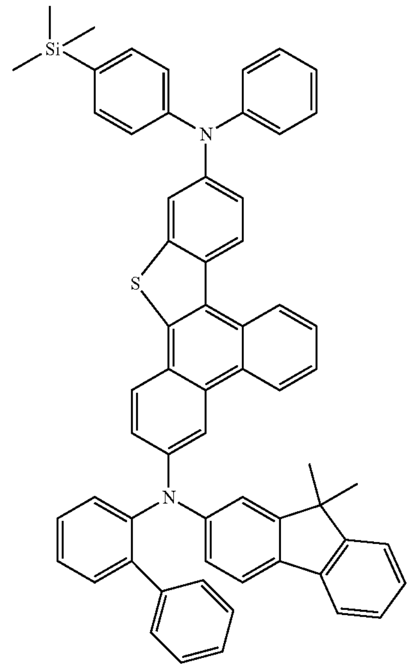
43
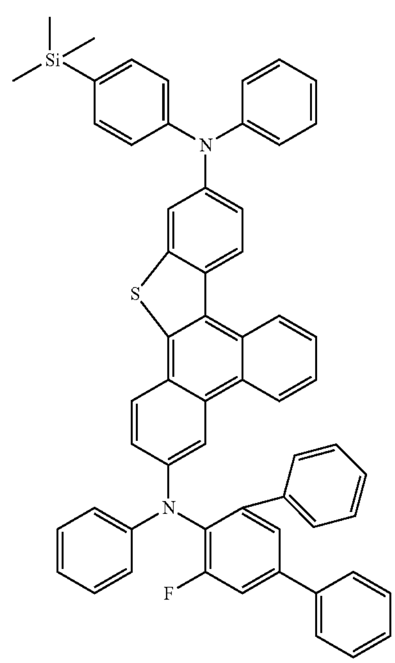

-continued
44
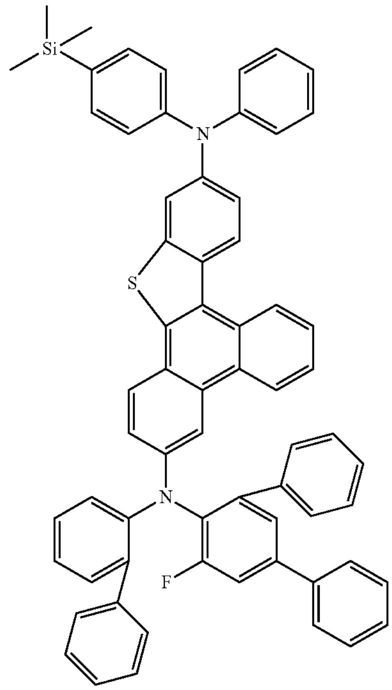
45
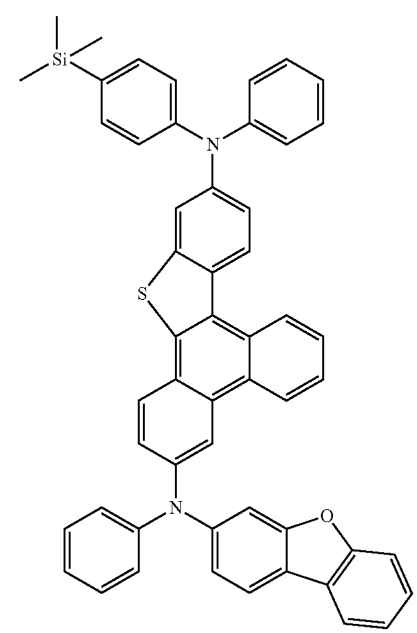
-continued
46
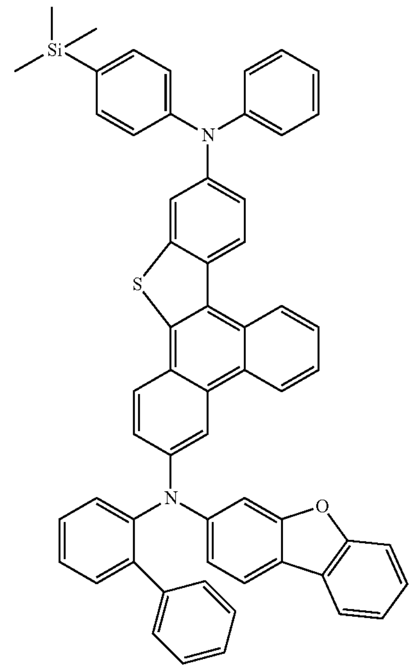
47
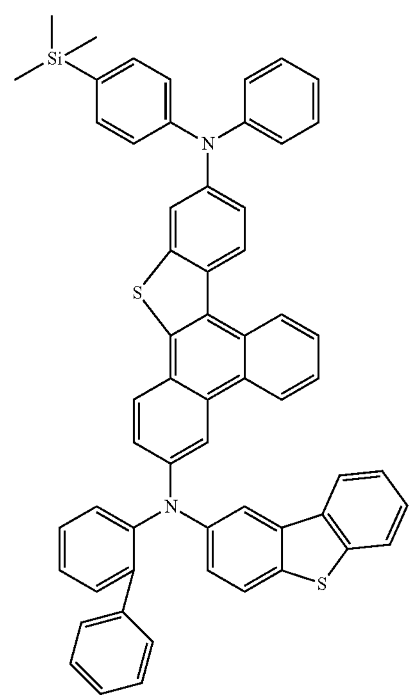

-continued
48
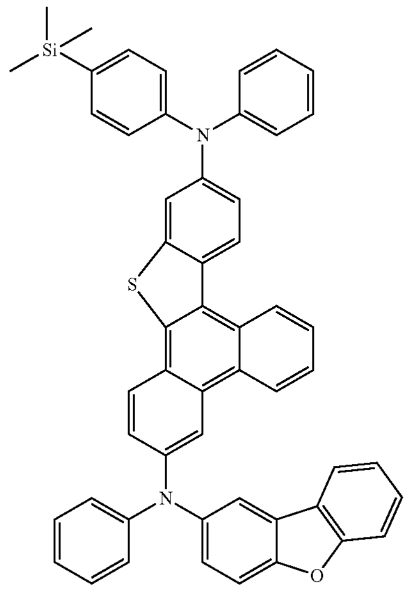
49
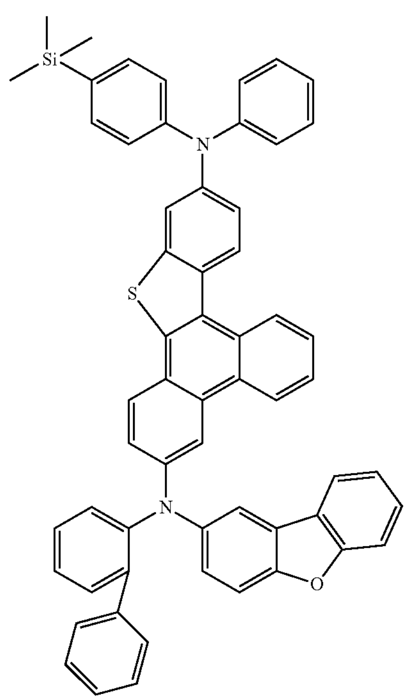
-continued
50
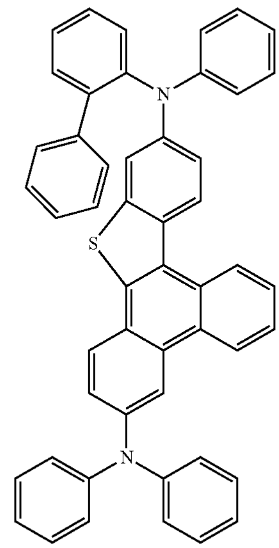
51
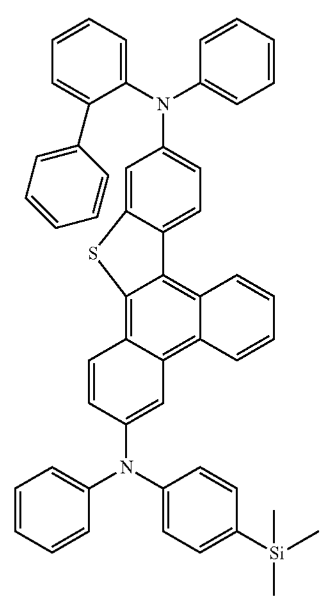

-continued
52
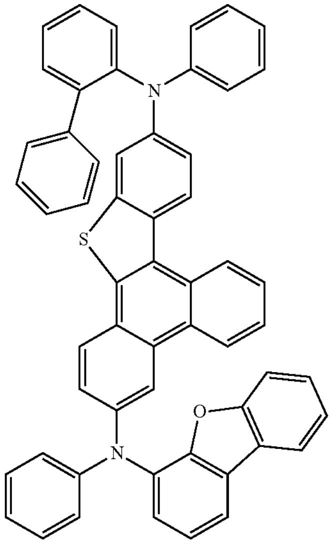
53
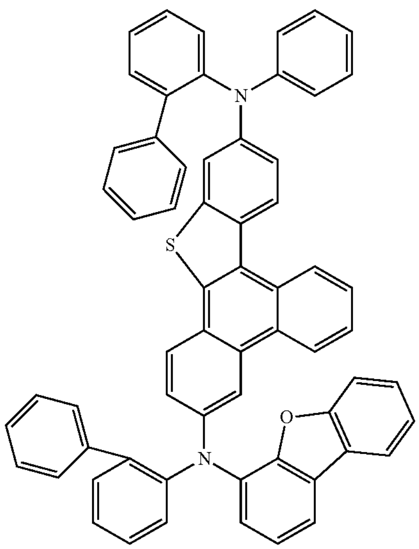
54
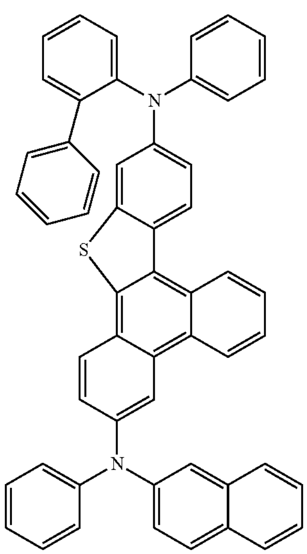
-continued
55
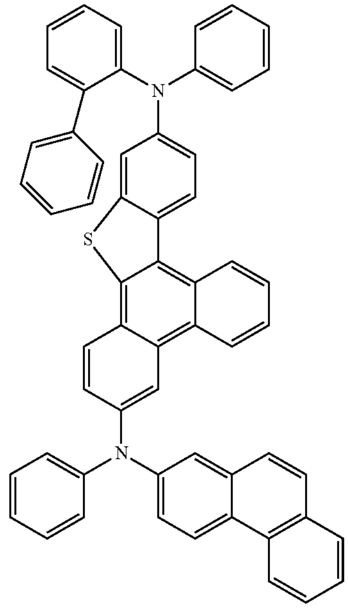
56
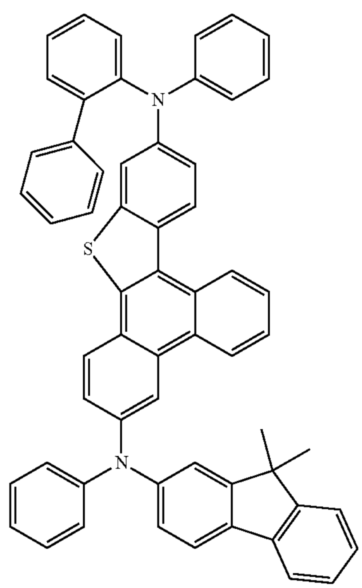

-continued
57
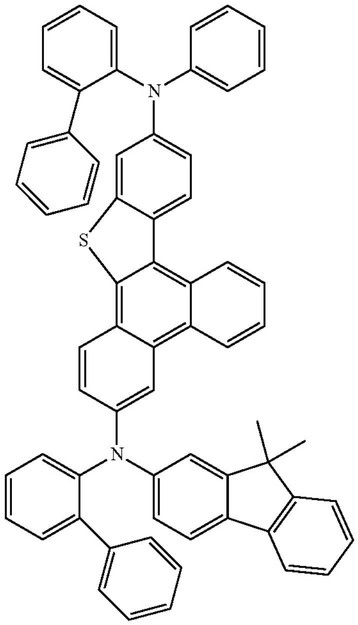
58
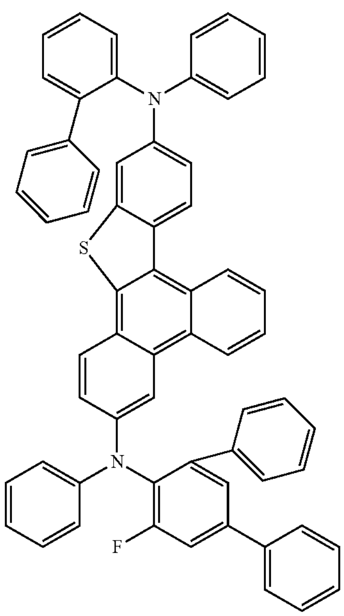
-continued
59
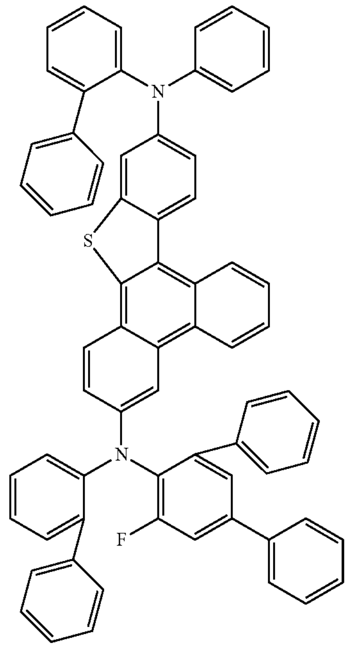
60
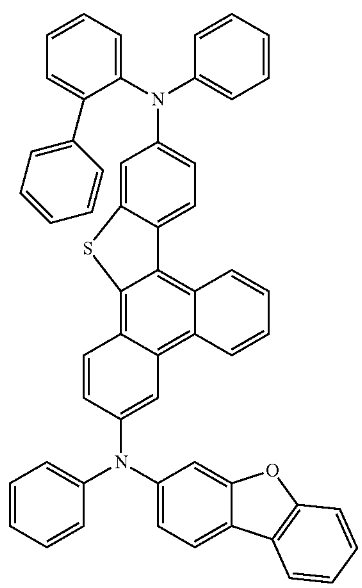

-continued
61
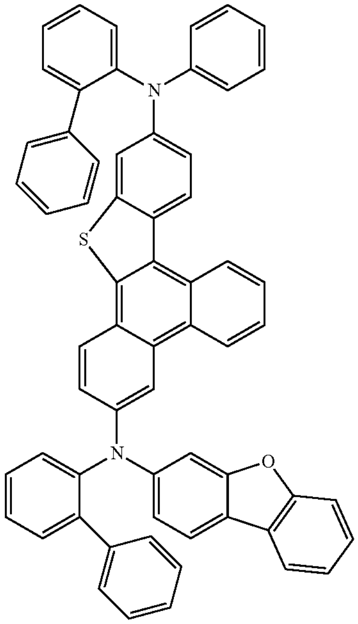
62
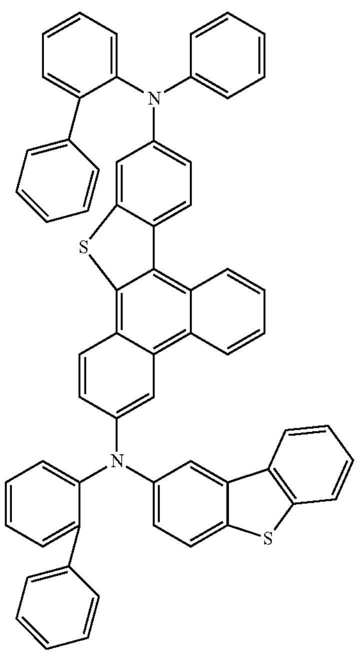
-continued
63
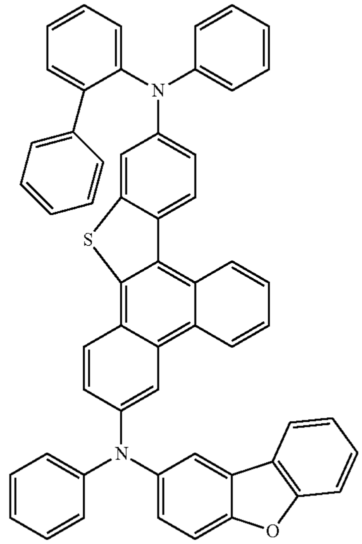
64
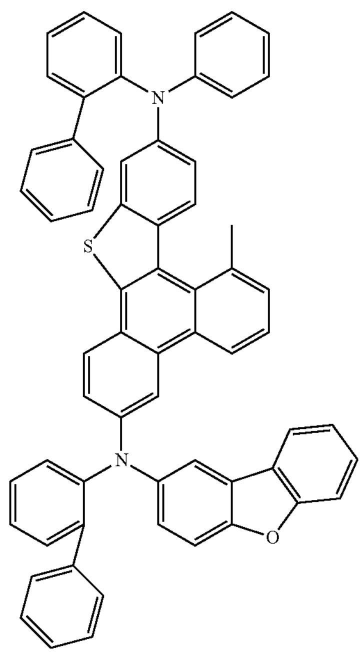

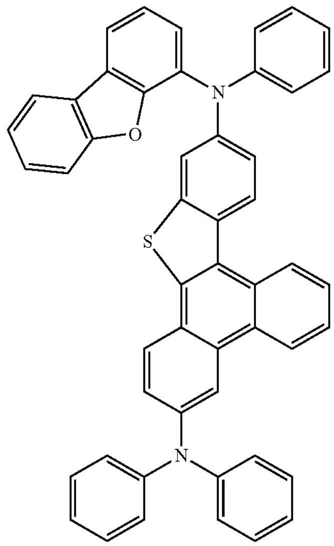
65
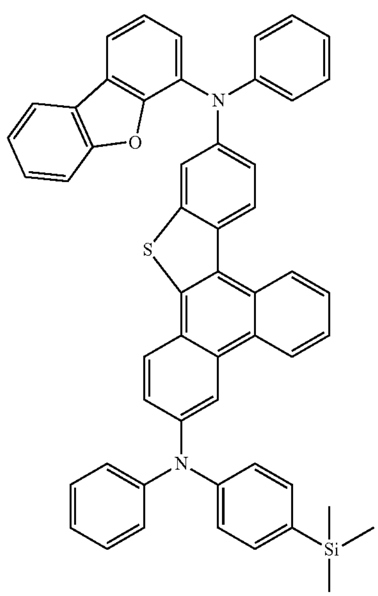
66
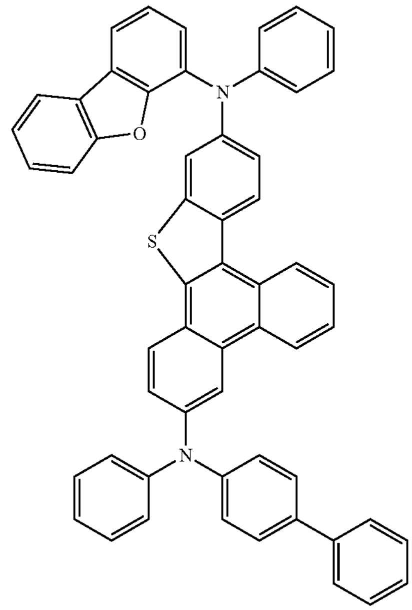
67
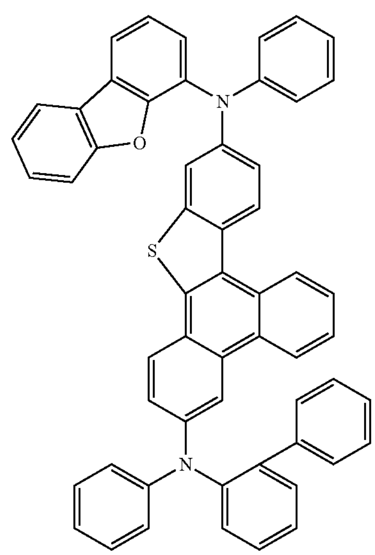
68

-continued
69
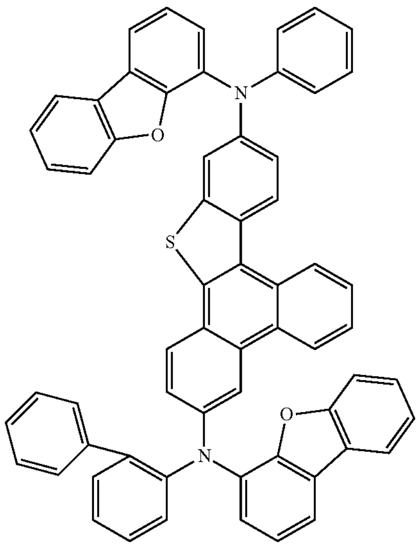
70
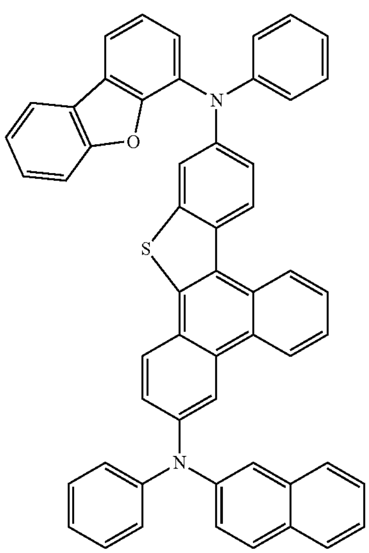
-continued
71
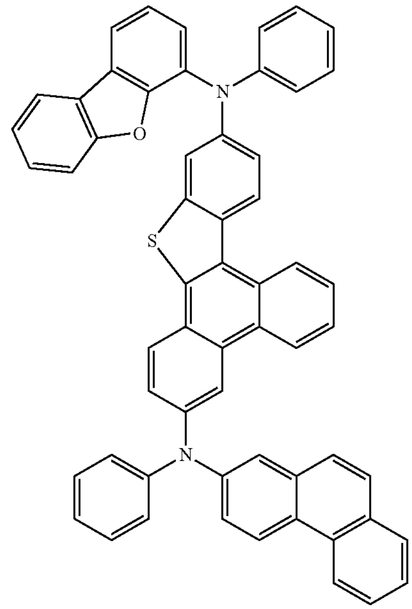
72
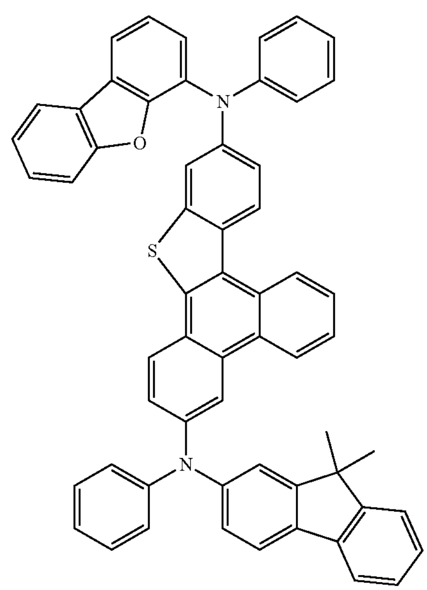

-continued
73
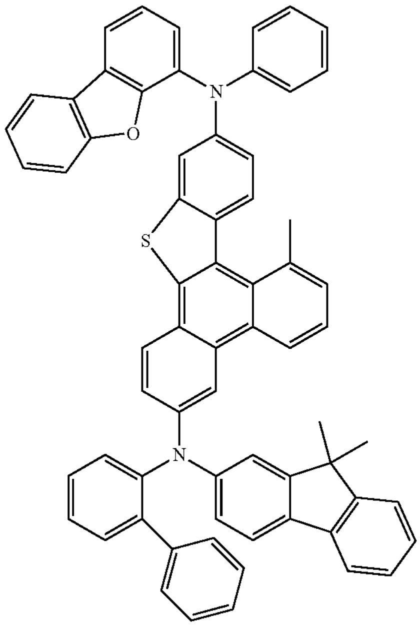
75
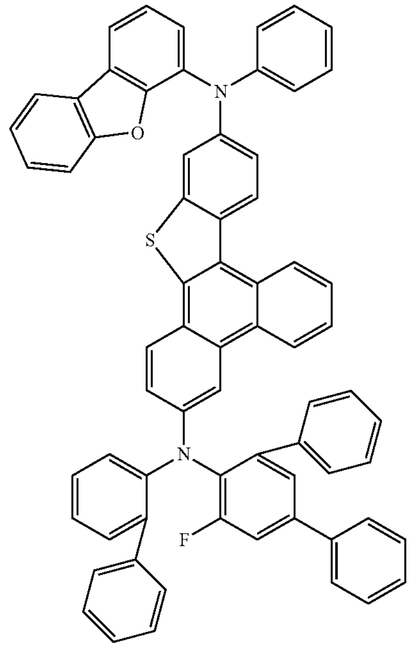
74
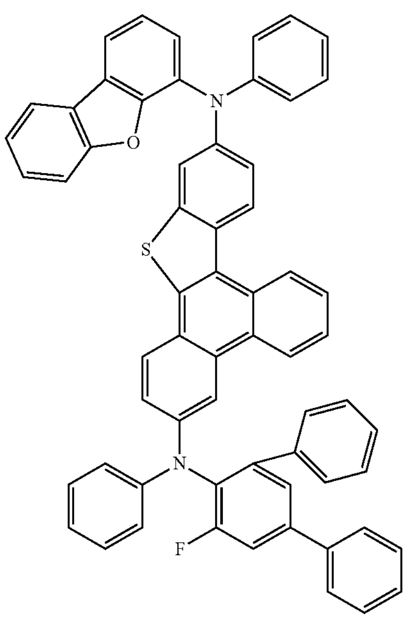
76
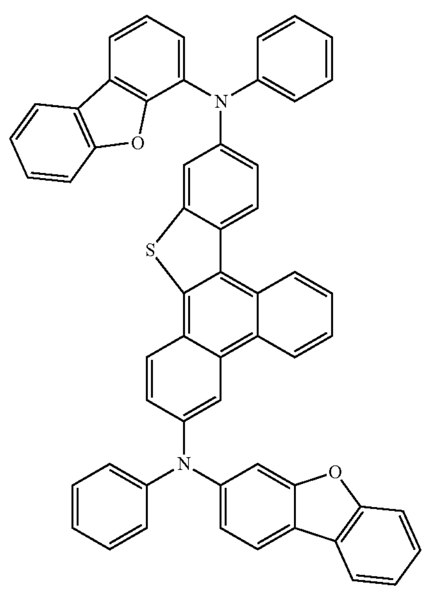

-continued
77
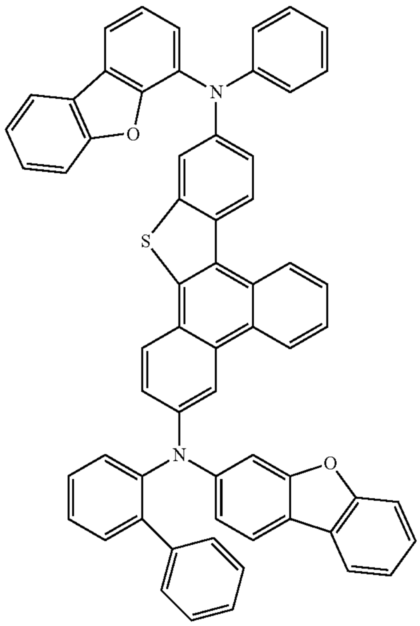
78
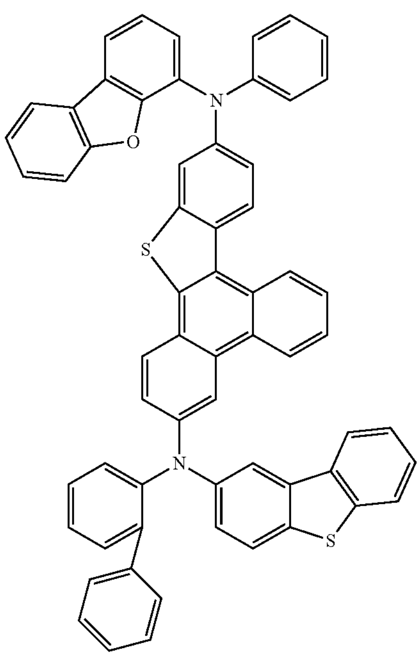
-continued
79
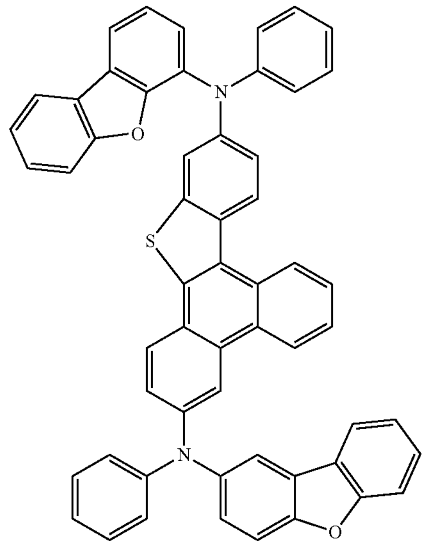
80
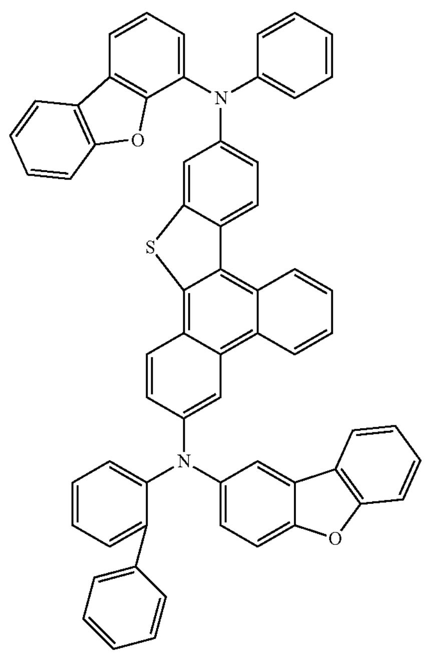

-continued
81
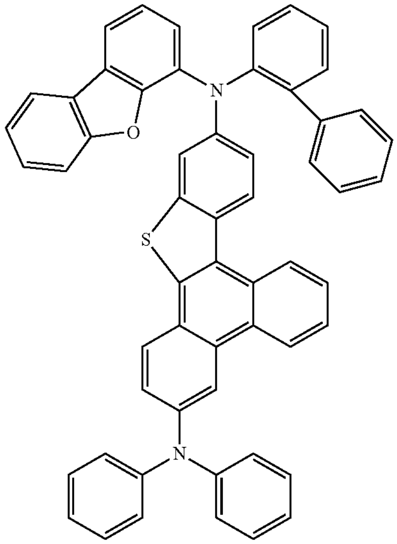
82
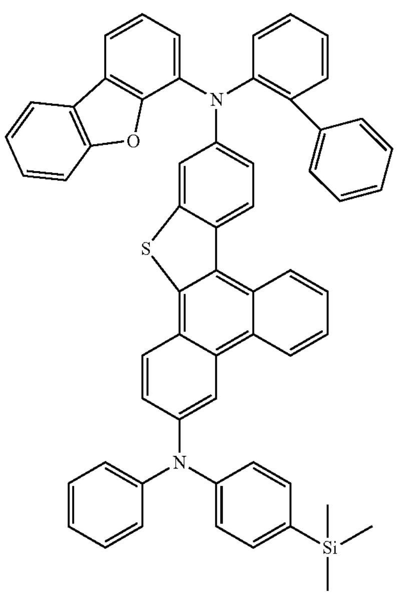
-continued
83
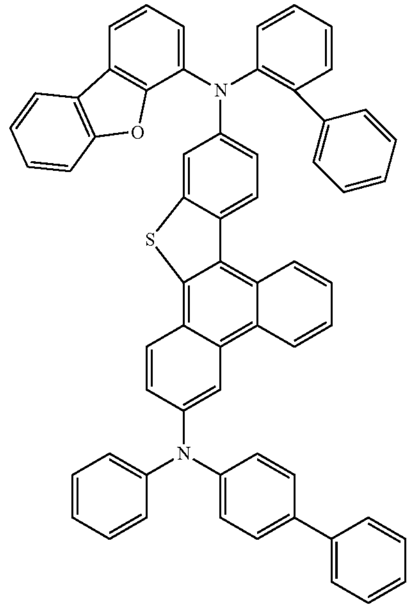
84
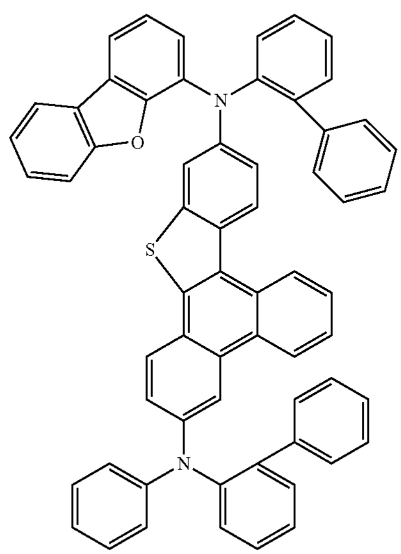

-continued
85
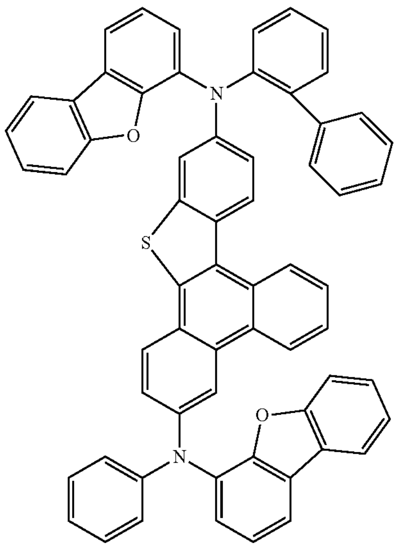
86
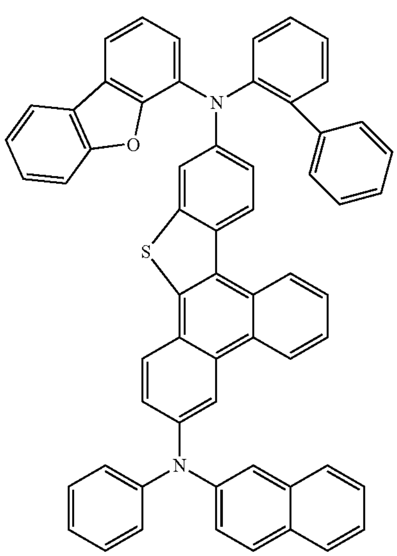
-continued
87
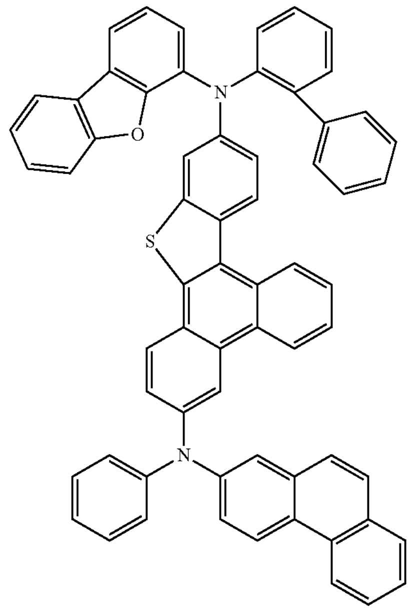
88
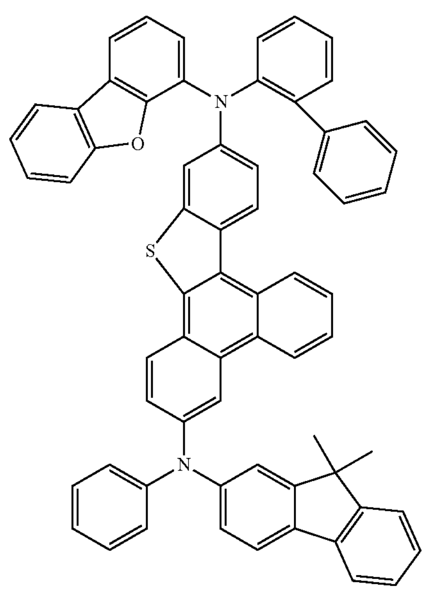

-continued
89
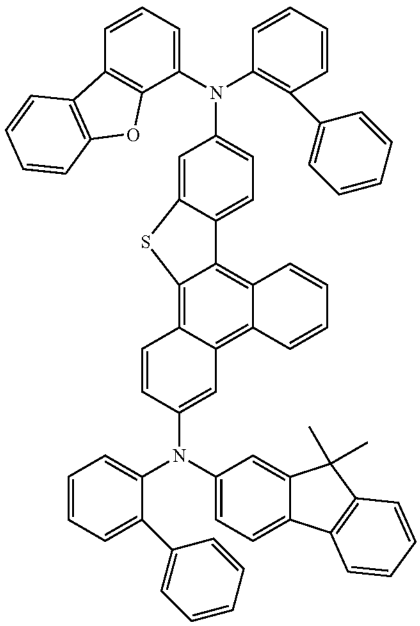
90
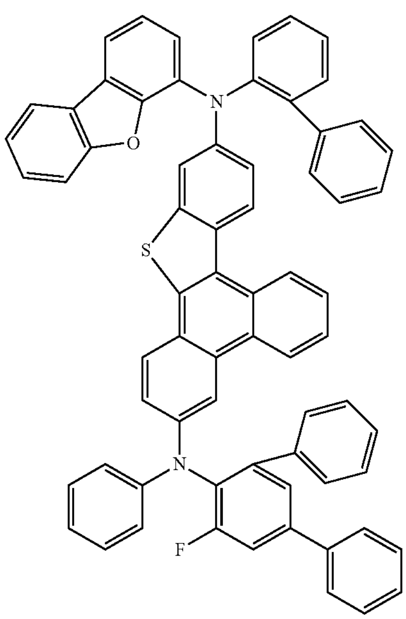
-continued
91
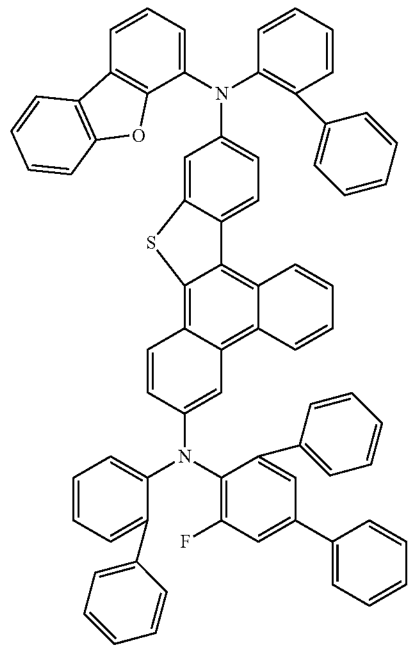
92
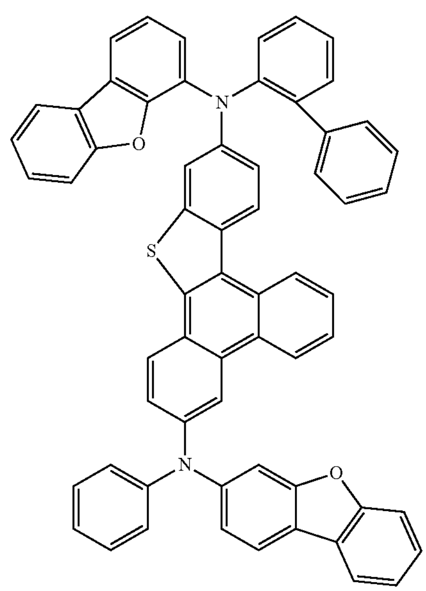

-continued
93
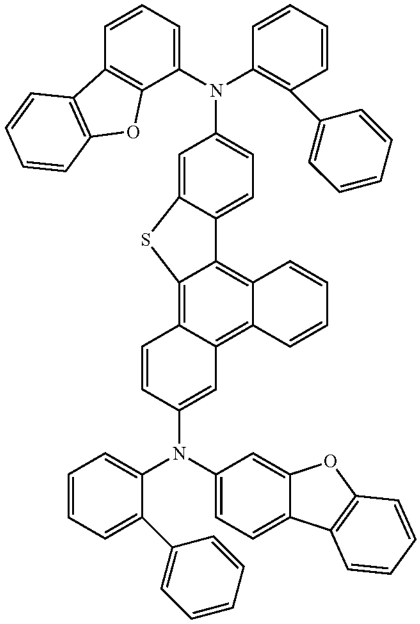
94
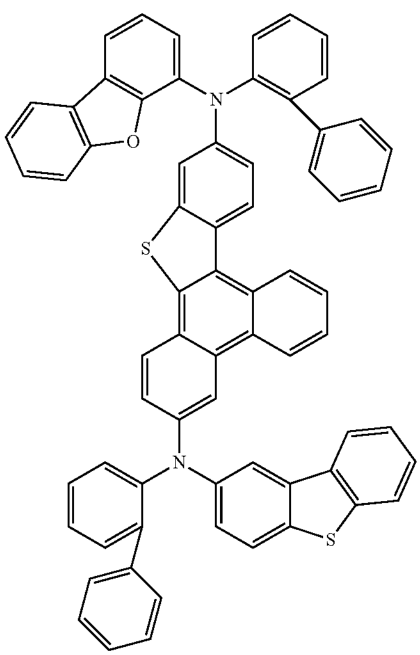
-continued
95
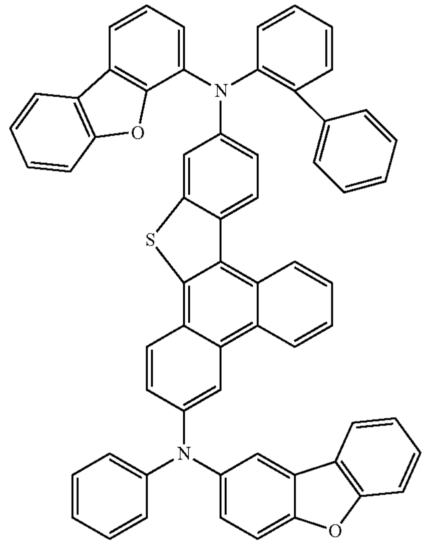
96
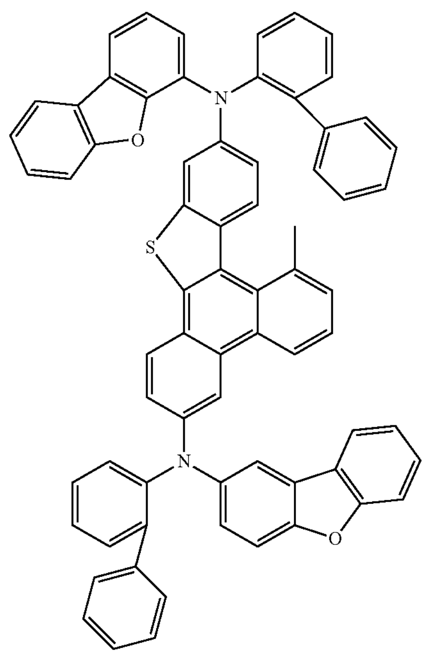

-continued
97
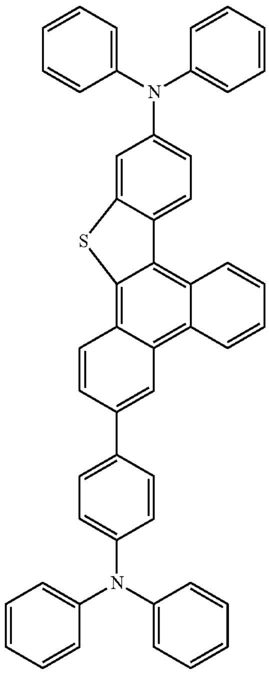
-continued
99
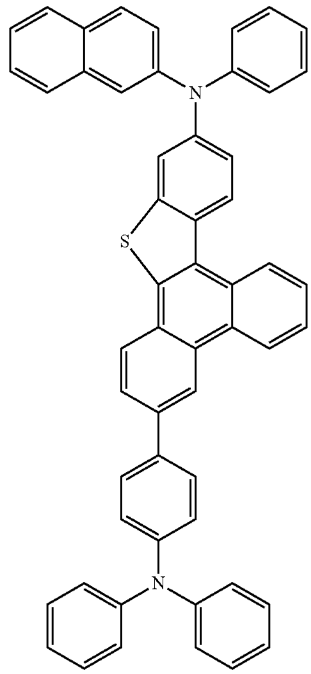
98
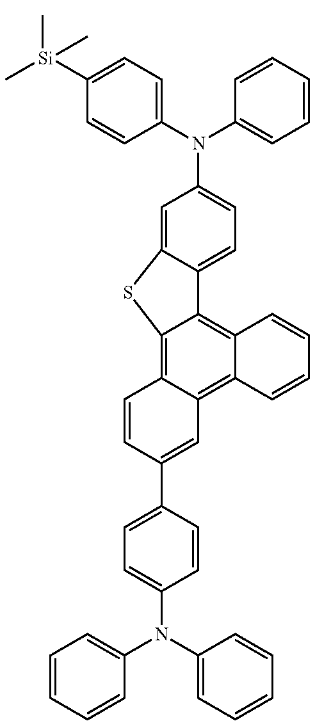
100
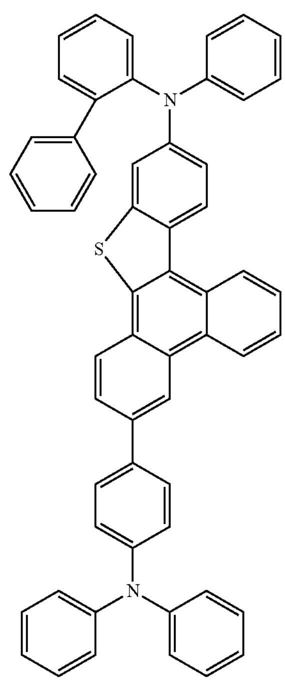

-continued
101
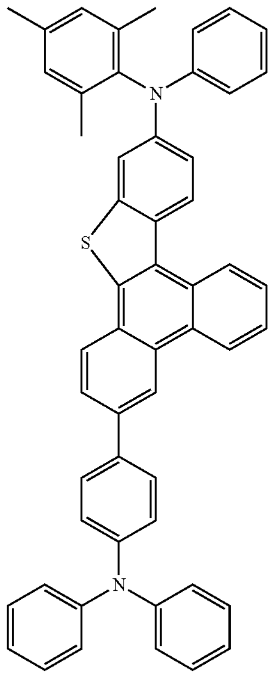
102
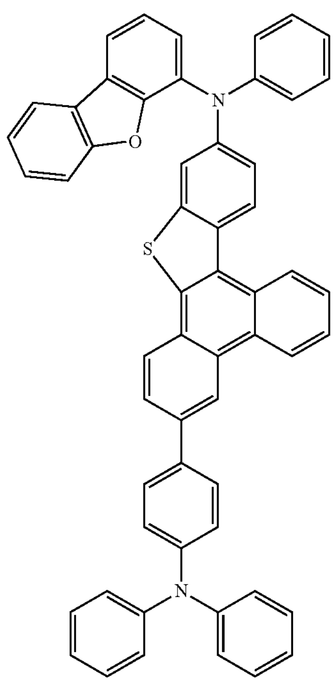
-continued
103
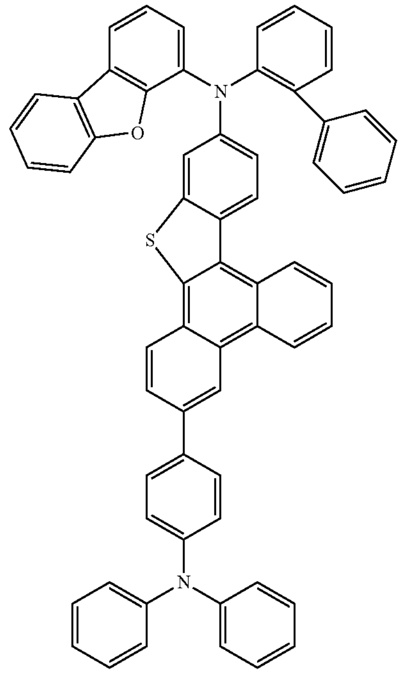
104
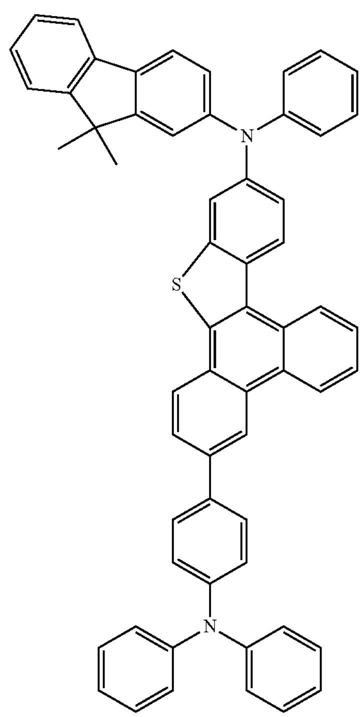

-continued
105
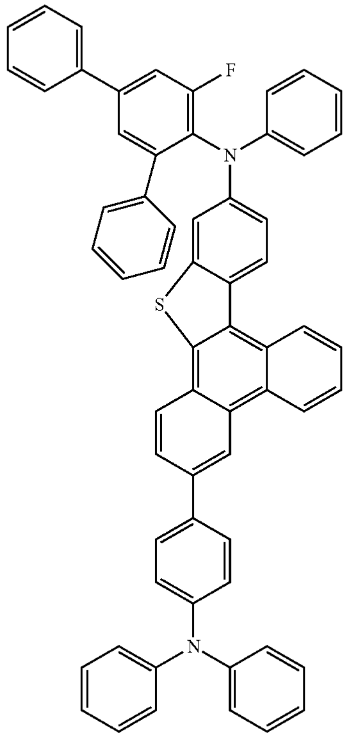
106
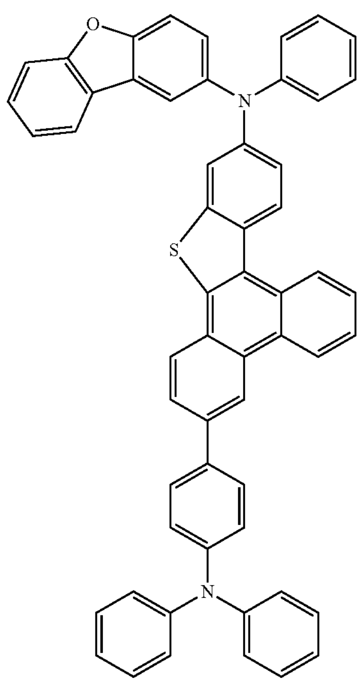
-continued
107
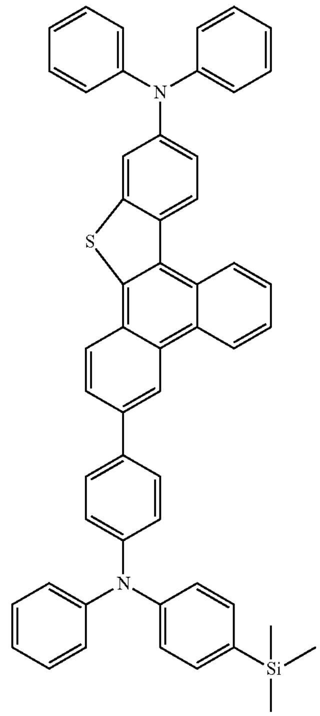
108
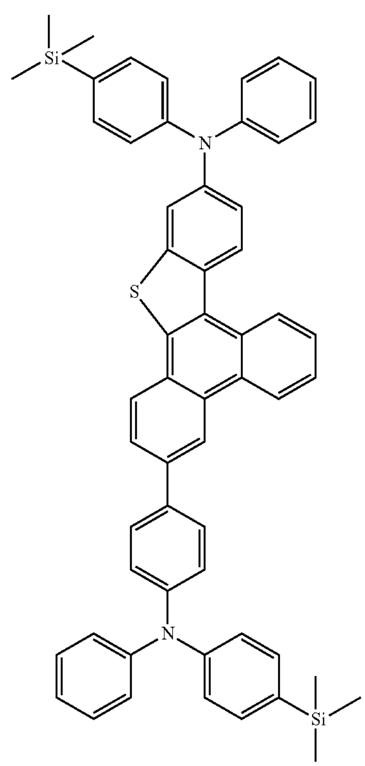

-continued
109
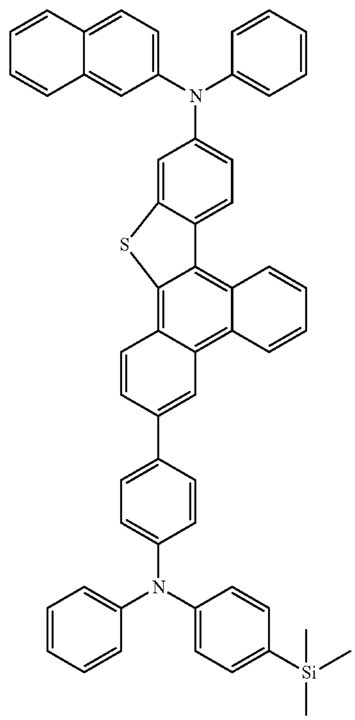
110
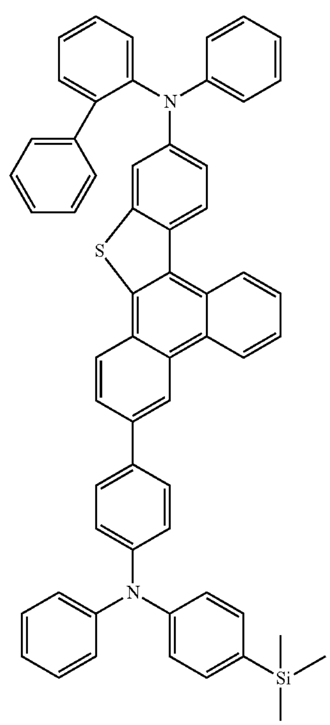
-continued
111
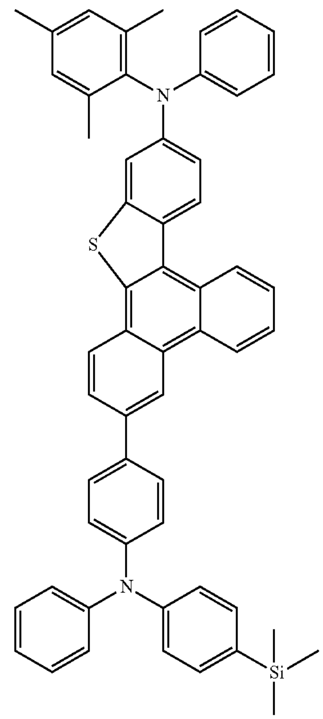
112
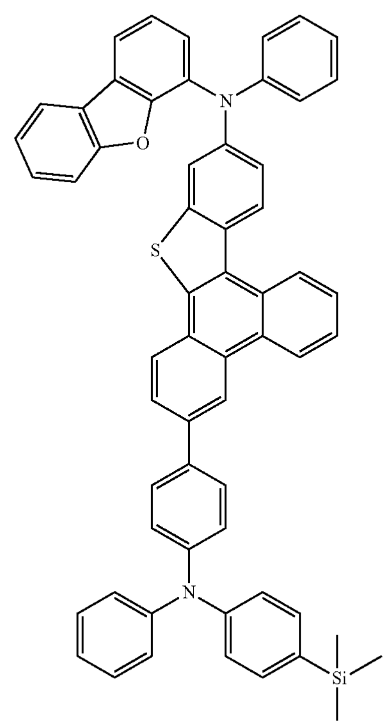

-continued
113
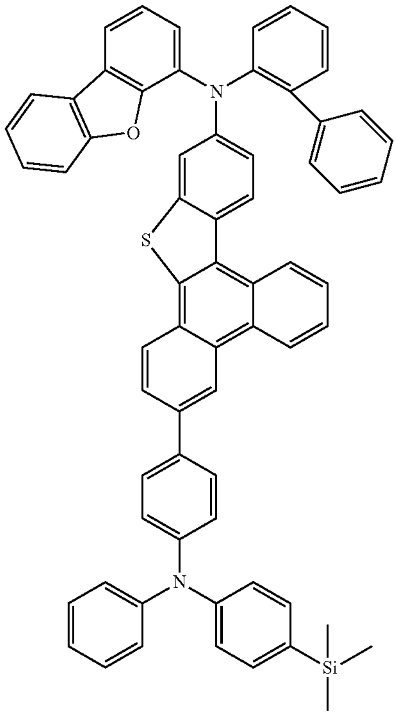
114
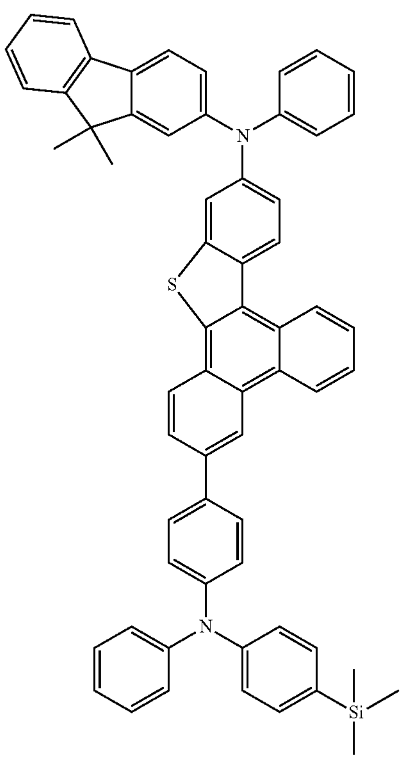
-continued
115
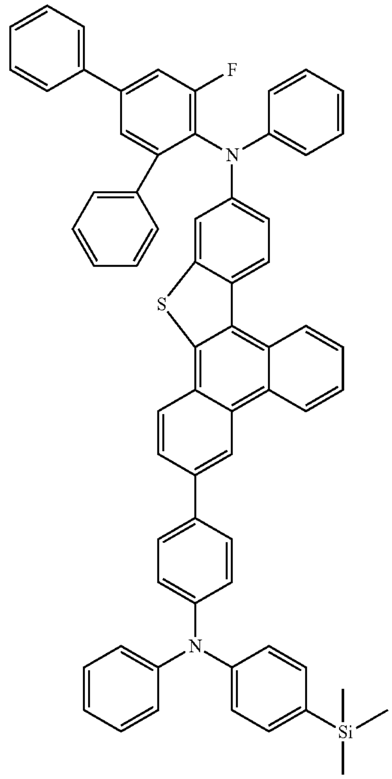
116
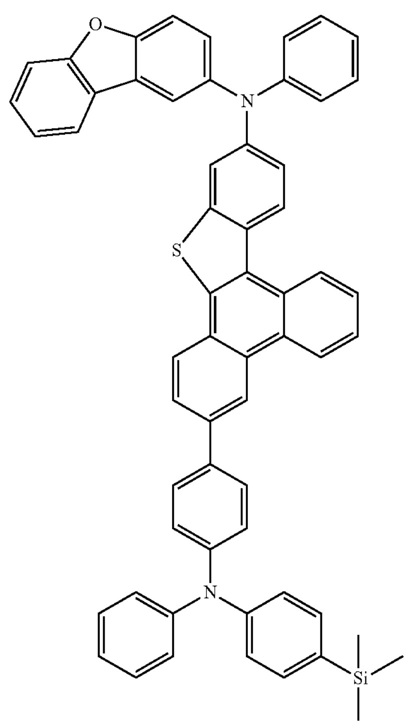

117
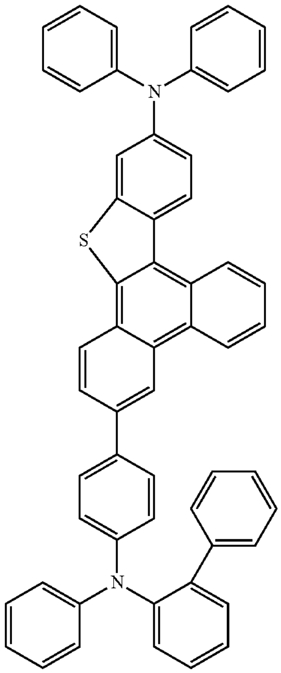
119
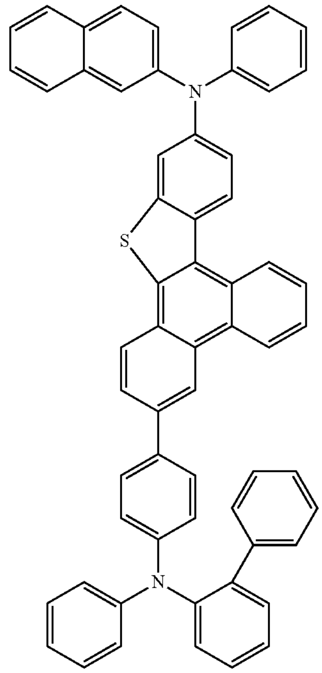
118
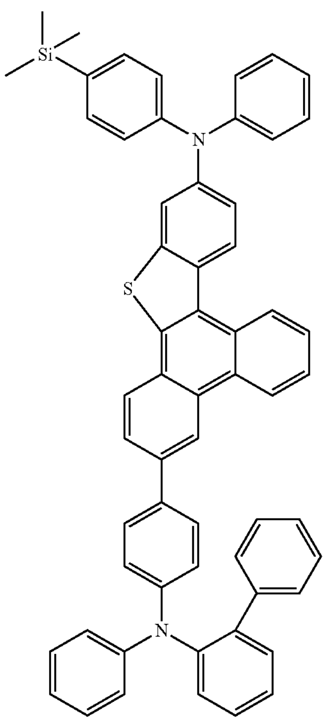
120
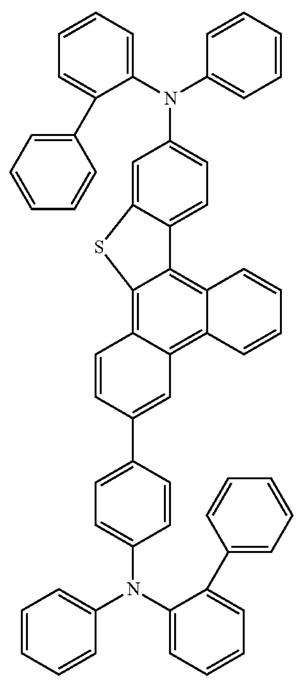

-continued
121
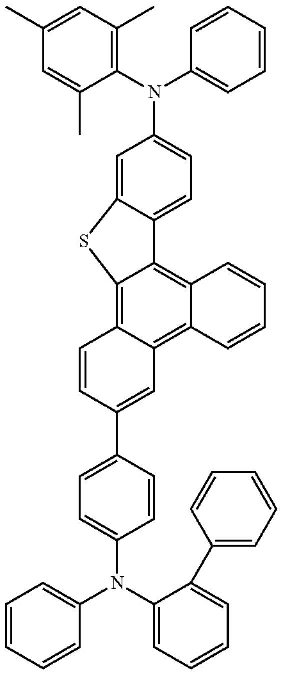
122
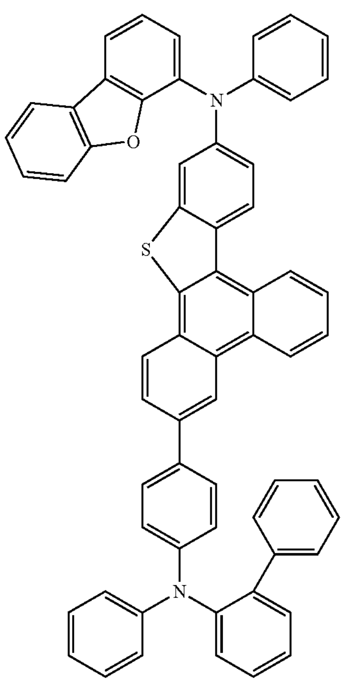
-continued
123
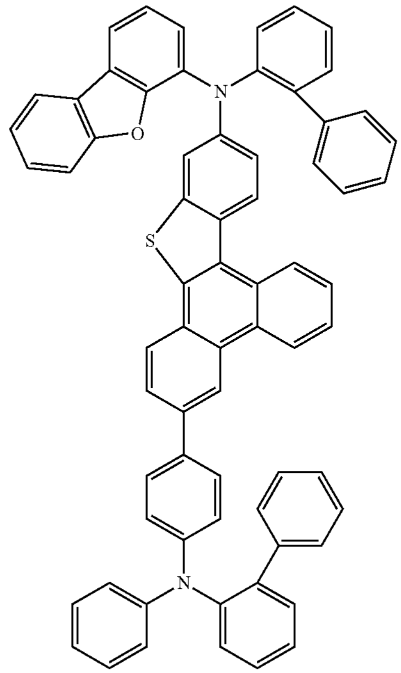
124
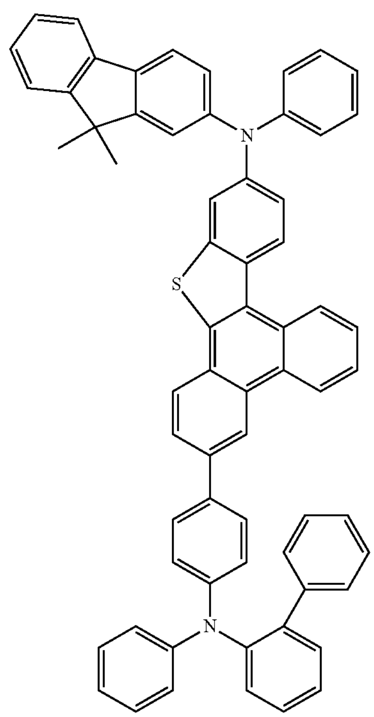

125
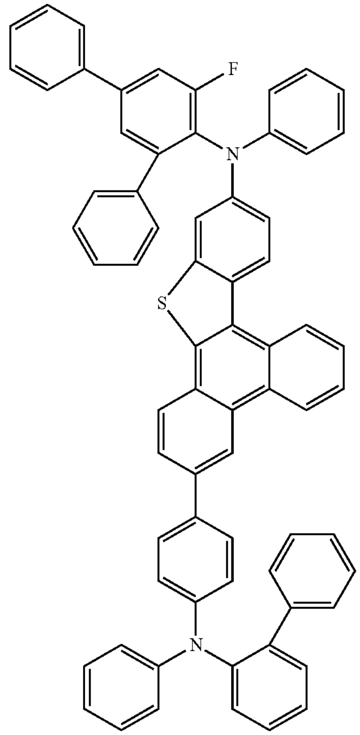
126
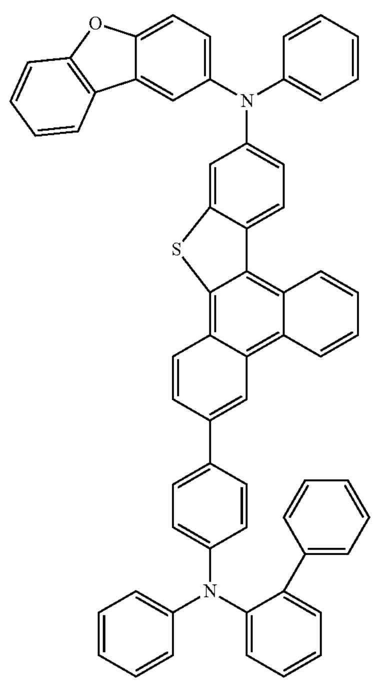
127
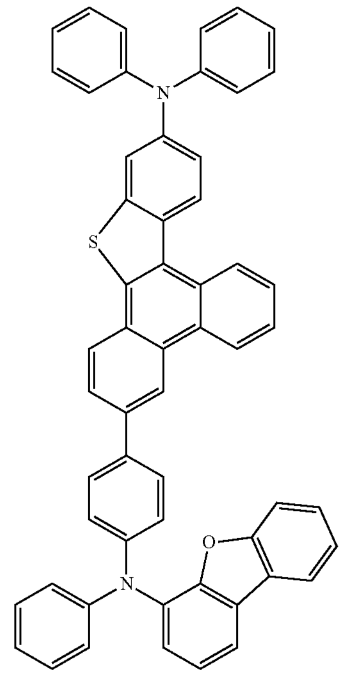
128
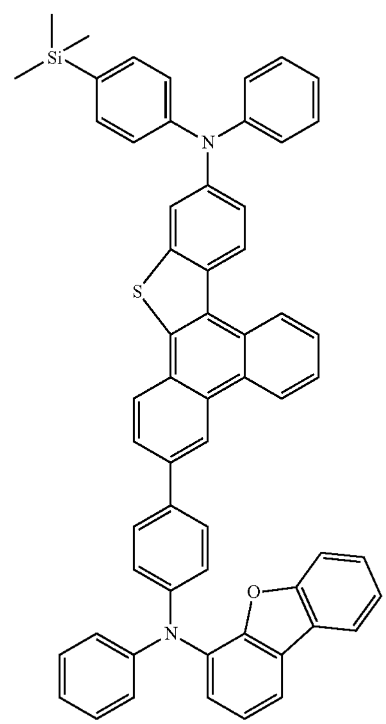

-continued
129
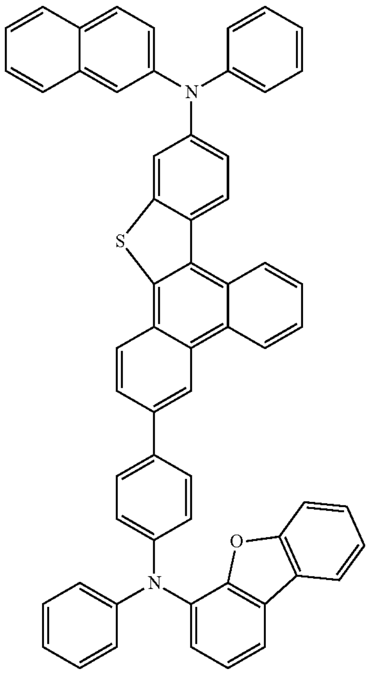
130
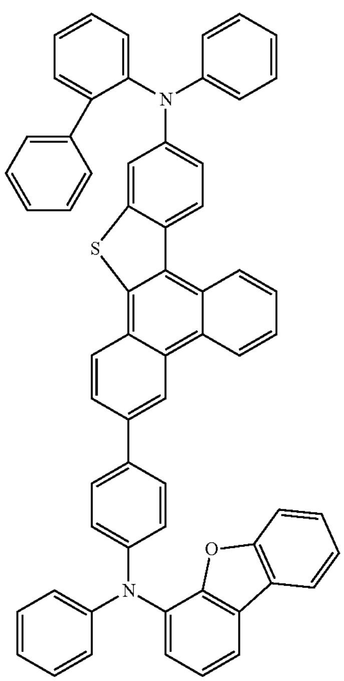
-continued
131
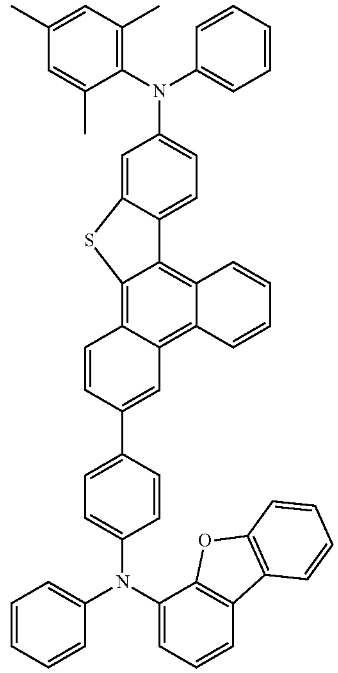
132
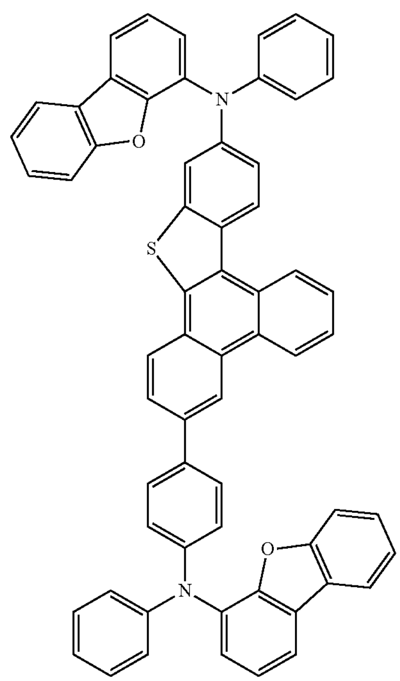

-continued
133
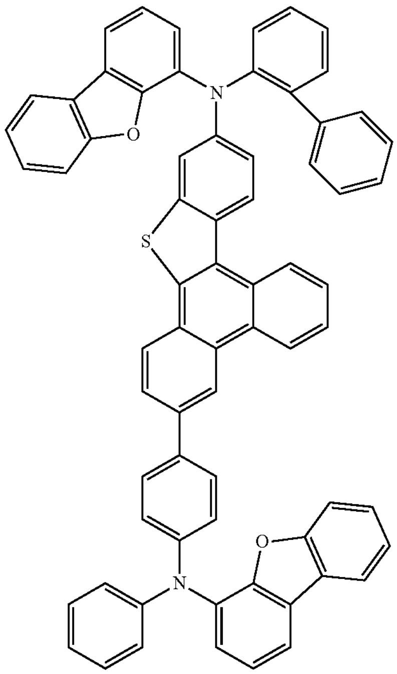
134
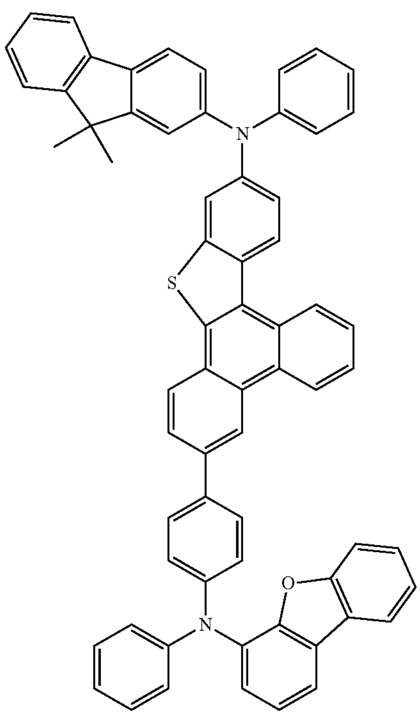
-continued
135
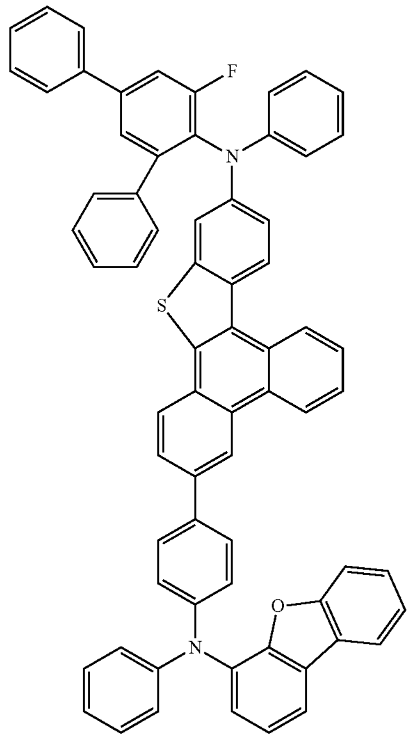
136
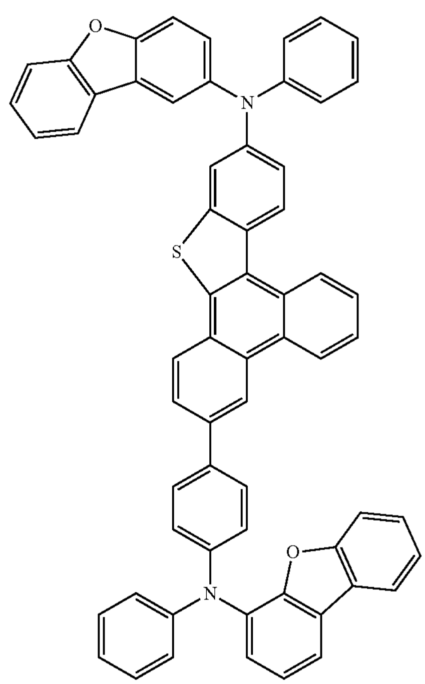

-continued
137
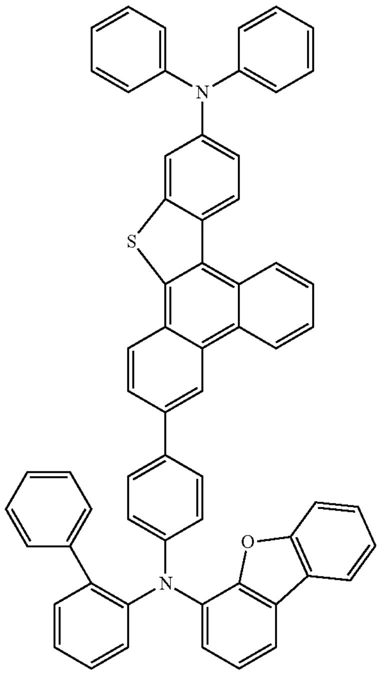
138
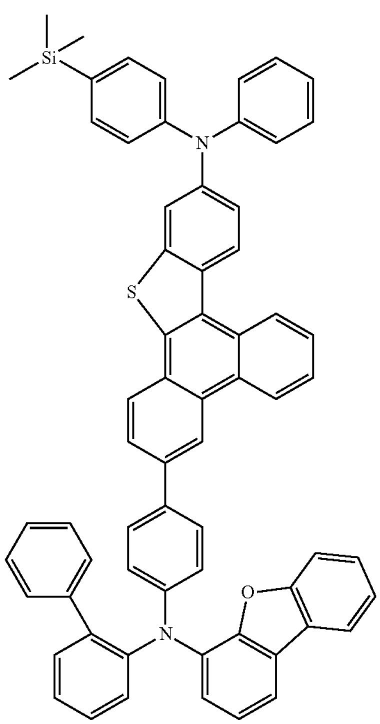
-continued
139
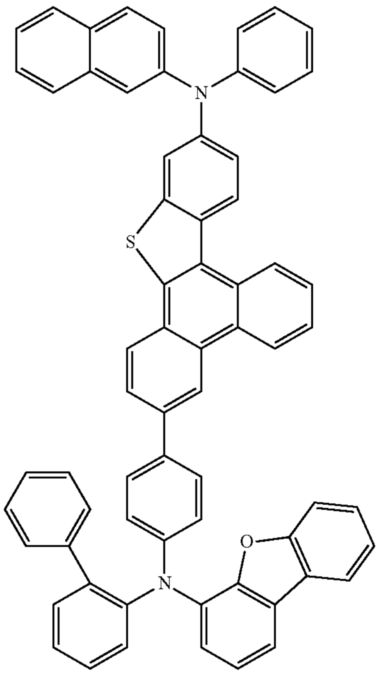
140
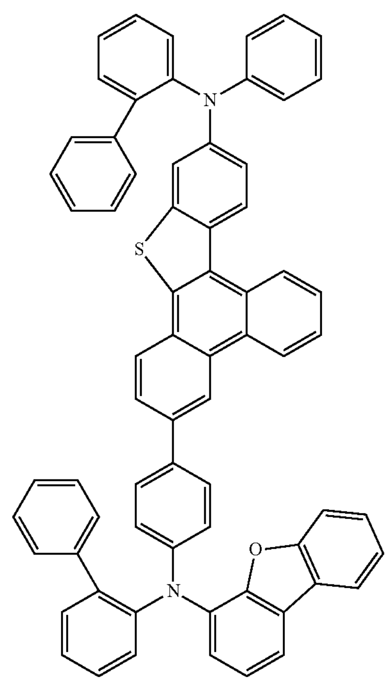

-continued
141
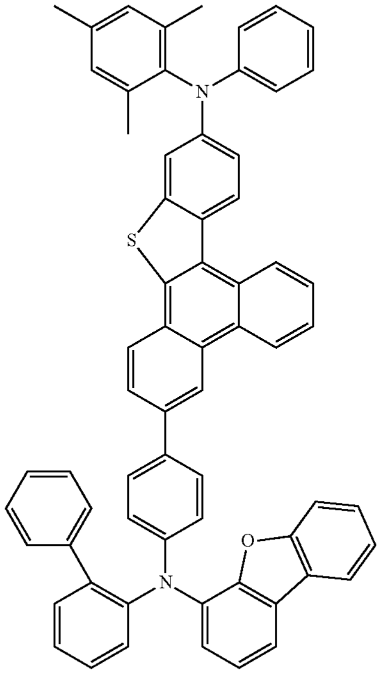
142
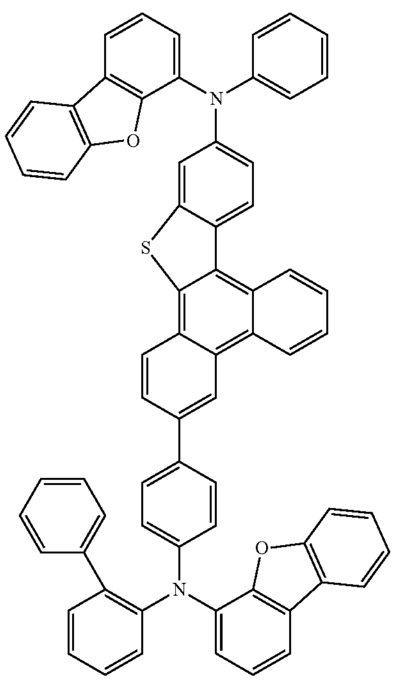
-continued
143
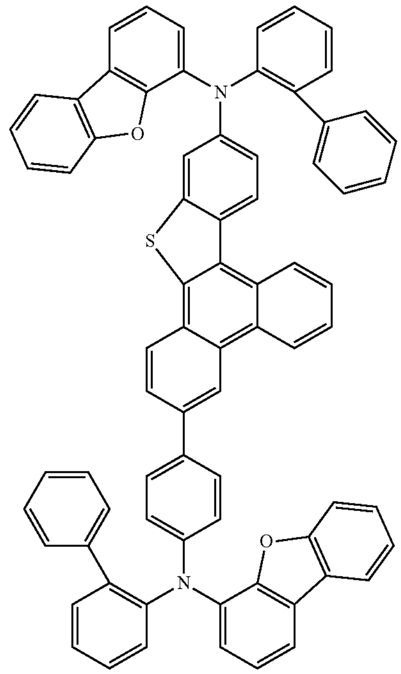
144
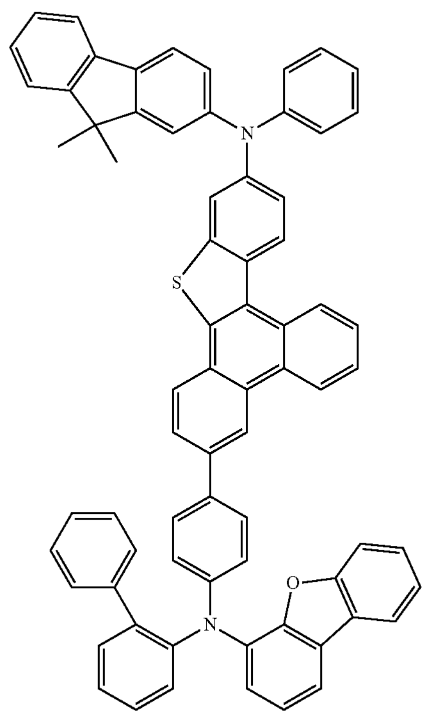

-continued
145
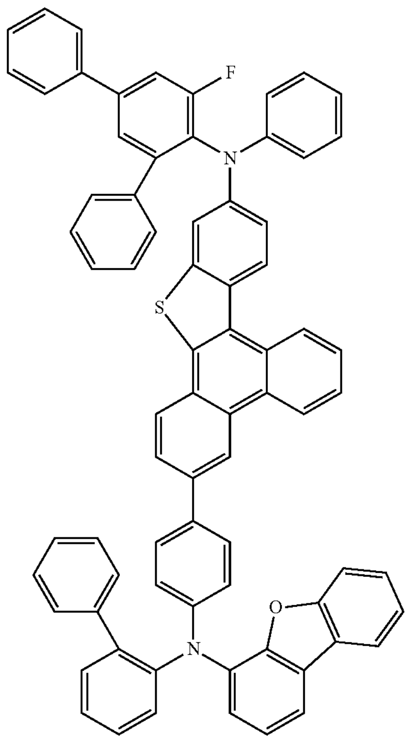
146
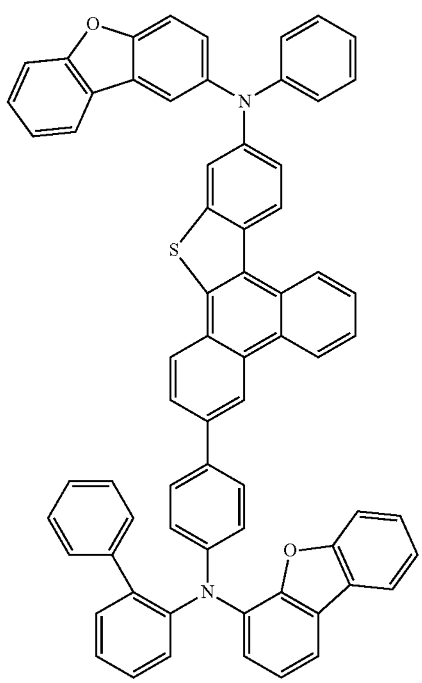
-continued
147
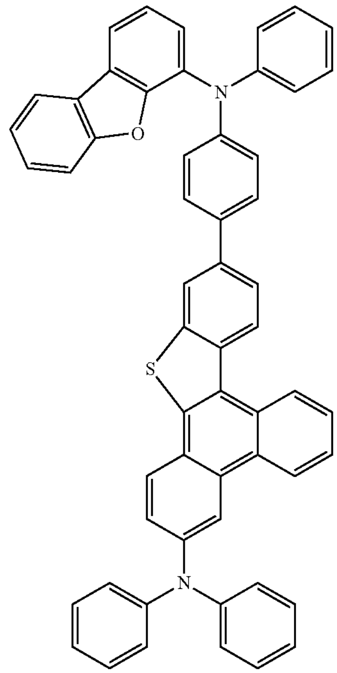
148
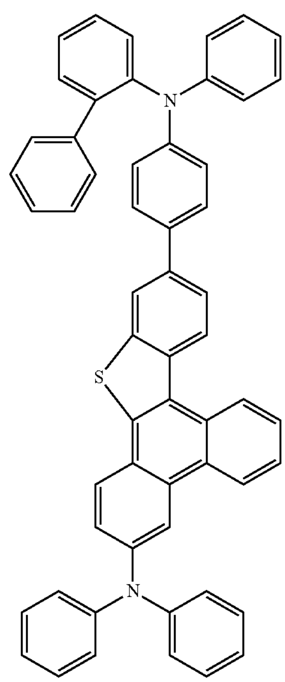

-continued
149
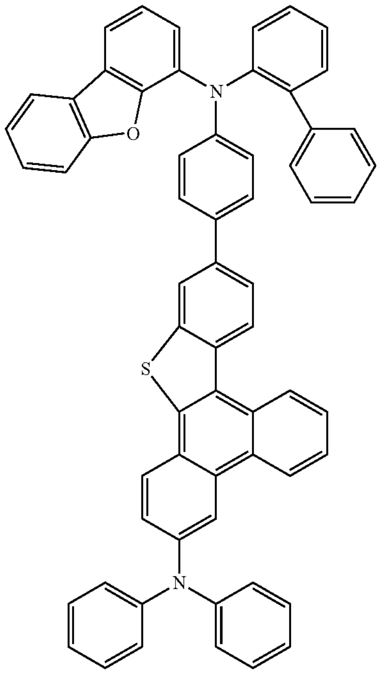
150
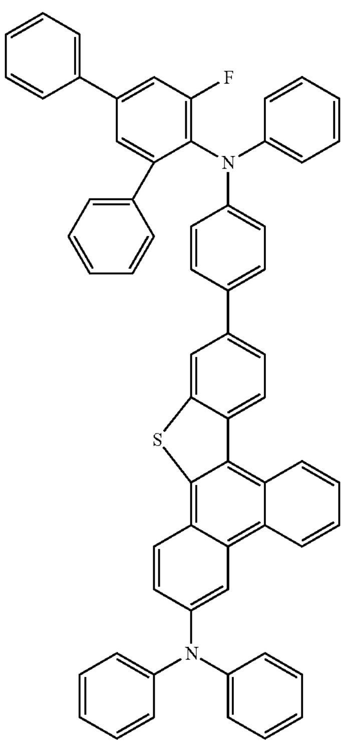
-continued
151
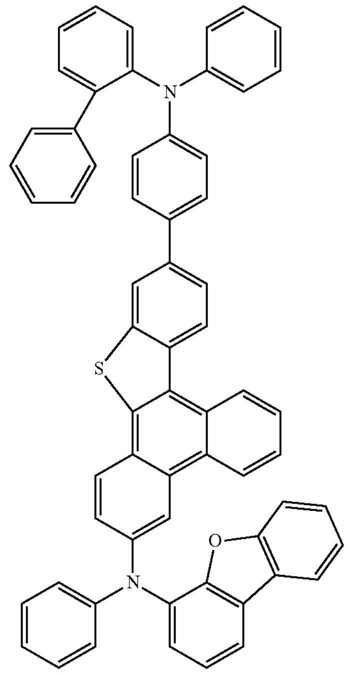
152
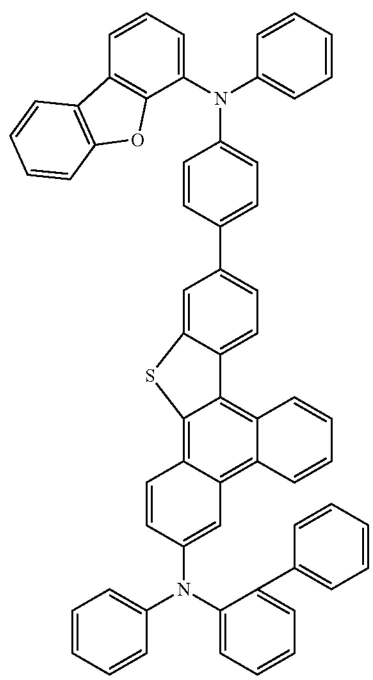

-continued
153
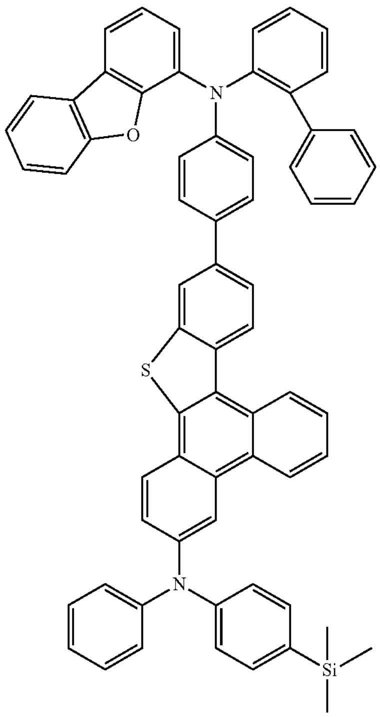
154
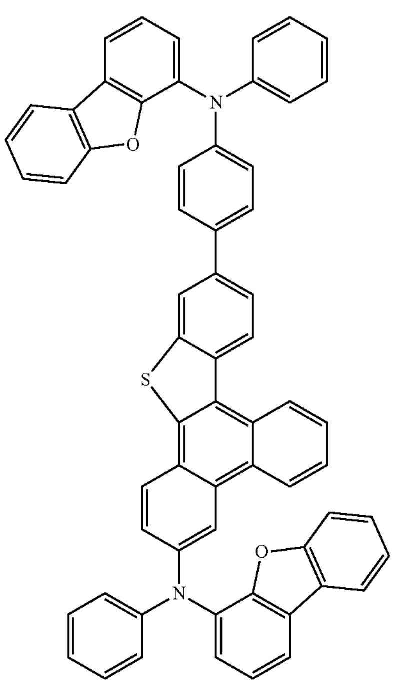
-continued
155
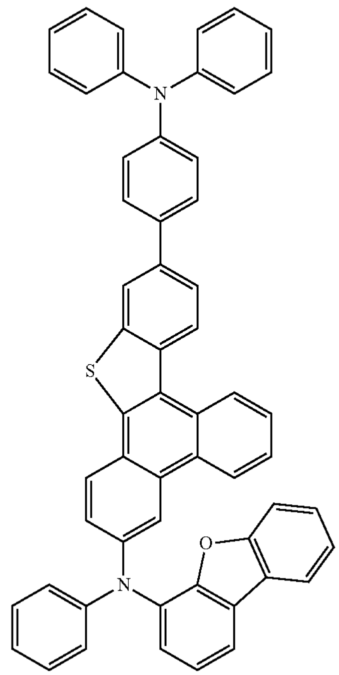
156
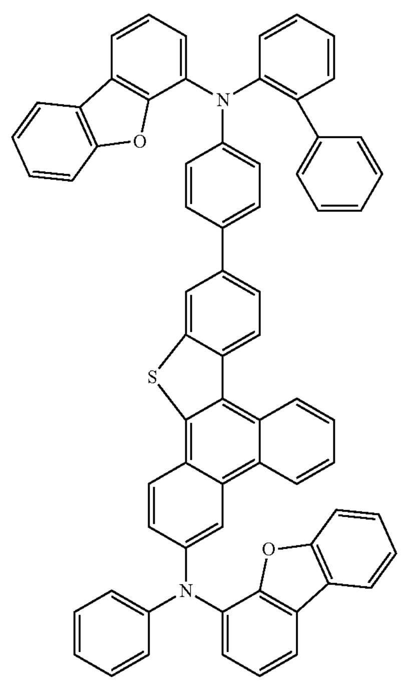

-continued
157
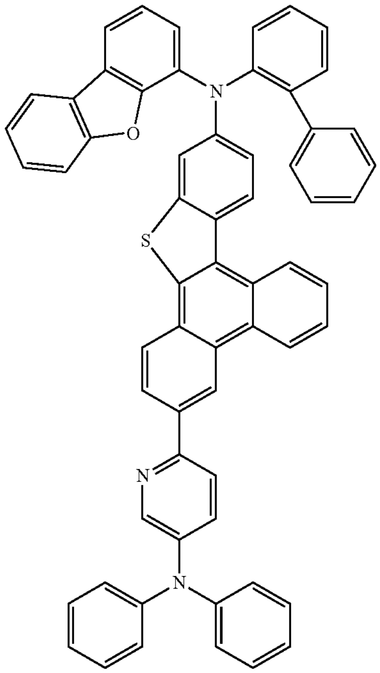
158
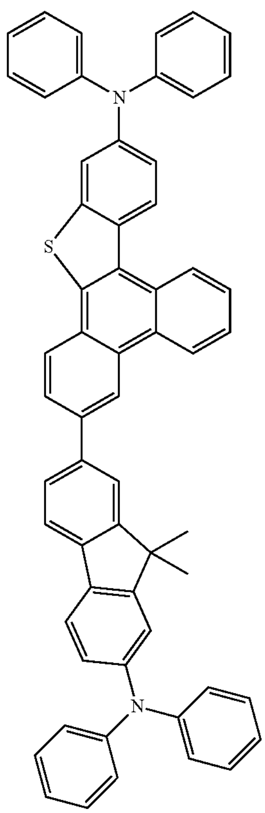
-continued
159
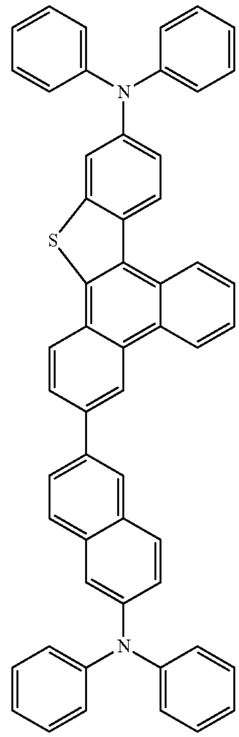
160
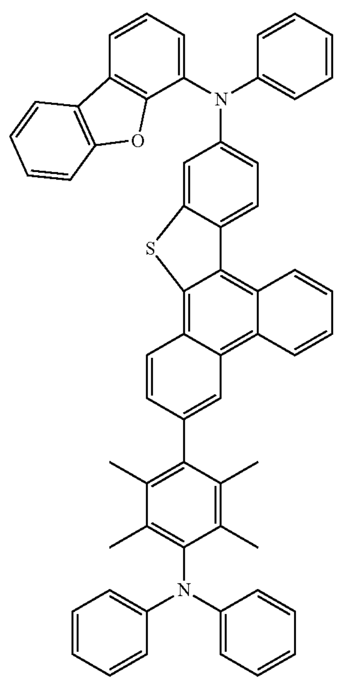

161
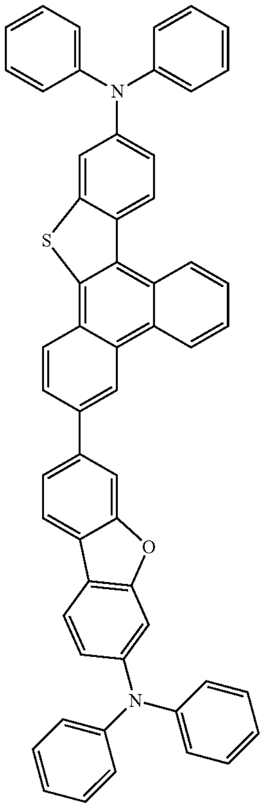
162
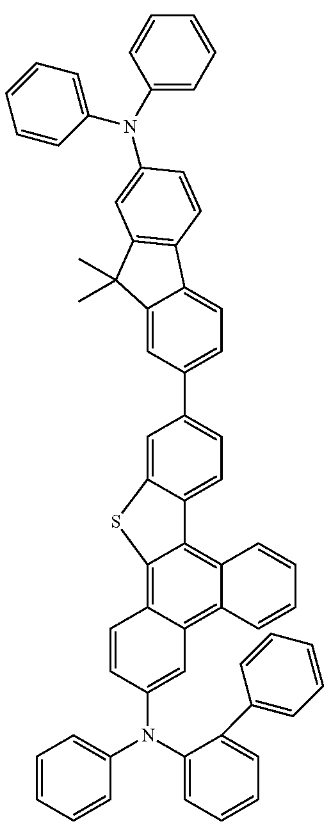
163
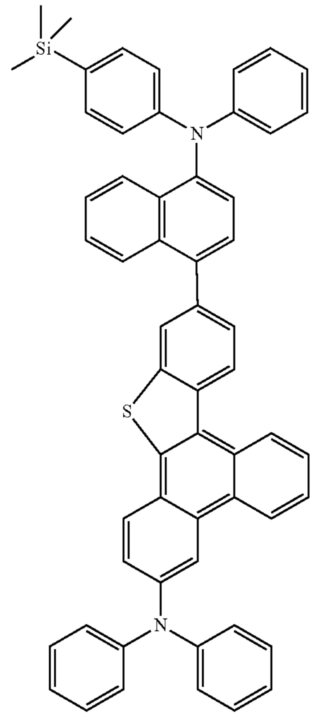
164
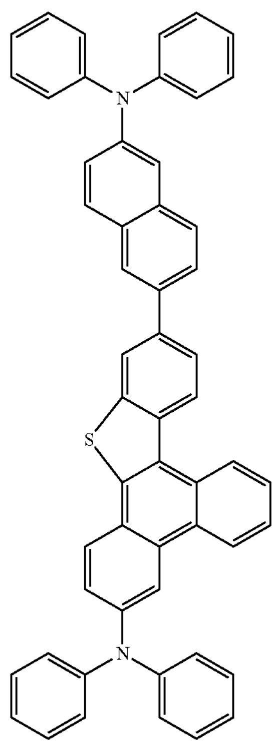

-continued
165
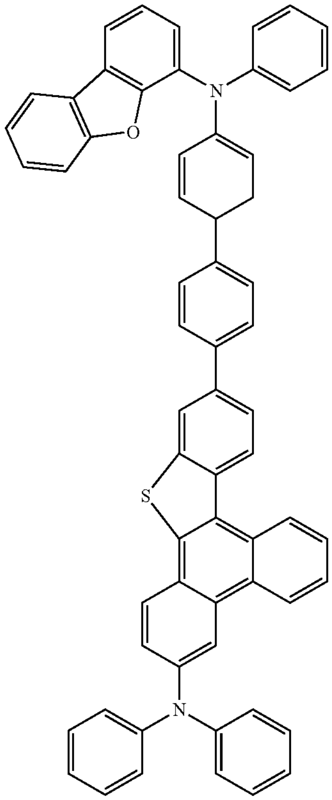
166
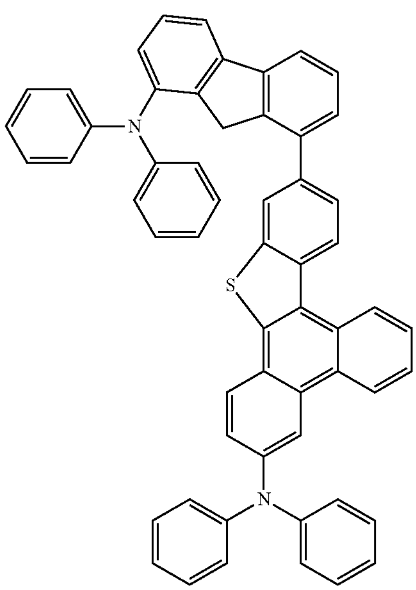
-continued
167
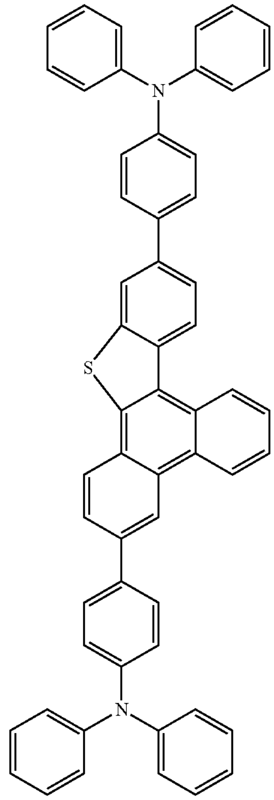
168
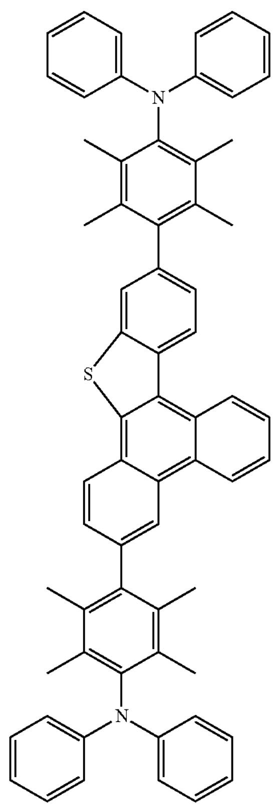

-continued
169
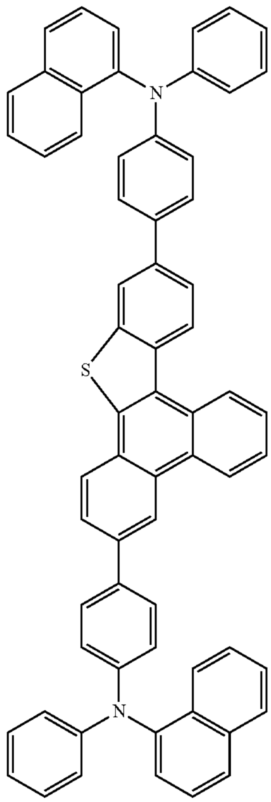
-continued
170
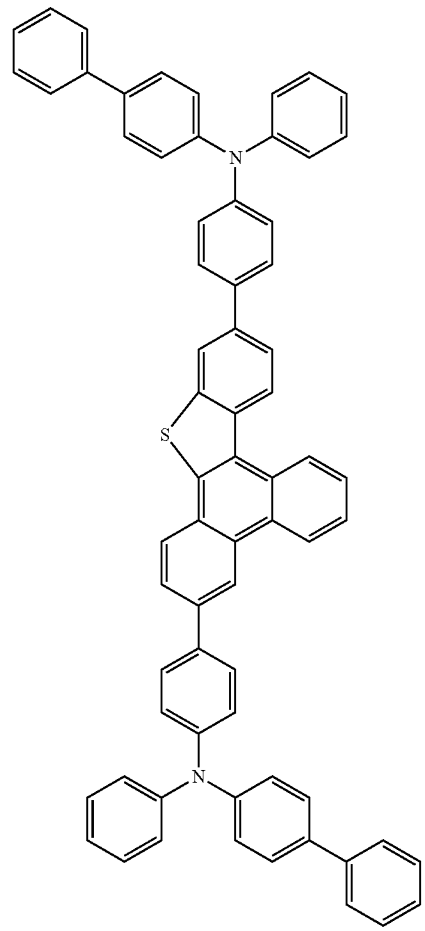

171
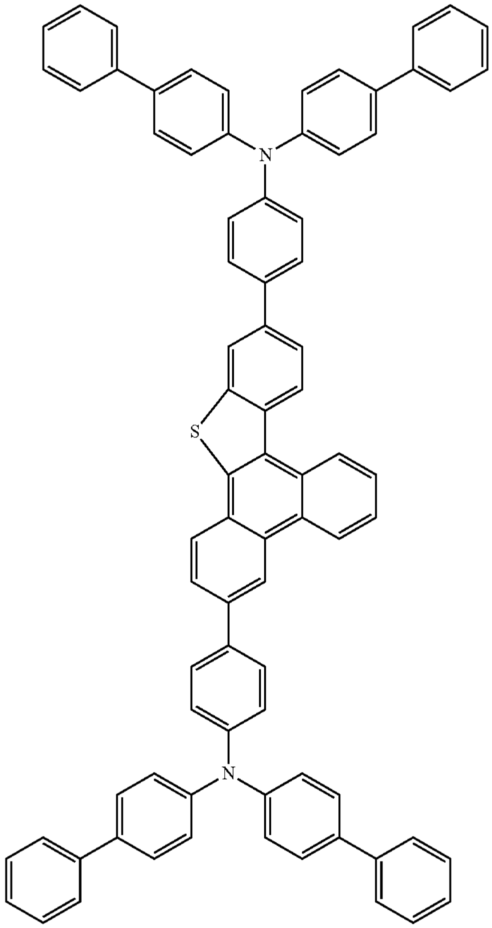
172
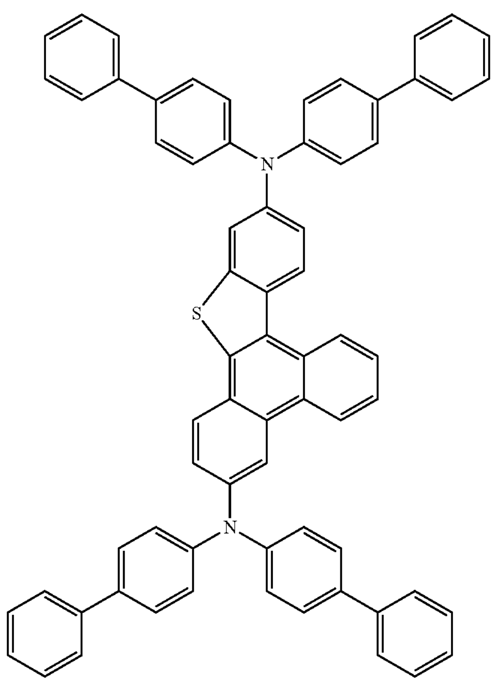
173
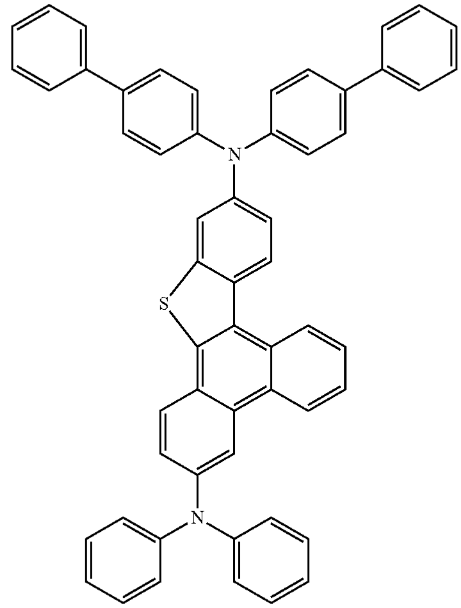
174
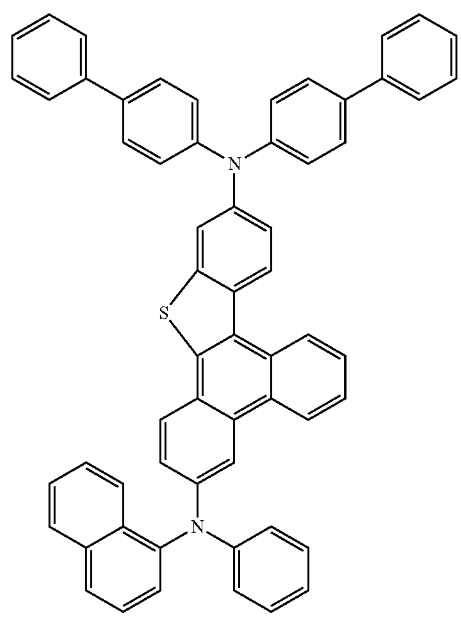

-continued
175
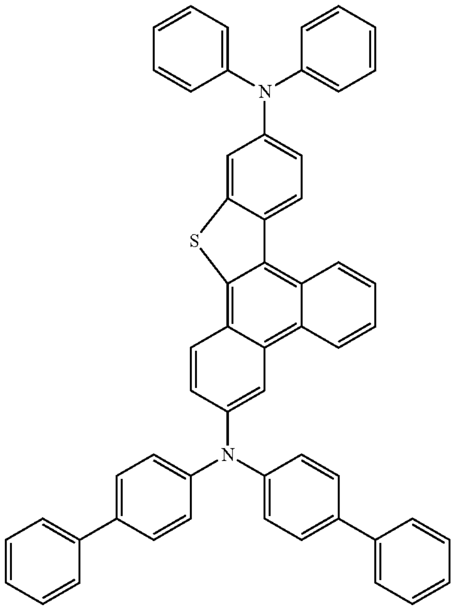
176
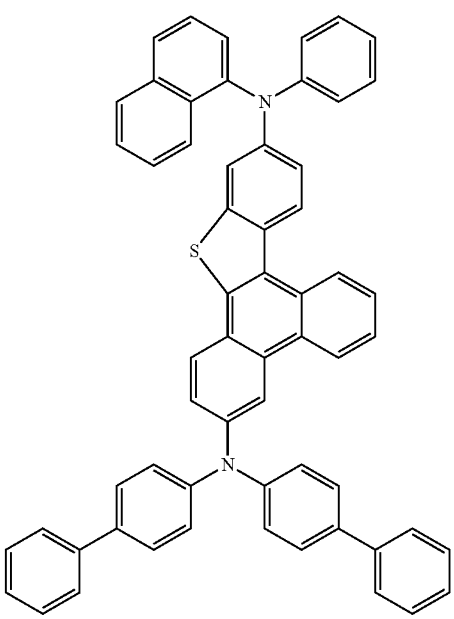
-continued
177
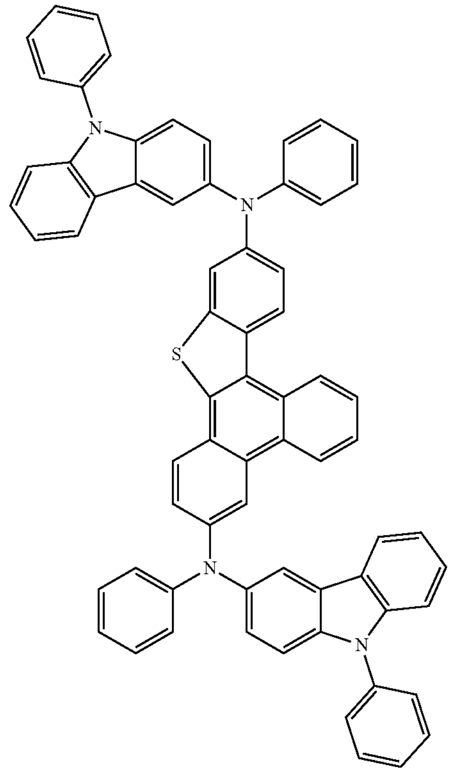
178
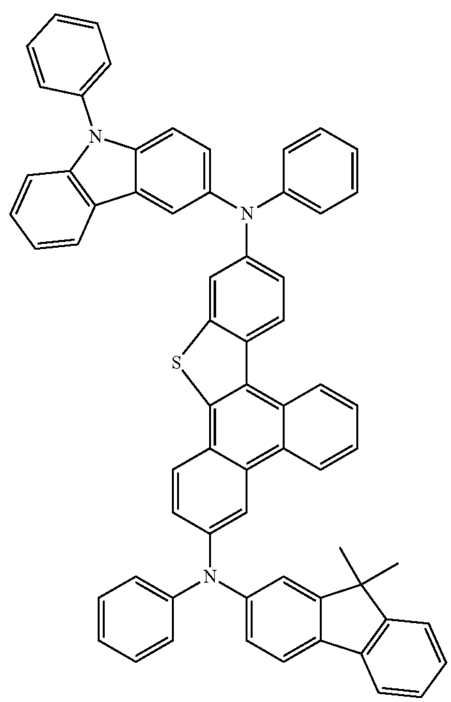

-continued
179
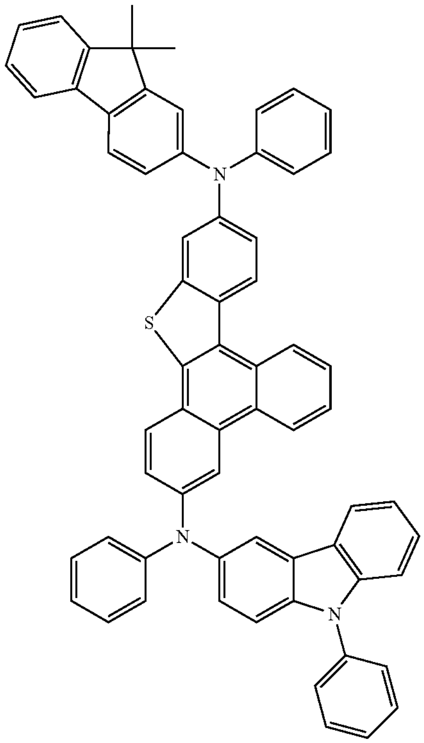
180
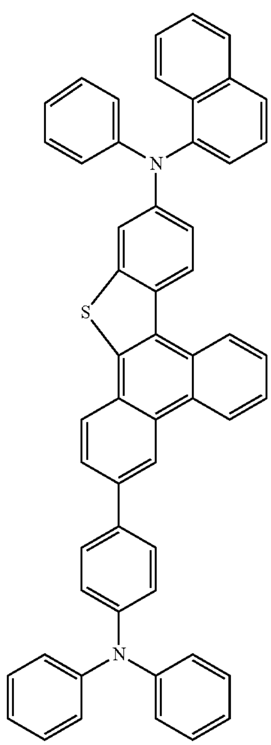
-continued
181
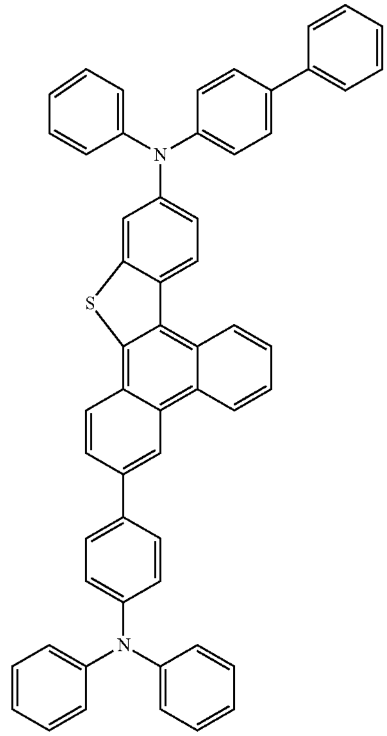
182
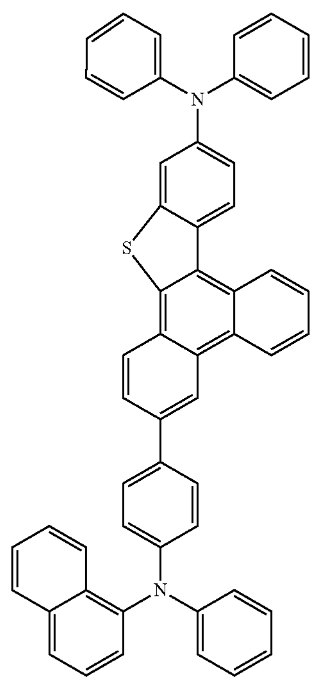

-continued
183
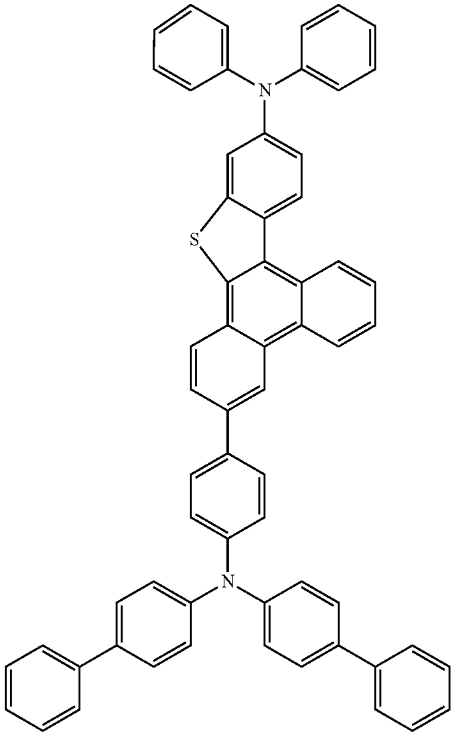
184
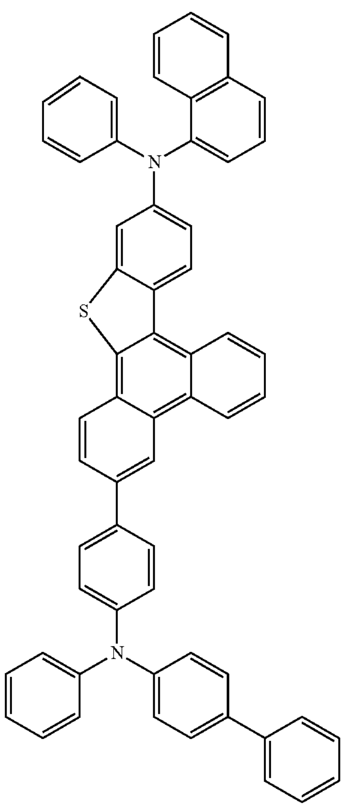
-continued
185
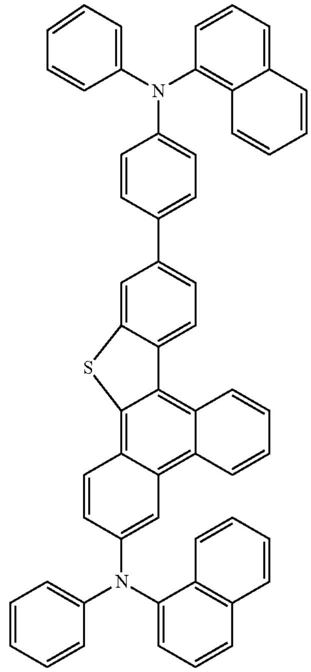
186
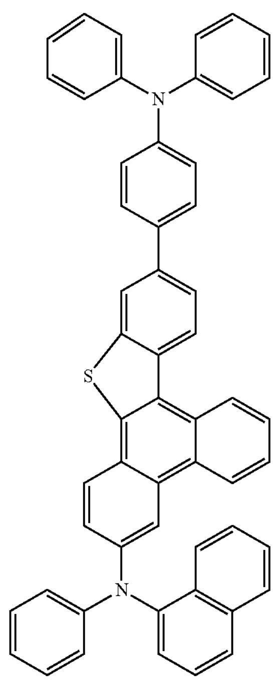

-continued
187
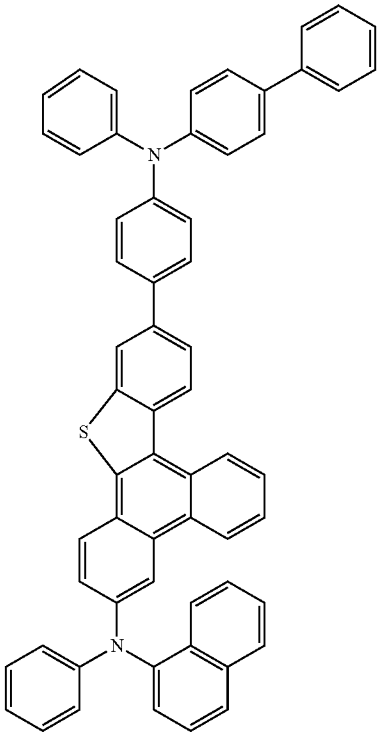
188
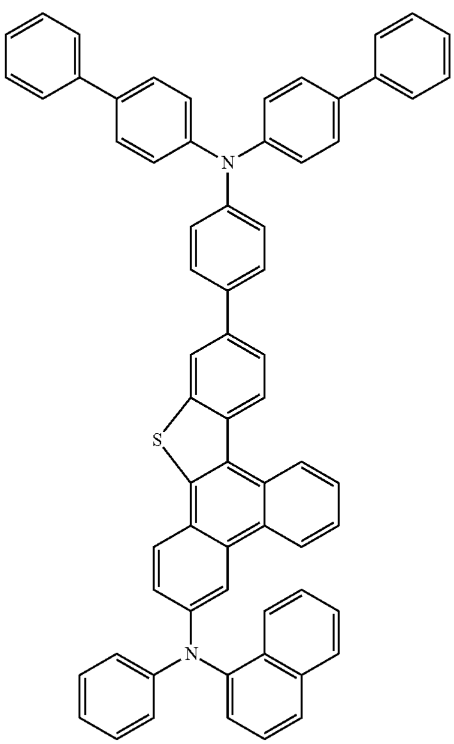
-continued
189
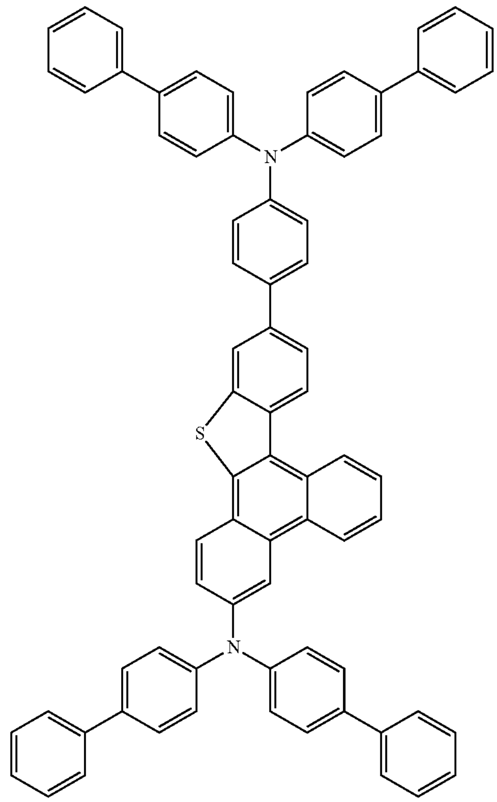
190
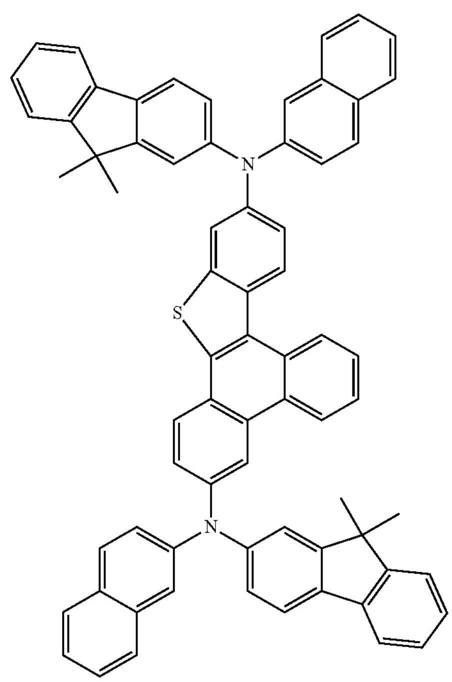

-continued
191
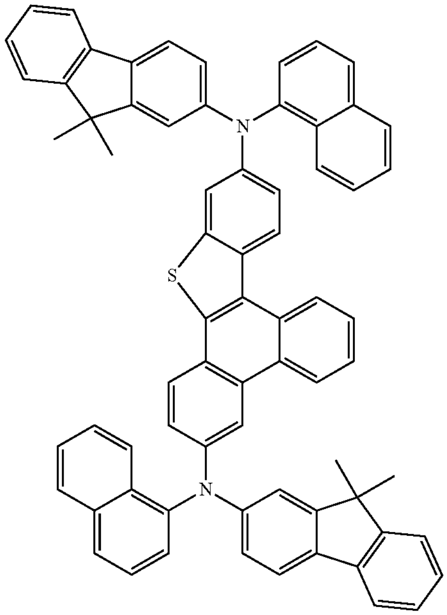
192
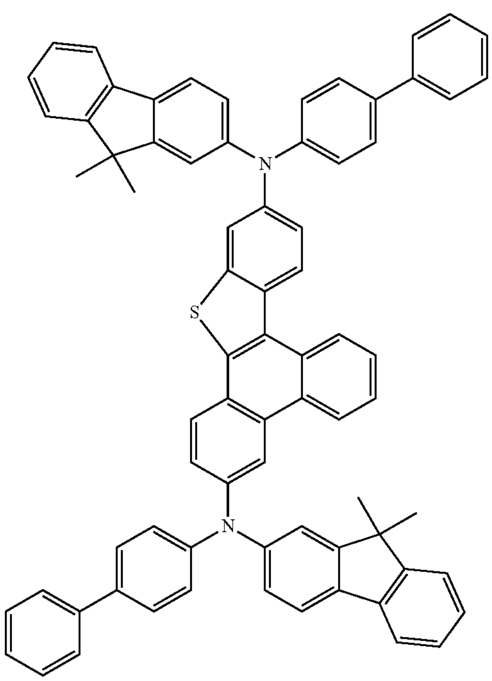
-continued
193
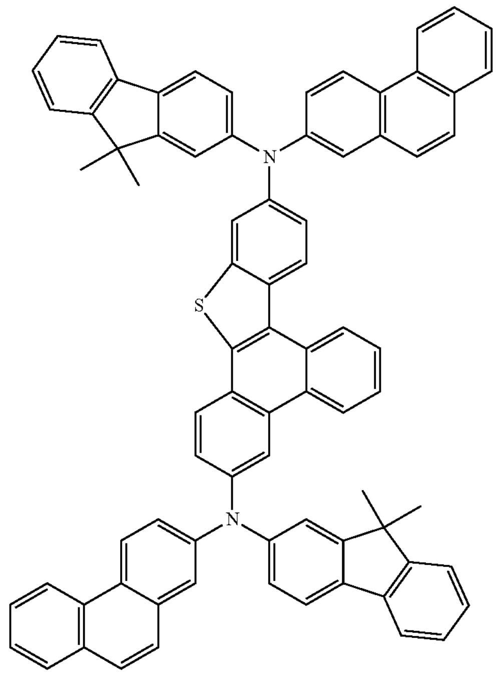
194
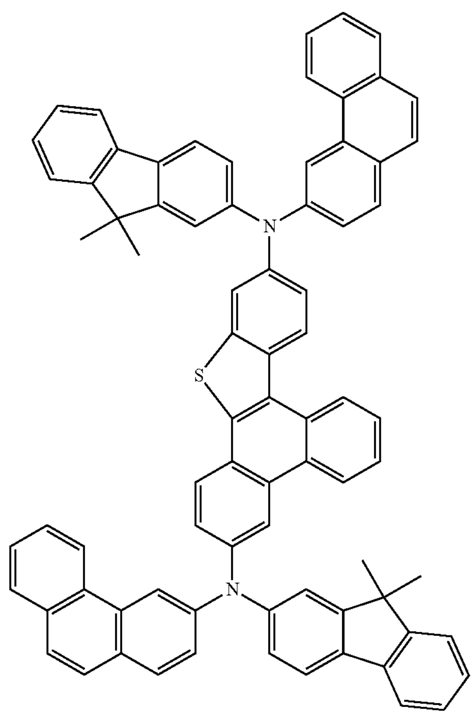

-continued
195
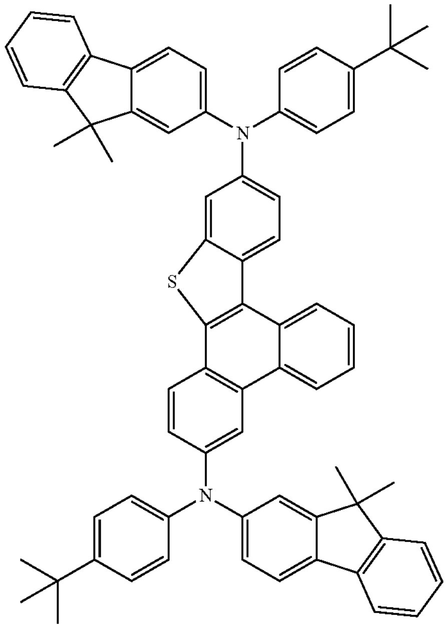
196
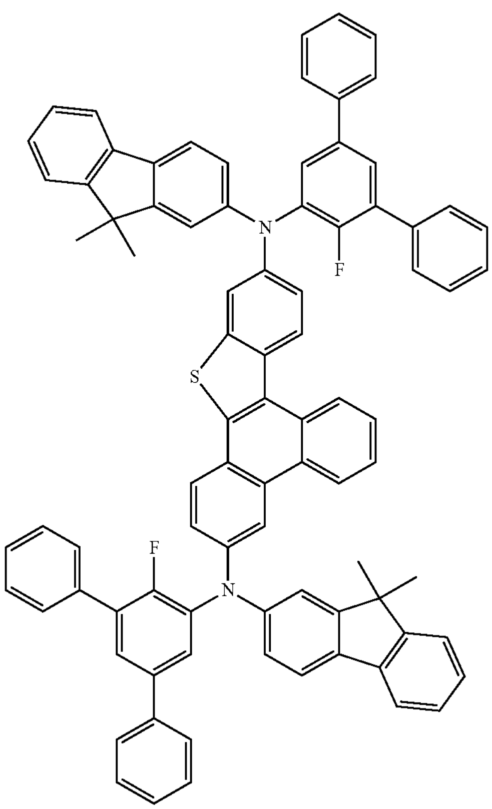
-continued
197
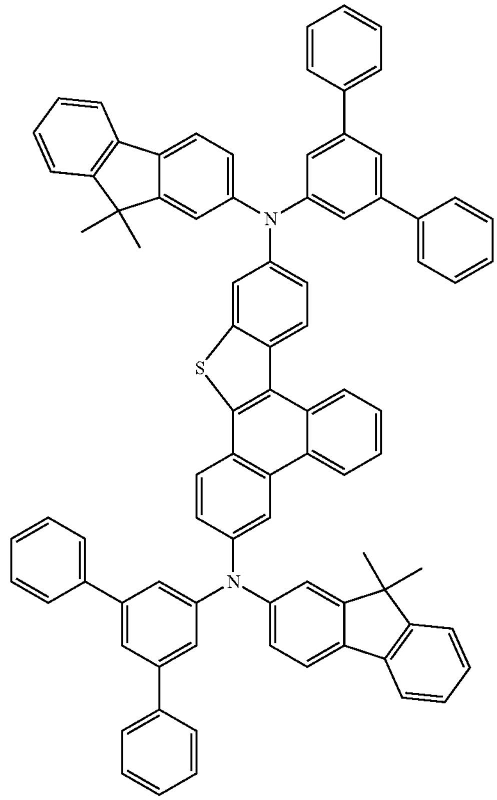
198
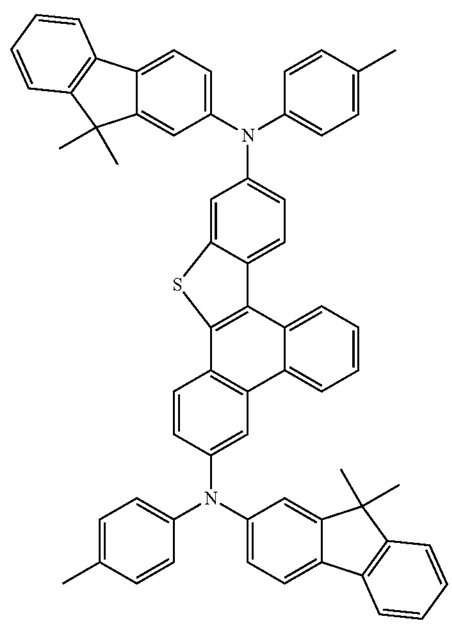

-continued
199
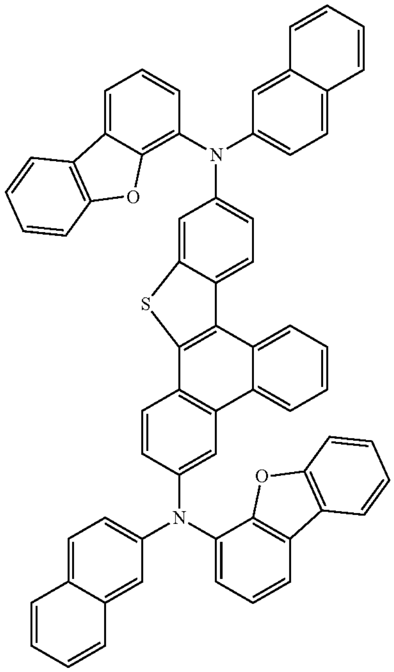
200
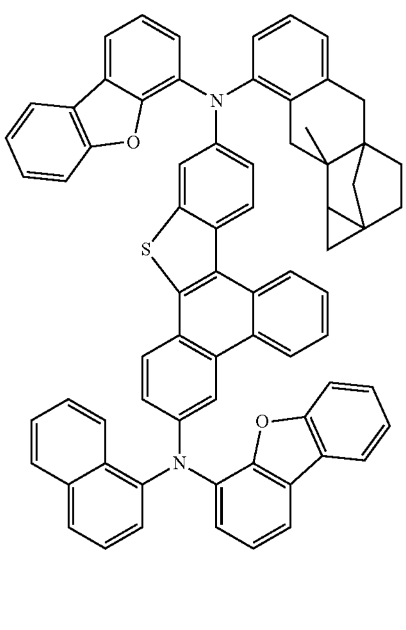
-continued
201
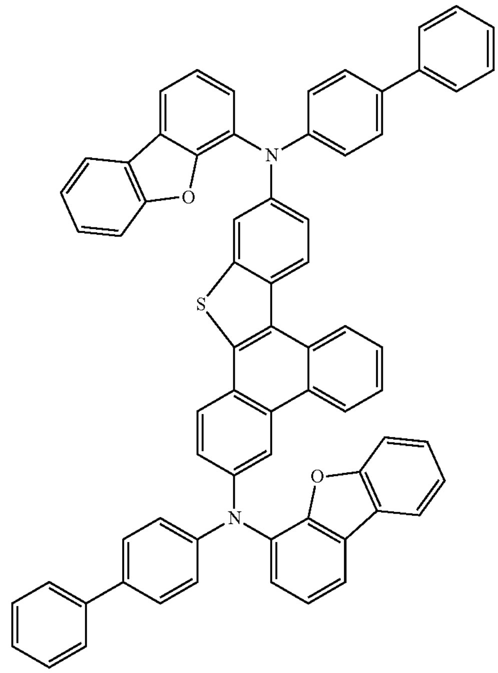
202
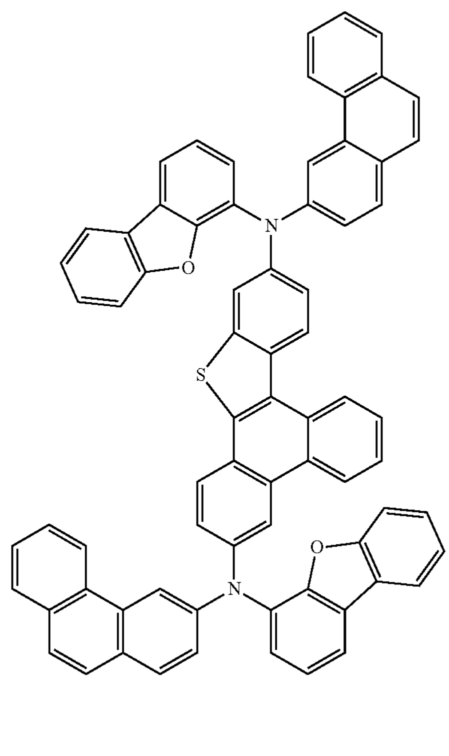

-continued
203
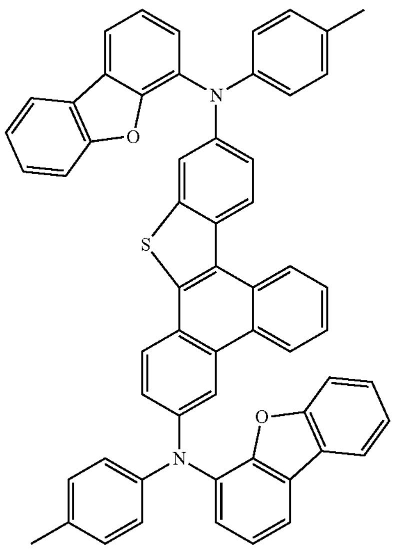
204
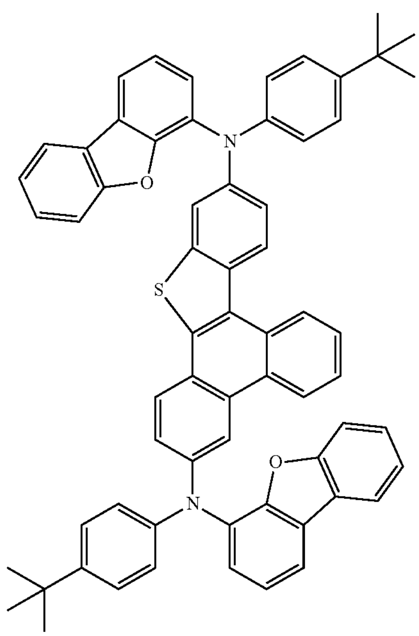
-continued
205
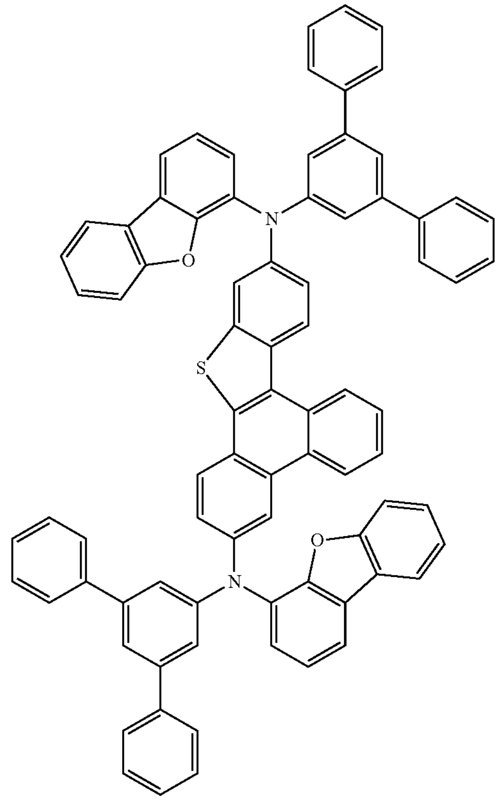
206
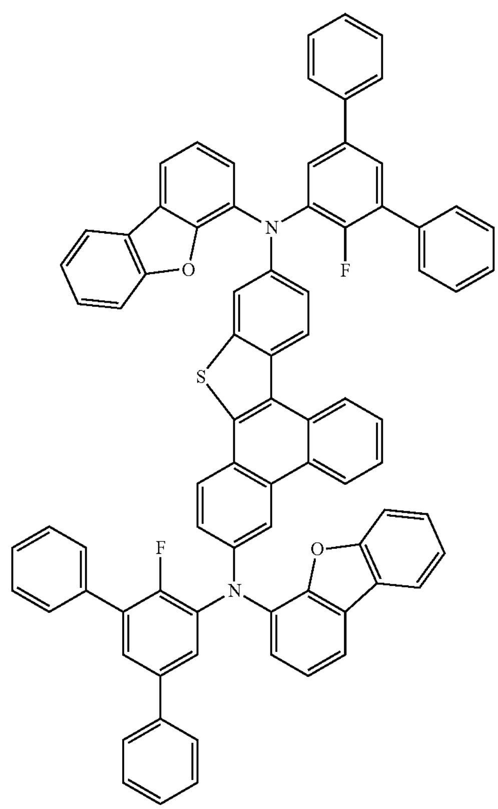

-continued
207
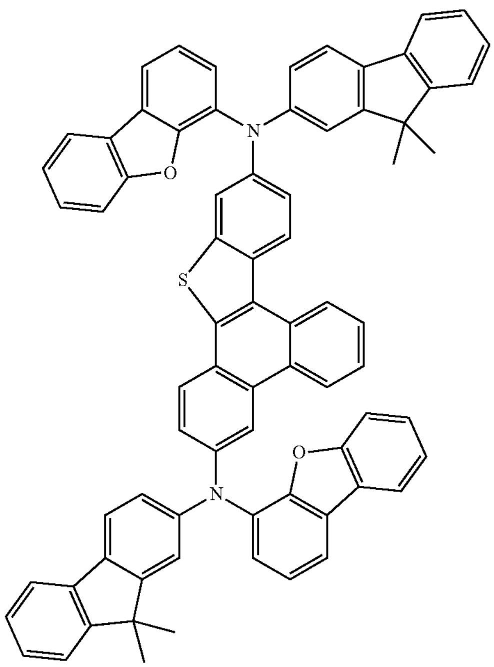
208
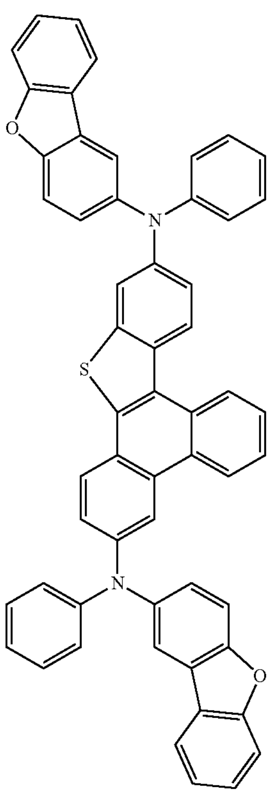
-continued
209
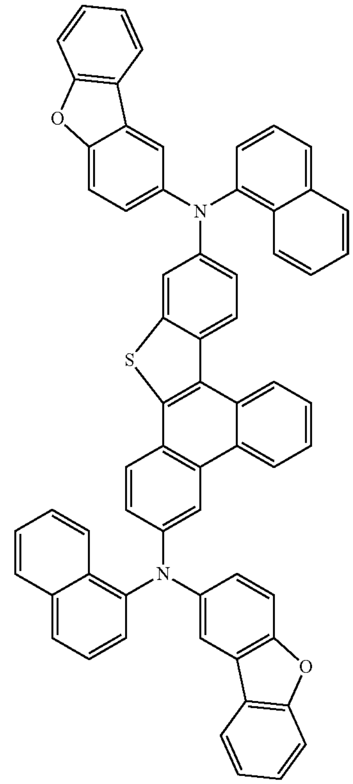
210
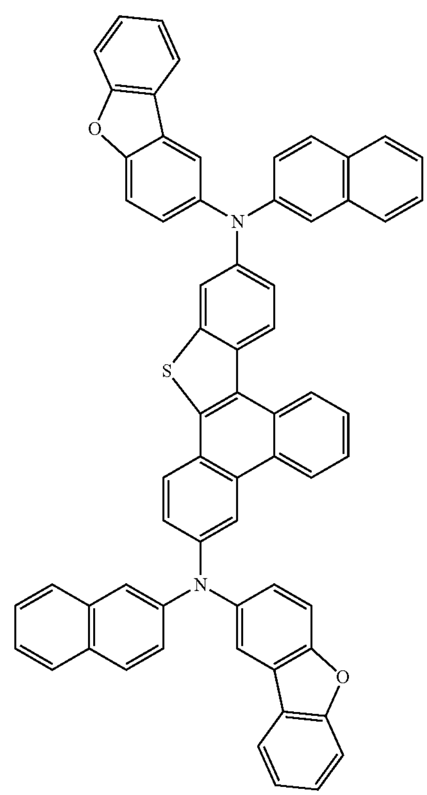

211
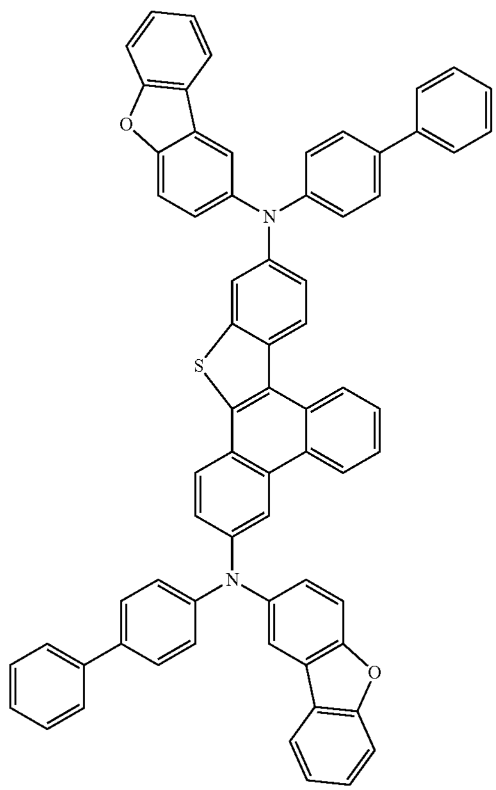
212
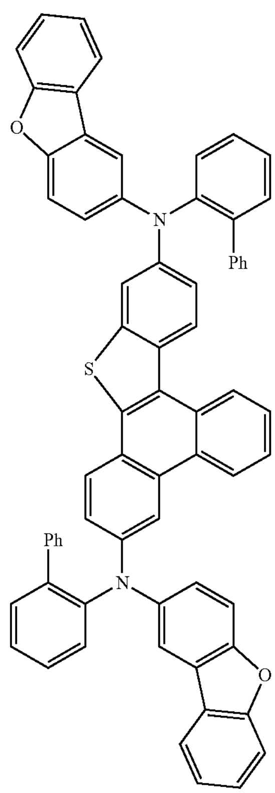
213
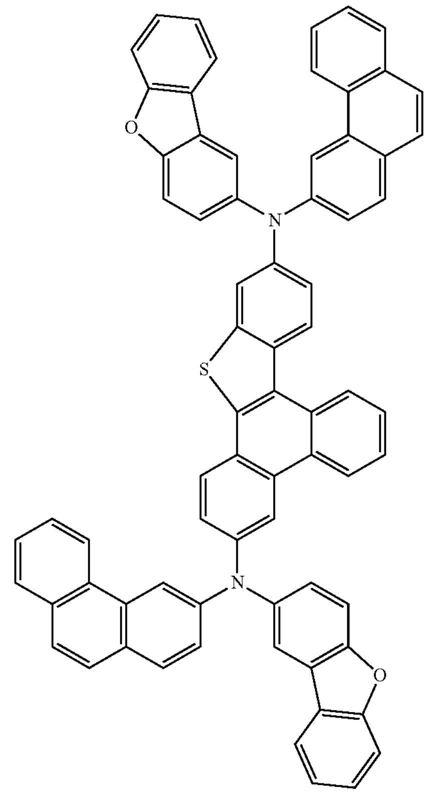
214
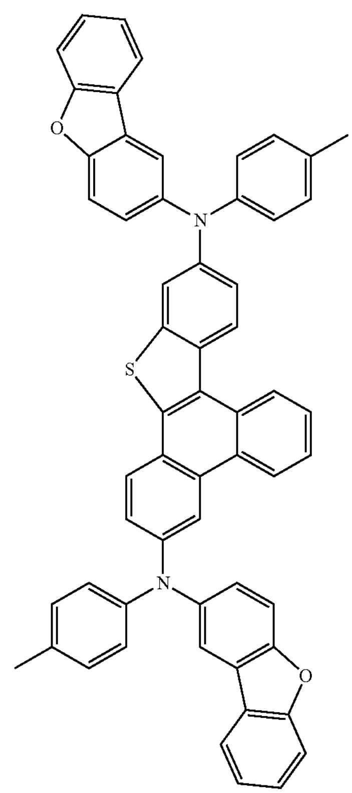

-continued
215
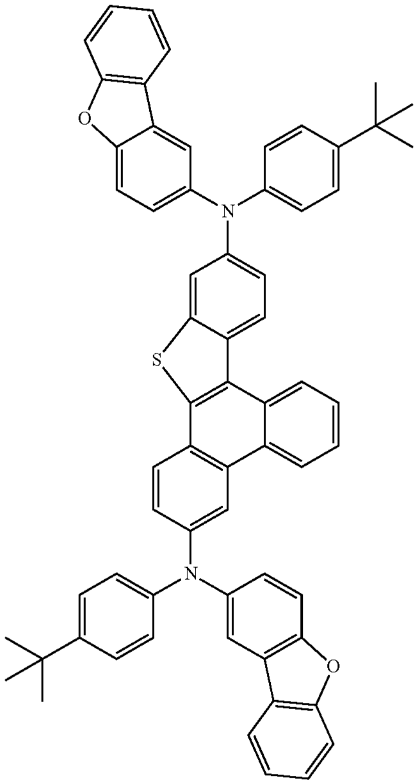
216
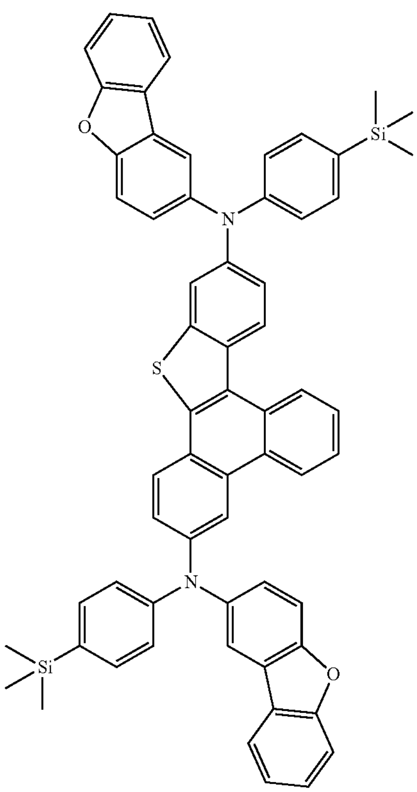
-continued
217
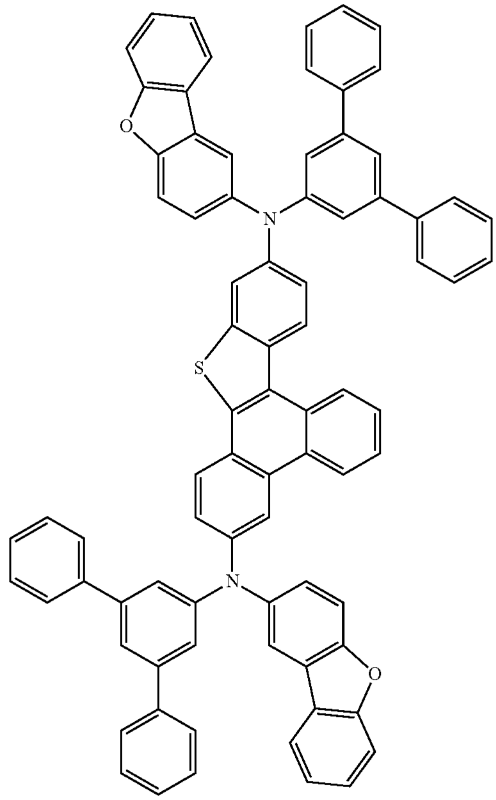
218
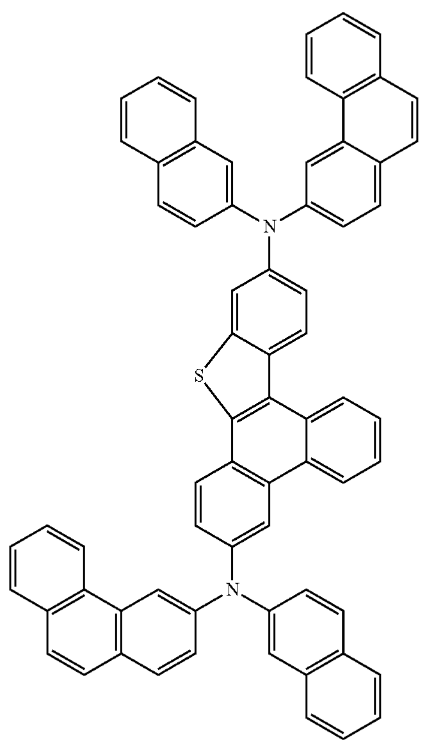

-continued
219
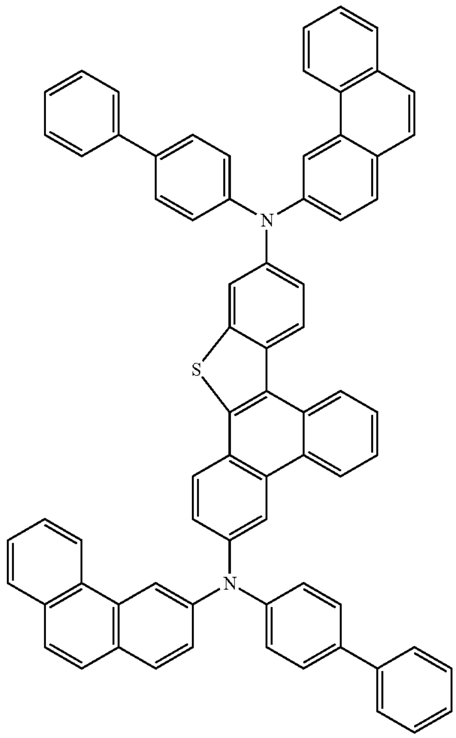
220
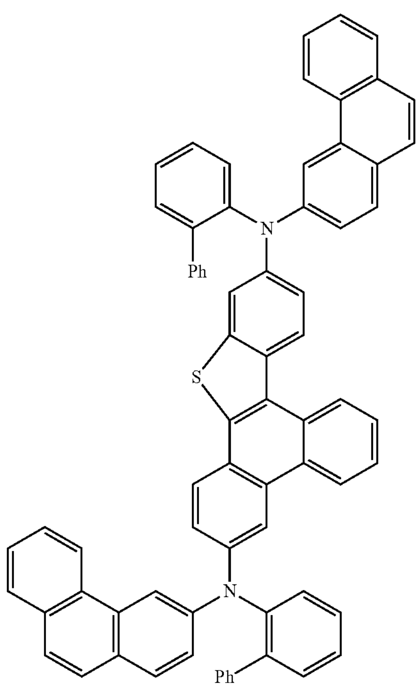
-continued
221
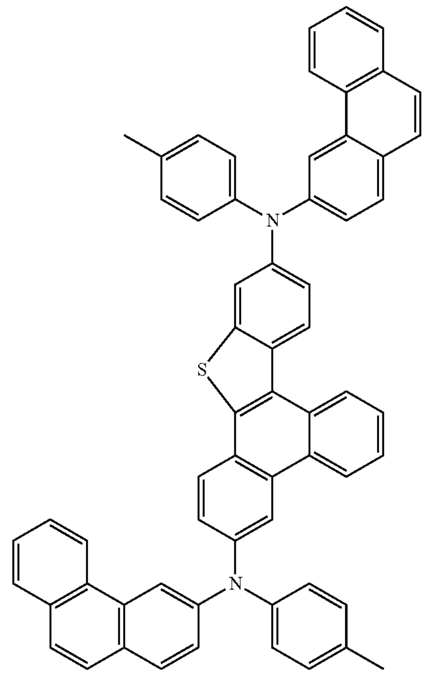
222
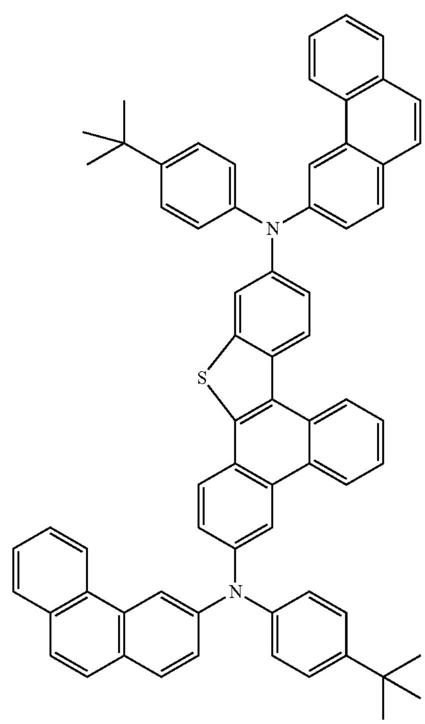

223
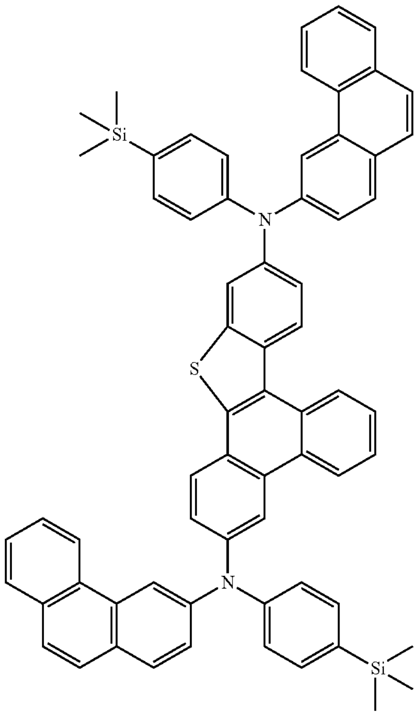
224
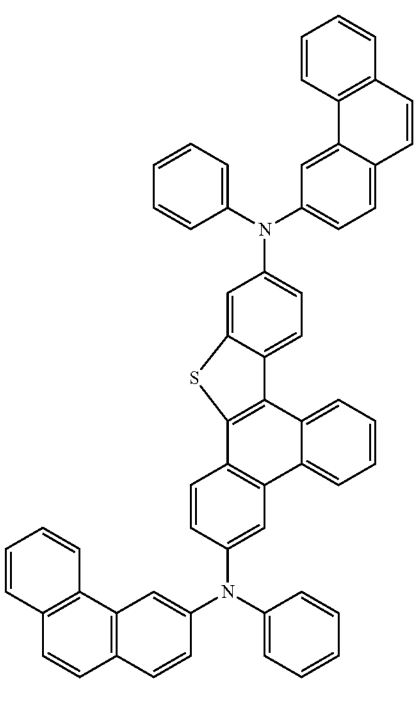
225
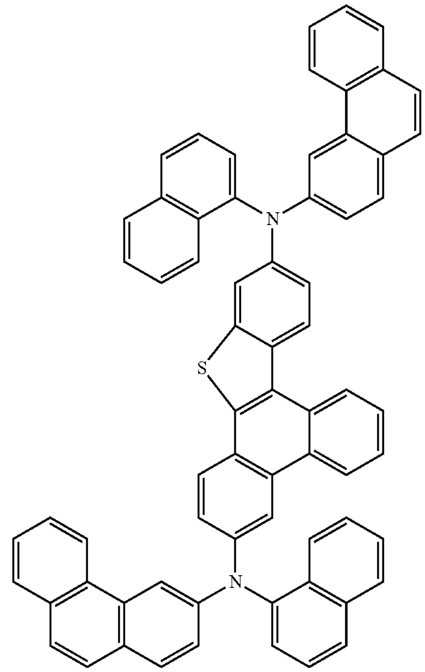
226
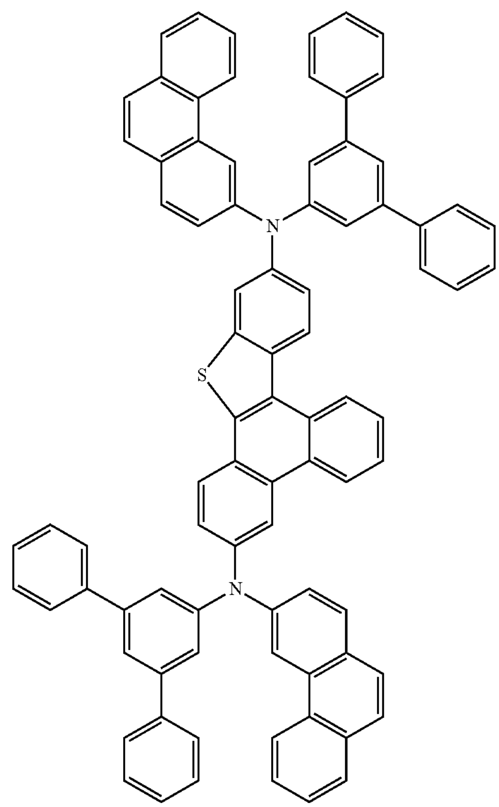

-continued
227
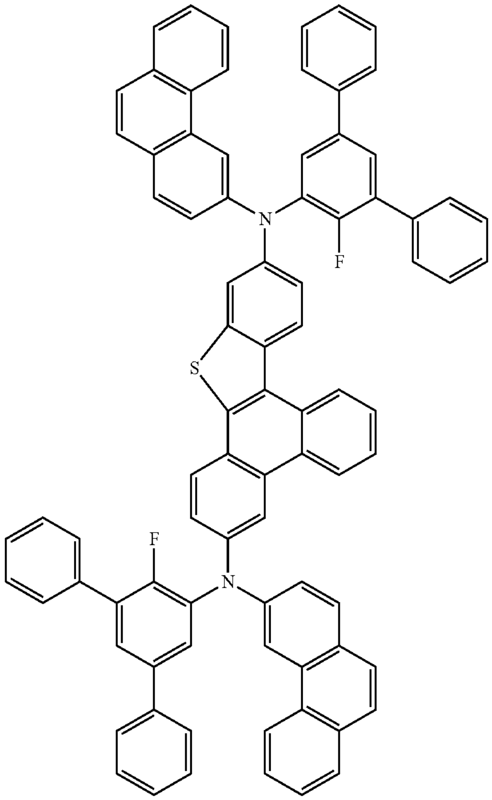
228
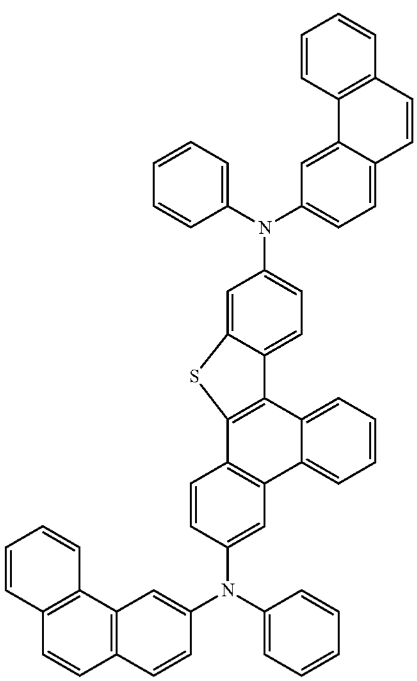
-continued
229
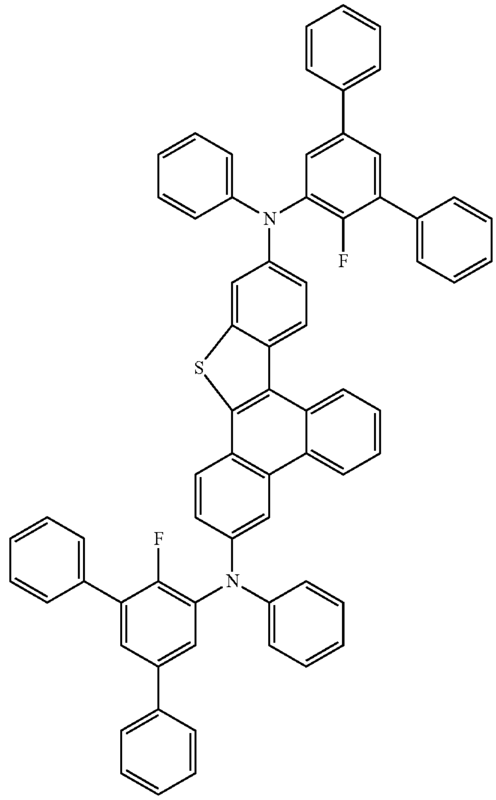
230
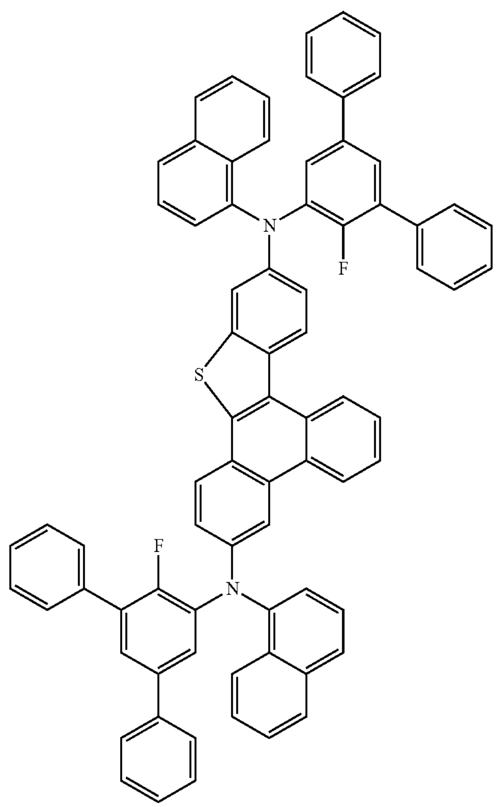

-continued
231
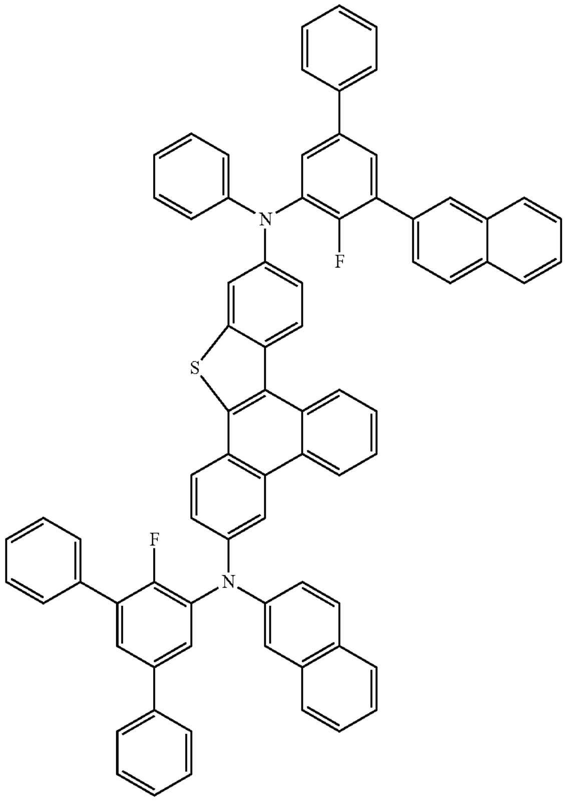
232
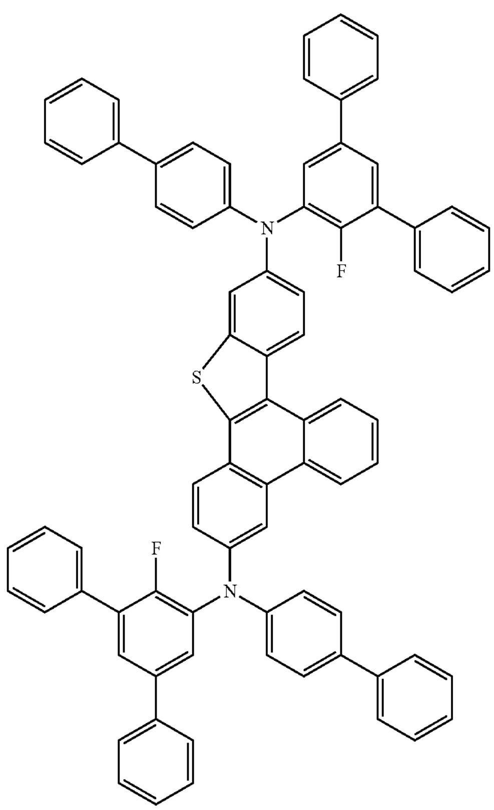
-continued
233
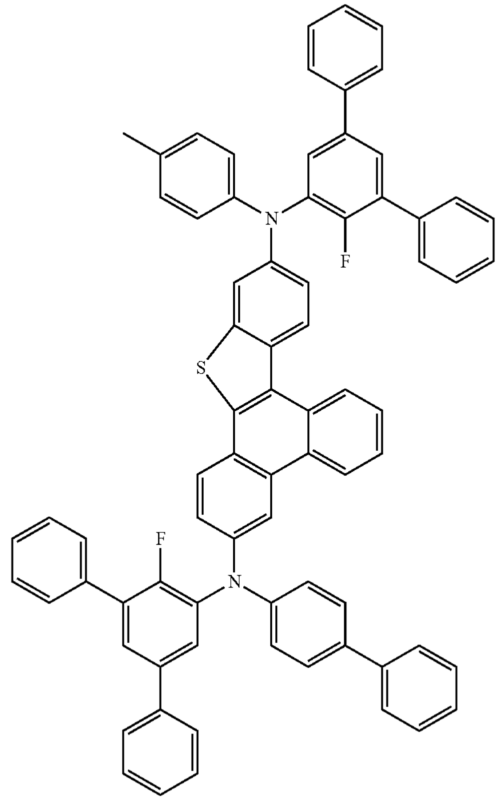
234
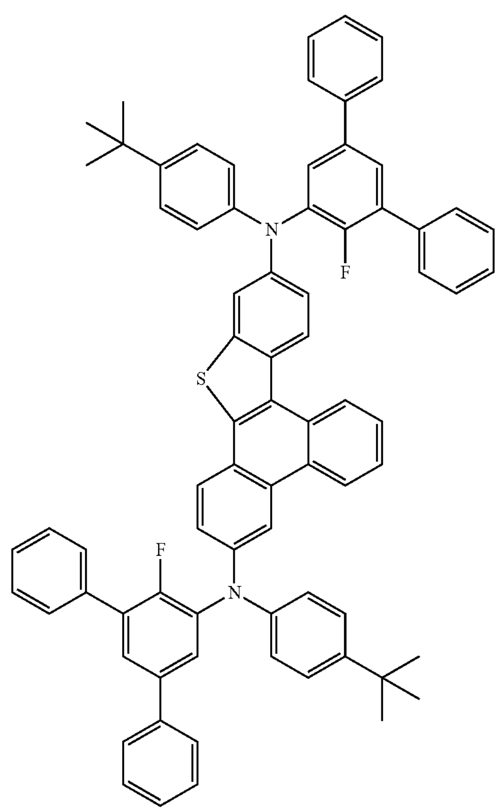

-continued
235
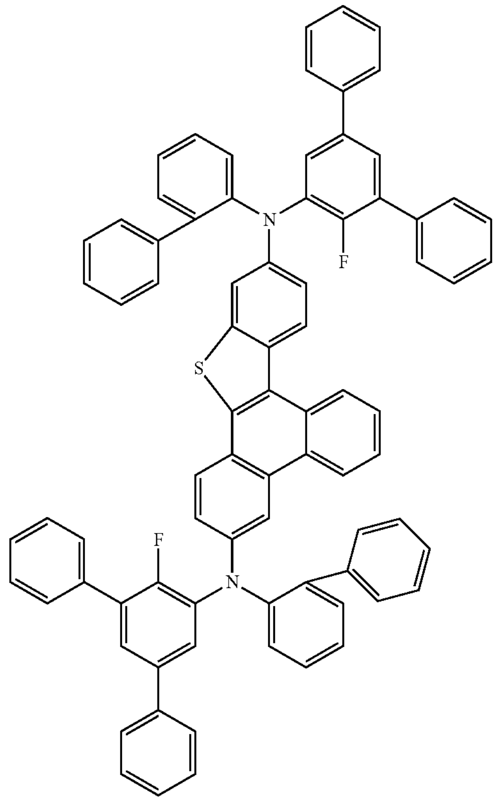
236
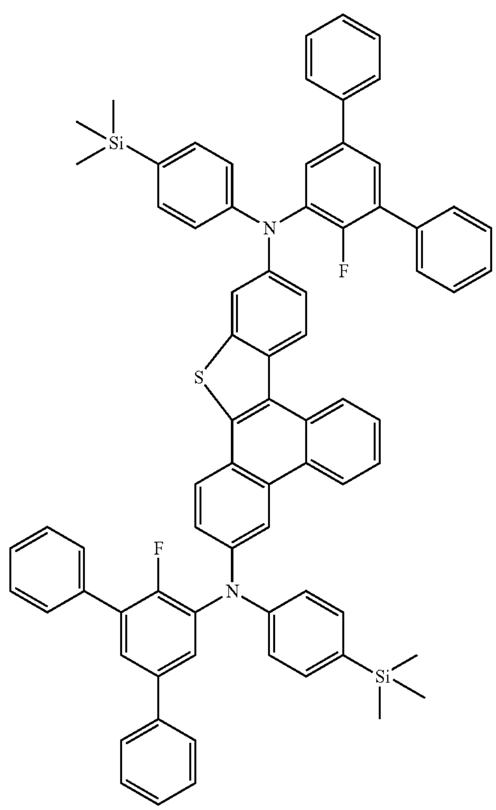
-continued
237
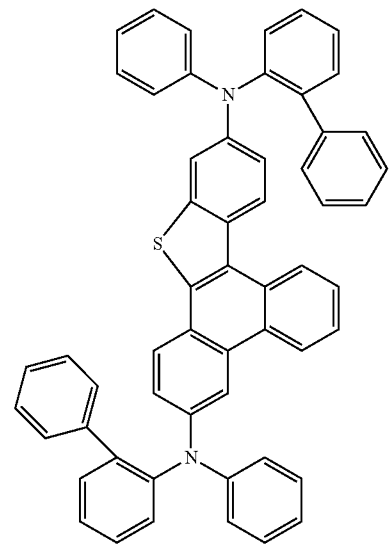
238
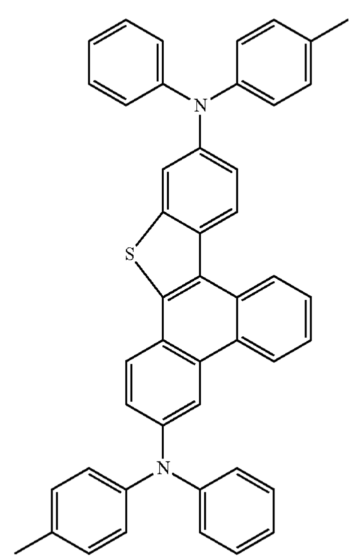

-continued
239
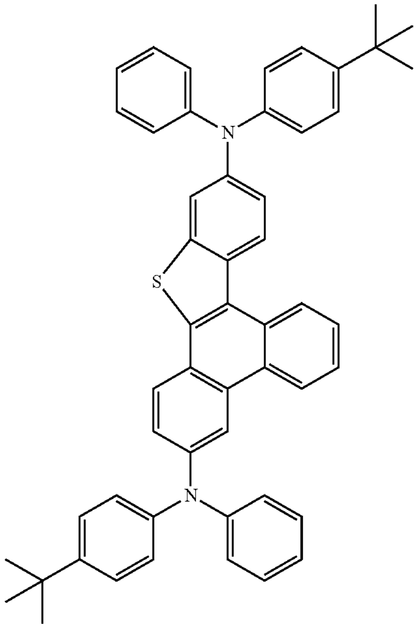
240
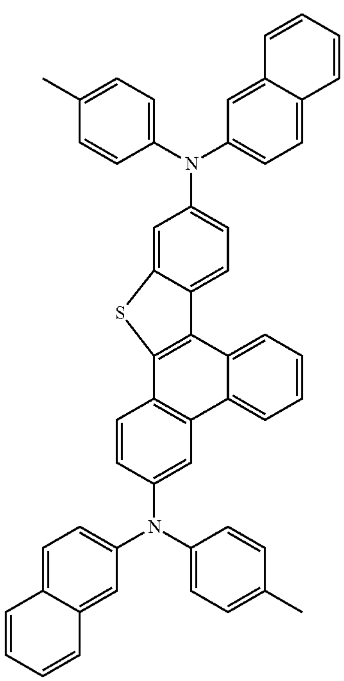
-continued
241
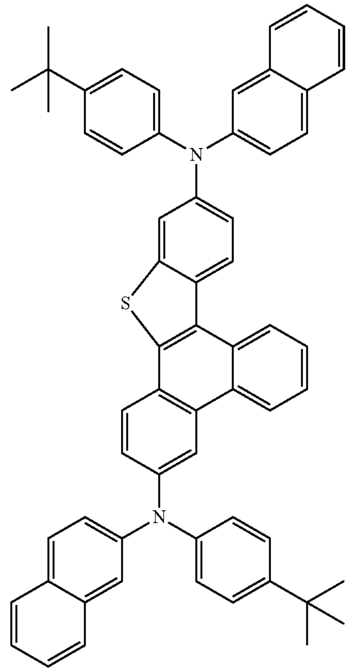
242
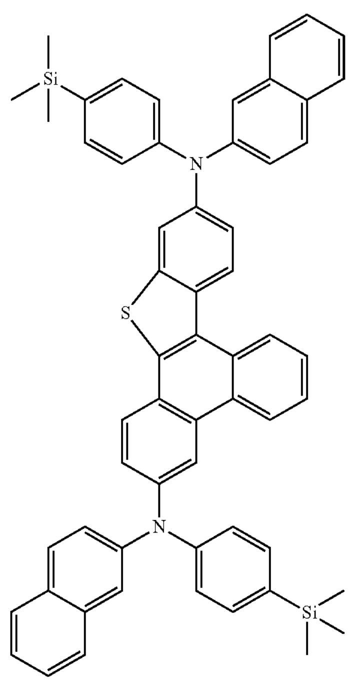

-continued
243
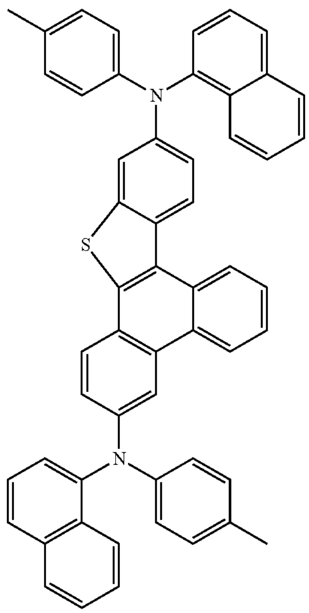
244
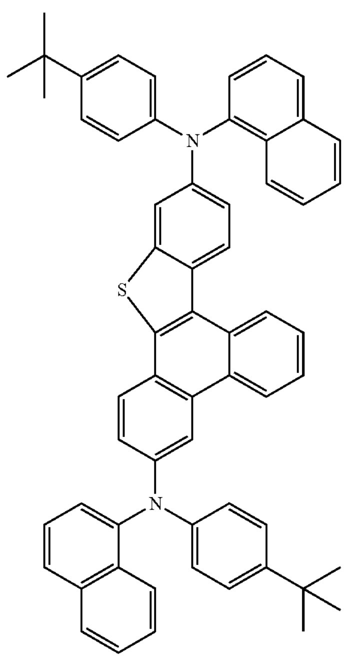
-continued
245
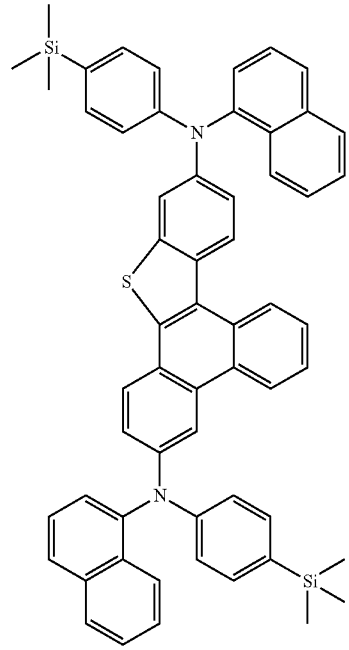
246
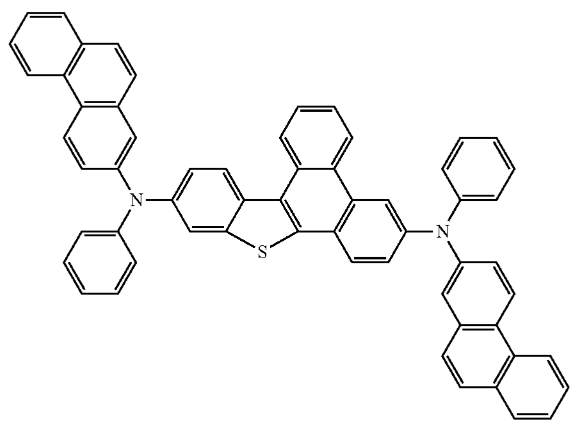
247
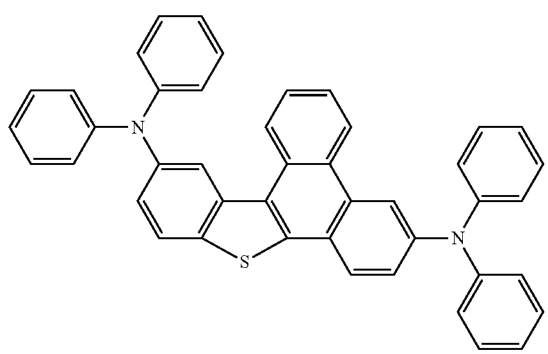

-continued
248
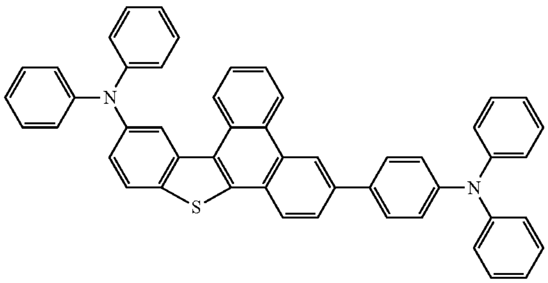
1A
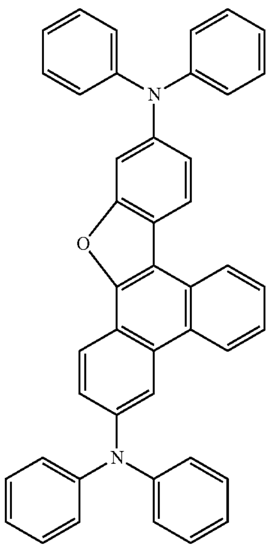
2A
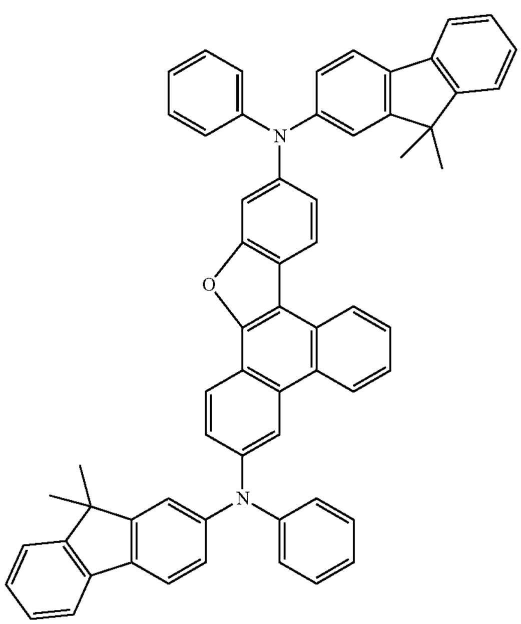
-continued
3A
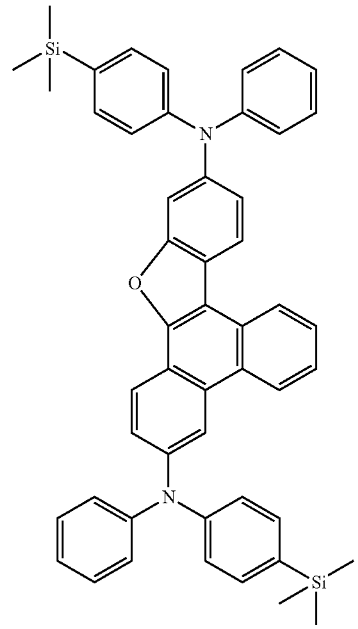
4A
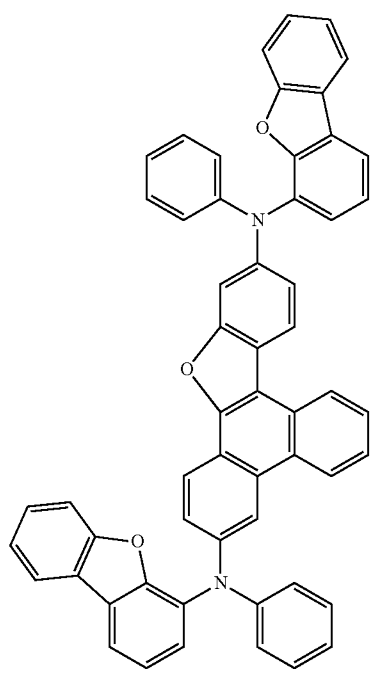

5A
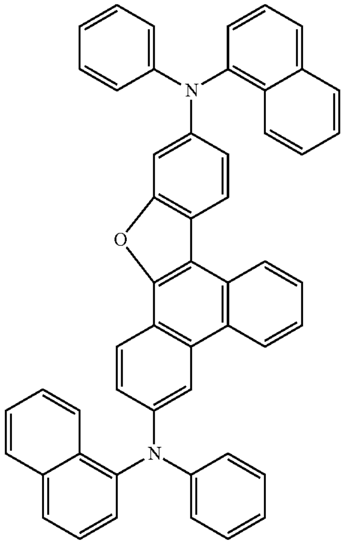
6A
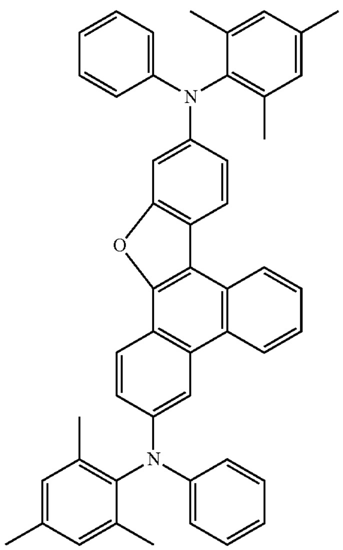
7A
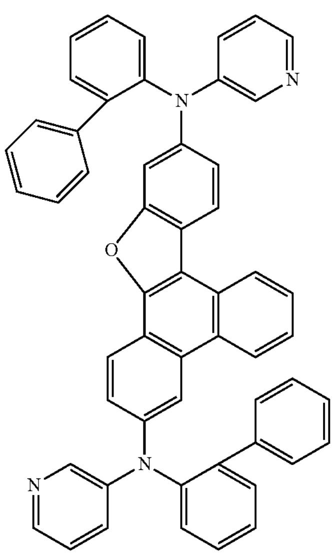
8A
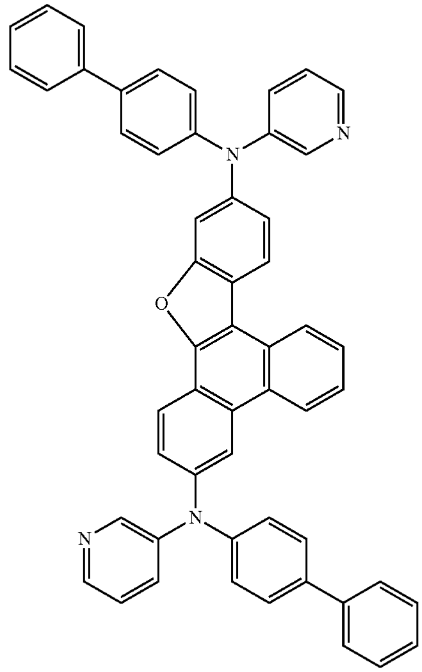
9A
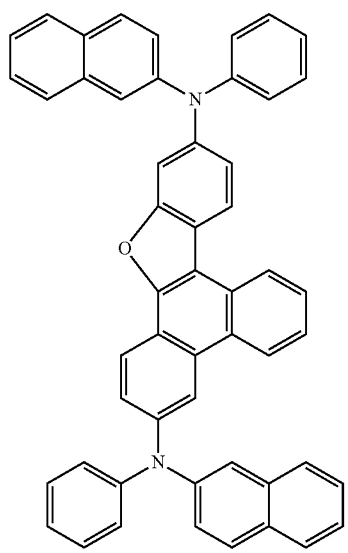

-continued
10A
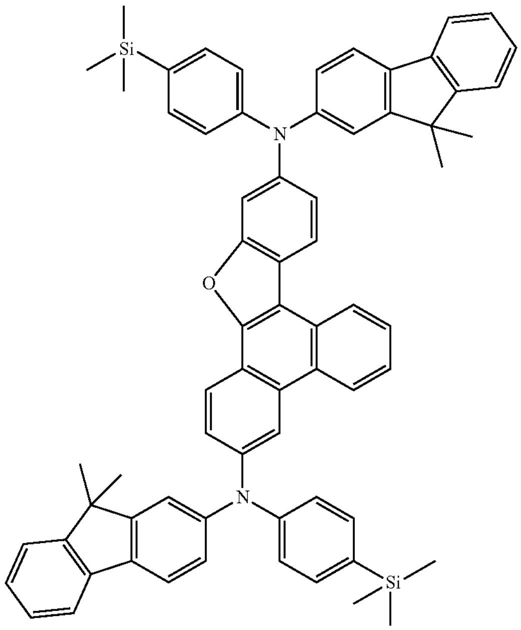
11A
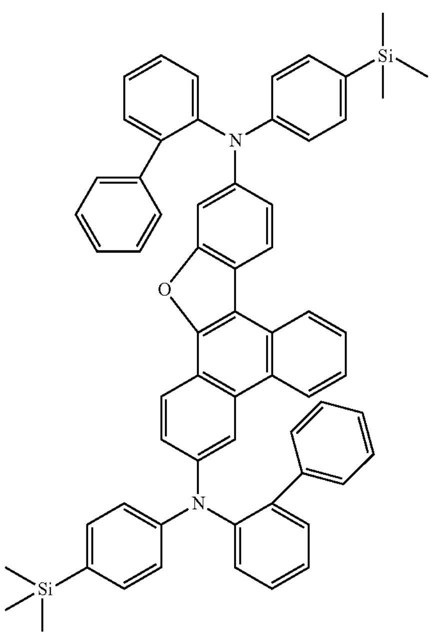
-continued
12A
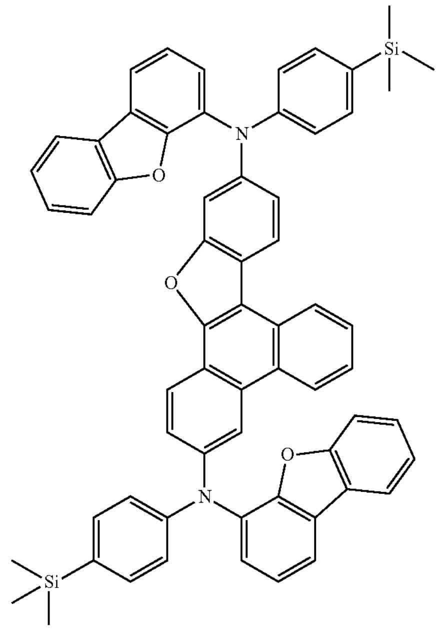
13A
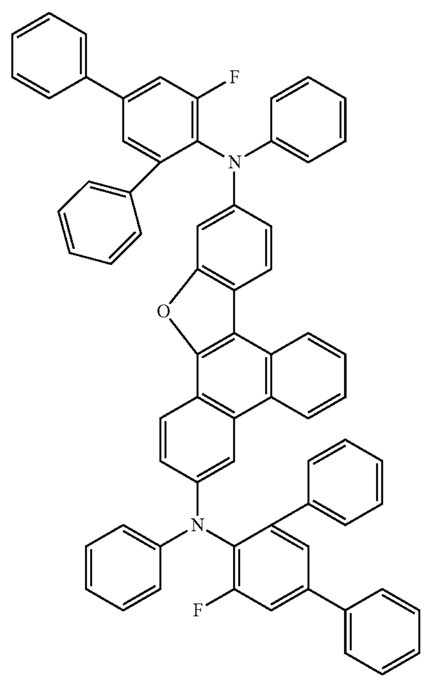

-continued
14A
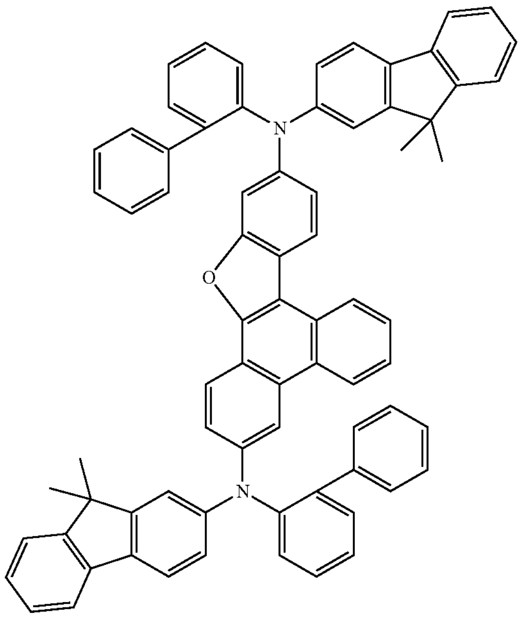
15A
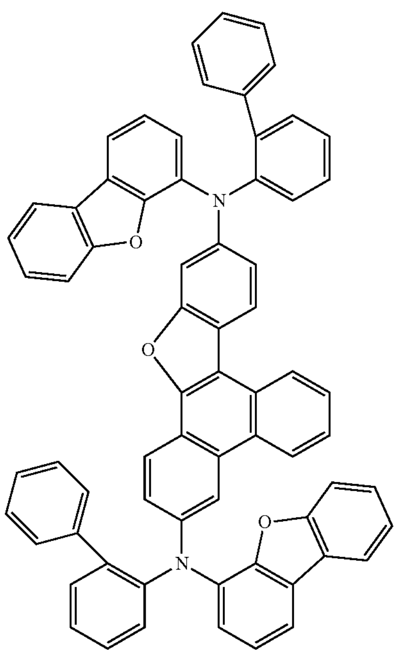
-continued
16A
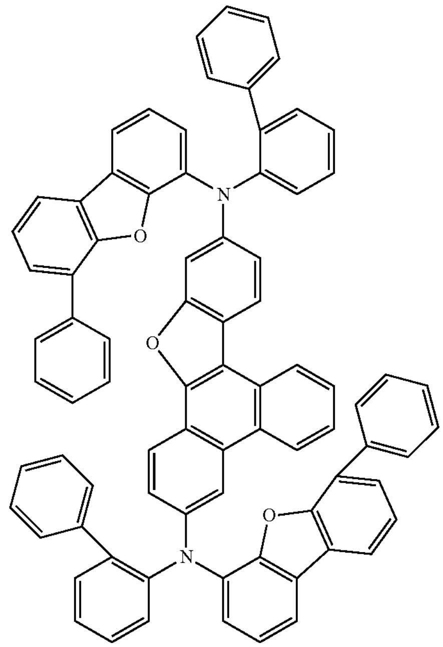
17A
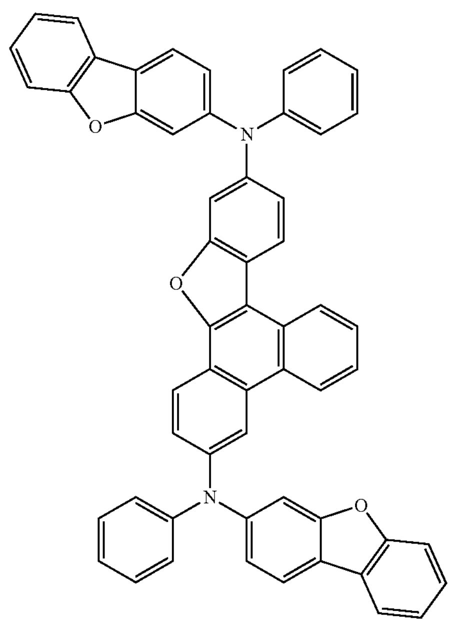

18A
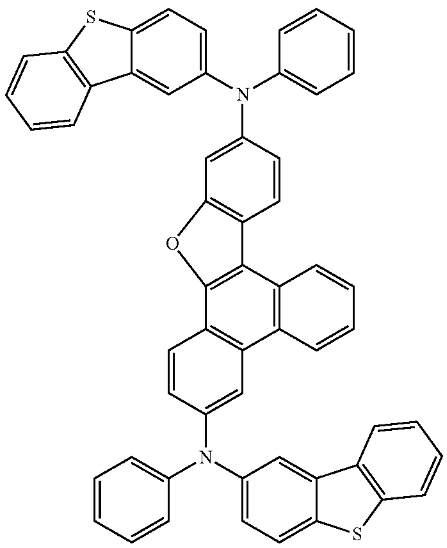
19A
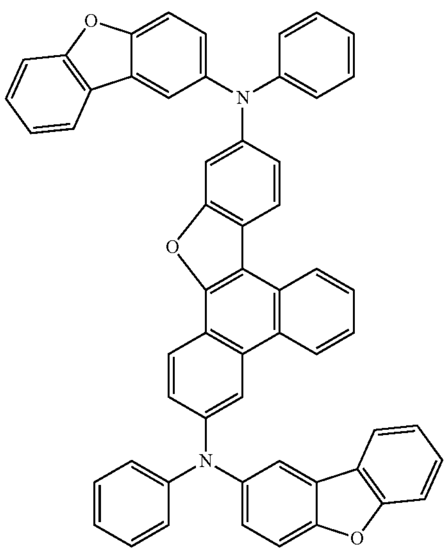
20A
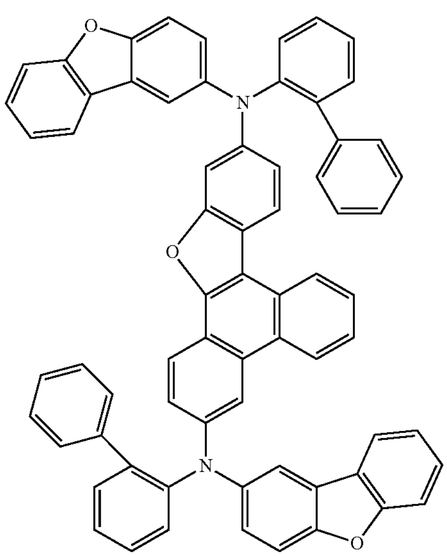
21A
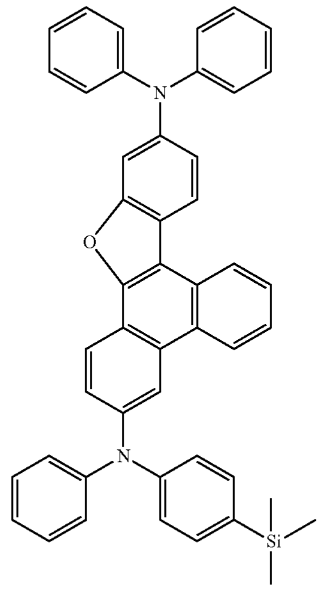
22A
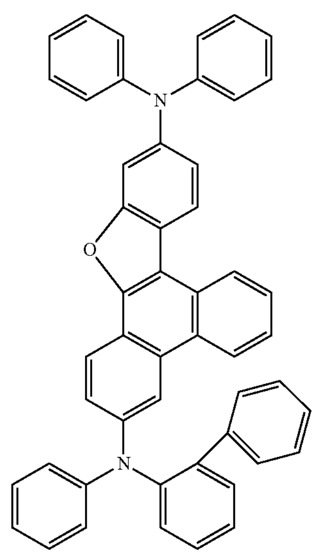

23A
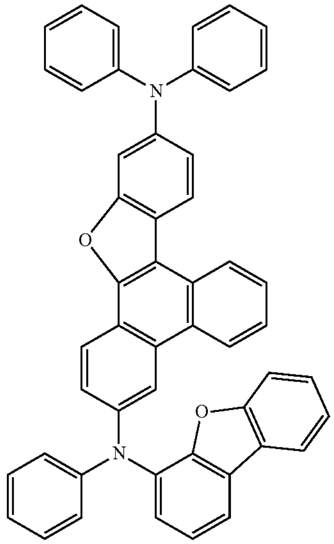
24A
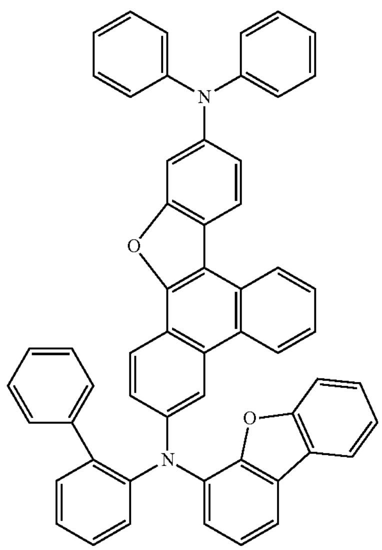
25A
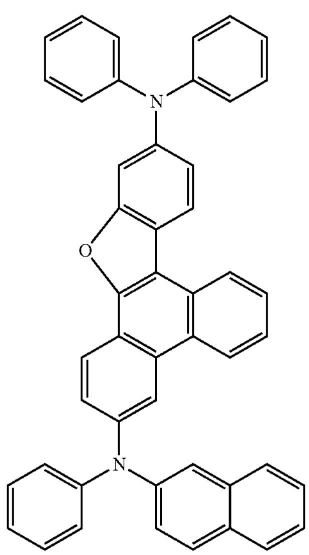
26A
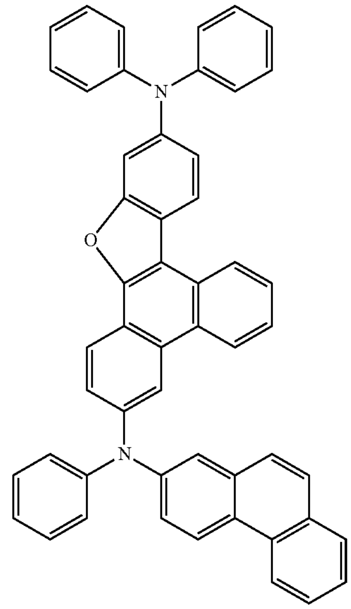
27A
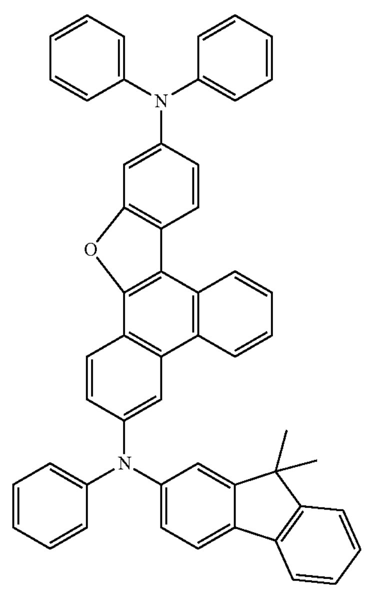

-continued
28A
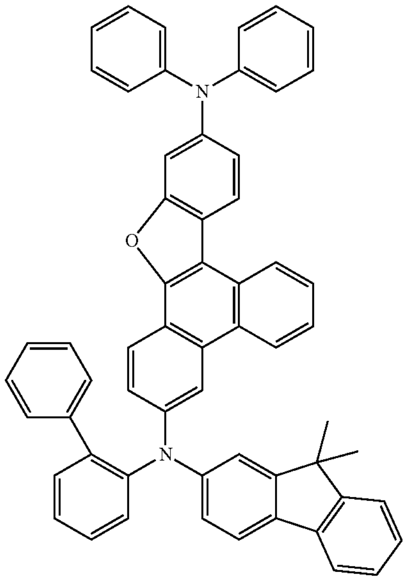
29A
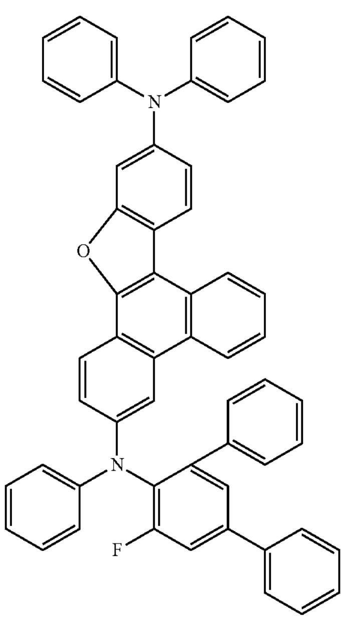
-continued
30A
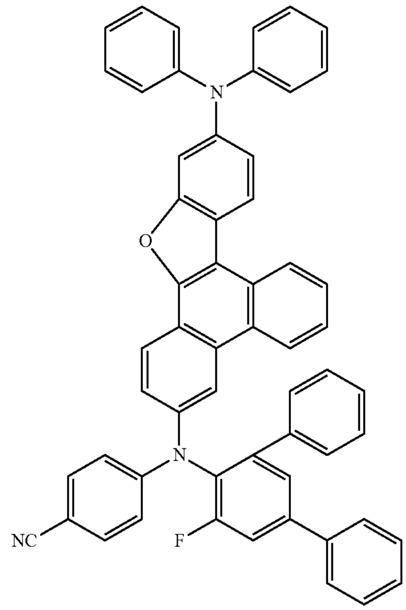
31A
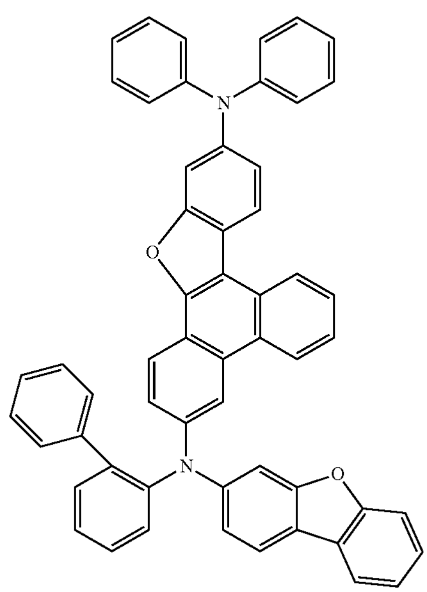

-continued
32A
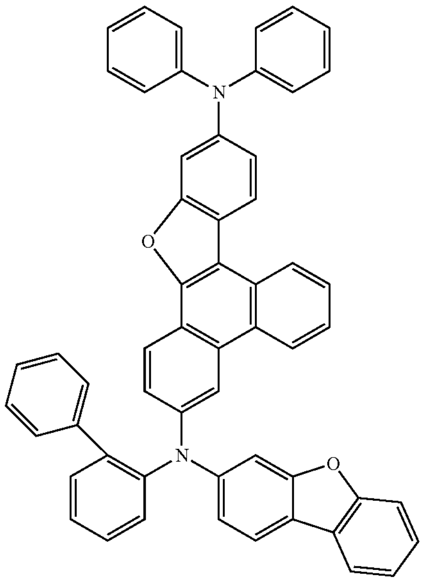
33A
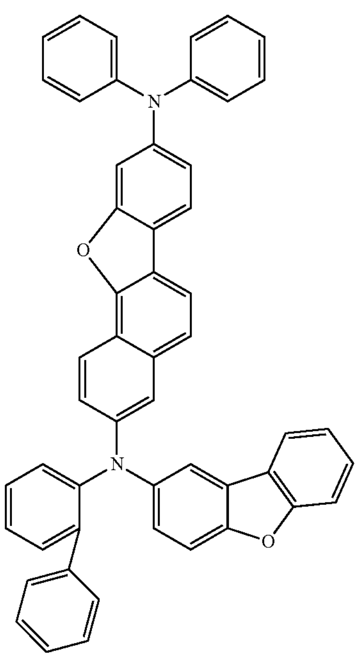
-continued
34A
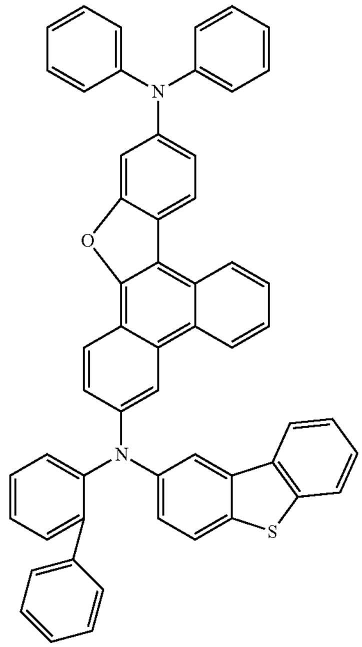
35A
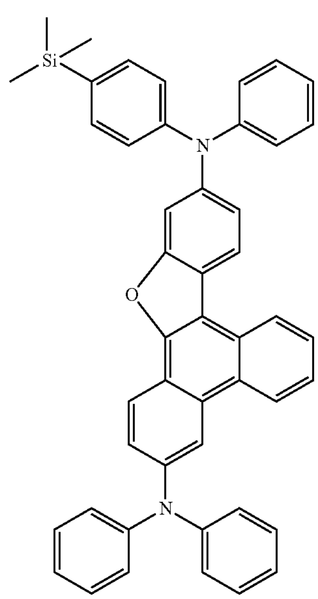

-continued
36A
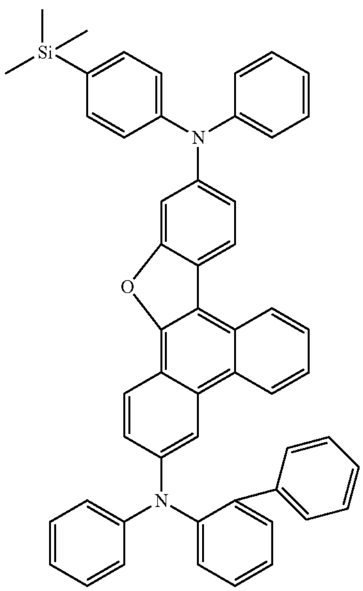
37A
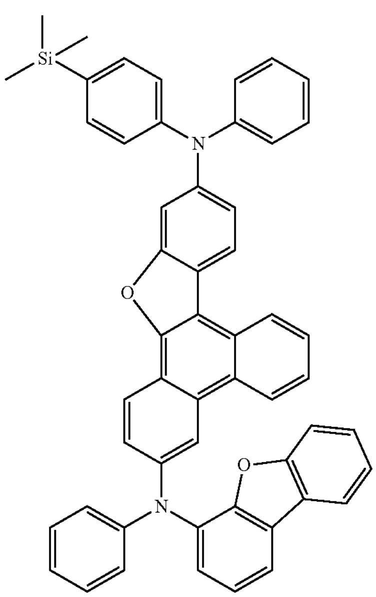
-continued
38A
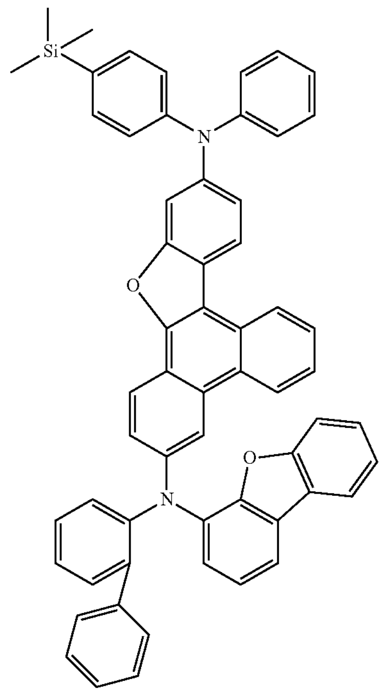
39A
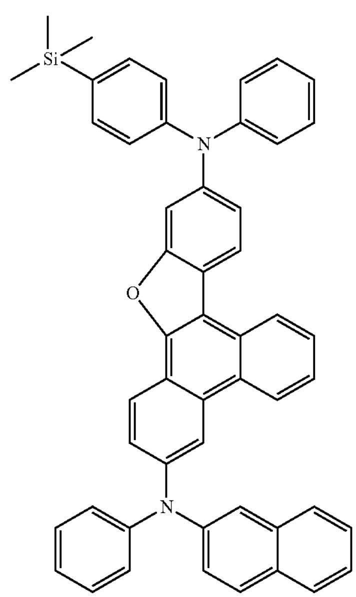

-continued
40A
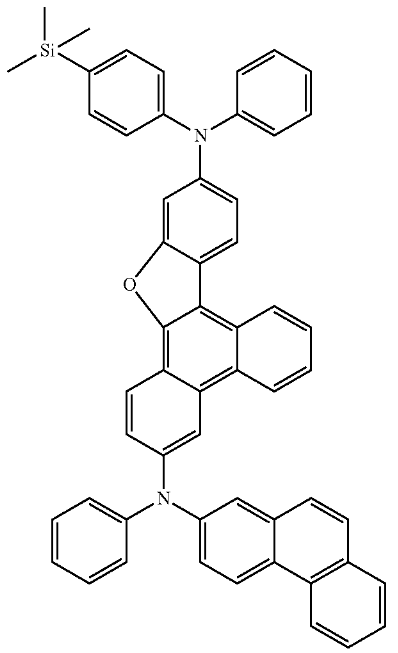
-continued
42A
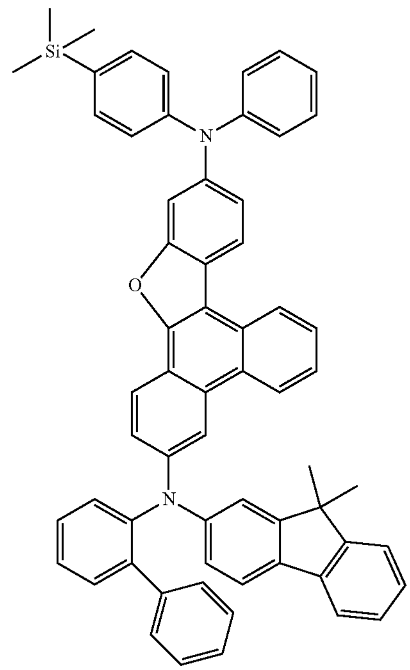
41A
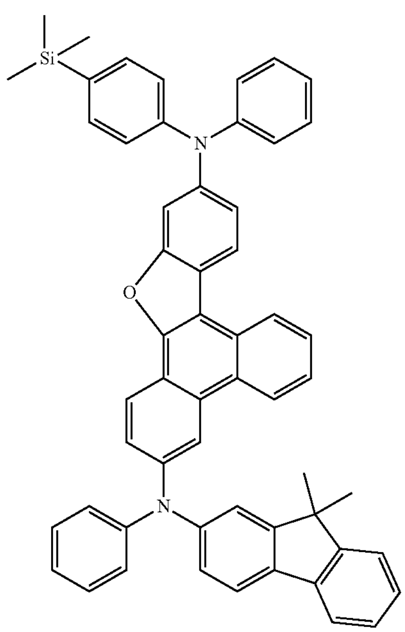
43A
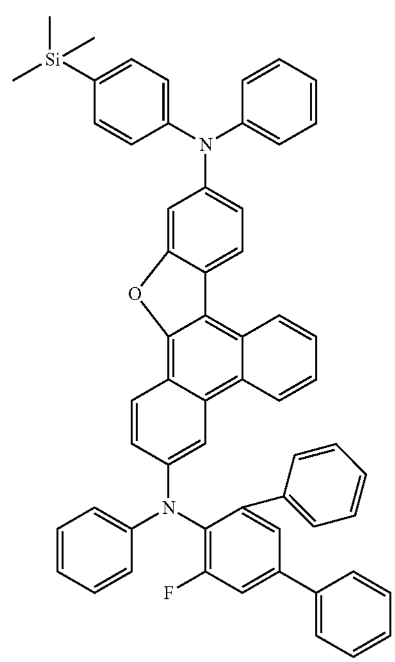

-continued
44A
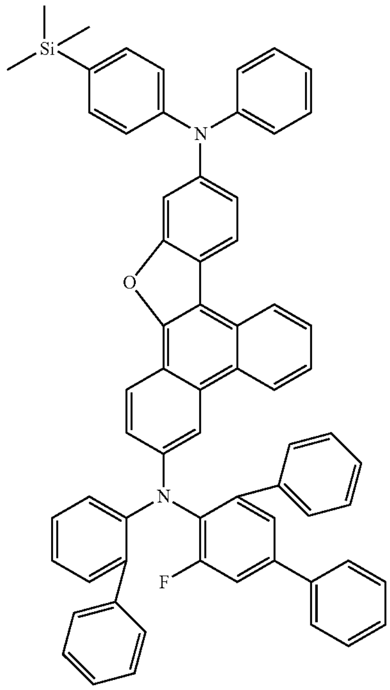
46A
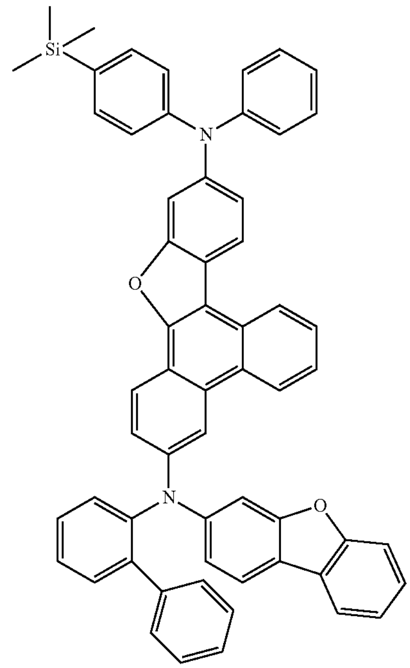
45A
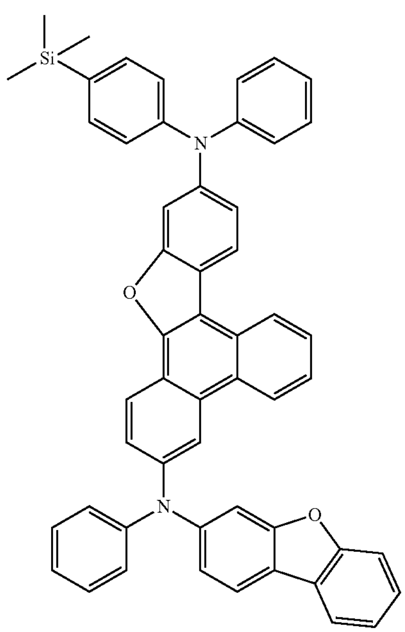
47A
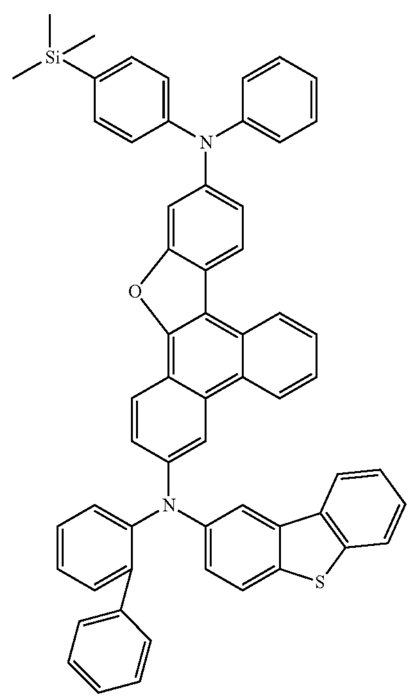

-continued
48A
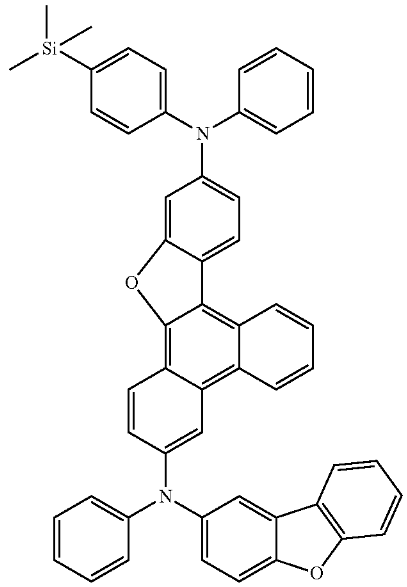
49A
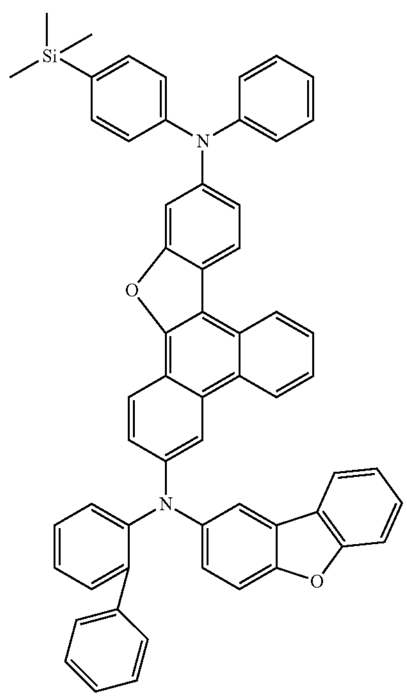
-continued
50A
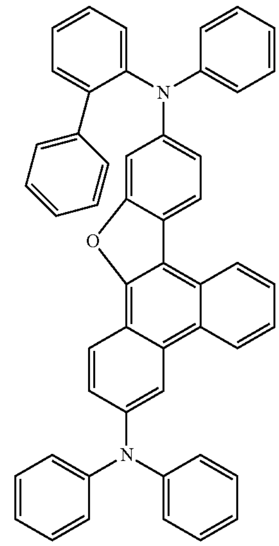
51A
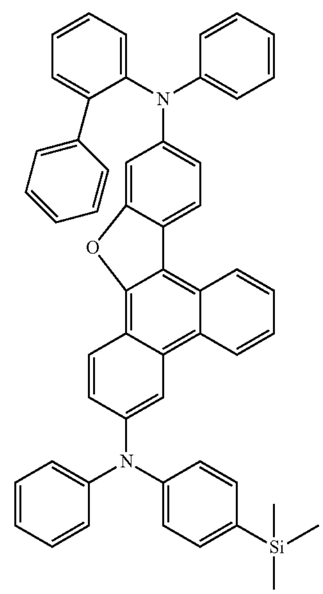

-continued
52A
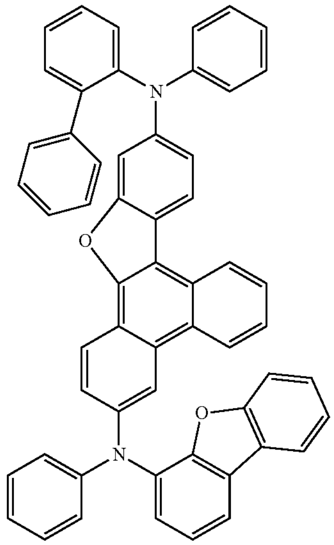
53A
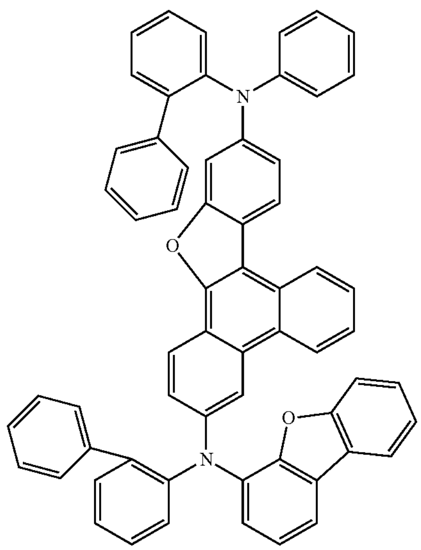
54A
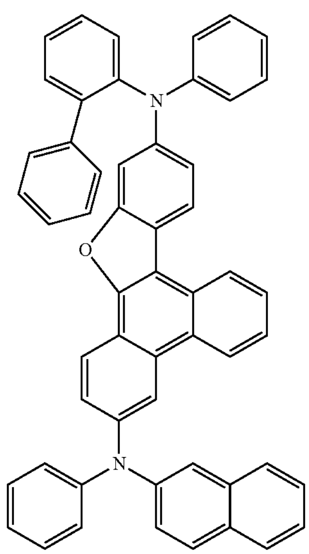
-continued
55A
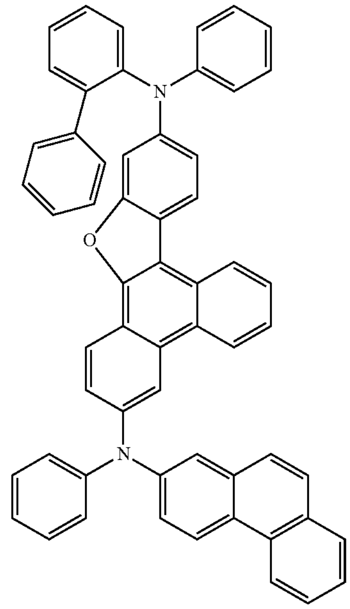
56A
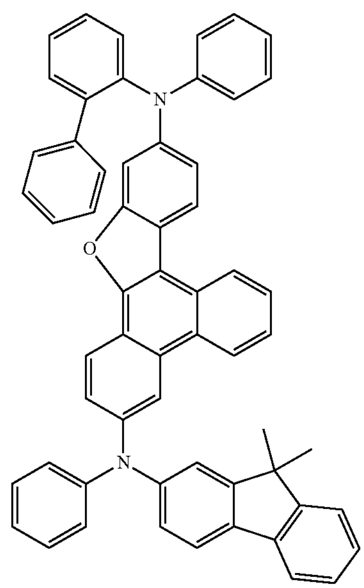

-continued
57A
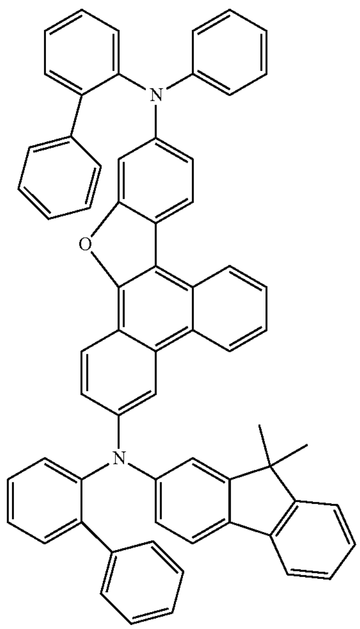
58A
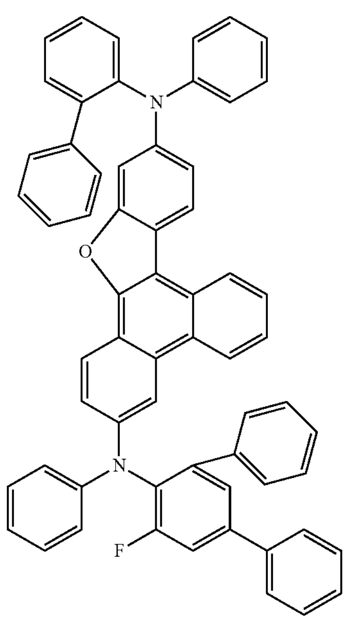
-continued
59A
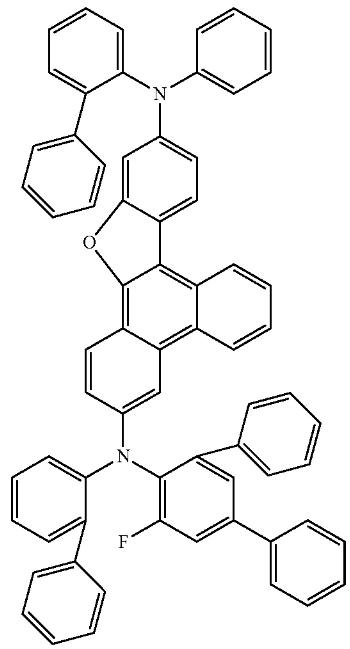
60A
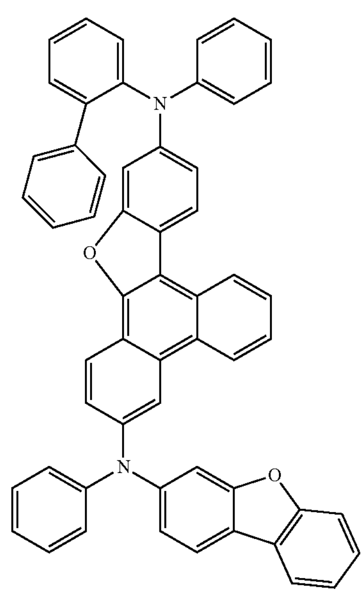

-continued
61A
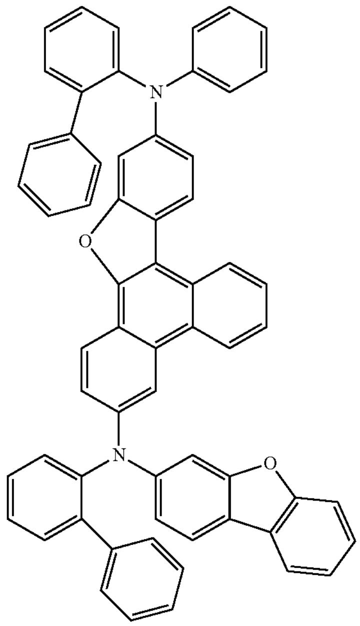
62A
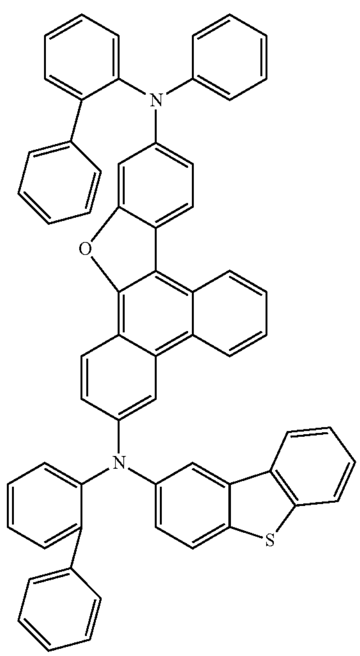
-continued
63A
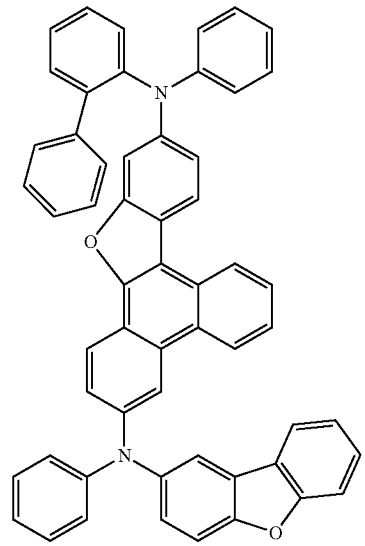
64A
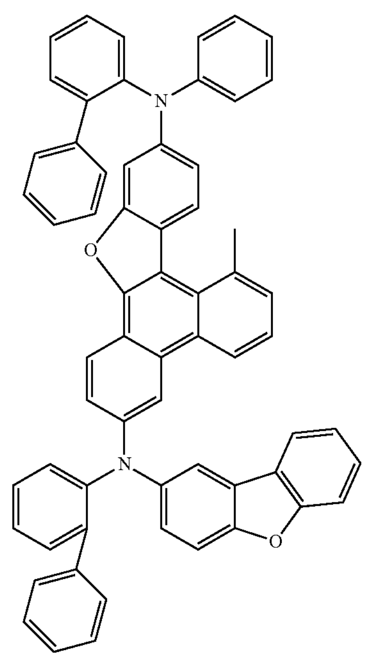

-continued
65A
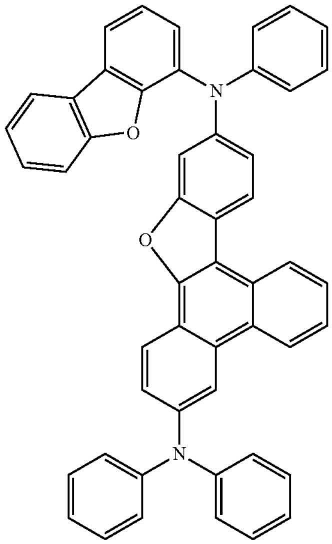
66A
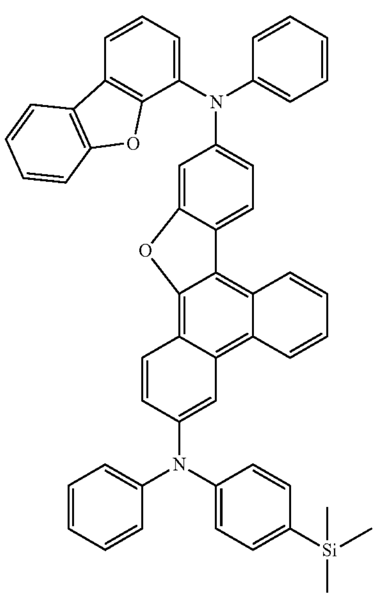
-continued
67A
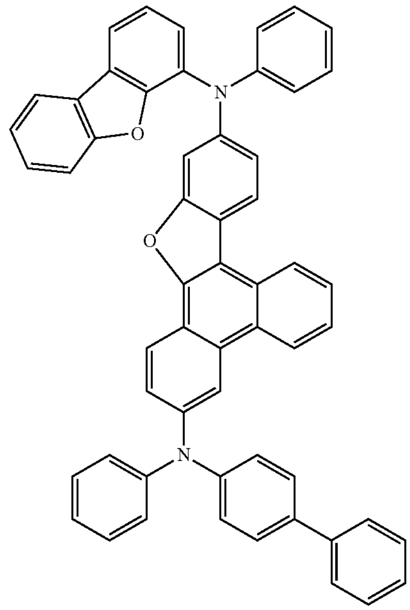
68A
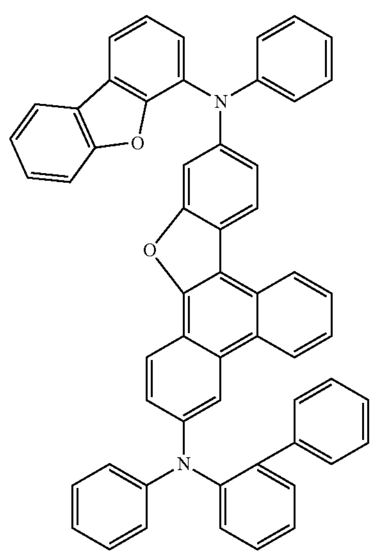

-continued
69A
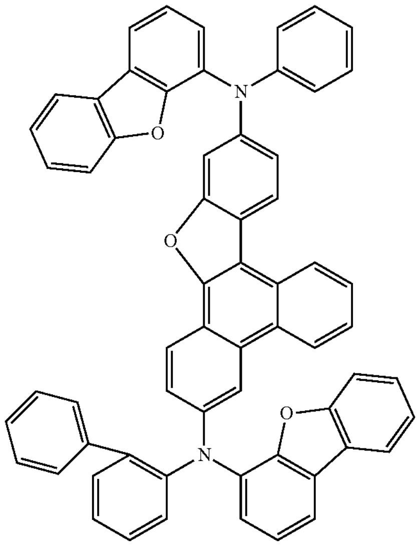
70A
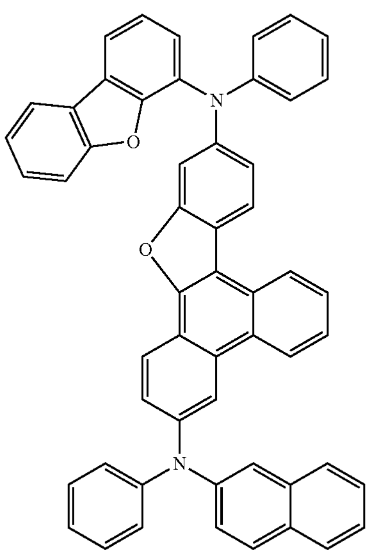
-continued
71A
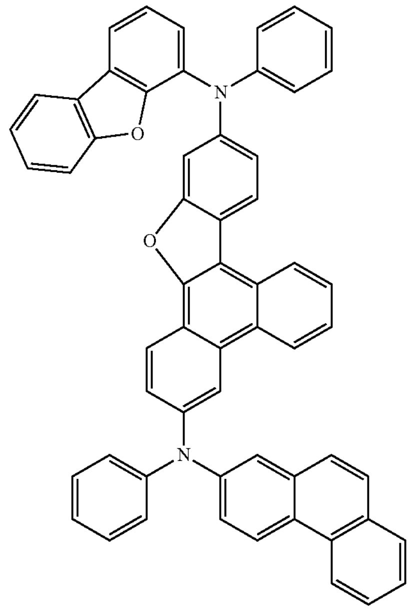
72A
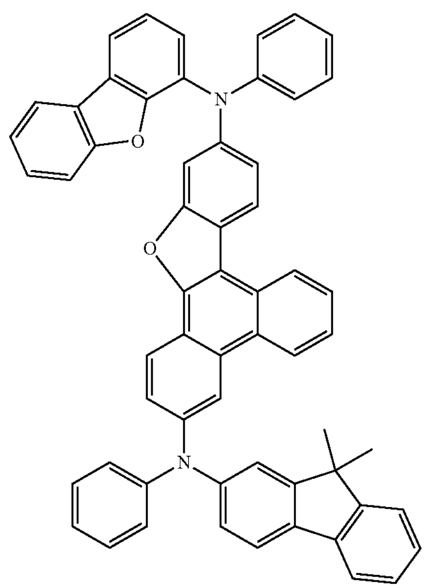

-continued
73A
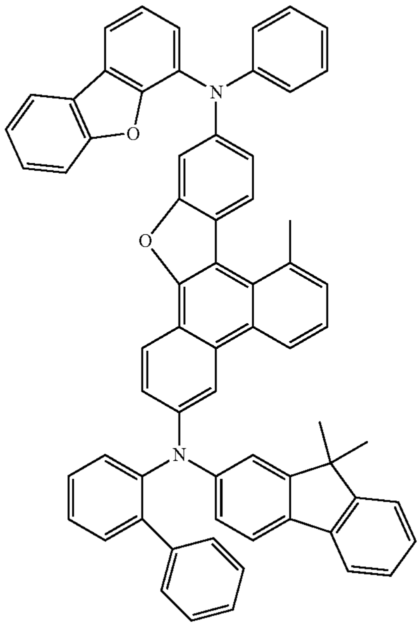
75A
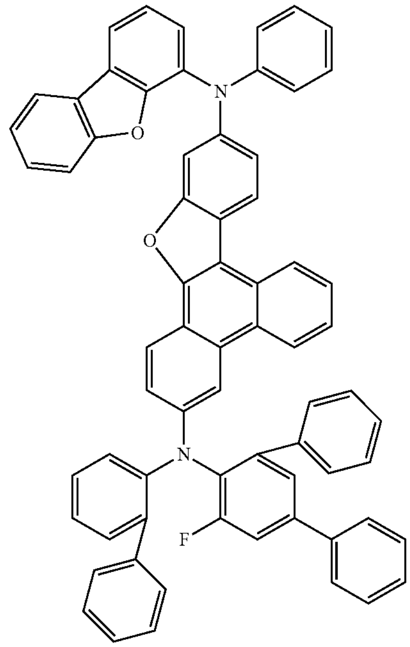
74A
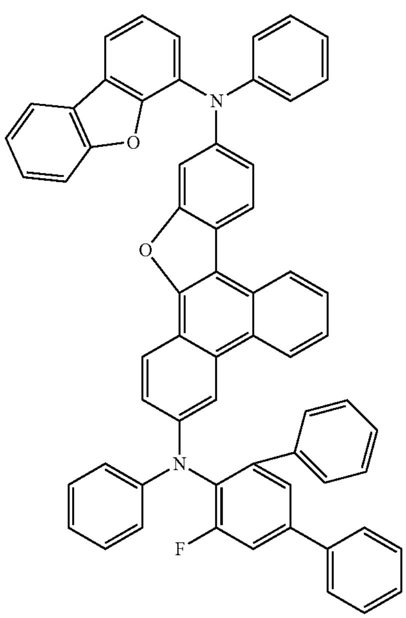
76A
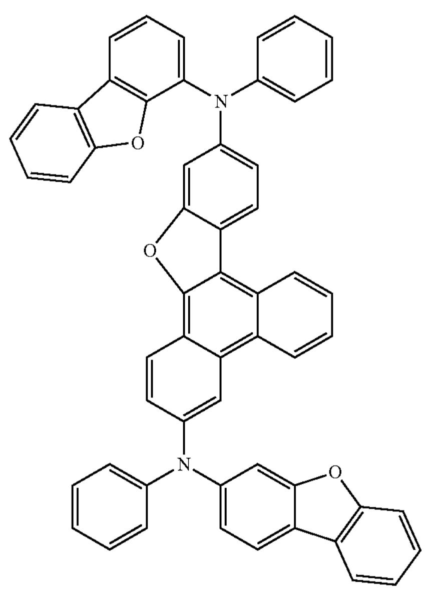

-continued
77A
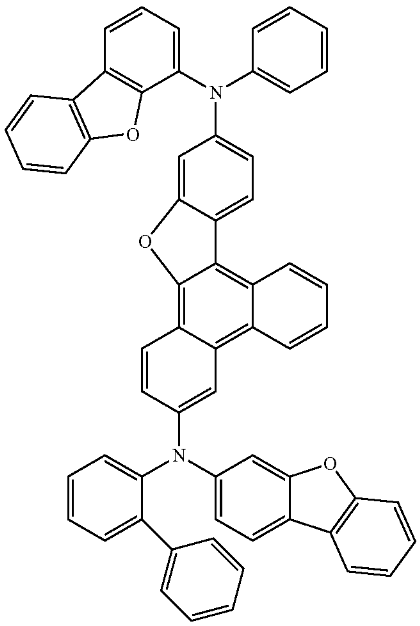
-continued
79A
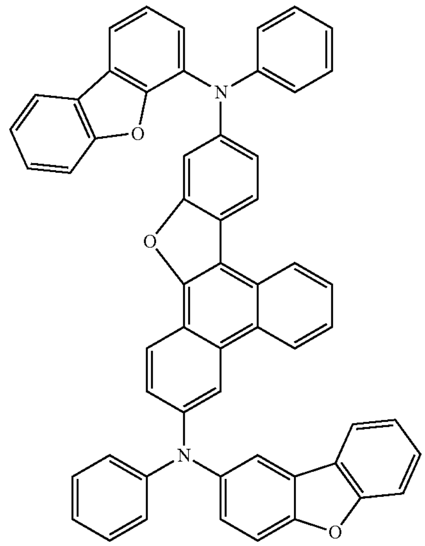
78A
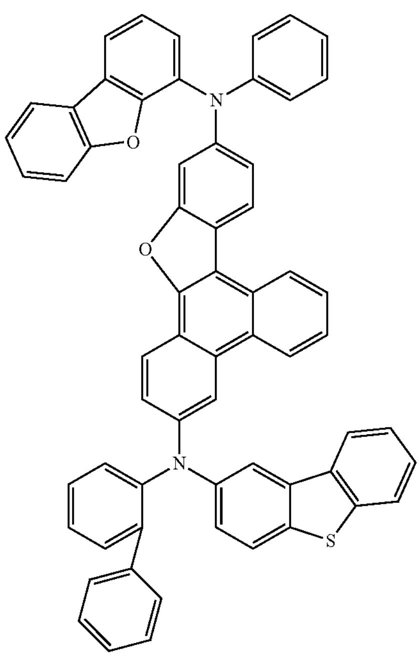
80A
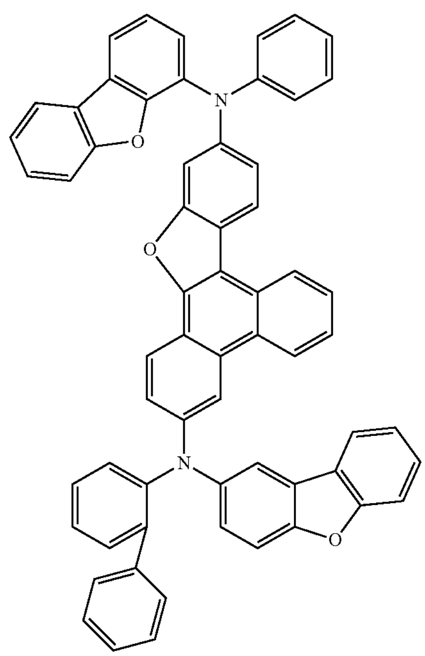

-continued
81A
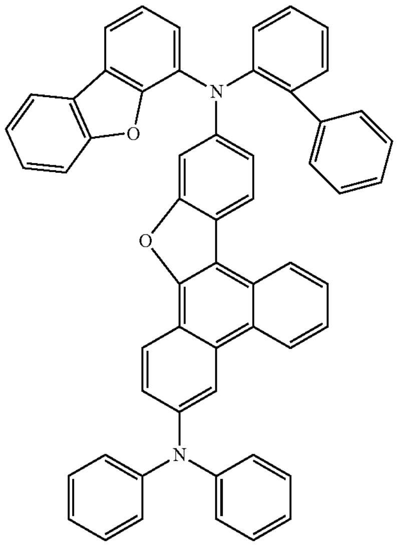
82A
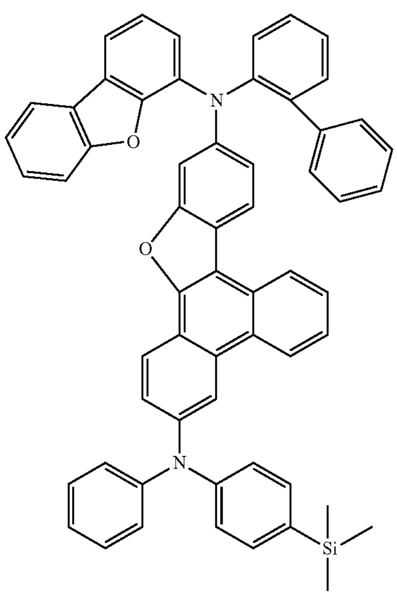
-continued
83A
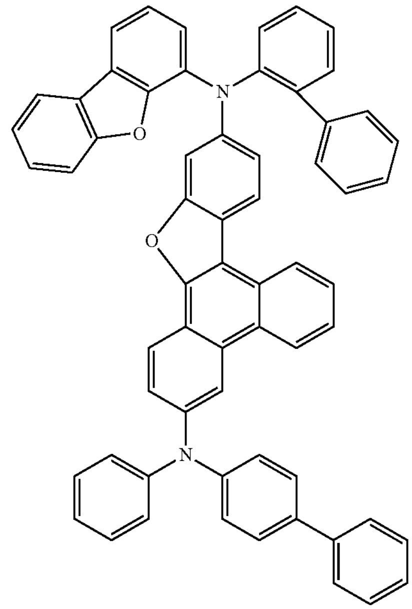
84A
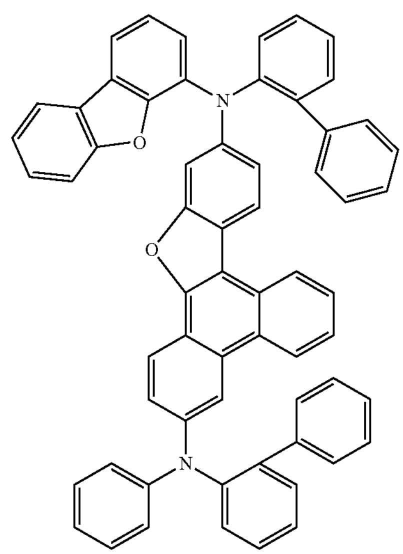

-continued
85A
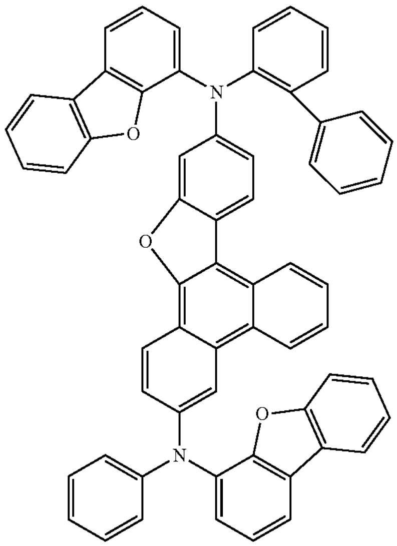
86A
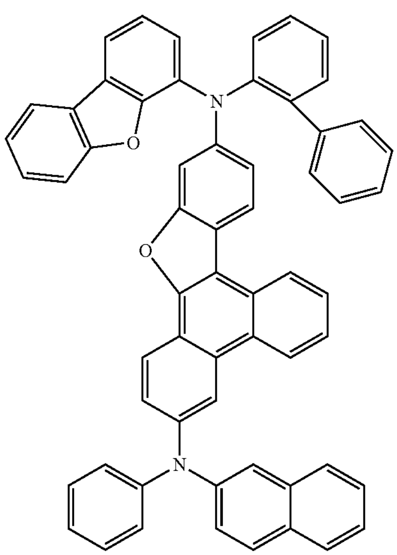
-continued
87A
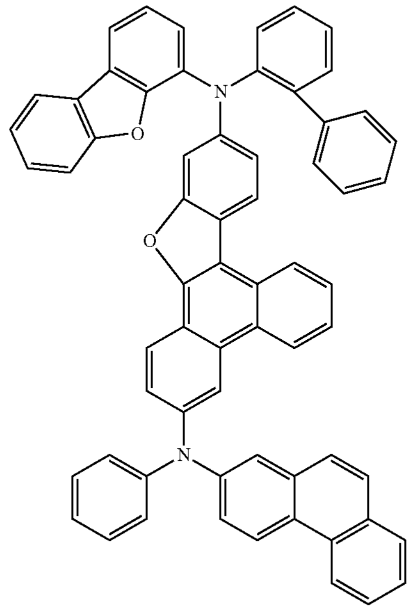
88A
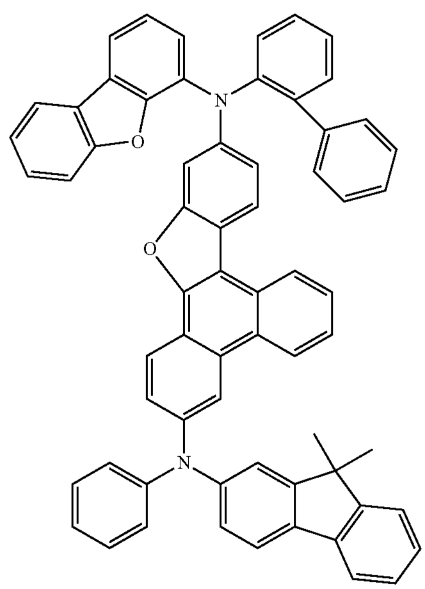

89A
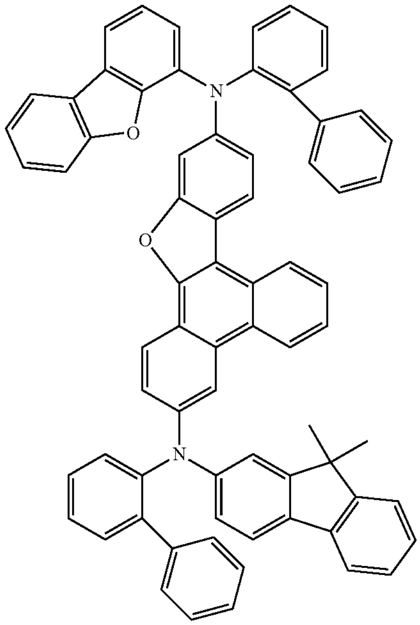
91A
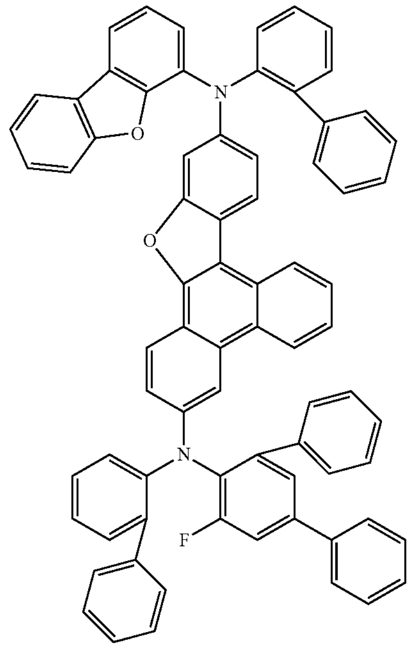
90A
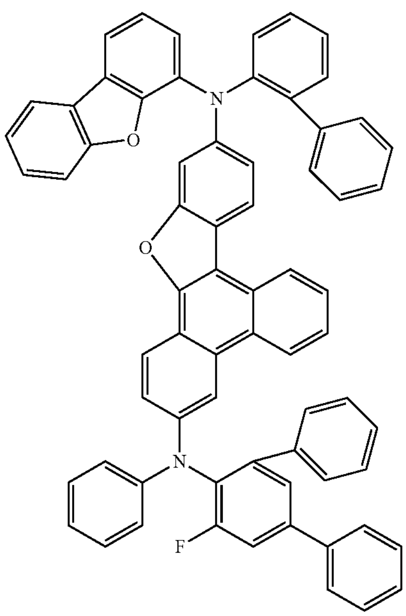
92A
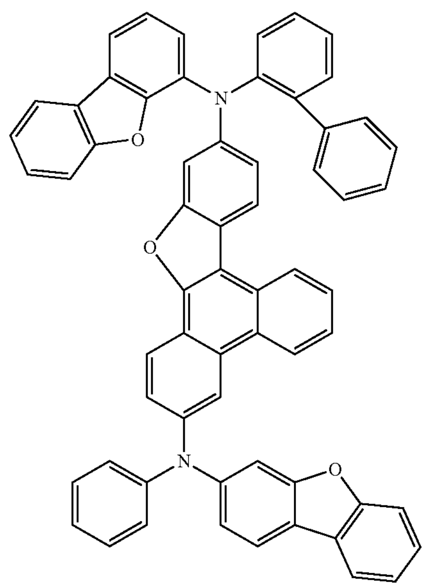

93A
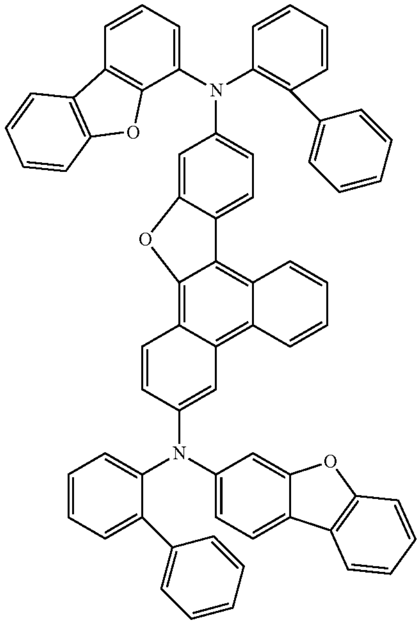
95A
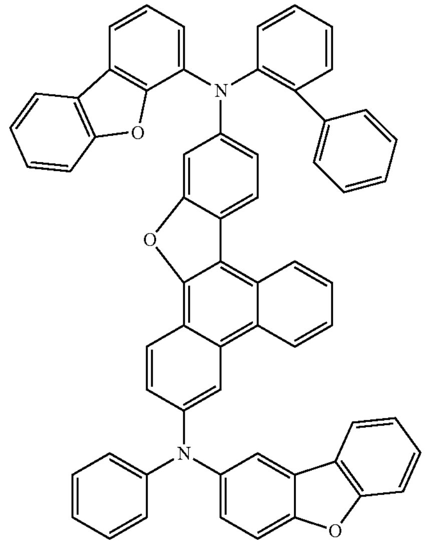
94A
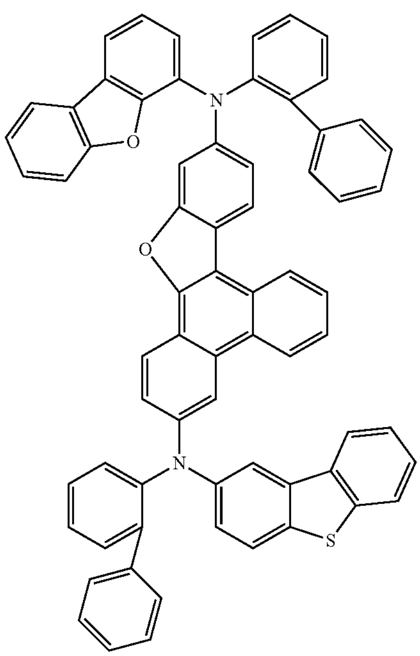
96A
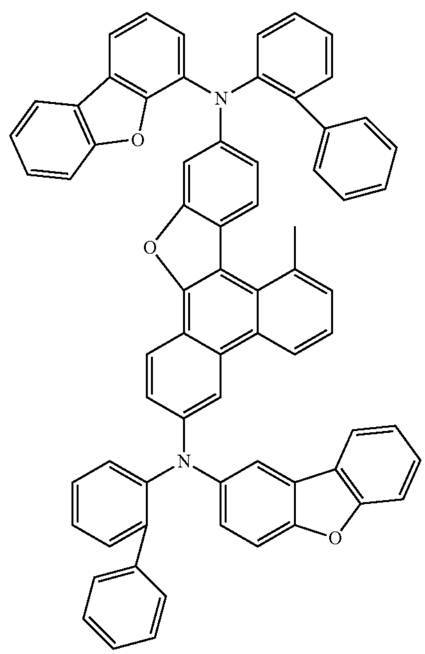

-continued
97A
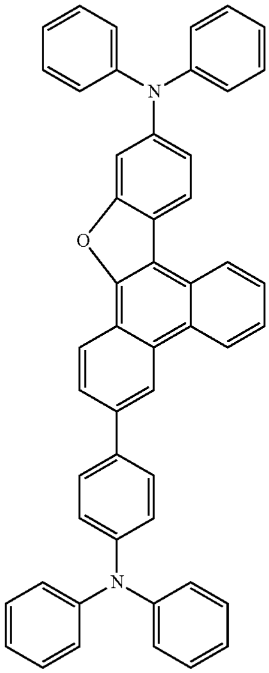
99A
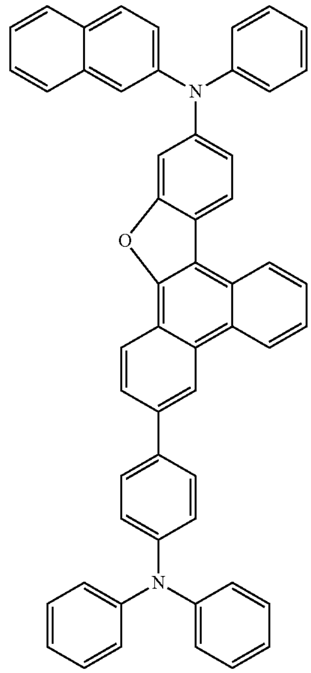
98A
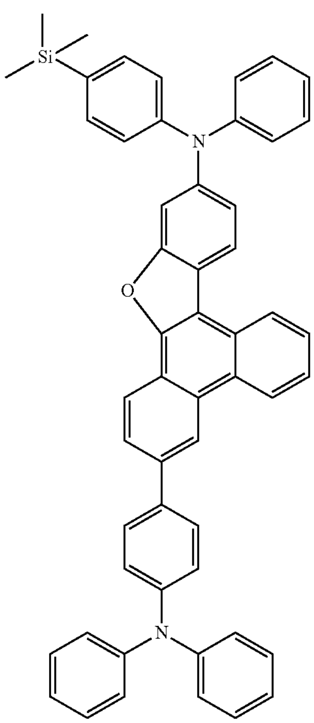
100A
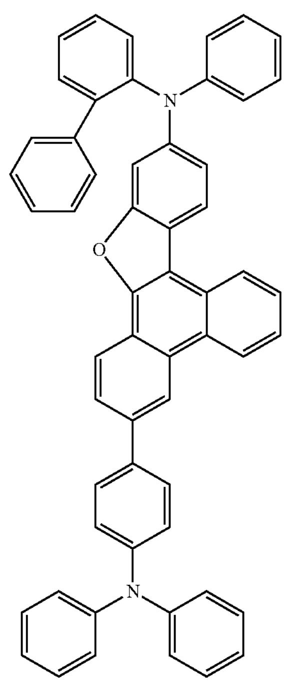

-continued
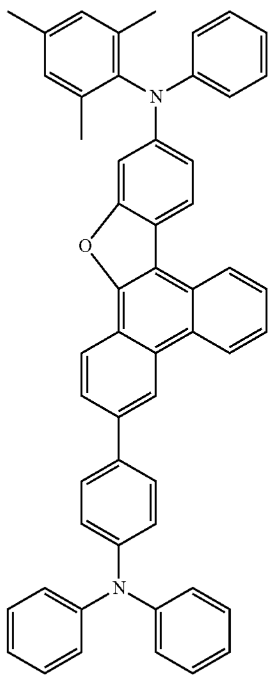
101A
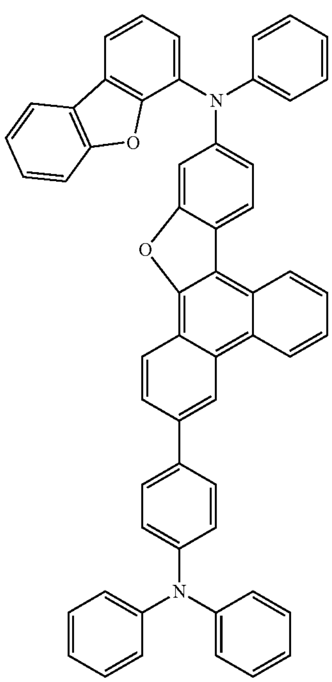
102A
-continued
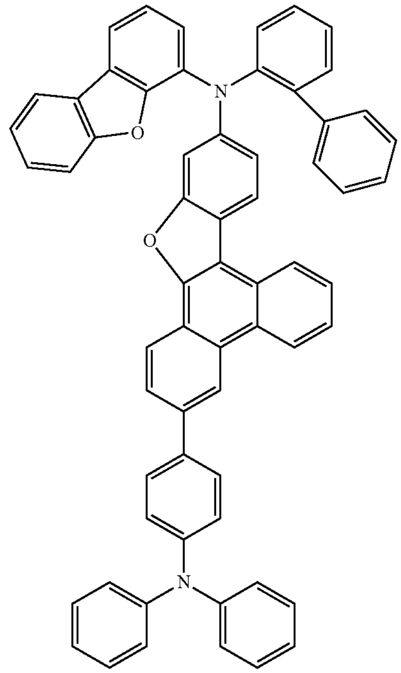
103A
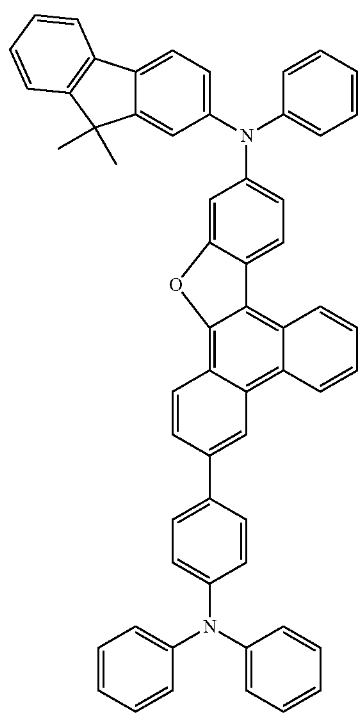
104A -continued
105A
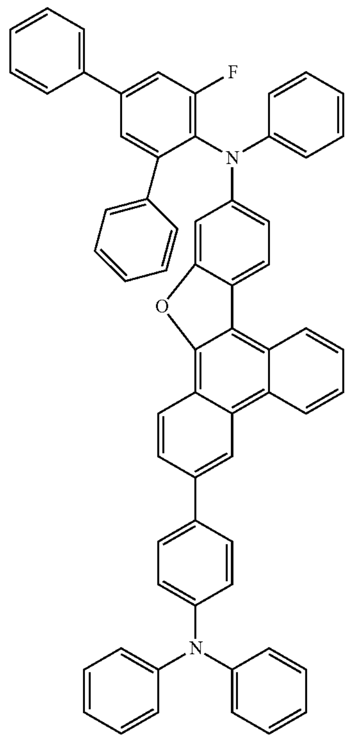
106A
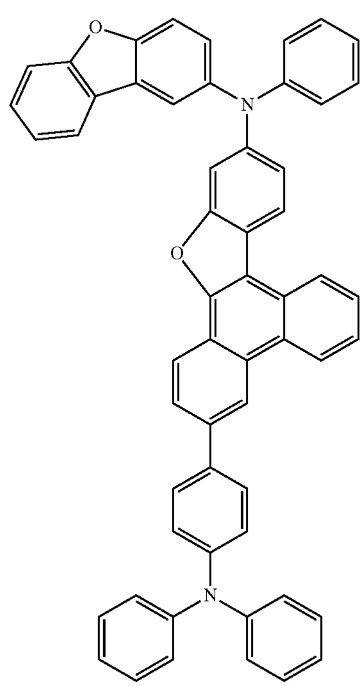
-continued
107A
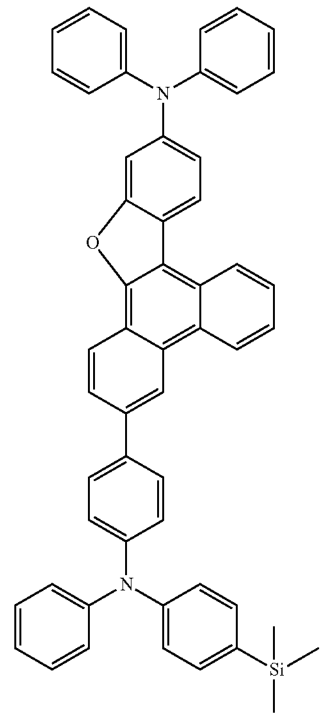
108A
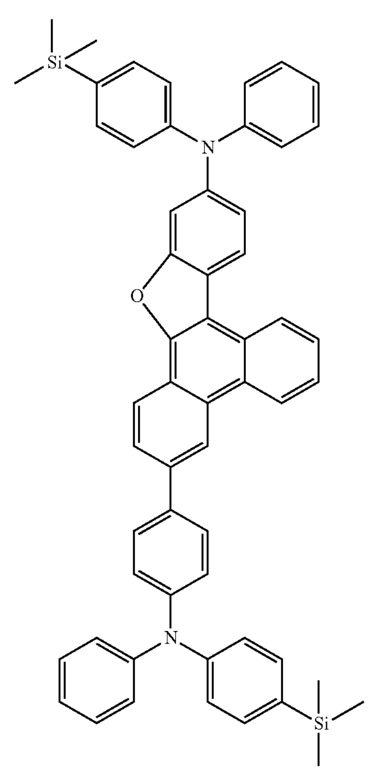

-continued
109A
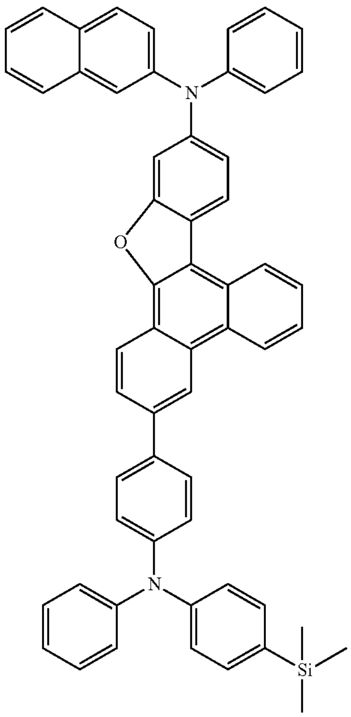
110A
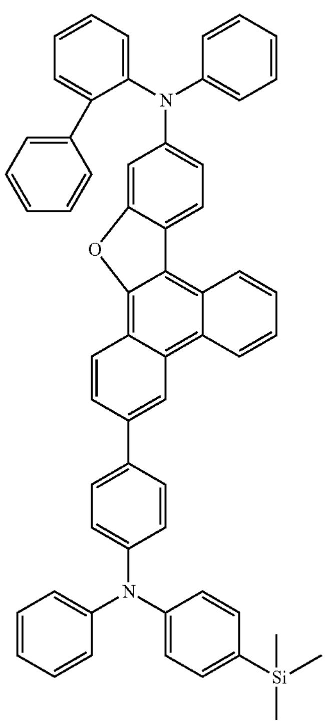
-continued
111A
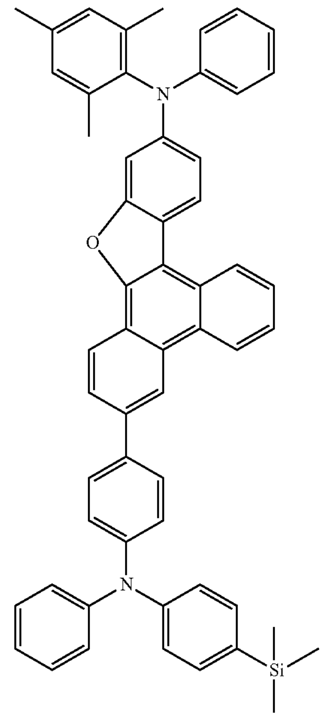
112A
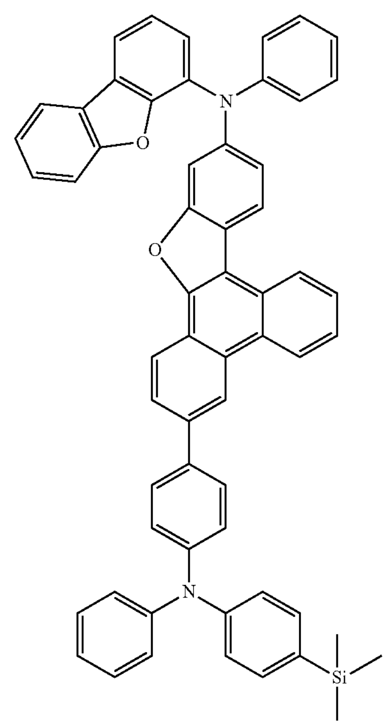

-continued
113A
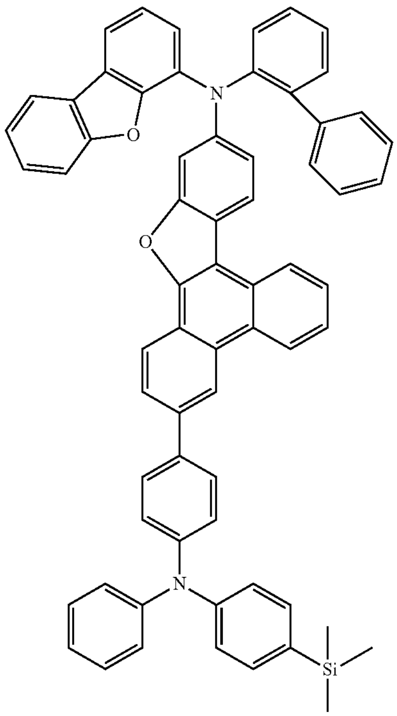
114A
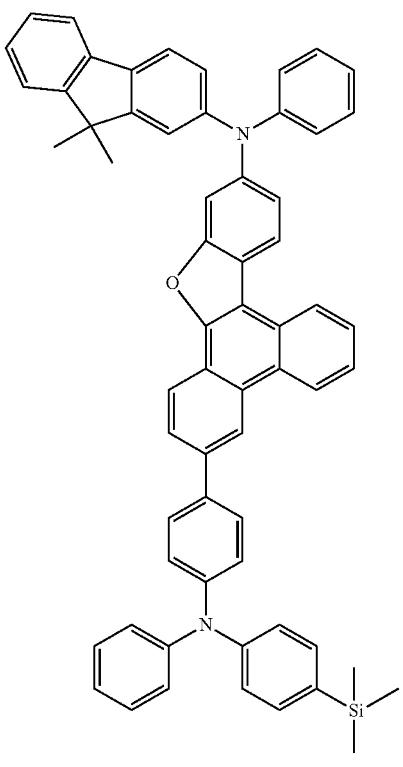
-continued
115A
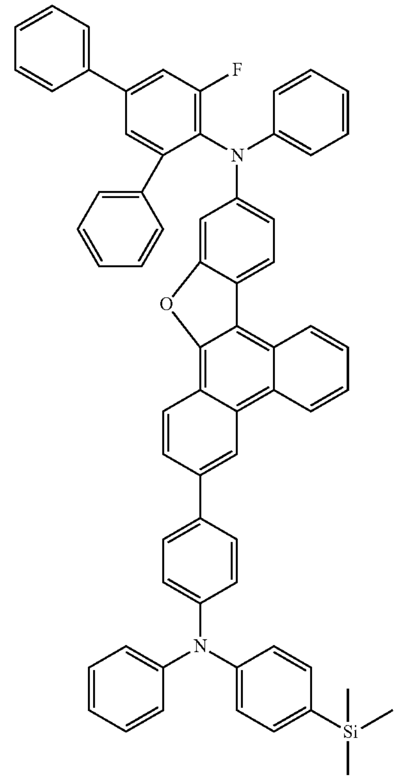
116A
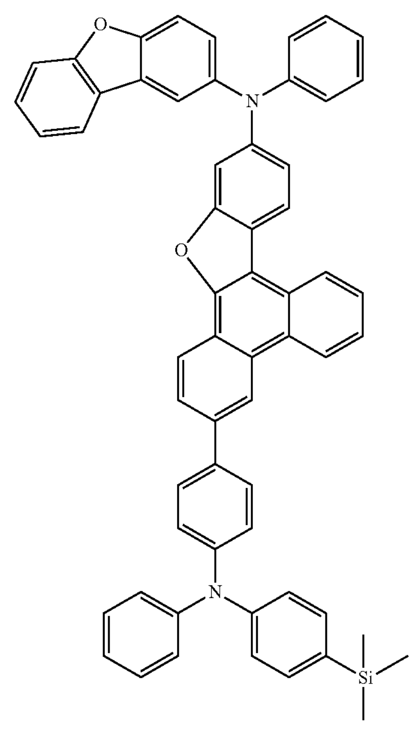

-continued
117A
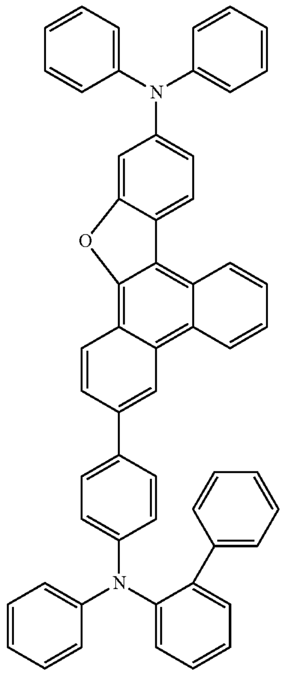
118A
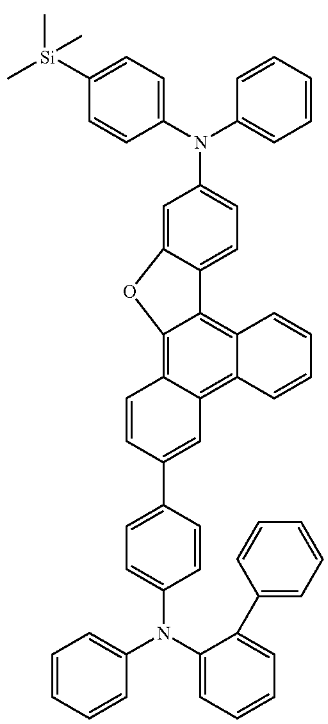
-continued
119A
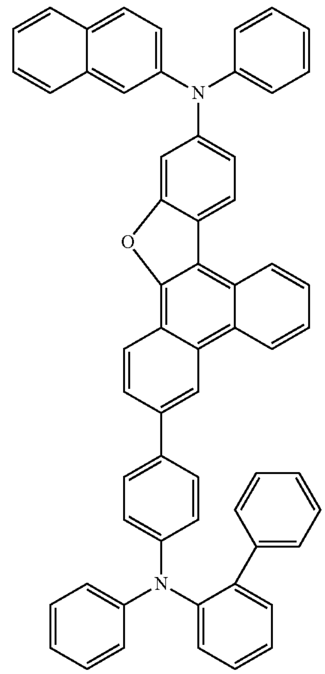
120A
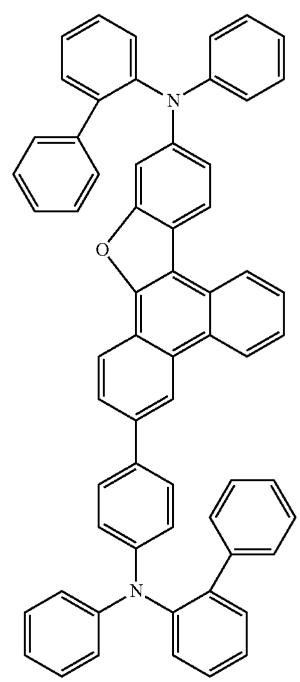

-continued
121A
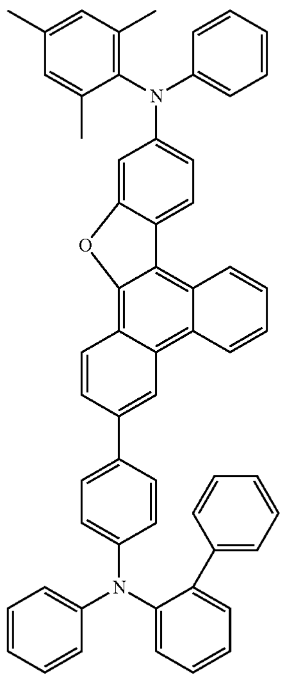
123A
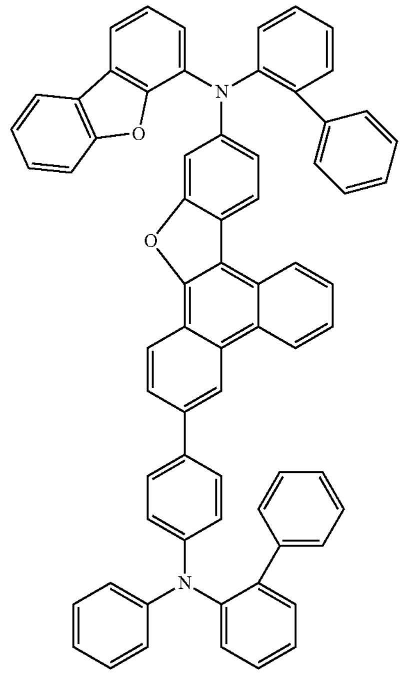
122A
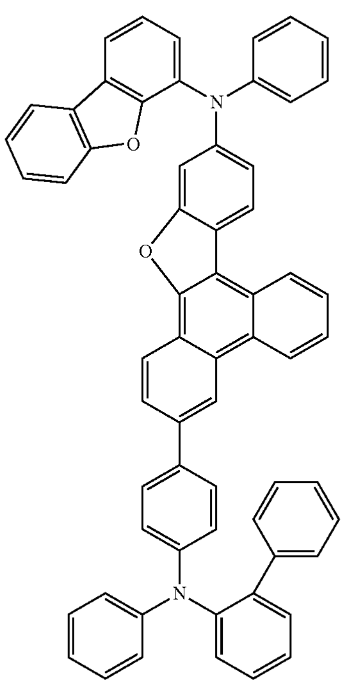
124A
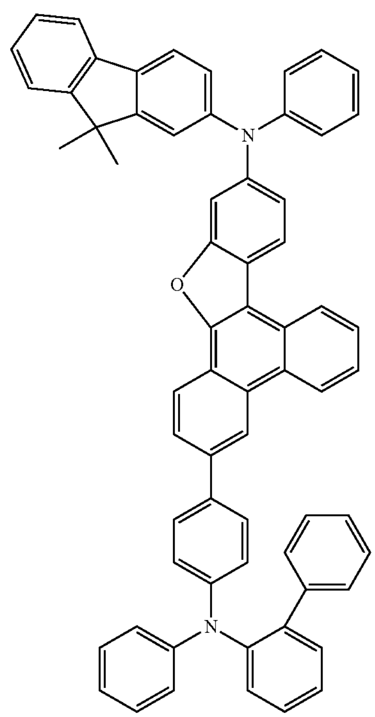

-continued
125A
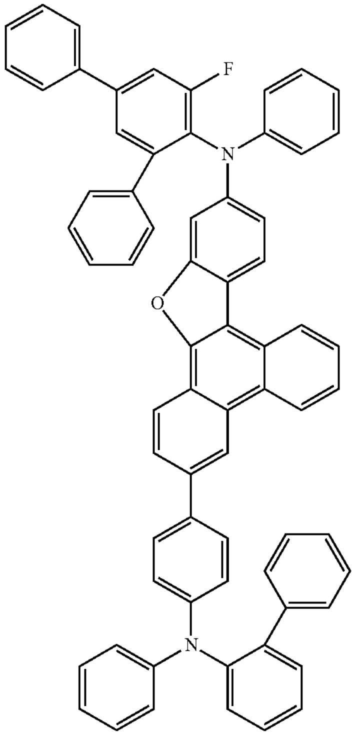
126A
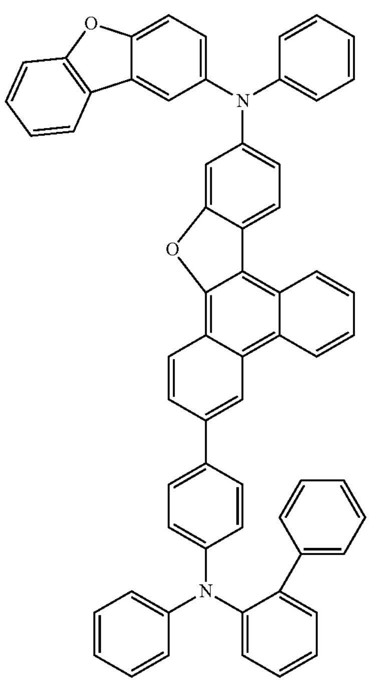
-continued
127A
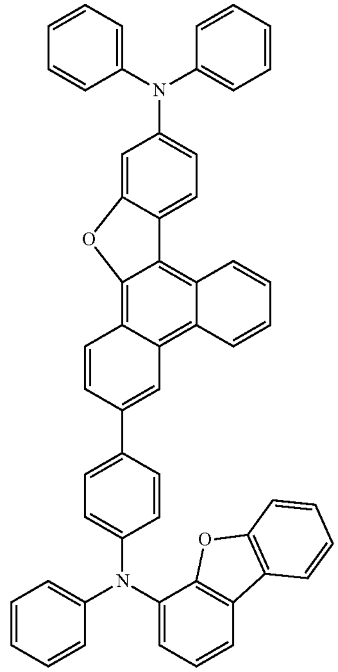
128A
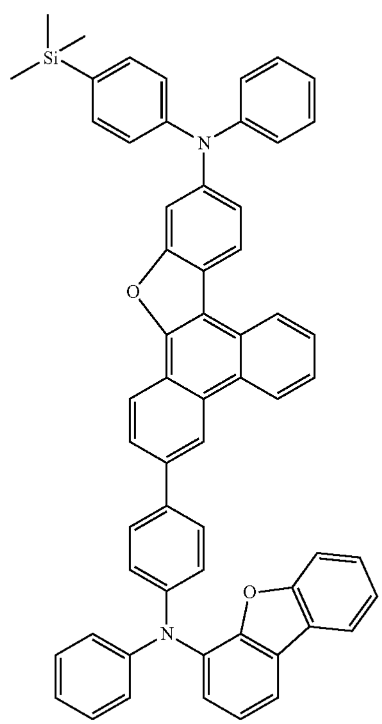

-continued
129A
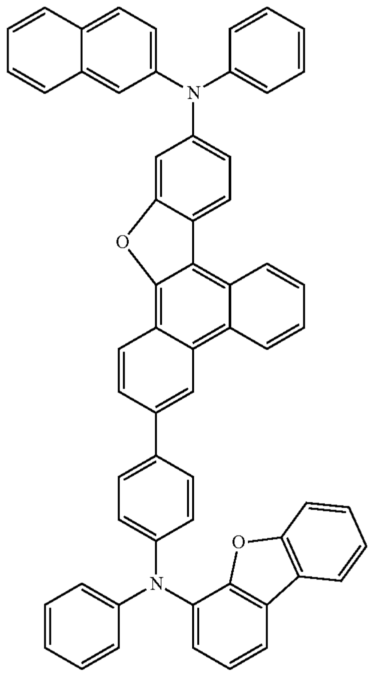
130A
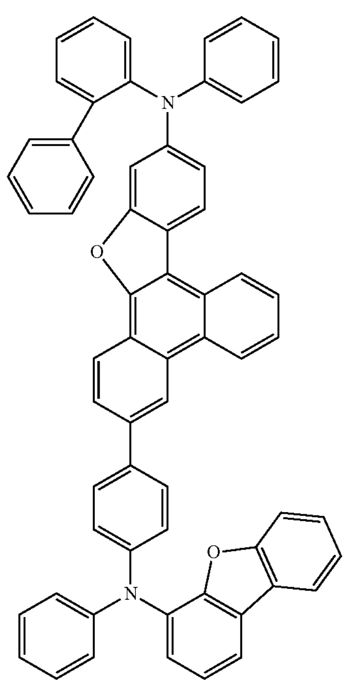
-continued
131A
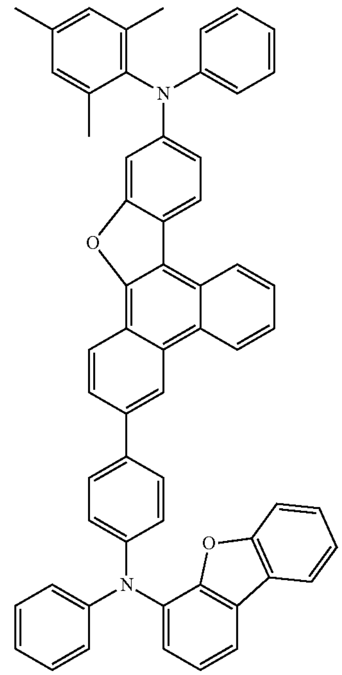
132A
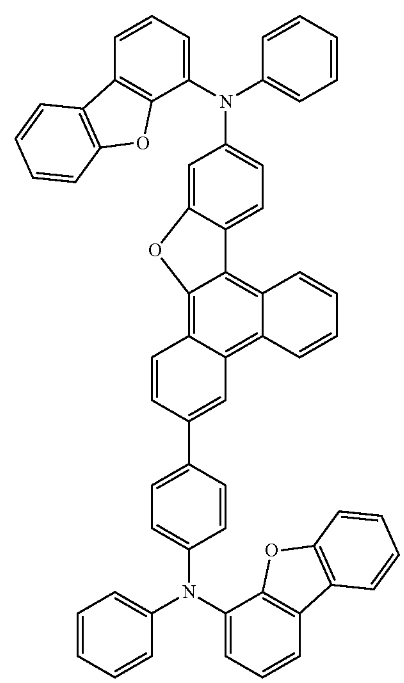

-continued
133A
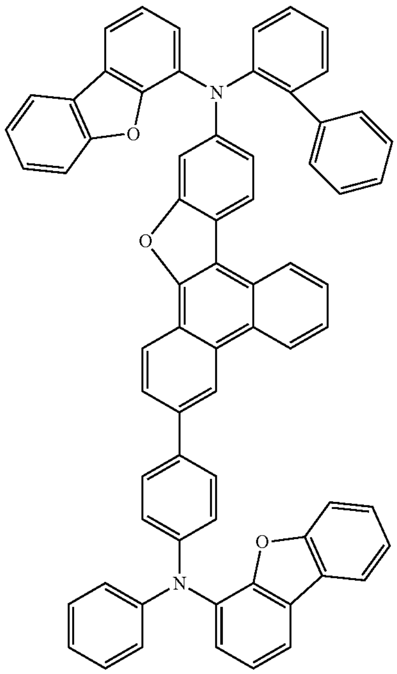
134A
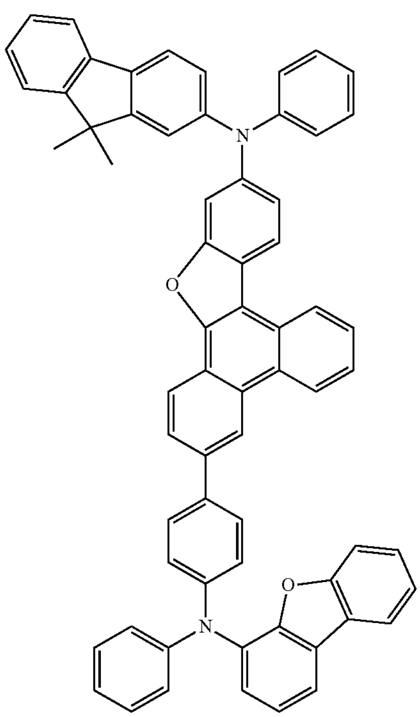
-continued
135A
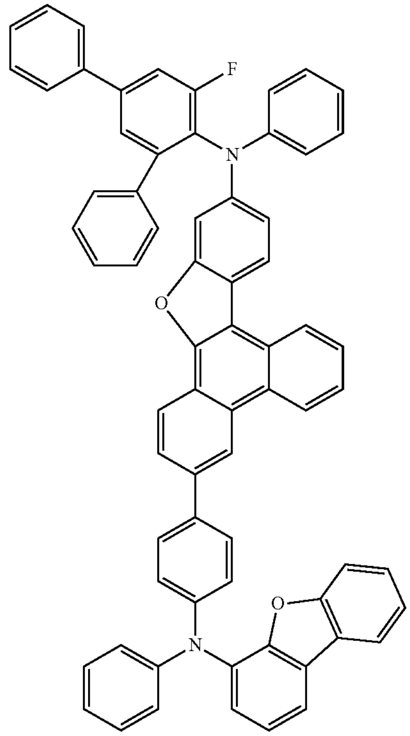
136A
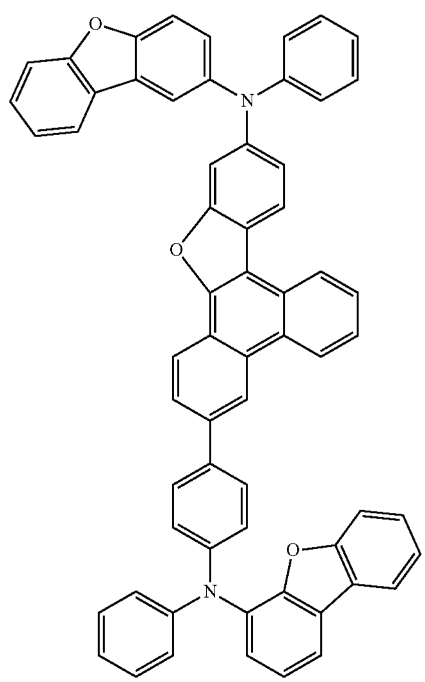

-continued
137A
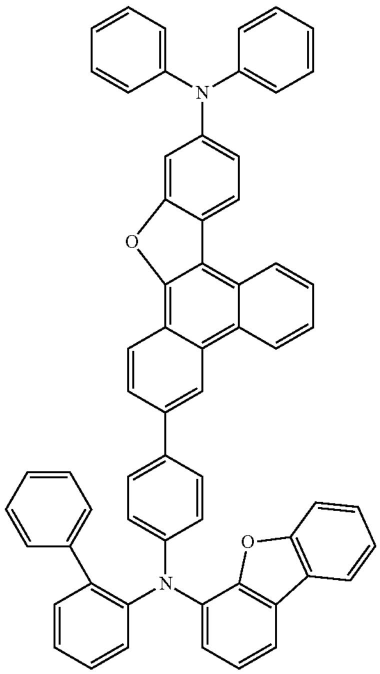
138A
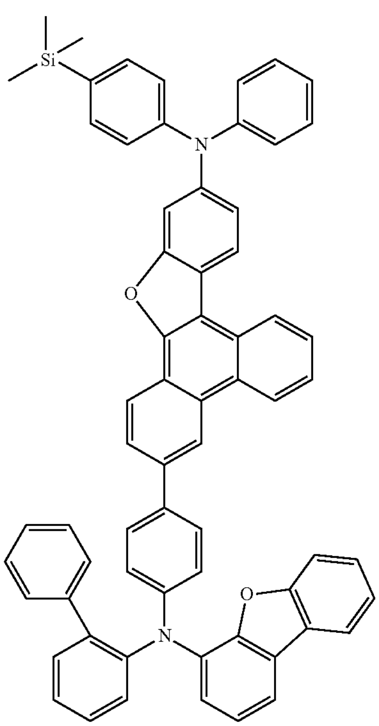
-continued
139A
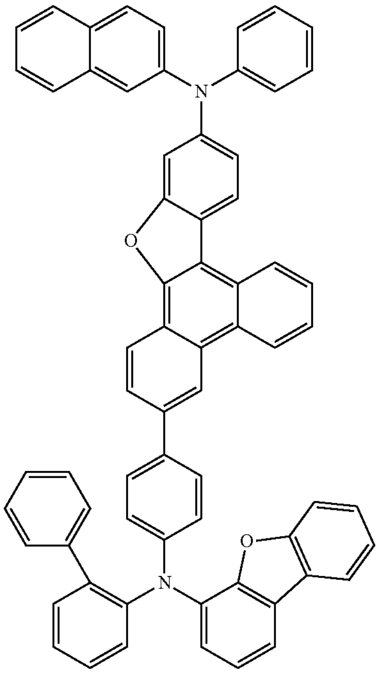
140A
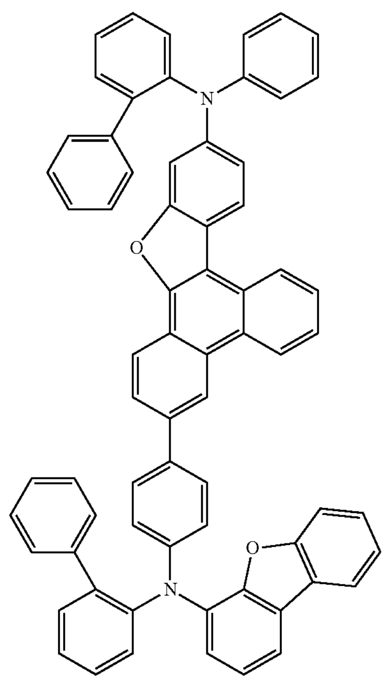

-continued
141A
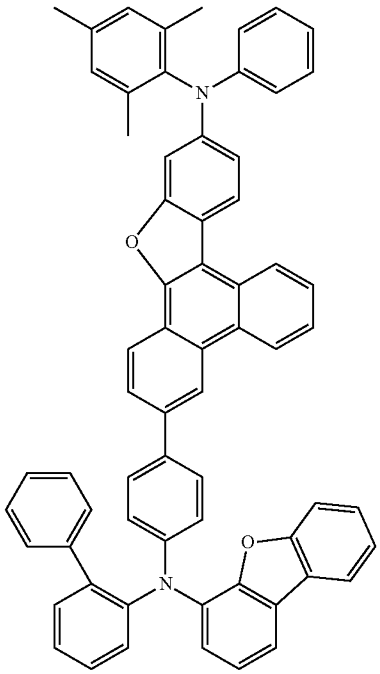
142A
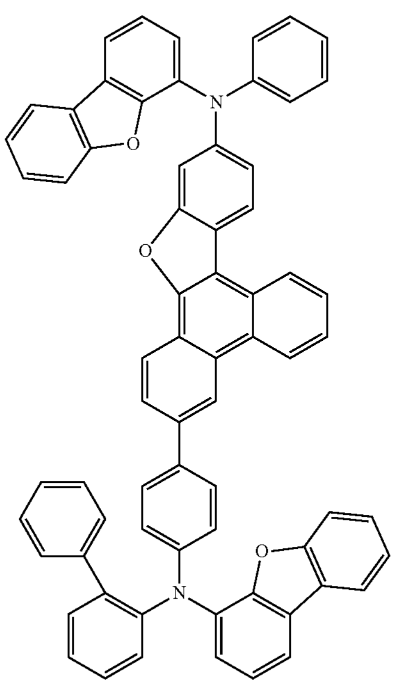
-continued
143A
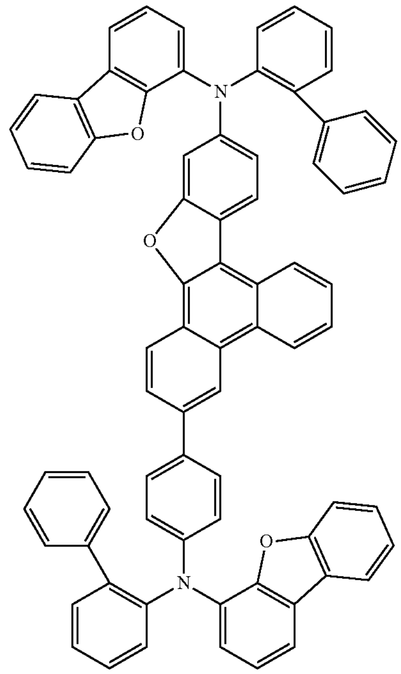
144A
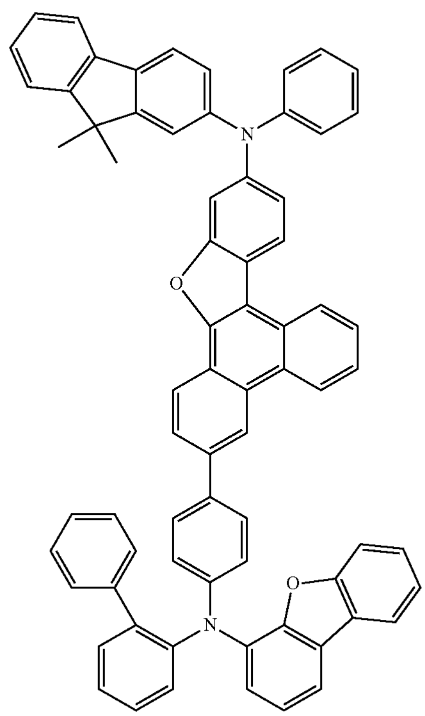

-continued
145A
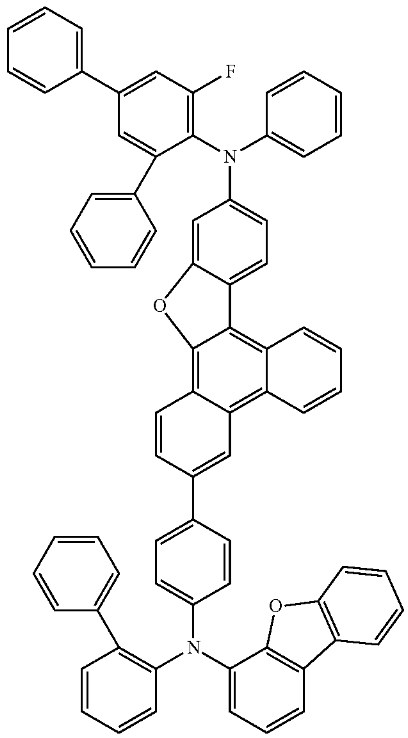
146A
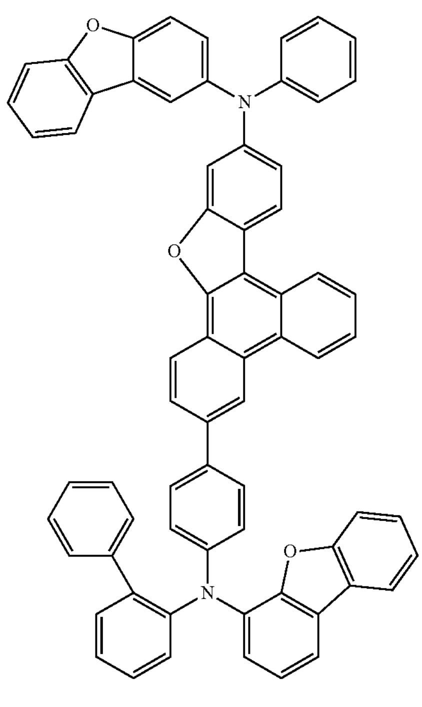
-continued
147A
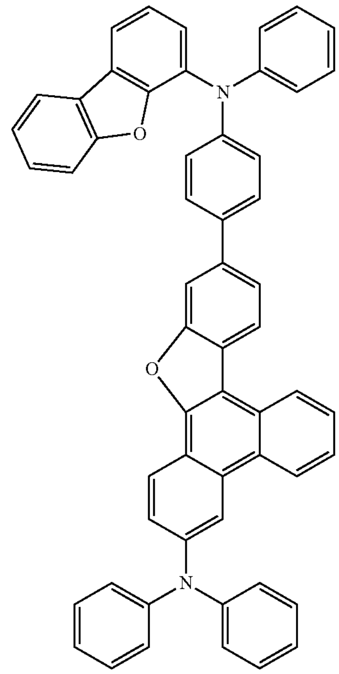
148A
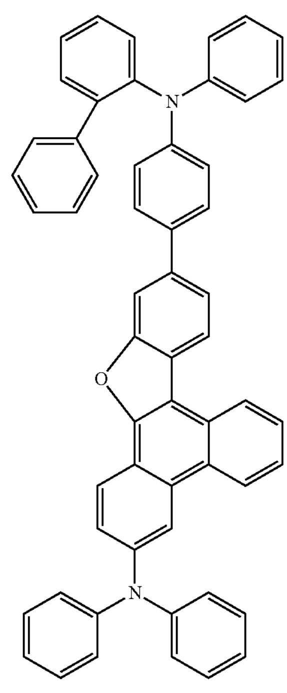

149A
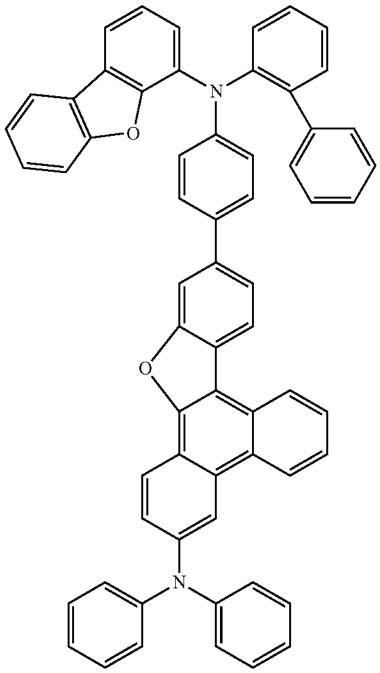
150A
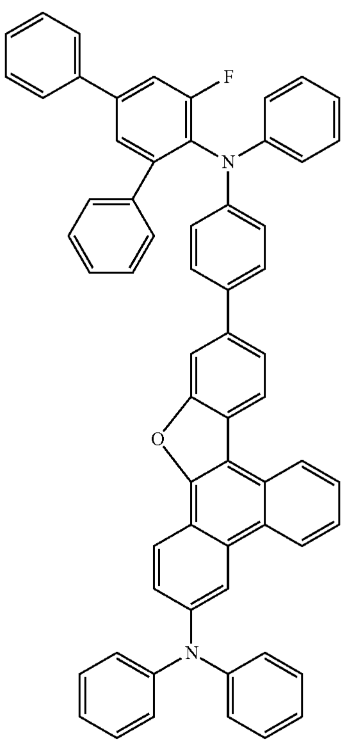
151A
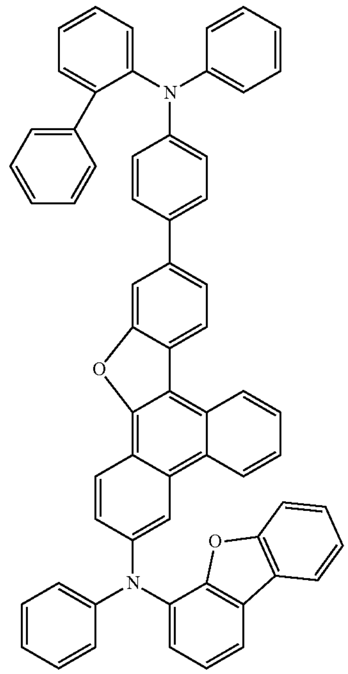
152A
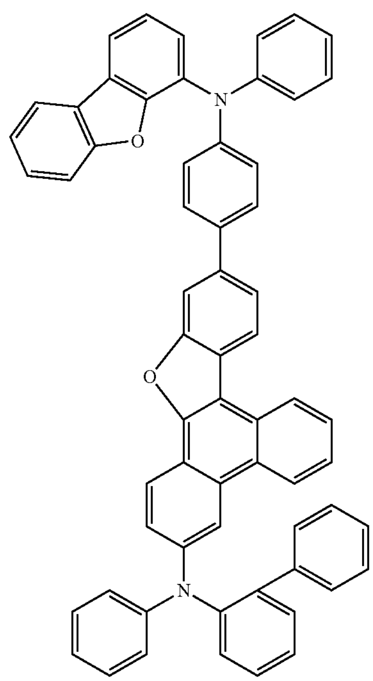

-continued
153A
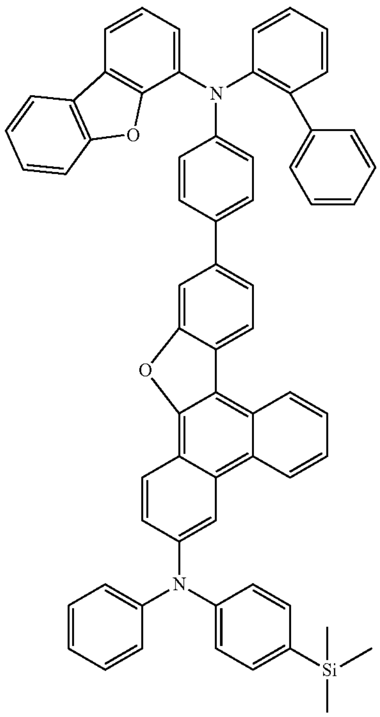
154A
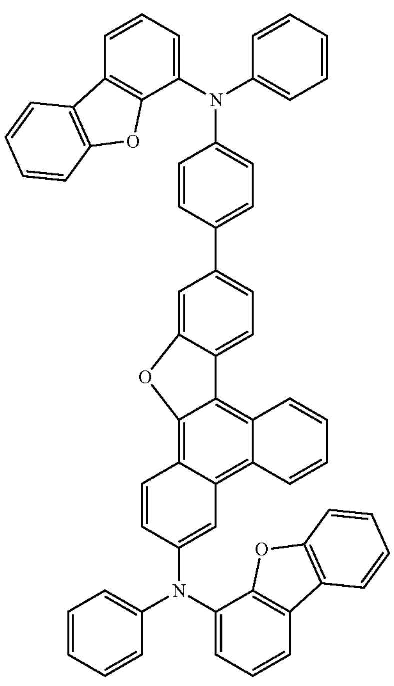
-continued
155A
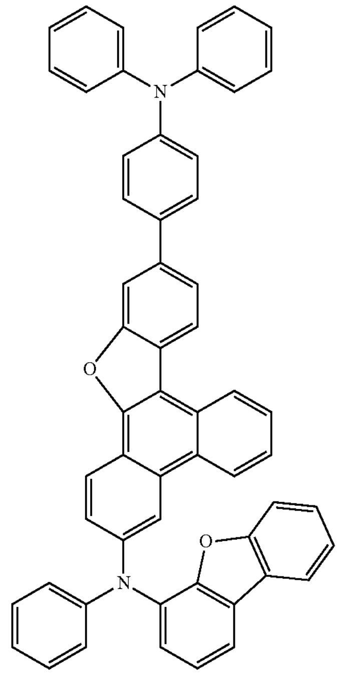
156A
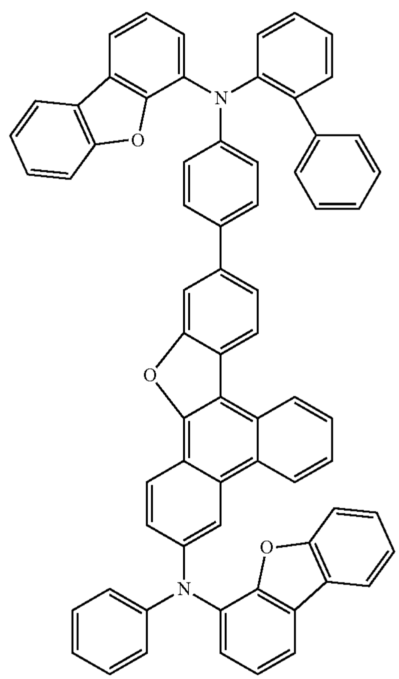

-continued
157A
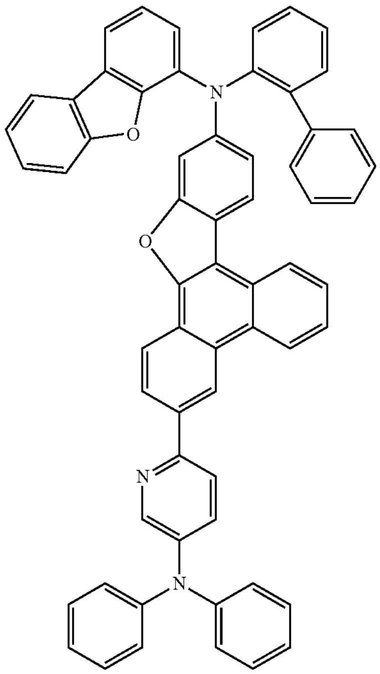
158A
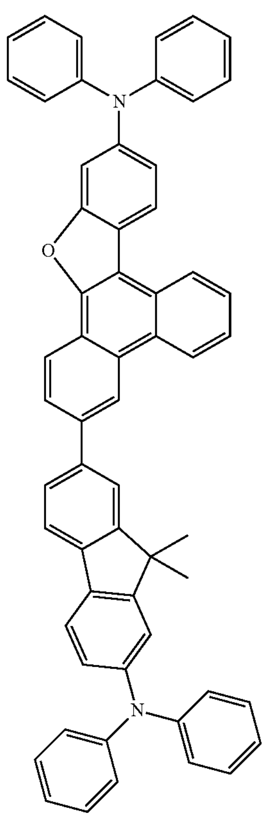
-continued
159A
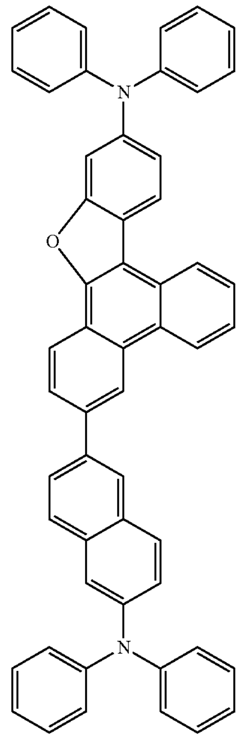
160A
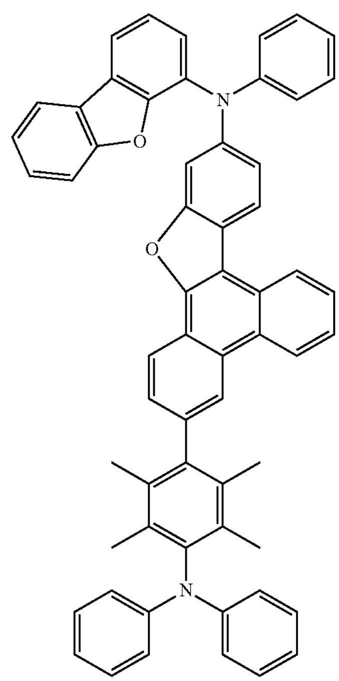

-continued
161A
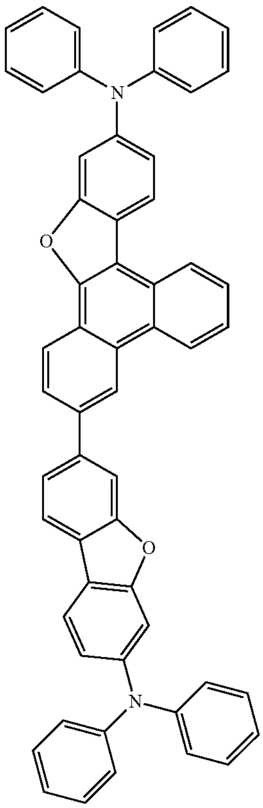
162A
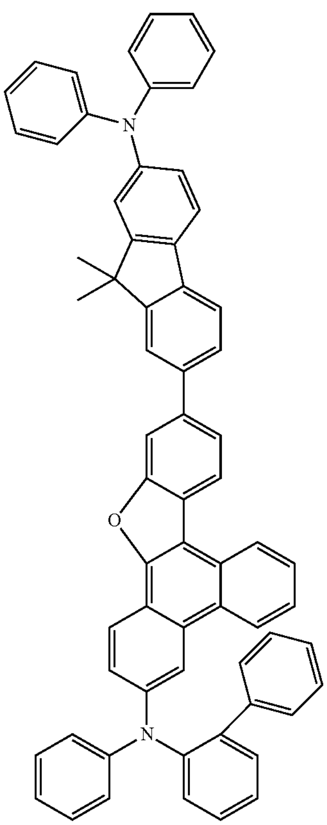
-continued
164A
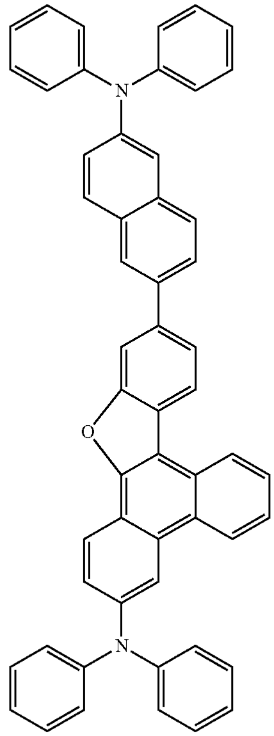
165A
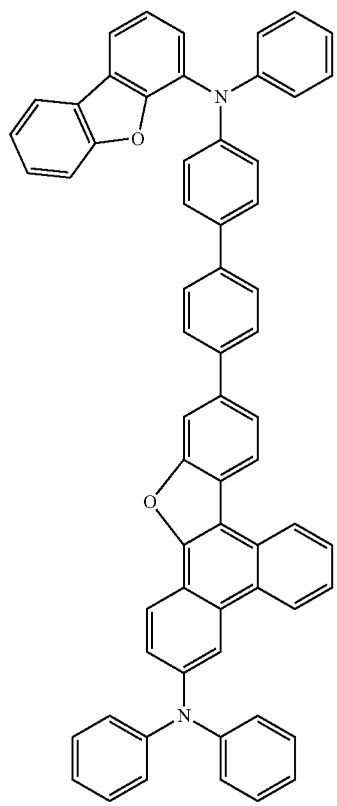

-continued
166A
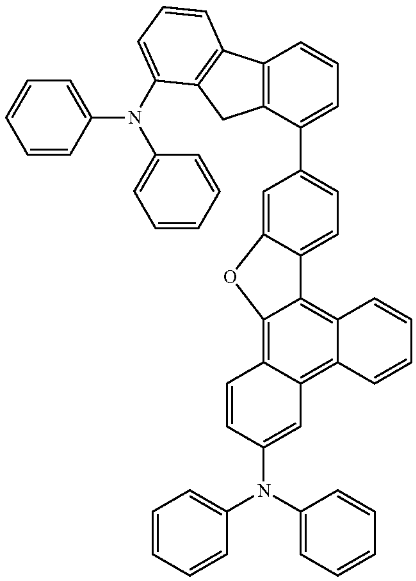
167A
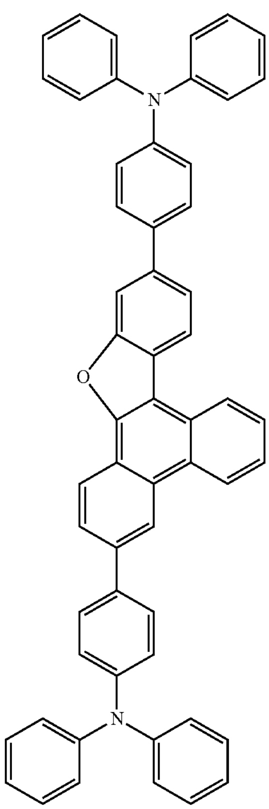
-continued
168A
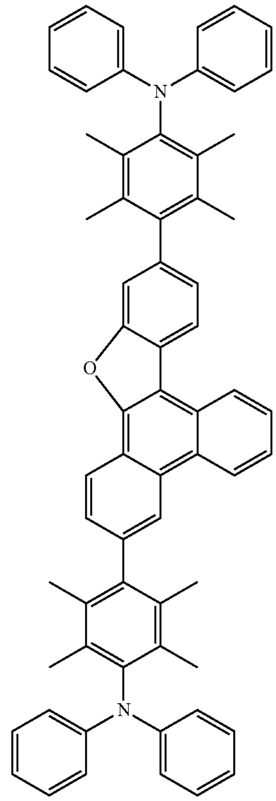
169A
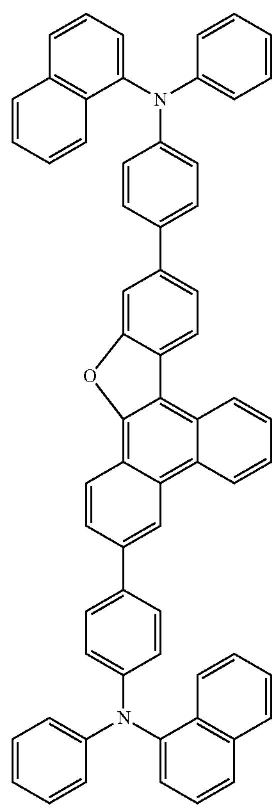

170A
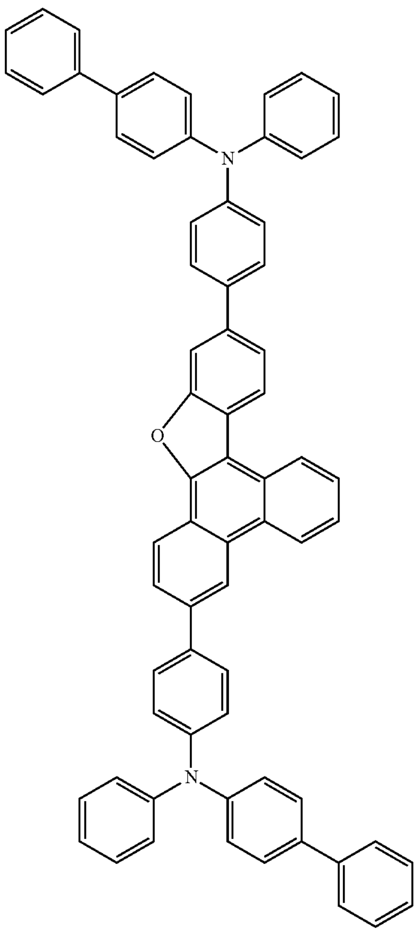
171A
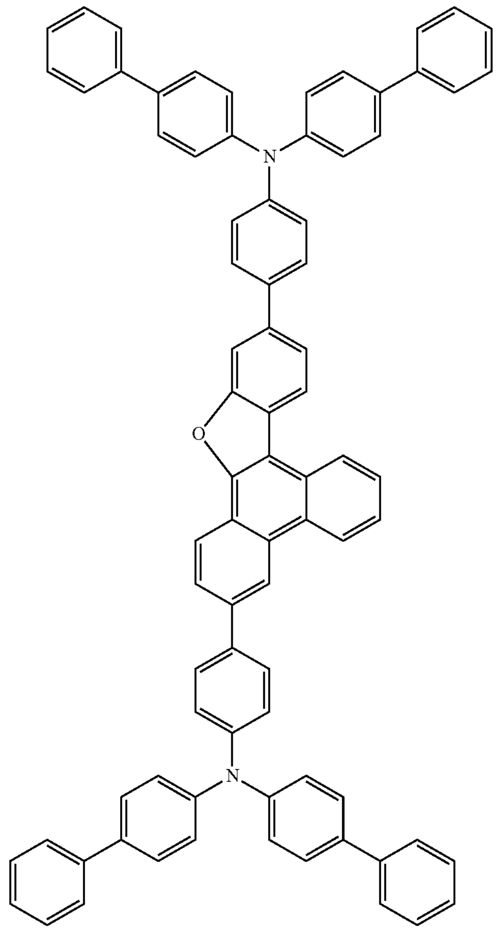
172A
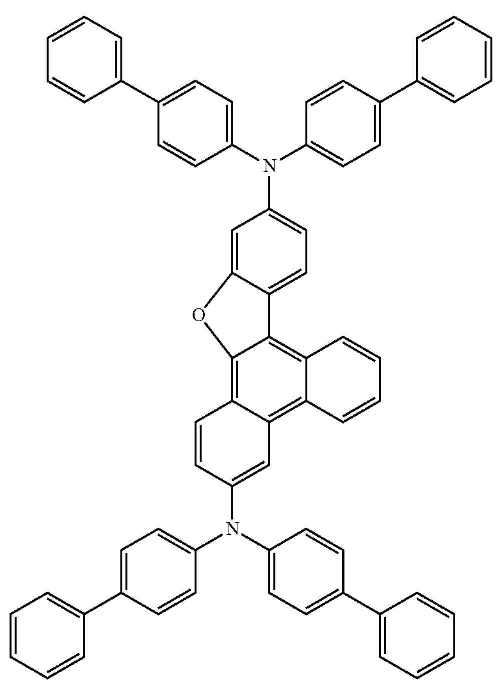

-continued
173A
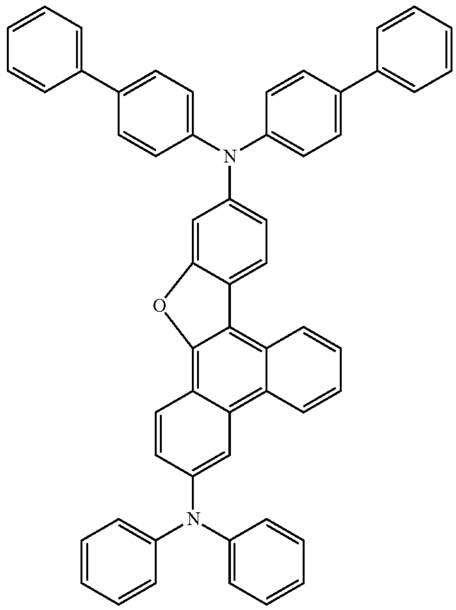
174A
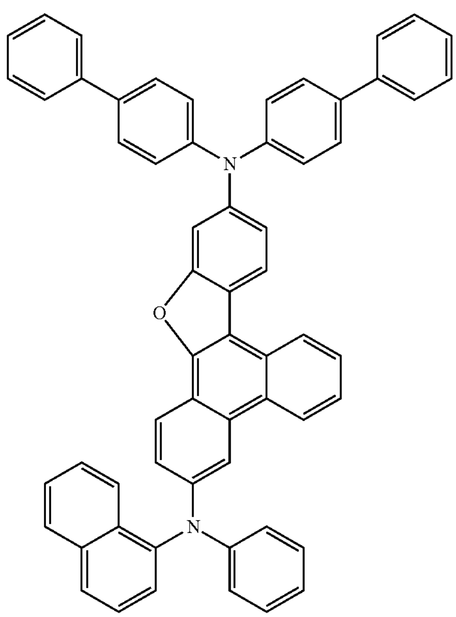
-continued
175A
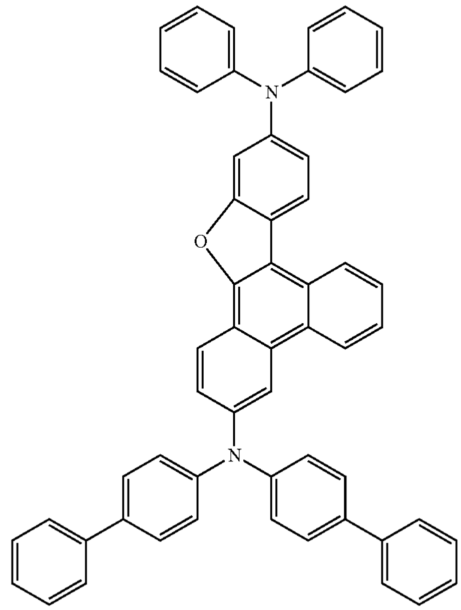
176A
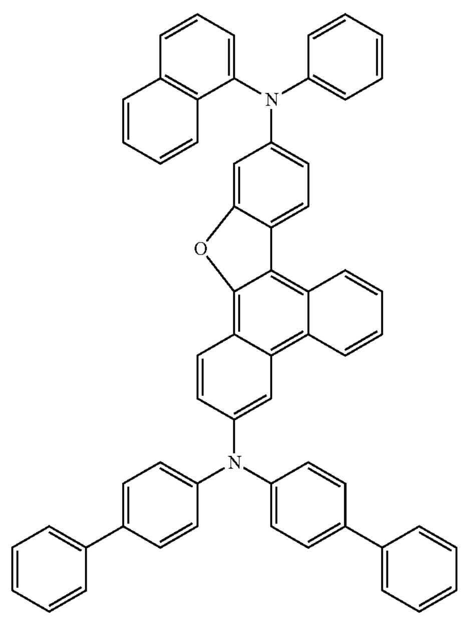

-continued
177A
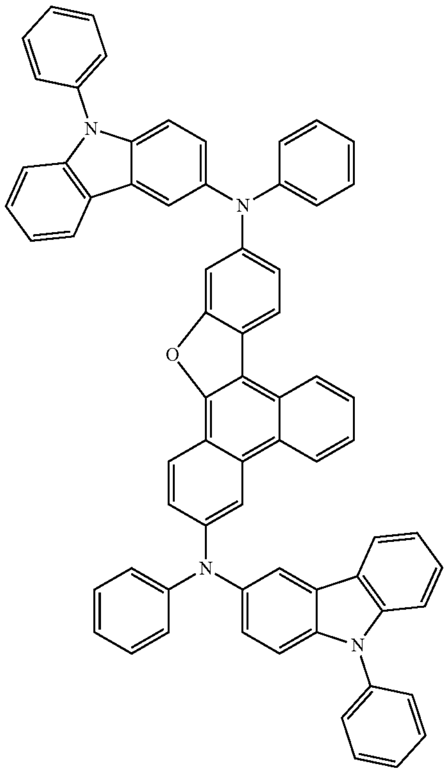
178A
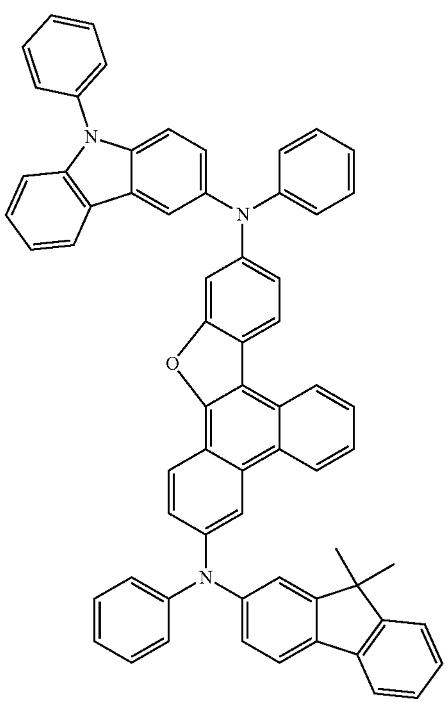
-continued
179A
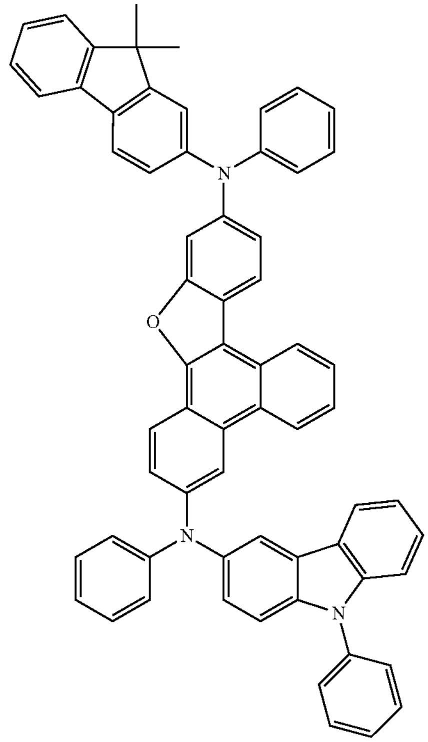
180A
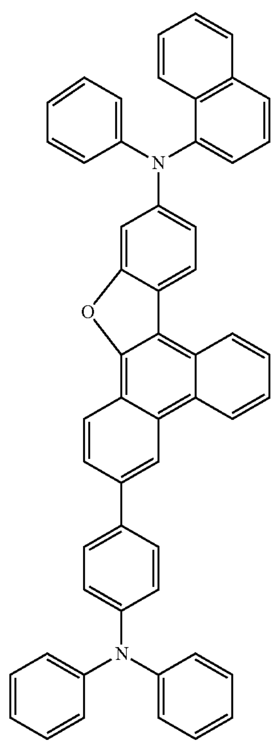

-continued
181A
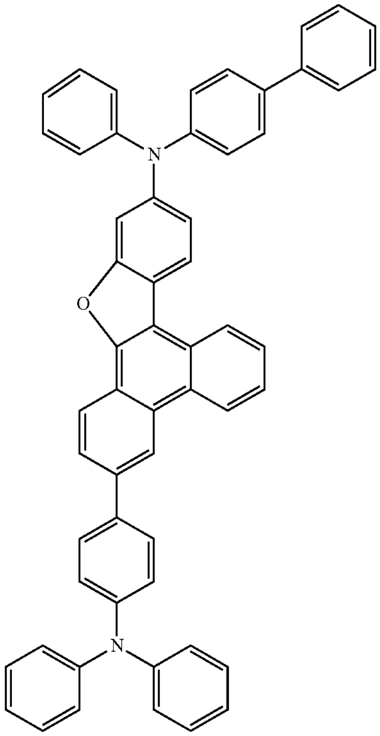
183A
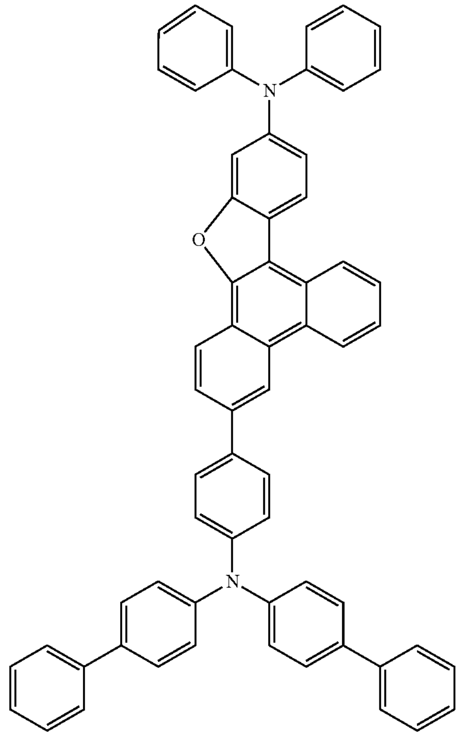
182A
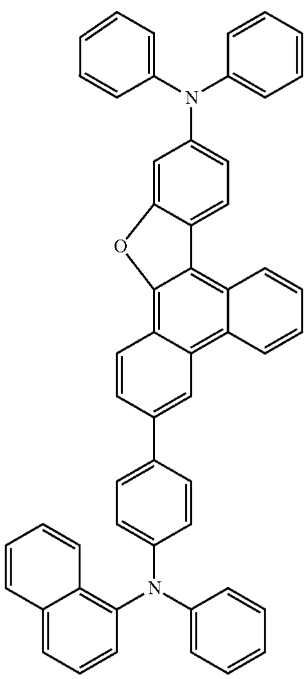
184A
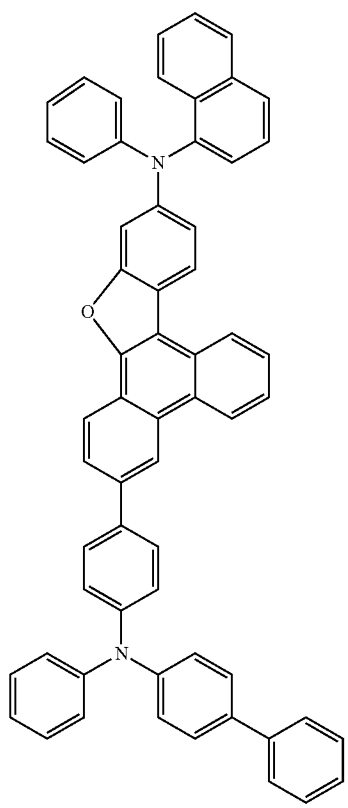

-continued
185A
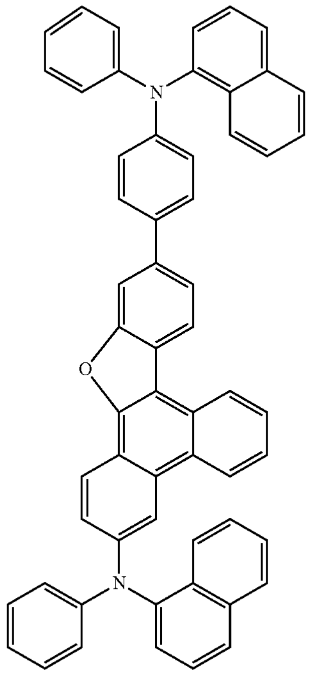
186A
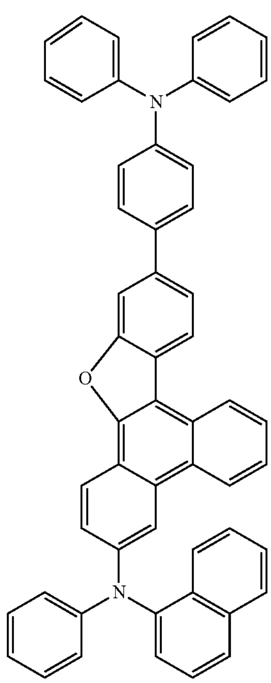
-continued
187A
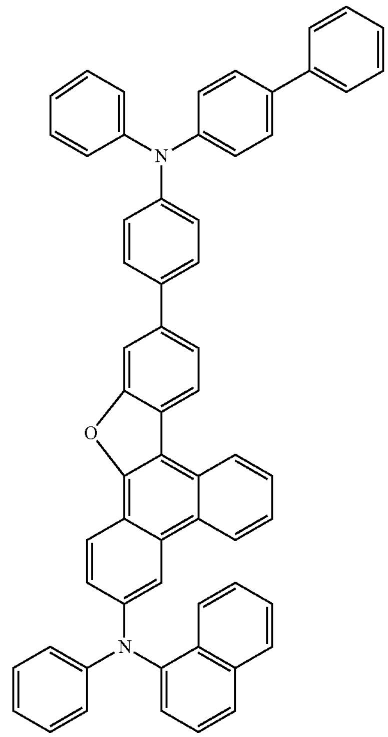
188A
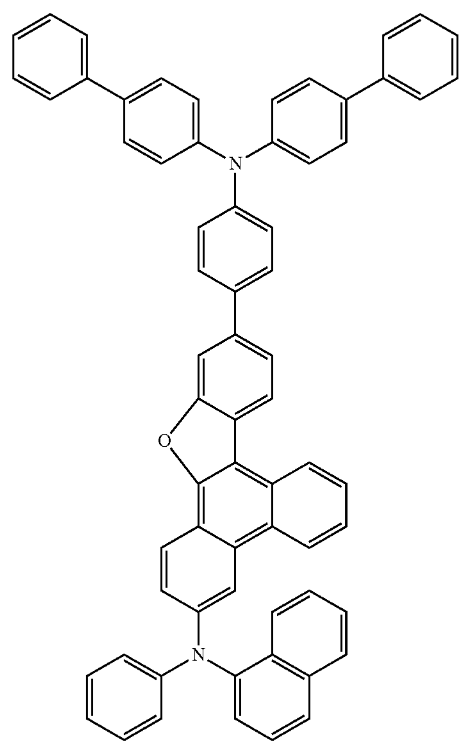

-continued
189A
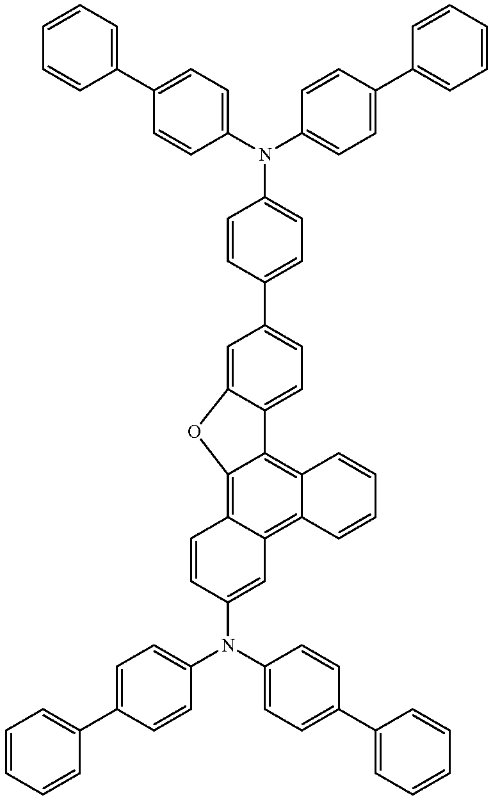
190A
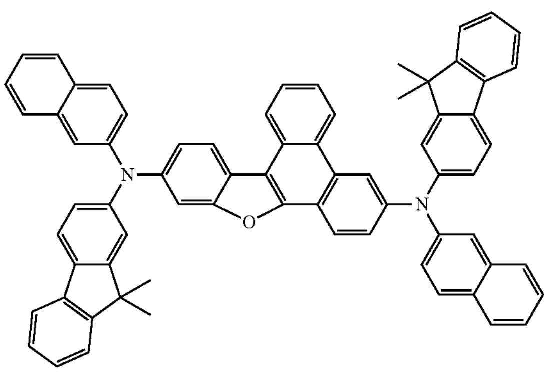
191A
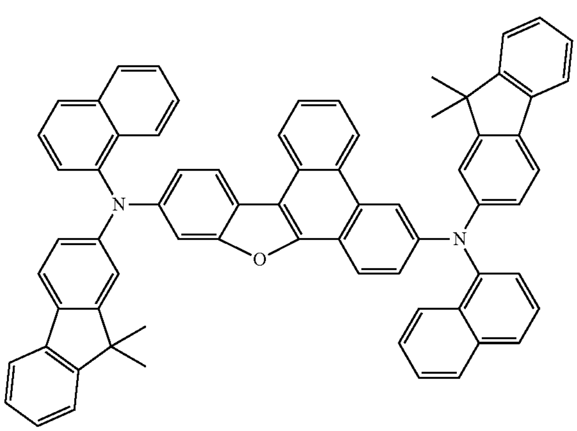
-continued
192A
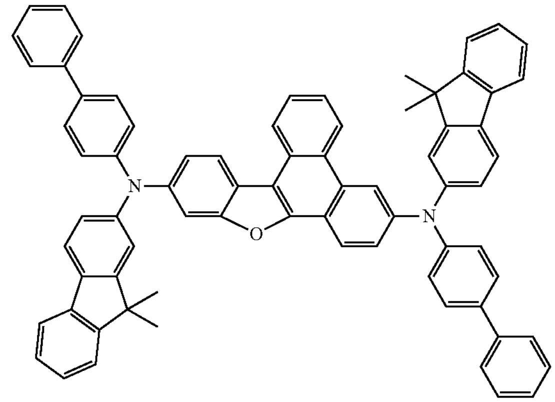
193A
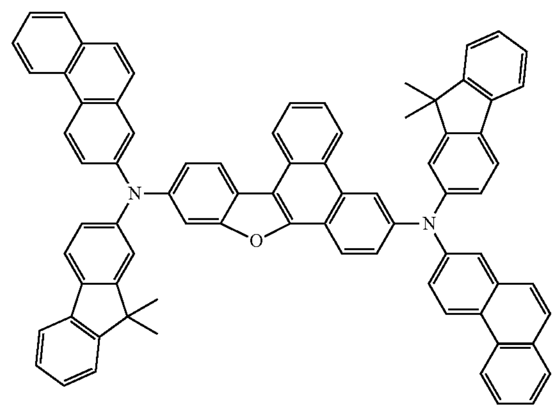
194A
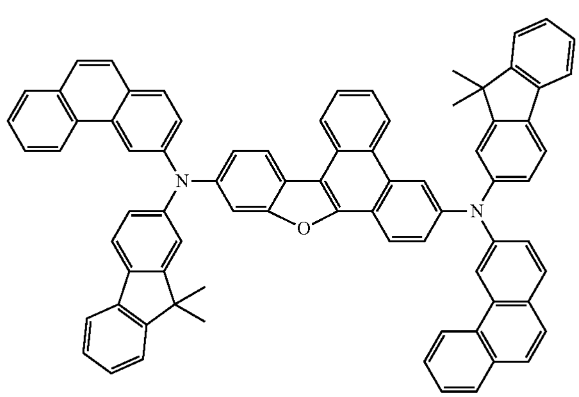

-continued
195A
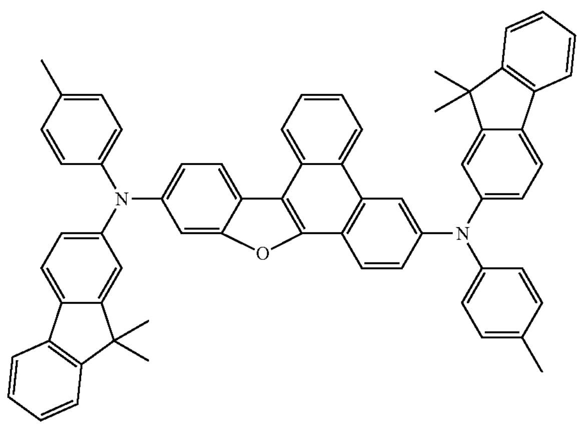
196A
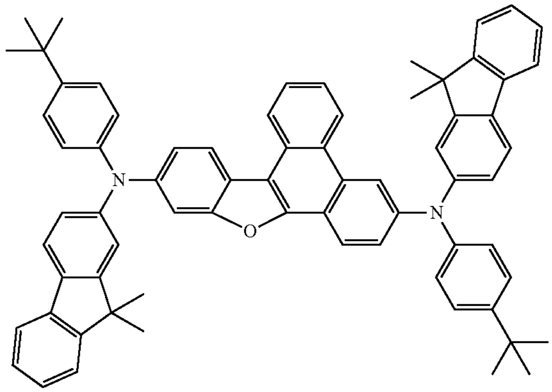
197A
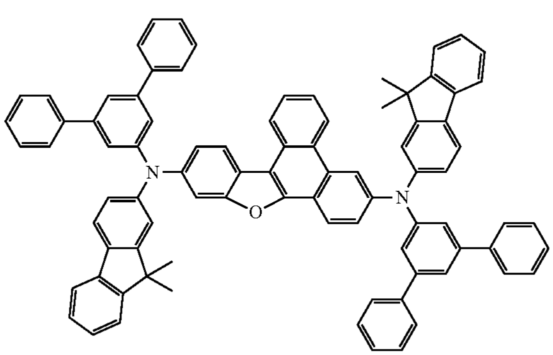
198A
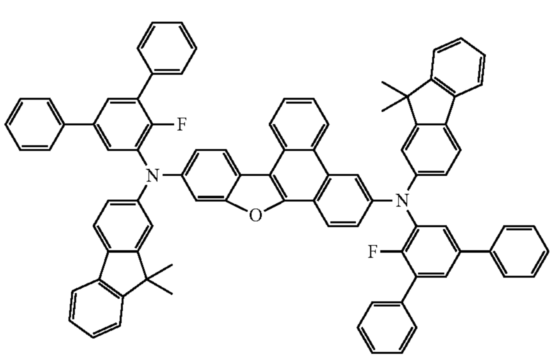
-continued
199A
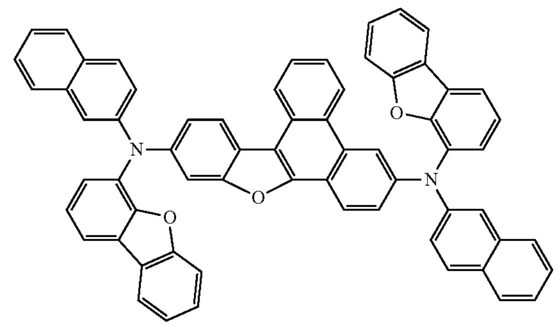
200A
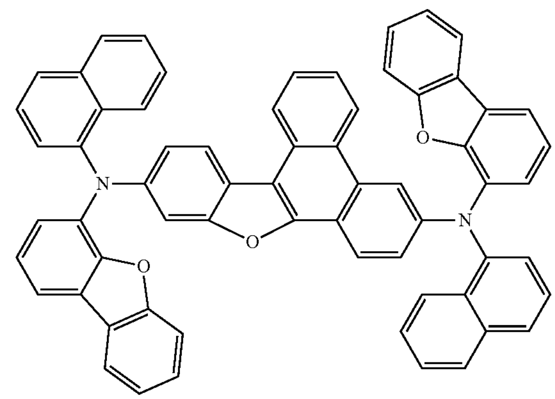
201A
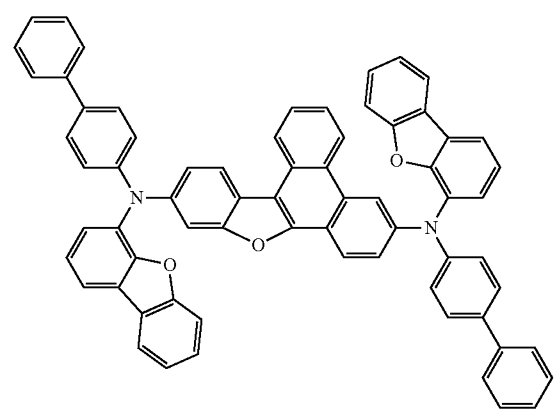
202A
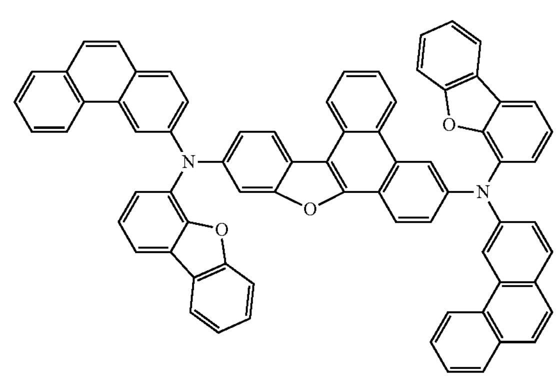

-continued
203A
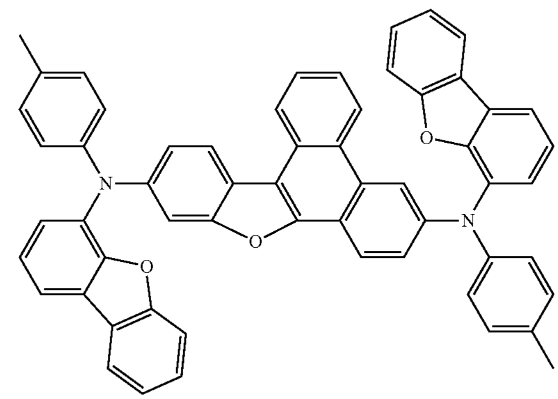
204A
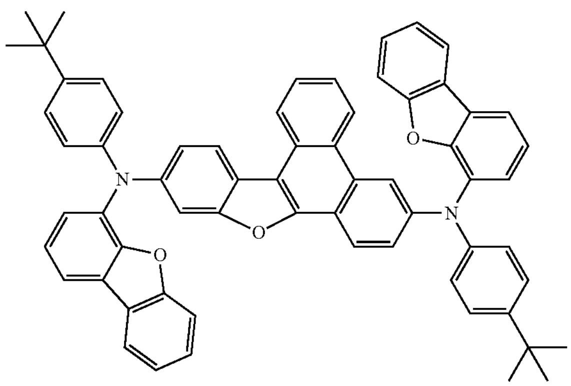
205A
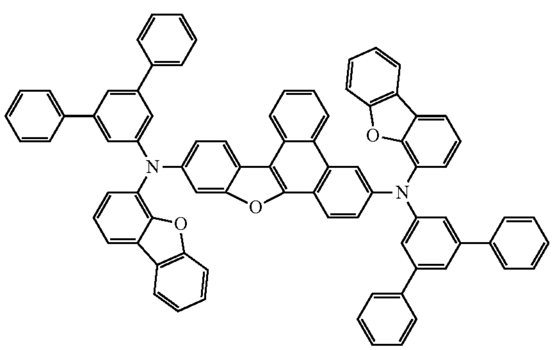
206A
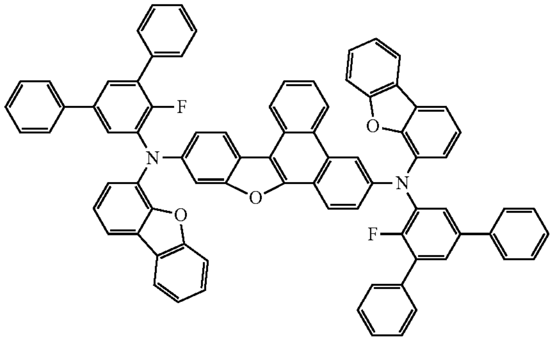
-continued
207A
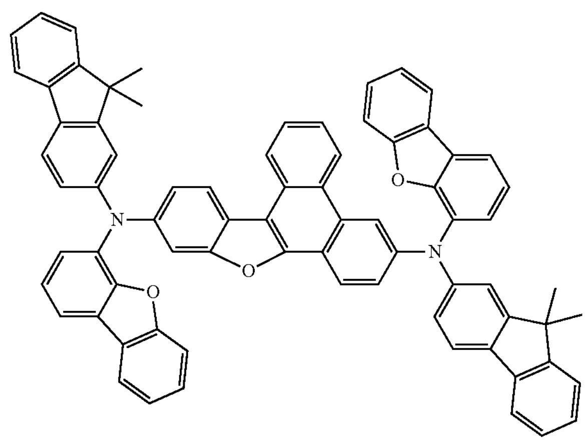
208A
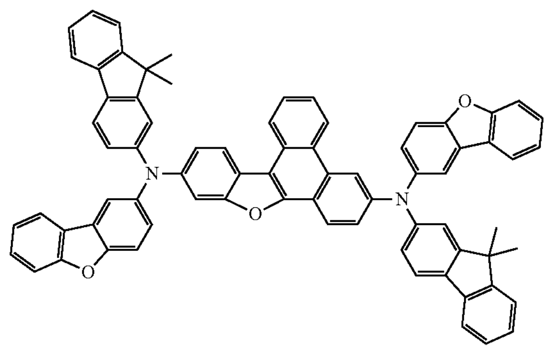
209A
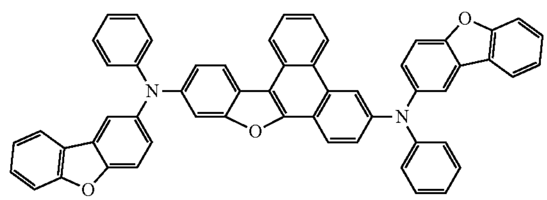
210A
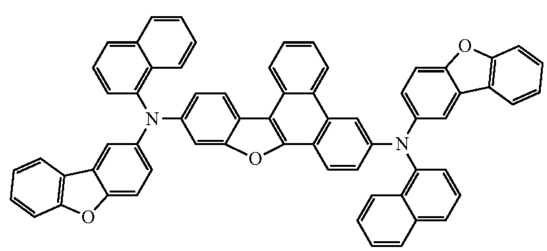
211A
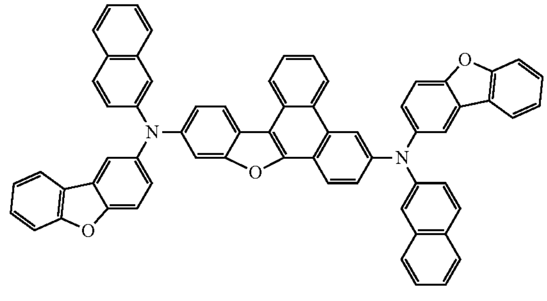

-continued
212A
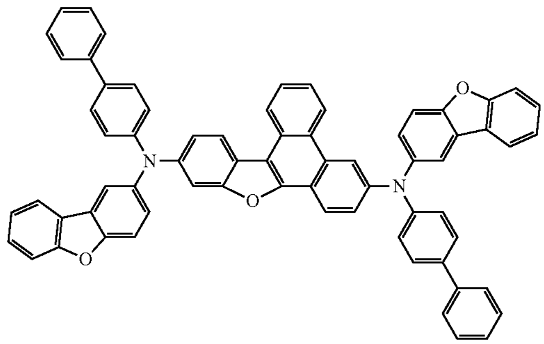
213A
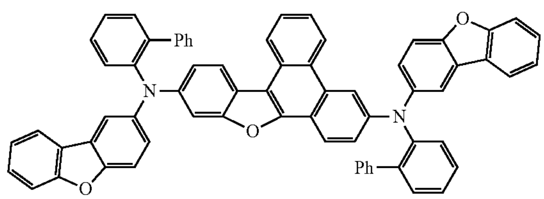
214A
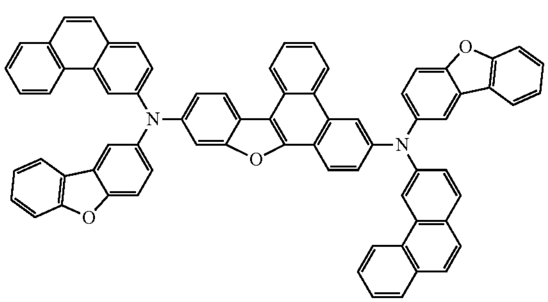
215A
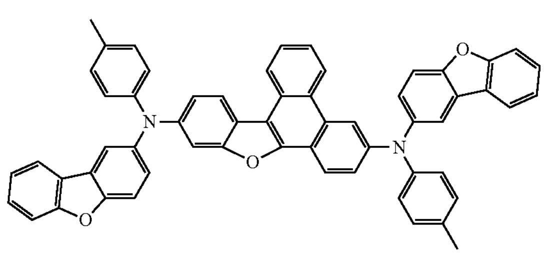
216A
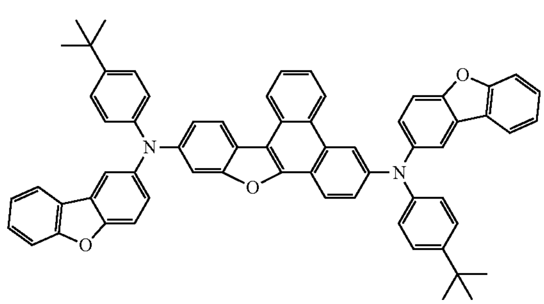
-continued
217A
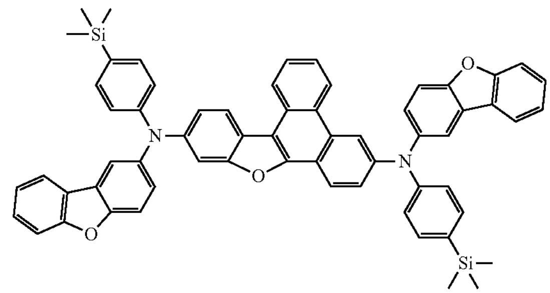
218A
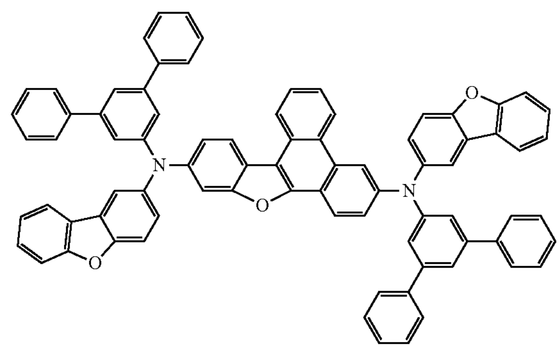
219A
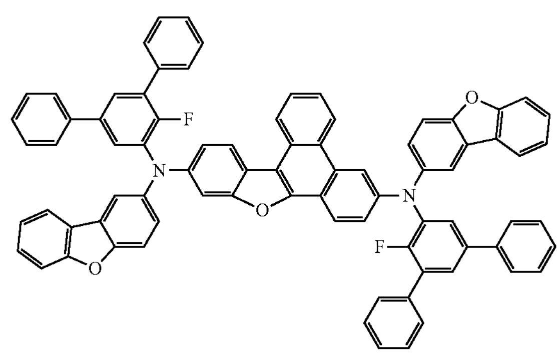
220A
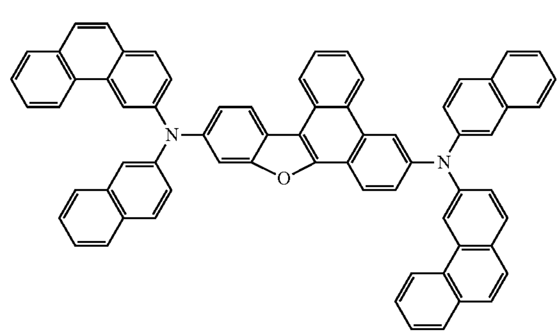

-continued
221A
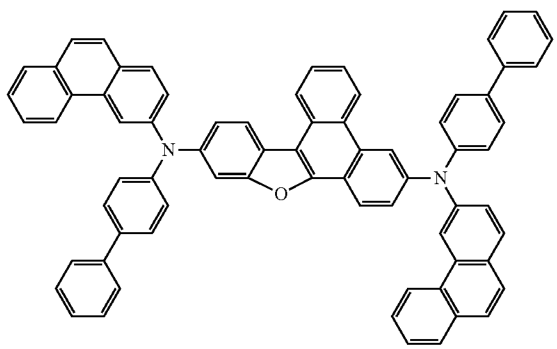
222A
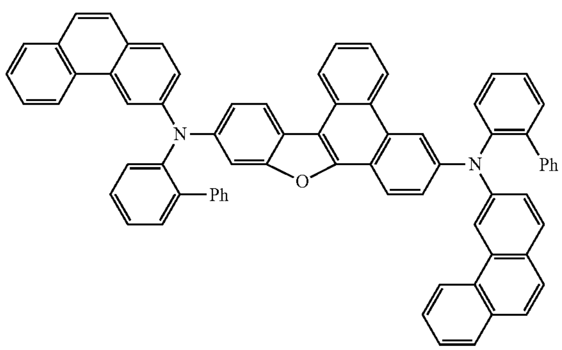
223A
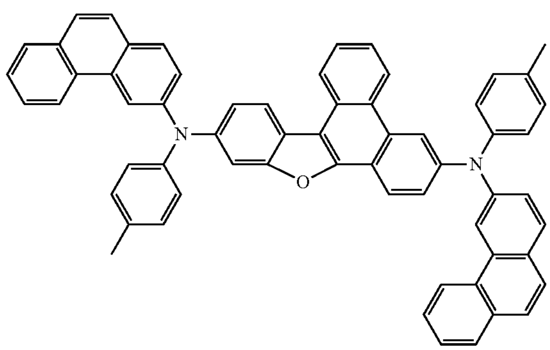
224A
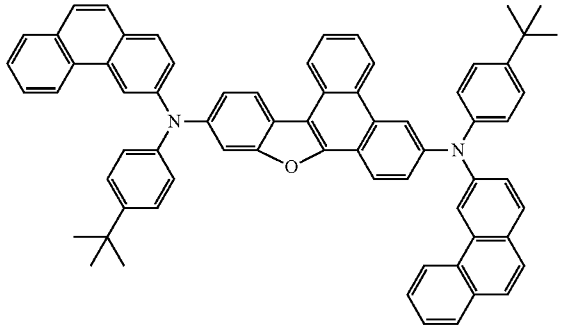
-continued
225A
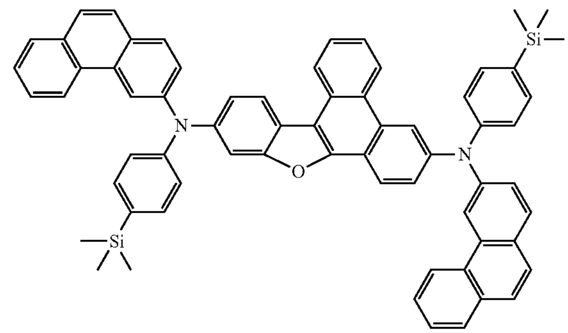
226A
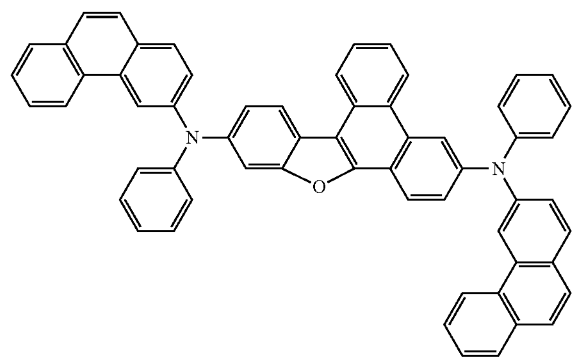
227A
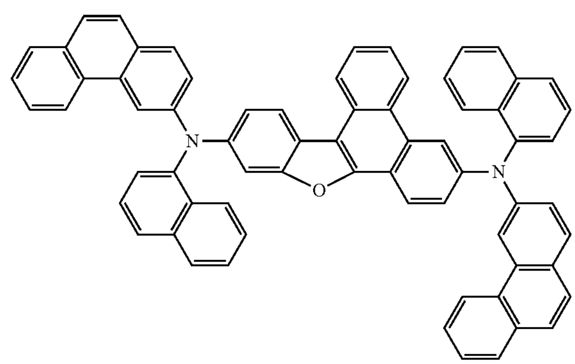
228A
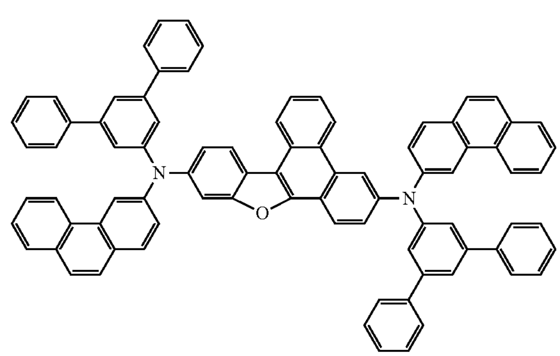

-continued
229A
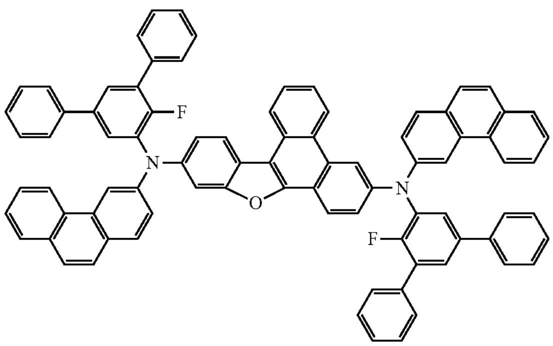
230A
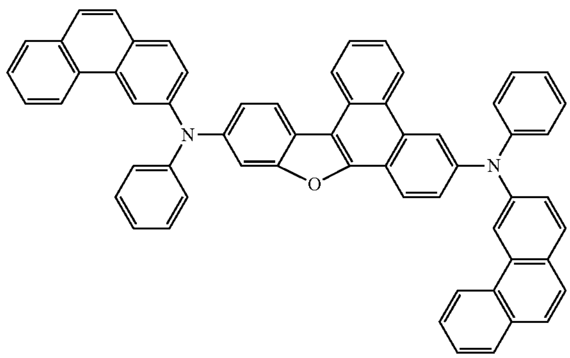
231A
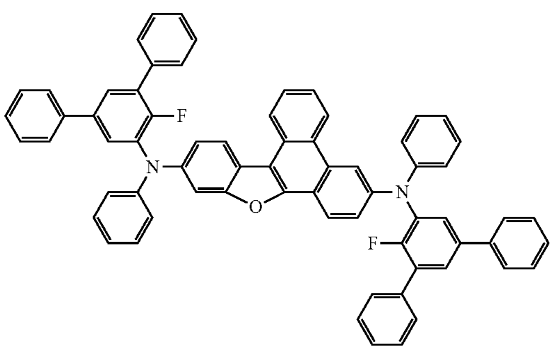
232A
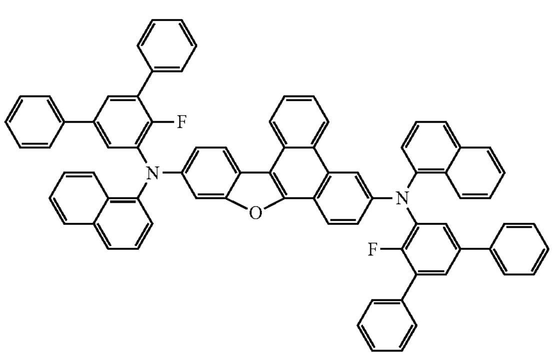
-continued
233A
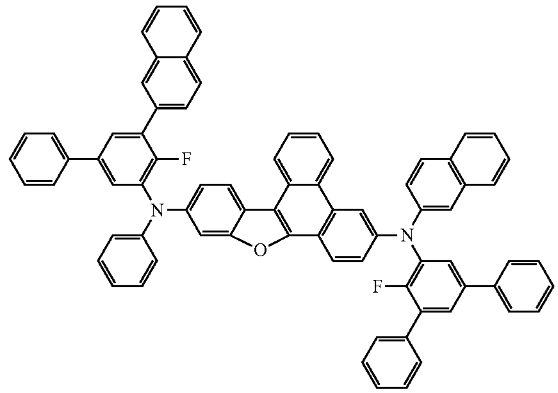
234A
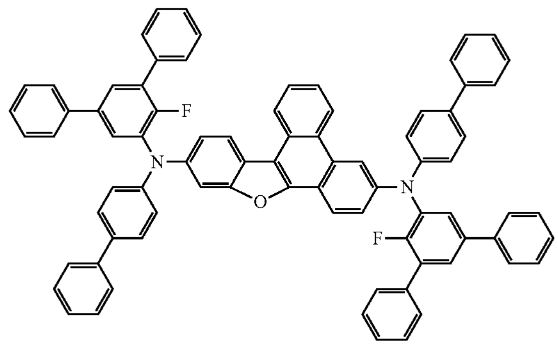
235A
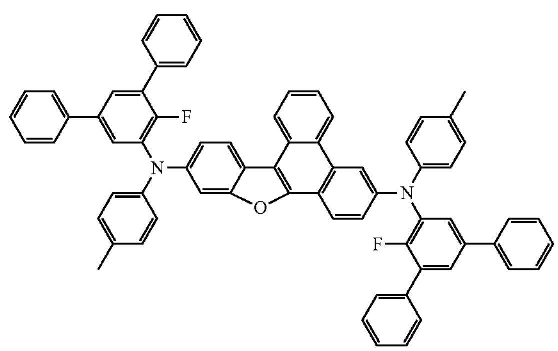
236A
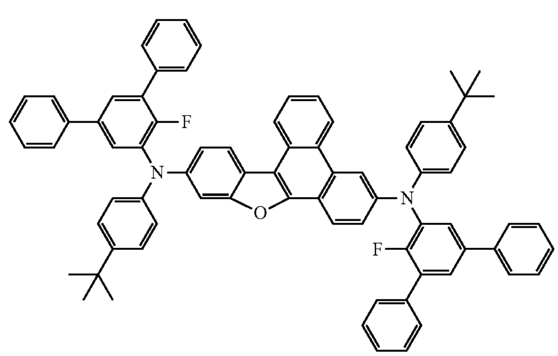

-continued
237A
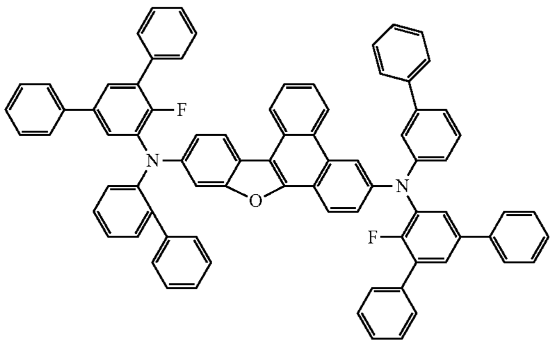
238A
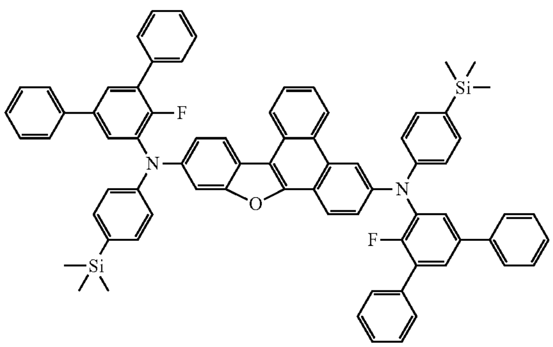
239A
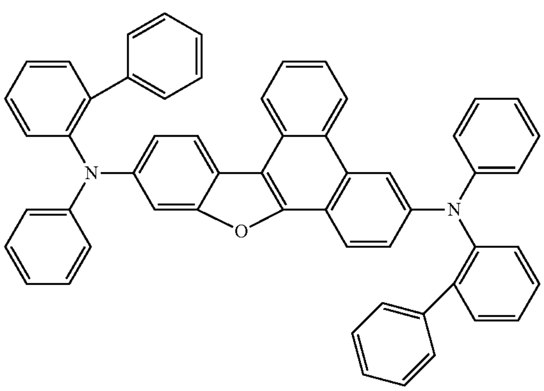
240A
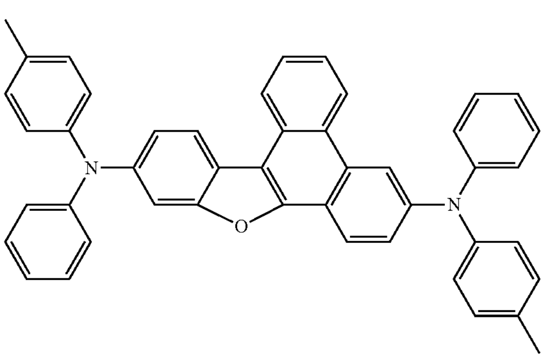
-continued
241A
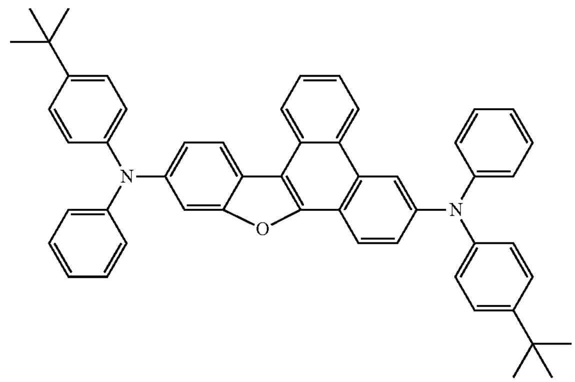
242A
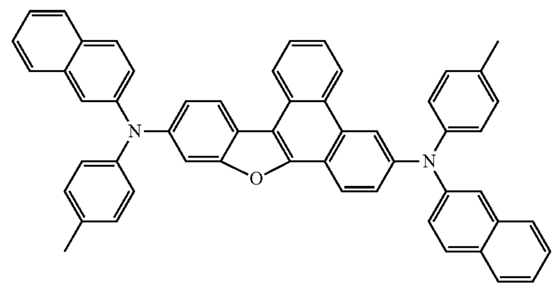
243A
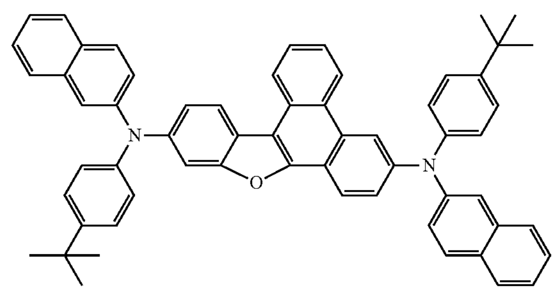
244A
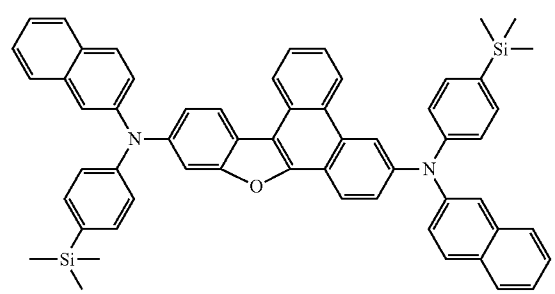
245A
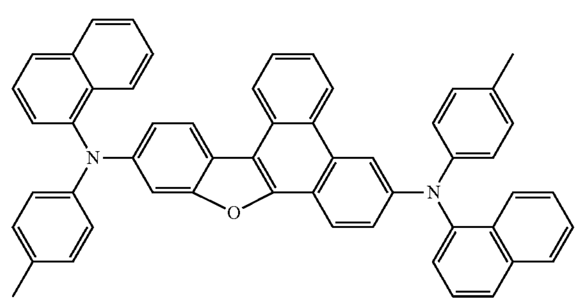

-continued
246A
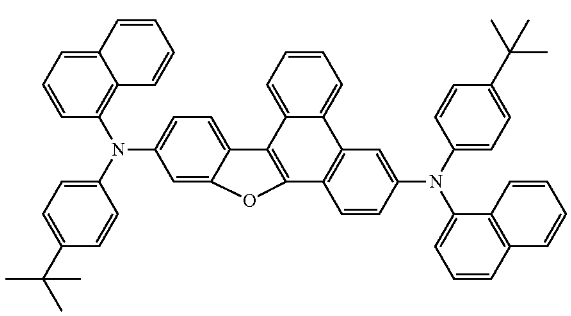
247A
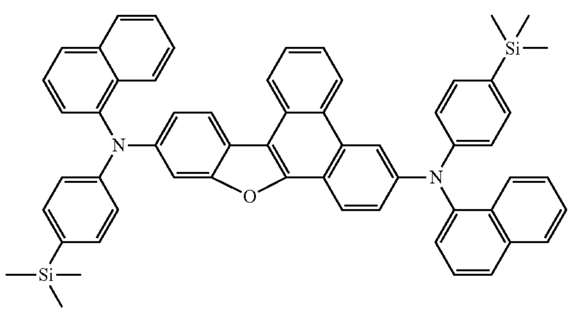
-continued
248A
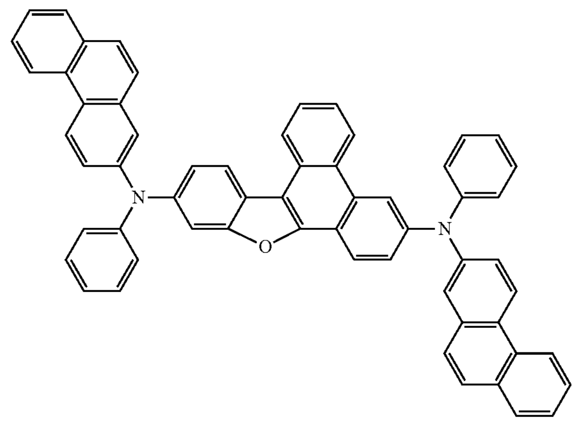
249A
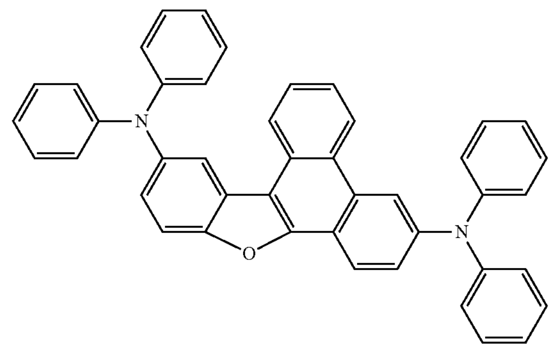
In some embodiments, the first compound, the second compound, and the third compound may each independently be selected from Compounds H-1 to H-65, but embodiments of the present disclosure are not limited thereto:
H-1
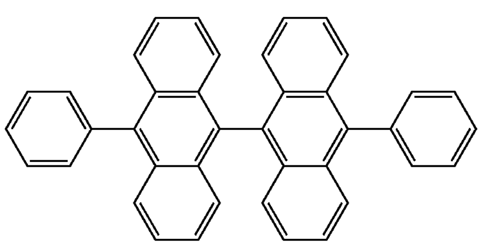
H-2
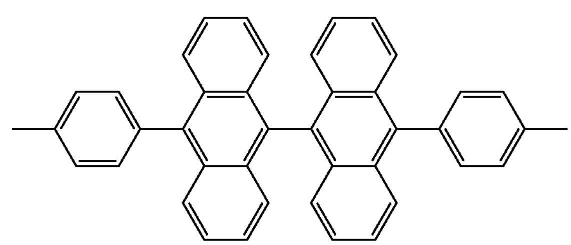
H-3
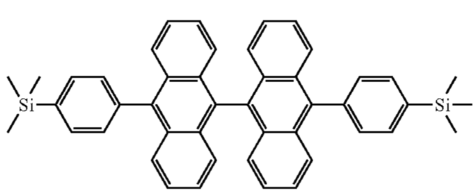
H-4
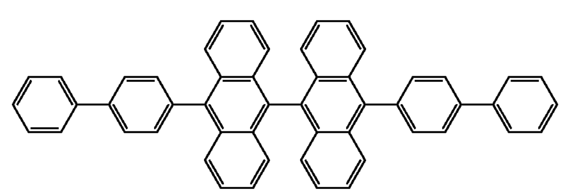

-continued
H-5
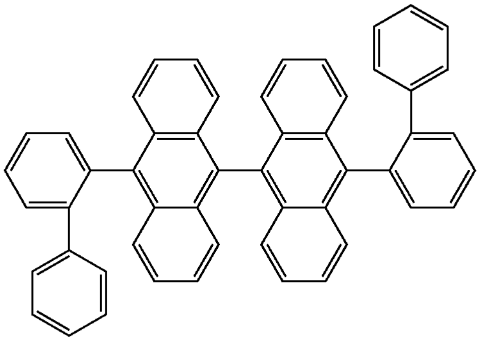
H-6
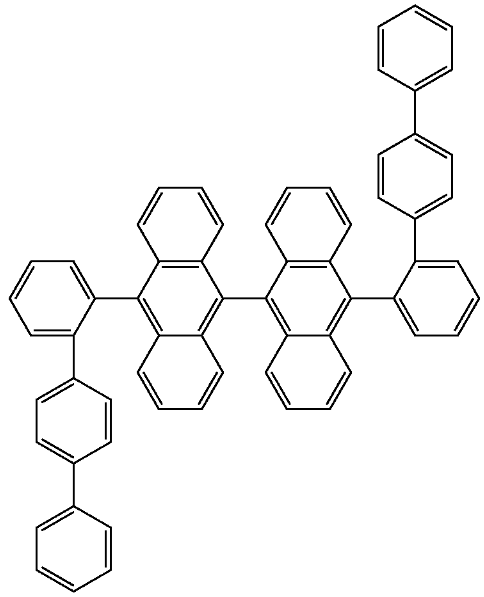
H-7
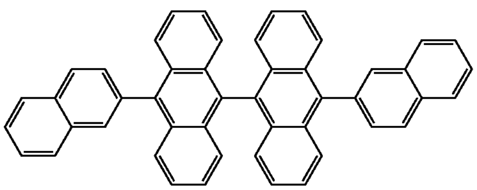
H-8
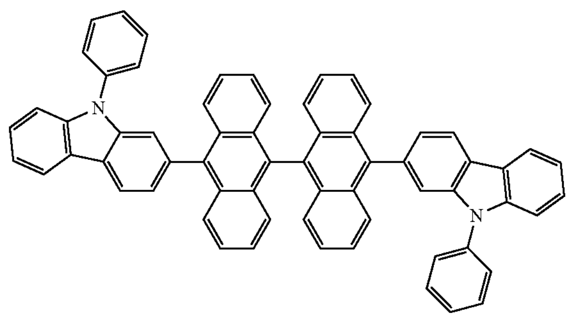
H-9
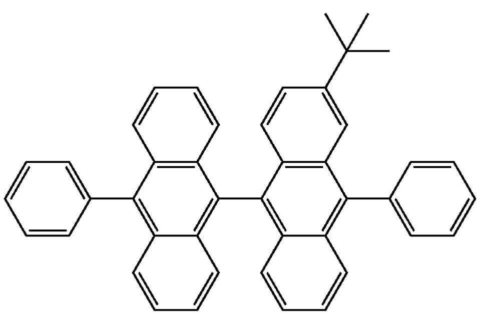
H-10
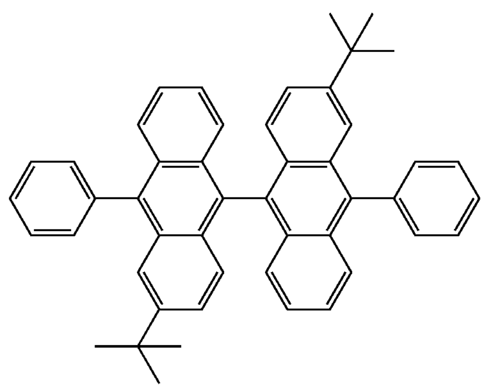
H-11
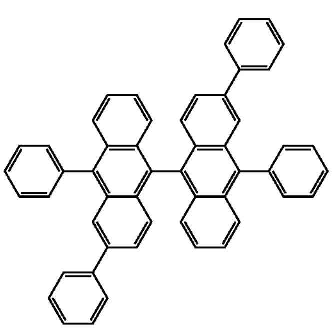
H-12
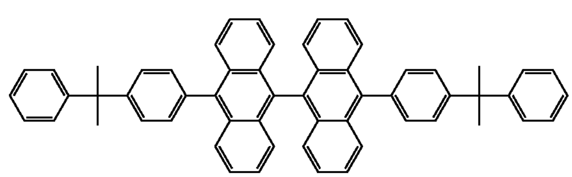

-continued
H-13
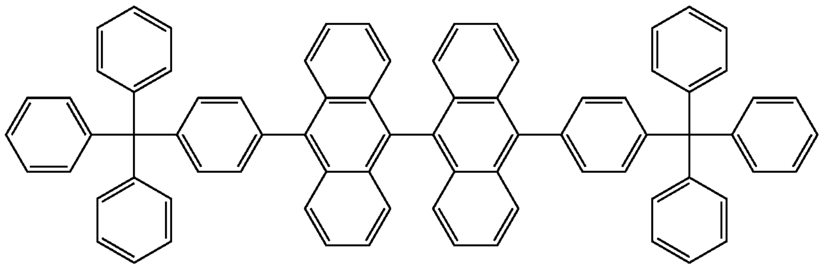
H-14
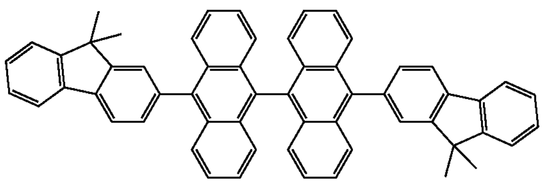
H-15
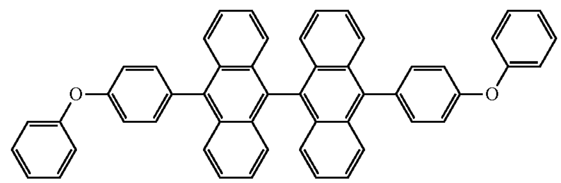
H-16
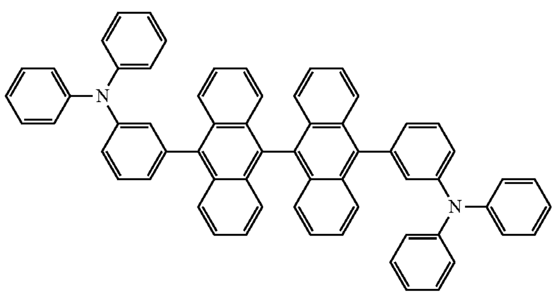
H-17
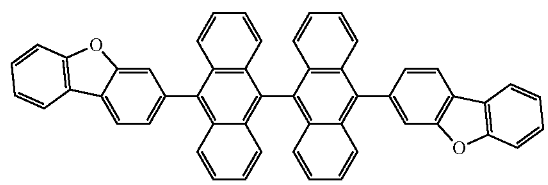
H-18
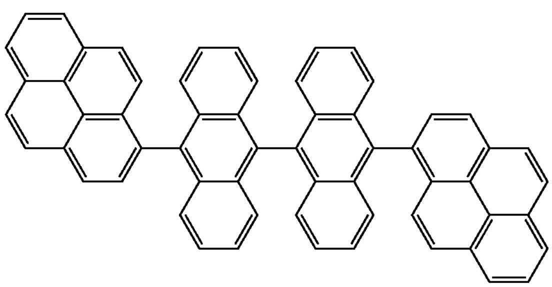
H-19
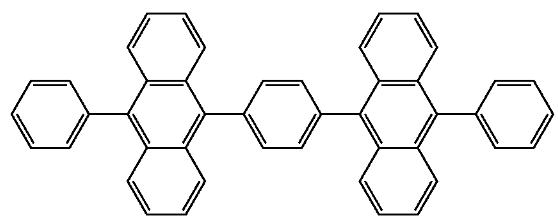
H-20
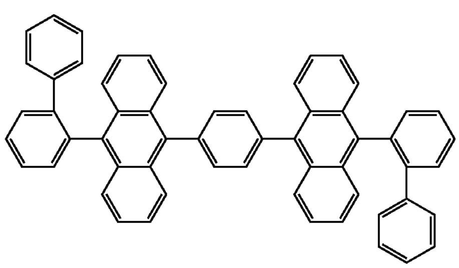
H-21
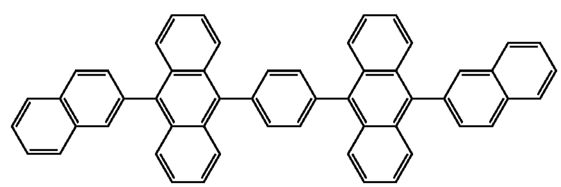
H-22
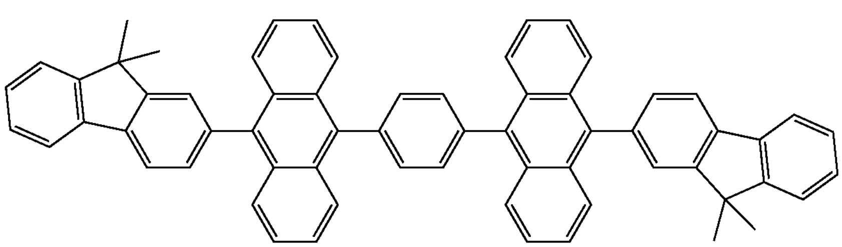

-continued
H-23
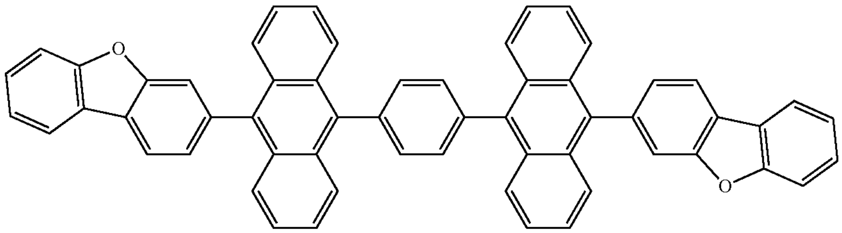
H-24
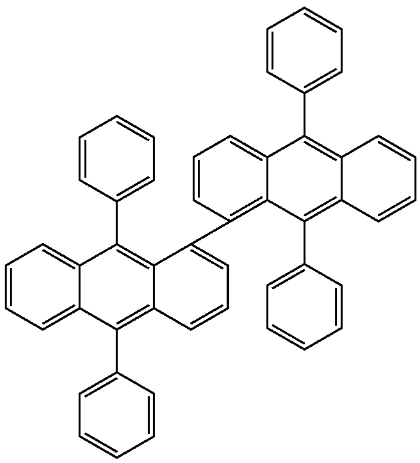
H-25
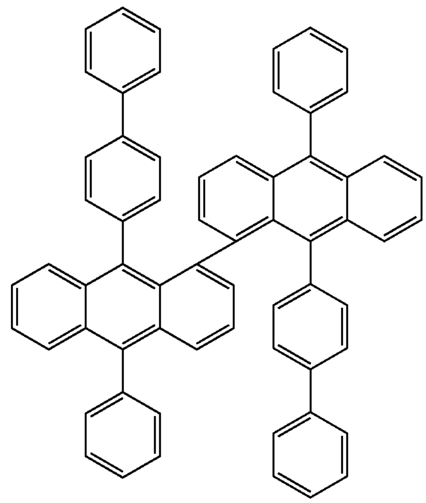
H-26
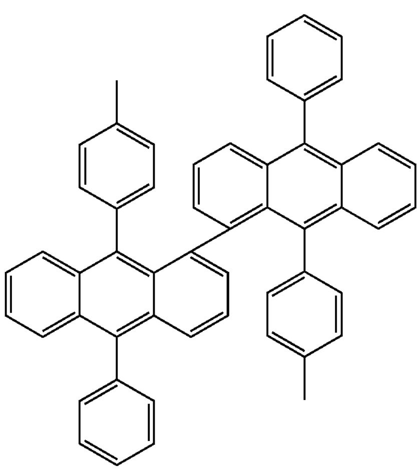
H-27
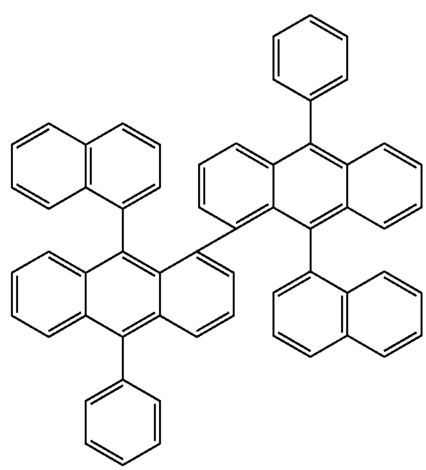

-continued
H-28
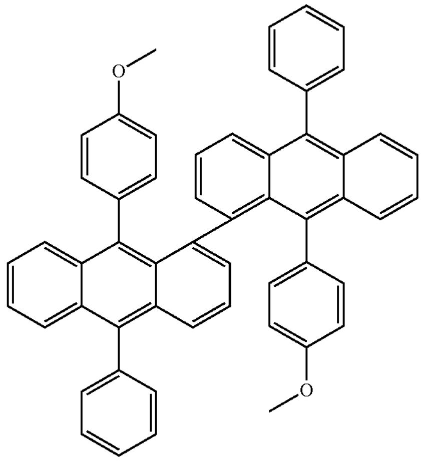
H-29
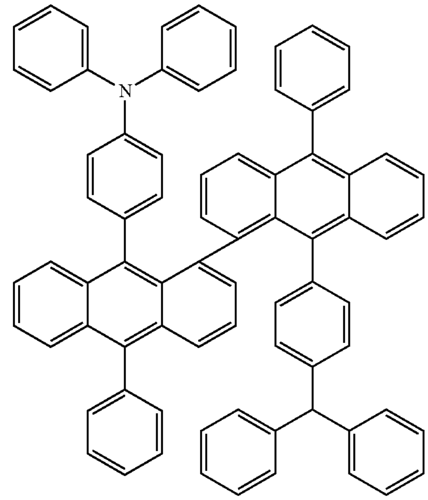
H-30
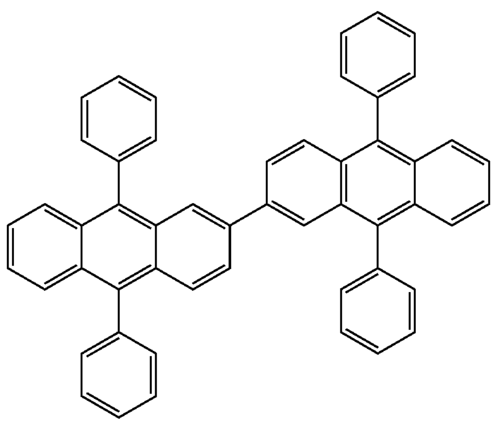
H-31
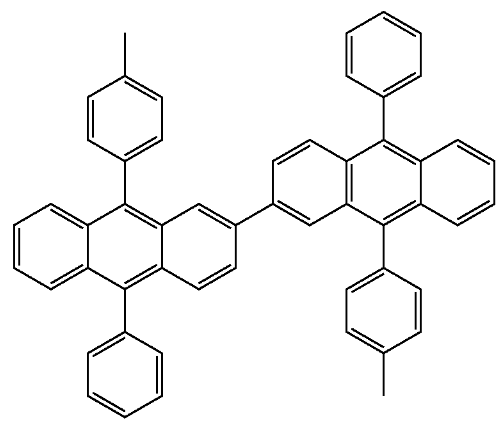
H-32
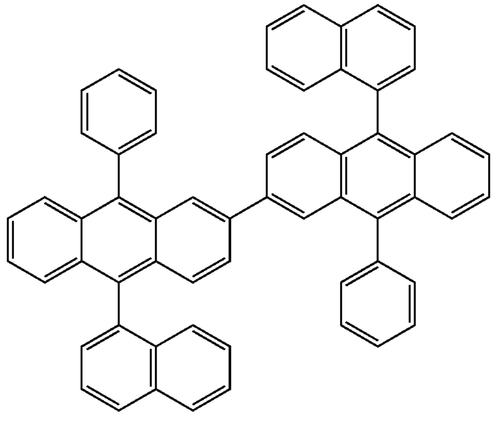
H-33
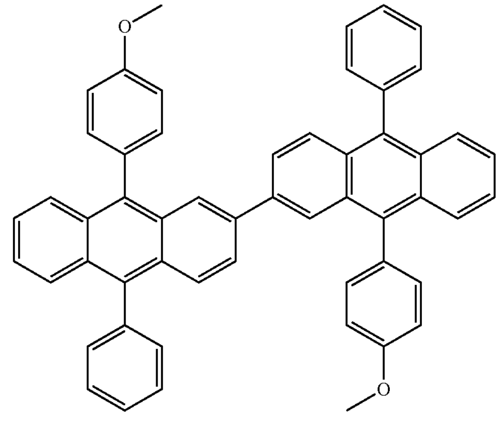

-continued
H-34
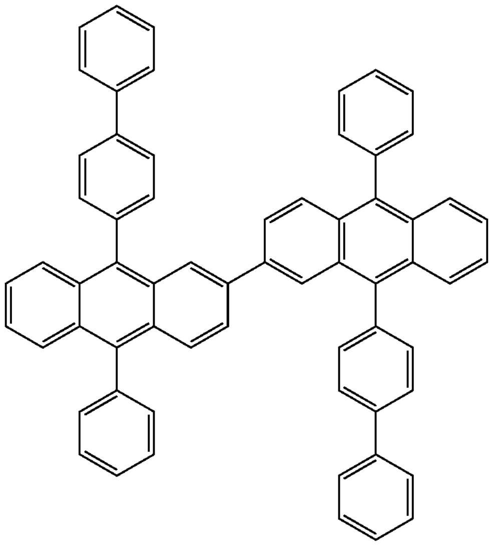
H-35
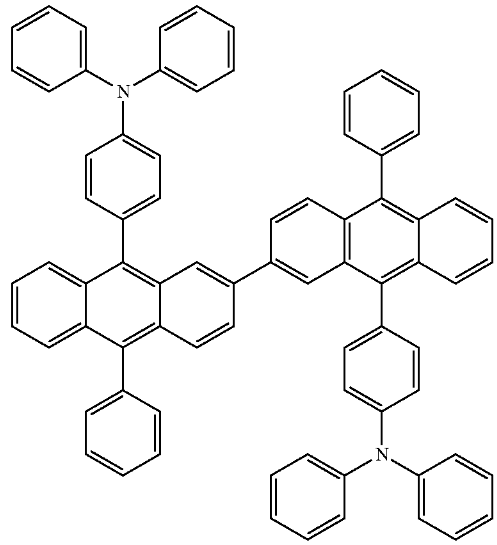
H-36
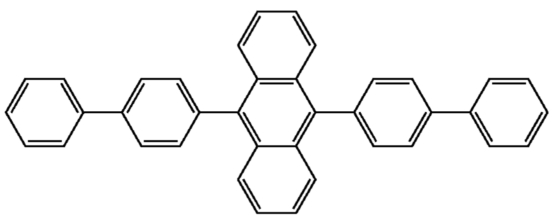
H-37
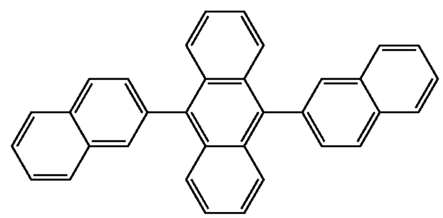
H-38
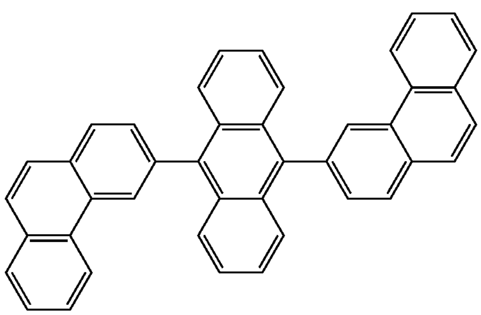
H-39
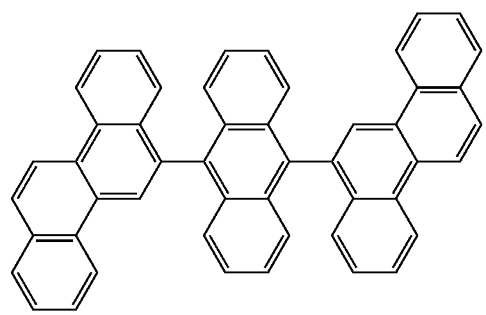
H-40
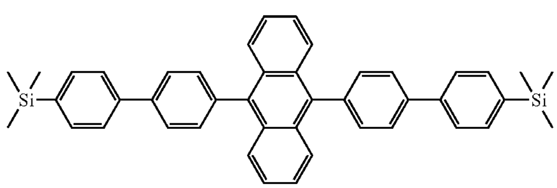
H-41
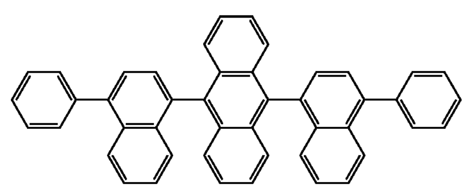
H-42
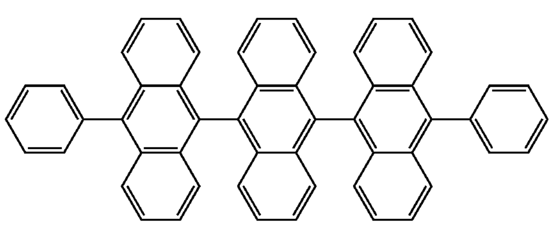
H-43
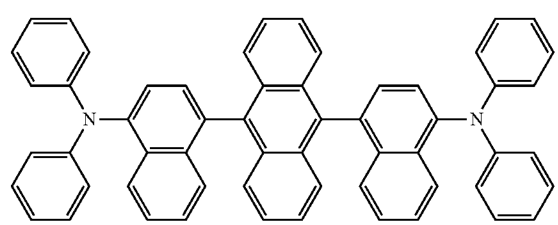

-continued
H-44
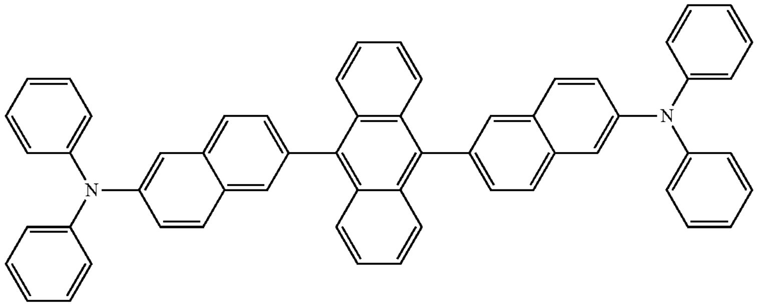
H-45
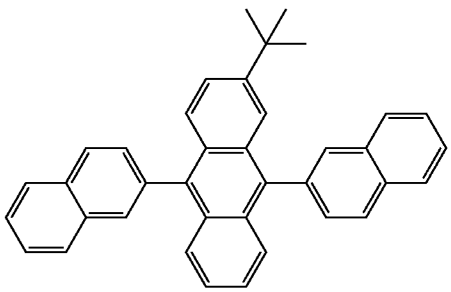
H-46
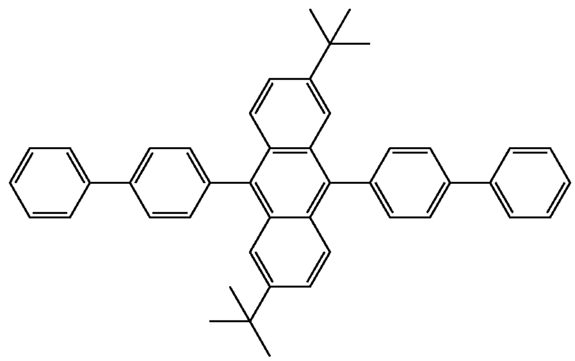
H-47
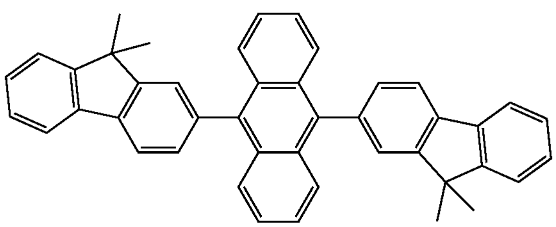
H-48
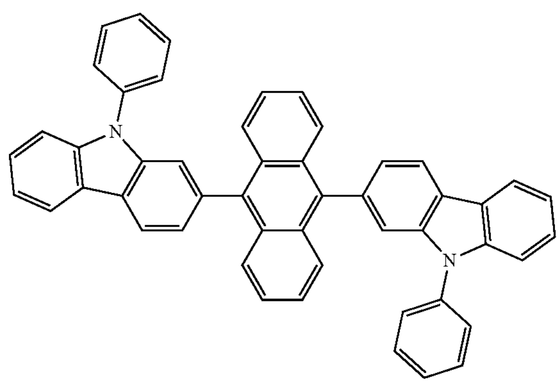
H-49
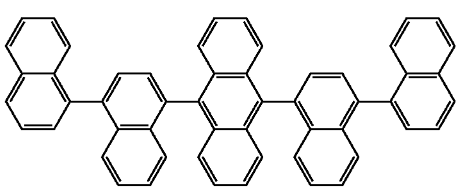
H-50
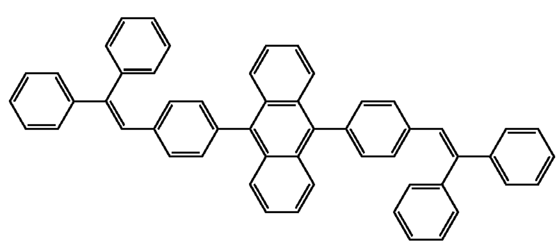

-continued
H-51
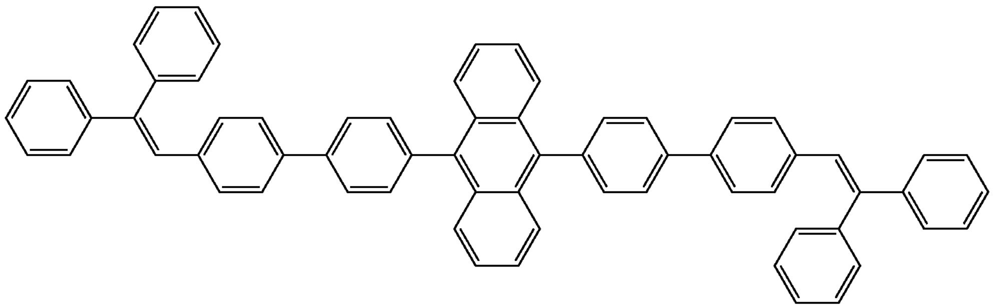
H-52
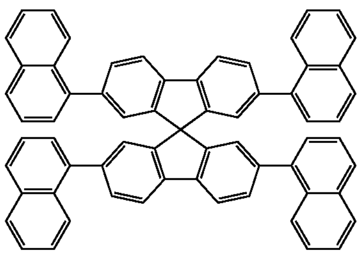
H-53
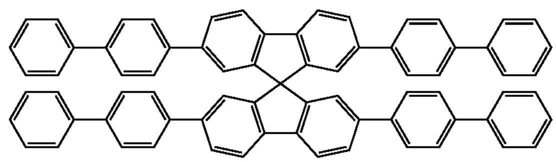
H-54
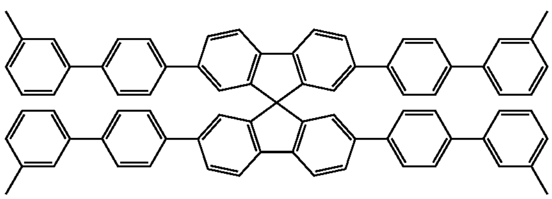
H-55
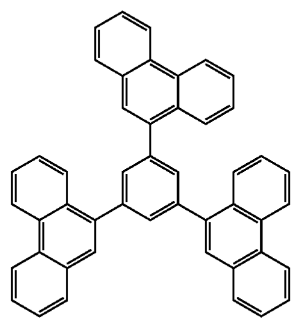
H-56
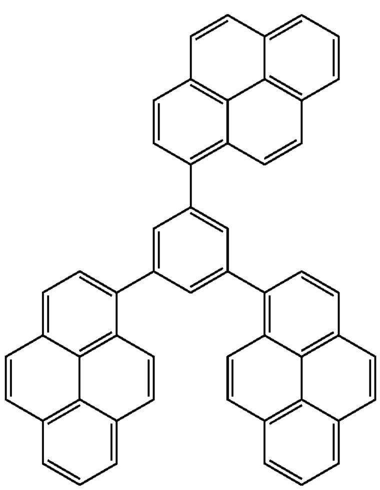
H-57
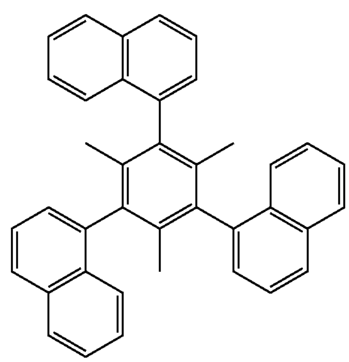

-continued
H-58
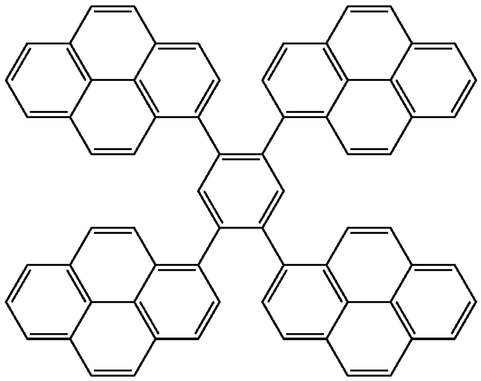
H-59
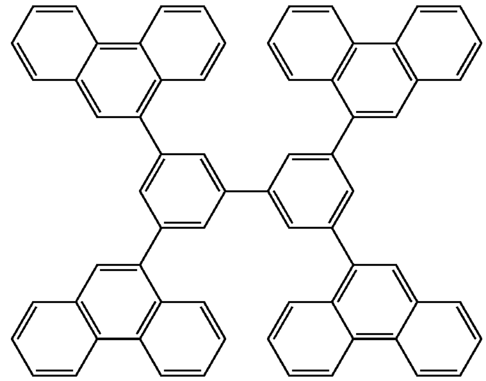
H-60
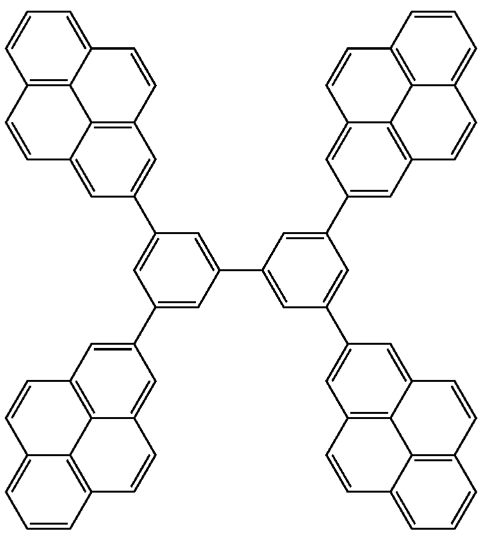
H-61
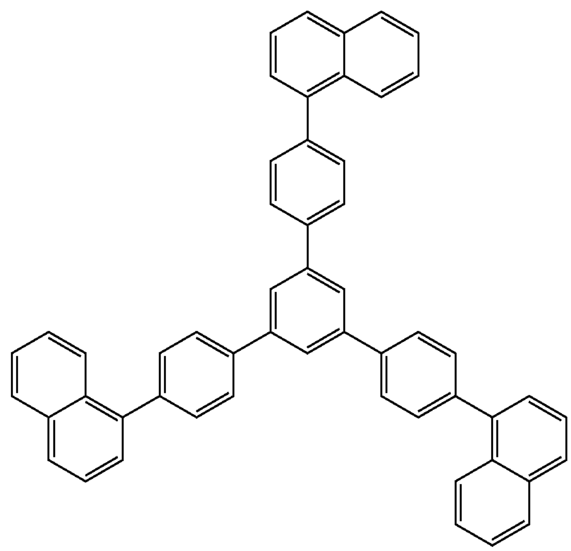
H-62
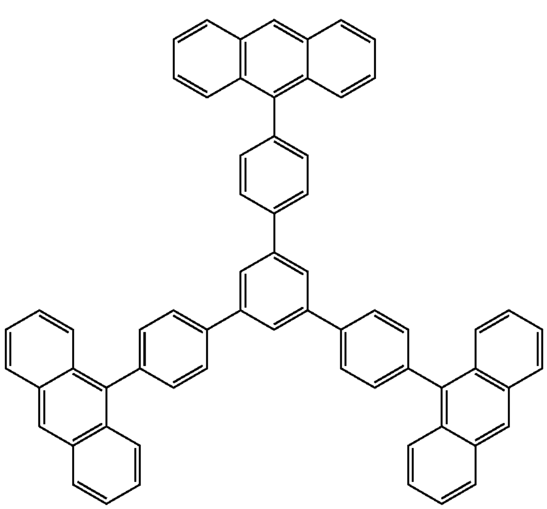
H-63
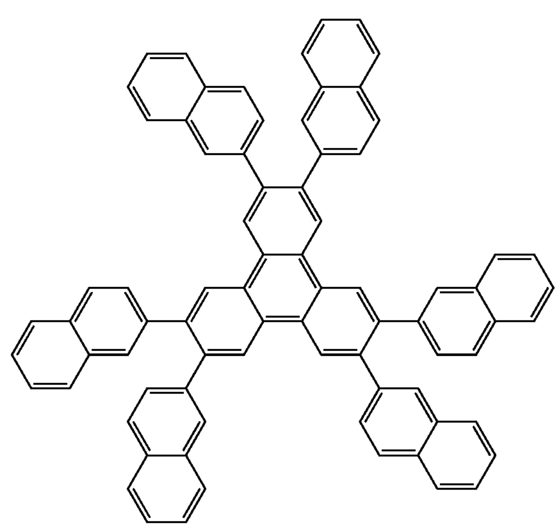

-continued

H-64

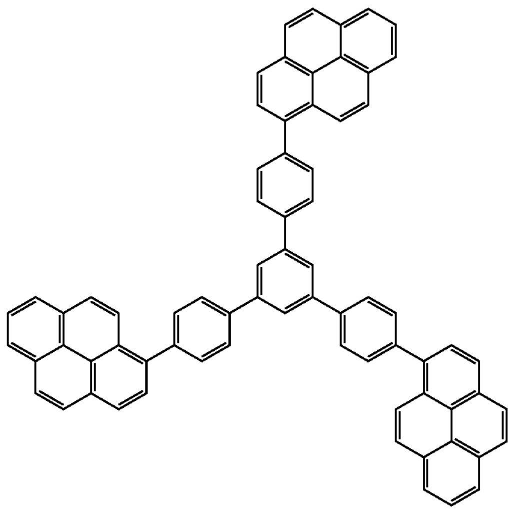

H-65

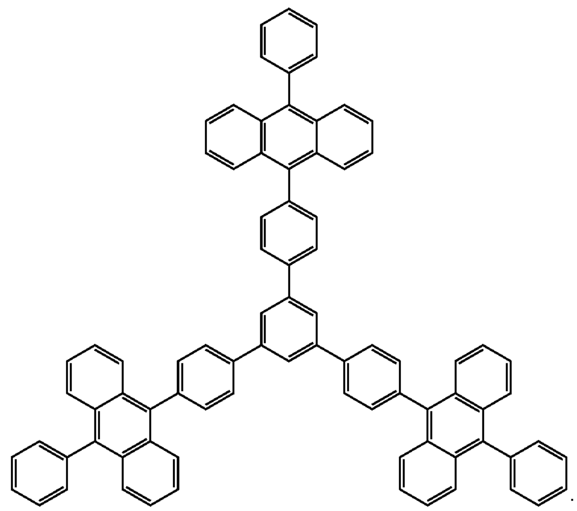

In embodiments where at least two selected from $R_1$ to $R_{12}$ in Formula 1 are each independently a group represented by Formula 2, an organic light-emitting device using the condensed cyclic compound represented by Formula 1 may have high efficiency characteristics.

Furthermore, when the organic light-emitting device includes the condensed cyclic compound represented by Formula 1 along with at least one selected from the first compound represented by Formula 11, the second compound represented by Formula 12, and the third compound represented by Formula 13, the organic light-emitting device may have a low driving voltage, high efficiency, high luminance, and long lifespan.

The condensed-cyclic compound represented by Formula 1 may be synthesized by using any suitable organic synthetic method. A method of synthesizing the condensed-cyclic compound should be apparent to those of ordinary skill in the from the examples provided herein.

In some embodiments, the condensed cyclic compound represented by Formula 1 may be included in the emission layer and may serve as a dopant, and at least one selected from the first compound represented by Formula 11, the second compound represented by Formula 12, and the third compound represented by Formula 13 may be further included in the emission layer and may serve as a host.

In some embodiments, in the emission layer, a weight ratio (/) of i) the condensed cyclic compound represented by Formula 1 to ii) the at least one selected from the first compound represented by Formula 11, the second compound represented by Formula 12, and the third compound represented by Formula 13 may be in a range of about 1:99 to about 20:80. When the weight ratio is within this range, the organic light-emitting device having a high efficiency and long lifespan may be realized.

The condensed cyclic compound represented by Formula 1 may be further included in the hole transport region of the organic light-emitting device (for example, in the hole transport layer), and the condensed cyclic compound included in the hole transport region may be identical to or different from the condensed cyclic compound included in the emission layer. For example, the condensed cyclic compound represented by Formula 1 may be included in the hole transport region (for example, in the hole transport layer), and the condensed cyclic compound included in the hole transport region may be different from the condensed cyclic compound included in the emission layer.

As used herein, the term the "organic layer" may refer to a single layer and/or a plurality of layers between the first electrode and the second electrode in an organic light-emitting device. A material included in the "organic layer" is not limited to an organic material.

The thickness of the emission layer may be in a range of about 100 Å to about 1000 Å, for example, about 200 Å to about 600 Å. When the thickness of the emission layer is within any of these ranges, excellent light-emission characteristics may be achieved without a substantial increase in driving voltage.

An electron transport region may be positioned on the emission layer.

The electron transport region may include at least one selected from a hole blocking layer, an electron transport layer (ETL), and an electron injection layer, but embodiments of the present disclosure are not limited thereto.

In some embodiments, the electron transport region may have a structure of electron transport layer/electron injection layer or a structure of hole blocking layer/electron transport layer/electron injection layer, wherein the layers of each structure are sequentially stacked from the emission layer in the stated order, but embodiments of the present disclosure are not limited thereto.

In some embodiments, the organic layer 150 of the organic light-emitting device may include an electron transport region between the emission layer and the second electrode 190.

When the electron transport region includes a hole blocking layer, the hole blocking layer may be formed on the emission layer by using one or more suitable methods, such as vacuum-deposition, spin coating, casting, LB method, ink-jet printing, laser-printing, and/or LITI. When the hole blocking layer is formed by vacuum-deposition and/or spin coating, deposition and coating conditions for the hole blocking layer may be similar to the deposition and coating conditions for the hole injection layer.

The hole blocking layer may include, for example, at least one selected from BCP and Bphen, but embodiments of the present disclosure are not limited thereto:

BCP

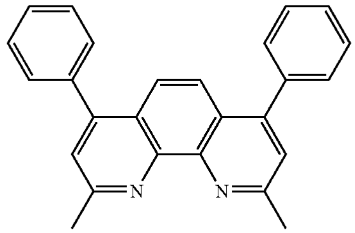

Bphen

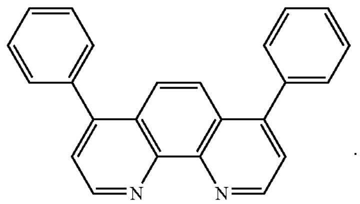

The thickness of the hole blocking layer may be in a range of about 20 Å to about 1000 Å, for example, about 30 Å to about 300 Å. When the thickness of the hole blocking layer is within any of these ranges, excellent hole blocking characteristics may be achieved without a substantial increase in driving voltage.

The electron transport region may include an electron transport layer. The electron transport layer may be formed on the emission layer or the hole blocking layer by using one or more suitable methods, such as vacuum deposition, spin coating, casting, LB method, ink-jet printing, laser-printing, and/or LITI. When the electron transport layer is formed by using vacuum deposition and/or spin coating, vacuum deposition and coating conditions for the electron transport layer may be similar to the vacuum deposition and coating conditions for the hole injection layer.

In some embodiments, the electron transport layer may include at least one selected from a compound represented by Formula 601 and a compound represented by Formula 602:

$Ar_{601}\text{-}[(L_{601})_{xe1}\text{-}E_{601}]_{xe2},$ Formula 601 where, in Formula 601, $Ar_{601}$ may be selected from:

a naphthalene, a heptalene, a fluorene, a spirobifluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene; and a naphthalene, a heptalene, a fluorene, a spirobifluorene, a benzofluorene, a dibenzofluorene, a phenalene, a phenanthrene, an anthracene, a fluoranthene, a triphenylene, a pyrene, a chrysene, naphthacene, a picene, a perylene, a pentaphene, and an indenoanthracene, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{301}$)($Q_{302}$)($Q_{303}$), where $Q_{301}$ to $Q_{303}$ may be each independently selected from hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group;

$L_{601}$ may be defined the same as $L_{201}$;

$E_{601}$ may be selected from:

a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spirobifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, xe1 may be selected from 0, 1, 2, and 3; and xe2 may be selected from 1, 2, 3, and 4;

Formula 602

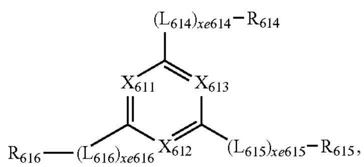

where, in Formula 602, $X_{611}$ may be N or C-$(L_{611})_{xe611}$-$R_{611}$, $X_{612}$ may be N or C-$(L_{612})_{xe612}$-$R_{612}$, $X_{613}$ may be N or C-$(L_{613})_{xe613}$-$R_{613}$, and at least one selected from $X_{611}$ to $X_{613}$ may be N;

$L_{611}$ to $L_{616}$ may be each independently defined the same as $L_1$ provided herein;

$R_{611}$ to $R_{616}$ may be each independently selected from:

a phenyl group, a naphthyl group, a fluorenyl group, a spirobifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spirobifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an azulenyl group, a fluorenyl group, a spirobifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, xe611 to xe616 may be each independently selected from 0, 1, 2, and 3.

The compound represented by Formula 601 and the compound represented by Formula 602 may be each independently selected from Compounds ET1 to ET15:

ET1

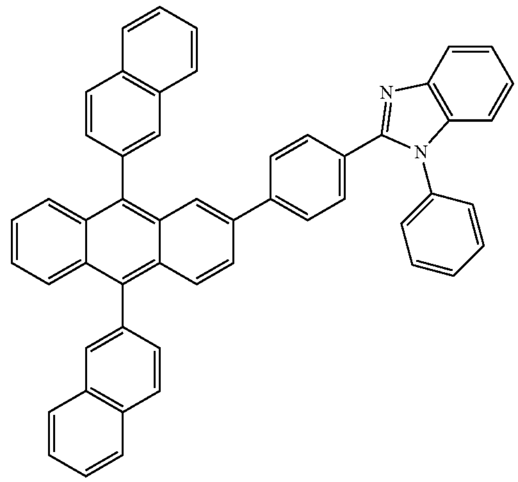

ET2

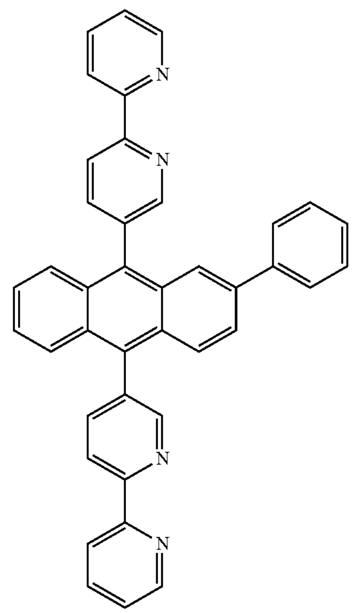

ET3

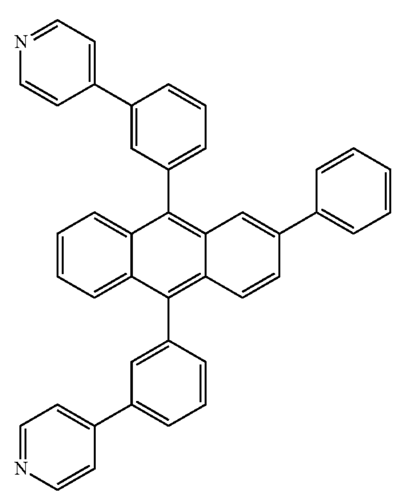

ET4
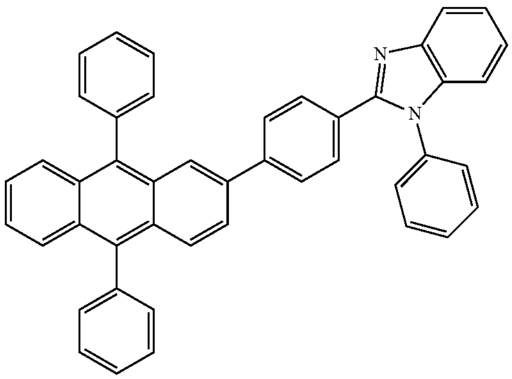
ET5
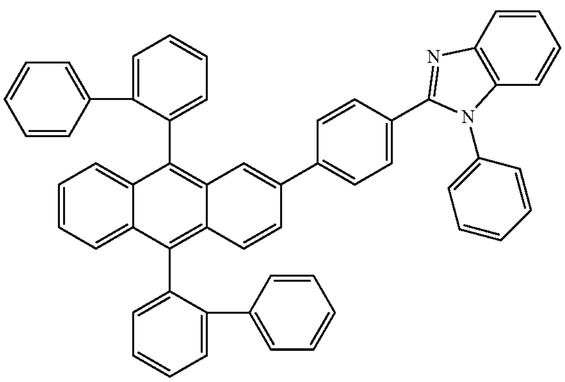
ET6
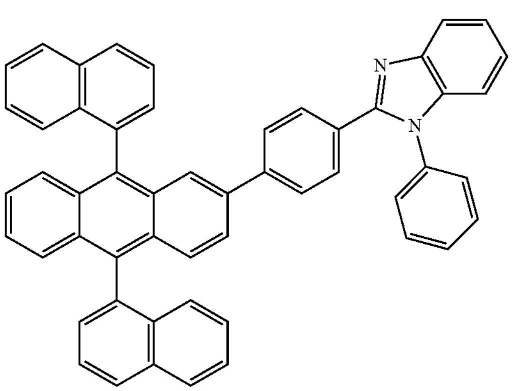
ET7
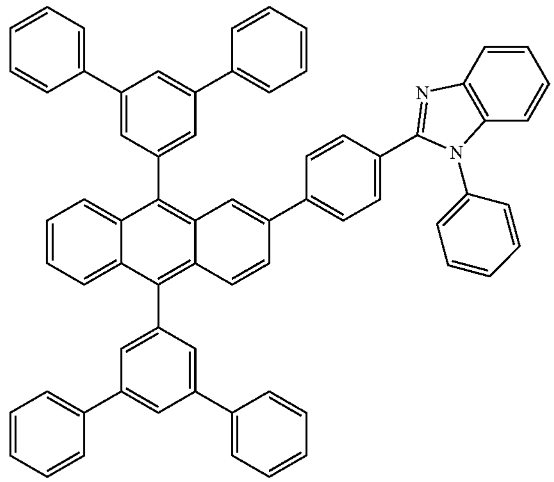
ET8
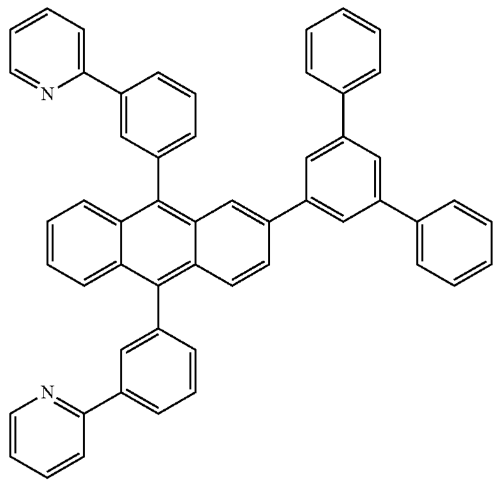
ET9
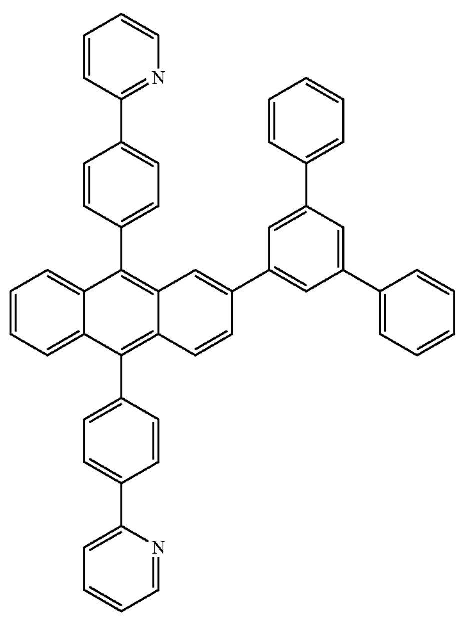

ET10
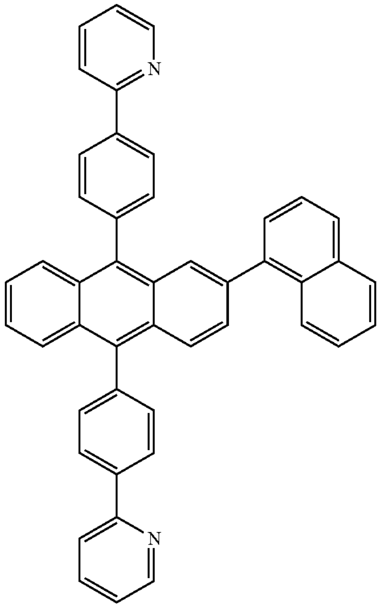
ET11
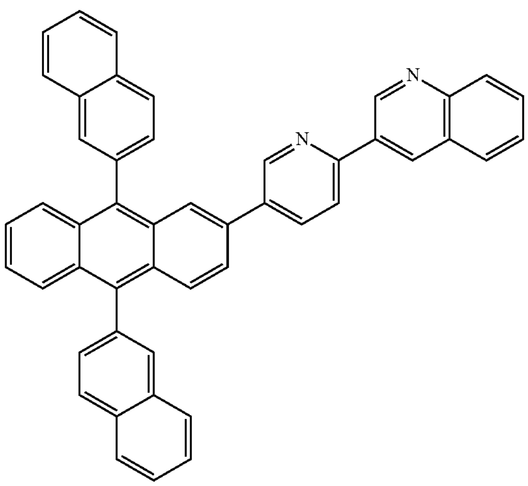
ET12
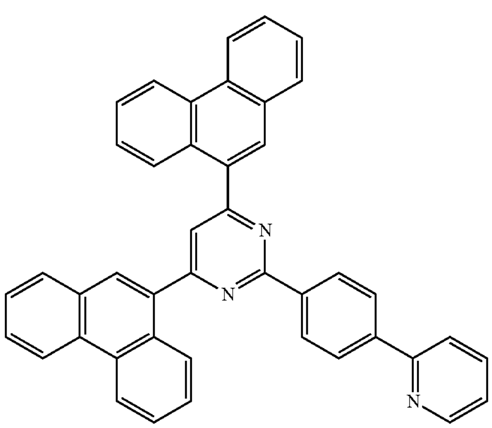
ET13
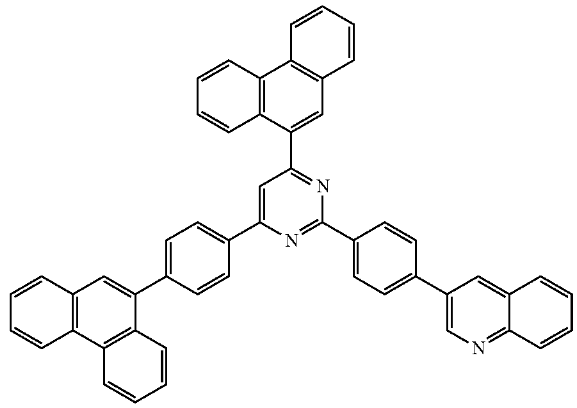
ET14
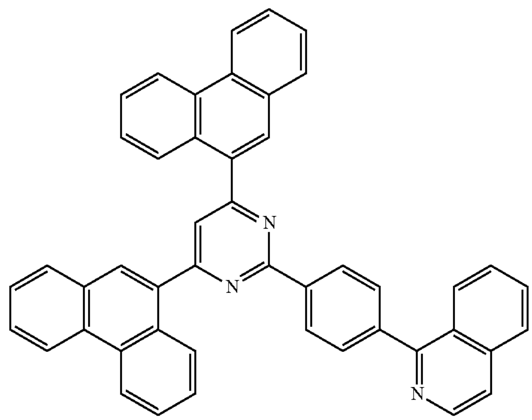
ET15
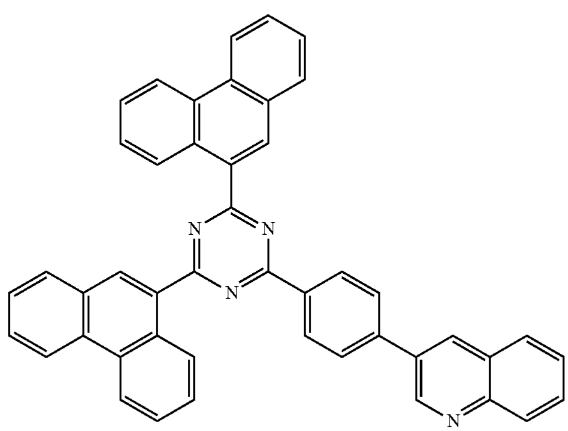
In some embodiments, the electron transport layer may include at least one selected from BCP, Bphen, $Alq_3$, BAlq, TAZ, and NTAZ:

Alq3

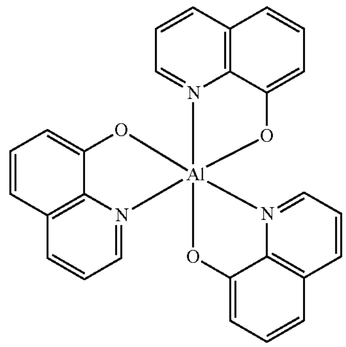

BAlq

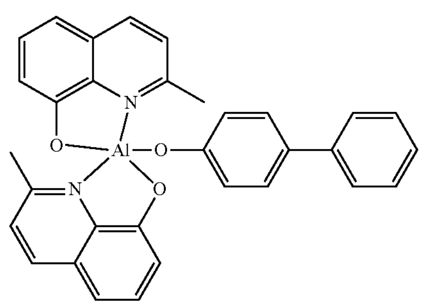

TAZ

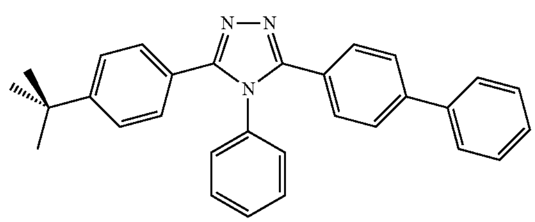

NTAZ

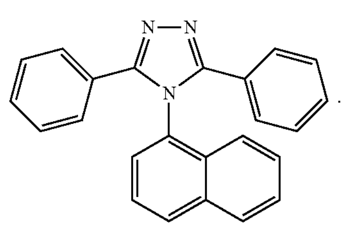

The thickness of the electron transport layer may be in a range of about 100 Å to about 1000 Å, for example, about 150 Å to about 500 Å. When the thickness of the electron transport layer is within any of these ranges, excellent electron transport characteristics may be obtained without a substantial increase in driving voltage.

The electron transport layer may further include a metal-containing material, in addition to the materials described above.

The metal-containing material may include a Li complex. The Li complex may include, for example, Compound ET-D1 (lithium quinolate, or LiQ) or ET-D2:

ET-D1

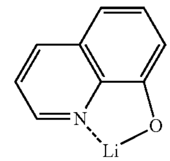

ET-D2

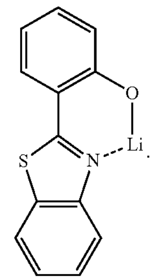

The electron transport region may include an electron injection layer that facilitates electron injection from the second electrode 190.

The electron injection layer may be formed on the electron transport layer by using one or more suitable methods, such as vacuum-deposition, spin coating, casting, LB method, ink-jet printing, laser-printing, and/or LITI. When the electron injection layer is formed by vacuum-deposition and/or spin coating, vacuum-deposition and coating conditions for the electron injection layer may be similar to the vacuum-deposition and coating conditions for the hole injection layer.

The electron injection layer may include at least one selected from LiF, NaCl, CsF, $Li_2O$, BaO, and LiQ.

The thickness of the electron injection layer may be in a range of about 1 Å to about 100 Å, for example, about 3 Å to about 90 Å. When the thickness of the electron injection layer is within any of these ranges, excellent electron injection characteristics may be obtained without a substantial increase in driving voltage.

The second electrode 190 may be positioned on the organic layer 150. The second electrode 190 may be a cathode that is an electron injection electrode, and in this regard, a material for forming the second electrode 190 may be a material having a low work function, for example, a metal, an alloy, an electrically conductive compound, or a mixture thereof. Non-limiting examples of the material for forming the second electrode 190 include lithium (Li), magnesium (Mg), aluminum (Al), aluminum-lithium (Al—Li), calcium (Ca), magnesium-indium (Mg—In), and magnesium-silver (Mg—Ag). In some embodiments, the material for forming the second electrode 190 may be ITO and/or IZO. The second electrode 190 may be a semi-transmissive electrode or a transmissive electrode.

Hereinbefore, the organic light-emitting device has been described with reference to the drawing, but embodiments of the present disclosure are not limited thereto.

According to another embodiment of the present disclosure, an organic light-emitting apparatus is provided, and the organic light-emitting apparatus may include the organic light-emitting device and a thin film transistor, wherein the first electrode of the organic light-emitting device and the thin film transistor may be electrically connected (e.g., coupled) to each other.

A $C_1$-$C_{60}$ alkyl group used herein may refer to a linear or branched aliphatic hydrocarbon monovalent group having 1 to 60 carbon atoms, and non-limiting examples thereof include a methyl group, an ethyl group, a propyl group, an iso-butyl group, a sec-butyl group, a tert-butyl group, a pentyl group, an iso-amyl group, and a hexyl group. A $C_1$-$C_{60}$ alkylene group used herein may refer to a divalent group having the same structure as the $C_1$-$C_{60}$ alkyl group.

A $C_1$-$C_{60}$ alkoxy group used herein may refer to a monovalent group represented by —$OA_{101}$ (where $A_{101}$ is the $C_1$-$C_{60}$ alkyl group), and non-limiting examples thereof include a methoxy group, an ethoxy group, and an isopropyloxy group.

A $C_2$-$C_{60}$ alkenyl group used herein may refer to a hydrocarbon group having at least one carbon double bond at one or more positions along the carbon chain of the $C_2$-$C_{60}$ alkyl group (e.g., in the middle or at either terminal end of the $C_2$-$C_{60}$ alkyl group), and non-limiting examples thereof include an ethenyl group, a propenyl group, and a butenyl group. A $C_2$-$C_{60}$ alkenylene group used herein may refer to a divalent group having the same structure as the $C_2$-$C_{60}$ alkenyl group.

A $C_2$-$C_{60}$ alkynyl group used herein may refer to a hydrocarbon group having at least one carbon triple bond at one or more positions along the carbon chain of the $C_2$-$C_{60}$ alkyl group (e.g., in the middle or at either terminal end of the $C_2$-$C_{60}$ alkyl group), and non-limiting examples thereof include an ethynyl group and a propynyl group. A $C_2$-$C_{60}$ alkynylene group used herein may refer to a divalent group having the same structure as the $C_2$-$C_{60}$ alkynyl group.

A $C_3$-$C_{10}$ cycloalkyl group used herein may refer to a monovalent monocyclic saturated hydrocarbon group including 3 to 10 carbon atoms, and non-limiting examples thereof include a cyclopropyl group, a cyclobutyl group, a cyclopentyl group, a cyclohexyl group, and a cycloheptyl group. A $C_3$-$C_{10}$ cycloalkylene group used herein may refer to a divalent group having the same structure as the $C_3$-$C_{10}$ cycloalkyl group.

A $C_1$-$C_{10}$ heterocycloalkyl group used herein may refer to a monovalent monocyclic group including at least one hetero atom selected from N, O, Si, P, and S as a ring-forming atom and 1 to 10 carbon atoms, and non-limiting examples thereof include a tetrahydrofuranyl group and a tetrahydrothiophenyl group. A $C_1$-$C_{10}$ heterocycloalkylene group used herein may refer to a divalent group having the same structure as the $C_1$-$C_{10}$ heterocycloalkyl group.

A $C_3$-$C_{10}$ cycloalkenyl group as used herein may refer to a monovalent monocyclic group that has 3 to 10 carbon atoms and at least one double bond in its ring, and which is not aromatic. Non-limiting examples thereof include a cyclopentenyl group, a cyclohexenyl group, and a cycloheptenyl group. A $C_3$-$C_{10}$ cycloalkenylene group used herein may refer to a divalent group having the same structure as the $C_3$-$C_{10}$ cycloalkenyl group.

A $C_1$-$C_{10}$ heterocycloalkenyl group used herein may refer to a monovalent monocyclic group including at least one hetero atom selected from N, O, Si, P, and S as a ring-forming atom, 1 to 10 carbon atoms, and at least one double bond in its ring. Non-limiting examples of the $C_1$-$C_{10}$ heterocycloalkenyl group include a 2,3-hydrofuranyl group and a 2,3-hydrothiophenyl group. A $C_1$-$C_{10}$ heterocycloalkenylene group used herein may refer to a divalent group having the same structure as the $C_1$-$C_{10}$ heterocycloalkenyl group.

A $C_6$-$C_{60}$ aryl group used herein may refer to a monovalent group including a carbocyclic aromatic system having 6 to 60 carbon atoms, and a $C_6$-$C_{60}$ arylene group used herein may refer to a divalent group including a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and/or the $C_6$-$C_{60}$ arylene group include a plurality of rings, the respective rings may be fused (e.g., coupled) to each other.

A $C_1$-$C_{60}$ heteroaryl group used herein may refer to a monovalent group having a carbocyclic aromatic system including at least one hetero atom selected from N, O, Si, P, and S as a ring-forming atom and 1 to 60 carbon atoms. A $C_1$-$C_{60}$ heteroarylene group used herein may refer to a divalent group having a carbocyclic aromatic system including at least one hetero atom selected from N, O, P, and S as a ring-forming atom and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and/or the $C_1$-$C_{60}$ heteroarylene group include a plurality of rings, the respective rings may be fused to each other.

A $C_6$-$C_{60}$ aryloxy group used herein may refer to a monovalent group represented by —$OA_{102}$ (where $A_{102}$ is the $C_6$-$C_{60}$ aryl group), and a $C_6$-$C_{60}$ arylthio group used herein may refer to a monovalent group represented by —$SA_{103}$ (where $A_{103}$ is the $C_6$-$C_{60}$ aryl group).

A monovalent non-aromatic condensed polycyclic group used herein may refer to a monovalent group that has a plurality of rings condensed (e.g., fused) to each other, only carbon atoms (for example, the number of carbon atoms may be in a range of 8 to 60) as ring-forming atoms, and does not have overall aromaticity (e.g., the molecular structure as a whole is non-aromatic). A non-limiting example of the monovalent non-aromatic condensed polycyclic group is a fluorenyl group. A divalent non-aromatic condensed polycyclic group used herein may refer to a divalent group having the same structure as the monovalent non-aromatic condensed polycyclic group.

A monovalent non-aromatic condensed heteropolycyclic group used herein may refer to a monovalent group that has two or more rings condensed (e.g., fused) to each other, has at least one hetero atom selected from N, O, Si, P, and S as a ring-form ing atom, and carbon atoms (for example, the number of carbon atoms may be in a range of 1 to 60) as the remaining ring-forming atoms, and does not have overall aromaticity (e.g. the molecular structure as a whole is non-aromatic). A non-limiting examples of the monovalent non-aromatic condensed heteropolycyclic group is a carbazolyl group. A divalent non-aromatic condensed heteropolycyclic group used herein may refer to a divalent group having the same structure as the monovalent non-aromatic condensed hetero-polycyclic group.

Herein, at least one substituent of the substituted anthracenylene group, substituted aromatic ring, substituted non-aromatic condensed polycyclic ring, substituted thiophenylene group, substituted furanylene group, substituted pyrrolylene group, substituted benzothiophenylene group, substituted benzofuranylene group, substituted indolylene group, substituted dibenzothiophenylene group, substituted dibenzofuranylene group, substituted carbazolylene group, substituted thiophenyl group, substituted furanyl group, substituted pyrrolyl group, substituted benzothiophenyl group, substituted benzofuranyl group, substituted indolyl group, substituted dibenzothiophenyl group, substituted dibenzofuranyl group, substituted carbazolyl group, substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), and —B($Q_{14}$)($Q_{15}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), and —B($Q_{24}$)($Q_{25}$); and —Si($Q_{31}$)($Q_{32}$)($Q_{33}$) and —B($Q_{34}$)($Q_{35}$), where $Q_{11}$ to $Q_{15}$, $Q_{21}$ to $Q_{25}$, and $Q_{31}$ to $Q_{35}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

"Ph" used herein may refer to a phenyl group, "Me" may refer to a methyl group, "Et" may refer to an ethyl group, and "ter-Bu" or "But" may refer to a tert-butyl group.

"A biphenyl group" may refer to a monovalent group in which two benzene rings are bound (e.g., coupled) to each other via a single bond, and "a terphenyl group" may refer to a monovalent group in which three benzene rings are bound (e.g., coupled) to each other via single bonds.

Hereinafter, an organic light-emitting device according to an example embodiment will be described in more detail with reference to Synthesis Examples and Examples. The expression "B was used instead of A" used in describing Synthesis Examples may refer to a molar equivalent of A being identical to a molar equivalent of B.

EXAMPLES

Synthesis Example: Synthesis of Compound 1

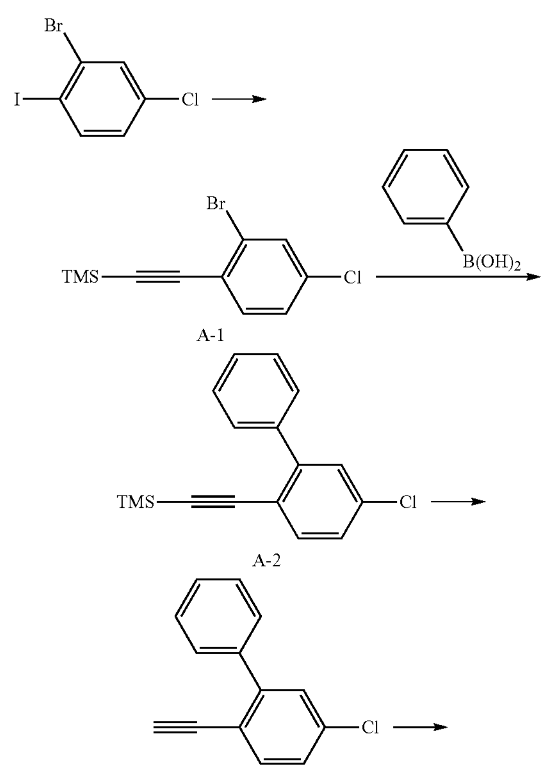

A-1

A-2

A-3

-continued

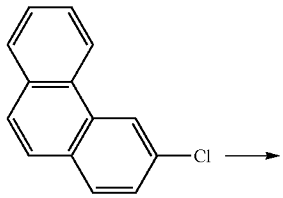

A-4

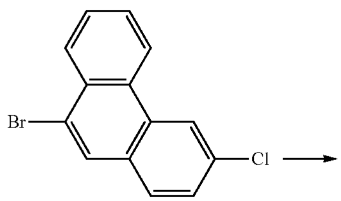

A-5

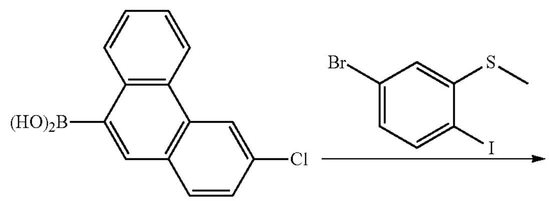

A-6

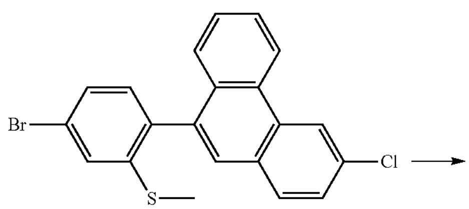

A-7

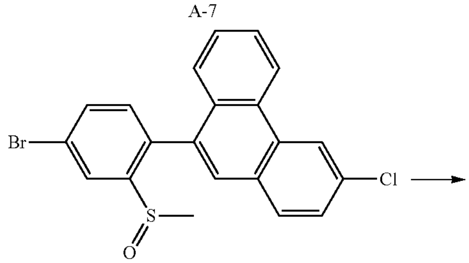

A-8

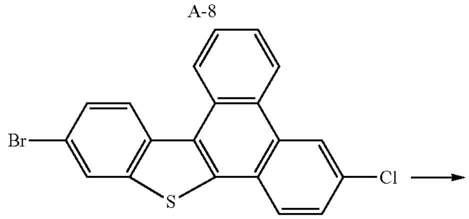

A-9

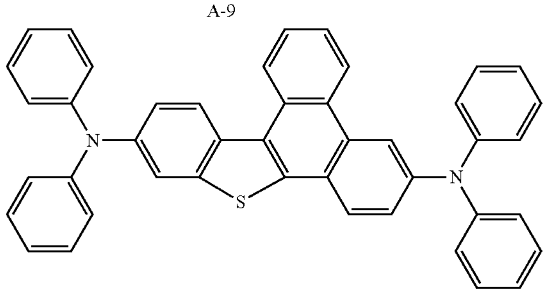

1

Synthesis of Intermediate A-1

40 g (126.0 mmol) of 2-bromo-4-chloro-1-iodobenzene, 1.41 g (6.3 mmol) of $Pd(OAc)_2$, and 1.6 g of (6.3 mmol) $PPh_3$ were mixed with 800 mL of triethylamine, and then stirred at a temperature of about 60° C. under $N_2$ atmosphere for about 12 hours. Once the reaction was complete, the mixture was cooled to room temperature. An organic layer was extracted five times therefrom by using water and diethyl ether. The extracted organic layer was dried by using magnesium sulfate ($MgSO_4$). Then, a solvent was removed therefrom by evaporation. The residual was separated and purified through a silica gel chromatography to obtain 29.0 g (100.8 mmol, yield: 80%) of Intermediate A-1. The obtained compound was identified by Fast Atom Bombardment Mass Spectrometry (MS/FAB).

$C_{11}H_{12}BrClSi$ cal. 287.66, found 287.96.

Synthesis of Intermediate A-2

29.0 g (100.8 mmol) of Intermediate A-1, 13.4 g (110.8 mmol) of phenylboronic acid, 11.6 g (10.0 mmol) of $Pd(PPh_3)_4$, and 27.8 g (201.2 mmol) of $K_2CO_3$ were added to 500 mL of a mixture of $THF/H_2O$ (at a volume ratio of about 9:1), and then stirred at a temperature of about 80° C. for about 12 hours. The mixture was cooled to room temperature, and then, an organic layer was extracted three times therefrom by using water and diethyl ether. The extracted organic layer was dried by using $MgSO_4$. Then, a solvent was removed therefrom by evaporation. The residual was separated and purified through a silica gel chromatography to obtain 20.4 g (71.6 mmol, yield: 75%) of Intermediate A-2. The obtained compound was identified by MS/FAB.

$C_{17}H_{17}ClSi$ cal. 284.86, found 284.08.

Synthesis of Intermediate A-3

20.4 g (71.6 mmol) of Intermediate A-2 and 9.8 g (71.6 mmol) of $K_2CO_3$ were mixed with 900 ml of a mixture of $MeOH/CH_2Cl_2$ (at a volume ratio of about 2:1), followed by stirring for about 1 hour at room temperature. The obtained compound was filtered by using a filter. An organic solvent was removed from the filtrate by evaporation. Then, an organic layer was extracted two times therefrom by using water and dichloromethane. Then, the obtained organic layer was dried by using $MgSO_4$. A solvent was removed therefrom by evaporation, and then the residual was separated and purified through a silica gel chromatography to obtain 13.0 g (61.1 mmol, yield: 85%) of Intermediate A-3. The obtained compound was identified by MS/FAB.

$C_{14}H_9Cl$ cal. 212.68, found 212.04.

Synthesis of Intermediate A-4

13.0 g (61.1 mmol) of Intermediate A-3 was mixed with 800 mL of dichloromethane. Then, 36 mL (600 mmol) of trifluoroacetic acid was slowly added dropwise thereto at a temperature of about 0° C. The temperature of the mixture was raised to room temperature, and 4 mL (60.8 mmol) of methanesulfonic acid was added thereto and stirred at room temperature. Once the reaction was complete, an organic layer was extracted two times therefrom by using water and diethyl ether. Then, the obtained organic layer was dried by using $MgSO_4$. A solvent was removed therefrom by evaporation, and then the residual was separated and purified through a silica gel chromatography to obtain 10.4 g (48.9 mmol, yield: 80%) of Intermediate A-4. The obtained compound was identified by MS/FAB.

$C_{14}H_9Cl$ cal. 212.68, found 212.04.

Synthesis of Intermediate A-5

10.4 g (48.9 mmol) of Intermediate A-4 was mixed with 500 mL of methylene chloride, and then, 588 mg (2.4 mmol) of benzoyl peroxide (BPO) and 8.6 g (48.6 mmol) of N-bromosuccinimide (NBS) was slowly added thereto and stirred at room temperature for about 24 hours. Once the reaction was complete, 500 mL of HCl at a concentration of about 5% was added thereto, followed by addition of 500 mL of water to remove remaining NBS. An organic layer was extracted therefrom by using diethyl ether and water. The obtained organic layer was dried by using $MgSO_4$. A solvent was removed therefrom by evaporation, and then, the residual was separated and purified through a silica gel chromatography to obtain 11.4 g (39.1 mmol, yield: 80%) of Intermediate A-5. The obtained compound was identified by MS/FAB.

$C_{14}H_8BrCl$ cal. 291.57, found 291.95.

Synthesis of Intermediate A-6

11.4 g (39.1 mmol) of Intermediate A-5 was stirred in 500 mL of tetrahydrofuran (THF) at −78° C. for about 10 minutes under $N_2$ atmosphere. 15.6 mL of 2.5 M concentration of n-BuLi was slowly added dropwise thereto by using a dropping funnel, and then, was stirred for additional 30 minutes. Then, 6.09 g (58.7 mmol) of trimethyl borate was slowly added dropwise thereto by using a dropping funnel, and then was stirred for addition 3 hours. Thereafter, 150 mL of HCl solution was added thereto, and an organic layer was extracted therefrom for one time. An organic layer was further extracted from the extracted organic layer three times by using water and diethyl ether. The organic layer was dried by using $MgSO_4$. A solvent was removed therefrom by evaporation. The residual was separated and purified through a silica gel chromatography to obtain 7.03 g (27.4 mmol, yield: 70%) of Intermediate A-6. The obtained compound was identified by MS/FAB.

$C_{14}H_{10}BClO_2$ cal. 256.49, found 256.05.

Synthesis of Intermediate A-7

5.7 g (19.4 mmol) of Intermediate A-6, 7.0 g (21.3 mmol) of (4-bromo-2-iodophenyl)(methyl)sulfane, 2.24 g (1.94 mmol) of $Pd(PPh_3)_4$, and 3.1 g (2.3 mmol) of $K_2CO_3$ were added to 400 mL of a mixture of THF/$H_2O$ (at a volume ratio of about 9:1) and stirred at a temperature of about 80° C. for about 12 hours. The temperature was cooled to room temperature, and an organic layer was extracted therefrom three times by using water and diethyl ether. The obtained organic layer was dried by using $MgSO_4$. Then, a solvent was removed therefrom by evaporation. The residual was separated and purified through a silica gel chromatography to obtain 7.2 g (17.5 mmol, yield: 90%) of Intermediate A-7. The obtained compound was identified by MS/FAB.

$C_{21}H_{14}BrCl_2S$ cal. 413.76, found 413.97.

Synthesis of Intermediate A-8

7.2 g (17.5 mmol) of Intermediate A-7 and 100 mL of acetic acid were mixed, and 2.2 g (19.2 mmol) of hydrogen peroxide (30 wt % in $H_2O$) was added thereto and stirred for about 6 hours at room temperature. Once the reaction was complete, the acetic acid was removed therefrom under reduced pressure. The residual was separated and purified through a silica gel chromatography to obtain 5.3 g (12.3 mmol, yield: 70%) of Intermediate A-8. The obtained compound was identified by MS/FAB.

$C_{21}H_{14}BrCl_2OS$ cal. 429.76, found 429.96.

Synthesis of Intermediate A-9

5.3 g (12.3 mmol) of Intermediate A-8 and 100 mL of methylene chloride were mixed, and then 1.8 g (12.3 mmol) of trifluoromethanesulfonic acid was added thereto and stirred at room temperature for about 24 hours. Then, 100 mL of a mixture of water and pyridine (at a volume ratio of about 8:1) was added thereto and stirred for about 1 hour. Once the reaction was complete, an organic layer was extracted therefrom two times by using water and dichloromethane. The obtained organic layer was dried by using $MgSO_4$. Then, a solvent was removed therefrom by evaporation. The residual was separated and purified through a silica gel chromatography to obtain 3.2 g (8.0 mmol, yield: 80%) of Intermediate A-9. The obtained compound was identified by MS/FAB.

$C_{20}H_{10}BrClS$ cal. 397.71, found 395.94.

Synthesis of Compound 1

700 mg (1.76 mmol) of Intermediate A-9, 740 mg (4.4 mmol) of diphenylamine, 156 mg (0.18 mmol) of tris (dibenzylideneacetone)dipalladium(0), 35 mg (0.18 mmol) of tri(tert-butyl)phosphine, and 423 mg (4.4 mmol) of sodium tert-butoxide were added to 20 mL of toluene and stirred at a temperature of about 80° C. for about 2 hours. The resultant was cooled to room temperature, and an organic layer was extracted therefrom two times by using water and diethyl ether. The obtained organic layer was dried by using $MgSO_4$. A solvent was removed therefrom by evaporation. The residual was separated and purified through a silica gel chromatography to obtain 762 mg (1.2 mmol, yield: 70%) of Compound 1. The obtained compound was identified by MS/FAB.

$C_{44}H_{30}N_2S$ cal. 618.80, found 618.21.

Synthesis Example 2: Synthesis of Compound 127

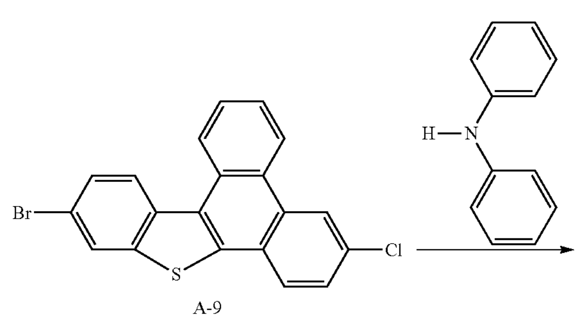

-continued

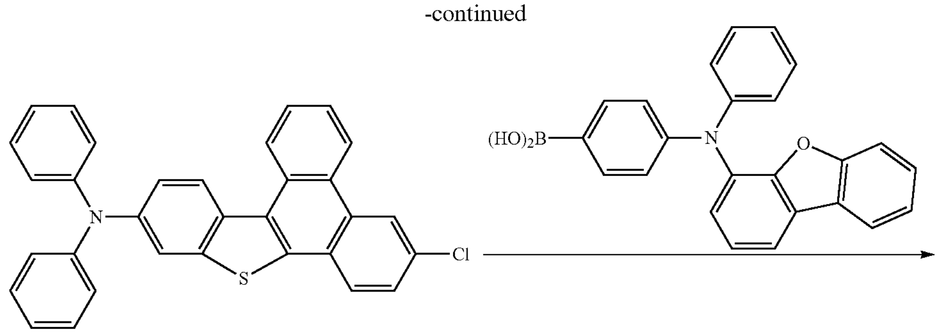

A-10

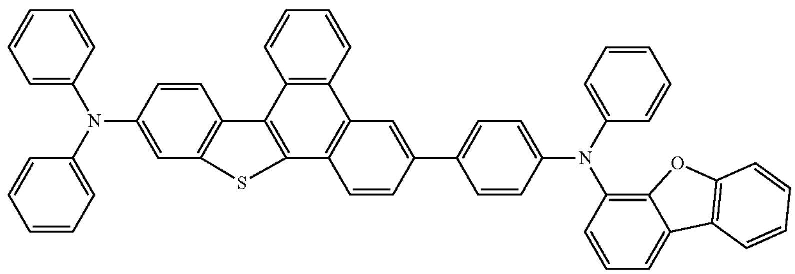

127

Synthesis of Intermediate A-10

600 mg (1.5 mmol) of Intermediate A-9, 254 mg (1.5 mmol) of diphenylamine, 137 mg (0.15 mmol) of tris (dibenzylideneacetone)dipalladium(0), 30 mg (0.15 mmol) of tri(tert-butyl)phosphine, and 211 mg (2.2 mmol) of sodium tert-butoxide were added to 40 mL of toluene and stirred at a temperature of about 80° C. for about 2 hours. The resultant was cooled to room temperature, and an organic layer was extracted therefrom three times by using water and diethyl ether. The obtained organic layer was dried by using $MgSO_4$. Then, a solvent was removed therefrom by evaporation. The residual was separated and purified through a silica gel chromatography to obtain 656 mg (1.35 mmol, yield: 90%) of Intermediate A-10. The obtained compound was identified by MS/FAB.

$C_{32}H_{20}ClNS$ cal. 486.03, found 485.10.

Synthesis of Compound 127

656 mg (1.35 mmol) of Intermediate A-10, 580 mg (1.53 mmol) of (4-(dibenzo[b,d]furan-4-yl(phenyl)amino)phenyl) boronic acid, 173 mg (0.15 mmol) of $Pd(PPh_3)_4$, and 304 mg (2.2 mmol) of $K_2CO_3$ were added to 40 mL of a mixture of $THF/H_2O$ (at a volume ratio of about 9:1) and stirred for about 12 hours at a temperature of about 80° C. The resultant was cooled to room temperature, and an organic layer was extracted therefrom three times by using water and diethyl ether. The obtained organic layer was dried by using $MgSO_4$. A solvent was removed therefrom by evaporation. The residual was separated and purified through a silica gel chromatography to obtain 887 mg (1.13 mmol, yield: 84%) of Compound 127. The obtained compound was identified by MS/FAB.

$C_{56}H_{36}N_2OS$ cal. 784.98, found 784.25.

Synthesis Example 3: Synthesis of Compound 1A

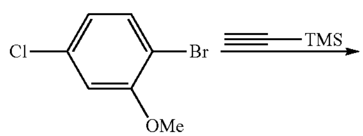

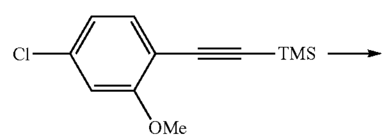

B-1

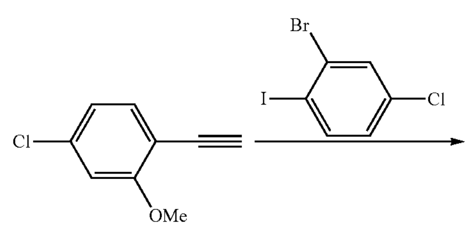

B-2

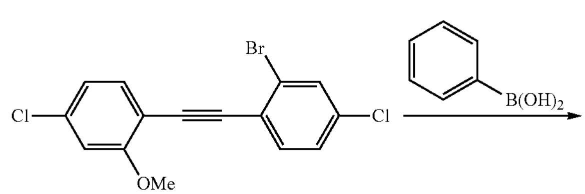

B-3

-continued

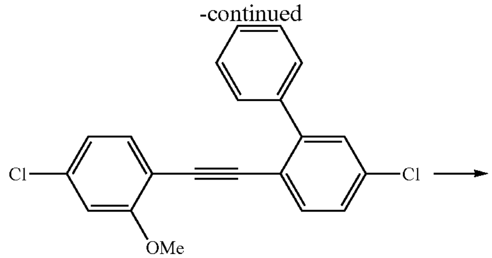

B-4

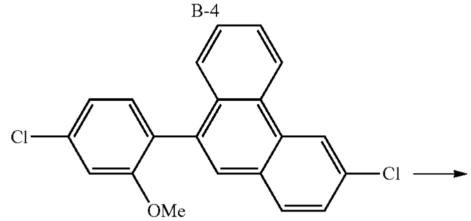

B-5

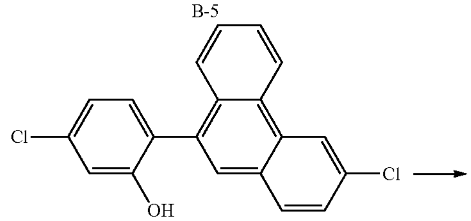

B-6

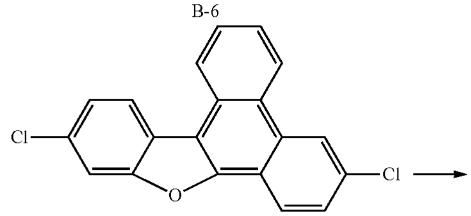

B-7

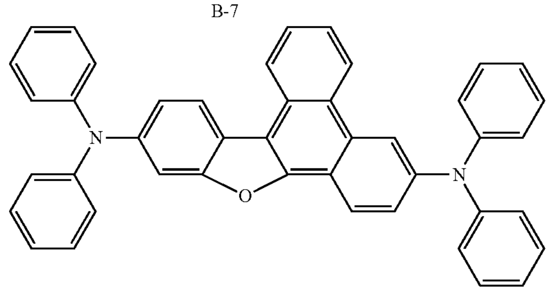

1A

Synthesis of Intermediate B-1

25 g (113 mmol) of 1-bromo-4-chloro-2-methoxybenzene, 19.1 mL (135 mmol) of ethynyltrimethylsilane, 3.96 g (5.6 mmol) of $Pd(PPh_3)_2Cl_2$, and 2.15 g (11.3 mmol) of CuI were mixed with 100 mL of triethylamine and was stirred at a temperature of about 60° C. under $N_2$ atmosphere for about 12 hours. The obtained compound was cooled to room temperature, and an organic layer was extracted therefrom five times by using water and diethyl ether. The obtained organic layer was dried by using $MgSO_4$. A solvent was removed therefrom by evaporation. The residual was separated and purified through a silica gel chromatography to obtain 22.9 g (96 mmol, yield: 85%) of Intermediate B-1. The obtained compound was identified by MS/FAB.

$C_{12}H_{15}ClOSi$ cal. 238.79, found 238.06.

Synthesis of Intermediate B-2

22.9 g (96 mmol) of Intermediate B-1 and 13.8 g (100 mmol) of $K_2CO_3$ were mixed with 600 ml of a mixture of $MeOH/CH_2Cl_2$ (at a volume ratio of about 2:1), followed by stirring for about 1 hour at room temperature. The obtained mixture was filtered by using a filter, and an organic solvent in the filtrate was removed by evaporation under reduced pressure. An organic layer was extracted from the obtained residual two times by using water and dichloromethane. The organic layer was dried by using $MgSO_4$. A solvent was removed therefrom, and the residual was separated and purified through a silica gel chromatography to obtain 15.5 g (92.9 mmol, yield: 97%) of Intermediate B-2. The obtained compound was identified by MS/FAB.

$C_9H_7ClO$ cal. 166.60, found 166.02.

Synthesis of Intermediate B-3

15.5 g (92.9 mmol) of Intermediate B-2, 26.8 g (84.4 mmol) of 2-bromo-4-chloro-1-iodobenzene, 5.4 g (4.64 mmol) of $Pd(PPh_3)_4$, 1.8 g (9.29 mmol) of CuI, and 52 mL (37.1 mmol) of triethyl amine were dissolved in 500 mL of N-dimethyl formamide (DMF) and stirred at a temperature of about 40° C. under $N_2$ atmosphere. The obtained compound was cooled to room temperature, and an organic layer was extracted therefrom three times by using water and diethyl ether. The obtained organic layer was dried by using $MgSO_4$. A solvent was removed therefrom by evaporation. The residual was separated and purified through a silica gel chromatography to obtain 22.5 g (63.2 mmol, yield 68%) of Intermediate B-3. The obtained compound was identified by MS/FAB.

$C_{15}H_9BrCl_2O$ cal. 356.04, found 355.92.

Synthesis of Intermediate B-4

Intermediate B-3 (8.1 g, 22.8 mmol), phenylboronic acid (phenylboronic acid) (3.0 g, 34.1 mmol), 1.3 g (1.14 mmol) OF $Pd(PPh_3)_4$, and 12.6 g (91 mmol) of $K_2CO_3$ were mixed with 150 mL of a mixture of $THF/H_2O$ (at a volume ratio of about 9:1) and stirred at a temperature of about 60° C. for about 12 hours. The resultant was cooled to a room temperature, and then, an organic layer was extracted three times therefrom by using water and diethyl ether. The extracted organic layer was dried by using $MgSO_4$. Then, a solvent was removed therefrom by evaporation. The residual was separated and purified through a silica gel chromatography to obtain 13.1 g (37.1 mmol, yield: 81%) of Intermediate B-4. The obtained compound was identified by MS/FAB.

$C_{21}H_{14}Cl_2O$ cal. 353.24, found 352.04.

Synthesis of Intermediate B-5

4.0 g (11.3 mmol) of Intermediate B-4 was mixed with 500 mL of dichloromethane, and 12.9 g (113.2 mmol) of trifluoroacetic acid was slowly added dropwise thereto at a temperature of about 0° C. The temperature of the mixture was raised to room temperature, and then 0.74 mL (11.3 mmol) of methanesulfonic acid was added thereto and stirred at room temperature. Once the reaction was complete, an organic layer was extracted therefrom two times by using water and diethyl ether. The obtained organic layer was dried by using $MgSO_4$. A solvent was removed therefrom by evaporation. The residual was separated and purified through a silica gel chromatography to obtain 3.14 g (8.6 mmol, yield: 76%) of Intermediate B-5. The obtained compound was identified by MS/FAB.

$C_{21}H_{14}Cl_2O$ cal. 353.24, found 352.04.

Synthesis of Intermediate B-6

3.16 g (8.9 mmol) of Intermediate B-5 and 100 mL of dichloromethane were mixed, and then, $BBr_3$ was slowly added dropwise thereto at a temperature of about 0° C. Once the reaction was complete, aqueous $NaHCO_3$ solution was slowly added thereto at a temperature of about 0° C. to end the reaction. An organic layer was extracted therefrom three times by using water and dichloromethane. The obtained organic layer was dried by using $MgSO_4$. A solvent was removed therefrom by evaporation. The residual was separated and purified through a silica gel chromatography to obtain 2.72 g (8.0 mmol, yield: 90%) of Intermediate B-6. The obtained compound was identified by MS/FAB.

$C_{20}H_{12}Cl_2O$ cal. 339.22, found 338.03.

Synthesis of Intermediate B-7

2.72 g (8.0 mmol) of Intermediate B-6 and 3.4 g (24.0 mmol) of copper(I) oxide were added to 250 mL of nitrobenzene and stirred at a temperature of about 190° C. for about 48 hours. Once the reaction was complete, the resultant was cooled to room temperature, and an organic layer was extracted therefrom four times by using water and diethyl ether. The obtained organic layer was dried using $MgSO_4$. A solvent was removed therefrom by evaporation. The residual was separated and purified through a silica gel chromatography to obtain 1.33 g (5.6 mmol, yield: 62%) of Intermediate B-7. The obtained compound was identified by MS/FAB.

$C_{20}H_{10}Cl_2O$ cal. 337.20, found 336.01.

Synthesis of Compound 1A 600 mg (1.78 mmol) of Intermediate B-7, 740 mg (4.4 mmol) of diphenylamine, 156 mg (0.18 mmol) of tris(dibenzylideneacetone)dipalladium(0), 35 mg (0.18 mmol) of tri(tert-butyl)phosphine, and 423 mg (4.4 mmol) of sodium tert-butoxide were added to 20 mL of toluene and stirred at a temperature of about 80° C. for about 2 hours. The resultant was cooled to room temperature, and an organic layer was extracted therefrom two times by using water and diethyl ether. The obtained organic layer was dried by using $MgSO_4$. A solvent was removed therefrom by evaporation. The residual was separated and purified through a silica gel chromatography to obtain 858 mg (1.42 mmol, yield: 70%) of Compound 1 Å. The obtained compound was identified by MS/FAB.

$C_{44}H_{30}N_2O$ cal. 602.74, found 602.24.

Synthesis Example 4: Synthesis of Compound 144A

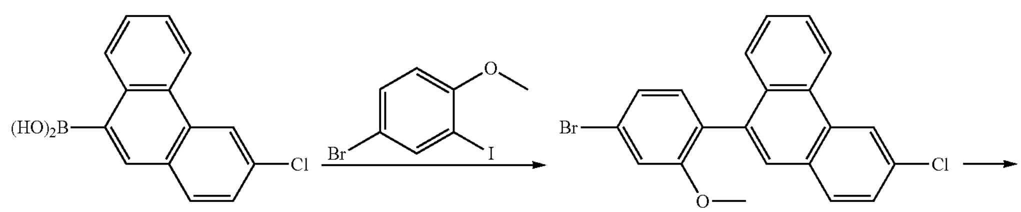

A-6 B-8

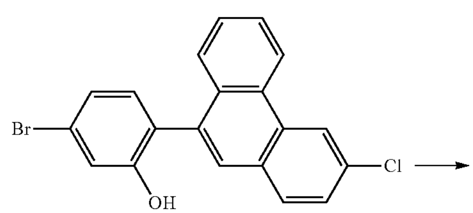

B-9

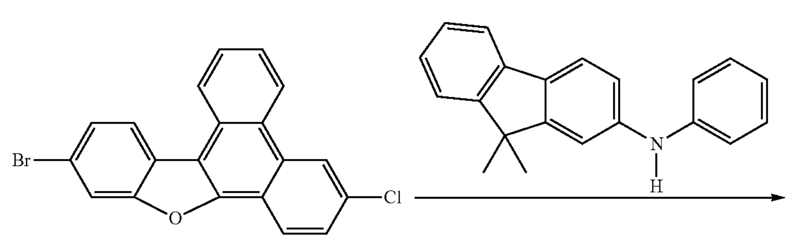

B-10

-continued

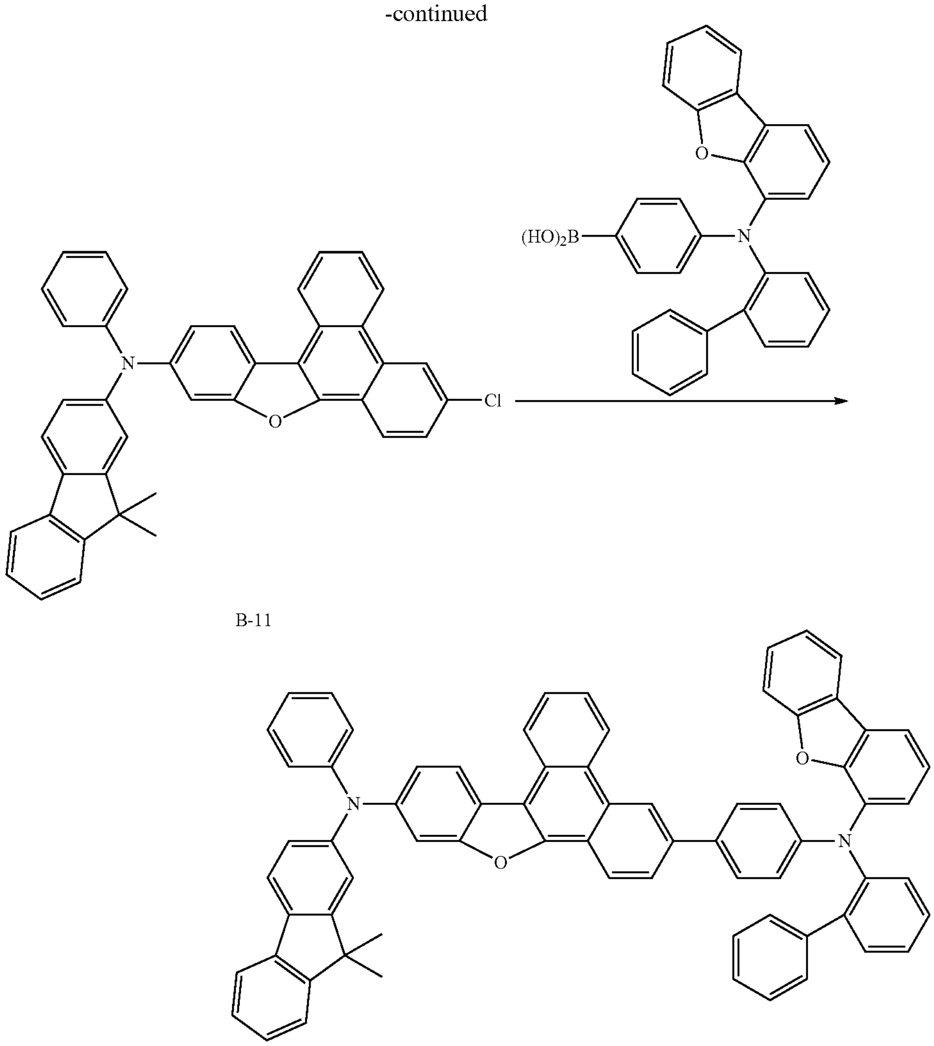

B-11

144A

Synthesis of Intermediate B-8

1.6 g (4 mmol, yield: 84%) of Intermediate B-8 was obtained in the same (or substantially the same) manner used to synthesize Intermediate A-7 in Synthesis Example 1, except that 4-bromo-2-iodo-1-methoxybenzene was used instead of (4-bromo-2-iodophenyl)(methyl)sulfane. The obtained compound was identified by MS/FAB.

$C_{21}H_{14}BrClO$ cal. 397.70, found 395.99.

Synthesis of Intermediate B-9

1.23 g of (3.2 mmol, yield: 80%) of Intermediate B-9 was obtained in the same (or substantially the same) manner used to synthesize Intermediate A-8 in Synthesis Example 1, except that Intermediate B-8 was used instead of Intermediate A-7. The obtained compound was identified by MS/FAB.

$C_{20}H_{12}BrClO$ cal. 383.67, found 383.97.

Synthesis of Intermediate B-10

1.04 g of (2.7 mmol, yield: 85%) of Intermediate B-10 was obtained in the same (or substantially the same) manner used to synthesize Intermediate A-9 in Synthesis Example 1, except that Intermediate B-9 was used instead of Intermediate A-8. The obtained compound was identified by MS/FAB.

$C_{20}H_{10}BrClO$ cal. 381.65, found 379.96.

Synthesis of Intermediate B-11

1.04 g (1.32 mmol, yield: 84%) of Intermediate B-11 was obtained in the same (or substantially the same) manner used to synthesize Intermediate A-10 in Synthesis Example 2, except that 600 mg (1.57 mmol) of Intermediate B-10 was used instead of Intermediate A-9, and 9,9-dimethyl-N-phenyl-9H-fluoren-2-amine was used instead of diphenylamine. The obtained compound was identified by MS/FAB.

$C_{41}H_{28}ClNO$ cal. 586.13, found 585.19.

Synthesis of Compound 144A 939 mg (0.98 mmol, yield: 74%) of Compound 144A was obtained in the same (or substantially the same) manner used to synthesize Compound 127 in Synthesis Example 2, except that 1.04 g (1.32 mmol) of Intermediate B-11 was used instead of Intermediate A-10, and (4-([1,1'-biphenyl]-

2-yl(dibenzo[b,d]furan-4-yl)amino)phenyl)boronic acid was used instead of (4-(dibenzo[b,d]furan-4-yl(phenyl)amino)phenyl)boronic acid. The obtained compound was identified by MS/FAB.

$C_{71}H_{48}N_2O_2$ cal. 961.18, found 960.37.

Synthesis Example 5: Synthesis of Compound 2

753 mg (0.88 mmol, yield: 82%) of Compound 2 was obtained in the same (or substantially the same) manner used to synthesize Compound 1 in Synthesis Example 1, except that 9,9-dimethyl-N-phenyl-9H-fluoren-2-amine was used instead of diphenylamine. The obtained compound was identified by mass spectroscopy/fast atom bombardment (MS/FAB) and $^1$H NMR.

$C_{62}H_{46}N_2S$ cal. 851.12, found 850.34.

Synthesis Example 6: Synthesis of Compound 7

753 mg (0.88 mmol, yield: 82%) of Compound 7 was obtained in the same (or substantially the same) manner used to synthesize Compound 1 in Synthesis Example 1, except that N-([1,1'-biphenyl]-2-yl)pyridin-3-amine was used instead of diphenylamine. The obtained compound was identified by MS/FAB and $^1$H NMR.

$C_{54}H_{36}N_4S$ cal. 772.97, found 772.27.

Synthesis Example 7: Synthesis of Compound 9

650 mg (0.90 mmol, yield: 79%) of Compound 9 was obtained in the same (or substantially the same) manner used to synthesize Compound 1 in Synthesis Example 1, except that N-phenylnaphthalen-2-amine was used instead of diphenylamine. The obtained compound was identified by MS/FAB and $^1$H NMR.

$C_{52}H_{34}N_2S$ cal. 718.92, found 718.24.

Synthesis Example 8: Synthesis of Compound 10

650 mg (0.65 mmol, yield: 69%) of Compound 10 was obtained in the same (or substantially the same) manner used to synthesize Compound 1 in Synthesis Example 1, except that 9,9-dimethyl-N-(4-(trimethylsilyl)phenyl)-9H-fluoren-2-amine was used instead of diphenylamine. The obtained compound was identified by MS/FAB and $^1$H NMR.

$C_{68}H_{62}N_2SSi_2$ cal. 995.49, found 994.42.

Synthesis Example 9: Synthesis of Compound 13

782 mg (0.82 mmol, yield: 74%) of Compound 13 was obtained in the same (or substantially the same) manner used to synthesize Compound 1 in Synthesis Example 1, except that 5'-fluoro-N-phenyl-[1,1':3',1''-terphenyl]-4'-amine was used instead of diphenylamine. The obtained compound was identified by MS/FAB and $^1$H NMR.

$C_{68}H_{44}F_2N_2S$ cal. 959.17, found 958.32.

Synthesis Example 10: Synthesis of Compound 15

485 mg (0.51 mmol, yield: 77%) of Compound 15 was obtained in the same (or substantially the same) manner used to synthesize Compound 1 in Synthesis Example 1, except that N-([1,1'-biphenyl]-2-yl)dibenzo[b,d]furan-4-amine was used instead of diphenylamine. The obtained compound was identified by MS/FAB and $^1$H NMR.

$C_{68}H_{42}N_2O_2S$ cal. 951.16, found 950.30.

Synthesis Example 11: Synthesis of Compound 16

839 mg (0.76 mmol, yield: 54%) of Compound 16 was obtained in the same (or substantially the same) manner used to synthesize Compound 1 in Synthesis Example 1, except that N-([1,1'-biphenyl]-2-yl)-6-phenyldibenzo[b,d]furan-4-amine was used instead of diphenylamine. The obtained compound was identified by MS/FAB and $^1$H NMR.

$C_{80}H_{50}N_2O_2S$ cal. 1103.35, found 1102.36.

Synthesis Example 12: Synthesis of Compound 19

535 mg (0.67 mmol, yield: 88%) of Compound 19 was obtained in the same (or substantially the same) manner used to synthesize Compound 1 in Synthesis Example 1, except that N-phenyldibenzo[b,d]furan-2-amine was used instead of diphenylamine. The obtained compound was identified by MS/FAB and $^1$H NMR.

$C_{56}H_{34}N_2O_2S$ cal. 798.96, found 798.23.

Synthesis Example 13: Synthesis of Compound 26

860 mg (1.77 mmol) of Intermediate A-10, 524 mg (1.95 mmol) of N-phenylphenanthren-2-amine, 156 mg (0.18 mmol) of tris(dibenzylideneacetone)dipalladium(0), 35 mg (0.18 mmol) of tri(tert-butyl)phosphine, and 423 mg (4.4 mmol) of sodium tert-butoxide were mixed with 20 mL of toluene and stirred at a temperature of about 80° C. for about 2 hours. The obtained organic layer was dried by using $MgSO_4$. A solvent was removed therefrom by evaporation. The residual was separated and purified through a silica gel chromatography to obtain 1.04 g (1.45 mmol, yield: 82%) of Compound 26. The obtained compound was identified by MS/FAB and $^1$H NMR.

$C_{52}H_{34}N_2S$ cal. 718.92, found 718.24.

Synthesis Example 14: Synthesis of Compound 29

500 mg (1.03 mmol) of Intermediate A-10, 419 mg (1.23 mmol) of 5'-fluoro-N-phenyl-[1,1':3',1''-terphenyl]-4'-amine, 91.6 mg (0.10 mmol) of tris(dibenzylideneacetone)dipalladium(0), 20 mg (0.10 mmol) of tri(tert-butyl)phosphine, and 192 mg (2 mmol) of sodium tert-butoxide were added to 20 mL of toluene and stirred at a temperature of about 80° C. for about 2 hours. The obtained organic layer was dried by using $MgSO_4$. A solvent was removed therefrom by evaporation. The residual was separated and purified through a silica gel chromatography to obtain 560 mg (0.71 mmol, yield: 69%) of Compound 29. The obtained compound was identified by MS/FAB and $^1$H NMR.

$C_{56}H_{37}FN_2S$ cal. 788.98, found 788.27.

Synthesis Example 15: Synthesis of Compound 30

461 mg (0.57 mmol, yield: 55%) of Compound 30 was obtained in the same (or substantially the same) manner as used in Synthesis Example 14, except that 4-((5'-fluoro-[1,1':3',1''-terphenyl]-4'-yl)amino)benzonitrile was used instead of 5'-fluoro-N-phenyl-[1,1':3',1"-terphenyl]-4'-amine. The obtained compound was identified by MS/FAB and $^1$H NMR.

$C_{57}H_{36}FN_3S$ cal. 813.99, found 813.26.

Synthesis Example 16: Synthesis of Compound 38

Synthesis of Intermediate A-10(1)

800 mg (2.01 mmol) of Intermediate A-9, 485 mg (2.01 mmol) of N-phenyl-4-(trimethylsilyl)aniline, 156 mg (0.18 mmol) of tris(dibenzylideneacetone)dipalladium(0), 35 mg (0.18 mmol) of tri(tert-butyl)phosphine, and 423 mg (4.4 mmol) of sodium tert-butoxide were added to 20 mL of toluene and stirred at a temperature of about 80° C. for about 2 hours. The resultant was cooled to room temperature, and an organic layer was extracted therefrom two times by using water and diethyl ether. The obtained organic layer was dried using $MgSO_4$. A solvent was removed therefrom by evaporation. The residual was separated and purified through a silica gel chromatography to obtain 774 mg (1.39 mmol, yield: 69%) of Intermediate A-10(1).

A-10(1)

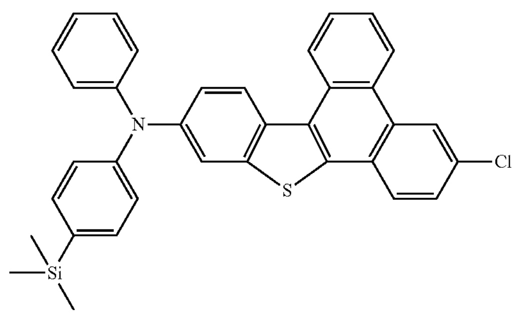

Synthesis of Compound 38

774 mg (1.39 mmol) of Intermediate A-10(1), 559 mg (1.67 mmol) of N—([1,1'-biphenyl]-2-yl)dibenzo[b,d]furan-4-amine, 91.6 mg (0.10 mmol) of tris(dibenzylideneacetone)dipalladium(0), 20 mg (0.10 mmol) of tri(tert-butyl)phosphine, and 192 mg (2 mmol) of sodium tert-butoxide were added to 20 mL of toluene and stirred at a temperature of about 80° C. for about 2 hours. The obtained organic layer was dried by using $MgSO_4$. A solvent was removed therefrom by evaporation. The residual was separated and purified through a silica gel chromatography to obtain 786 mg (0.92 mmol, yield: 66%) of Compound 38. The obtained compound was identified by MS/FAB and $^1$H NMR.

$C_{59}H_{44}N_2OSSi$ cal. 857.16, found 856.29.

Synthesis Example 17: Synthesis of Compound 54

Synthesis of Intermediate A-10(2)

825 mg (1.47 mmol, yield: 73%) of Intermediate A-10(2) was obtained in the same (or substantially the same) manner used to synthesize Intermediate A-10(1) in Synthesis Example 16, except that N-phenyl-[1,1'-biphenyl]-2-amine was used instead of N-phenyl-4-(trimethylsilyl)aniline.

A-10(2)

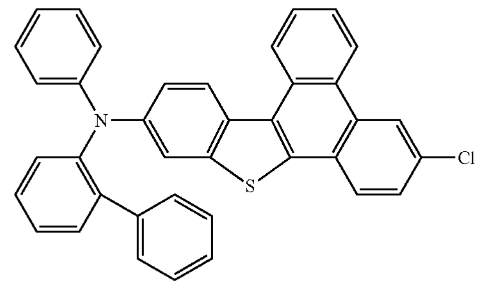

Synthesis of Compound 54

825 mg (1.47 mmol) of Intermediate A-10(2), 366 mg (1.67 mmol) of N-phenylnaphthalen-2-amine, 91.6 mg (0.10 mmol) of tris(dibenzylideneacetone)dipalladium(0), 20 mg (0.10 mmol) of tri(tert-butyl)phosphine, and 192 mg (2 mmol) of sodium tert-butoxide were added to 20 mL of toluene and stirred at a temperature of about 80° C. for about 2 hours. The obtained organic layer was dried by using $MgSO_4$. A solvent was removed therefrom by evaporation. The residual was separated and purified through a silica gel chromatography to obtain 712 mg (0.96 mmol, yield: 65%) of Compound 54. The obtained compound was identified by MS/FAB and $^1$H NMR.

$C_{54}H_{36}N_2S$ cal. 744.96, found 744.26.

Synthesis Example 18: Synthesis of Compound 57

847 mg (1.51 mmol) of Intermediate A-10(2), 669 mg (1.85 mmol) of N-([1,1'-biphenyl]-2-yl)-9,9-dimethyl-9H-fluoren-2-amine, 183 mg (0.20 mmol) of tris(dibenzylideneacetone)dipalladium(0), 40 mg (0.20 mmol) of tri(tert-butyl)phosphine, and 288 mg (3 mmol) of sodium tert-butoxide were added to 20 mL of toluene and stirred at a temperature of about 80° C. for about 2 hours. The obtained organic layer was dried by using $MgSO_4$. A solvent was removed therefrom by evaporation. The residual was separated and purified through a silica gel chromatography to obtain 1.18 g (1.33 mmol, yield: 88%) of Compound 57. The obtained compound was identified by MS/FAB and $^1$H NMR.

$C_{65}H_{46}N_2S$ cal. 887.16, found 886.34.

Synthesis Example 19: Synthesis of Compound 72

Synthesis of Intermediate A-10(3)

1.00 mg (1.75 mmol, yield: 87%) of Intermediate A-10(3) was obtained in the same (or substantially the same) manner used to synthesize Intermediate A-10(1) in Synthesis Example 16, except that N-phenyldibenzo[b,d]furan-4-amine was used instead of N-phenyl-4-(trimethylsilyl)aniline.

A-10(3)

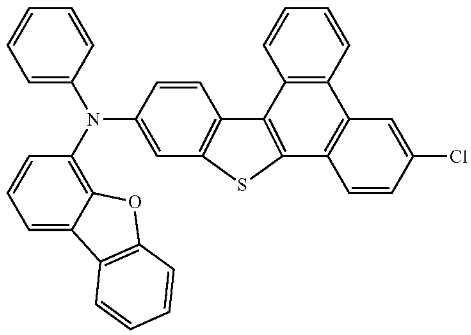

Synthesis of Compound 72

1.00 g (1.75 mmol) of Intermediate A-10(3), 528 mg (1.85 mmol) of 9,9-dimethyl-N-phenyl-9H-fluoren-2-amine, 183 mg (0.20 mmol) of tris(dibenzylideneacetone)dipalladium (0), 40 mg (0.20 mmol) of tri(tert-butyl)phosphine, and 288 mg (3 mmol) of sodium tert-butoxide were added to 20 mL of toluene and stirred at a temperature of about 80° C. for about 2 hours. The obtained organic layer was dried by using $MgSO_4$. A solvent was removed therefrom by evaporation. The residual was separated and purified through a silica gel chromatography to obtain 1.27 g (1.54 mmol, yield: 88%) of Compound 72. The obtained compound was identified by MS/FAB and $^1H$ NMR.

$C_{59}H_{40}N_2OS$ cal. 825.04, found 824.29.

Synthesis Example 20: Synthesis of Compound 88

Synthesis of Intermediate A-10(4)

1.14 g (1.75 mmol, yield: 87%) of Intermediate A-10(4) was obtained in the same (or substantially the same) manner used to synthesize Intermediate A-10(1) in Synthesis Example 16, except that N-([1,1'-biphenyl]-2-yl)dibenzo[b,d]furan-4-amine was used instead of N-phenyl-4-(trimethylsilyl)aniline.

A-10(4)

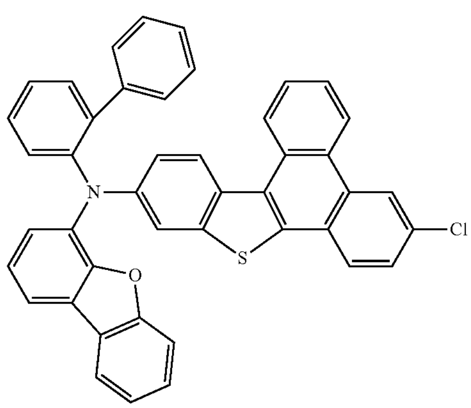

Synthesis of Compound 88

1.23 g (1.37 mmol, yield: 78%) of Compound 88 was obtained in the same (or substantially the same) manner used to synthesize Compound 72 in Synthesis Example 19, except that Intermediate A-10(4) was used instead of Intermediate A-10(3). The obtained compound was identified by MS/FAB and $^1H$ NMR.

$C_{65}H_{44}N_2OS$ cal. 901.14, found 900.32.

Synthesis Example 21: Synthesis of Compound 90

1.14 g (1.19 mmol, yield: 68%) of Compound 90 was obtained in the same (or substantially the same) manner used to synthesize Compound 72 in Synthesis Example 19, except that Intermediate A-10(4) was used instead of Intermediate A-10(3), and 5'-fluoro-N-phenyl-[1,1':3',1"-terphenyl]-4'-amine was used instead of 9,9-dimethyl-N-phenyl-9H-fluoren-2-amine. The obtained compound was identified by MS/FAB and $^1H$ NMR.

$C_{68}H_{43}FN_2OS$ cal. 955.16, found 954.31.

Synthesis Example 22: Synthesis of Compound 129

Synthesis of Intermediate A-10(5)

916 mg (1.71 mmol, yield: 85%) of Intermediate A-10(5) was obtained in the same (or substantially the same) manner used to synthesize Intermediate A-10(1) in Synthesis Example 16, except that N-phenylnaphthalen-2-amine was used instead of N-phenyl-4-(trimethylsilyl)aniline.

A-10(5)

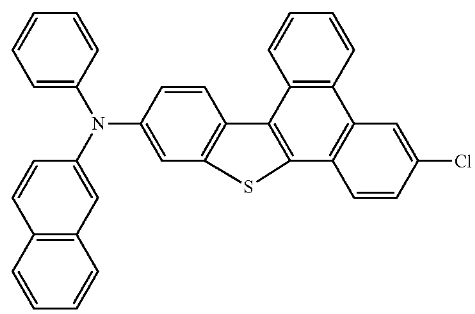

Synthesis of Compound 129

916 mg (1.71 mmol) of Intermediate A-10(5), 758 mg (2.0 mmol) of (4-(dibenzo[b,d]furan-4-yl(phenyl)amino)phenyl) boronic acid, 196 mg (0.17 mmol) of $Pd(PPh_3)_4$, and 473 mg (3.4 mmol) of $K_2CO_3$ were added to 50 mL of a mixture of $THF/H_2O$ (at a volume ratio of about 9:1) and stirred at a temperature of about 80° C. for about 12 hours. The resultant was cooled to room temperature, and an organic layer was extracted therefrom three times by using water and diethyl ether. The obtained organic layer was dried by using $MgSO_4$. A solvent was removed therefrom by evaporation. The residual was separated and purified through a silica gel chromatography to obtain 1.20 g (1.44 mmol, yield: 84%) of Compound 129. The obtained compound was identified by MS/FAB.

$C_{60}H_{38}N_2OS$ cal. 835.04, found 834.27.

Synthesis Example 23: Synthesis of Compound 134

Synthesis of Intermediate A-10(6)

908 mg (1.50 mmol, yield: 75%) of Intermediate A-10(6) was obtained in the same (or substantially the same) manner used to synthesize Intermediate A-10(1) in Synthesis Example 16, except that 9,9-dimethyl-N-phenyl-9H-fluoren-2-amine was used instead of N-phenyl-4-(trimethylsilyl) aniline.

A-10(6)

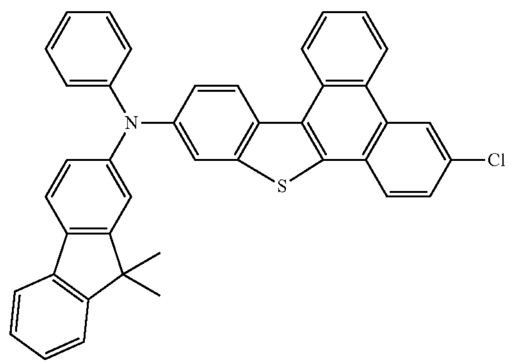

Synthesis of Compound 134

908 mg (1.50 mmol) of Intermediate A-10(6), 758 mg (2.0 mmol) of (4-(dibenzo[b,d]furan-4-yl(phenyl)amino)phenyl) boronic acid, 196 mg (0.17 mmol) of $Pd(PPh_3)_4$, and 473 mg (3.4 mmol) of $K_2CO_3$ were added to 50 mL of a mixture of $THF/H_2O$ (at a volume ratio of about 9:1) and stirred at a temperature of about 80° C. for about 12 hours. The resultant was cooled to room temperature, and an organic layer was extracted therefrom three times by using water and diethyl ether. The obtained organic layer was dried by using $MgSO_4$. A solvent was removed therefrom by evaporation. The residual was separated and purified through a silica gel chromatography to obtain 1.08 g (1.40 mmol, yield: 80%) of Compound 134. The obtained compound was identified by MS/FAB.

$C_{65}H_{44}N_2OS$ cal. 901.14, found 900.32.

Synthesis Example 24: Synthesis of Compound 140

1.33 g (1.42 mmol, yield: 80%) of Compound 140 was obtained in the same (or substantially the same) manner used to synthesize Compound 129 in Synthesis Example 22, except that Intermediate A-10(2) was used instead of Intermediate A-10(5), and (4-([1,1'-biphenyl]-2-yl(dibenzo[b,d]furan-4-yl)amino)phenyl)boronic acid was used instead of (4-(dibenzo[b,d]furan-4-yl(phenyl)amino)phenyl)boronic acid. The obtained compound was identified by MS/FAB.

$C_{68}H_{44}N_2OS$ cal. 937.17, found 936.32.

Synthesis Example 25: Synthesis of Compound 167

800 mg (2.01 mmol) of Intermediate A-9, 1.45 g (5.0 mmol) of (4-(diphenylamino)phenyl)boronic acid, 231 mg (0.2 mmol) of $Pd(PPh_3)_4$, and 5.53 g (4 mmol) of $K_2CO_3$ were added to 50 mL of a mixture of $THF/H_2O$ (at a volume ratio of about 9:1) and stirred at a temperature of about 80° C. for about 12 hours. The resultant was cooled to room temperature, and an organic layer was extracted therefrom three times by using water and diethyl ether. The obtained organic layer was dried by using $MgSO_4$. A solvent was removed therefrom by evaporation. The residual was separated and purified through a silica gel chromatography to obtain 1.22 g (1.59 mmol, yield: 79%) of Compound 167. The obtained compound was identified by MS/FAB.

$C_{56}H_{38}N_2S$ cal. 770.99, found 770.28.

Synthesis Example 26: Synthesis of Compound 174

Synthesis of Intermediate A-10(7)

1.03 g (1.61 mmol, yield: 80%) of Intermediate A-10(7) was obtained in the same (or substantially the same) manner used to synthesize Intermediate A-10(1) in Synthesis Example 16, except that di([1,1'-biphenyl]-4-yl)amine was used instead of N-phenyl-4-(trimethylsilyl)aniline.

A-10(7)

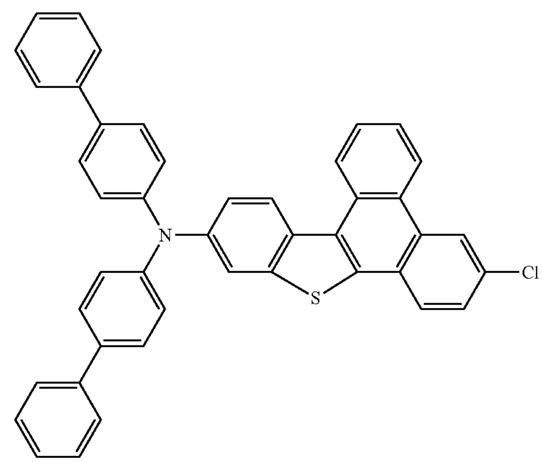

Synthesis of Compound 174

1.03 g (1.61 mmol) of Intermediate A-10(7), 406 mg (1.85 mmol) of N-phenylnaphthalen-1-amine, 183 mg (0.20 mmol) of tris(dibenzylideneacetone)dipalladium(0), 40 mg (0.20 mmol) of tri(tert-butyl)phosphine, and 288 mg (3 mmol) of sodium tert-butoxide were added to 20 mL of toluene and stirred at a temperature of about 80° C. for about 2 hours. The obtained organic layer was dried by using $MgSO_4$. A solvent was removed therefrom by evaporation. The residual was separated and purified through a silica gel chromatography to obtain 1.19 g (1.45 mmol, yield: 90%) of Compound 174. The obtained compound was identified by MS/FAB and $^1H$ NMR.

$C_{60}H_4ON_2S$ cal. 821.05, found 820.29.

Synthesis Example 27: Synthesis of Compound 180

Synthesis of Intermediate A-10(8)

981 mg (1.83 mmol, yield: 92%) of Intermediate A-10(8) was obtained in the same (or substantially the same) manner used to synthesize Intermediate A-10(1) in Synthesis Example 16, except that N-phenylnaphthalen-1-amine was used instead of N-phenyl-4-(trimethylsilyl)aniline.

A-10(8)

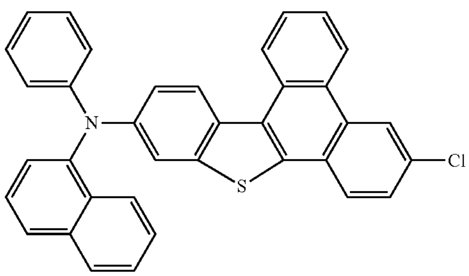

Synthesis of Compound 180

981 mg (1.83 mmol) of Intermediate A-10(8), 578 mg (2.0 mmol) of (4-(diphenylamino)phenyl)boronic acid, 196 mg (0.17 mmol) of $Pd(PPh_3)_4$, and 473 mg (3.4 mmol) of $K_2CO_3$ were added to 50 mL of a mixture of $THF/H_2O$ (at a volume ratio of about 9:1) and stirred at a temperature of about 80° C. for about 12 hours. The resultant was cooled to room temperature, and an organic layer was extracted therefrom three times by using water and diethyl ether. The obtained organic layer was dried by using $MgSO_4$. A solvent was removed therefrom by evaporation. The residual was separated and purified through a silica gel chromatography to obtain 1.89 g (1.59 mmol, yield: 87%) of Compound 180. The obtained compound was identified by MS/FAB.

$C_{54}H_{36}N_2S$ cal. 744.96, found 744.26.

Synthesis Example 28: Synthesis of Compound 185

Synthesis of Intermediate A-10(9)

800 mg (2.01 mmol) of Intermediate A-9, 682 mg (2.0 mmol) of (4-(naphthalen-1-yl(phenyl)amino)phenyl)boronic acid, 231 mg (0.2 mmol) of $Pd(PPh_3)_4$, and 553 mg (4.0 mmol) of $K_2CO_3$ were added to 50 mL of a mixture of $THF/H_2O$ (at a volume ratio of about 9:1) and stirred at a temperature of about 80° C. for about 12 hours. The resultant was cooled to room temperature, and an organic layer was extracted therefrom three times by using water and diethyl ether. The obtained organic layer was dried by using $MgSO_4$. A solvent was removed therefrom by evaporation. The residual was separated and purified through a silica gel chromatography to obtain 1.01 g (1.65 mmol, yield: 82%) of Intermediate A-10(9).

A-10(9)

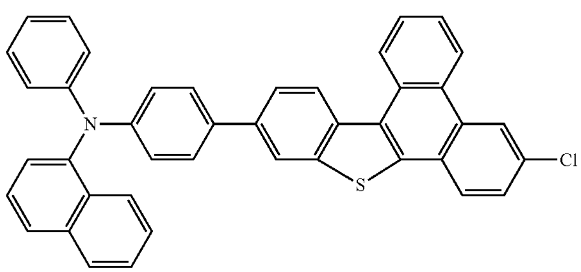

Synthesis of Compound 185

1.01 g (1.65 mmol) of Intermediate A-10(9), 392 mg (1.8 mmol) of N-phenylnaphthalen-1-amine, 183 mg (0.20 mmol) of tris(dibenzylideneacetone)dipalladium(0), 40 mg (0.20 mmol) of tri(tert-butyl)phosphine, and 384 mg (4.0 mmol) of sodium tert-butoxide were added to 20 mL of toluene and stirred at a temperature of about 80° C. for about 2 hours. The resultant was cooled to room temperature, and an organic layer was extracted therefrom two times by using water and diethyl ether. The obtained organic layer was dried by using $MgSO_4$. A solvent was removed therefrom by evaporation. The residual was separated and purified through a silica gel chromatography to obtain 1.15 g (1.45 mmol, yield: 88%) of Compound 185. The obtained compound was identified by MS/FAB.

$C_{58}H_{38}N_2S$ cal. 795.02, found 794.28.

Synthesis Example 29: Synthesis of Compound 196

596 mg (0.50 mmol, yield: 77%) of Compound 196 was obtained in the same (or substantially the same) manner used to synthesize Compound 1 in Synthesis Example 1, except that N-(4'-fluoro-[1,1':3',1"-terphenyl]-5'-yl)-9,9-dimethyl-9H-fluoren-2-amine was used instead of diphenylamine. The obtained compound was identified by MS/FAB and $^1H$ NMR.

$C_{86}H_{60}F_2N_2S$ cal. 1191.50, found 1190.44.

Synthesis Example 30: Synthesis of Compound 201

675 mg (0.71 mmol, yield: 72%) of Compound 201 was obtained in the same (or substantially the same) manner used to synthesize Compound 1 in Synthesis Example 1, except that (N-[1,1'-biphenyl]-4-yl)dibenzo[b,d]furan-4-amine was used instead of diphenylamine. The obtained compound was identified by MS/FAB and $^1H$ NMR.

$C_{68}H_{42}N_2O_2S$ cal. 951.16, found 950.30.

Synthesis Example 31: Synthesis of Compound 2A 501 mg (0.60 mmol, yield: 87%) of Compound 2A was obtained in the same (or substantially the same) manner used to synthesize Compound 1A in Synthesis Example 3, except that 9,9-dimethyl-N-phenyl-9H-fluoren-2-amine was used instead of diphenylamine. The obtained compound was identified by MS/FAB and $^1H$ NMR.

$C_{62}H_{46}N_2O$ cal. 835.06, found 834.36.

Synthesis Example 32: Synthesis of Compound 5A 499 mg (0.71 mmol, yield: 92%) of Compound 5A was obtained in the same (or substantially the same) manner used to synthesize Compound 1A in Synthesis Example 3, except that N-phenylnaphthalen-1-amine was used instead of diphenylamine. The obtained compound was identified by MS/FAB and $^1H$ NMR.

$C_{52}H_{34}N_2O$ cal. 702.86, found 702.27.

Synthesis Example 33: Synthesis of Compound 7A 325 mg (0.43 mmol, yield: 62%) of Compound 7A was obtained in the same (or substantially the same) manner used to synthesize Compound 1A in Synthesis Example 3, except that N-([1,1'-biphenyl]-2-yl)pyridin-3-amine was used instead of diphenylamine. The obtained compound was identified by MS/FAB and $^1H$ NMR.

$C_{54}H_{36}N_4O$ cal. 756.91, found 756.29.

Synthesis Example 34: Synthesis of Compound 8A 400 mg (0.53 mmol, yield: 66%) of Compound 8A was obtained in the same (or substantially the same) manner used to synthesize Compound 1A in Synthesis Example 3, except that N-phenyl-[1,1'-biphenyl]-4-amine was used instead of diphenylamine. The obtained compound was identified by MS/FAB and $^1$H NMR.

$C_{56}H_{38}N_2O$ cal. 754.93, found 754.30.

Synthesis Example 35: Synthesis of Compound 9A 436 mg (0.62 mmol, yield: 89%) of Compound 9A was obtained in the same (or substantially the same) manner used to synthesize Compound 1A in Synthesis Example 3, except that N-phenylnaphthalen-2-amine was used instead of diphenylamine. The obtained compound was identified by MS/FAB and $^1$H NMR.

$C_{52}H_{34}N_2O$ cal. 702.86, found 702.27.

Synthesis Example 36: Synthesis of Compound 10A 436 mg (0.62 mmol, yield: 89%) of Compound 10A was obtained in the same (or substantially the same) manner used to synthesize Compound 1A in Synthesis Example 3, except that 9,9-dimethyl-N-(4-(trimethylsilyl)phenyl)-9H-fluoren-2-amine was used instead of diphenylamine. The obtained compound was identified by MS/FAB and $^1$H NMR.

$C_{68}H_{62}N_2SSi_2$ cal. 995.49, found 994.42.

Synthesis Example 37: Synthesis of Compound 13A 622 mg (0.66 mmol, yield: 72%) of Compound 13A was obtained in the same (or substantially the same) manner used to synthesize Compound 1A in Synthesis Example 3, except that 5'-fluoro-N-phenyl-[1,1':3',1"-terphenyl]-4'-amine was used instead of diphenylamine. The obtained compound was identified by MS/FAB and $^1$H NMR.

$C_{68}H_{44}F_2N_2O$ cal. 943.11, found 942.34.

Synthesis Example 38: Synthesis of Compound 15A 701 mg (0.75 mmol, yield: 78%) of Compound 15A was obtained in the same (or substantially the same) manner used to synthesize Compound 1A in Synthesis Example 3, except that N-([1,1'-biphenyl]-2-yl)dibenzo[b,d]furan-4-amine was used instead of diphenylamine. The obtained compound was identified by MS/FAB and $^1$H NMR.

$C_{68}H_{42}N_2O_3$ cal. 935.09, found 934.32.

Synthesis Example 39: Synthesis of Compound 19A 611 mg (0.78 mmol, yield: 88%) of Compound 19A was obtained in the same (or substantially the same) manner used to synthesize Compound 1A in Synthesis Example 3, except that N-phenyldibenzo[b,d]furan-2-amine was used instead of diphenylamine. The obtained compound was identified by MS/FAB and $^1$H NMR.

$C_{56}H_{34}N_2O_3$ cal. 782.90, found 782.26.

Synthesis Example 40: Synthesis of Compound 26A

Synthesis of Intermediate B-11(1)

763 mg (2.0 mmol) of Intermediate B-10, 338 mg (2.0 mmol) of diphenylamine, 183 mg (0.20 mmol) of tris (dibenzylideneacetone)dipalladium(0), 40 mg (0.20 mmol) of tri(tert-butyl)phosphine, and 384 mg (4.0 mmol) of sodium tert-butoxide were added to 20 mL of toluene and stirred at a temperature of about 80° C. for about 2 hours. The resultant was cooled to room temperature, and an organic layer was extracted therefrom two times by using water and diethyl ether. The obtained organic layer was dried by using $MgSO_4$. A solvent was removed therefrom by evaporation. The residual was separated and purified through a silica gel chromatography to obtain 818 mg (1.74 mmol, yield: 63%) of Intermediate B-11(1).

B-11(1)

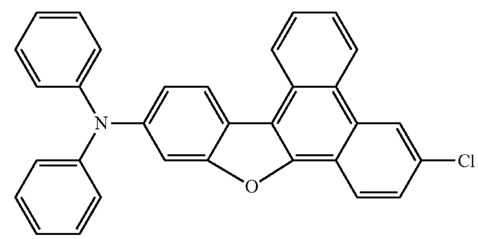

Synthesis of Compound 26A 818 mg (1.74 mmol) of Intermediate B-11(1), 498 mg (1.85 mmol) of N-phenylphenanthren-2-amine, 156 mg (0.17 mmol) of tris(dibenzylideneacetone)dipalladium(0), 34 mg (0.17 mmol) of tri(tert-butyl)phosphine, and 288 mg (3 mmol) of sodium tert-butoxide were added to 20 mL of toluene and stirred at a temperature of about 80° C. for about 2 hours. The obtained organic layer was dried by using $MgSO_4$. A solvent was removed therefrom by evaporation. The residual was separated and purified through a silica gel chromatography to obtain 1.14 g (1.62 mmol, yield: 93%) of Compound 26 Å. The obtained compound was identified by MS/FAB and $^1$H NMR.

$C_{52}H_{34}N_2O$ cal. 702.86, found 702.27.

Synthesis Example 41: Synthesis of Compound 29A 982 mg (1.27 mmol, yield: 73%) of Compound 29A was obtained in the same (or substantially the same) manner used to synthesize Compound 26A in Synthesis Example 40, except that 5'-fluoro-N-phenyl-[1,1':3',1"-terphenyl]-4'-amine was used instead of N-phenylphenanthren-2-amine. The obtained compound was identified by MS/FAB and $^1$H NMR.

$C_{56}H_{37}FN_2O$ cal. 772.92, found 772.29.

Synthesis Example 42: Synthesis of Compound 30A 958 mg (1.20 mmol, yield: 69%) of Compound 30A was obtained in the same (or substantially the same) manner used to synthesize Compound 26A in Synthesis Example 40, except that 5'-fluoro-6'-(phenylamino)-[1,1':3',1"-terphenyl]-4-carbonitrile was used instead of N-phenylphenanthren-2-amine. The obtained compound was identified by MS/FAB and $^1$H NMR.

$C_{57}H_{36}FN_3O$ cal. 797.93, found 797.28.

Synthesis Example 43: Synthesis of Compound 38A

Synthesis of Intermediate B-11(2)

650 mg (1.20 mmol, yield: 60%) of Intermediate B-11(2) was obtained in the same (or substantially the same) manner used to synthesize Intermediate B-11(1) in Synthesis Example 40, except that N-(4-(trimethylsilyl)phenyl)benzenamine was used instead of diphenylamine.

B-11(2)

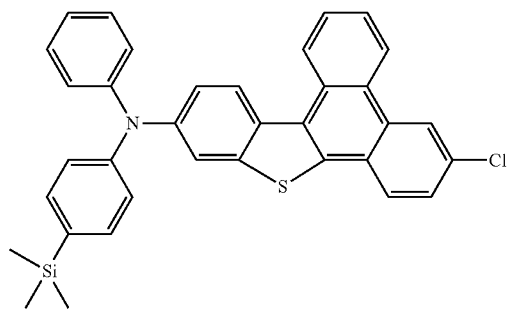

Synthesis of Compound 38A 650 mg (1.20 mmol) of Intermediate B-11(2), 469 mg (1.4 mmol) of N-([1,1'-biphenyl]-2-yl)dibenzo[b,d]furan-4-amine, 110 mg (0.12 mmol) of tris(dibenzylideneacetone) dipalladium(0), 24.3 mg (0.12 mmol) of tri(tert-butyl)phosphine, and 240 mg (2.5 mmol) of sodium tert-butoxide were added to 20 mL of toluene and stirred at a temperature of about 80° C. for about 2 hours. The obtained organic layer was dried by using $MgSO_4$. A solvent was removed therefrom by evaporation. The residual was separated and purified through a silica gel chromatography to obtain 689 mg (0.82 mmol, yield: 68%) of Compound 38 Å. The obtained compound was identified by MS/FAB and $^1$H NMR.

$C_{59}H_{44}N_2O_2Si$ cal. 841.10, found 840.32.

Synthesis Example 44: Synthesis of Compound 54A

Synthesis of Intermediate B-11(3)

852 mg (1.56 mmol, yield: 78%) of Intermediate B-11(3) was obtained in the same (or substantially the same) manner used to synthesize Intermediate B-11(1) in Synthesis Example 40, except that N-phenyl-2-biphenylamine was used instead of diphenylamine.

B-11(3)

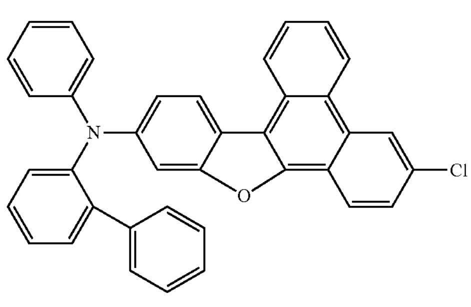

Synthesis of Compound 54A 852 mg (1.56 mmol) of Intermediate B-11(3), 372 mg (1.7 mmol) of N-phenylnaphthalen-2-amine, 146 mg (0.16 mmol) of tris(dibenzylideneacetone)dipalladium(0), 32.4 mg (0.16 mmol) of tri(tert-butyl)phosphine, and 288 mg (3.0 mmol) of sodium tert-butoxide were added to 20 mL of toluene and stirred at a temperature of about 80° C. for about 2 hours. The obtained organic layer was dried by using $MgSO_4$. A solvent was removed therefrom by evaporation. The residual was separated and purified through a silica gel chromatography to obtain 1.00 g (1.32 mmol, yield: 88%) of Compound 54 Å. The obtained compound was identified by MS/FAB and $^1$H NMR.

$C_{54}H_{36}N_2O$ cal. 728.89, found 728.28.

Synthesis Example 45: Synthesis of Compound 57A 1.01 g (1.16 mmol, yield: 77%) of Compound 57A was obtained in the same (or substantially the same) manner used to synthesize Compound 54A in Synthesis Example 44, except that N-([1,1'-biphenyl]-2-yl)-9,9-dimethyl-9H-fluoren-2-amine was used instead of N-phenylnaphthalen-2-amine. The obtained compound was identified by MS/FAB and $^1$H NMR.

$C_{65}H_{46}N_2O$ cal. 871.10, found 870.36.

Synthesis Example 46: Synthesis of Compound 72A

Synthesis of Intermediate B-11(4)

1.01 g (1.8 mmol, yield: 90%) of Intermediate B-11(4) was obtained in the same (or substantially the same) manner used to synthesize Intermediate B-11(1) in Synthesis Example 40, except that N-phenyl-4-(trimethylsilyl)aniline was used instead of diphenylamine.

B-11(4)

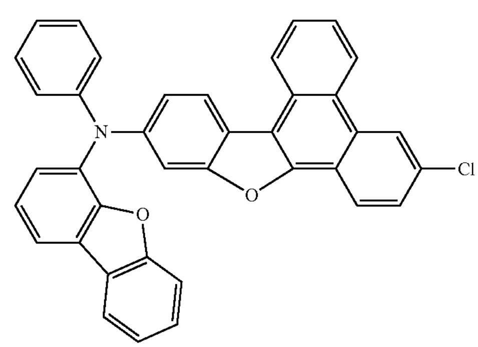

Synthesis of Compound 72A 1.01 g (1.8 mmol) of Intermediate B-11(4), 542 mg (1.9 mmol) of 9,9-dimethyl-N-phenyl-9H-fluoren-2-amine, 183 mg (0.2 mmol) of tris(dibenzylideneacetone)dipalladium(0), 40 mg (0.2 mmol) of tri(tert-butyl)phosphine, and 336 mg (3.5 mmol) of sodium tert-butoxide were added to 20 mL of toluene and stirred at a temperature of about 80° C. for about 2 hours. The obtained organic layer was dried by using $MgSO_4$. A solvent was removed therefrom by evaporation.

The residual was separated and purified through a silica gel chromatography to obtain 1.20 g (1.48 mmol, yield: 82%) of Compound 72 Å. The obtained compound was identified by MS/FAB and $^1$H NMR.

$C_{59}H_{40}N_2O_2$ cal. 808.98, found 808.31.

Synthesis Example 47: Synthesis of Compound 88A

Synthesis of Intermediate B-11(5)

891 mg (1.4 mmol, yield: 70%) of Intermediate B-11(5) was obtained in the same (or substantially the same) manner used to synthesize Intermediate B-11(1) in Synthesis Example 40, except that N-([1,1'-biphenyl]-2-yl)dibenzo[b,d]furan-4-amine was used instead of diphenylamine.

B-11(5)

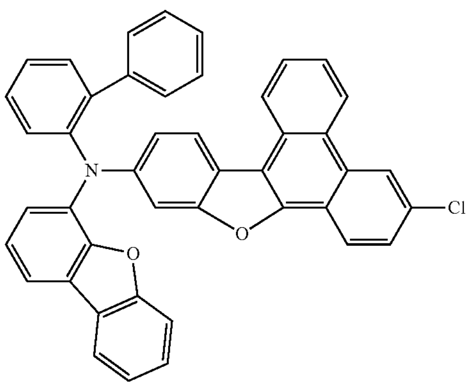

Synthesis of Compound 88A 891 mg (1.4 mmol) of Intermediate B-11(5), 457 mg (1.6 mmol) of 9,9-dimethyl-N-phenyl-9H-fluoren-2-amine, 183 mg (0.2 mmol) of tris(dibenzylideneacetone)dipalladium(0), 40 mg (0.2 mmol) of tri(tert-butyl)phosphine, and 336 mg (3.5 mmol) of sodium tert-butoxide were added to 20 mL of toluene and stirred at a temperature of about 80° C. for about 2 hours. The obtained organic layer was dried by using $MgSO_4$. A solvent was removed therefrom by evaporation. The residual was separated and purified through a silica gel chromatography to obtain 1.08 g (1.22 mmol, yield: 87%) of Compound 88 Å. The obtained compound was identified by MS/FAB and $^1$H NMR.

$C_{65}H_{44}N_2O_2$ cal. 885.08, found 884.34.

Synthesis Example 48: Synthesis of Compound 90A 882 mg (0.94 mmol, yield: 67%) of Compound 90A was obtained in the same (or substantially the same) manner used to synthesize Compound 88A in Synthesis Example 47, except that 5'-fluoro-N-phenyl-[1,1':3',1"-terphenyl]-4'-amine was used instead of 9,9-dimethyl-N-phenyl-9H-fluoren-2-amine. The obtained compound was identified by MS/FAB and $^1$H NMR.

$C_{68}H_{43}FN_2O_2$ cal. 939.10, found 938.33.

Synthesis Example 49: Synthesis of Compound 129A

Synthesis of Intermediate B-11(6)

957 mg (1.84 mmol, yield: 92%) of Intermediate B-11(6) was obtained in the same (or substantially the same) manner used to synthesize Intermediate B-11(1) in Synthesis Example 40, except that N-phenylnaphthalen-2-amine was used instead of diphenylamine.

B-11(6)

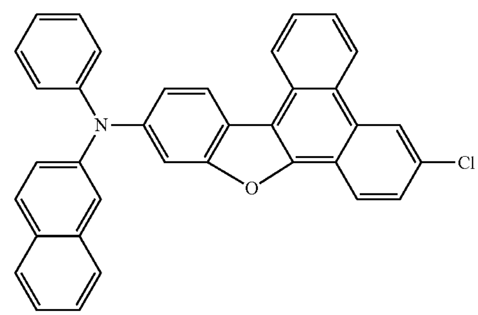

Synthesis of Compound 129A 957 mg (1.84 mmol) of Intermediate B-11(6), 758 mg (2.0 mmol) of (4-(dibenzo[b,d]furan-4-yl(phenyl)amino)phenyl) boronic acid, 208 mg (0.18 mmol) of $Pd(PPh_3)_4$, and 497 mg (3.6 mmol) of $K_2CO_3$ were added to 50 mL of a mixture of $THF/H_2O$ (at a volume ratio of about 9:1) and stirred at a temperature of about 80° C. for about 12 hours. The resultant was cooled to room temperature, and an organic layer was extracted therefrom three times by using water and diethyl ether. The obtained organic layer was dried by using $MgSO_4$. A solvent was removed therefrom by evaporation. The residual was separated and purified through a silica gel chromatography to obtain 1.05 g (1.29 mmol, yield: 70%) of Compound 129 Å. The obtained compound was identified by MS/FAB.

$C_{60}H_{38}N_2O_2$ cal. 818.98, found 818.29.

Synthesis Example 50: Synthesis of Compound 134A

Synthesis of Intermediate B-11(7)

1.03 g (1.76 mmol, yield: 88%) of Intermediate B-11(7) was obtained in the same (or substantially the same) manner used to synthesize Intermediate B-11(1) in Synthesis Example 40, except that 9,9-dimethyl-N-phenyl-9H-fluoren-2-amine was used instead of diphenylamine.

B-11(7)

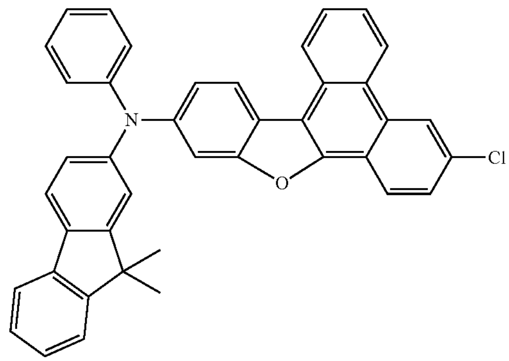

Synthesis of Compound 134A 1.03 g (1.76 mmol) of Intermediate B-11(7), 758 mg (2.0 mmol) of (4-(dibenzo[b,d]furan-4-yl(phenyl)amino)phenyl) boronic acid, 208 mg (0.18 mmol) of $Pd(PPh_3)_4$, and 497 mg (3.6 mmol) of $K_2CO_3$ were added to 50 mL of a mixture of $THF/H_2O$ (at a volume ratio of about 9:1) and stirred at a temperature of about 80° C. for about 12 hours. The resultant was cooled to room temperature, and an organic layer was extracted therefrom three times by using water and diethyl ether. The obtained organic layer was dried by using $MgSO_4$. A solvent was removed therefrom by evaporation. The residual was separated and purified through a silica gel chromatography to obtain 1.07 g (1.21 mmol, yield: 71%) of Compound 134 Å. The obtained compound was identified by MS/FAB.

$C_{65}H_{44}N_2O_2$ cal. 885.08, found 884.34.

Synthesis Example 51: Synthesis of Compound 144A 1.04 g (1.08 mmol, yield: 63%) of Compound 144A was obtained in the same (or substantially the same) manner used to synthesize Compound 134A in Synthesis Example 50, except that (4-([1,1'-biphenyl]-2-yl(dibenzo[b,d]furan-4-yl) amino)phenyl)boronic acid was used instead of (4-(dibenzo [b,d]furan-4-yl(phenyl)amino)phenyl)boronic acid. The obtained compound was identified by MS/FAB.

$C_{71}H_{48}N_2O_2$ cal. 961.18, found 960.37.

Synthesis Example 52: Synthesis of Compound 167A 800 mg (2.01 mmol) of Intermediate B-10, 1.45 g (5.0 mmol) of (4-(diphenylamino)phenyl)boronic acid, 231 mg (0.2 mmol) of $Pd(PPh_3)_4$, and 5.53 g (4 mmol) of $K_2CO_3$ were added to 50 mL of a mixture of $THF/H_2O$ (at a volume ratio of about 9:1) and stirred at a temperature of about 80° C. for about 12 hours. The resultant was cooled to room temperature, and an organic layer was extracted therefrom three times by using water and diethyl ether. The obtained organic layer was dried by using $MgSO_4$. A solvent was removed therefrom by evaporation. The residual was separated and purified through a silica gel chromatography to obtain 1.23 g (1.63 mmol, yield: 81%) of Compound 167 Å. The obtained compound was identified by MS/FAB.

$C_{56}H_{38}N_2O$ cal. 754.93, found 754.30.

Synthesis Example 53: Synthesis of Compound 174A

Synthesis of Intermediate B-11(8)

958 mg (1.54 mmol, yield: 77%) of Intermediate B-11(8) was obtained in the same (or substantially the same) manner used to synthesize Intermediate B-11(1) in Synthesis Example 40, except that di([1,1'-biphenyl]-4-yl)amine was used instead of diphenylamine.

B-11(8)

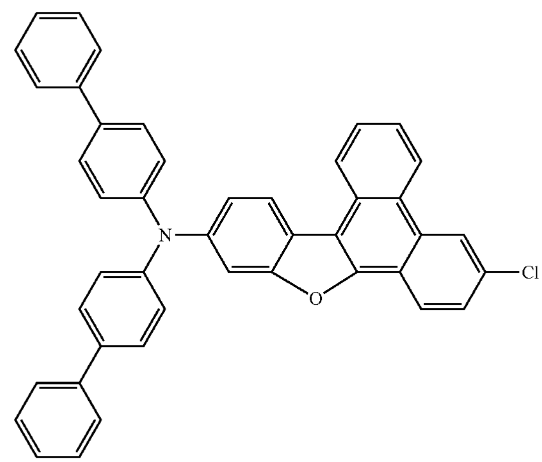

Synthesis of Compound 174A 958 mg (1.54 mmol) of Intermediate B-11(8), 373 mg (1.7 mmol) of N-phenylnaphthalen-1-amine, 183 mg (0.2 mmol) of tris(dibenzylideneacetone)dipalladium(0), 40 mg (0.2 mmol) of tri(tert-butyl)phosphine, and 336 mg (3.5 mmol) of sodium tert-butoxide were added to 20 mL of toluene and stirred at a temperature of about 80° C. for about 2 hours. The obtained organic layer was dried by using $MgSO_4$. A solvent was removed therefrom by evaporation. The residual was separated and purified through a silica gel chromatography to obtain 882 mg (0.94 mmol, yield: 67%) of Compound 174 Å. The obtained compound was identified by MS/FAB and $^1$H NMR.

$C_{60}H_{40}N_2O$ cal. 804.99, found 804.31.

Synthesis Example 54: Synthesis of Compound 183A 874 mg (1.86 mmol) of Intermediate B-11(1), 730 mg (2.0 mmol) of (di([1,1'-biphenyl]-4-yl)boronic acid, 208 mg (0.18 mmol) of $Pd(PPh_3)_4$, and 497 mg (3.6 mmol) of $K_2CO_3$ were added to 50 mL of a mixture of $THF/H_2O$ (at a volume ratio of about 9:1) and stirred at a temperature of about 80° C. for about 12 hours. The resultant was cooled to room temperature, and an organic layer was extracted therefrom three times by using water and diethyl ether. The obtained organic layer was dried by using $MgSO_4$. A solvent was removed therefrom by evaporation. The residual was separated and purified through a silica gel chromatography to obtain 1.19 g (1.43 mmol, yield: 77%) of Compound 183 Å. The obtained compound was identified by MS/FAB.

$C_{62}H_{42}N_2O$ cal. 831.03, found 830.33.

Synthesis Example 55: Synthesis of Compound 185A

Synthesis of Intermediate B-11(9)

990 mg (1.66 mmol, yield: 83%) of Intermediate B-11(9) was obtained in the same (or substantially the same) manner used to synthesize Intermediate B-11(1) in Synthesis Example 40, except that (4-(naphthalen-1-yl(phenyl)amino) phenyl)boronic acid was used instead of diphenylamine.

B-11(9)

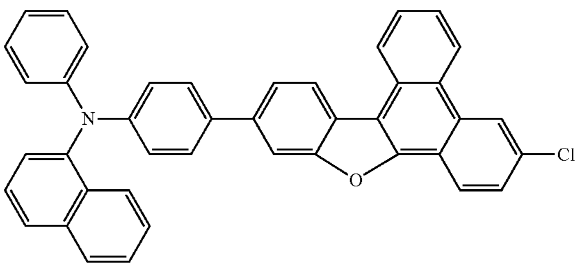

Synthesis of Compound 185A 990 mg (1.66 mmol) of Intermediate B-11(9), 439 mg (2.0 mmol) of N-phenylnaphthalen-1-amine, 183 mg (0.20 mmol) of tris(dibenzylideneacetone)dipalladium(0), 40 mg (0.20 mmol) of tri(tert-butyl)phosphine, and 384 mg (4.0 mmol) of sodium tert-butoxide were added to 20 mL of toluene and stirred at a temperature of about 80° C. for about 2 hours. The resultant was cooled to room temperature, and an organic layer was extracted therefrom two times by using water and diethyl ether. The obtained organic layer was dried by using $MgSO_4$. A solvent was removed therefrom by evaporation. The residual was separated and purified through a silica gel chromatography to obtain 1.16 g (1.49 mmol, yield: 90%) of Compound 185 Å. The obtained compound was identified by MS/FAB.

$C_{58}H_{38}N_2O$ cal. 778.95, found 778.30.

Synthesis Example 56: Synthesis of Compound 196A 611 mg (0.78 mmol, yield: 88%) of Compound 196A was obtained in the same (or substantially the same) manner used to synthesize Compound 1A in Synthesis Example 3, except that N-([1,1'-biphenyl]-2-yl)-9,9-dimethyl-9H-fluoren-2-amine was used instead of diphenylamine. The obtained compound was identified by MS/FAB and $^1$H NMR.

$C_{70}H_{62}N_2O$ cal. 947.28, found 946.49.

Synthesis Example 57: Synthesis of Compound 201A 823 mg (0.88 mmol, yield: 91%) of Compound 201A was obtained in the same (or substantially the same) manner used to synthesize Compound 1A in Synthesis Example 3, except that N-([1,1'-biphenyl]-4-yl)dibenzo[b,d]furan-4-amine was used instead of diphenylamine. The obtained compound was identified by MS/FAB and $^1$H NMR.

$C_{68}H_{42}N_2O_3$ cal. 935.09, found 934.32.

Synthesis Example 58: Synthesis of Compound 192A

Compound 192A was obtained in the same (or substantially the same) manner used to synthesize Compound 1A in Synthesis Example 3, except that N-(4-biphenyl)-(9,9'-dimethylfluoren-2-yl)amine was used instead of diphenylamine. The obtained compound was identified by MS/FAB and $^1$H NMR.

The NMR and MS data of Compounds synthesized in Synthesis Examples is shown in Table 1:

TABLE 1

| Compound | $^1$H NMR ($CDCl_3$, 400 MHz) | MS/FAB calc. | MS/FAB found |
|---|---|---|---|
| 1 | δ = 8.46 (m, 1H), 8.12 (m, 1H), 8.04 (d, 1H), 8.02-7.96 (m, 1H), 7.66-7.60 (m, 2H), 7.35 (m, 1H), 7.17 (m, 1H), 7.10-7.02 (m, 8H), 6.70-7.55 (m, 6H), 6.35-6.28 (m, 4H), 6.25-6.20 (m, 4H) | 618.80 | 618.21 |
| 2 | δ = 8.37 (d, 1H), 8.04-7.97 (m, 4H), 7.78 (d, 1H), 7.76 (d, 1H), 7.75-7.69 (m, 2H), 7.54 (d, 1H), 7.48-7.42 (m, 2H), 7.30-7.21 (m, 8H), 7.02-6.85 (m, 7H), 6.80-6.77 (m, 1H), 6.68 (d, 1H), 6.66 (d, 1H), 1.65 (dd, 2H), 6.65 (m, 1H), 2.93 (s, 12H) | 851.12 | 850.34 |
| 7 | δ = 8.46 (m, 1H), 8.34-8.30 (m, 2H), 8.13-8.10 (m, 1H), 8.09-8.03 (m, 2H), 8.02-9-7.96 (m, 1H), 7.80-7.76 (m, 1H), 7.64-7.52 (m, 6H), 7.50-7.42 (m, 6H), 7.38-7.30 (m, 3H), 7.29-7.16 (m, 6H), 7.12-7.06 (m, 1H), 67.02-6.93 (m, 3H), 6.90-6.87 (m, 1H), 6.52-6.40 (m, 2H) | 772.97 | 772.27 |
| 9 | δ = 8.35 (d, 1H), 8.10-0.08 (m, 1H), 8.01 (d, 1H), 7.98-7.94 (m, H), 7.9-7.86 (m, 2H), 7.74-7.57 (m, 8H), 7.55-7.44 (m, 6H), 7.38-7.28 (m, 3H), 7.26-7.18 (m, 4H), 6.93-6.80 (m, 4H), 6.68-6.62 (m, 2H), 6.62-6.58 (m, 2H), | 718.92 | 718.24 |
| 10 | δ = 8.49-8.45 (m, 1H), 8.07-7.86 (m, 2H), 7.74-7.70 (m, 3H), 7.67-7.62 (m, 2H), 7.47-7.43 (m, 2H), 7.40-7.30 (m, 7H), 7.20-7.09 (m, 5H), 6.83-6.78 (m, 2H), 6.77-6.70 (m, 4H), 6.65-6.60 (m, 3H), 6.53-6.49 (m, 1H), 1.61 (s, 12H), 0.24 (s, 18H) | 995.49 | 994.42 |

TABLE 1-continued

| Compound | $^1$H NMR ($CDCl_3$, 400 MHz) | MS/FAB calc. | MS/FAB found |
|---|---|---|---|
| 13 | δ = 8.35 (d, 1H), 8 (d, 1H), 7.97 (ddd, 1H), 7.84 (dd, 1H), 7.74-7.66 (m, 9H), 7.62-7.54 (m, 10H), 7.52-7.42 (m, 6H), 7.3-7.20 (m, 7H), 6.90-6.86 (m, 2H), 6.71 (dd, 1H), 6.62 (dd, 1H), 6.60-6.56 (m, 2H), 6.54-6.51 (m, 2H), | 959.17 | 958.32 |
| 15 | δ = 8.28-8.24 (m, 1H), 7.94 (d, 1H), 7.84 (dd, 1H), 7.72-7.66 (m, 2H), 7.61-7.51 (m, 5H), 7.51-7.48 (m, 2H), 7.48-7.42 (m, 8H), 7.36-7.29 (m, 6H), 7.27 (ddd, 1H), 7.11-7.04 (m, 4H), 7.02-6.87 (m, 9H), 6.65 (dd, 1H), 6.28-6.25 (m, 1H) | 951.16 | 950.30 |
| 16 | δ = 8.48-8.44 (m, 1H), 8.03-7.96 (m, 2H), 7.86-7.80 (m, 4H), 7.77-7.73 (m, 2H), 7.68-7.60 (m, 7H), 7.58-7.52 (m, 8H), 7.48-7.44 (m, 2H), 7.40-7.36 (m, 4H), 7.35-7.32 (m, 3H), 7.25-7.21 (m, 2H), 7.16-7.10 (m, 4H), 7.09-7.02 (m, 3H), 7.10-6.94 (m, 4H), 6.85-6.81 (m, 2H), 6.69-6.65 (m, 1H), 6.25-6.22 (m, 1H) | 1103.35 | 1102.36 |
| 19 | δ = 8.28-8.25 (m, 1H), 8.08-8.04 (m, 1H), 7.89 (d, 1H), 7.86-7.81 (m, 1H), 7.72-7.66 (m, 2H), 7.63-7.49 (m, 3H), 7.45-7.39 (m, 4H), 7.34-7.22 (m, 6H), 7.09 (d, 1H), 7.06-6.99 (m, 4H), 6.91 (dd, 1H), 6.88 (dd, 1H), 6.72 (dd, 1H), 6.66-6.62 (m, 3H), 6.47-6.42 (m, 2H), 6.4-6.36 (m, 2H) | 798.96 | 798.23 |
| 26 | δ = 8.29-8.24 (m, 2H), 8.08-8.02 (m, 1H), 7.99-7.94 (m, 1H), 7.89 (d, 1H), 7.87-7.82 (m, 1H), 7.73-7.68 (m, 1H), 7.60-7.51 (m, 3H), 7.48-7.42 (m, 4H), 7.27 (dd, 1H), 7.1 (dd, 1H), 7.06-6.98 (m, 6H), 6.95 (dd, 1H), 6.66 (dd, 1H), 6.64 (d, 1H), 6.64 (dd, 1H), 6.63 (dd, 1H), 6.62 (dd, 1H), 6.36-6.26 (m, 6H) | 718.92 | 718.24 |
| 29 | δ = 8.29-8.24 (m, 1H), 7.89 (d, 1H), 7.87-7.83 (m, 1H), 7.69 (d, 1H), 7.58-7.49 (m, 5H), 7.45-7.37 (m, 5H), 7.34-7.22 (m, 4H), 7.1 (dd, 1H), 7.05 (dd, 1H), 7.02-6.95 (m, 6H), 6.68-6.57 (m, 4H), 6.37-6.29 (m, 5H), 6.23-6.18 (m, 2H) | 788.98 | 788.27 |
| 30 | δ = 8.52-8.47 (m, 1H), 8.1 (d, 1H), 8.08-7.99 (m, 2H), 7.79-7.68 (m, 5H), 7.65-7.56 (m, 5H), 7.54-7.41 (m, 6H), 7.29 (dd, 1H), 7.23 (dd, 1H), 7.21-7.15 (m, 4H), 6.87-6.77 (m, 5H), 6.58 (dd, 1H), 6.53-6.47 (m, 4H) | 813.99 | 813.26 |
| 38 | δ = 8.50-8.45 (m, 1H), 8.10-8.02 (m, 2H), 7.88 (dd, 1H), 7.78-7.66 (m, 5H), 5.80-5.74 (m, 4H), 7.58-7.43 (m, 6H), 7.30-7.21 (m, 3H), 7.20-7.05 (m, 6H), 6.90-6.83 (m, 4H), 6.54 (dd, 1H), 6.54 (dd, 1H), 6.41 (dd, 1H), 0.83 (s, 9H) | 857.16 | 856.29 |
| 54 | δ = 8.4-8.36 (m, 1H), 8.07 (dd, 1H), 7.97 (dd, 1H), 7.94 (dd, 1H), 7.83 (ddd, 1H), 7.66 (ddd, 1H), 7.64-7.51 (m, 5H), 7.51-7.41 (m, 6H), 7.40-7.33 (m, 2H), 7.21 (ddd, 1H), 7.2 (d, 1H), 7.16 (ddd, 1H), 7.11 (ddd, 1H), 7.11-7.05 (m, 4H), 7.02-6.89 (m, 2H), 6.70-6.65 (m, 2H), 6.6 (ddd, 1H), 6.38-6.31 (m, 2H), 6.3-6.24 (m, 2H) | 744.96 | 744.26 |
| 57 | δ = 8.60-8.56 (m, 1H), 8.17 (d, 1H), 8.14 (dd, 1H), 7.96-7.85 (m, 2H), 7.83-7.71 (m, 6H), 7.70-7.58 (m, 7H), 7.57-7.51 (m, 2H), 7.43-7.30 (m, 6H), 7.29-7.13 (m, 6H), 6.90-6.85 (m, 2H), 6.71-6.63 (m, 3H), 6.5-6.45 (m, 3H), 2.21 (s, 6H) | 887.16 | 886.34 |
| 72 | δ = 8.6-8.56 (m, 1H), 8.22-8.12 (m, 3H), 7.98 (dd, 1H), 7.93 (dd, 1H), 7.88-7.80 (m, 4H), 7.68-7.57 (m, 3H), 7.57-7.51 (m, 2H), 7.36-7.25 (m, 8H), 7.21 (dd, 1H), 6.99-6.85 (m, 5H), 6.74 (dd, 1H), 6.64 (dd, 1H), 6.64 (dd, 1H), 6.56 (ddd, 1H), 6.55 (ddd, 1H), 2.21 (s, 6H) | 825.04 | 824.29 |
| 88 | δ = 8.61-8.57 (m, 1H), 8.23-8.14 (m, 3H), 8 (dd, 1H), 7.94 (dd, 1H), 7.9-7.81 (m, 4H), 7.78-7.72 (m, 4H), 7.69-7.59 (m, 4H), 7.58-7.52 (m, 2H), 7.38-7.16 (m, 9H), 6.98 (dd, 1H), 6.93 (ddd, 1H), 6.91 (dd, 1H), 6.9 (dd, 1H), 6.75 (dd, 1H), 6.57 (dd, 1H), 6.57 (dd, 1H), 2.22 (s, 6H) | 888.12 | 887.31 |
| 90 | δ = 8.43-8.39 (m, 1H), 8.04-7.95 (m, 2H), 7.82-7.79 (m, 2H), 7.72-7.6 (m, 7H), 7.59-7.48 (m, 9H), 7.48 (, H), 7.49-7.32 (m, 7H), 7.19-7.04 (m, 8H), 7.02 (dd, 1H), 6.97 (d, 1H), 6.71 (dd, 1H), 6.66 (ddd, 1H), 6.41-6.34 (m, 1H), 6.26-6.22 (m, 2H) | 955.16 | 954.31 |
| 127 | δ = 8.43-8.40 (m, 1H), 8.33-8.30 (m, 1H), 8.27-8.22 (m, 1H), 8.16-8.12 (m, 1H), 8.06-8.00 (m, 2H), 7.84-7.80 (m, 1H), 7.70-7.59 (m, 3H), 7.51-7.45 (m, 3H), 7.42-7.38 (m, 1H), 7.36-7.34 (m, 1H), 7.19-7.16 (m, 1H), 7.08-7.03 (m, 6H), 6.99-6.95 (m, 2H), 6.70-6.61 (m, 4H), 6.56-6.53 (m, 2H), 6.33-6.22 (m, 6H) | 784.98 | 784.25 |

TABLE 1-continued

| Compound | $^1H$ NMR ($CDCl_3$, 400 MHz) | MS/FAB calc. | MS/FAB found |
|---|---|---|---|
| 129 | δ = 8.42-8.38 (m, 1H), 8.28-8.24 (m, 1H), 8.2 (dd, 1H), 8.1 (dd, 1H), 8 (ddd, 1H), 7.99-7.97 (m, 2H), 7.87-7.78 (m, 2H), 7.68-7.52 (m, 5H), 7.52-7.41 (m, 5H), 7.41-7.33 (m, 3H), 7.21 (dd, 1H), 7.16 (d, 1H), 7.13-7.02 (m, 3H), 6.99 (dd, 1H), 6.98 (dd, 1H), 6.7-6.64 (m, 3H), 6.61-6.54 (m, 2H), 6.44-6.36 (m, 2H), 6.33-6.26 (m, 2H) | 835.04 | 834.27 |
| 134 | δ = 8.38-8.36 (m, 1H), 8.27 (dd, 1H), 8.21 (d, 1H), 8.11 (dd, 1H), 8.03-7.98 (m, 2H), 7.75 (d, 1H), 7.69-7.59 (m, 3H), 7.51-7.39 (m, 5H), 7.39-7.31 (m, 2H), 7.19 (dd, 1H), 7.15-7.05 (m, 6H), 7.03-6.75 (m, 4H), 6.71-6.61 (m, 3H), 6.61-6.56 (m, 2H), 6.42 (d, 1H), 6.41 (d, 1H), 6.34-6.27 (m, 2H), 1.9 (s, 6H) | 888.12 | 887.31 |
| 140 | δ = 8.43-8.40 (m, 1H), 8.33-8.31 (m, 1H), 8.26-8.24 (m, 1H), 8.15-8.13 (m, 1H), 8.85-8.00 (m, 2H), 7.84-7.80 (m, 1H), 7.70-7.63 (m, 2H), 7.63-7.52 (m, 7H), 7.50-7.44 (m, 7H), 7.42-7.33 (m, 2H), 7.2-7.10 (m, 4H), 7.06-6.90 (m, 9H), 6.65-6.61 (m, 1H), (6.45-6.37 (m, 3H), 6.23-6.16 (m, 2H) | 937.17 | 936.32 |
| 167 | δ = 8.49 (s, 1H), 8.43-8.40 (m, 1H), 8.33-8.20 (m, 3H), 8.16-8.12 (m, 1H), 8.04-8.00 (m, 1H), 7.63-7.60 (m, 1H), 7.56-7.43 (m, 5H), 7.37-7.33 (m, 1H), 7.08-7.04 (m, 8H), 6.85-6.80 (m, 2H), 6.67-6.55 (m, 6H), 6.18-6.12 (m, 8H) | 770.99 | 770.28 |
| 174 | δ = 8.48-8.44 (m, 1H), 8.15-8.11 (m, 1H), 8.05-7.98 (m, 2H), 7.89-7.85 (m, 1H), 7.73-7.70 (m, 1H), 7.66-7.65 (m, 1H), 7.59-7.50 (m, 5H), 7.48-7.42 (m, 10H), 7.39-7.33 (m, 3H), 7.27-7.28 (m, 1H), 7.24-7.21 (m, 1H), 7.15-7.13 (m, 1H), 7.08-7.03 (m, 2H), 6.85-6.84 (m, 1H), 6.75-6.70 (m, 5H), 6.63-6.35 (m, 2H), 6.15-6.11 (m, 2H) | 821.05 | 820.29 |
| 180 | δ = 8.45 (s, 1H), 8.33-8.30 (m, 1H), 8.27-8.24 (m, 1H), 8.16-8.10 (m, 2H), 8.05-8.03 (m, 2H), 7.89-7.85 (m, 1H), 7.63-7.60 (m, 1H), 7.55-7.48 (m, 3H), 7.46-7.43 (m, 1H), 3.37-7.27 (m, 2H), 7.25-7.21 (m, 1H), 7.12-7.03 (m, 7H), 6.85-6.81 (m, 2H), 6.74-6.70 (m, 1H), 6.70-6.63 (m, 3H), 6.21-6.10 (m, 6H) | 744.96 | 744.26 |
| 185 | δ = 8.41 (d, 1H), 8.38 (d, 1H), 8.2 (s, 1H), 8.16 (dd, 1H), 8.12 (dd, 1H), 8.01 (d, 1H), 7.91 (d, 2H), 7.79 (d, 1H), 7.72 (t, 1H), 7.66-7.63 (m, 3H), 7.6-7.56 (m, 5H), 7.52-7.37 (m, 5H), 7.28-7.23 (m, 4H), 7.0 (t, 2H), 6.93 (t, 2H), 6.77 (dd, 2H), 6.68 (dd, 1H), 6.53-6.47 (m, 4H) | 795.02 | 794.28 |
| 196 | δ = 8.28-8.25 (m, 1H), 7.92-7.84 (m, 3H), 7.67-7.59 (m, 3H), 7.56-7.47 (m, 5H), 7.44-7.4 (m, 4H), 7.37-7.28 (m, 14H), 7.28-7.21 (m, 5H), 7.18-7.00 (m, 5H), 6.88-6.52 (m, 3H), 6.69-6.62 (m, 3H), 6.55 (d, 1H), 6.46 (dd, 1H), 1.8 (s, 6H), 1.79 (s, 6H) | 1191.5 | 1190.44 |
| 201 | δ = 8.38-8.35 (m, 1H), 8.18-8.15 (m, 1H), 8 (dd, 1H), 7.96 (ddd, 1H), 7.83-7.78 (m, 2H), 7.71-7.59 (m, 6H), 7.58-7.53 (m, 4H), 7.51-7.43 (m, 11H), 7.42-7.32 (m, 5H), 7.08 (dd, 1H), 7.04-6.98 (m, 3H), 6.79 (dd, 1H), 6.76-6.61 (m, 5H) | 951.16 | 950.30 |
| 1A | δ = 8.72-8.68 (m, 1H), 8.37-8.32 (m, 1H), 8.23-8.19 (m, 1H), 7.92 (dd, 1H), 7.71 (d, 1H), 7.67-7.54 (m, 2H), 7.11-7.06 (m, 8H), 6.86-6.74 (m, 3H), 6.71-6.67 (m, 4H), 6.37-6.26 (m, 8H) | 602.74 | 602.24 |
| 2A | δ = 8.76-8.73 (m, 1H), 8.40-8.36 (m, 1H), 8.02 (d, 1H), 7.82-7.73 (m, 3H), 7.65-7.55 (m, 3H), 7.45 (d, 1H), 7.43 (d, 1H), 7.36-7.30 (m, 2H), 7.21-7.03 (m, 8H), 6.91-6.77 (m, 3H), 6.77-6.47 (m, 6H), 6.37-6.28 (m, 4H), 1.73 (s, 6H), 1.71 (s, 6H) | 835.06 | 834.36 |
| 5A | δ = 8.95-8.91 (m, 1H), 8.6-8.54 (m, 1H), 8.34-8.28 (m, 2H), 8.15 (ddd, 1H), 8.09-8.03 (m, 2H), 7.98 (dd, 1H), 7.87-7.71 (m, 5H), 7.68-7.6 (m, 2H), 7.53-7.41 (m, 4H), 7.3-7.22 (m, 4H), 6.97-6.77 (m, 7H), 6.45-6.31 (m, 4H) | 702.86 | 702.27 |
| 7A | δ = 8.75-8.7 (m, 1H), 8.39-8.35 (m, 1H), 8.31-8.27 (m, 2H), 8.08-7.96 (m, 3H), 7.79-7.74 (m, 1H), 7.67-7.55 (m, 7H), 7.5-7.44 (m, 6H), 7.34 (dd, 1H), 7.32 (dd, 1H), 7.26 (dd, 1H), 7.25 (dd, 1H), 7.23-7.15 (m, 3H), 7.11-6.81 (m, 5H), 6.81-6.7 (m, 3H) | 756.91 | 758.29 |
| 8A | δ = 8.66-8.62 (m, 1H), 8.3-8.26 (m, 1H), 8.22-8.18 (m, 1H), 7.84 (d, 1H), 7.63 (d, 1H), 7.55-7.44 (m, 6H), 7.38-7.32 (m, 8H), 7.3-7.25 (m, 2H), 7.01-6.94 (m, 4H), 6.79-6.67 (m, 3H), 6.61-6.47 (m, 6H), 6.3-6.21 (m, 4H) | 754.93 | 754.30 |

TABLE 1-continued

| Compound | $^1$H NMR ($CDCl_3$, 400 MHz) | MS/FAB calc. | MS/FAB found |
|---|---|---|---|
| 9A | δ = 8.75-8.71 (m, 1H), 8.39-8.34 (m, 1H), 8.01 (d, 1H), 8.01 (d, 1H), 7.86 (dd, 1H), 7.85 (dd, 1H), 7.79 (d, 1H), 7.65-7.50 (m, 8H), 7.48-7.38 (m, 4H), 7.2 (dd, 1H), 7.11-7.06 (m, 4H), 6.9 (dd, 1H), 6.84-6.65 (m, 5H), 6.41-6.29 (m, 4H) | 702.86 | 702.27 |
| 10A | δ = 8.78-8.75 (m, 1H), 8.45-8.38 (m, 1H), 8.04-8.00 (m, 1H), 7.83-7.74 (m. 3H), 7.65-7.57 (m, 3H), 7.48-7.30 (m, 8H), 7.14-7.08 (m, 4H), 6.90-6.84 (m, 3H), 6.78-6.60 (m, 6H), 6.55-6.50 (m, 2H), 1.61 (s, 12H), 0.25 (s, 18H) | 979.43 | 979.44 |
| 13A | δ = 8.36-8.32 (m, 1H), 7.94-8.84 (m, 2H), 7.71 (d, 1H), 7.60-7.50 (m, 9H), 7.45-7.38 (m, 10H), 7.33-7.21 (m, 6H), 7.06-6.94 (m, 7H), 6.57-6.50 (m, 2H), 6.33 (dd, 1H), 6.22 (dd, 1H), 6.19-6.16 (m, 1H), 6.12-6.08 (m, 1H) | 943.110 | 942.34 |
| 15A | δ = 8.85-8.81 (m, 1H), 8.49-8.44 (m, 1H), 8.03-7.87 (m, 5H), 7.81-7.60 (m, 14H), 7.6-7.48 (m, 6H), 7.26-7.19 (m, 4H), 7.11-7.02 (m, 8H), 6.77 (dd, 1H), 6.72 (dd, 1H), 6.68 (dd, 1H) | 935.09 | 934.32 |
| 19A | δ = 8.65-8.61 (m, 1H), 8.29-8.24 (m, 2H), 7.93-7.86 (m, 1H), 7.74-7.64 (m, 3H), 7.54-7.40 (m, 6H), 7.32-7.25 (m, 6H), 7.01-6.52 (m, 9H), 6.52-6.23 (m, 6H) | 782.90 | 782.26 |
| 26A | δ = 8.67-7.75 (m, 1H), 8.36-8.26 (m, 2H), 8.19 (dd, 1H), 8.1 (dd, 1H), 7.93-7.89 (m, 1H), 7.77-7.73 (m, 1H), 7.63 (d, 1H), 7.58-7.52 (m, 2H), 7.50-7.40 (m, 5H), 7.01-6.95 (m, 6H), 6.91 (dd, 1H), 6.72-6.56 (m, 6H), 6.23-6.19 (m, 6H) | 702.86 | 702.27 |
| 29A | δ = 8.75-8.71 (m, 1H), 8.39-8.34 (m, 1H), 8.01-7.96 (m, 1H), 7.74-7.55 (m, 8H), 7.55-7.45 (m, 5H), 7.42-7.30 (m, 2H), 7.16-7.06 (m, 7H), 7.01-6.58 (m, 6H), 6.35-6.19 (m, 6H) | | |
| 30A | δ = 8.56-8.52 (m, 1H), 8.13 (d, 1H), 8.09-8.04 (m, 2H), 7.80-7.70 (m, 5H), 7.65-7.56 (m, 6H), 7.52-7.42 (m, 5H), 7.28 (dd, 1H), 7.22 (dd, 1H), 7.19-7.15 (m, 4H), 6.82-6.74 (m, 5H), 6.52 (dd, 1H), 6.47-6.42 (m, 4H) 6.42 (, H), | 797.93 | 797.28 |
| 38A | δ = 8.56-8.53 (m, 1H), 8.20-8.15 (m, 1H), 7.74-7.50 (m, 4H), 7.55-7.30 (m, 8H), 7.29-7.15 (m, 5H), 6.96-6.86 (m, 4H), 6.83-6.32 (m, 10H), 6.17-6.13 (m, 2H), 0.19 (s, 9H) | 841.10 | 840.32 |
| 54A | δ = 8.66-6.63 (m, 1H), 8.30-8.18 (m, 2H), 7.94-7.89 (m, 1H), 7.76 (dd, 1H), 7.58-7.40 (m, 8H), 7.40-7.28 (m, 5H), 7.16-7.05 (m, 3H), 7.03-6.86 (m, 5H), 6.76-6.69 (m, 2H), 6.60-6.52 (m, 3H), 6.57 (d, 1H), 6.22-6.08 (m, 4H) | 728.89 | 728.26 |
| 57A | δ = 8.46-8.42 (m, 1H), 8.03 (d, 1H), 7.99-7.94 (m, 1H), 7.79-7.53 (m, 8H), 7.50-7.43 (m, 6H), 7.43-7.04 (m, 11H), 7.01-6.91 (m, 4H), 6.67-6.62 (m, 2H), 6.47-6.37 (m, 3H), 6.25-6.20 (m, 3H), 1.73 (s, 6H) | 871.10 | 870.36 |
| 72A | δ = 8.85-8.81 (m, 1H), 8.49-8.45 (m, 1H), 8.13-8.09 (m, 1H), 7.99-7.84 (m, 3H), 7.79-7.64 (m, 5H), 7.60-7.45 (m, 4H), 7.26-7.06 (m, 8H), 6.97-6.63 (m, 6H), 6.63-6.38 (m, 5H), 1.88 (s, 6H) | 808.98 | 808.31 |
| 88A | δ = 8.65-8.61 (m, 1H), 8.29-8.25 (m, 1H), 7.89-7.63 (m, 3H), 7.55-7.44 (m, 7H), 7.4-7.29 (m, 7H), 7.25-6.99 (m, 5H), 6.97-6.67 (m, 5H), 6.60-6.48 (m, 5H), 6.38 (dd, 1H), 6.19-6.09 (m, 3H), 1.69 (s, 6H) | 885.08 | 884.34 |
| 90A | δ = 8.66-8.62 (m, 1H), 8.30-8.26 (m, 1H), 7.91-7.87 (m, 1H), 7.73-7.67 (m, 2H), 7.61-7.51 (, 8H), 7.51-7.35 (m, 12H), 7.33-7.27 (m, 2H), 7.25 (dd, 1H), 7.06-7.00 (m, 3H), 6.99-6.95 (m, 2H), 6.91-6.81 (m, 4H), 6.71-6.42 (m, 4H), 6.12-6.08 (m, 2H) | 939.10 | 938.33 |
| 129A | δ = 8.79-8.74 (m, 1H), 8.25-8.20 (m, 2H), 8.06-7.96 (m, 2H), 7.87-7.67 (m, 3H), 7.59-7.28 (, 13H), 7.03-6.82 (m, 6H), 6.82-6.53 (m, 5H), 6.48-6.19 (m, 6H) | 818.98 | 818.29 |
| 134A | δ = 8.99-8.94 (m, 1H), 8.45-8.40 (m, 2H), 8.28-8.23 (m, 1H), 8.18 (dd, 1H), 7.93-7.84 (m, 3H), 7.79-7.66 (m, 4H), 7.60-7.41 (m, 6H), 7.26-7.14 (m, 6H), 7.11-7.07 (m, 2H), 7.12-6.24 (m, 5H), 6.68-6.58 (m, 3H), 6.48-6.45 (m, 4H), 1.89 (s, 6H) | 885.08 | 884.34 |

TABLE 1-continued

| Compound | $^1$H NMR ($CDCl_3$, 400 MHz) | MS/FAB calc. | MS/FAB found |
|---|---|---|---|
| 144A | δ = 8.88-8.84 (m, 1H), 8.34-8.31 (m, 2H), 8.16-8.06 (m, 2H), 7.83-7.73 (m, 3H), 7.69-7.52 (m, 8H), 7.5-7.34 (m, 7H), 7.16-6.87 (m, 12H), 6.74 (d, 1H), 6.67 (d, 1H), 6.53 (dd, 1H), 6.49-6.34 (m, 4H), 1.79 (s, 6H) | 961.18 | 960.37 |
| 167A | δ = 8.72-8.62 (m, 1H), 8.17-8.08 (m, 2H), 7.99-7.95 (m, 1H), 7.88 (dd, 1H), 7.75 (d, 1H), 7.55 (dd, 1H), 7.42-7.30 (m, 4H), 7.25-7.20 (m, 3H), 6.90-6.82 (m, 8H), 6.7-6.61 (m, 4H), 6.50-6.42 (m, 4H), 6.01-5.93 (m, 8H) | 754.93 | 754.30 |
| 174A | δ = 8.73 (m, 1H), 8.40-8.36 (m, 1H), 8.12 (dd, 1H), 7.99-7.95 (m, 1H), 7.86 (dd, 1H), 7.78 (d, 1H), 7.73 (d, 1H), 7.65-7.50 (m, 7H), 7.48-7.42 (m, 9H), 7.39-7.34 (m, 2H), 7.31-7.24 (m, 2H), 7.1-(m, 2H), 6.89 (dd, 1H), 6.82 (dd, 1H), 6.77-6.71 (m, 5H), 6.67-6.62 (m, 2H), 6.17-6.12 (m, 2H) | 804.99 | 804.31 |
| 183A | δ = 8.89-8.85 (m, 1H), 8.37-8.31 (m, 2H), 8.18-8.16 (m, 1H), 8.08 (dd, 1H), 7.72 (d, 1H), 7.65-7.55 (m, 6H), 7.52-7.35 (m, 12H), 7.09-6.66 (m, 10H), 6.66-6.59 (m, 4H), 6.34-6.28 (m, 4H) | 831.03 | 830.33 |
| 185A | δ = 8.76-8.73 (m, 1H), 8.12 (dd, 1H), 8.12 (dd, 1H), 8.13 (d, 1H), 7.97 (d, 1H), 7.86 (dd, 1H), 7.85 (dd, 1H), 7.78 (d, 1H), 7.75 (dd, 1H), 7.73-7.58 (m, 2H), 7.66 (dd, 1H), 7.6 (d, 1H), 7.55-7.50 (m, 3H), 7.46-7.38 (m, 3H), 7.32-7.21 (m, 4H), 7.10-7.03 (m, 4H), 6.85 (dd, 1H), 6.8 (dd, 1H), 6.74 (dd, 1H), 6.73 (dd, 1H), 6.67-6.60 (m, 3H), 6.22-6.11 (m, 4H) | 778.95 | 778.3 |
| 192A | δ = 8.86-8.82 (m, 1H), 8.50-8.46 (m, 1H), 8.12 (d, 1H), 7.89 (d, 1H), 7.85 (dd, 1H), 7.84 (dd, 1H), 7.76-7.65 (m, 7H), 7.58-7.53 (m, 10H), 7.50-7.40 (m, 4H), 7.26-7.17 (m, 4H), 7.02-6.84 (m, 5H), 6.79-6.62 (m, 6H), 6.28 (s, 6H), 6.28 (s, 6H) | 987.26 | 986.42 |
| 196A | δ = 8.67-8.63 (m, 1H), 8.30-8.26 (m, 1H), 7.92 (dd, 1H), 7.69 (d, 1H), 7.65 (dd, 1H), 7.65 (dd, 1H), 7.55-7.48 (m, 3H), 7.35 (d, 1H), 7.34 (d, 1H), 7.25-7.16 (m, 6H), 7.06-6.99 (m, 4H), 6.83-6.76 (m, 3H), 6.71-6.40 (m, 8H), 1.65 (s, 6H), 1.63 (s, 6H), 1.52 (s, 9H), 1.52 (s, 9H) | 947.28 | 946.49 |
| 201A | δ = 8.46-8.42 (m, 1H), 8.79-8.17 (m, 1H), 8.02 (d, 1H), 7.98 (dd, 1H), 7.83-7.79 (m, 2H), 7.70-7.62 (m, 6H), 7.59-7.55 (m, 5H), 7.50-7.43 (m, 10H), 7.42-7.33 (m, 5H), 7.07 (d, 1H), 7.02-6.97 (m, 3H), 6.77 (dd, 1H), 6.74-6.67 (m, 3H), 6.65-6.60 (m, 2H) | 935.09 | 934.32 |

Example 1

A 15 Ohms per square centimeter (Ω/cm$^2$) (1200 Å (Angstroms)) ITO glass substrate (available from Corning Co., Ltd) was cut to a size of 50 millimeters (mm)×50 mm×0.7 mm, sonicated in isopropyl alcohol and pure water for 5 minutes in each solvent, cleaned with ultraviolet rays for 30 minutes, and then ozone, and was mounted on a vacuum deposition apparatus.

2-TNATA was vacuum-deposited on the ITO anode of the glass substrate to form a hole injection layer having a thickness of about 600 Å. Then, NPB was vacuum-deposited on the hole injection layer to form a hole transport layer having a thickness of about 300 Å, thereby forming a hole transport region.

Compound H-1 (as a host), and Compound 1 (as a dopant), were co-deposited on the hole transport region at a weight ratio of about 98:2, thereby forming an emission layer having a thickness of about 300 Å.

$Alq_3$ was vacuum-deposited on the emission layer to form an electron transport layer having a thickness of about 300 Å. Then, LiF was vacuum-deposited on the electron transport layer to form an electron injection layer having a thickness of about 10 Å, thereby forming an electron transport region.

Aluminum was vacuum-deposited on the electron transport region to form a cathode having a thickness of about 3000 Å, thereby completing the manufacture of an organic light-emitting device.

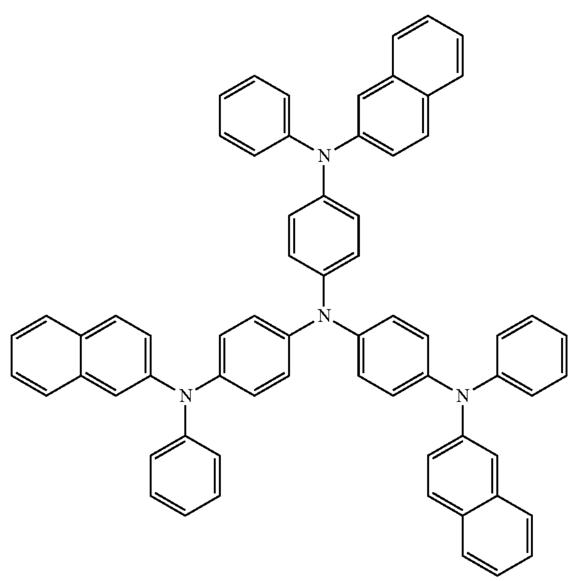

2-TNATA

-continued

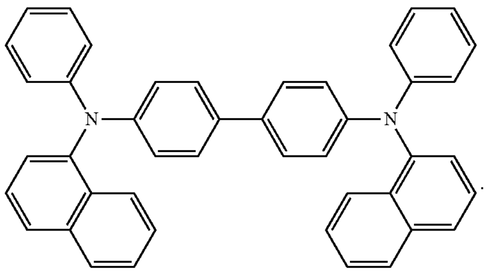

NPB

Examples 2 to 16 and Comparative Examples 1 to 6

Organic light-emitting devices according to Examples 2 to 16 and Comparative Examples 1 to 6 were manufactured in the same (or substantially the same) manner as in Example 1, except that in forming an emission layer, a host and a dopant were varied as shown in Table 2.

Evaluation Example 1

The driving voltage, current density, luminance, efficiency, and half-lifespan of the organic light-emitting devices manufactured according to Examples 1 to 16 and Comparative Examples 1 to 6 were measured by using Keithley SMU 236 and a luminance meter PR650 (Photo Research, Inc.), and results thereof are shown in Table 2. The half-lifespan refers to a period of time required for the initial luminance of the organic light-emitting device to reduce by 50%.

TABLE 2

| | Host | Dopant | Driving voltage (V) | Current density ($mA/cm^2$) | Luminance ($cd/m^2$) | Efficiency (cd/A) | Emission color | Half lifespan (hr @ 100 m $A/cm^2$) |
|---|---|---|---|---|---|---|---|---|
| Example 1 | Compound H-1 | Compound 1 | 4.77 | 50 | 3860 | 7.50 | blue | 392 |
| Example 2 | Compound H-1 | Compound 15 | 4.92 | 50 | 3432 | 7.24 | blue | 455 |
| Example 3 | Compound H-4 | Compound 90 | 5.43 | 50 | 3381 | 6.65 | blue | 434 |
| Example 4 | Compound H-4 | Compound 127 | 5.32 | 50 | 3458 | 6.91 | blue | 450 |
| Example 5 | Compound H-16 | Compound 140 | 5.55 | 50 | 3259 | 6.49 | blue | 399 |
| Example 6 | Compound H-16 | Compound 167 | 6.04 | 50 | 3319 | 7.05 | blue | 459 |
| Example 7 | Compound H-19 | Compound 1 | 5.35 | 50 | 3645 | 7.35 | blue | 480 |
| Example 8 | Compound H-19 | Compound 15 | 5.99 | 50 | 3650 | 7.45 | blue | 460 |
| Example 9 | Compound H-1 | Compound 1A | 4.53 | 50 | 3801 | 7.61 | blue | 488 |
| Example 10 | Compound H-1 | Compound 2A | 4.99 | 50 | 3342 | 7.37 | blue | 435 |
| Example 11 | Compound H-4 | Compound 19A | 5.32 | 50 | 3512 | 6.93 | blue | 422 |
| Example 12 | Compound H-19 | Compound 26A | 5.71 | 50 | 3667 | 6.44 | blue | 426 |
| Example 13 | Compound H-38 | Compound 144A | 5.02 | 50 | 3432 | 6.71 | blue | 451 |
| Example 14 | Compound H-61 | Compound 2A | 5.99 | 50 | 3620 | 6.60 | blue | 369 |
| Example 15 | Compound H-61 | Compound 19A | 6.13 | 50 | 3599 | 6.93 | blue | 385 |
| Example 16 | Compound H-61 | Compound 167A | 5.87 | 50 | 3427 | 6.71 | blue | 456 |
| Comparative Example 1 | ADN | TPD | 7.02 | 50 | 2690 | 5.38 | blue | 242 |
| Comparative Example 2 | Compound X1 | Compound Y1 | 6.99 | 50 | 3250 | 5.65 | blue | 252 |
| Comparative Example 3 | Compound X2 | Compound Y1 | 5.98 | 50 | 3458 | 5.98 | blue | 225 |
| Comparative Example 4 | Compound X3 | Compound Y2 | 6.02 | 50 | 3695 | 6.77 | blue | 331 |

TABLE 2-continued
| | Host | Dopant | Driving voltage (V) | Current density ($mA/cm^2$) | Luminance ($cd/m^2$) | Efficiency (cd/A) | Emission color | Half lifespan (hr @ 100 m $A/cm^2$) |
|---|---|---|---|---|---|---|---|---|
| Comparative Example 5 | Compound X4 | Compound Y2 | 6.78 | 50 | 3125 | 6.89 | blue | 299 |
| Comparative Example 6 | Compound X5 | Compound Y2 | 6.54 | 50 | 2998 | 7.02 | blue | 343 |
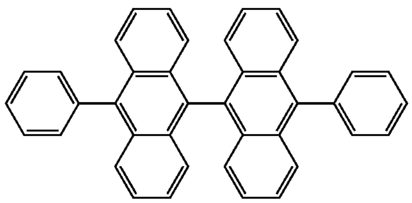
H-1
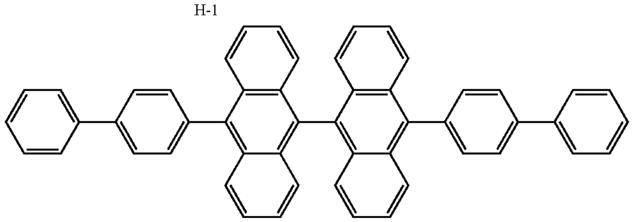
H-4
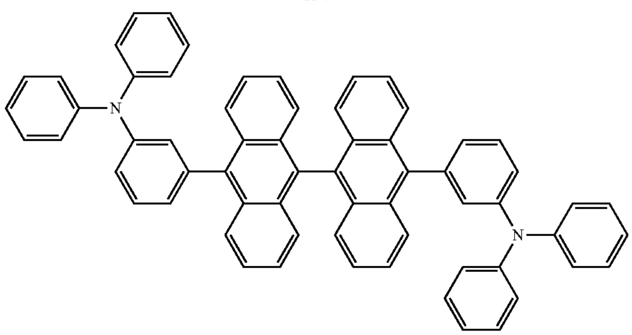
H-16
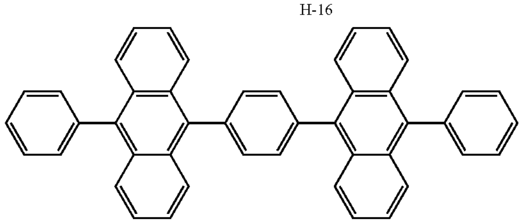
H-19
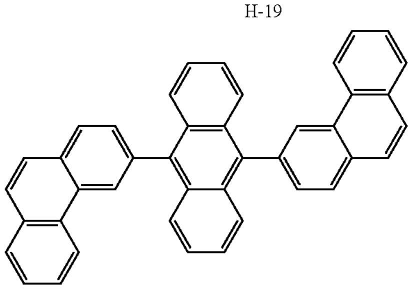
H-38

TABLE 2-continued
| Host | Dopant | Driving voltage (V) | Current density (mA/cm$^2$) | Luminance (cd/m$^2$) | Efficiency (cd/A) | Emission color | Half lifespan (hr @ 100 m A/cm$^2$) |
|---|---|---|---|---|---|---|---|
| 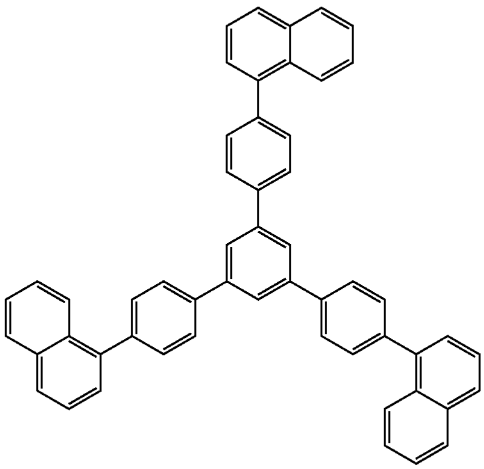 H-61 | 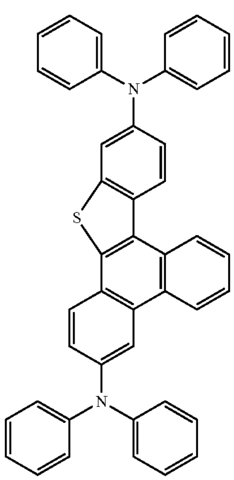 1 | | | | | | |

TABLE 2-continued
| Host | Dopant | Driving voltage (V) | Current density (mA/cm$^2$) | Luminance (cd/m$^2$) | Efficiency (cd/A) | Emission color | Half lifespan (hr @ 100 m A/cm$^2$) |
|---|---|---|---|---|---|---|---|
| 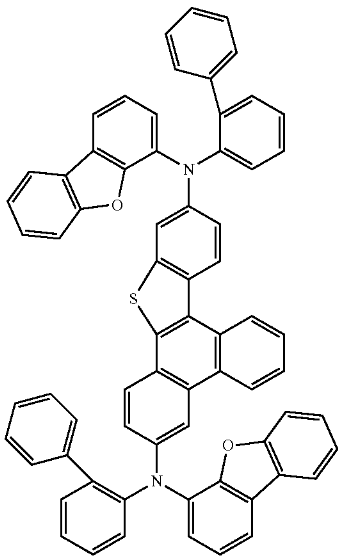 15 | | | | | | | |
| 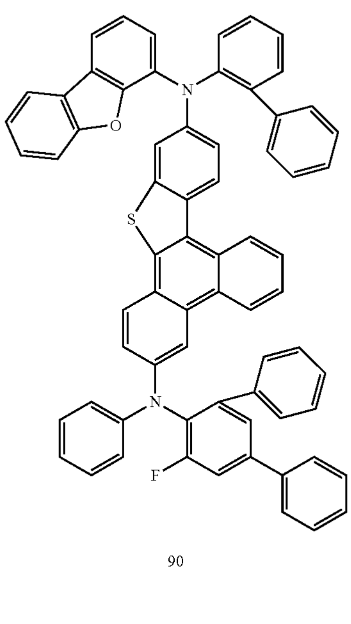 [SMILES: Fc1cc(-c2ccccc2)cc(-c2ccccc2)c1N(c1ccccc1)c1ccc2c(c1)c1ccccc1c1c3ccc(N(c4ccccc4-c4ccccc4)c4cccc5c4oc4ccccc45)cc3sc21] 90 | | | | | | | |

TABLE 2-continued
| Host | Dopant | Driving voltage (V) | Current density (mA/cm²) | Luminance (cd/m²) | Efficiency (cd/A) | Emission color | Half lifespan (hr @ 100 m A/cm²) |
|---|---|---|---|---|---|---|---|
| 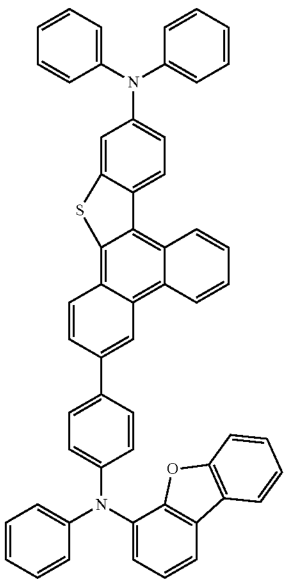 127 | | | | | | | |
| 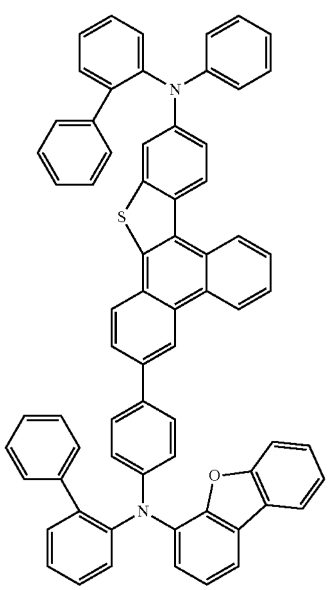 140 | | | | | | | |

TABLE 2-continued
| Host | Dopant | Driving voltage (V) | Current density (mA/cm²) | Luminance (cd/m²) | Efficiency (cd/A) | Emission color | Half lifespan (hr @ 100 m A/cm²) |
|---|---|---|---|---|---|---|---|
| 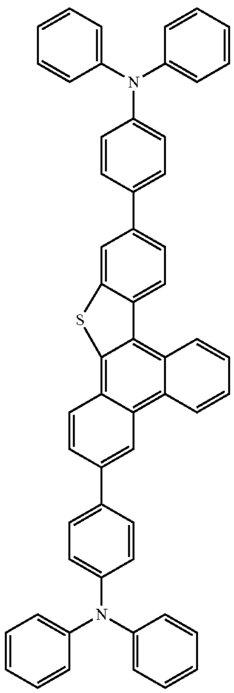 167 | | | | | | | |
| 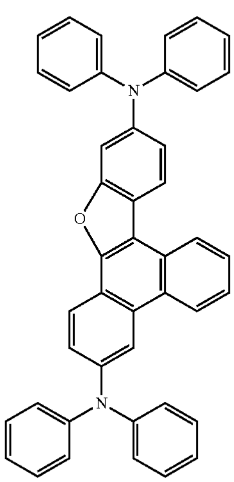 1A | | | | | | | |

TABLE 2-continued
| Host | Dopant | Driving voltage (V) | Current density (mA/cm$^2$) | Luminance (cd/m$^2$) | Efficiency (cd/A) | Emission color | Half lifespan (hr @ 100 m A/cm$^2$) |
|---|---|---|---|---|---|---|---|
| | | | | | | | |
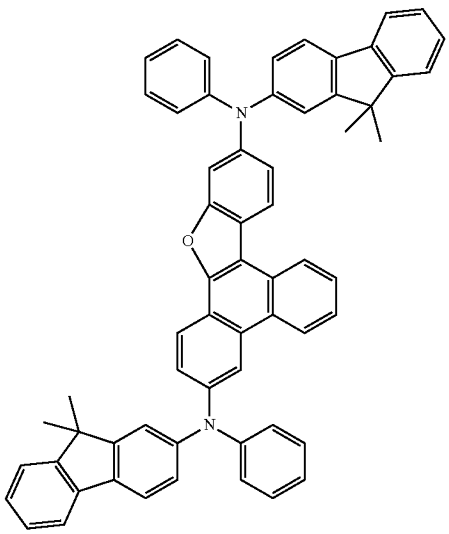
2A
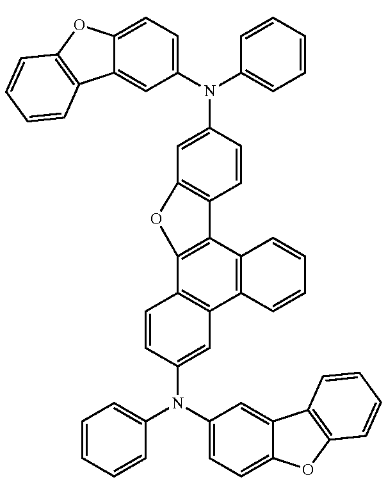
19A TABLE 2-continued
| Host | Dopant | Driving voltage (V) | Current density ($mA/cm^2$) | Luminance ($cd/m^2$) | Efficiency (cd/A) | Emission color | Half lifespan (hr @ 100 m $A/cm^2$) |
|---|---|---|---|---|---|---|---|
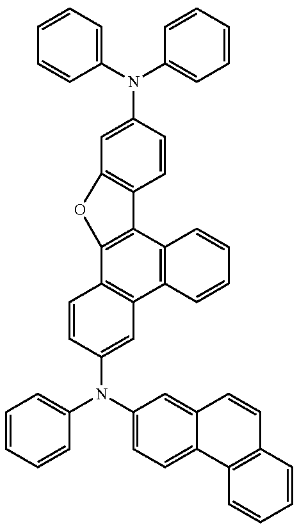
26A
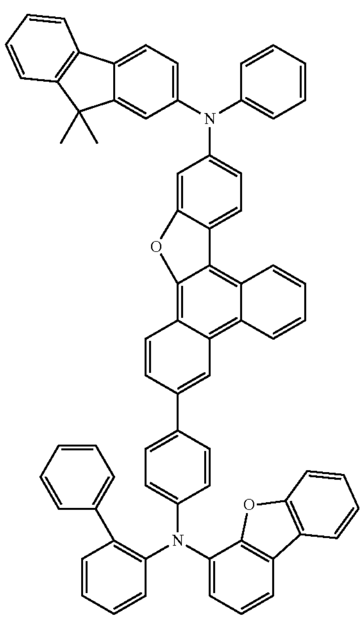
144A TABLE 2-continued
| | Host | Dopant | Driving voltage (V) | Current density (mA/cm²) | Luminance (cd/m²) | Efficiency (cd/A) | Emission color | Half lifespan (hr @ 100 m A/cm²) |
|---|---|---|---|---|---|---|---|---|
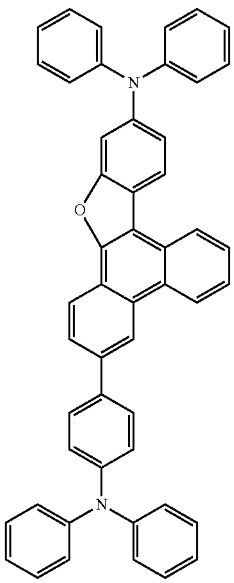
167A
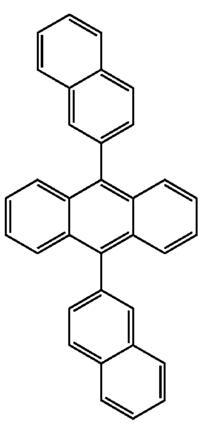
ADN
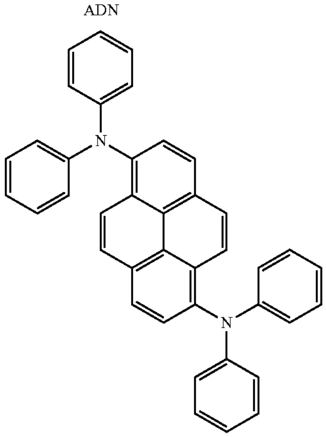
TPD TABLE 2-continued
| Host | Dopant | Driving voltage (V) | Current density (mA/cm²) | Luminance (cd/m²) | Efficiency (cd/A) | Emission color | Half lifespan (hr @ 100 m A/cm²) |
|---|---|---|---|---|---|---|---|
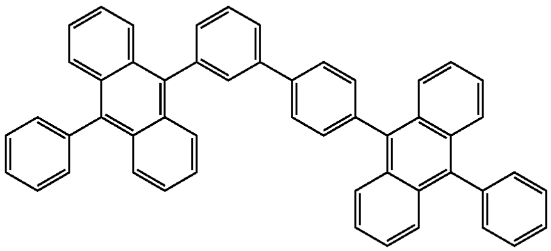
Compound X1
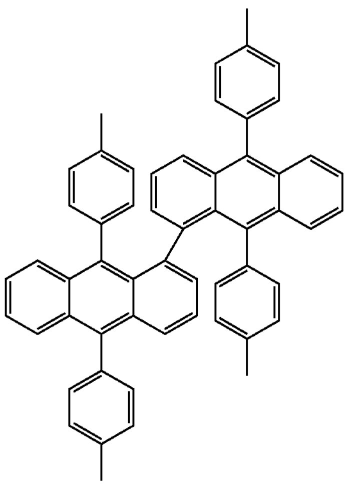
Compound X2
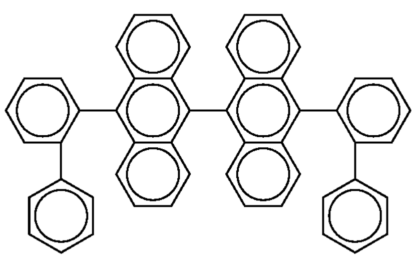
Compound X3
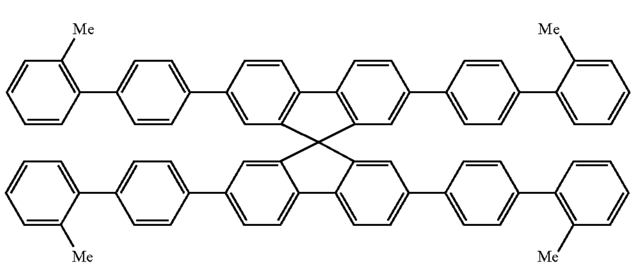
Compound X4

TABLE 2-continued

| Host | Dopant | Driving voltage (V) | Current density (mA/cm$^2$) | Luminance (cd/m$^2$) | Efficiency (cd/A) | Emission color | Half lifespan (hr @ 100 m A/cm$^2$) |
|---|---|---|---|---|---|---|---|

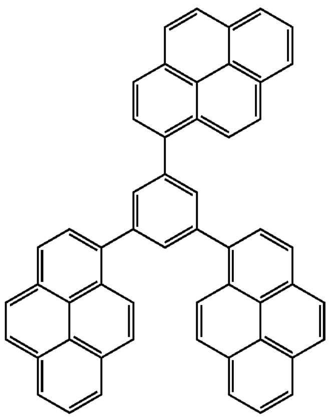

Compound X5

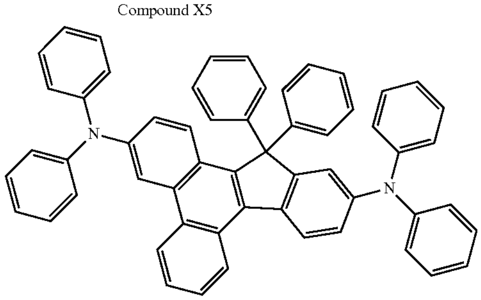

Compound Y1

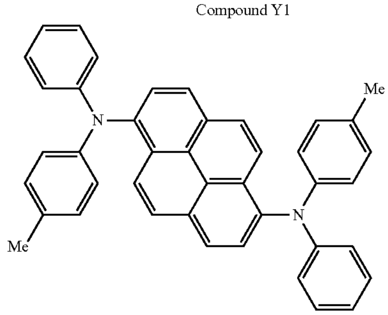

Compound Y2

Referring to the results shown in Table 2, it can be seen that the organic light-emitting devices manufactured according to Examples 1 to 16 exhibited improved driving voltage and improved half-lifespan, and most also show improved luminance and improved efficiency, as compared to those of the organic light-emitting devices manufactured according to Comparative Examples 1 to 6.

As described above, the organic light-emitting device according to embodiments of the present disclosure may have a low-driving voltage, improved efficiency, high luminance, and long lifespan.

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

It should be understood that example embodiments described herein should be considered in a descriptive sense only and not for purposes of limitation. Descriptions of features or aspects within each example embodiment should typically be considered as available for other similar features or aspects in other example embodiments.

While one or more example embodiments have been described with reference to the drawing, it will be understood by those of ordinary skill in the art that various changes in form and details may be made therein without departing from the spirit and scope of the present disclosure as defined by the following claims and equivalents thereof.

What is claimed is:

1. An organic light-emitting device comprising:

a first electrode;

a second electrode facing the first electrode; and an organic layer between the first electrode and the second electrode, the organic layer comprising an emission layer, wherein the organic layer comprises:

i) a condensed cyclic compound represented by Formula 1; and ii) at least one selected from a first compound represented by Formula 11, a second compound represented by Formula 12, and a third compound represented by Formula 13:

Formula 1

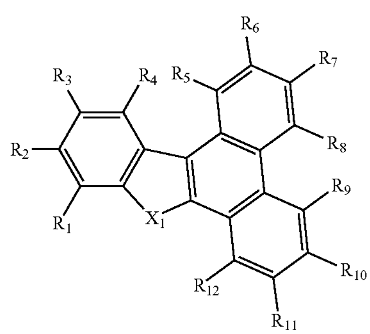

Formula 2

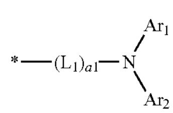

Formula 11

$$R_{301}—L_{301}—An_1—(L_{310})_{xb1}—An_2—L_{302}—R_{302}$$

Formula 12

$$R_{303}—L_{303}—An_3—L_{304}—R_{304}$$

Formula 13

$$Ar_{311}\text{—}[(L_{311})_{xb11}—R_{311}]_{xb20},$$

wherein, in Formulae 1, 2, and 11 to 13, $X_1$ is O or S, $L_1$ is selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{301}$ to $L_{304}$, $L_{310}$, and $L_{311}$ are each independently selected from a substituted or unsubstituted $C_3$-$C_{10}$ cycloalkylene group, a substituted or unsubstituted $C_3$-$C_{10}$ cycloalkenylene group, a substituted or unsubstituted $C_6$-$C_{60}$ arylene group, a substituted or unsubstituted divalent non-aromatic condensed polycyclic group, a substituted or unsubstituted thiophenylene group, a substituted or unsubstituted furanylene group, a substituted or unsubstituted pyrrolylene group, a substituted or unsubstituted benzothiophenylene group, a substituted or unsubstituted benzofuranylene group, a substituted or unsubstituted indolylene group, a substituted or unsubstituted dibenzothiophenylene group, a substituted or unsubstituted dibenzofuranylene group, and a substituted or unsubstituted carbazolylene group, a1, xb1, and xb11 are each independently selected from 0, 1, 2, and 3, wherein when a1 is 2 or more, a plurality of $L_1$(s) are identical to or different from each other, when xb1 is 2 or more, a plurality of $L_{310}$(s) are identical to or different from each other, and when xb11 is 2 or more, a plurality of $L_{311}$(s) are identical to or different from each other, $An_1$ to $An_3$ are each independently a substituted or unsubstituted anthracenylene group, $Ar_{311}$ is selected from a substituted or unsubstituted aromatic ring and a substituted or unsubstituted non-aromatic condensed polycyclic ring, $Ar_1$ and $Ar_2$ are each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, $R_1$ to $R_{12}$ are each independently selected from groups represented by Formula 2, hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), and —B($Q_4$)($Q_5$), wherein at least two selected from $R_1$ to $R_{12}$ are each independently a group represented by Formula 2, $R_{301}$ to $R_{304}$, and $R_{311}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted monovalent non-aromatic condensed polycyclic group, a substituted or unsubstituted thiophenyl group, a substituted or unsubstituted furanyl group, a substituted or unsubstituted pyrrolyl group, a substituted or unsubstituted benzothiophenyl group, a substituted or unsubstituted benzofuranyl group, a substituted or unsubstituted indolyl group, a substituted or unsubstituted dibenzothiophenyl group, a substituted or unsubstituted dibenzofuranyl group, a substituted or unsubstituted carbazolyl group, —Si($Q_1$)($Q_2$)($Q_3$), —B($Q_4$)($Q_5$), and —N($Q_6$)($Q_7$), xb20 is an integer selected from 1 to 10, and at least one substituent of the substituted anthracenylene group, substituted aromatic ring, substituted non-aromatic condensed polycyclic ring, substituted thiophenylene group, substituted furanylene group, substituted pyrrolylene group, substituted benzothiophenylene group, substituted benzofuranylene group, substituted indolylene group, substituted dibenzothiophenylene group, substituted dibenzofuranylene group, substituted carbazolylene group, substituted thiophenyl group, substituted furanyl group, substituted pyrrolyl group, substituted benzothiophenyl group, substituted benzofuranyl group, substituted indolyl group, substituted dibenzothiophenyl group, substituted dibenzofuranyl group, substituted carbazolyl group, substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group is selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), and —B($Q_{14}$)($Q_{15}$), a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), and —B($Q_{24}$)($Q_{25}$); and —Si($Q_{31}$)($Q_{32}$)($Q_{33}$) and —B($Q_{34}$)($Q_{35}$), wherein $Q_1$ to $Q_7$, $Q_{11}$ to $Q_{15}$, $Q_{21}$ to $Q_{25}$, and $Q_{31}$ to $Q_{35}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

2. The organic light-emitting device of claim 1, wherein $L_1$ is selected from a phenylene group, a pentalenylene group, an indenylene group, a naphthylene group, an azulenylene group, a heptalenylene group, an indacenylene group, an acenaphthylene group, a fluorenylene group, a spirobifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, a thiadiazolylene group, an imidazopyridinylene group, and an imidazopyrimidinylene group; and a phenylene group, a pentalenylene group, an indenylene group, a naphthylene group, an azulenylene group, a heptalenylene group, an indacenylene group, an acenaphthylene group, a fluorenylene group, a spirobifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, a thiadiazolylene group, an imidazopyridinylene group, and an imidazopyrimidinylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spirobifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, an imidazopyrimidinyl group, a diphenylethenyl group, a biphenyl group, a terphenyl group, and —Si($Q_{31}$)($Q_{32}$)($Q_{33}$), and $L_{301}$ to $L_{304}$, $L_{310}$, and $L_{311}$ are each independently selected from:

a phenylene group, a pentalenylene group, an indenylene group, a naphthylene group, an azulenylene group, a heptalenylene group, an indacenylene group, an acenaphthylene group, a fluorenylene group, a spirobifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an indolylene group, a benzothiophenylene group, a benzofuranylene group, a carbazolylene group, a dibenzothiophenylene group, and a dibenzofuranylene group; and a phenylene group, a pentalenylene group, an indenylene group, a naphthylene group, an azulenylene group, a heptalenylene group, an indacenylene group, an acenaphthylene group, a fluorenylene group, a spirobifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an indolylene group, a benzothiophenylene group, a benzofuranylene group, a carbazolylene group, a dibenzothiophenylene group, and a dibenzofuranylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spirobifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an indolyl group, a benzothiophenyl group, a benzofuranyl group, a carbazolyl group, a dibenzothiophenyl group, a dibenzofuranyl group, a diphenylethenyl group, a biphenyl group, a terphenyl group, and —Si($Q_{31}$)($Q_{32}$)($Q_{33}$), wherein $Q_{31}$ to $Q_{33}$ are each independently selected from a $C_1$-$C_{10}$ alkyl group, a $C_1$-$C_{10}$ alkoxy group, a phenyl group, a naphthyl group, a fluorenyl group, a spirobifluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, an oxadiazolyl group, a triazinyl group, a dibenzofuranyl group, a dibenzothiophenyl group, a benzocarbazolyl group, a dibenzocarbazolyl group, a dibenzosilolyl group, a thiadiazolyl group, an imidazopyridinyl group, an imidazopyrimidinyl group, a biphenyl group, and a terphenyl group.

3. The organic light-emitting device of claim 1, wherein $L_1$ is selected from groups represented by Formulae 3-1 to 3-35, and $L_{301}$ to $L_{304}$, $L_{310}$, and $L_{311}$ are each independently selected from groups represented by Formulae 3-1 to 3-9, 3-25 to 3-27, and 3-31 to 3-35:

Formula 3-1

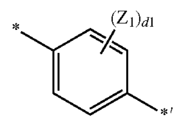

Formula 3-2

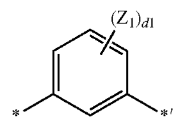

Formula 3-3

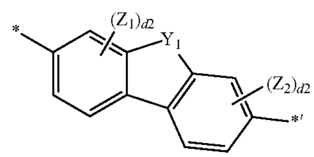

Formula 3-4

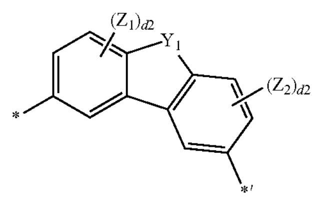

Formula 3-5

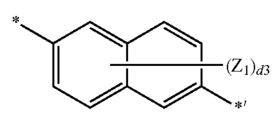

Formula 3-6

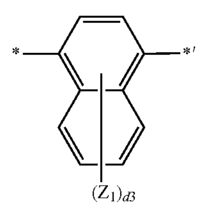

Formula 3-7

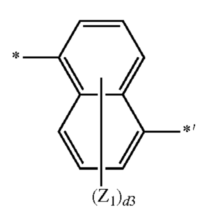

-continued
Formula 3-8
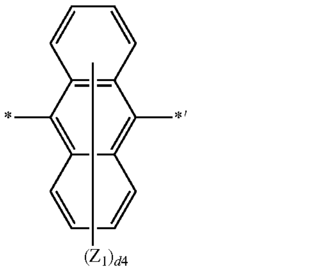
Formula 3-9
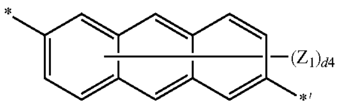
Formula 3-10
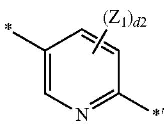
Formula 3-11
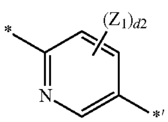
Formula 3-12
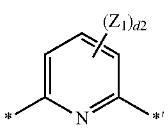
Formula 3-13
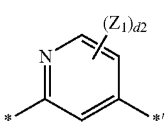
Formula 3-14
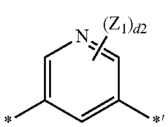
Formula 3-15
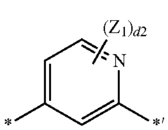
Formula 3-16
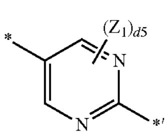
Formula 3-17
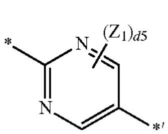
Formula 3-18
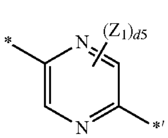
-continued
Formula 3-19
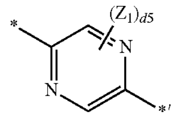
Formula 3-20
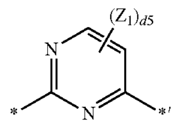
Formula 3-21
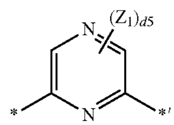
Formula 3-22
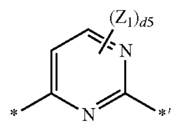
Formula 3-23
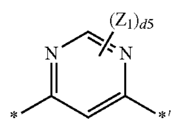
Formula 3-24
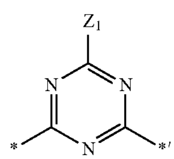
Formula 3-25
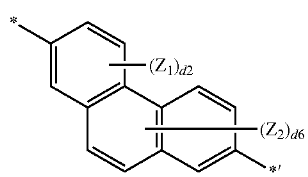
Formula 3-26
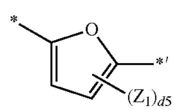
Formula 3-27
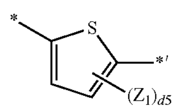
Formula 3-28
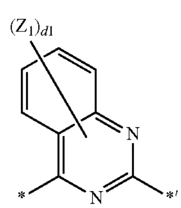
Formula 3-29
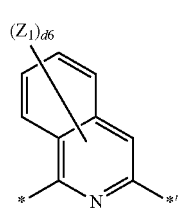

-continued

Formula 3-30

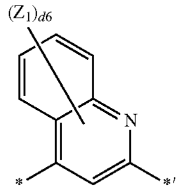

Formula 3-31

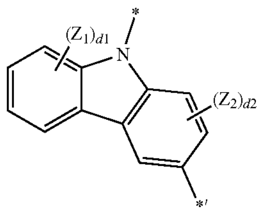

Formula 3-32

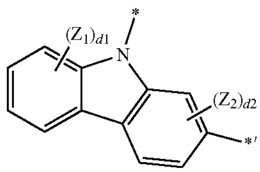

Formula 3-33

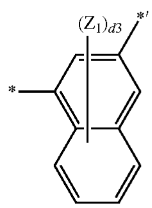

Formula 3-34

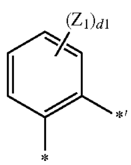

Formula 3-35

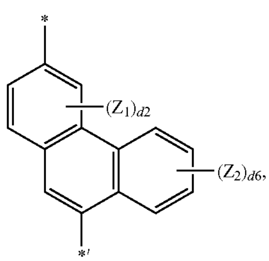

wherein, in Formulae 3-1 to 3-35, $Y_1$ is selected from O, S, $C(Z_3)(Z_4)$, $N(Z_5)$, and $Si(Z_6)(Z_7)$, and $Z_1$ to $Z_7$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spirobifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a diphenylethenyl group, a biphenyl group, a terphenyl group, and $—Si(Q_{31})(Q_{32})(Q_{33})$, wherein $Q_{31}$ to $Q_{33}$ are each independently selected from a $C_1$-$C_{10}$ alkyl group, a $C_1$-$C_{10}$ alkoxy group, a phenyl group, a naphthyl group, a pyridinyl group, a pyrimidinyl group, a triazinyl group, a biphenyl group, and a terphenyl group, d1 is an integer selected from 1 to 4, d2 is an integer selected from 1 to 3, d3 is an integer selected from 1 to 6, d4 is an integer selected from 1 to 8, d5 is an integer selected from 1 and 2, d6 is an integer selected from 1 to 5, and

* and *' each indicate a binding site to an adjacent atom.

4. The organic light-emitting device of claim 1, wherein $L_1$ is selected from groups represented by Formulae 4-1 to 4-28, and $L_{301}$ to $L_{304}$, $L_{310}$, and $L_{311}$ are each independently selected from groups represented by Formulae 4-1, 4-3, 4-5 to 4-8, 4-10 to 4-17, 4-20, 4-21, and 4-24 to 4-28:

Formula 4-1

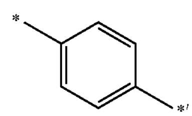

Formula 4-2

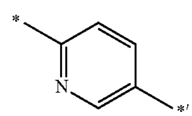

Formula 4-3

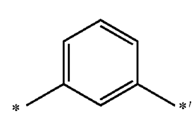

Formula 4-4

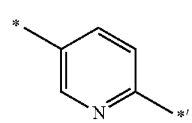

Formula 4-5

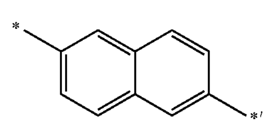

Formula 4-6

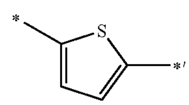

Formula 4-7

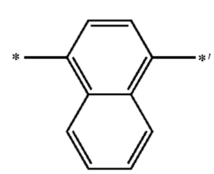

-continued
Formula 4-8
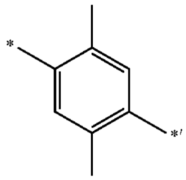
Formula 4-9
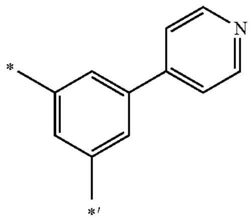
Formula 4-10
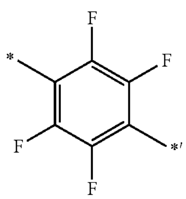
Formula 4-11
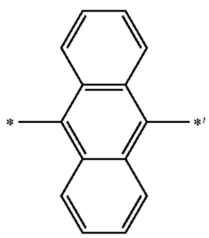
Formula 4-12
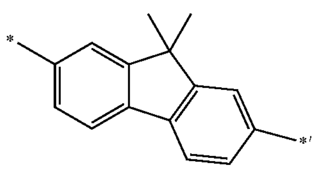
Formula 4-13
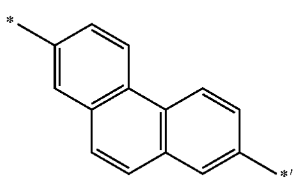
Formula 4-14
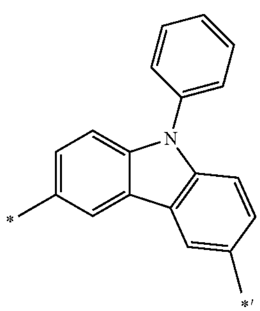
-continued
Formula 4-15
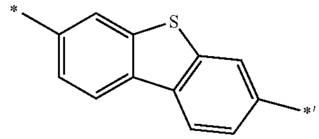
Formula 4-16
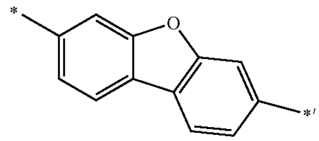
Formula 4-17
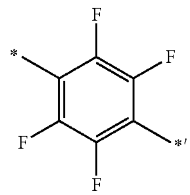
Formula 4-18
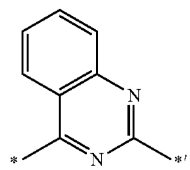
Formula 4-19
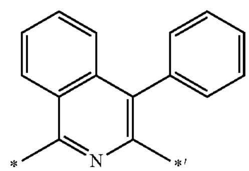
Formula 4-20
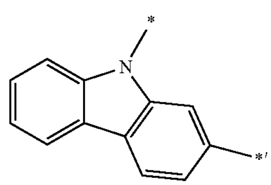
Formula 4-21
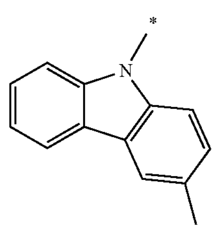
Formula 4-22
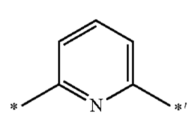
Formula 4-23
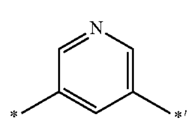

-continued

Formula 4-24

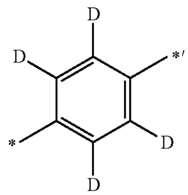

Formula 4-25

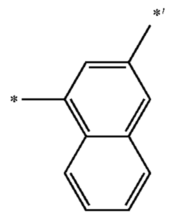

Formula 4-26

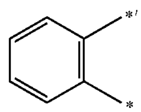

Formula 4-27

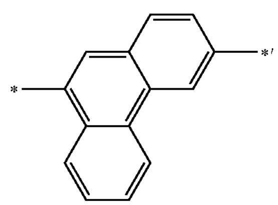

Formula 4-28

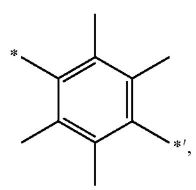

wherein, in Formulae 4-1 to 4-28, * and *' each indicate a binding site to an adjacent atom.

5. The organic light-emitting device of claim 1, wherein a1, xb1, and xb11 are each independently selected from 0, 1, and 2.

6. The organic light-emitting device of claim 1, wherein $An_1$ to $An_3$ are each independently selected from:

an anthracenylene group; and an anthracenylene group substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spirobifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an indolyl group, a benzothiophenyl group, a benzofuranyl group, a carbazolyl group, a dibenzothiophenyl group, a dibenzofuranyl group, a diphenylethenyl group, a biphenyl group, a terphenyl group, and —Si$(Q_{31})(Q_{32})(Q_{33})$, wherein $Q_{31}$ to $Q_{33}$ are each independently selected from a $C_1$-$C_{10}$ alkyl group, a $C_1$-$C_{10}$ alkoxy group, a phenyl group, a naphthyl group, a pyridinyl group, a pyrimidinyl group, a triazinyl group, a biphenyl group, and a terphenyl group.

7. The organic light-emitting device of claim 1, wherein $Ar_{311}$ is selected from:

a benzene, a naphthalene, a fluorene, a spirobifluorene, a benzofluorene, a dibenzofluorene, a phenanthrene, an anthracene, a pyrene, a triphenylene, and a chrysene; and a benzene, a naphthalene, a fluorene, a spirobifluorene, a benzofluorene, a dibenzofluorene, a phenanthrene, an anthracene, a pyrene, a triphenylene, and a chrysene, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spirobifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an indolyl group, a benzothiophenyl group, a benzofuranyl group, a carbazolyl group, a dibenzothiophenyl group, a dibenzofuranyl group, a diphenylethenyl group, a biphenyl group, a terphenyl group, and —Si$(Q_{31})(Q_{32})(Q_{33})$, wherein $Q_{31}$ to $Q_{33}$ are each independently selected from a $C_1$-$C_{10}$ alkyl group, a $C_1$-$C_{10}$ alkoxy group, a phenyl group, a naphthyl group, a pyridinyl group, a pyrimidinyl group, a triazinyl group, a biphenyl group, and a terphenyl group.

8. The organic light-emitting device of claim 1, wherein $Ar_1$ and $Ar_2$ are each independently selected from:

a phenyl group, a naphthyl group, a fluorenyl group, a spirobifluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, and an imidazopyrimidinyl group; and a phenyl group, a naphthyl group, a fluorenyl group, a spirobifluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, and an imidazopyrimidinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a phenyl group, a naphthyl group, a fluorenyl group, a spirobifluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, an imidazopyrimidinyl group, a diphenylethenyl group, a biphenyl group, a terphenyl group, and —Si($Q_{31}$)($Q_{32}$)($Q_{33}$), wherein $Q_{31}$ to $Q_{33}$ are each independently selected from a $C_1$-$C_{10}$ alkyl group, a $C_1$-$C_{10}$ alkoxy group, a phenyl group, a naphthyl group, a biphenyl group, and a terphenyl group.

9. The organic light-emitting device of claim 1, wherein $R_1$ to $R_{12}$ are each independently selected from:

groups represented by Formula 2, hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a phenyl group, a naphthyl group, a fluorenyl group, a spirobifluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, and an imidazopyrimidinyl group;

a phenyl group, a naphthyl group, a fluorenyl group, a spirobifluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, and an imidazopyrimidinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, an imidazopyrimidinyl group, and —Si($Q_{31}$)($Q_{32}$)($Q_{33}$); and —Si($Q_1$)($Q_2$)($Q_3$), wherein $Q_1$ to $Q_3$ and $Q_{31}$ to $Q_{33}$ are each independently selected from a $C_1$-$C_{10}$ alkyl group, a $C_1$-$C_{10}$ alkoxy group, a phenyl group, and a naphthyl group.

10. The organic light-emitting device of claim 1, wherein $R_{301}$ to $R_{304}$ and $R_{311}$ are each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_2$-$C_{10}$ alkenyl group, and a $C_1$-$C_{10}$ alkoxy group;

a $C_1$-$C_{20}$ alkyl group, a $C_2$-$C_{10}$ alkenyl group, and a $C_1$-$C_{10}$ alkoxy group, each substituted with at least one selected from a phenyl group, a naphthyl group, and an anthracenyl group;

a phenyl group, a naphthyl group, a fluorenyl group, a spirobifluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an indolyl group, a benzothiophenyl group, a benzofuranyl group, a carbazolyl group, a dibenzothiophenyl group, a dibenzofuranyl group, a phenoxy group, and a naphthoxy group;

a phenyl group, a naphthyl group, a fluorenyl group, a spirobifluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an indolyl group, a benzothiophenyl group, a benzofuranyl group, a carbazolyl group, a dibenzothiophenyl group, a dibenzofuranyl group, a phenoxy group, and a naphthoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_2$-$C_{10}$ alkenyl group, a $C_1$-$C_{10}$ alkoxy group, a phenyl group, a naphthyl group, a fluorenyl group, a spirobifluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an indolyl group, a benzothiophenyl group, a benzofuranyl group, a carbazolyl group, a dibenzothiophenyl group, a dibenzofuranyl group, a phenoxy group, a naphthoxy group, a diphenylethenyl group, a biphenyl group, a terphenyl group, and —$Si(Q_{31})(Q_{32})(Q_{33})$; and —$Si(Q_1)(Q_2)(Q_3)$ and —$N(Q_6)(Q_7)$, wherein $Q_1$ to $Q_3$, $Q_6$, $Q_7$, and $Q_{31}$ to $Q_{33}$ are each independently selected from a $C_1$-$C_{10}$ alkyl group, a $C_1$-$C_{10}$ alkoxy group, a phenyl group, a naphthyl group, a biphenyl group, and a terphenyl group.

11. The organic light-emitting device of claim 1, wherein $Ar_1$ and $Ar_2$ are each independently selected from groups represented by Formulae 5-1 to 5-43, $R_1$ to $R_{12}$ are each independently selected from groups represented by Formula 2, hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, —$Si(Q_1)(Q_2)(Q_3)$, and groups represented by Formulae 5-1 to 5-43, and $R_{301}$ to $R_{304}$ and $R_{311}$ are each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_2$-$C_{10}$ alkenyl group, and a $C_1$-$C_{10}$ alkoxy group;

a $C_1$-$C_{20}$ alkyl group, a $C_2$-$C_{10}$ alkenyl group, and a $C_1$-$C_{10}$ alkoxy group, each substituted with at least one selected from a phenyl group, a naphthyl group, and an anthracenyl group;

a phenoxy group and a naphthoxy group;

groups represented by Formulae 5-1 to 5-20; and

—$Si(Q_1)(Q_2)(Q_3)$ and —$N(Q_6)(Q_7)$;

wherein $Q_1$ to $Q_3$, $Q_6$, and $Q_7$ are each independently selected from a $C_1$-$C_{10}$ alkyl group, a $C_1$-$C_{10}$ alkoxy group, a phenyl group, a naphthyl group, a biphenyl group, and a terphenyl group:

Formula 5-1

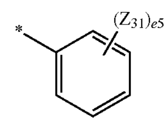

Formula 5-2

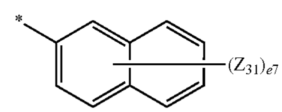

Formula 5-3

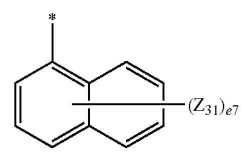

Formula 5-4

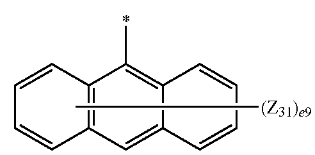

Formula 5-5

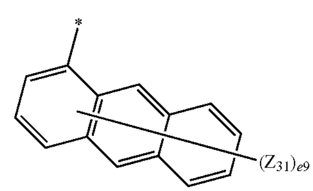

Formula 5-6

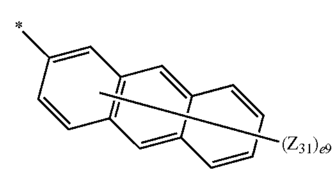

Formula 5-7

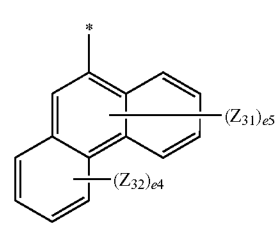

-continued
Formula 5-8
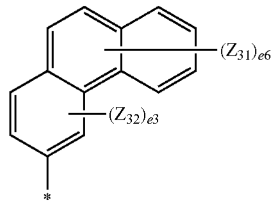
Formula 5-9
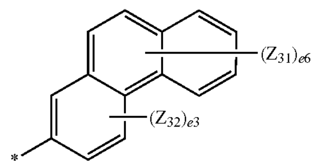
Formula 5-10
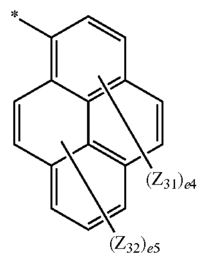
Formula 5-11
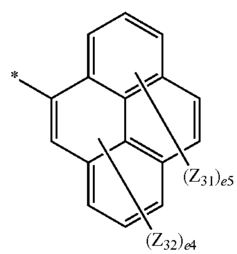
Formula 5-12
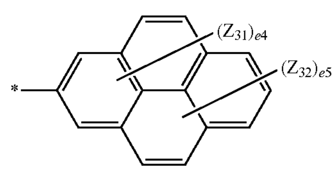
Formula 5-13
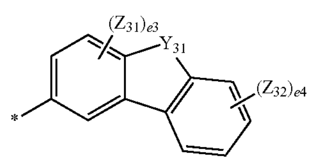
Formula 5-14
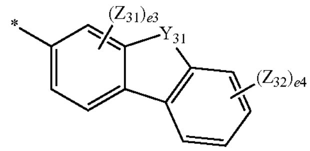
Formula 5-15
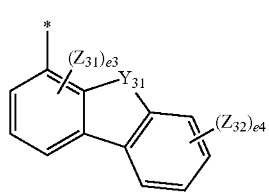
-continued
Formula 5-16
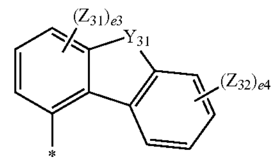
Formula 5-17
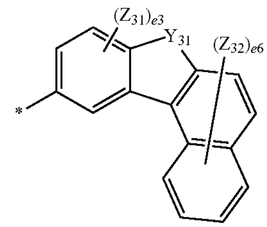
Formula 5-18
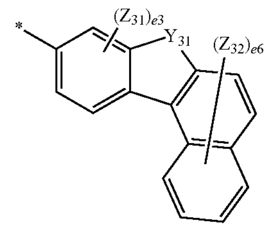
Formula 5-19
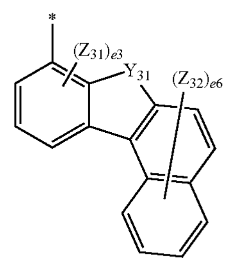
Formula 5-20
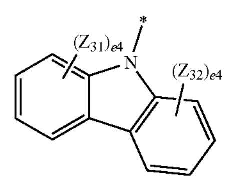
Formula 5-21
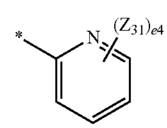
Formula 5-22
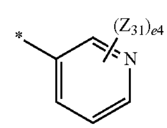
Formula 5-23
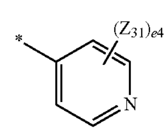
Formula 5-24
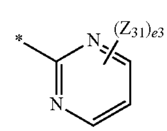

-continued

Formula 5-25

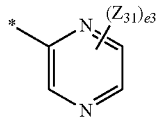

Formula 5-26

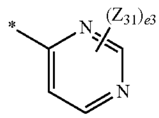

Formula 5-27

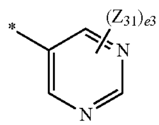

Formula 5-28

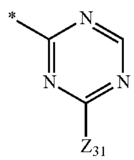

Formula 5-29

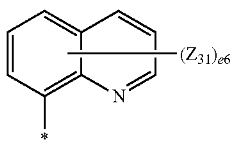

Formula 5-30

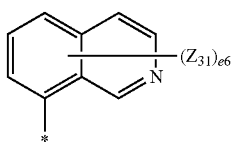

Formula 5-31

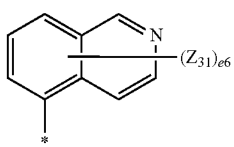

Formula 5-32

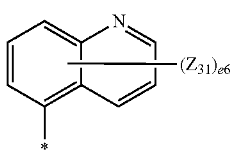

Formula 5-33

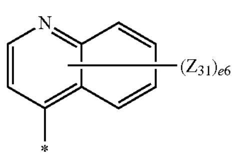

Formula 5-34

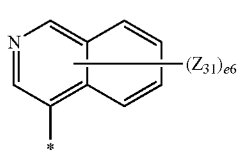

Formula 5-35

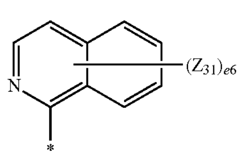

-continued

Formula 5-36

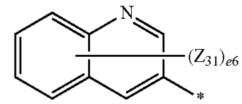

Formula 5-37

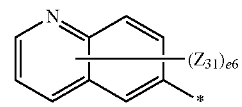

Formula 5-38

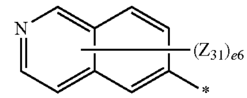

Formula 5-39

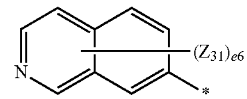

Formula 5-40

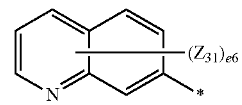

Formula 5-41

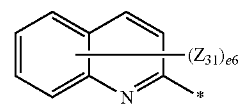

Formula 5-42

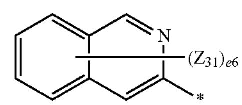

Formula 5-43

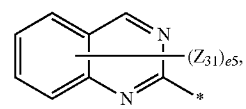

wherein, in Formulae 5-1 to 5-43, $Y_{31}$ is selected from O, S, $C(Z_{33})(Z_{34})$, $N(Z_{35})$, and $Si(Z_{36})(Z_{37})$, and $Z_{31}$ to $Z_{37}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spirobifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a diphenylethenyl group, a biphenyl group, a terphenyl group, and $—Si(Q_{31})(Q_{32})(Q_{33})$, wherein $Q_{31}$ to $Q_{33}$ are each independently selected from a $C_1$-$C_{10}$ alkyl group, a $C_1$-$C_{10}$ alkoxy group, a phenyl group, a naphthyl group, a biphenyl group, and a terphenyl group, e2 is 1 or 2, e3 is an integer selected from 1 to 3, e4 is an integer selected from 1 to 4, e5 is an integer selected from 1 to 5, e6 is an integer selected from 1 to 6, e7 is an integer selected from 1 to 7, e9 is an integer selected from 1 to 9, and

* indicates a binding site to an adjacent atom.

12. The organic light-emitting device of claim 1, wherein $Ar_1$ and $Ar_2$ are each independently selected from groups represented by Formulae 6-1 to 6-41, and $R_1$ to $R_{12}$ are each independently selected from groups represented by Formula 2, hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, —Si($Q_1$)($Q_2$)($Q_3$), a phenyl group, a naphthyl group, a pyridinyl group, a pyrimidinyl group, a triazinyl group, a biphenyl group, and a terphenyl group, wherein $Q_1$ to $Q_3$ are each independently selected from a $C_1$-$C_{10}$ alkyl group, a $C_1$-$C_{10}$ alkoxy group, a phenyl group, a naphthyl group, a biphenyl group, and a terphenyl group:

Formula 6-1

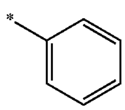

Formula 6-2

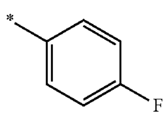

Formula 6-3

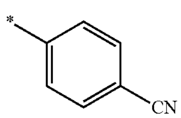

Formula 6-4

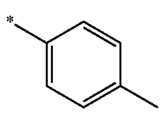

Formula 6-5

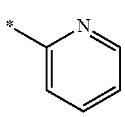

Formula 6-6

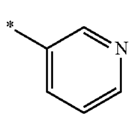

Formula 6-7

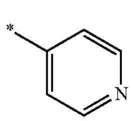

Formula 6-8

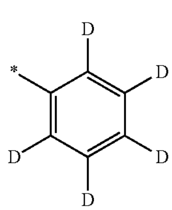

-continued

Formula 6-9

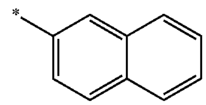

Formula 6-10

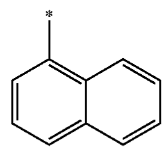

Formula 6-11

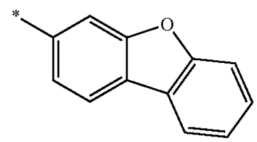

Formula 6-12

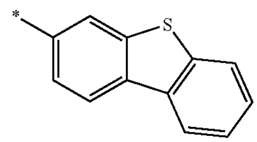

Formula 6-13

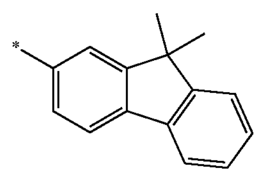

Formula 6-14

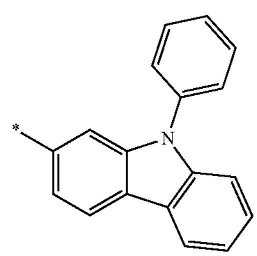

Formula 6-15

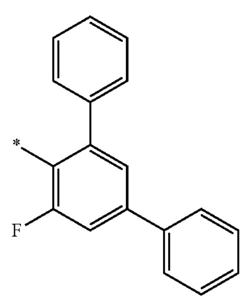

Formula 6-16

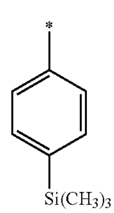

-continued
Formula 6-17
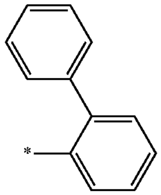
Formula 6-18
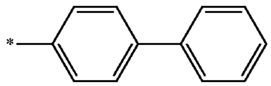
Formula 6-19
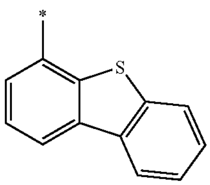
Formula 6-20
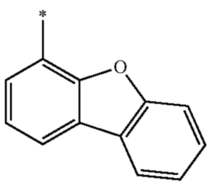
Formula 6-21
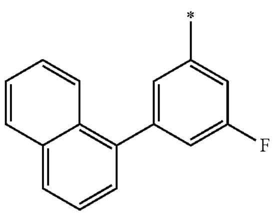
Formula 6-22
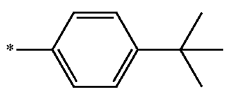
Formula 6-23
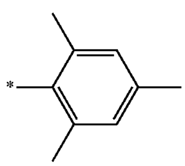
Formula 6-24
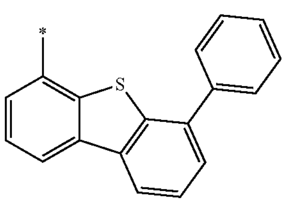
Formula 6-25
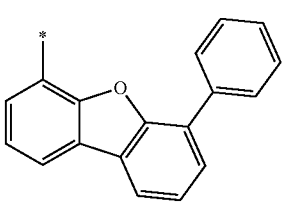
-continued
Formula 6-26
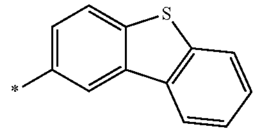
Formula 6-27
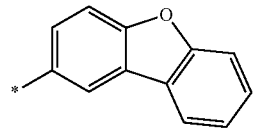
Formula 6-28
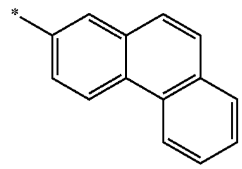
Formula 6-29
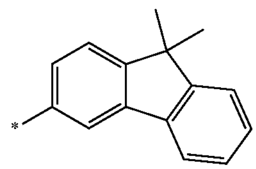
Formula 6-30
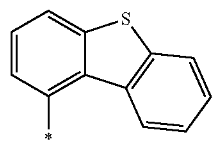
Formula 6-31
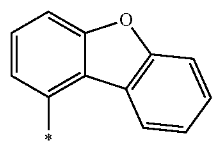
Formula 6-32
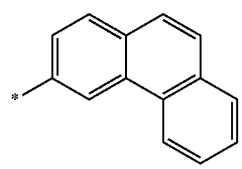
Formula 6-33
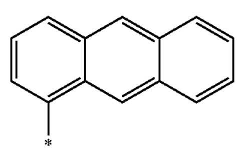
Formula 6-34
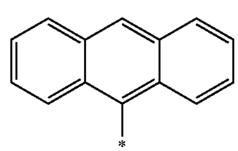
Formula 6-35
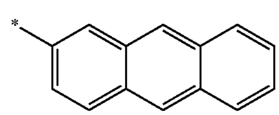

-continued

Formula 6-36

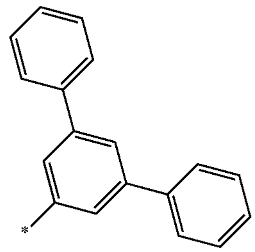

Formula 6-37

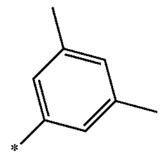

Formula 6-38

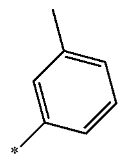

Formula 6-39

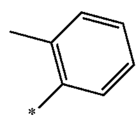

Formula 6-40

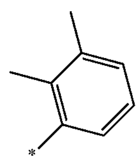

Formula 6-41

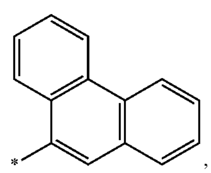

wherein, in Formulae 6-1 to 6-41, * indicates a binding site to an adjacent atom.

13. The organic light-emitting device of claim 1, wherein the condensed cyclic compound is represented by one of Formulae 1-1 to 1-4:

Formula 1-1

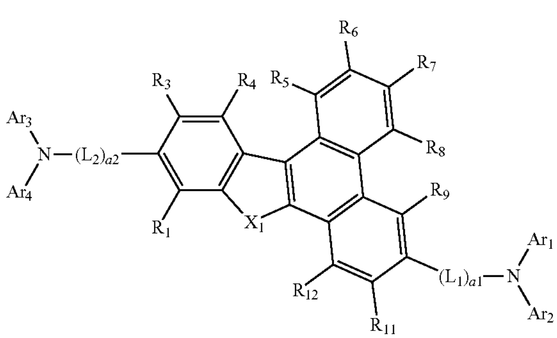

-continued

Formula 1-2

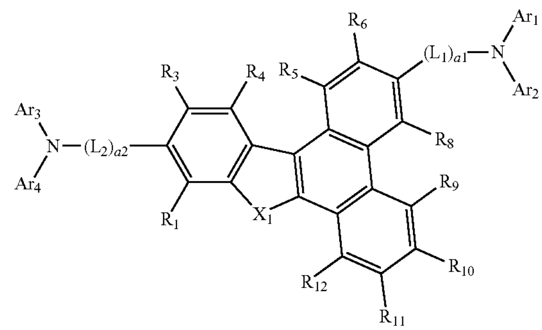

Formula 1-3

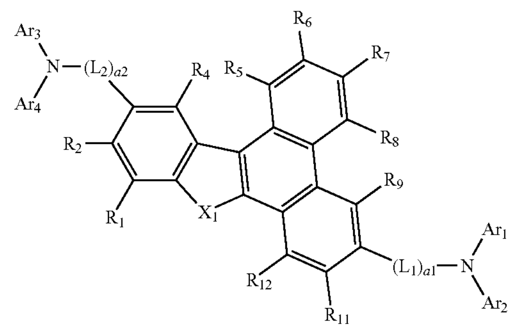

Formula 1-4

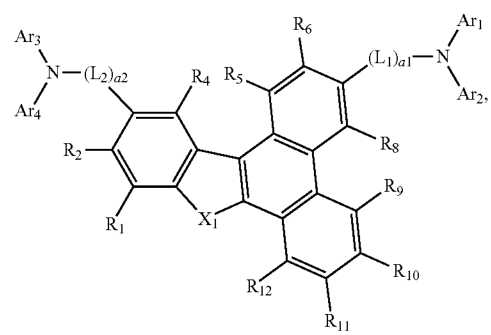

wherein, in Formulae 1-1 to 1-4, descriptions for $X_1$, $L_1$, a1, $Ar_t$, $Ar_2$, and $R_1$ to $R_{12}$ are the same as in Formulae 1 and 2, and descriptions for $L_2$, a2, $Ar_3$, and $Ar_4$ are the same as the descriptions for $L_1$, a1, $Ar_1$, and $Ar_2$, respectively.

14. The organic light-emitting device of claim 1, wherein the condensed cyclic compound is represented by one of Formulae 1-1(1) to 1-1(4):

Formula 1-1(1)

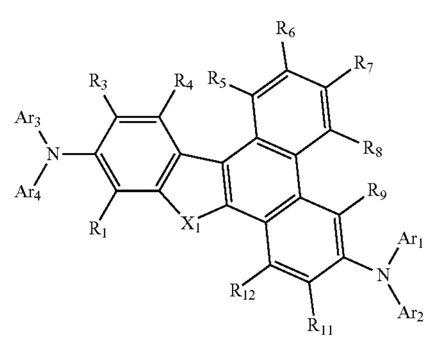

-continued

Formula 1-1(2)

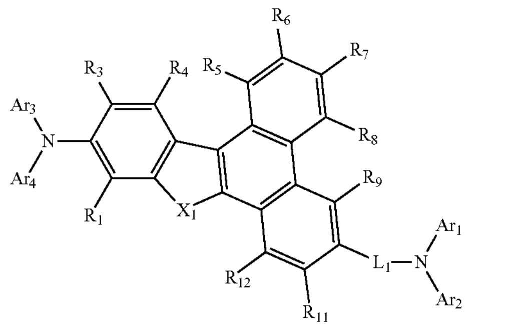

Formula 1-1(3)

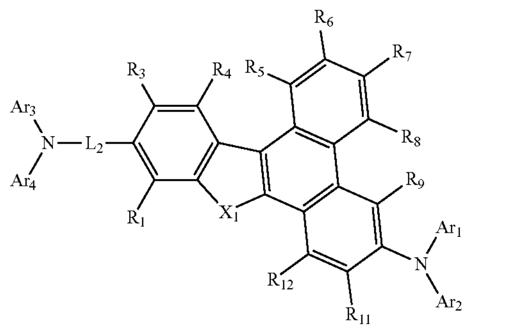

Formula 1-1(4)

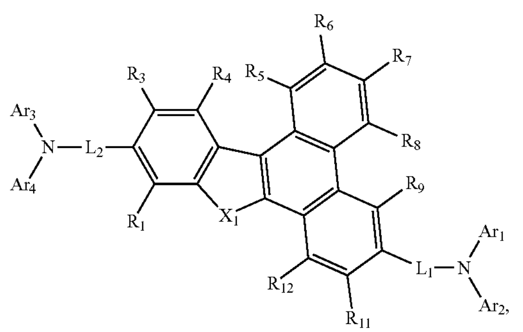

wherein, in Formulae 1-1(1) to 1-1(4), descriptions for $X_1$, $L_1$, $Ar_1$, $Ar_2$, $R_1$, $R_3$ to $R_9$, and $R_{11}$ to $R_{12}$ are the same as in Formulae 1 and 2, and descriptions for $L_2$, $Ar_3$, and $Ar_4$ are the same as the descriptions for $L_1$, $Ar_1$, and $Ar_2$, respectively.

15. The organic light-emitting device of claim 1, wherein the first compound is represented by one of Formulae 11-1 to 11-7, the second compound is represented by one of Formulae 12-1 to 12-3, and the third compound is represented by one of Formulae 13-1 to 13-11:

Formula 11-1

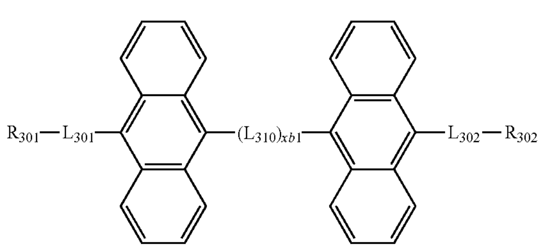

-continued

Formula 11-2

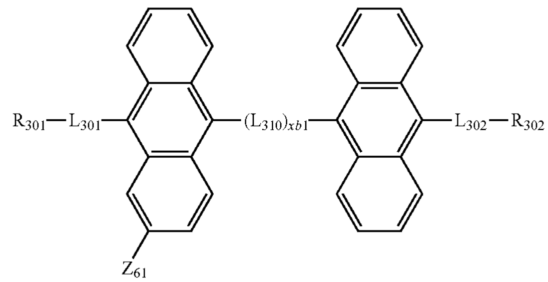

Formula 11-3

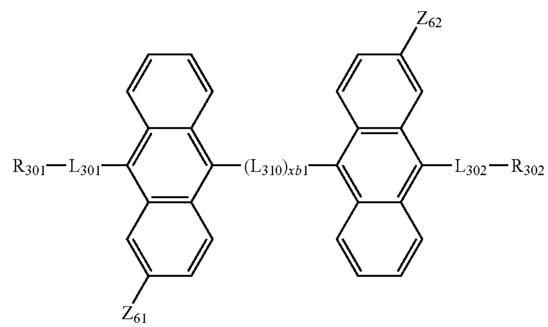

Formula 11-4

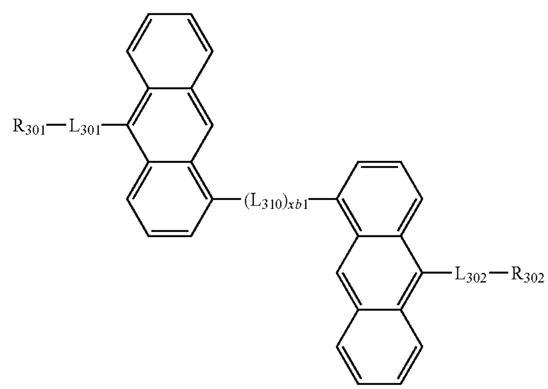

Formula 11-5

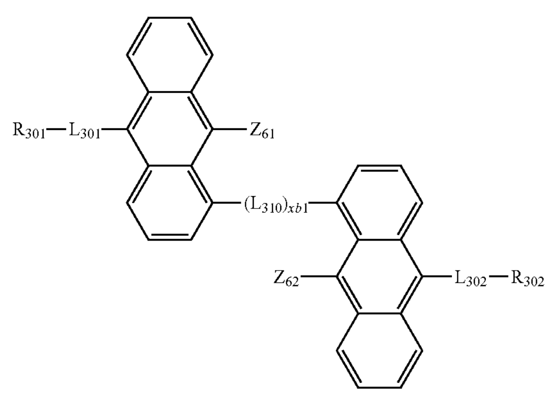

-continued
Formula 11-6
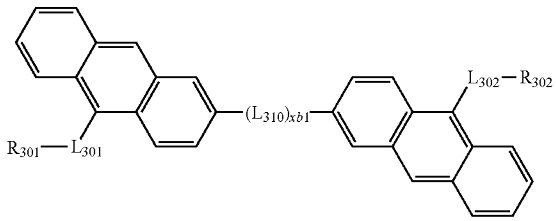
Formula 11-7
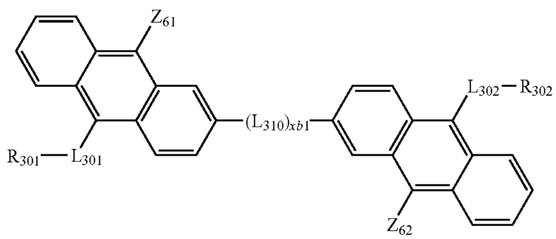
Formula 12-1
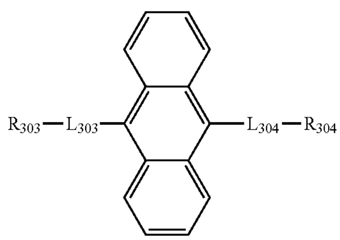
Formula 12-2
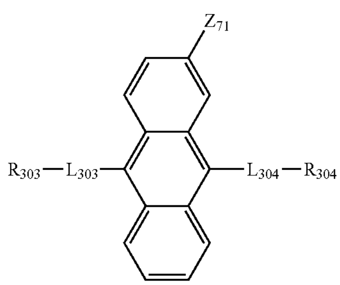
Formula 12-3
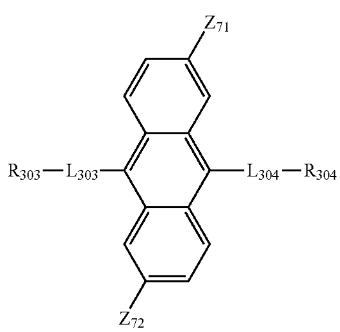
Formula 13-1
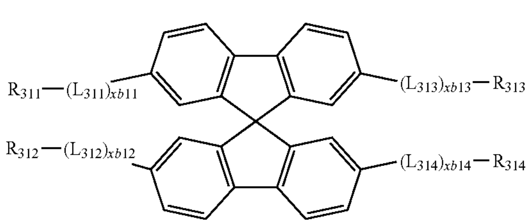
-continued
Formula 13-2
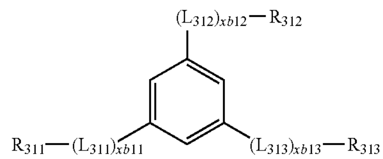
Formula 13-3
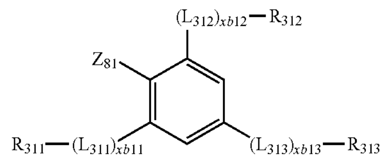
Formula 13-4
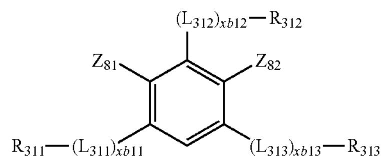
Formula 13-5
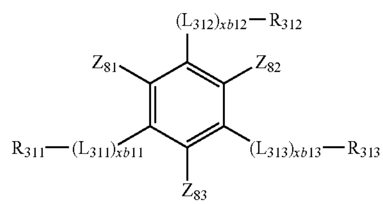
Formula 13-6
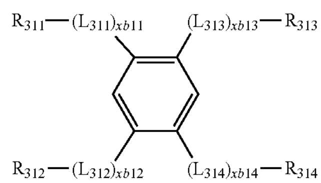
Formula 13-7
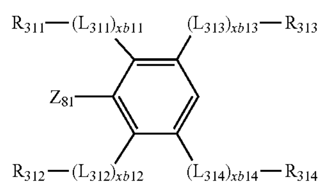
Formula 13-8
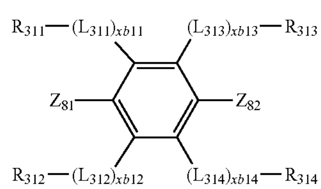
Formula 13-9
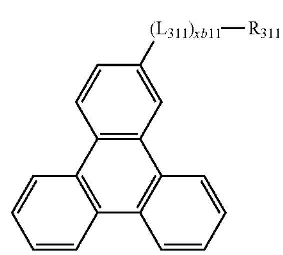

-continued

Formula 13-10

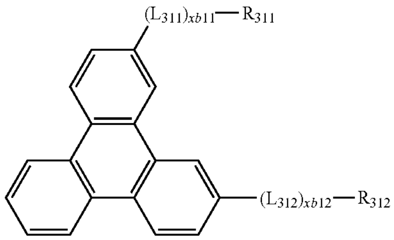

Formula 13-11

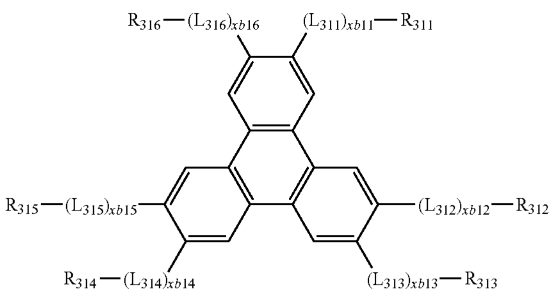

wherein, in Formulae 11-1 to 11-7, 12-1 to 12-3, and 13-1 to 13-11, descriptions for $L_{301}$ to $L_{304}$, $L_{310}$, $L_{311}$, xb1, xb11, $R_{301}$ to $R_{304}$, and $R_{311}$ are the same as in Formulae 11 to 13, $L_{312}$ to $L_{316}$ are each independently the same as $L_{311}$, xb12 to xb16 are each independently the same as xb11, $R_{312}$ to $R_{316}$ are each independently the same as $R_{311}$, and $Z_{61}$, $Z_{62}$, $Z_{71}$, $Z_{72}$, and $Z_{81}$ to $Z_{83}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spirobifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an indolyl group, a benzothiophenyl group, a benzofuranyl group, a carbazolyl group, a dibenzothiophenyl group, a dibenzofuranyl group, a diphenylethenyl group, a biphenyl group, a terphenyl group, and —Si($Q_{31}$)($Q_{32}$)($Q_{33}$), wherein $Q_{31}$ to $Q_{33}$ are each independently selected from a $C_1$-$C_{10}$ alkyl group, a $C_1$-$C_{10}$ alkoxy group, a phenyl group, a naphthyl group, a pyridinyl group, a pyrimidinyl group, a triazinyl group, a biphenyl group, and a terphenyl group.

16. The organic light-emitting device of claim 1, wherein the condensed cyclic compound is selected from Compounds 1 to 248 and 1A to 249A:

1

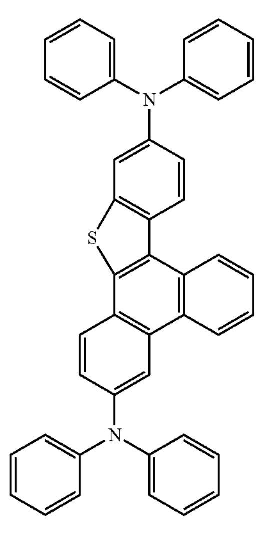

2

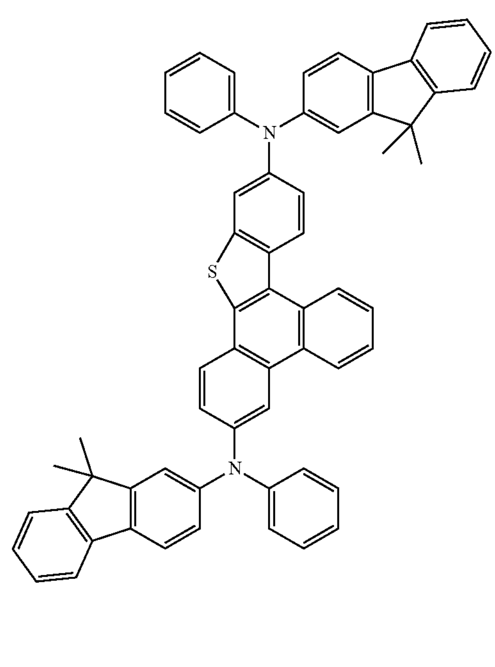

-continued
3
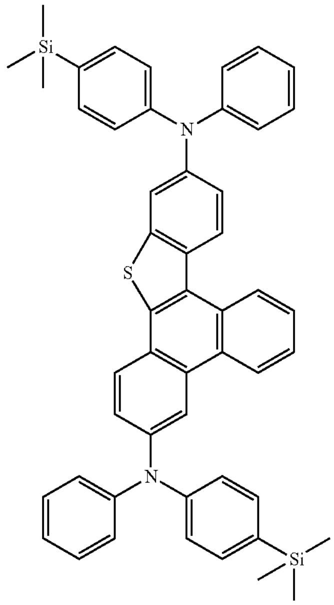
4
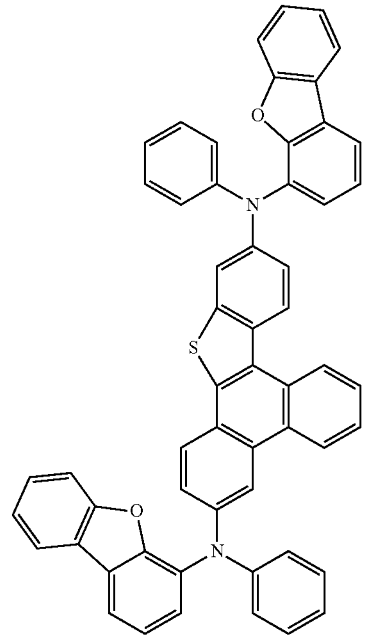
5
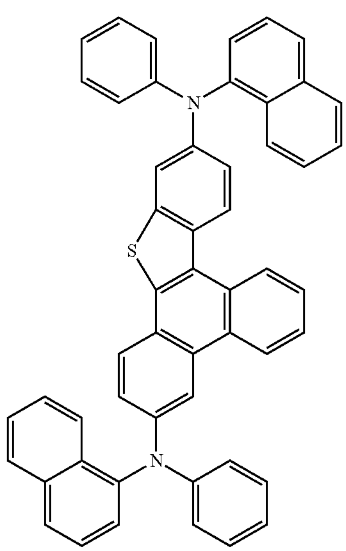
6
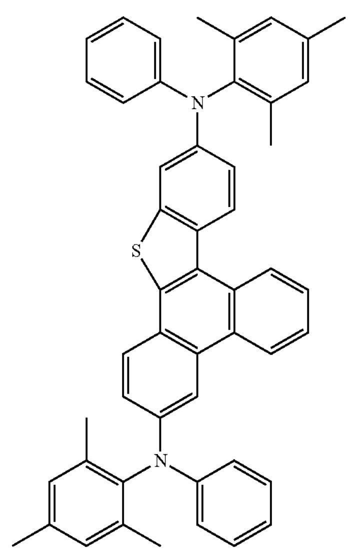

-continued
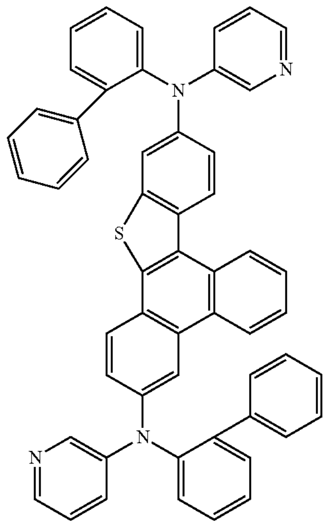
7
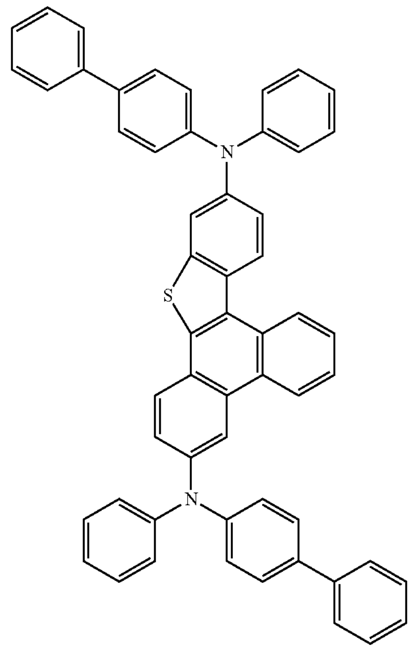
8
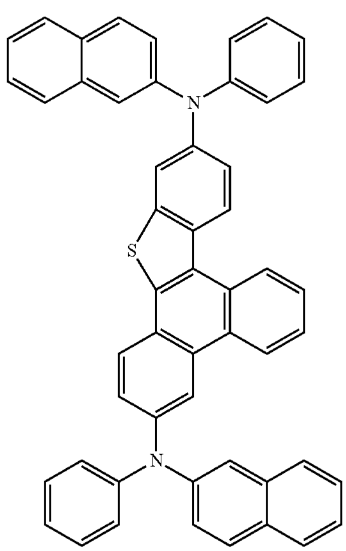
9
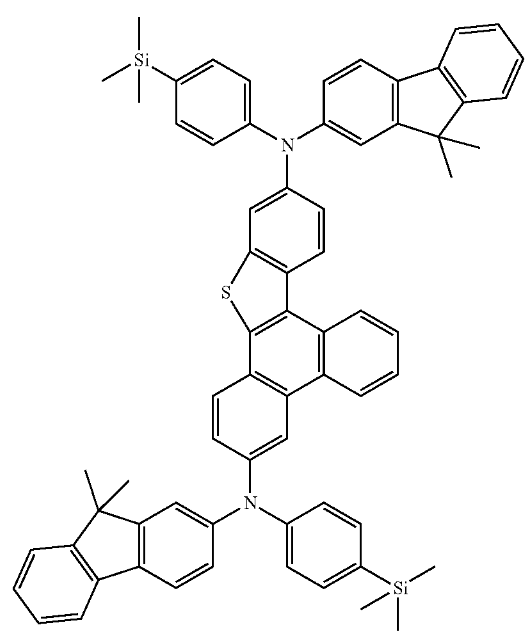
10

-continued
11
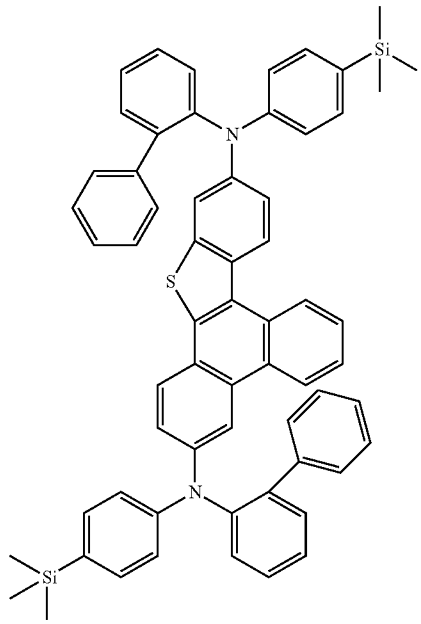
12
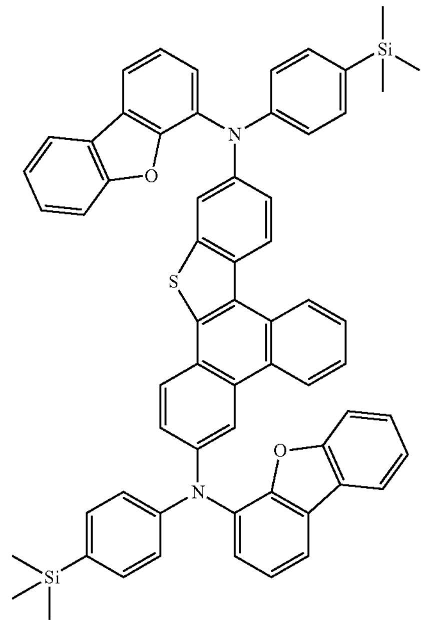
13
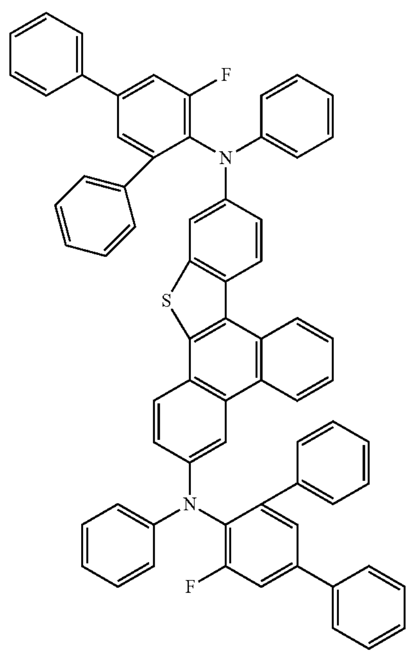
14
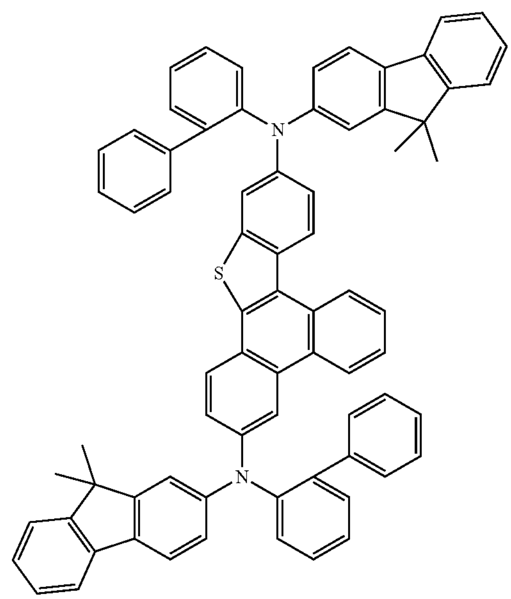

-continued
15
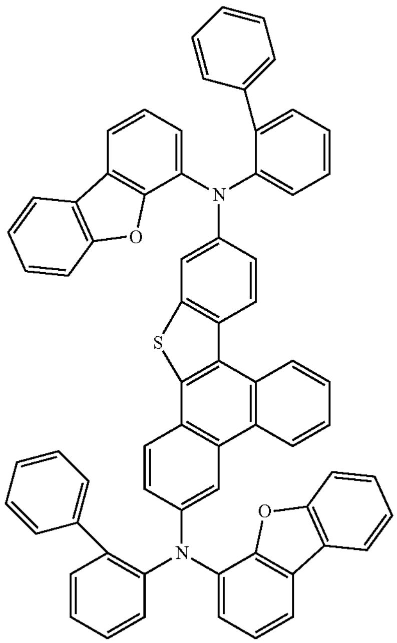
16
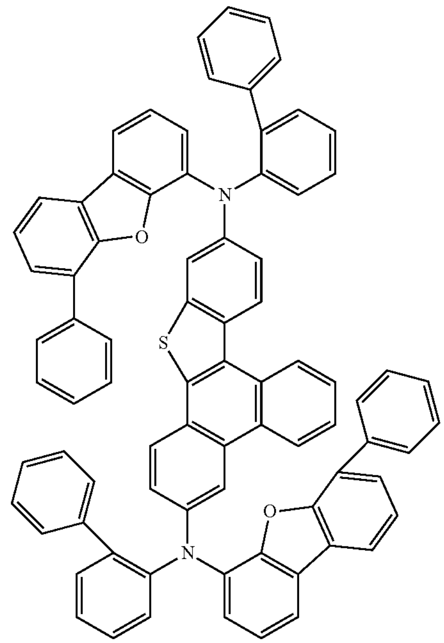
17
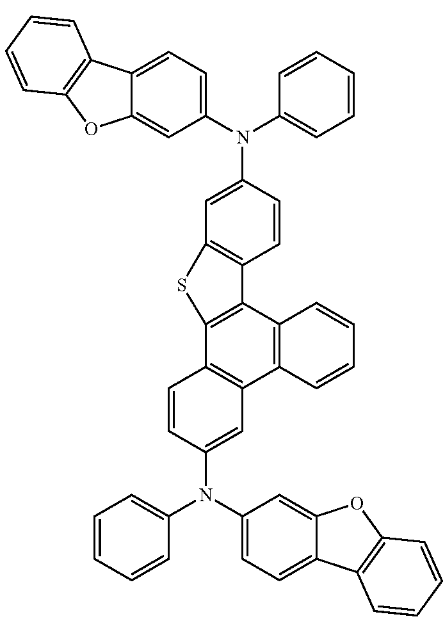
18
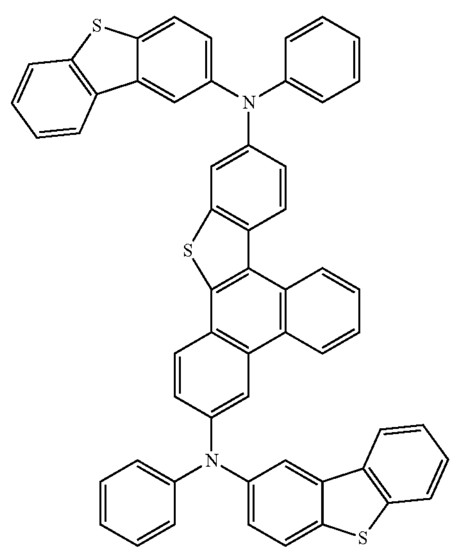

-continued
19
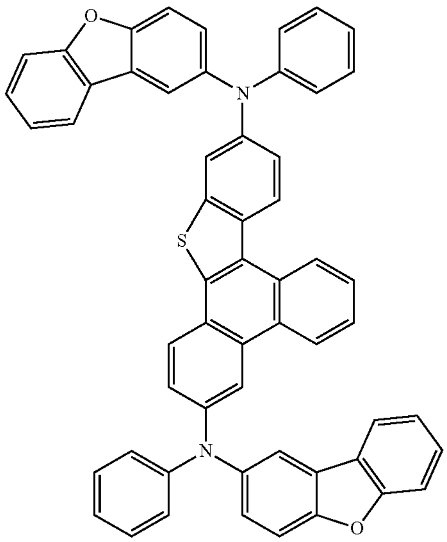
20
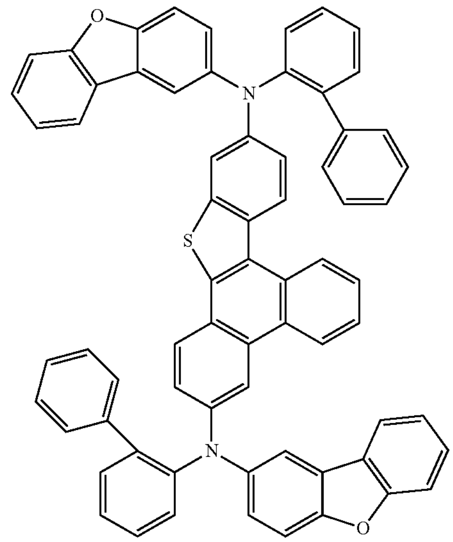
21
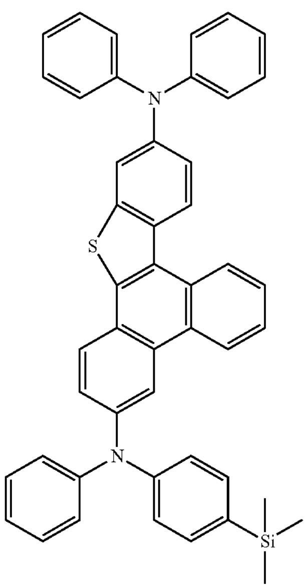
22
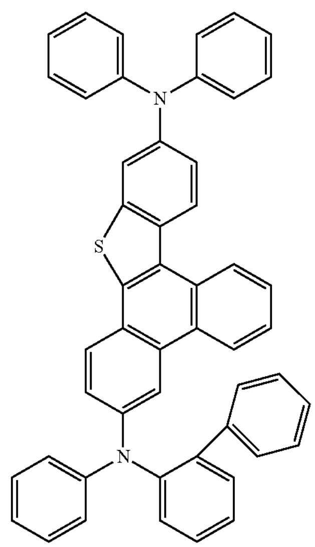
23
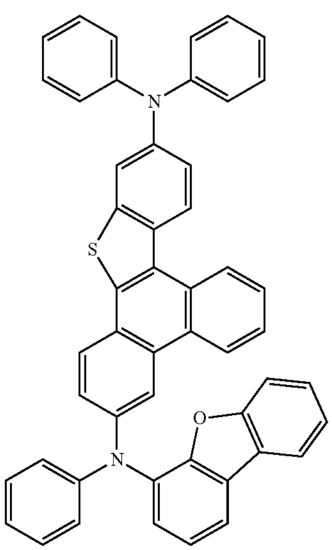
24
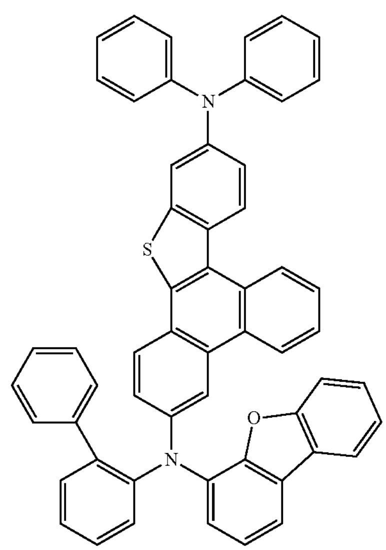

-continued
25
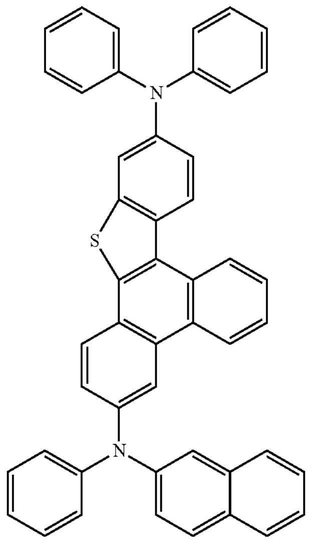
26
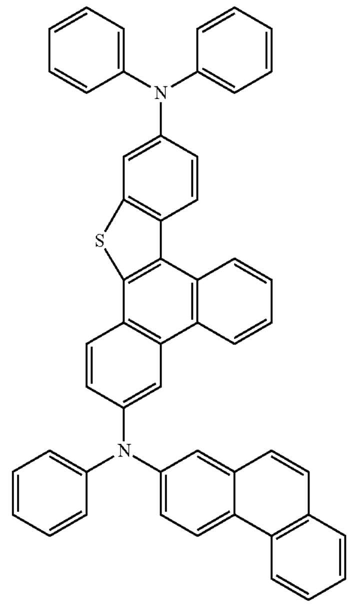
27
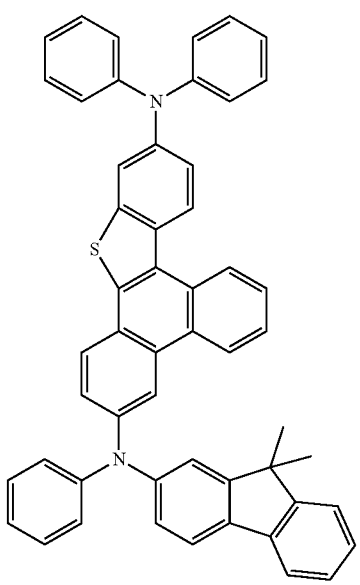
28
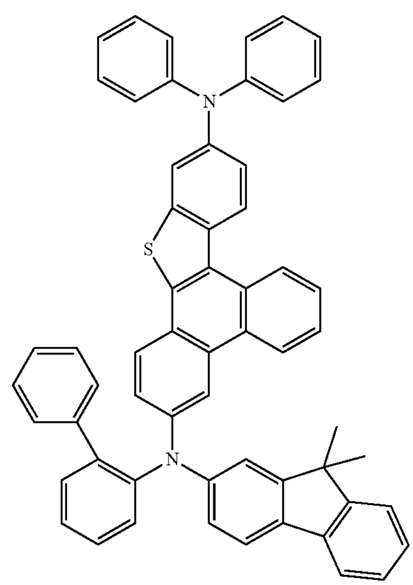

-continued
29
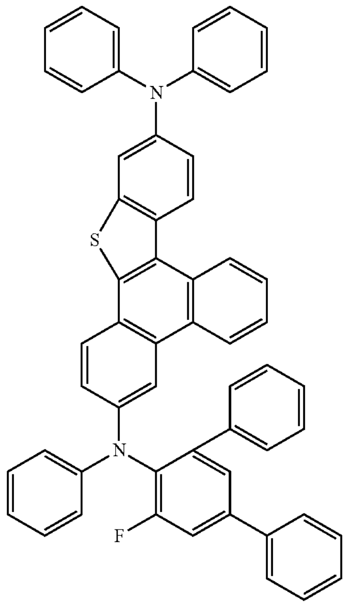
30
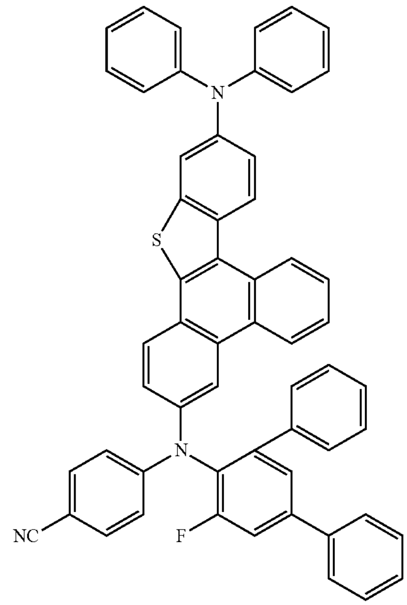
31
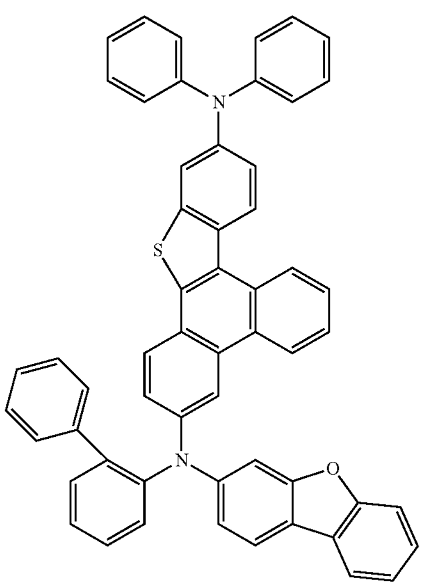
32
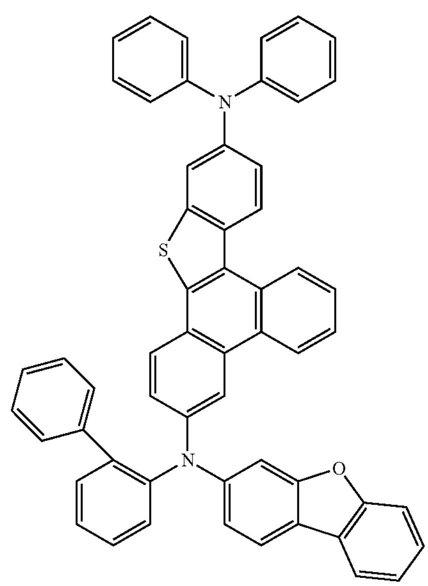

-continued
33
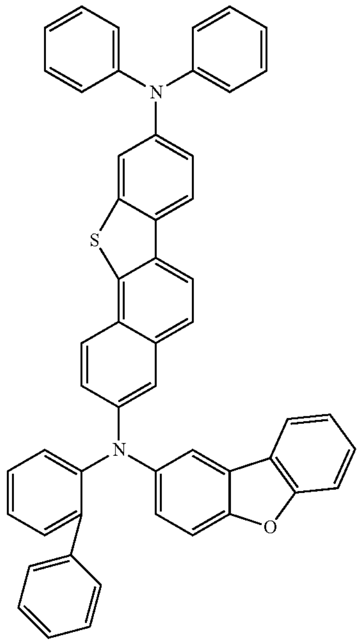
34
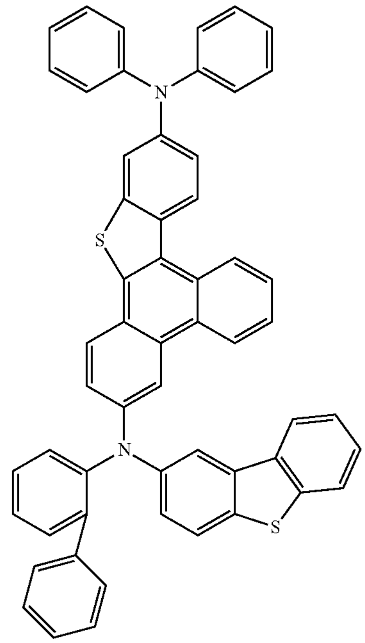
35
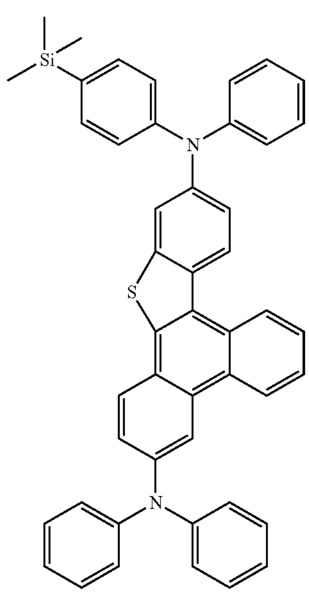
36
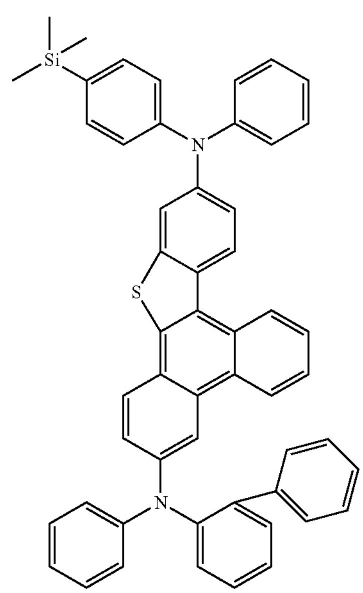

-continued
37
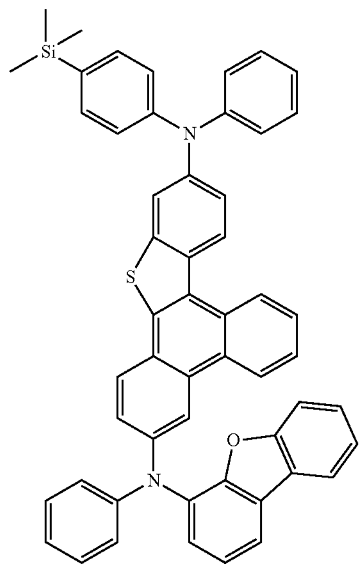
38
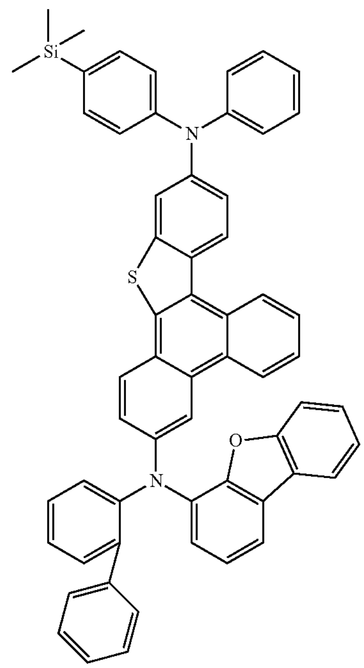
39
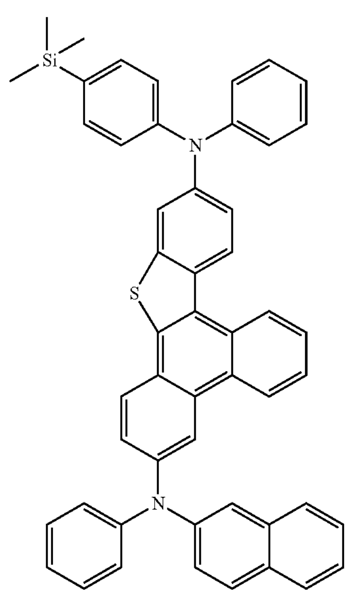
40
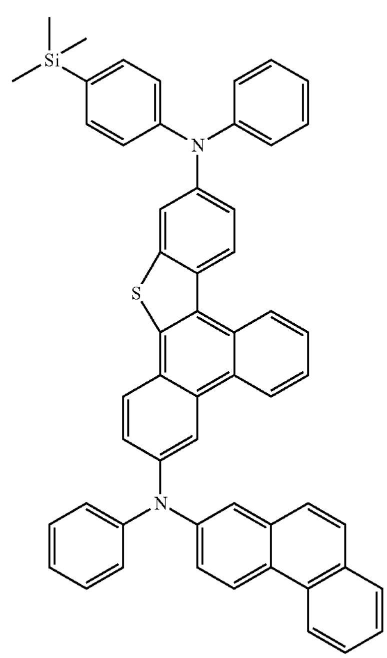

-continued
41
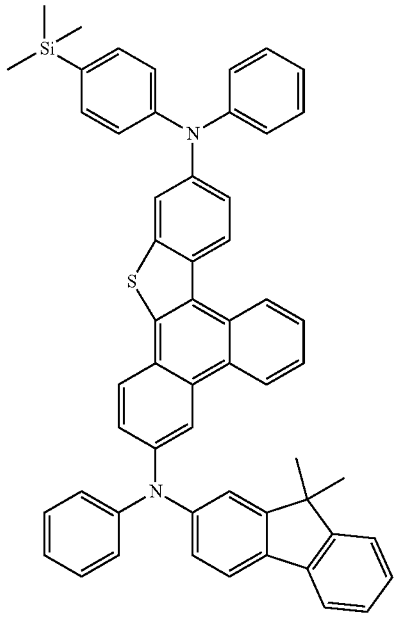
42
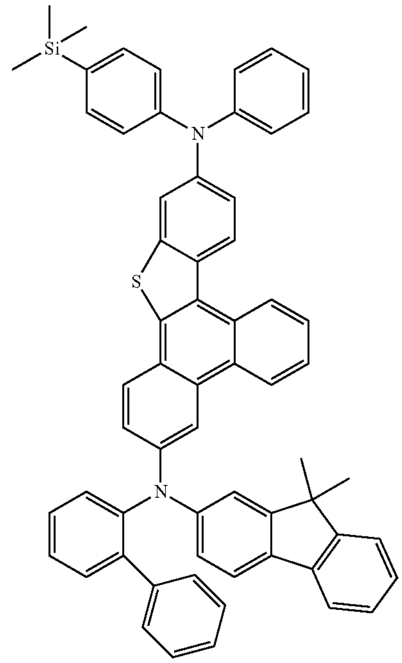
43
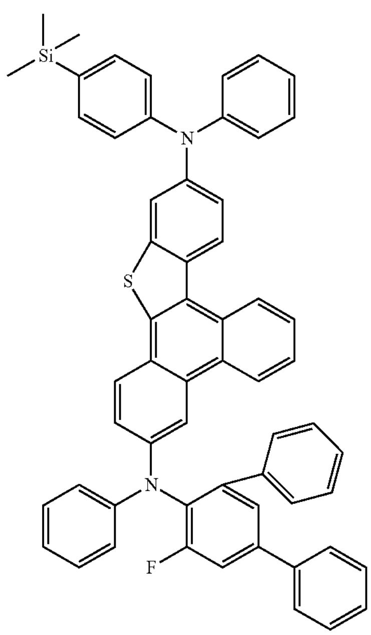
44
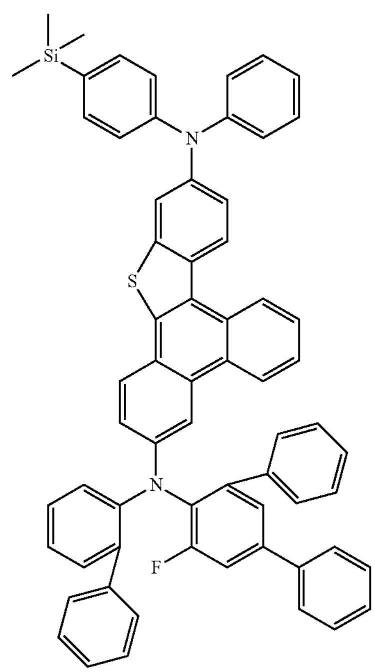

-continued
45
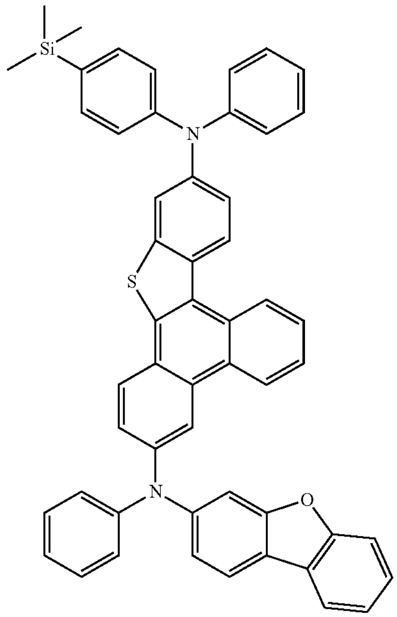
46
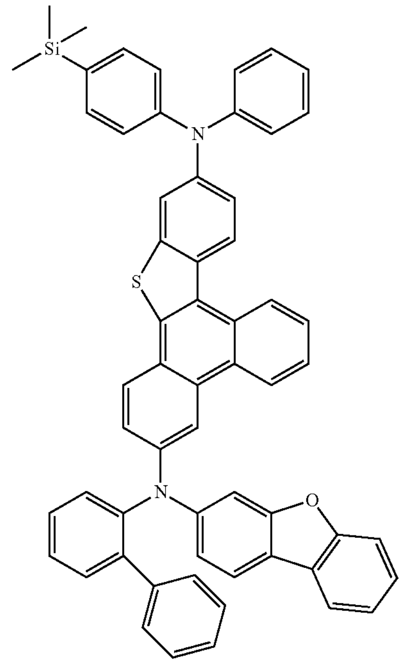
47
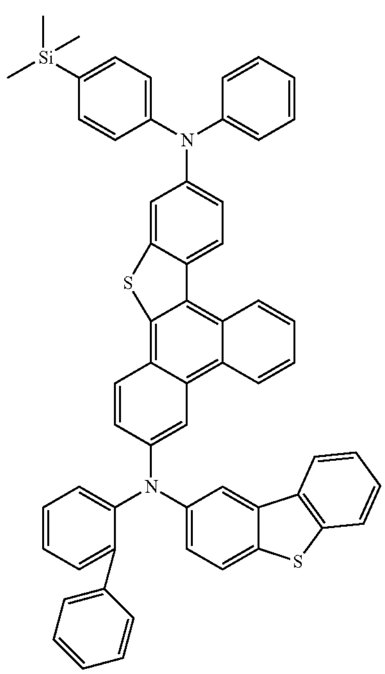
48
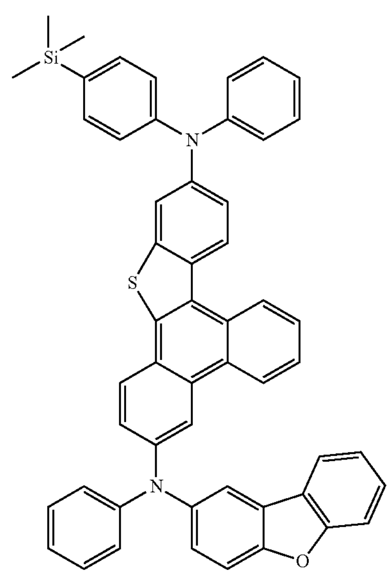

-continued
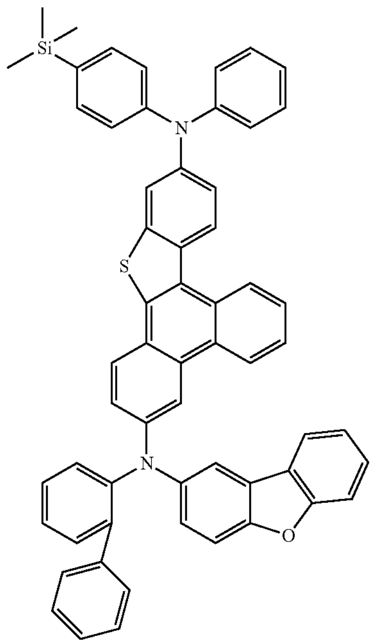
49
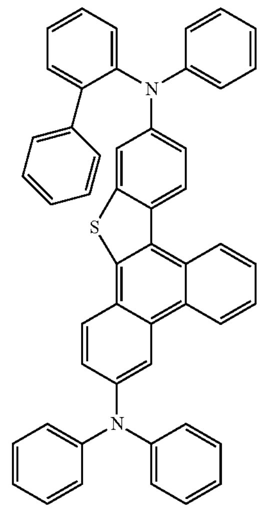
50
51
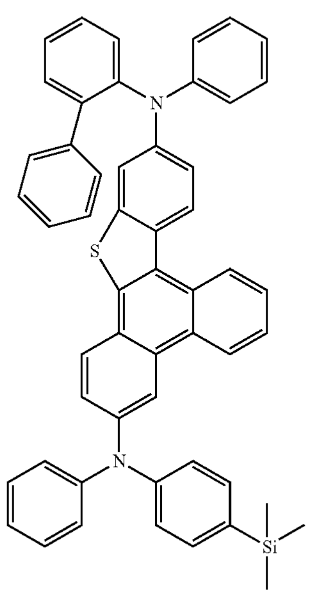
52
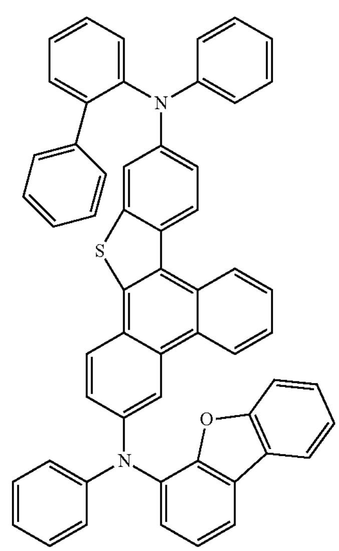

-continued
53
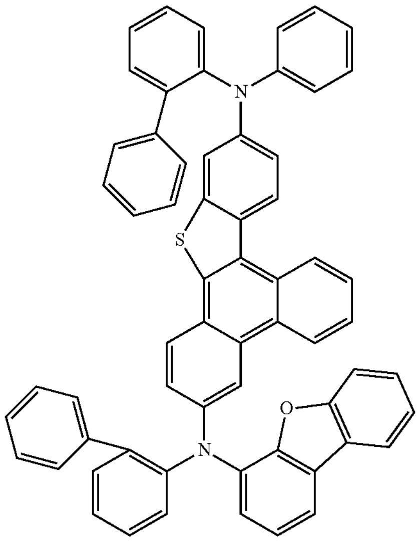
54
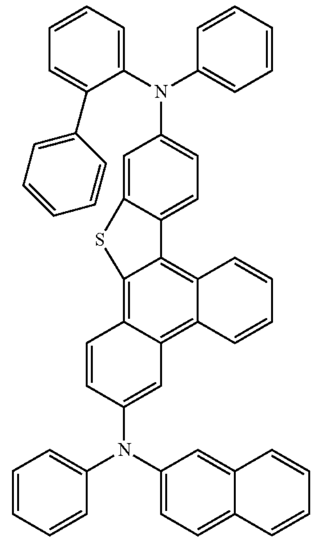
55
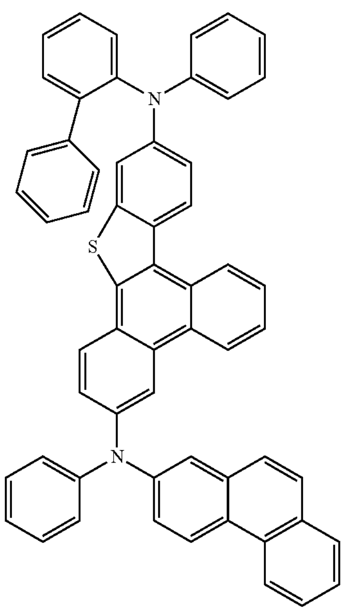
56
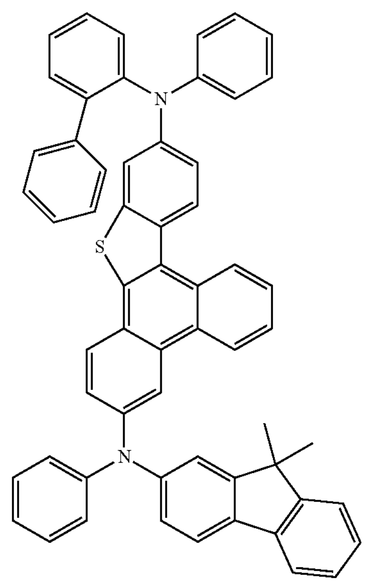

-continued
57
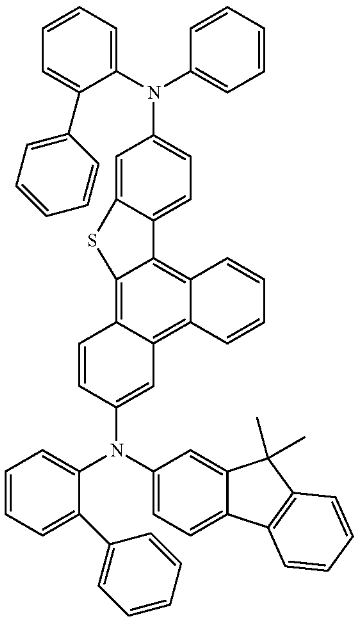
58
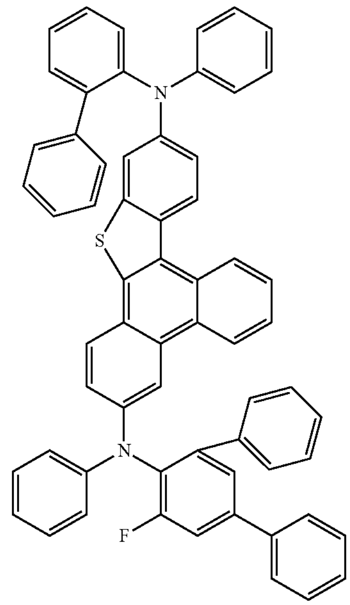
59
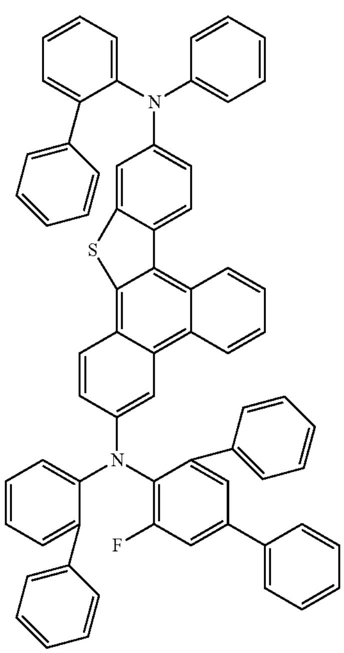
60
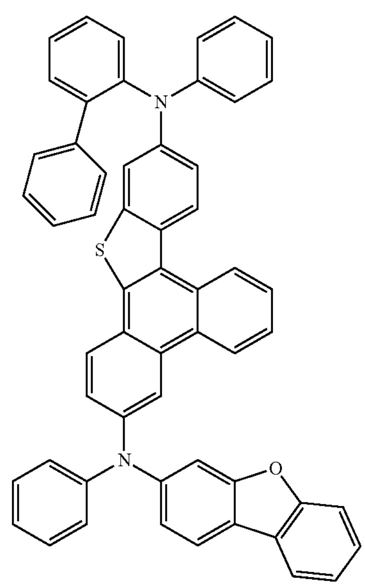

-continued
61
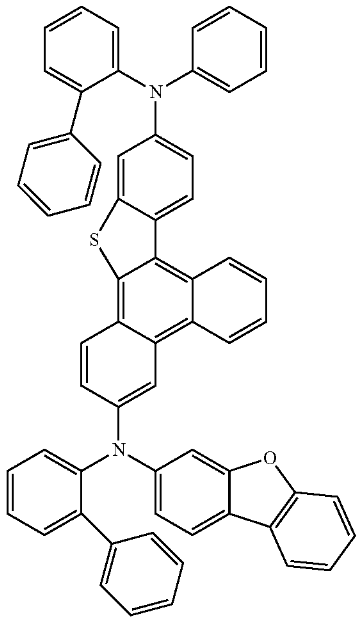
62
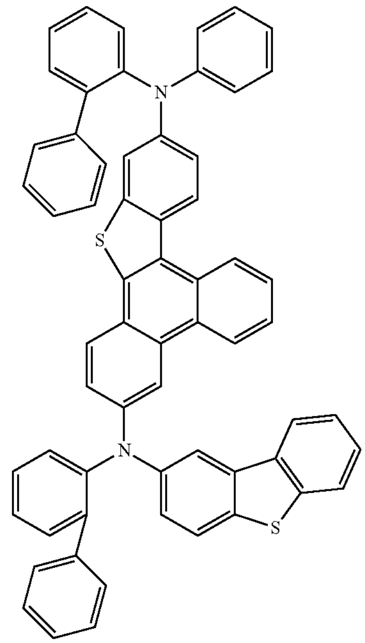
63
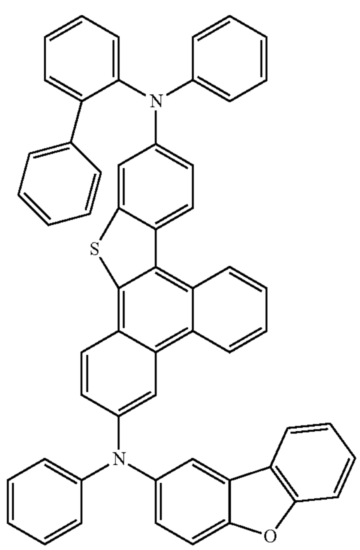
64
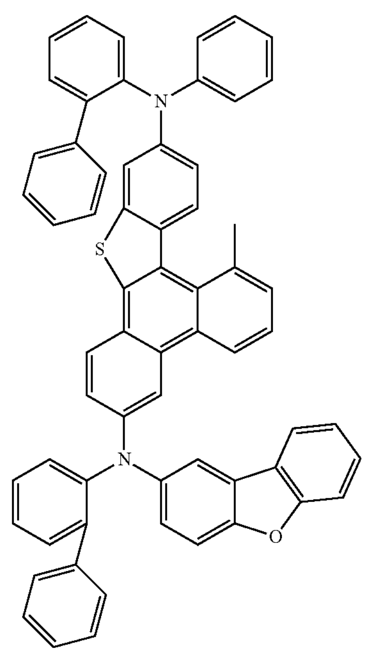

-continued
65
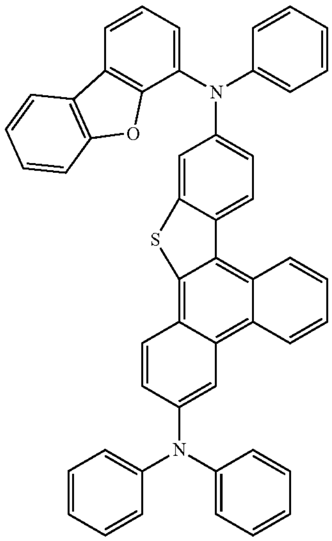
66
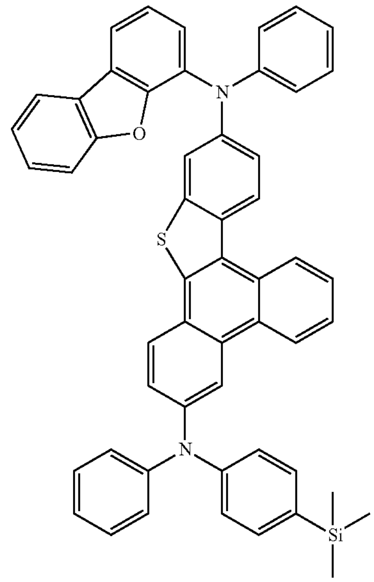
67
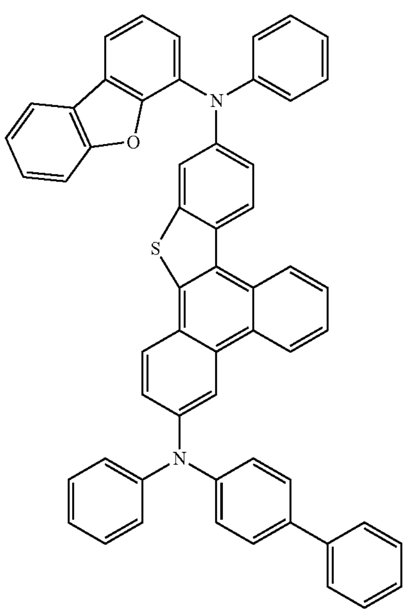
68
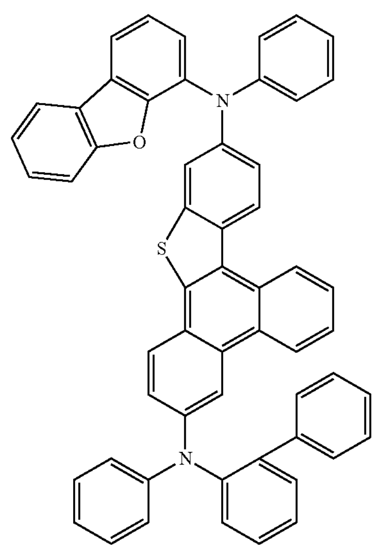

-continued
69
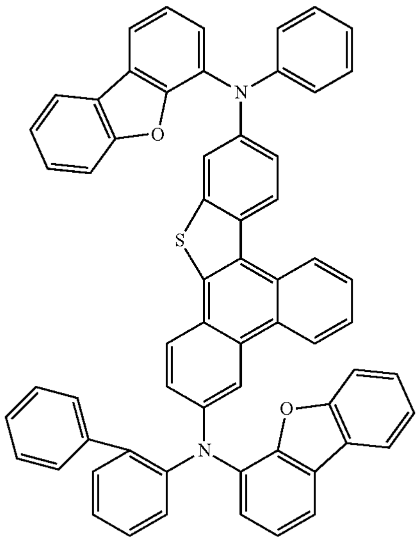
70
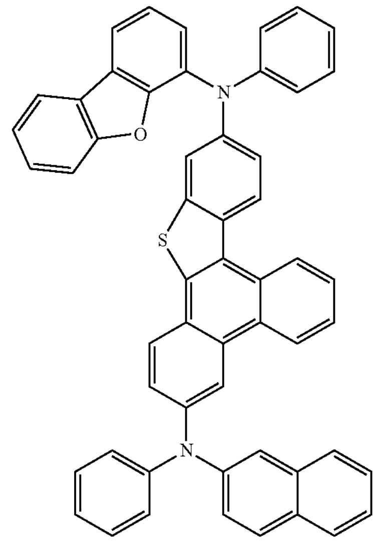
71
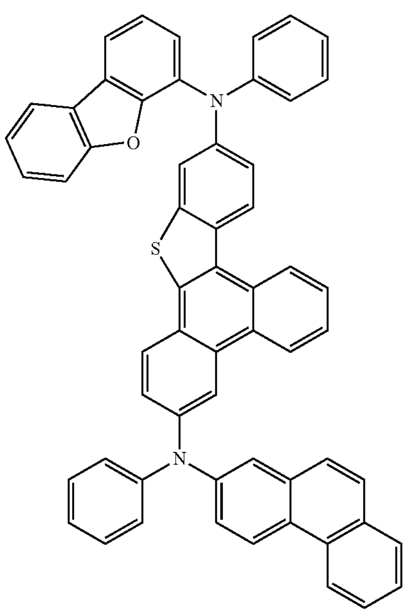
72
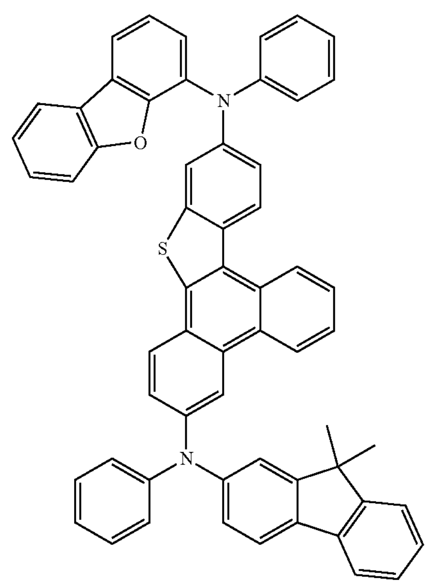

-continued
73
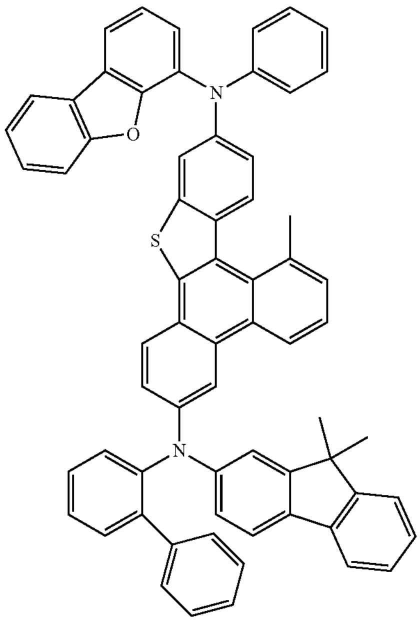
74
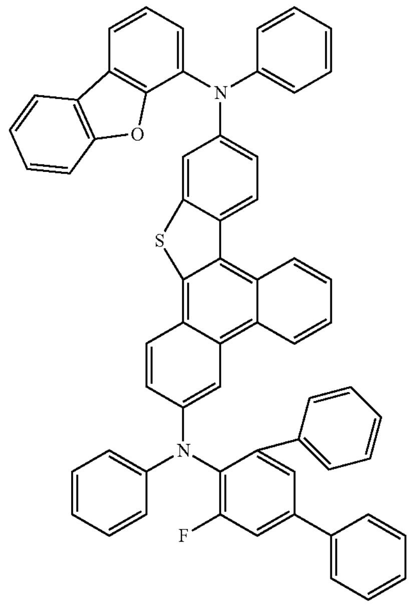
75
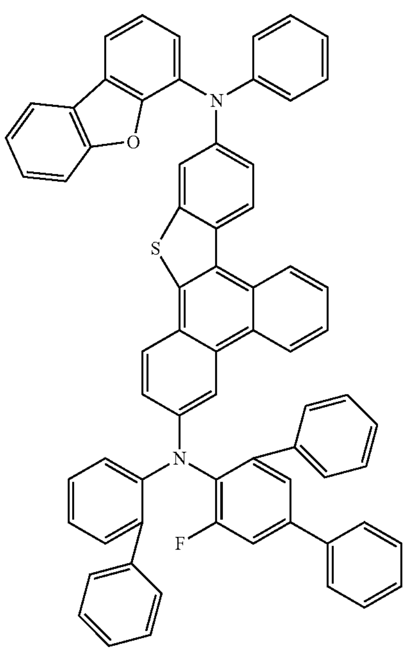
76
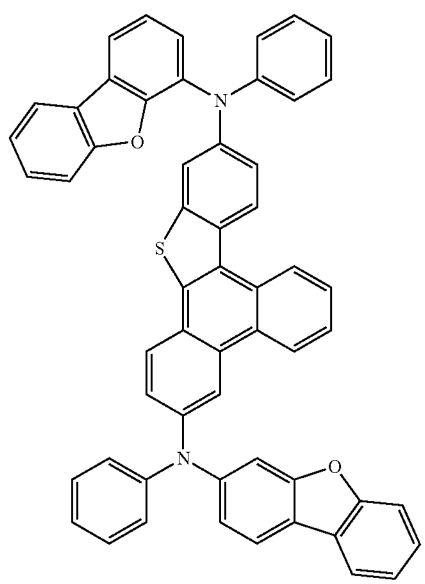

-continued
77
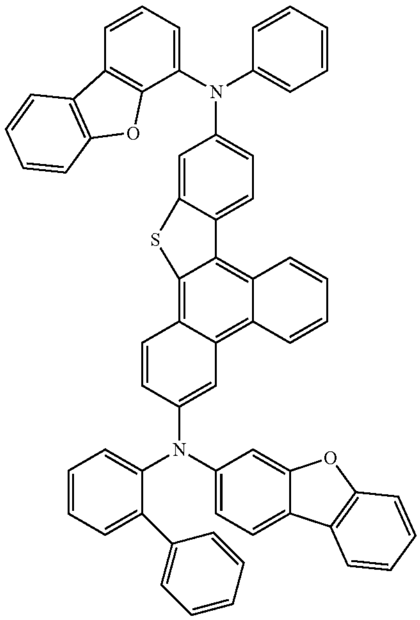
78
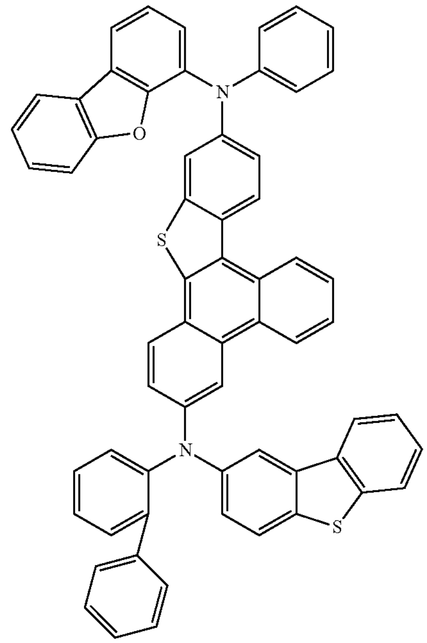
79
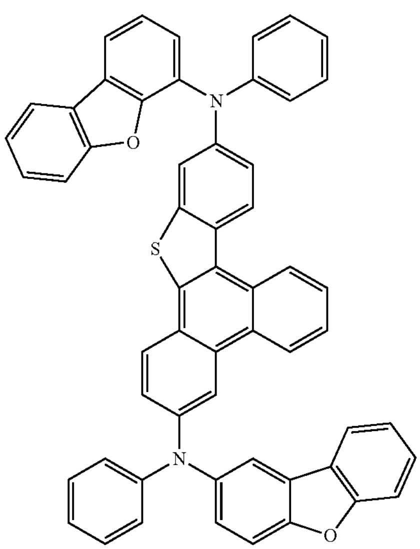
80
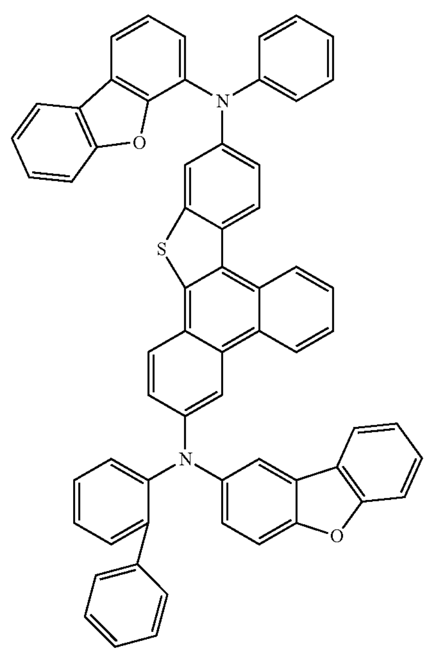

-continued
81
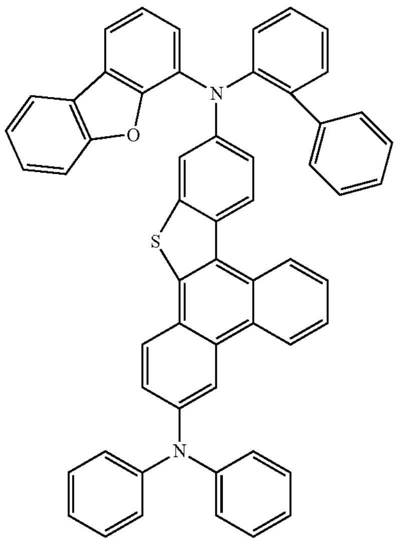
82
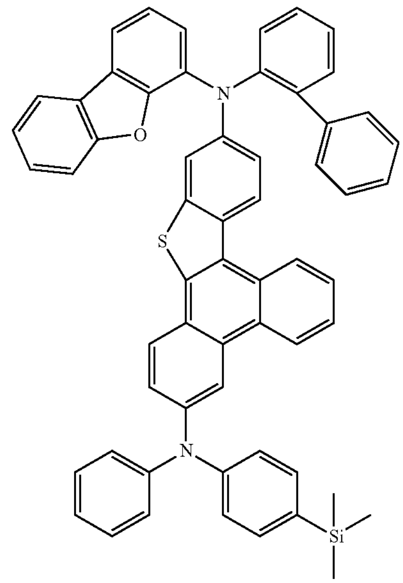
83
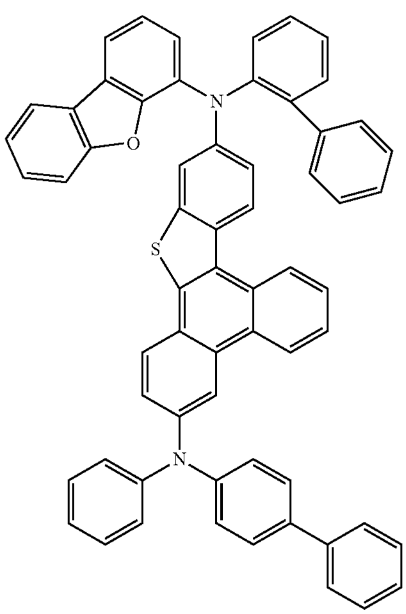
84
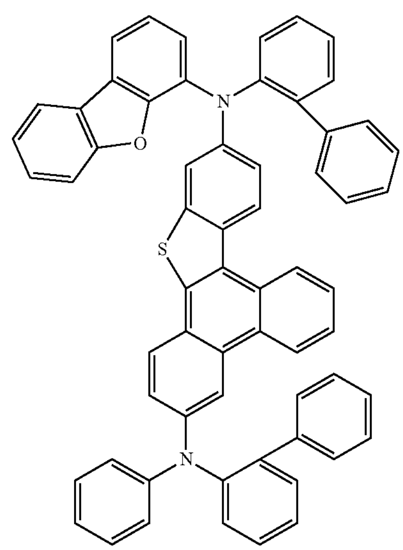

-continued
85
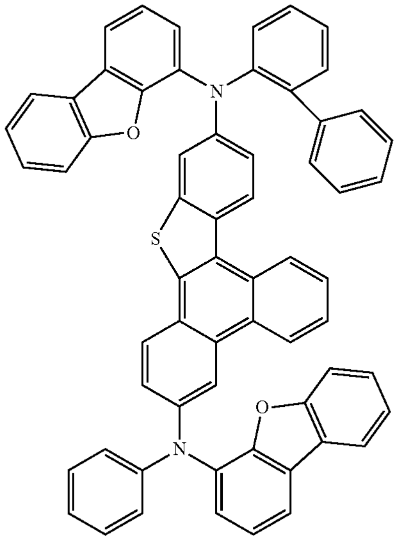
86
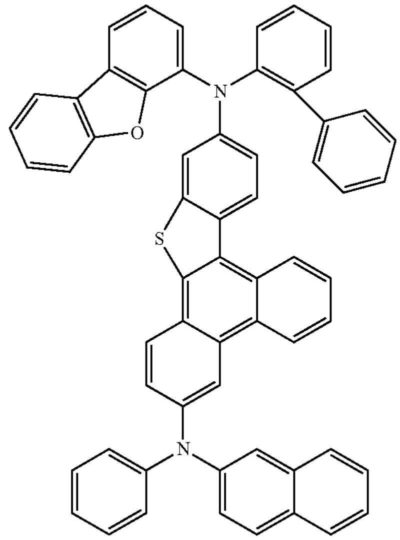
87
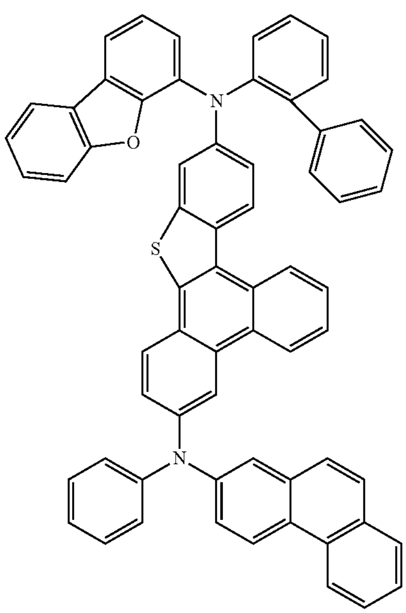
88
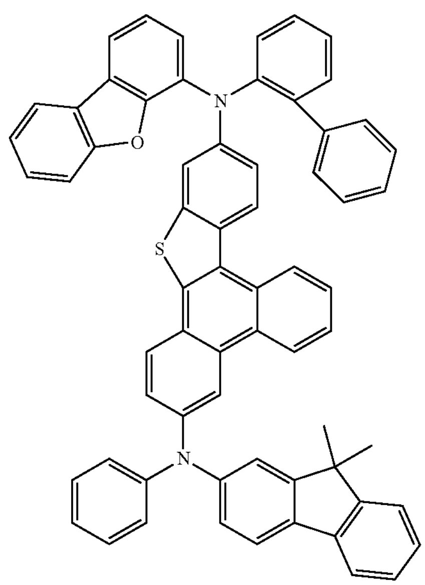

-continued
89
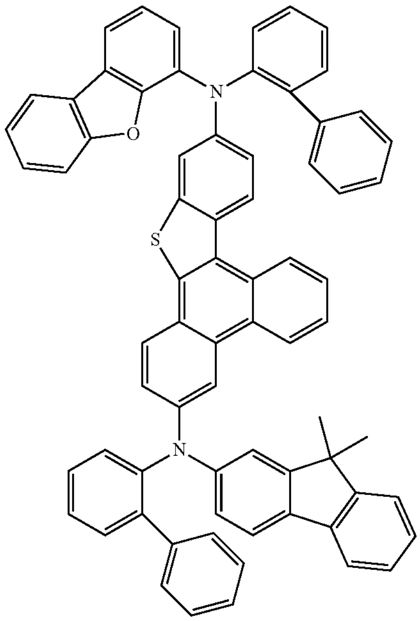
90
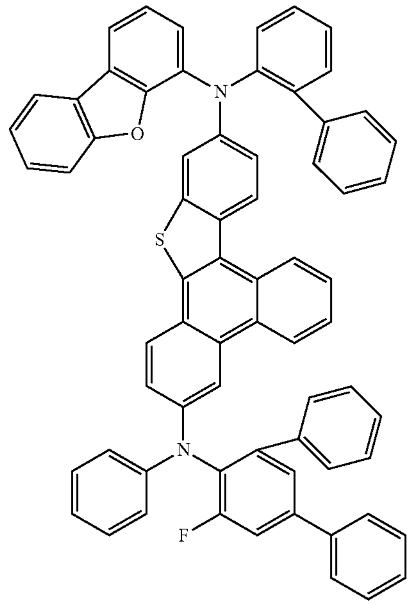
91
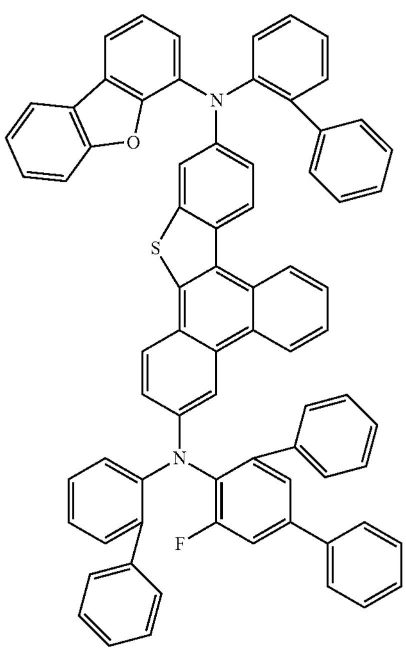
92
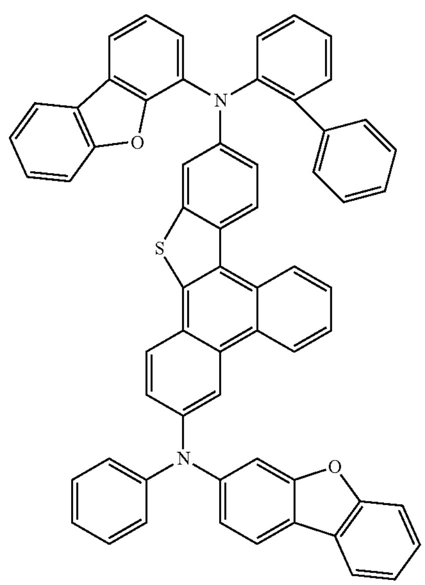

-continued
93
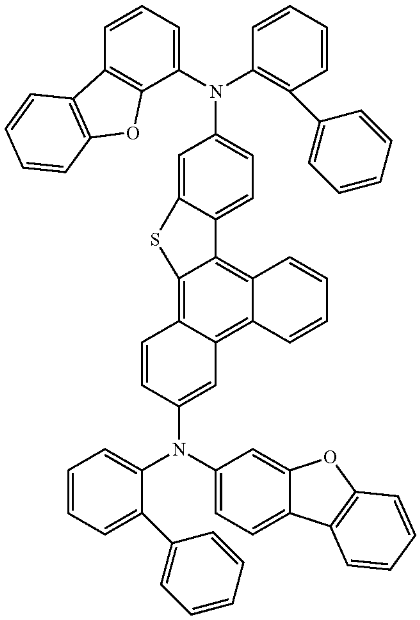
94
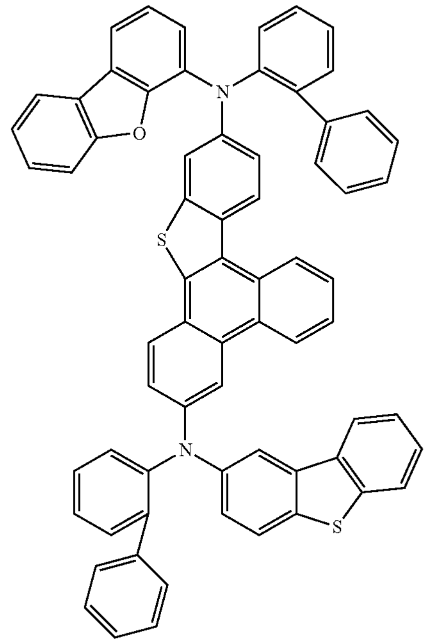
95
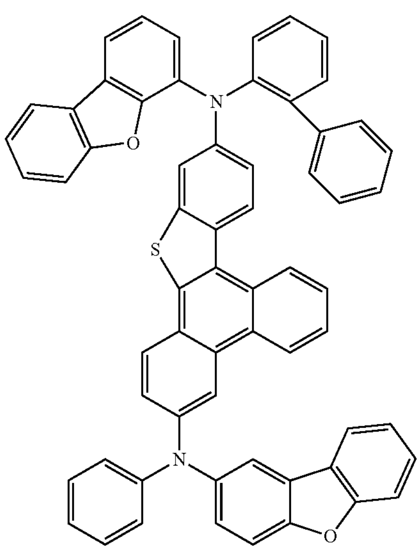
96
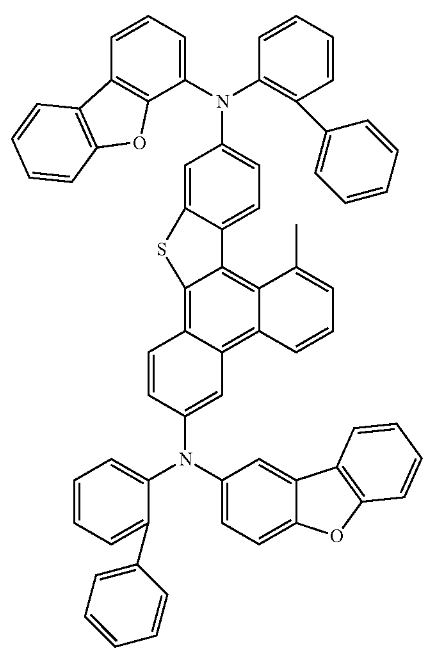

-continued
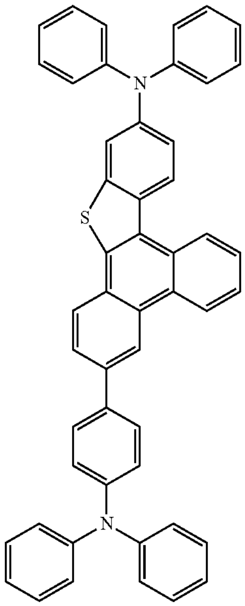
97
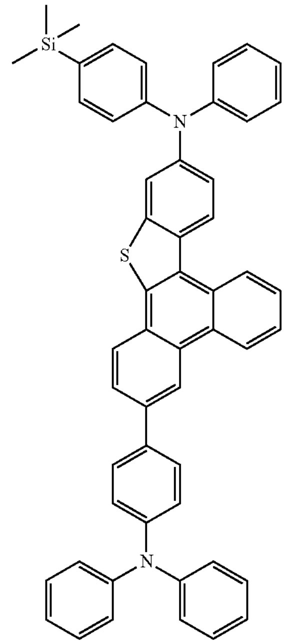
98
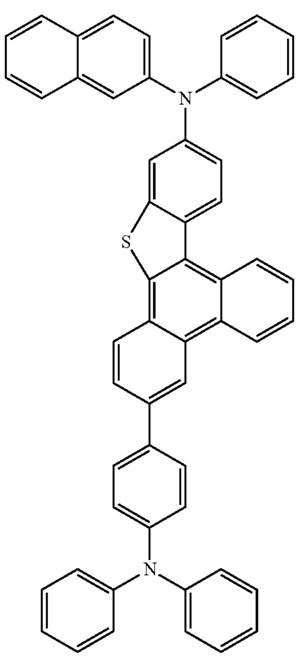
99
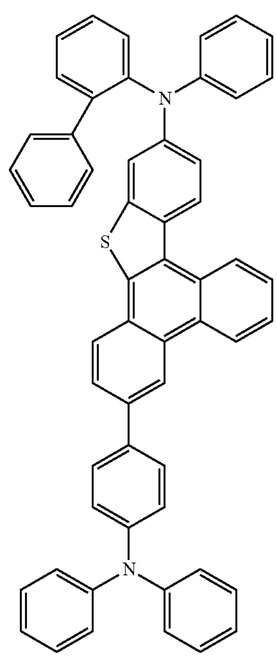
100

-continued
101
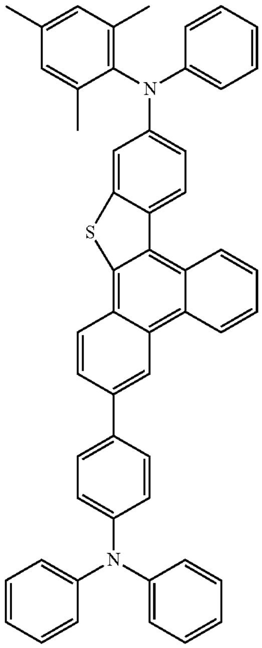
102
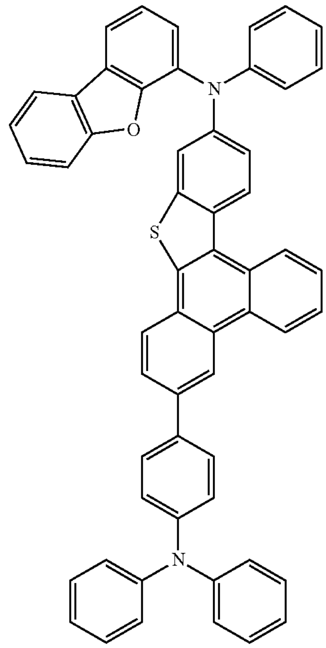
103
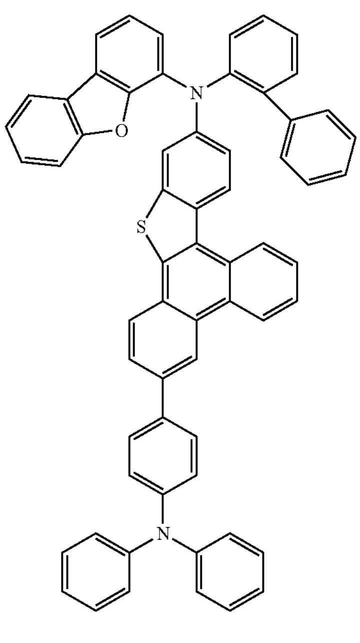
104
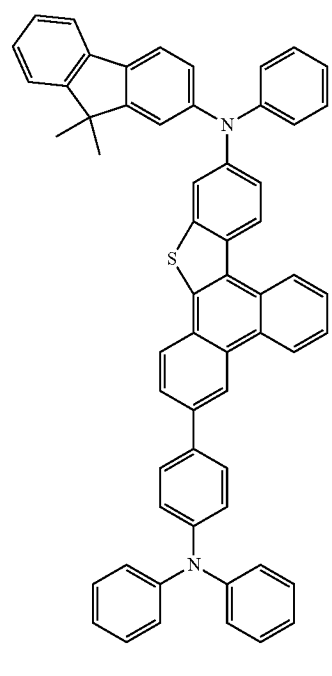

-continued
105
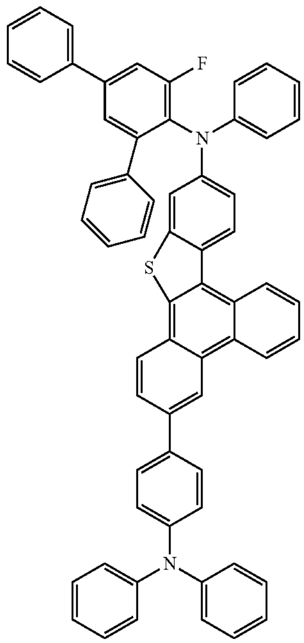
106
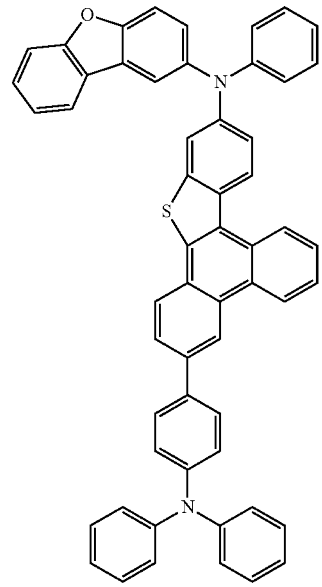
107
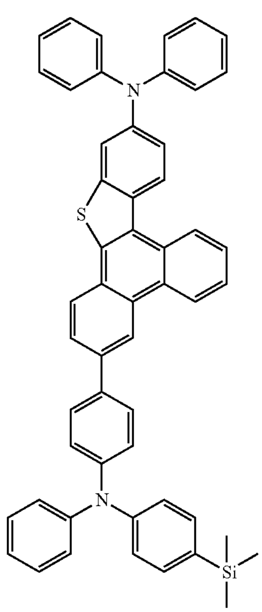
108
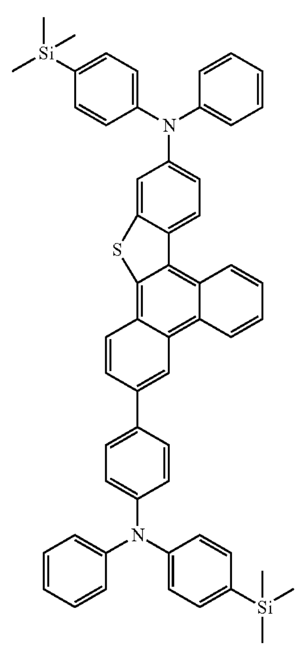

-continued
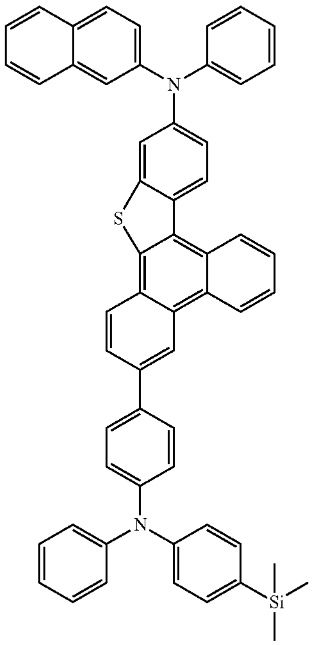
109
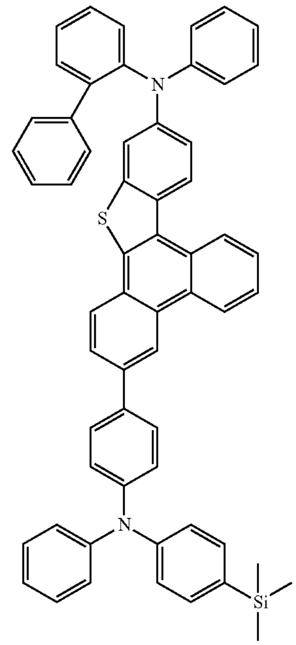
110
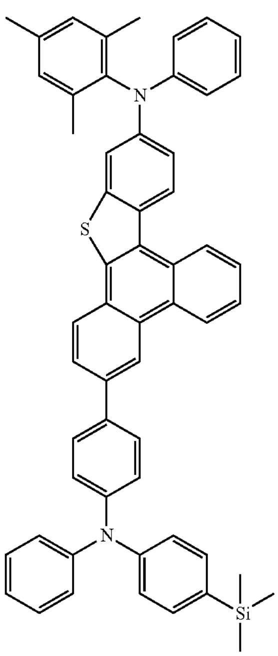
111
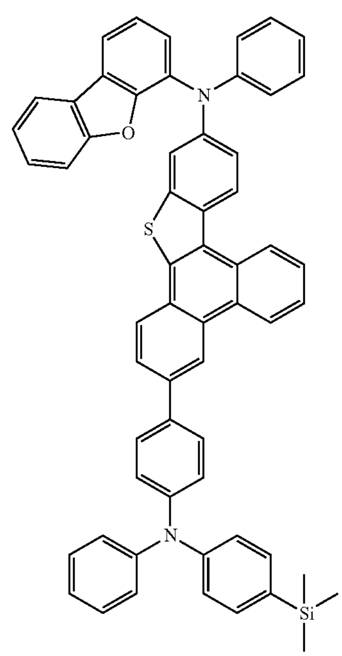
112

-continued
113
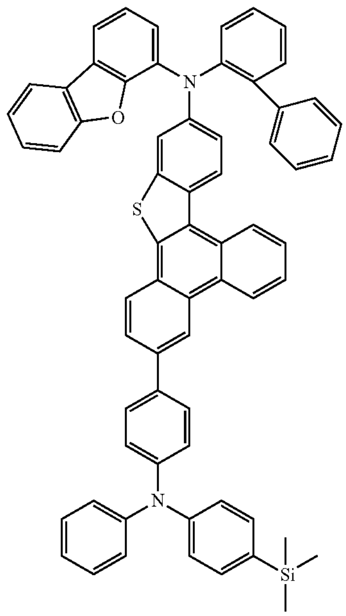
114
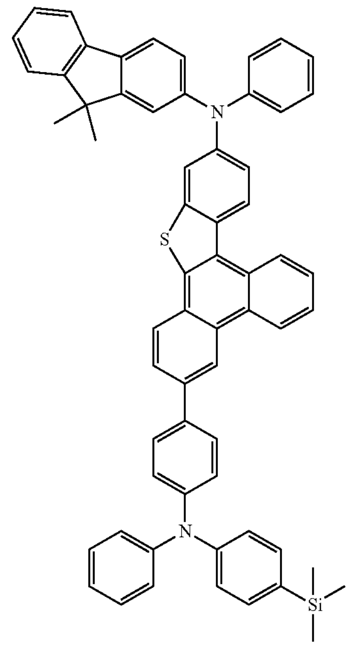
115
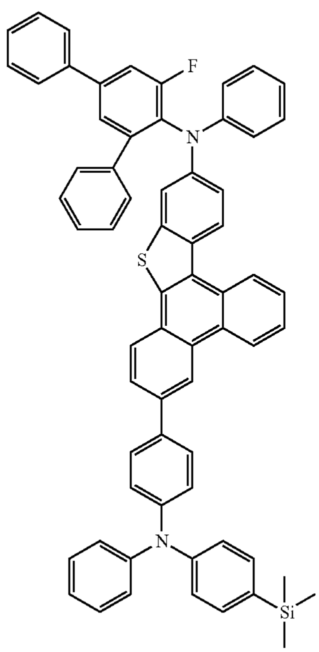
116
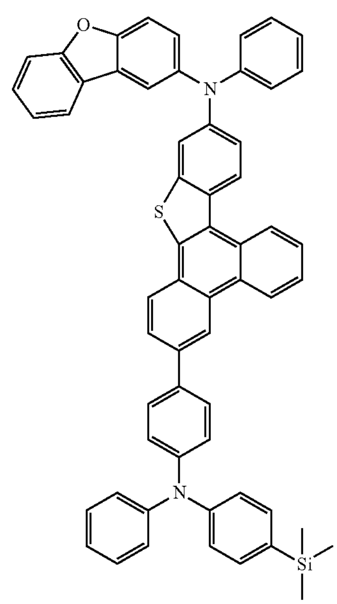

-continued
117
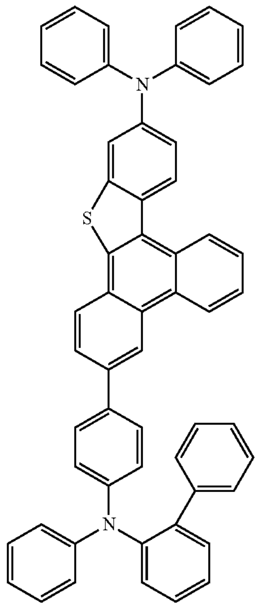
118
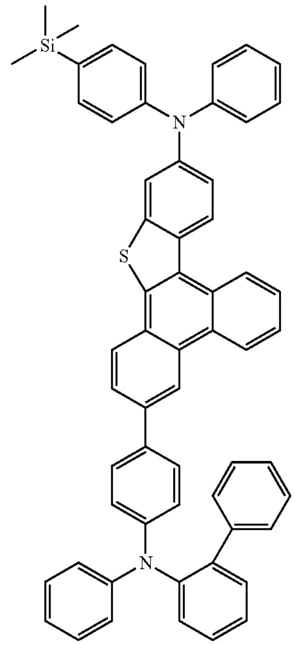
119
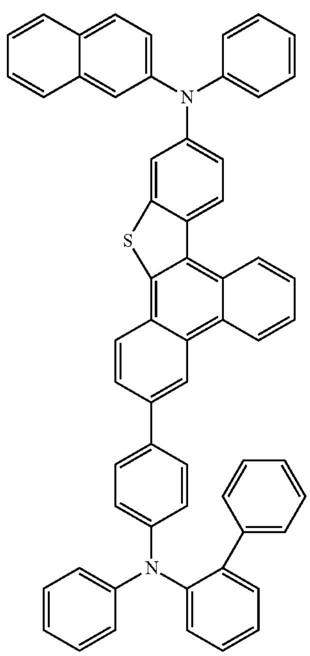
120
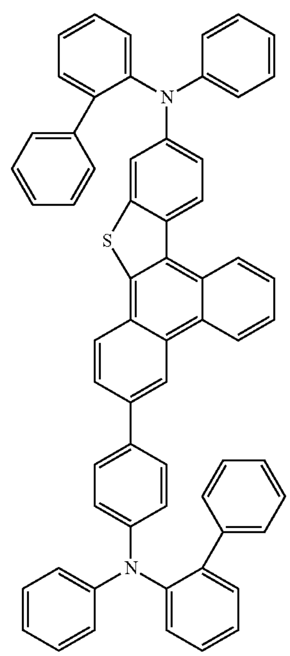

-continued
121
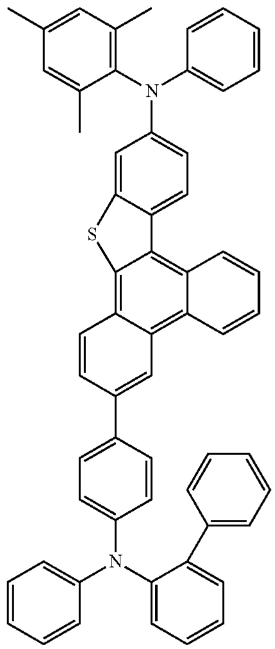
122
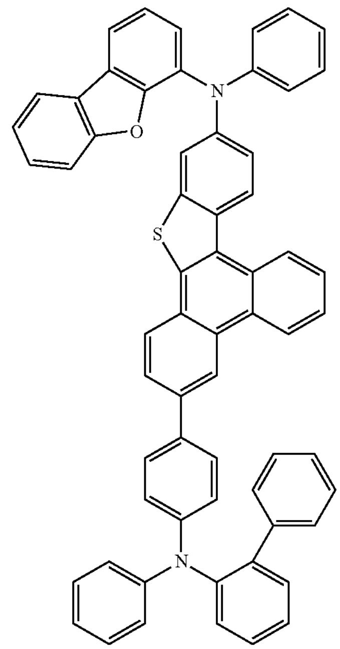
123
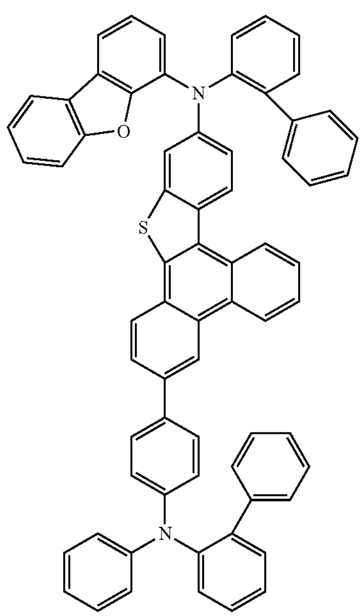
124
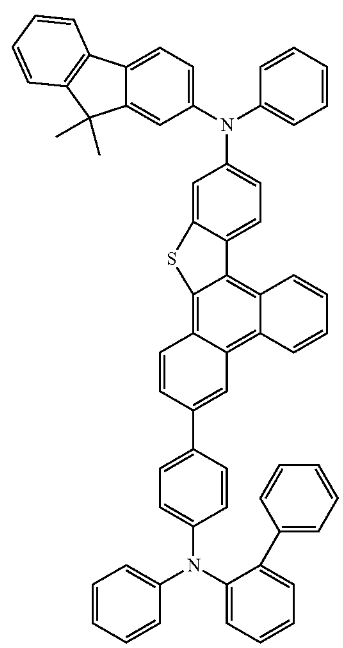

-continued
125
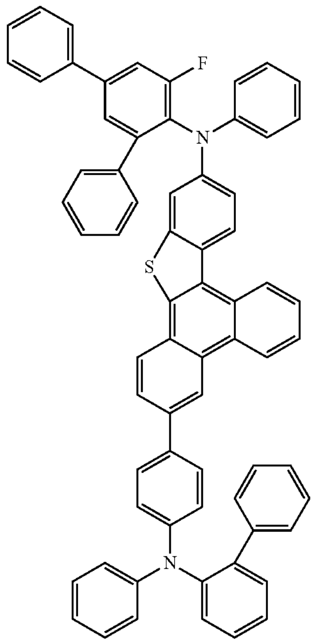
126
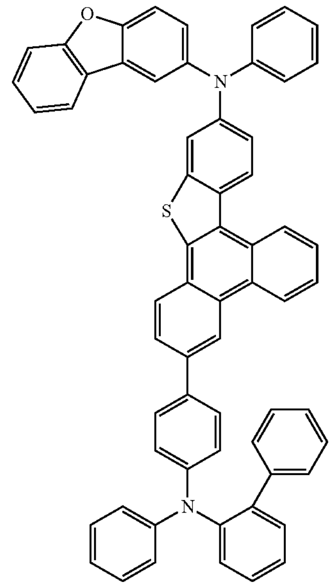
127
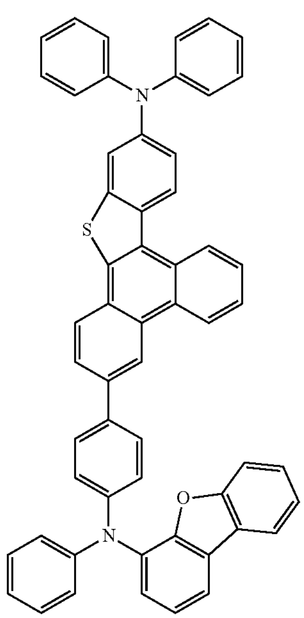
128
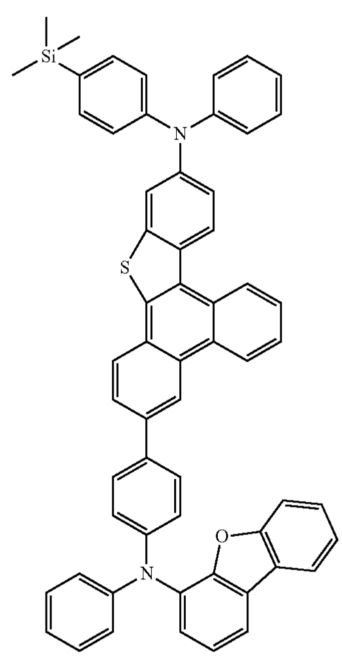

-continued
129
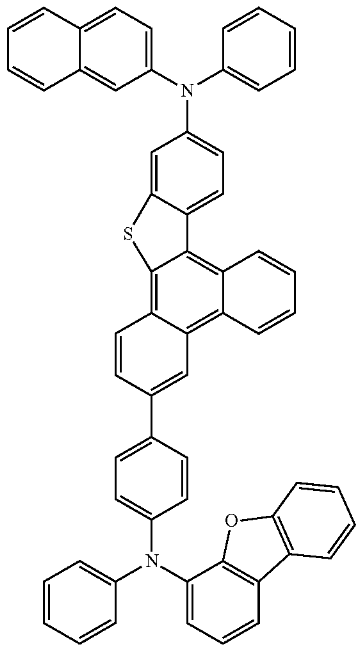
130
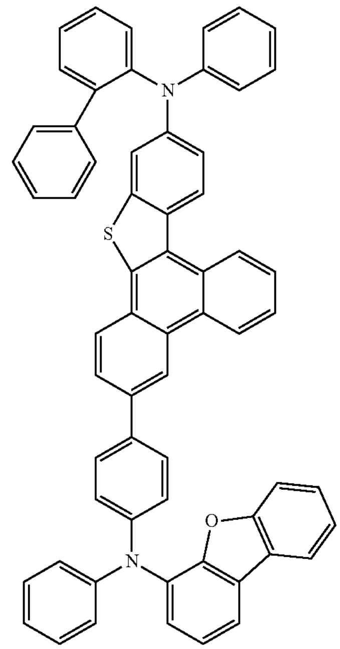
131
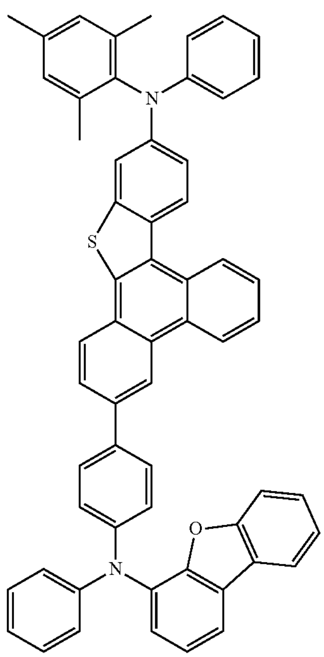
132
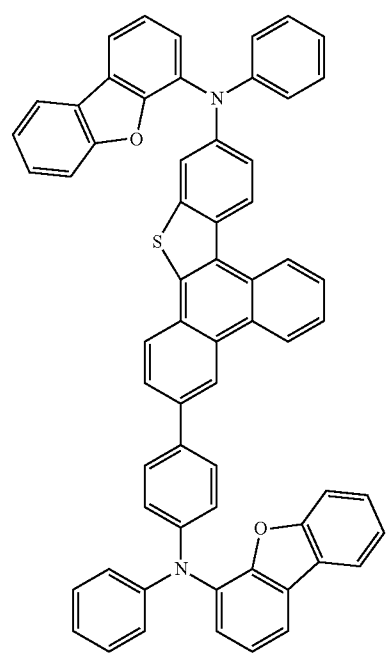

-continued
133
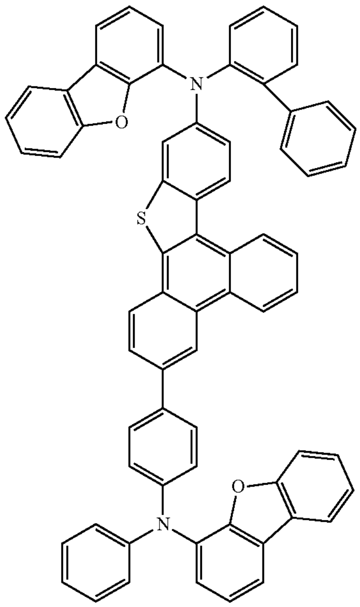
134
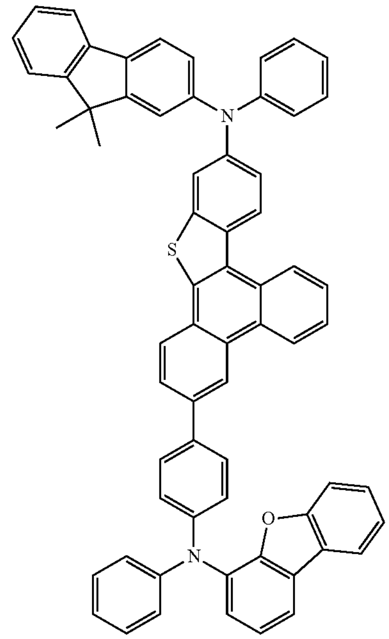
135
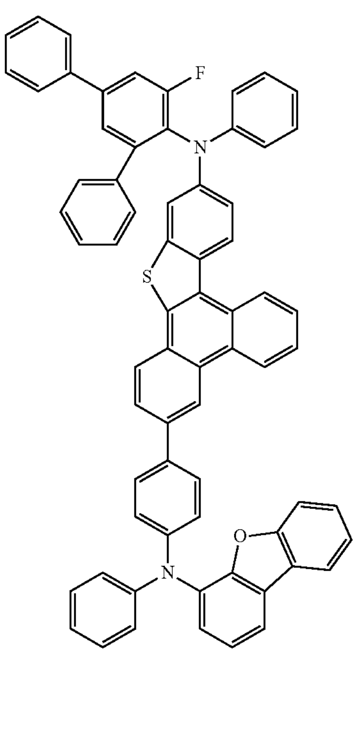
136
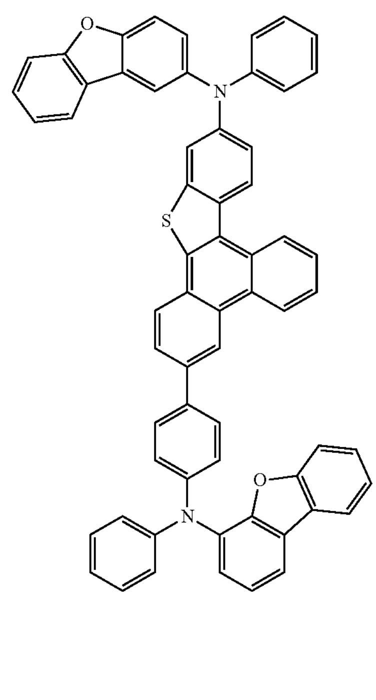

-continued
137
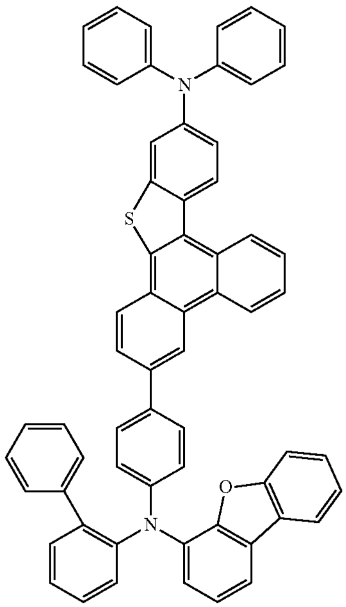
138
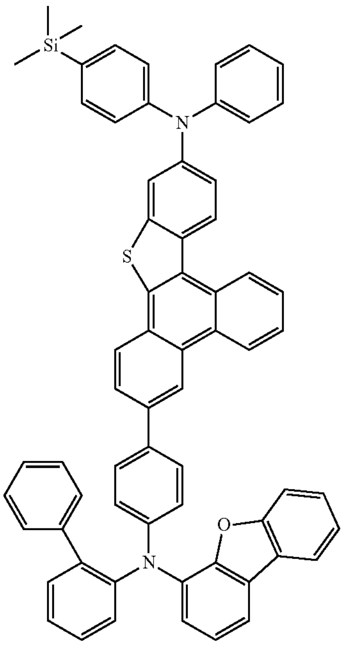
139
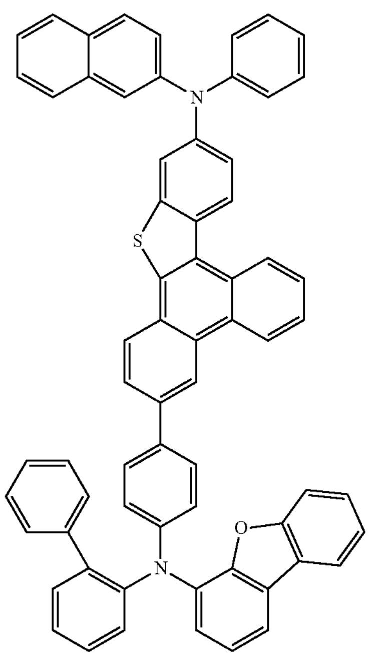
140
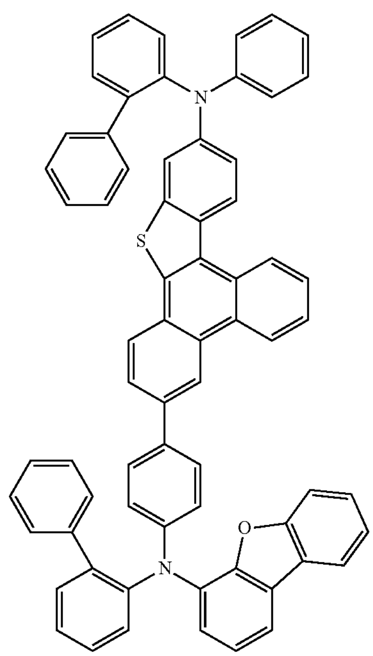

-continued
141
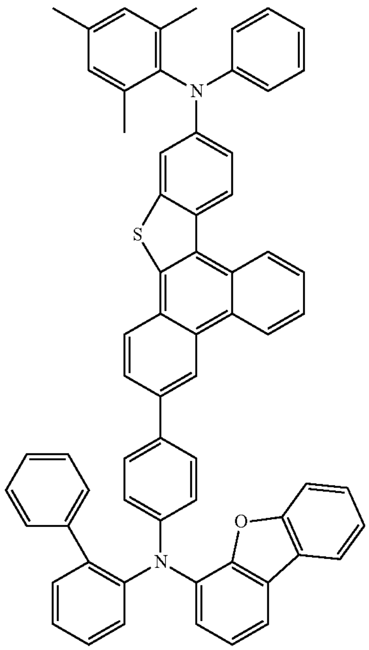
142
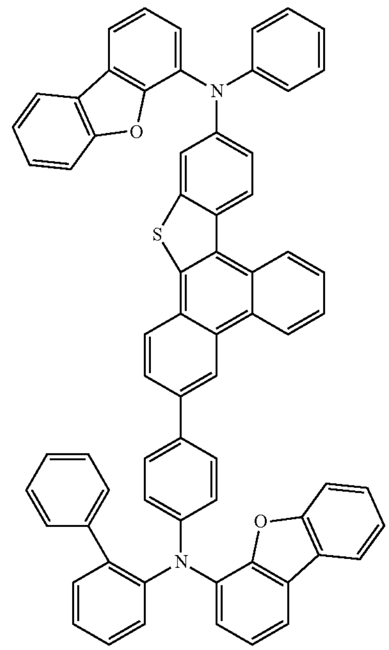
143
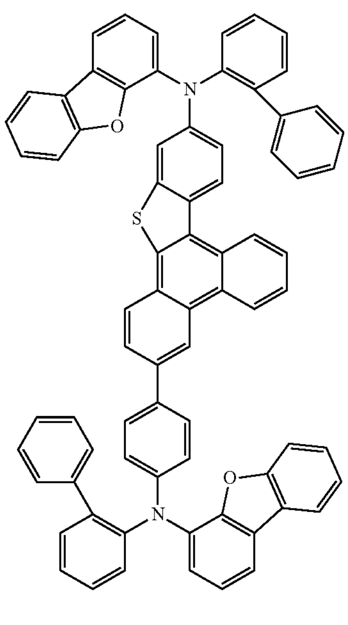
144
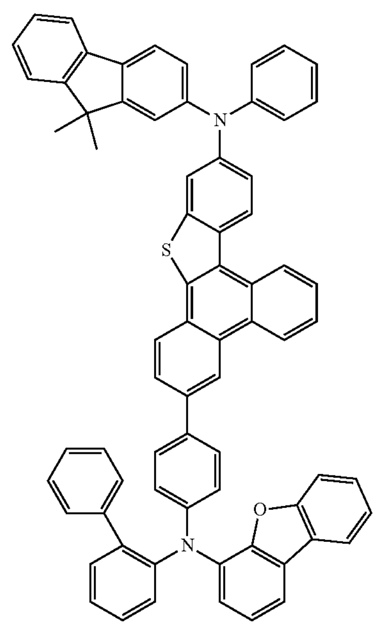

-continued
145
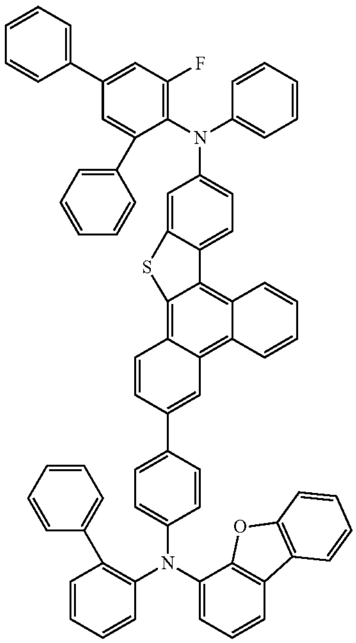
146
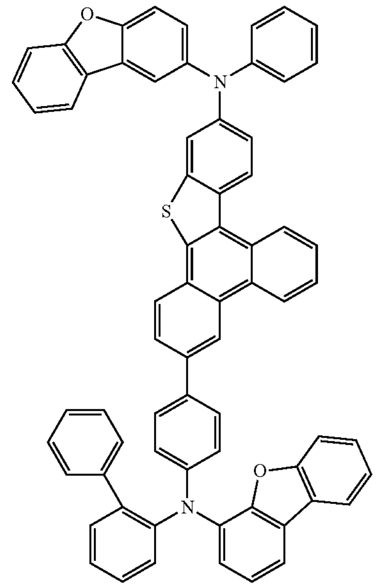
147
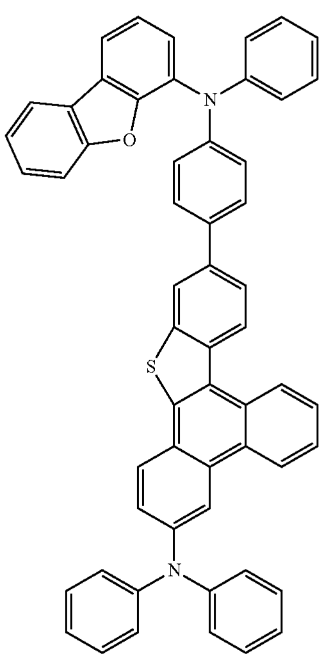
148
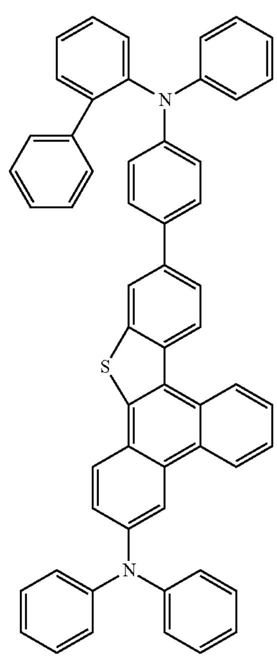

-continued
149
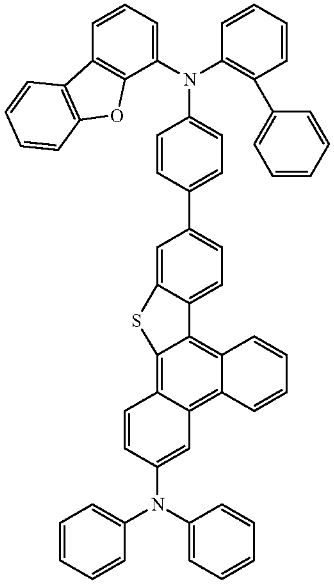
150
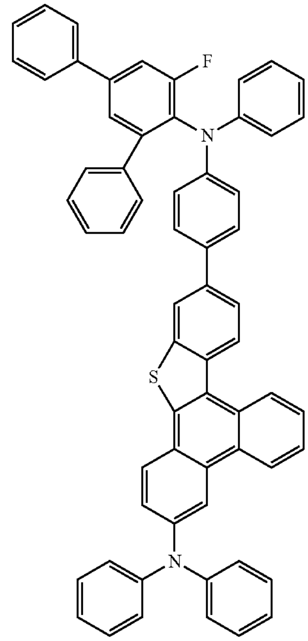
151
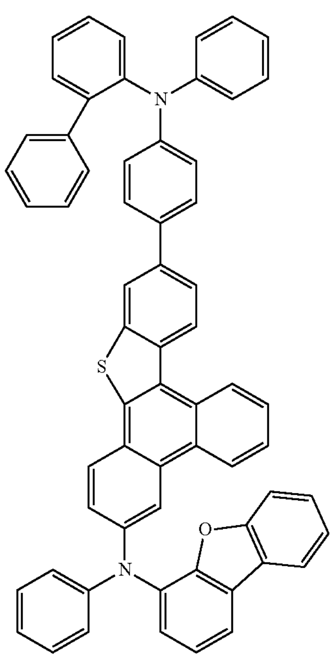
152
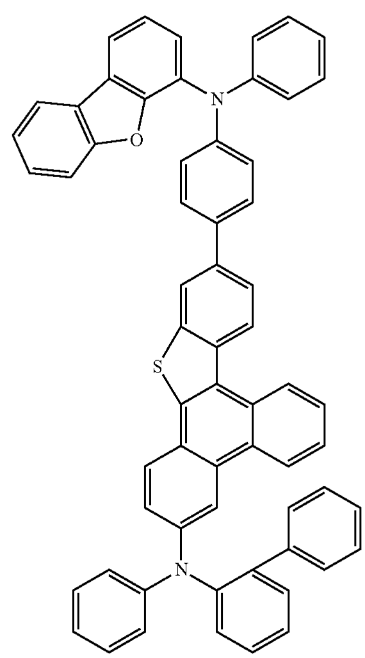

-continued
153
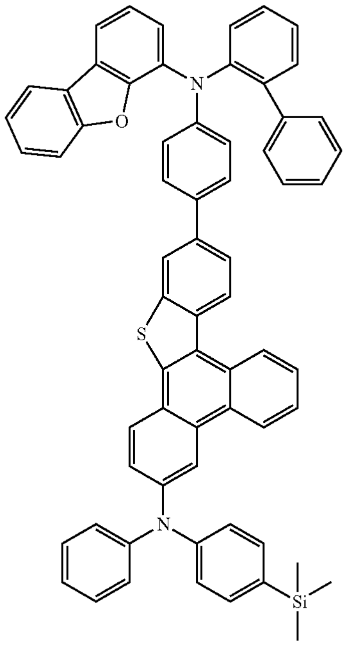
154
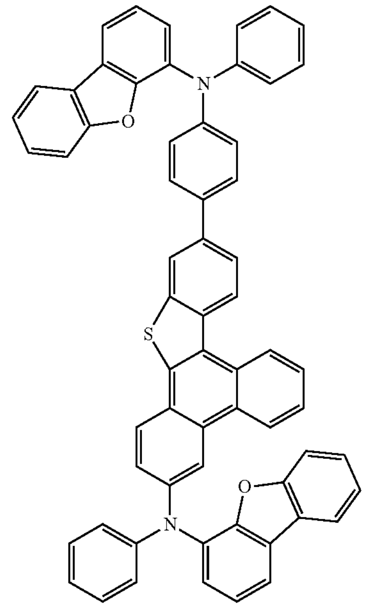
155
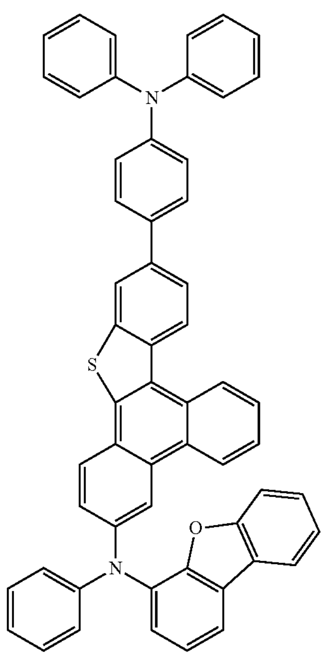
156
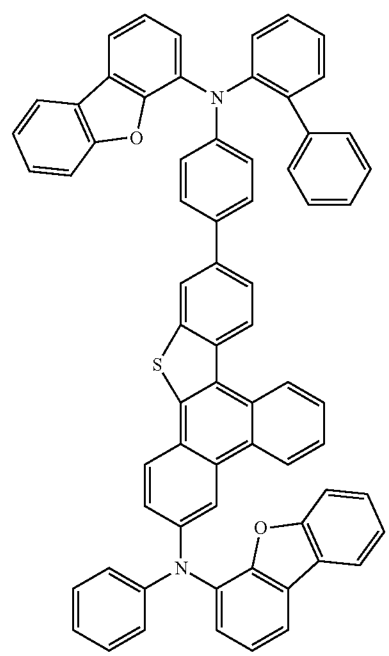

-continued
157
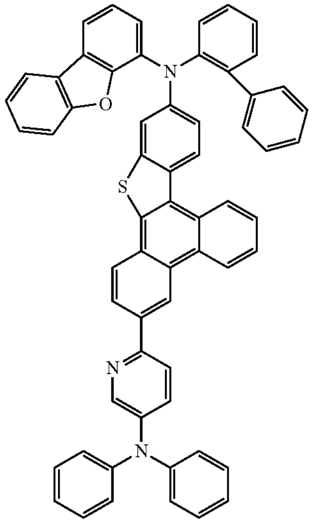
158
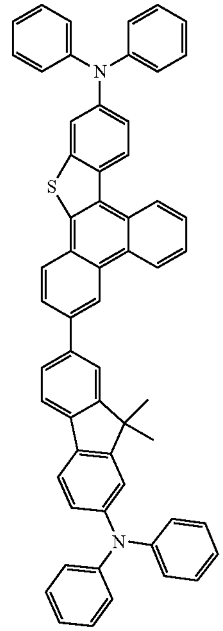
159
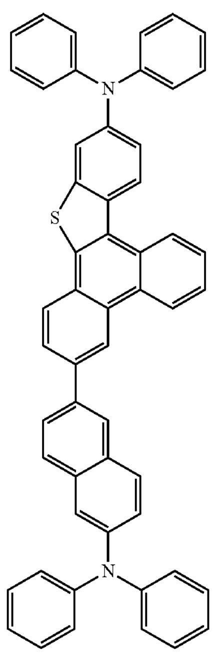
160
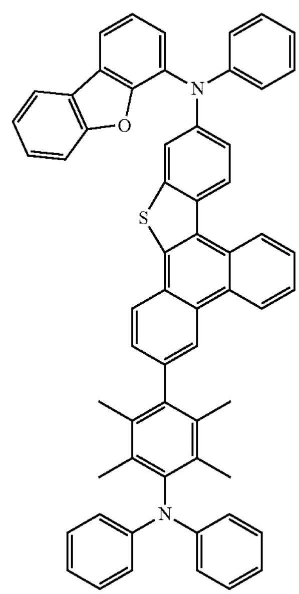

-continued
161
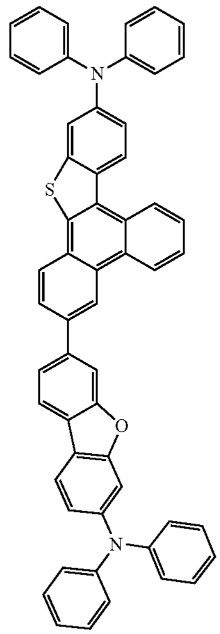
162
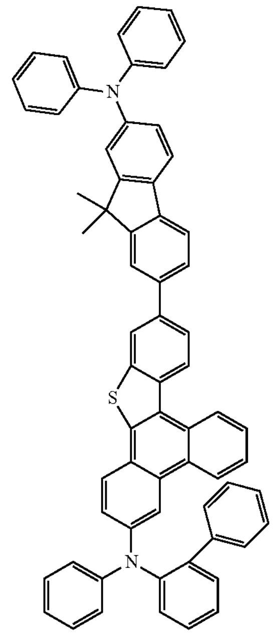
163
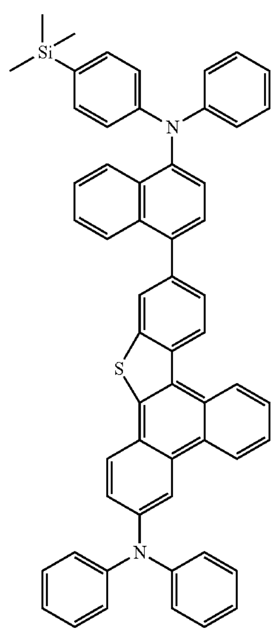
164
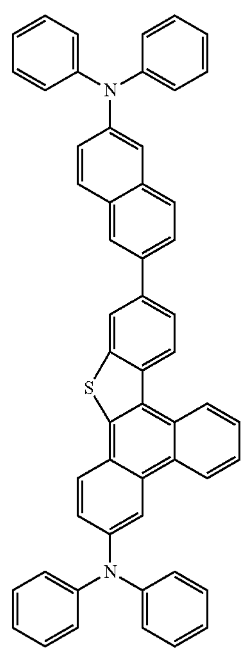

-continued
165
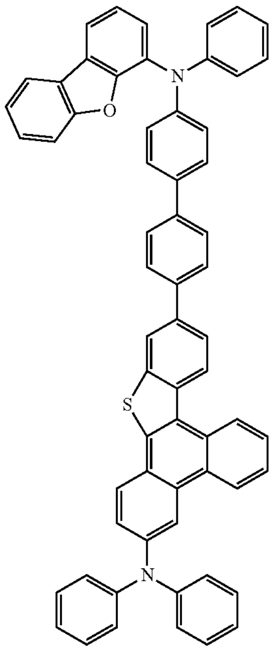
166
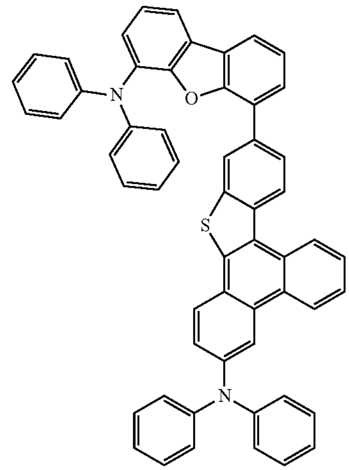
167
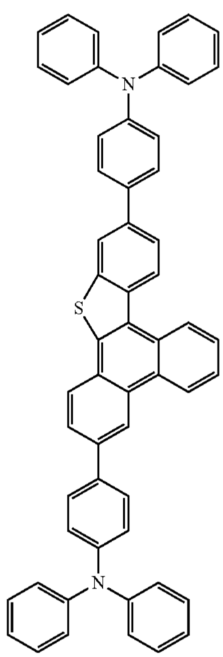
168
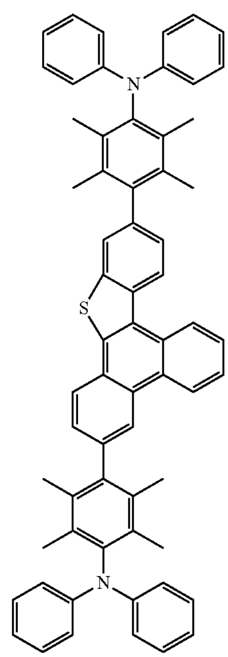

-continued
169
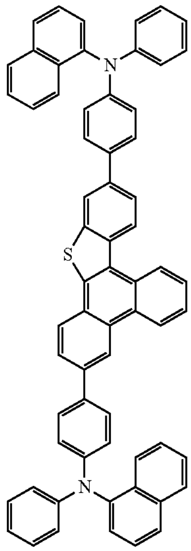
170
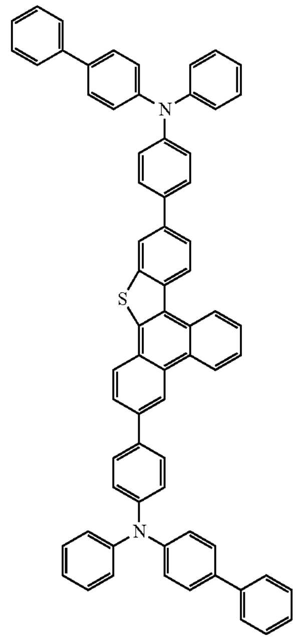
171
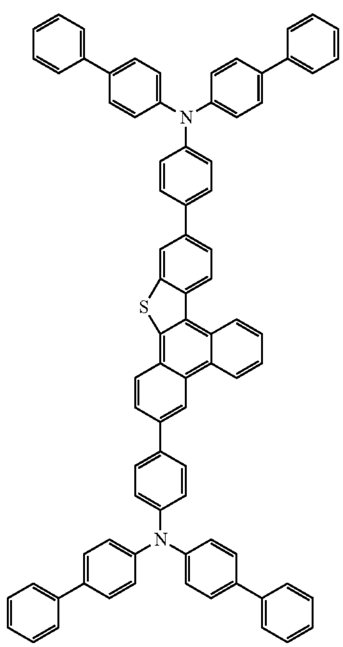
172
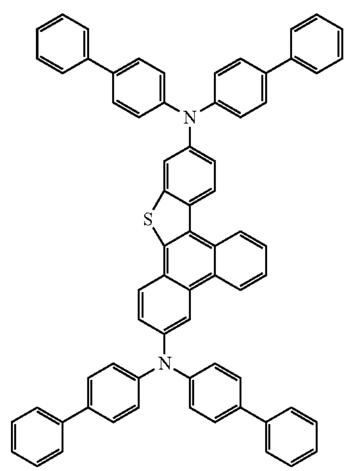

-continued
173
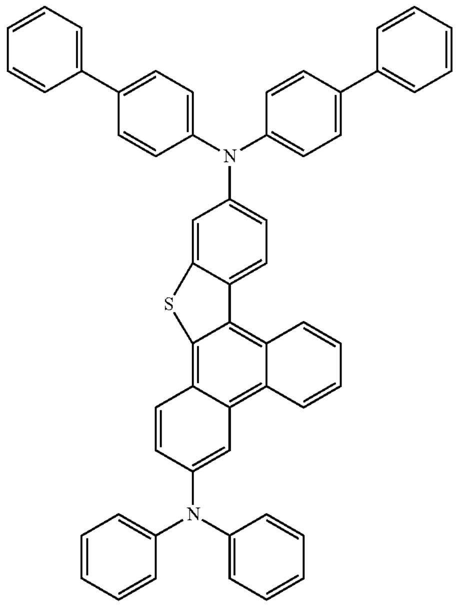
174
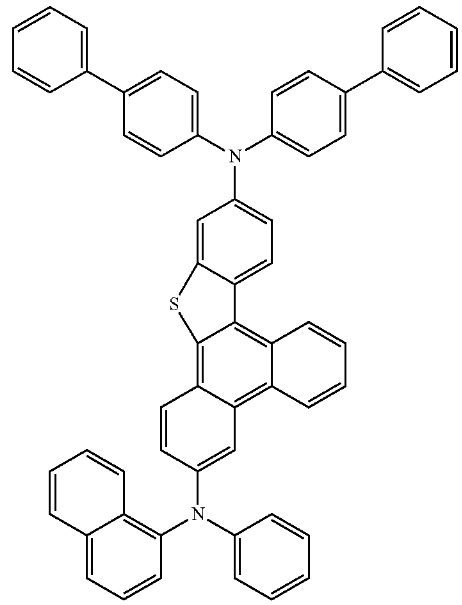
175
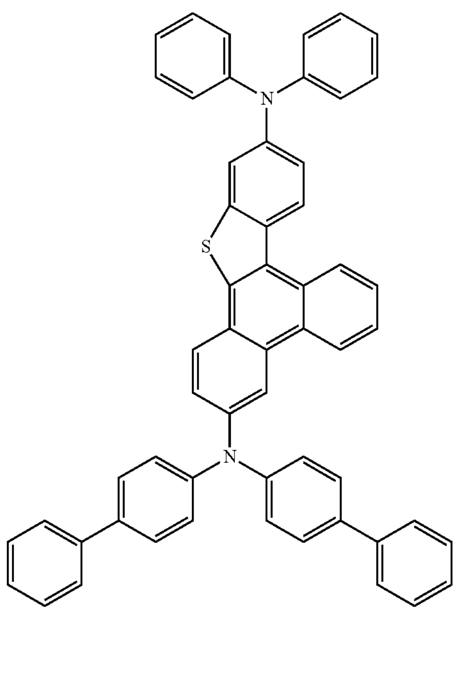
176
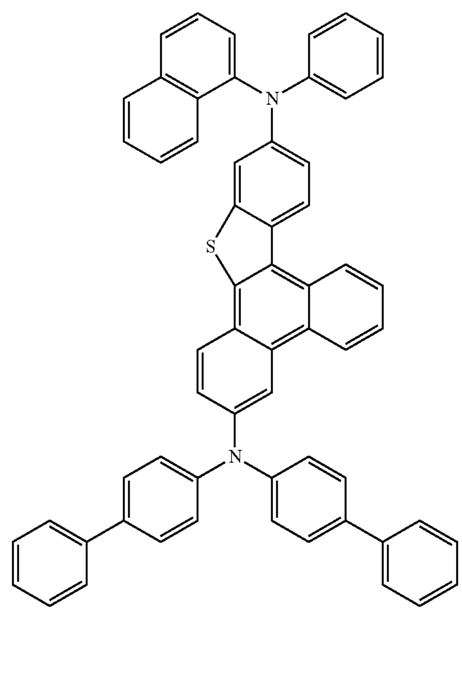

-continued
177
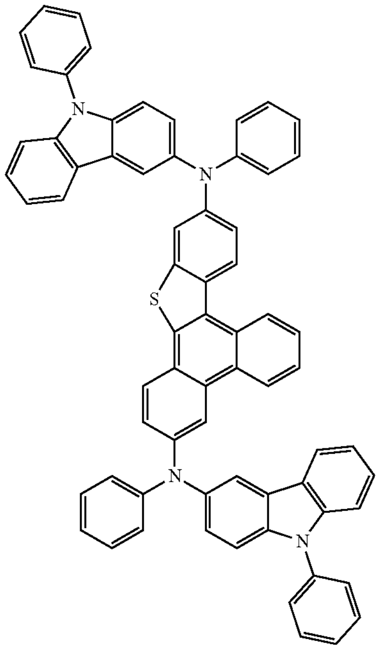
178
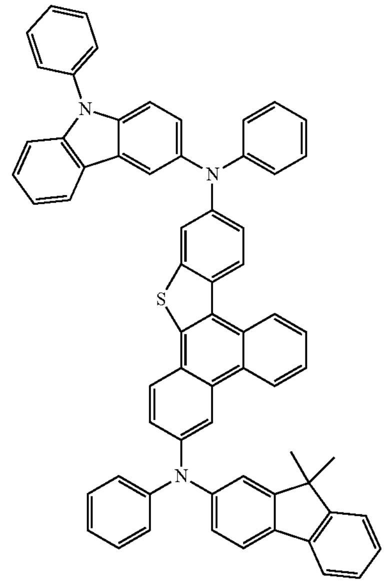
179
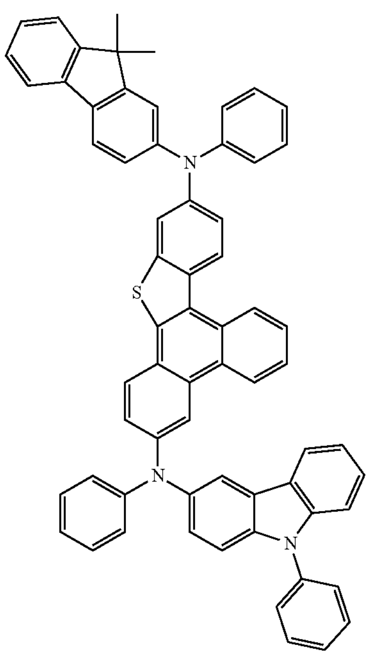
180
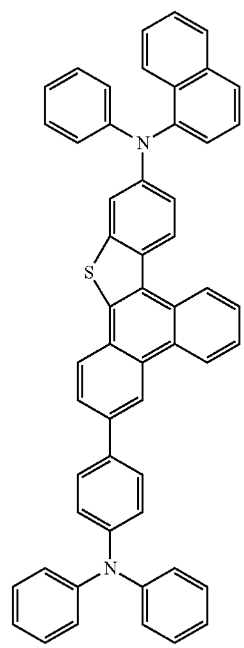

-continued
181
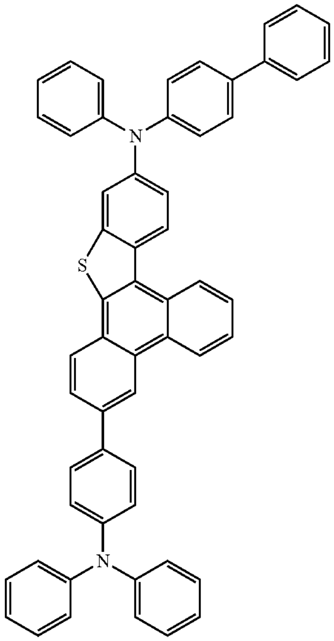
182
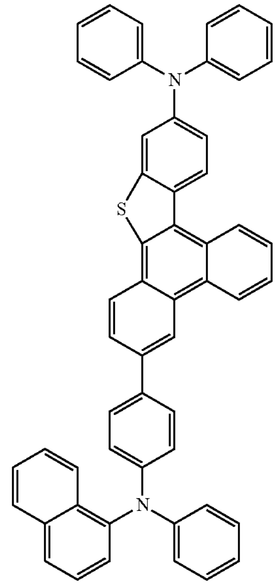
183
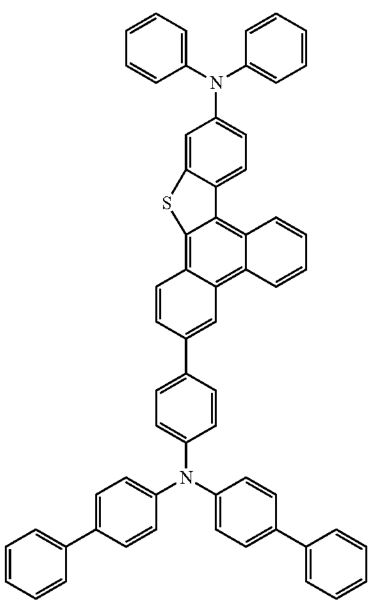
184
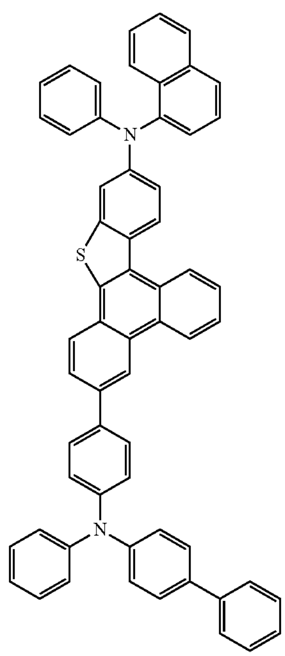

-continued
185
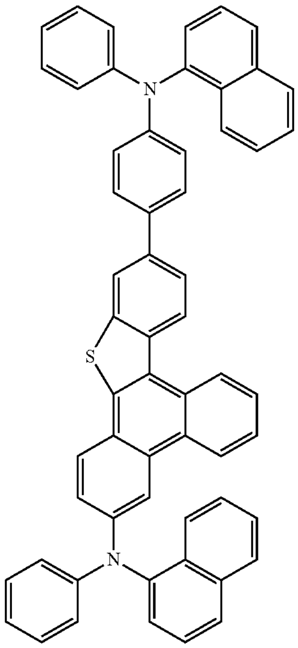
186
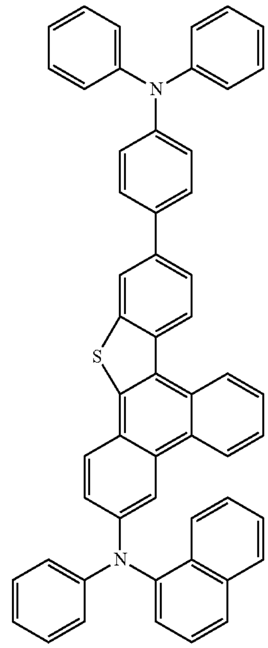
187
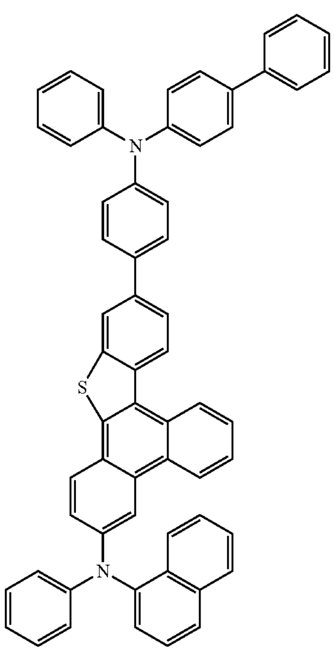
188
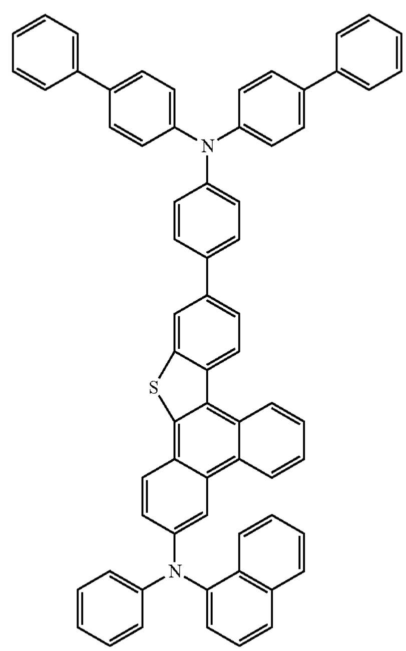

-continued
189
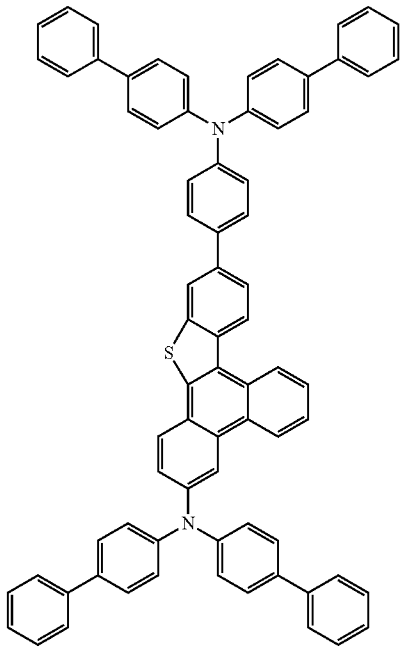
190
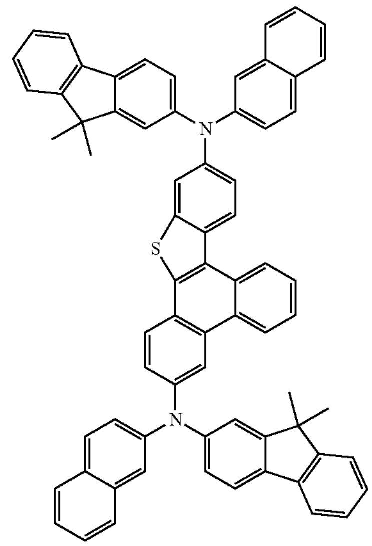
191
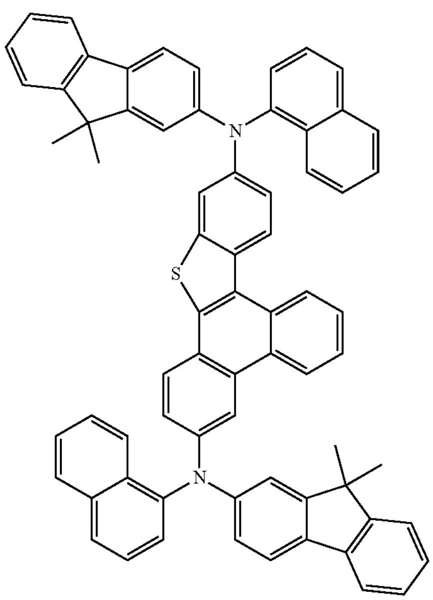
192
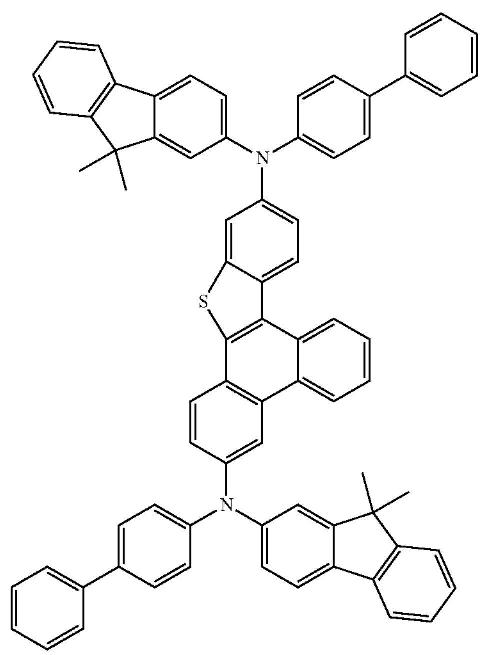

-continued
193
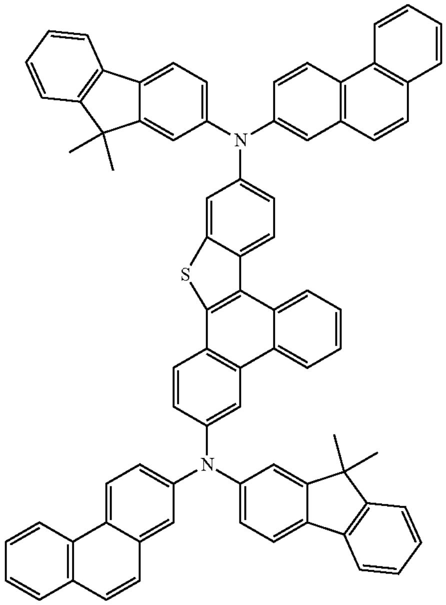
194
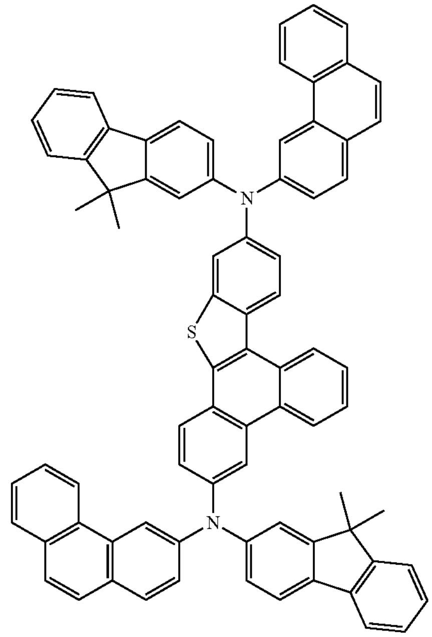
195
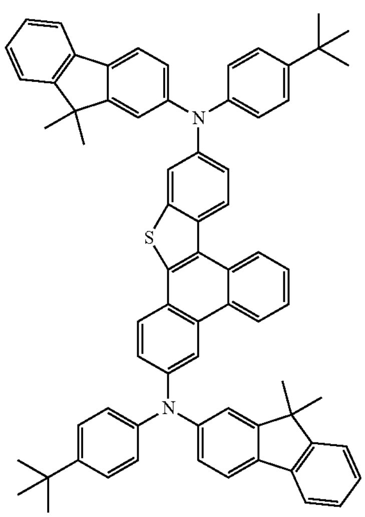
196
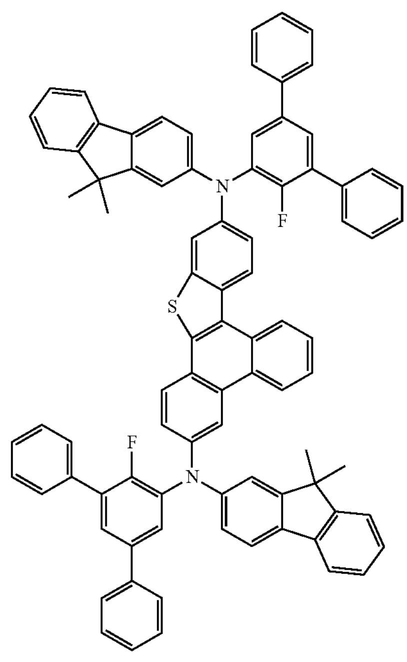

-continued
197
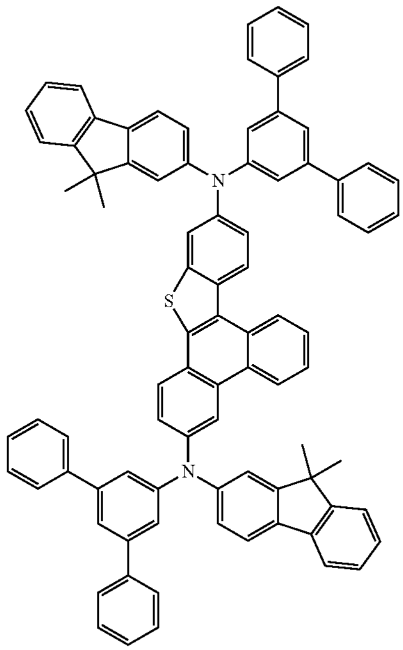
198
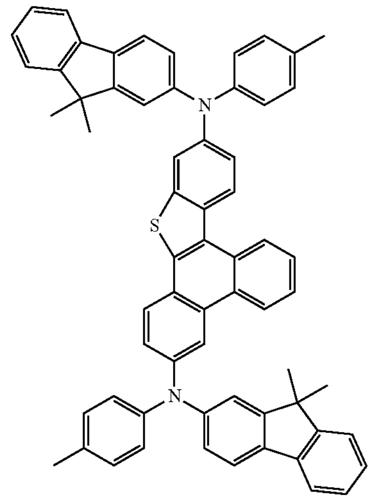
199
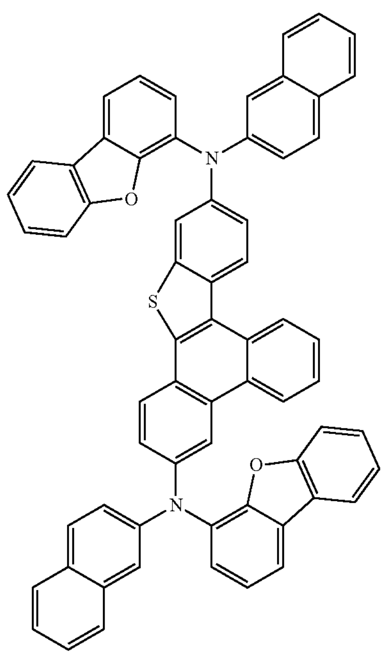
200
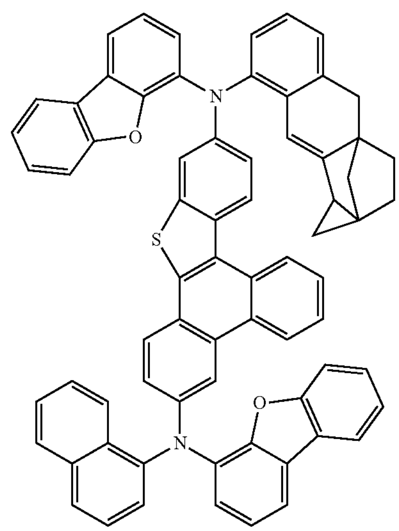

-continued
201
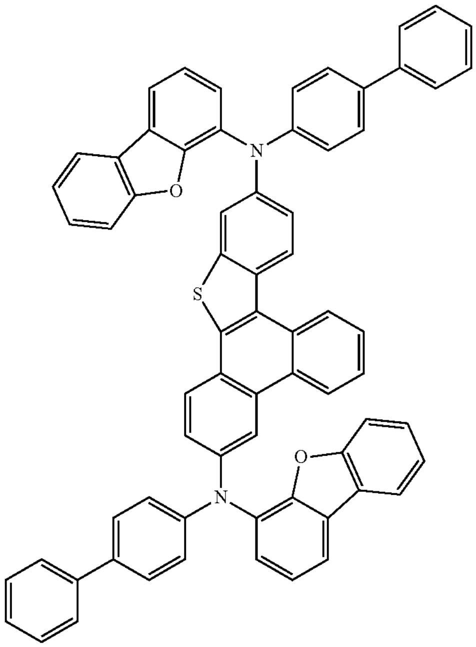
202
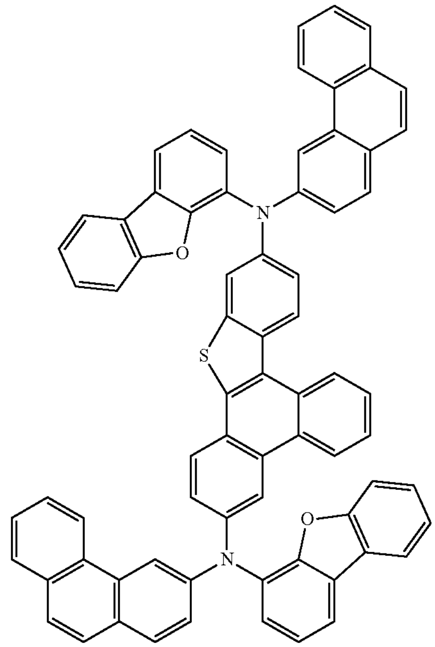
203
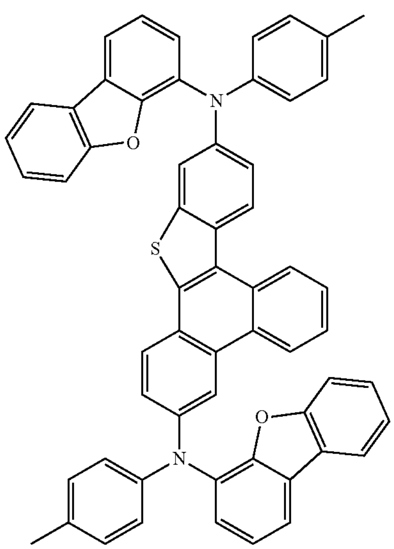
204
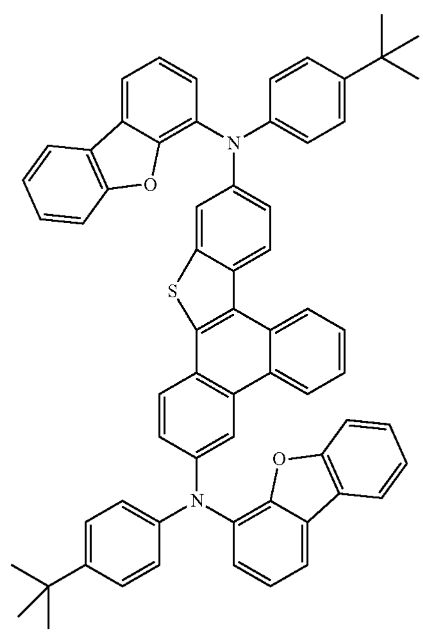

-continued
205
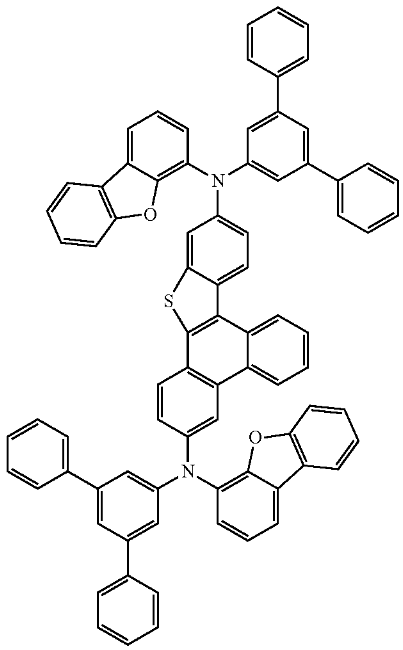
206
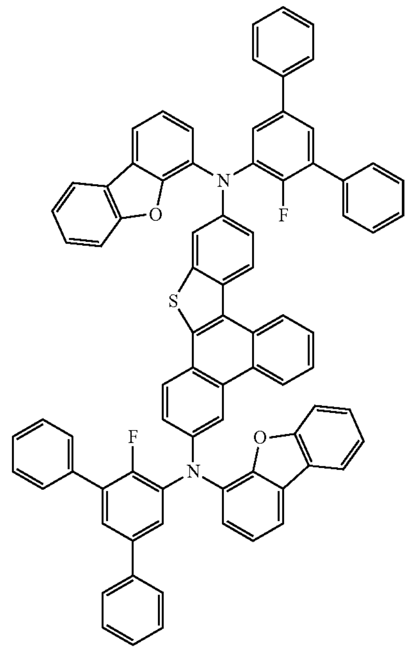
207
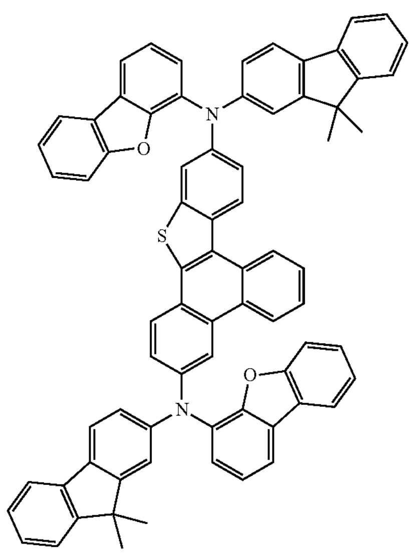
208
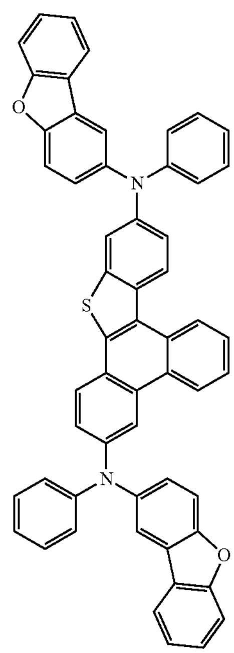

-continued
209
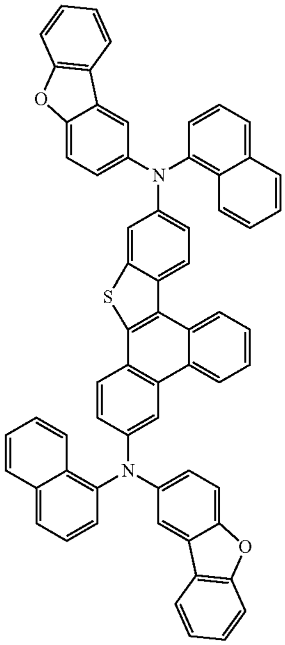
210
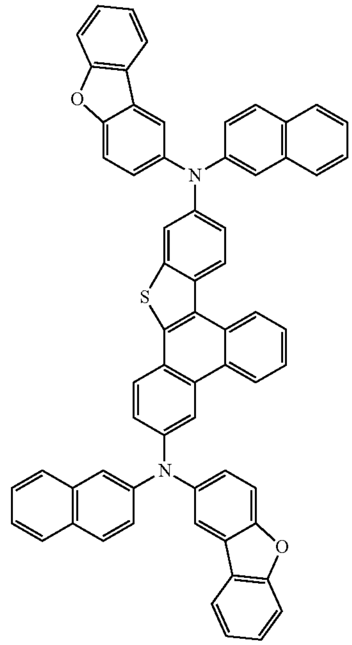
211
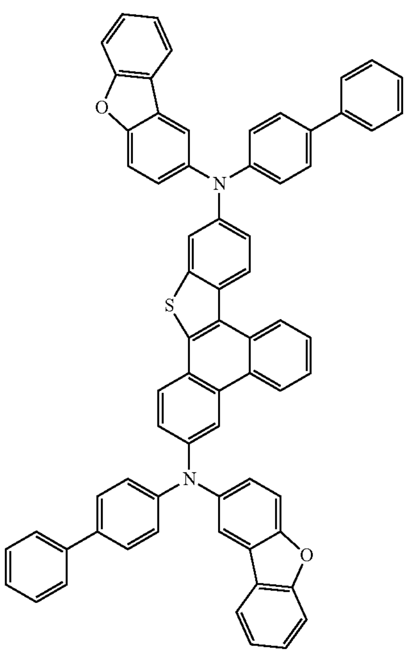
212
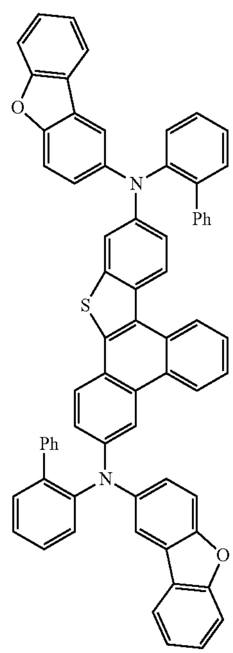

-continued
213
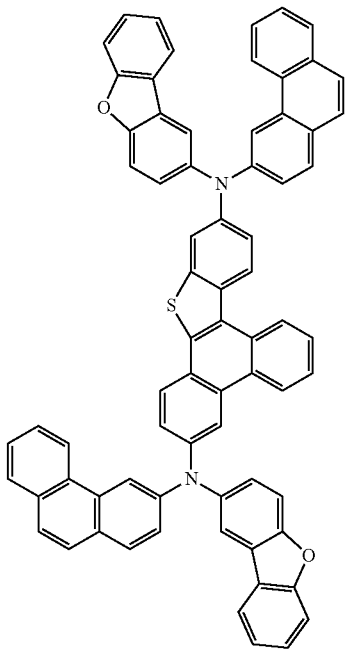
214
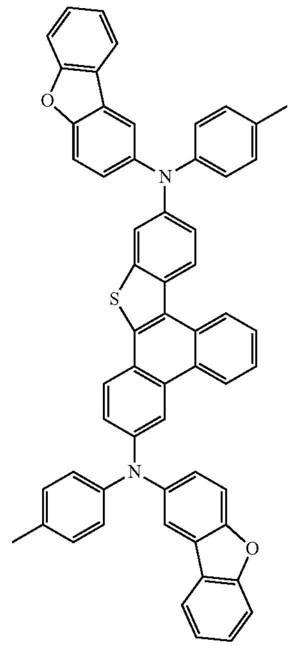
215
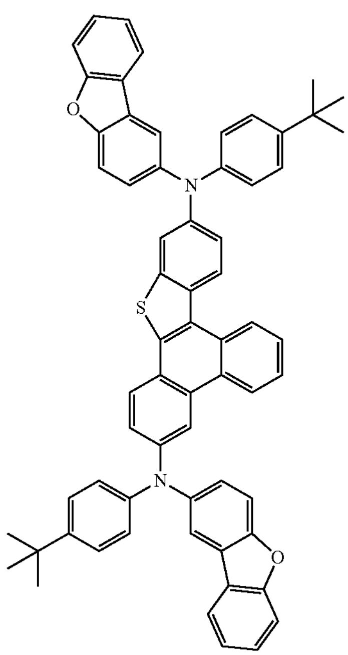
216
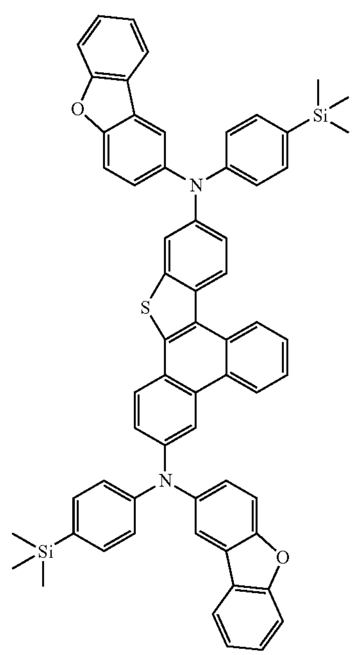

-continued
217
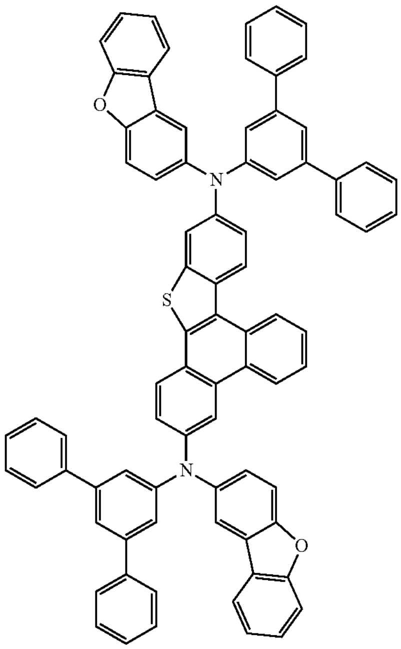
218
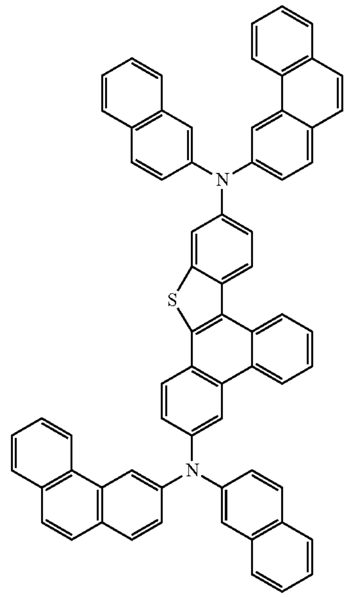
219
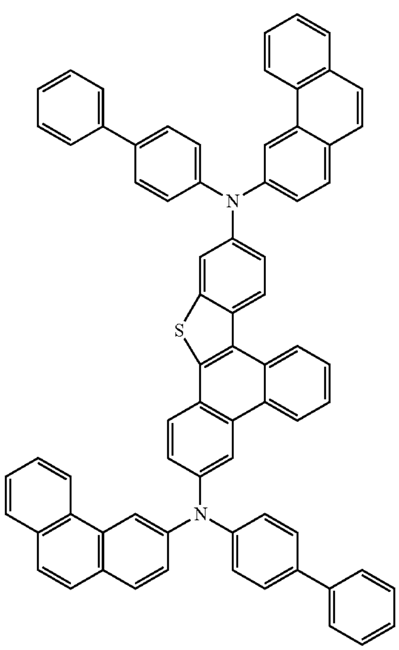
220
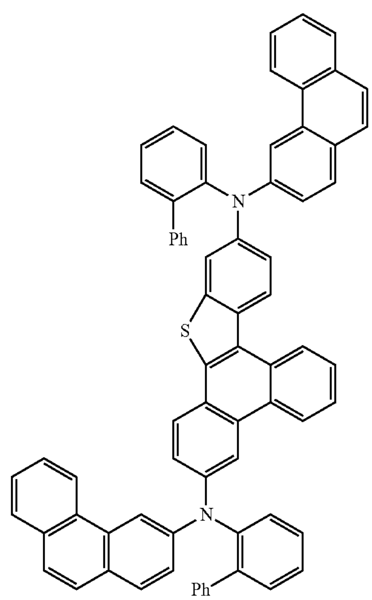

-continued
221
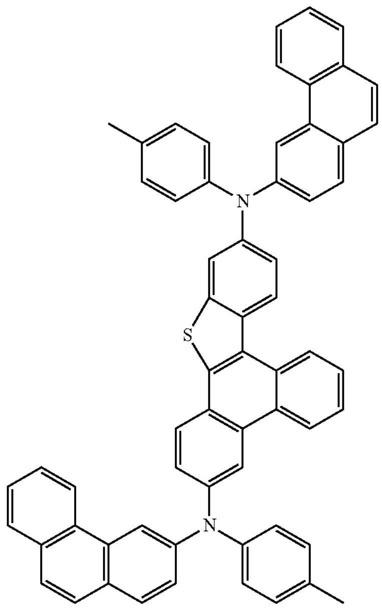
222
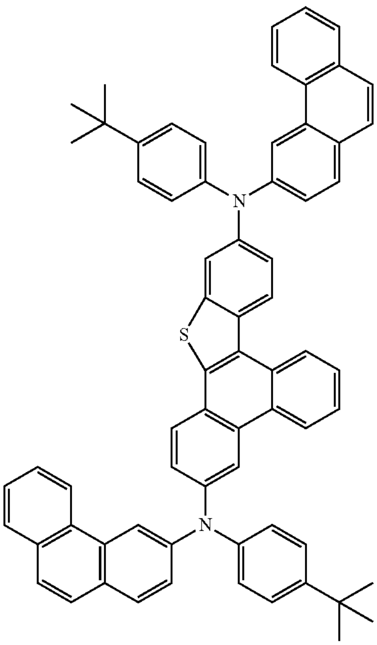
223
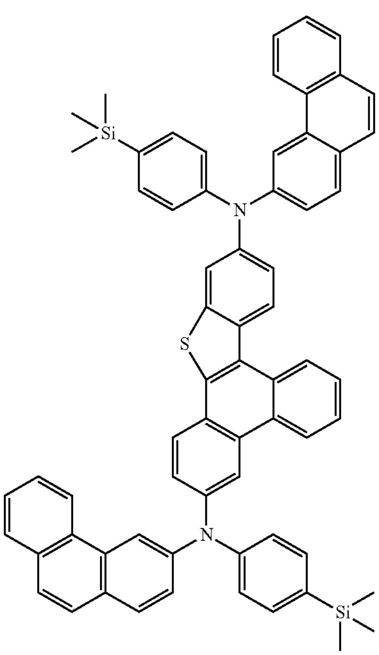
224
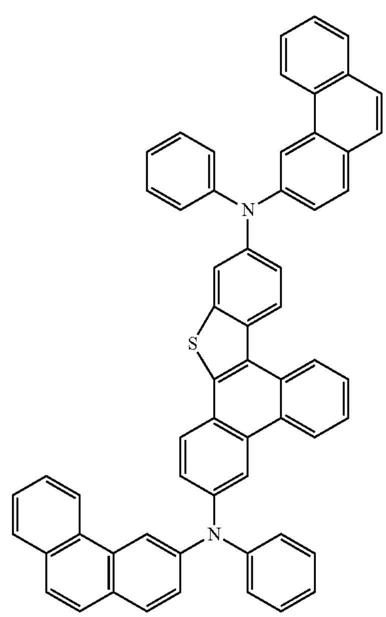

-continued
225
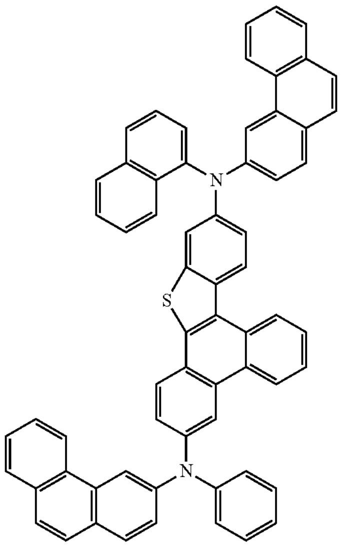
226
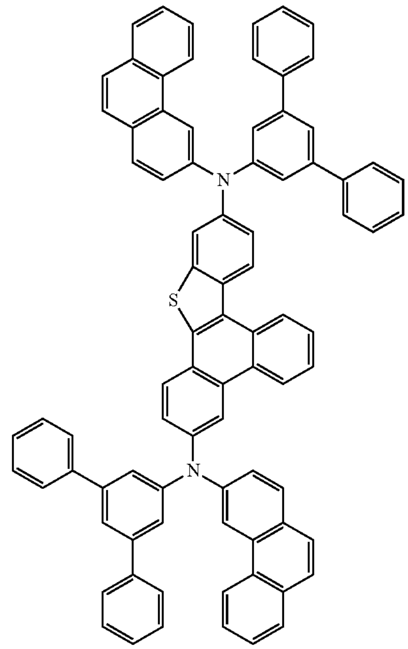
227
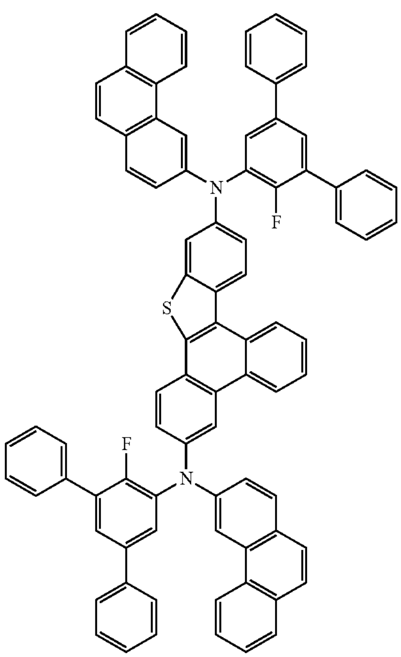
228
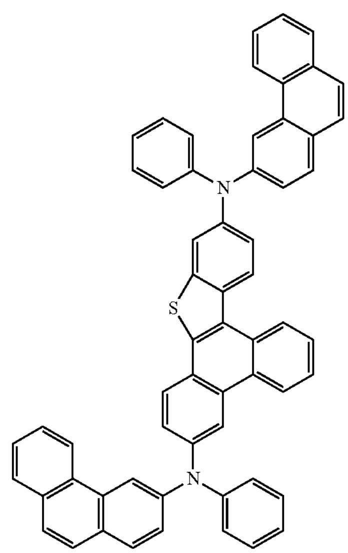

-continued
229
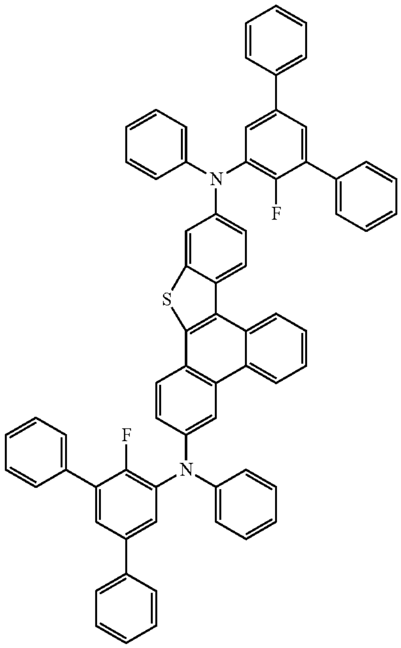
230
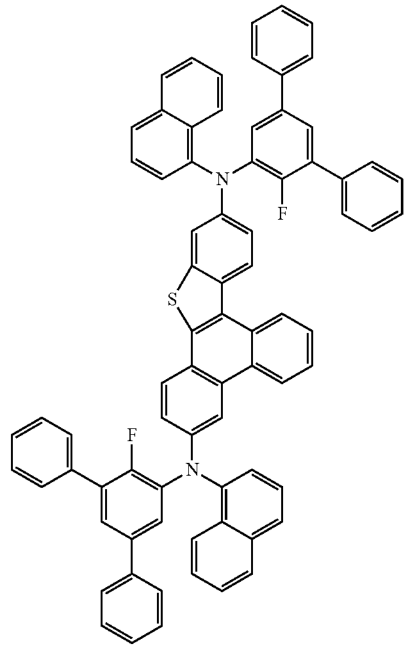
231
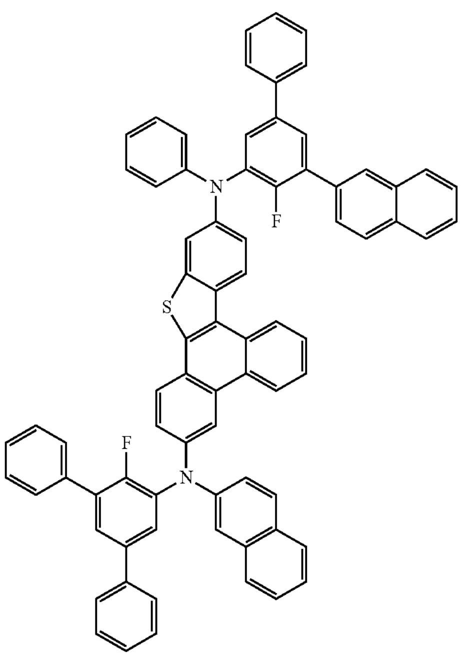
232
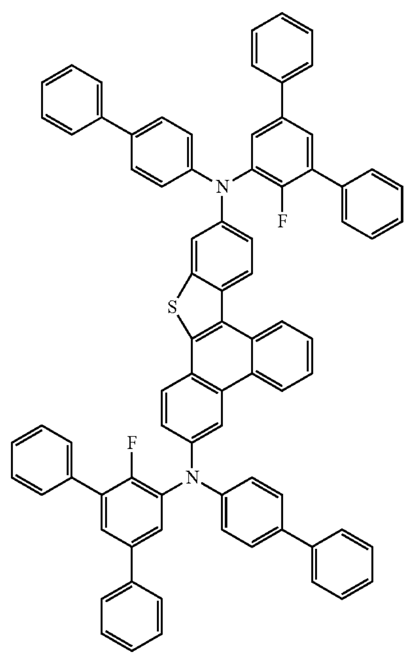

-continued
233
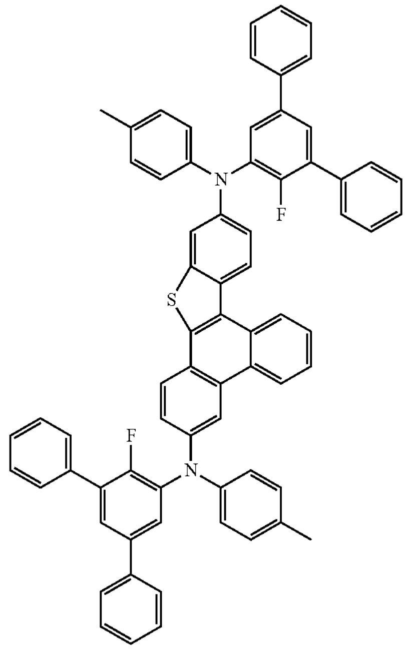
234
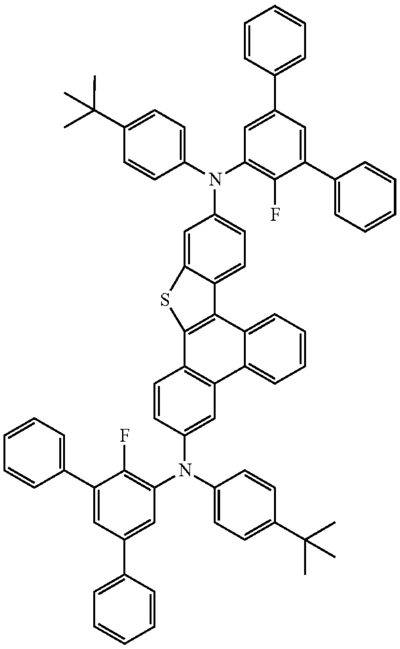
235
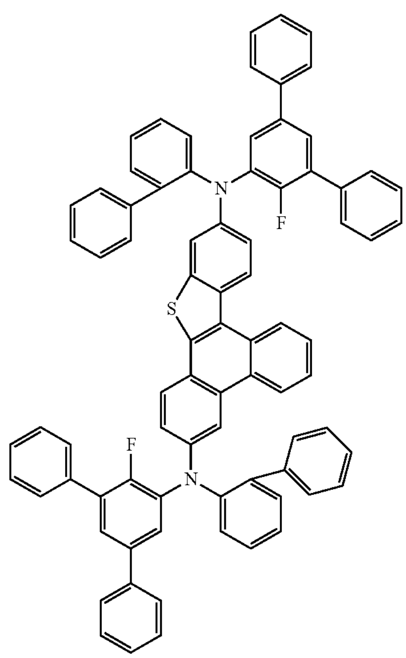
236
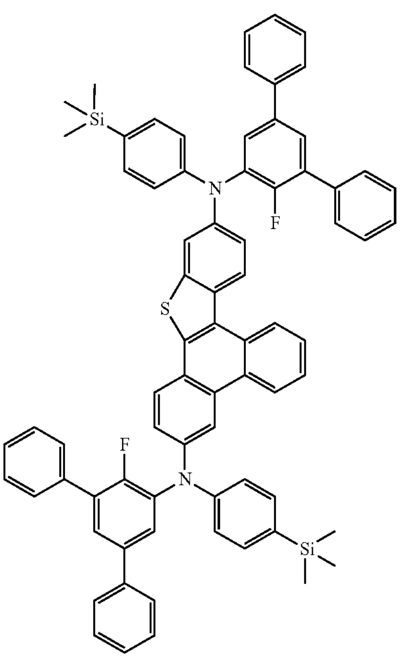

-continued
237
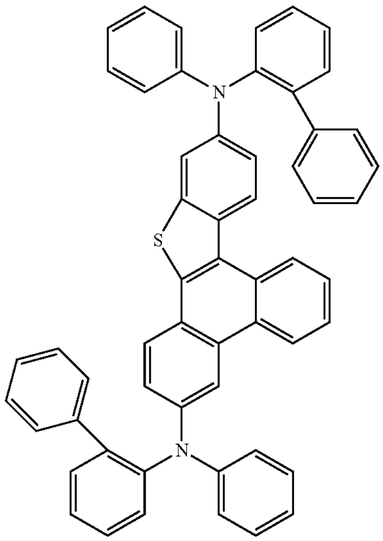
238
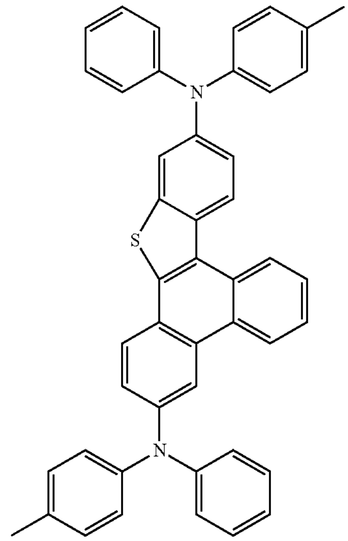
239
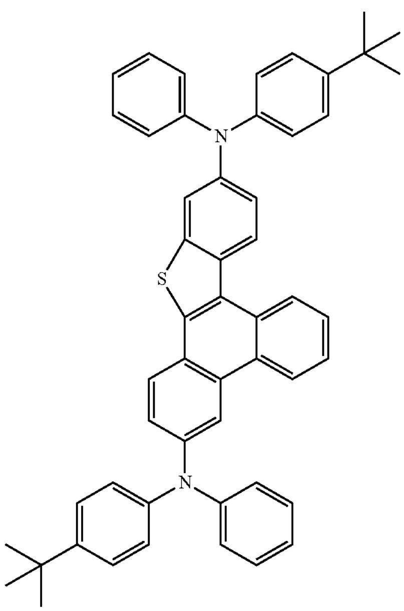
240
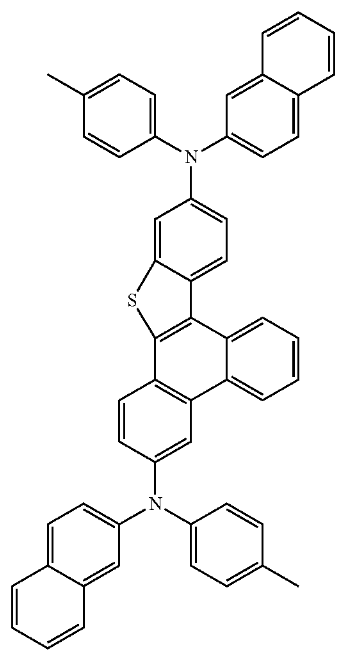

-continued
241
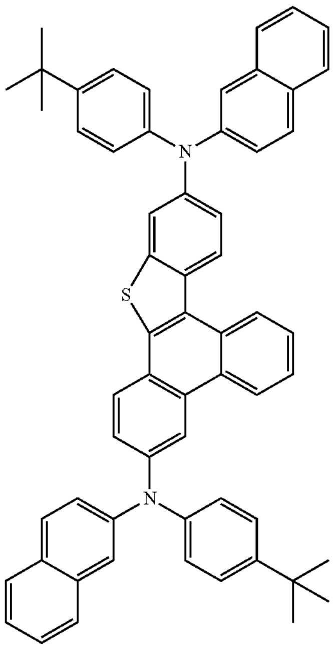
242
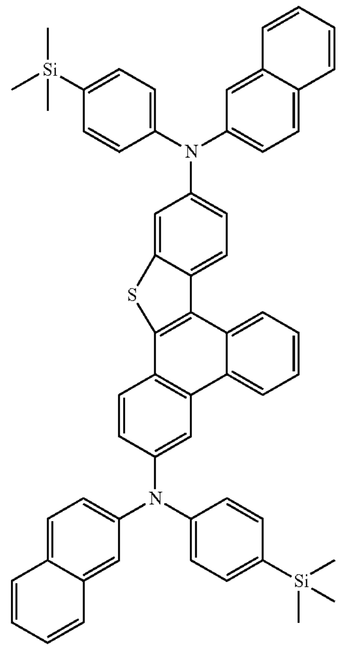
243
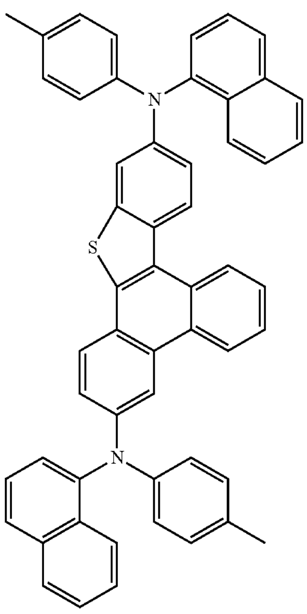
244
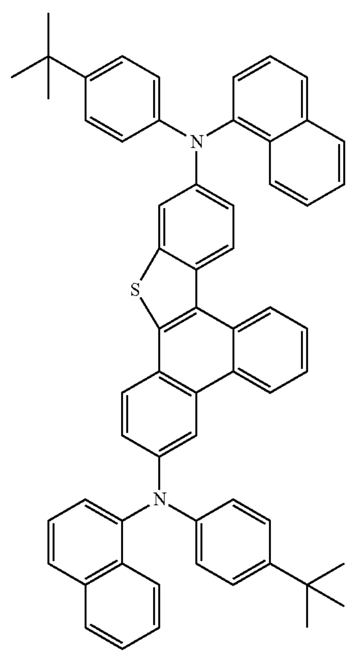

-continued
245
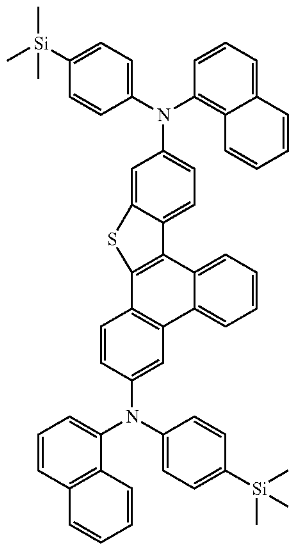
246
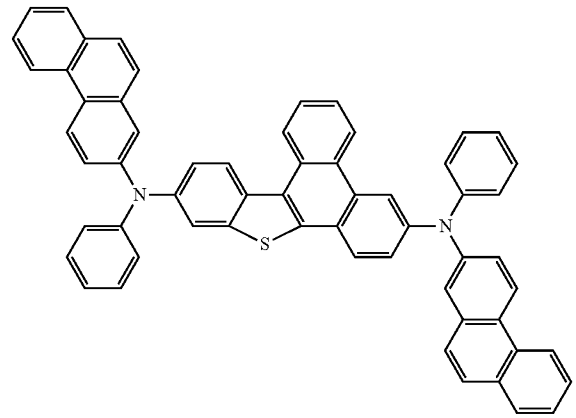
247
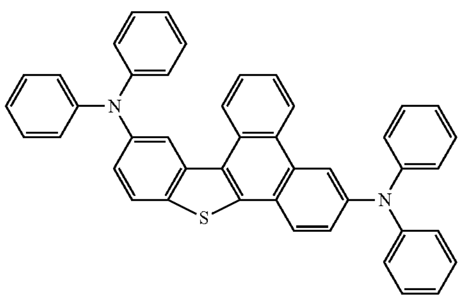
248
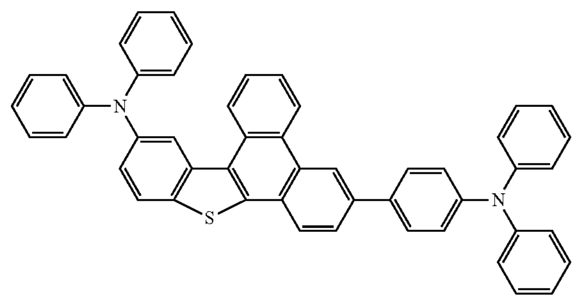
1A
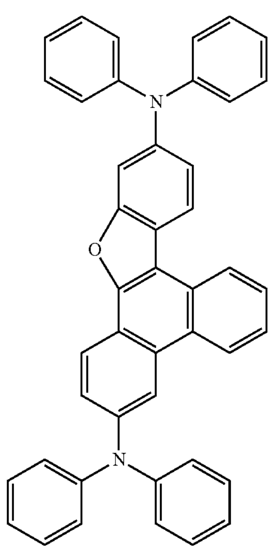
2A
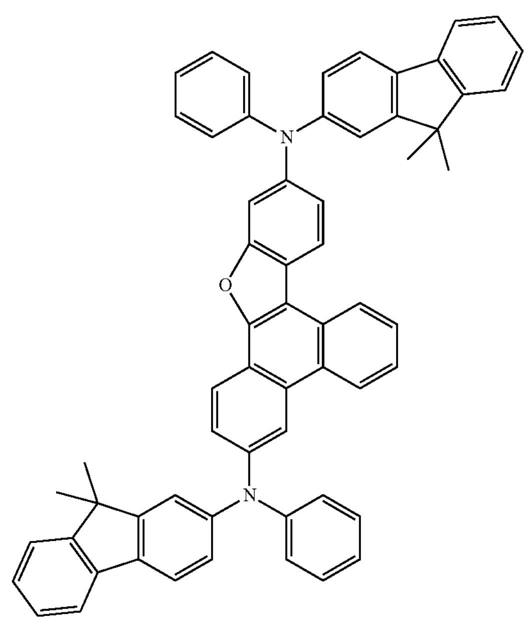

-continued
3A
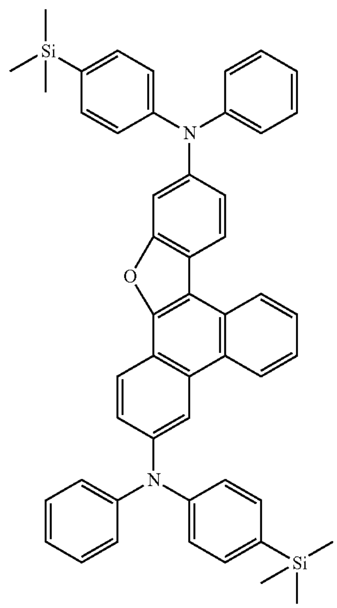
4A
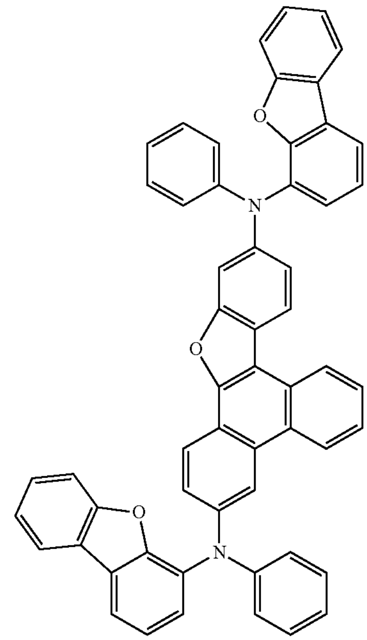
5A
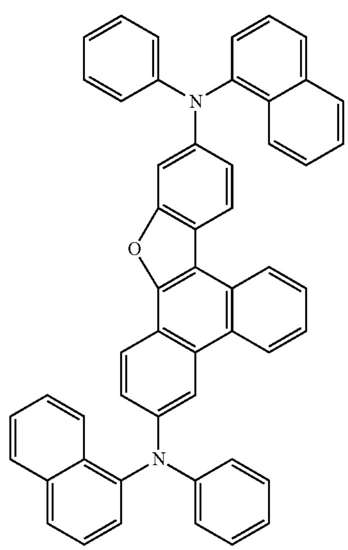
6A
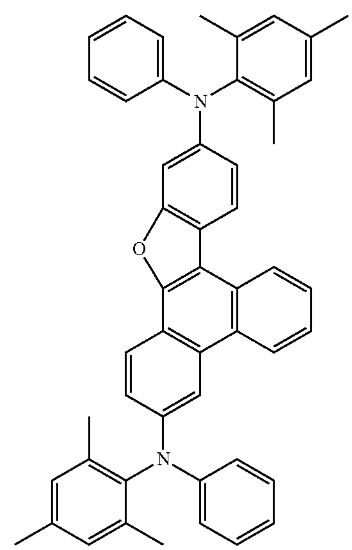

-continued
7A
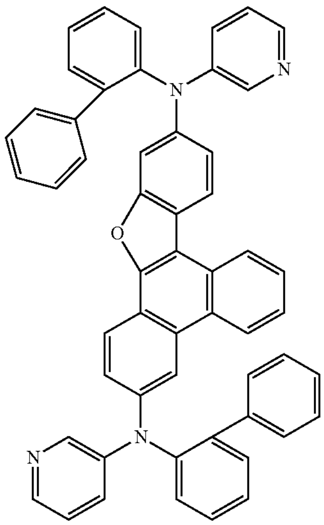
8A
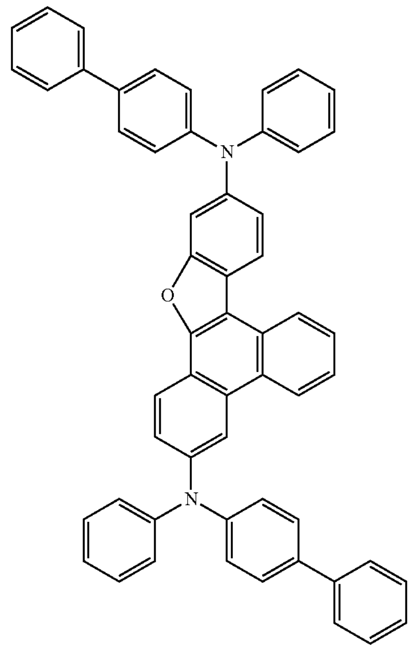
9A
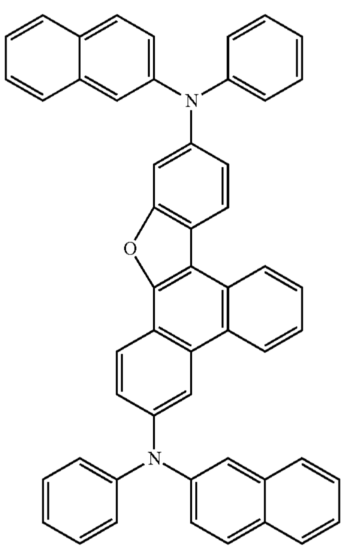
10A
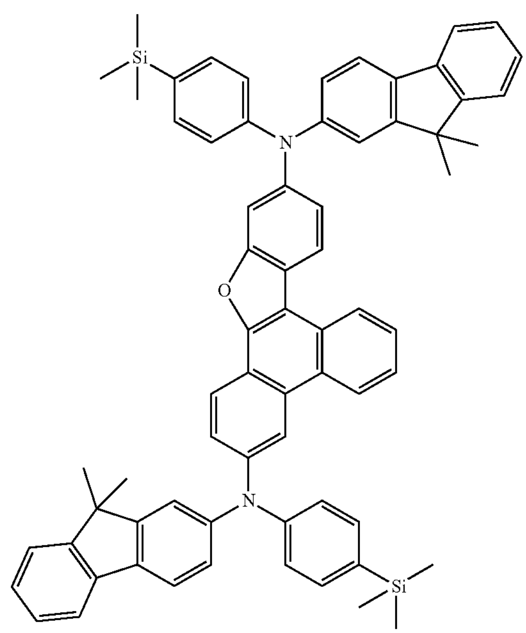

-continued
11A
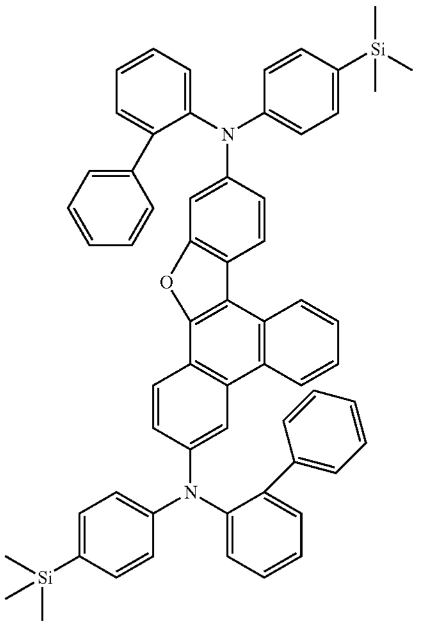
12A
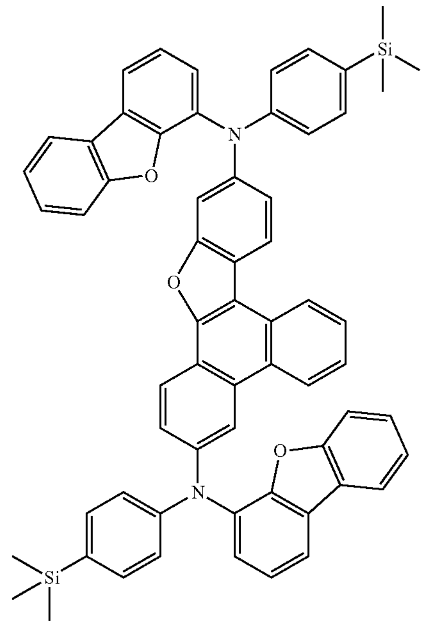
13A
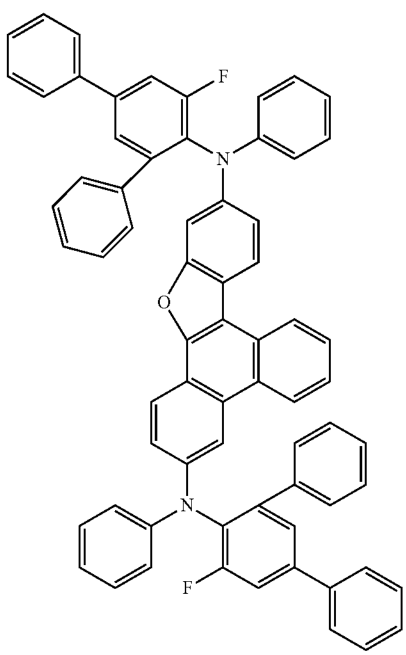
14A
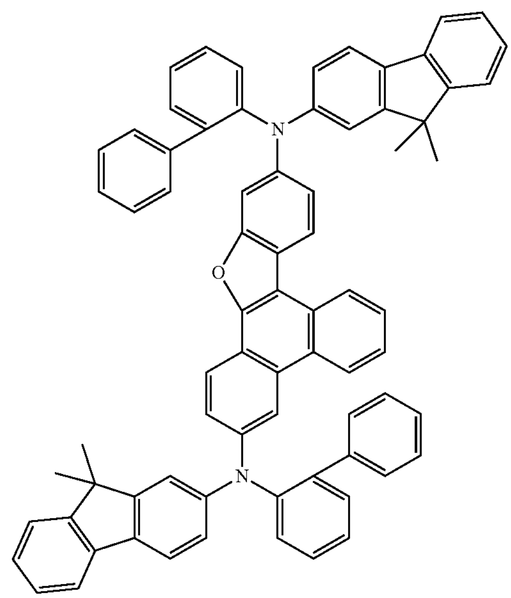

-continued
15A
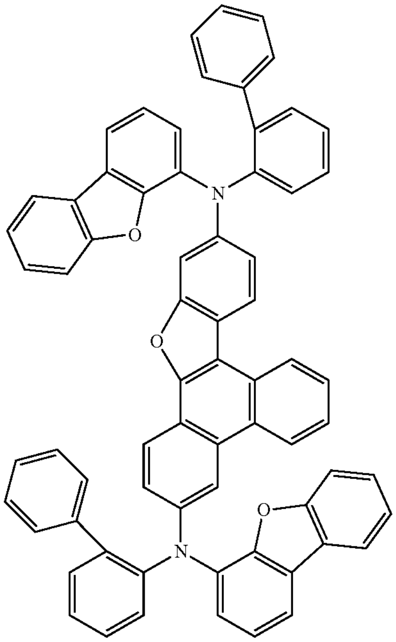
16A
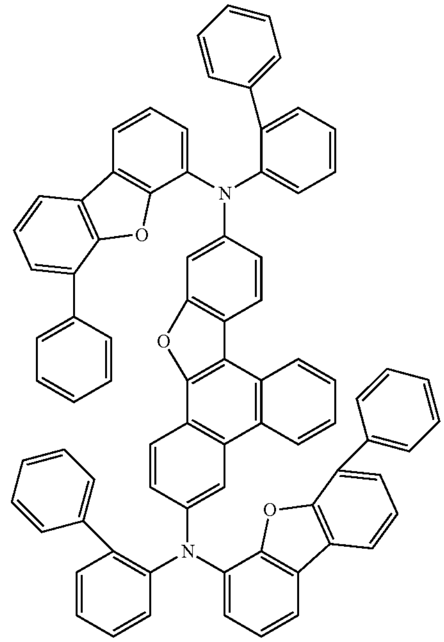
17A
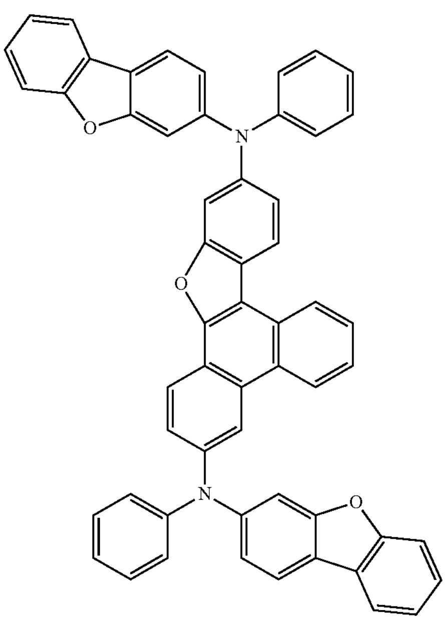
18A
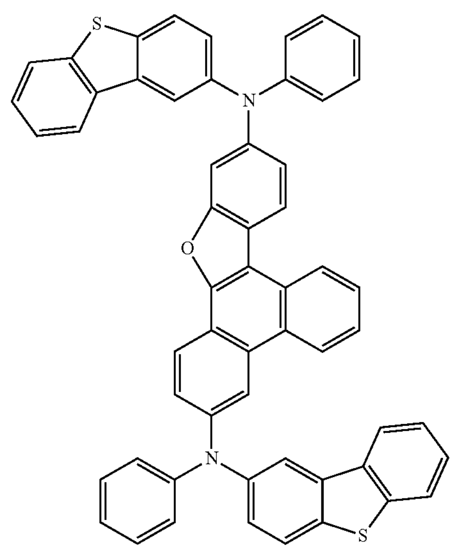

-continued
19A
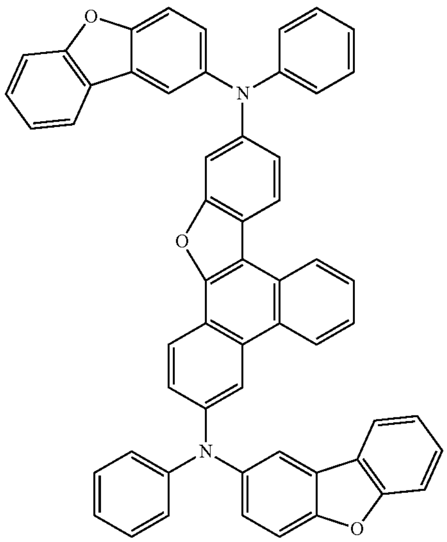
20A
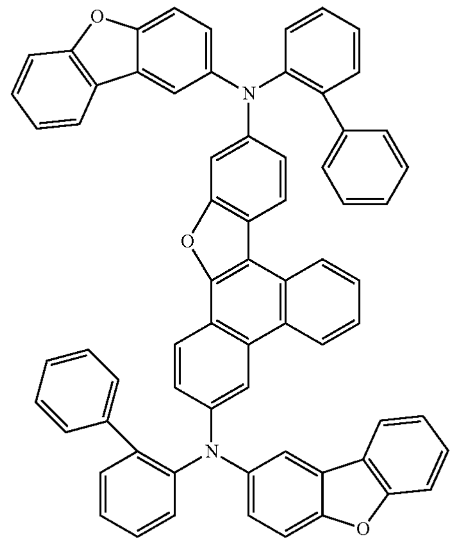
21A
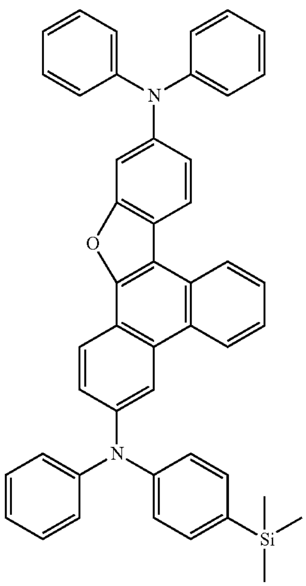
22A
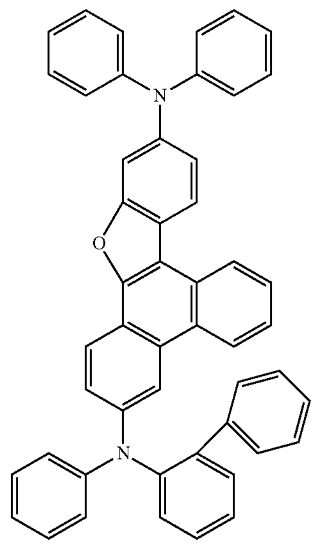
23A
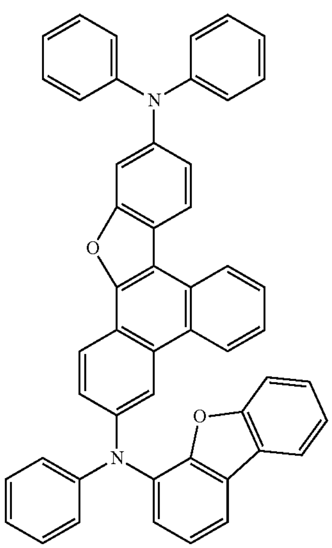
24A
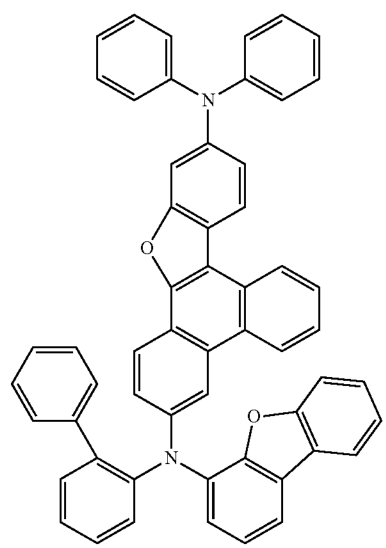

-continued
25A
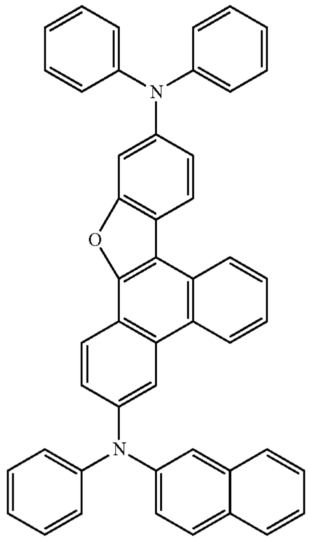
26A
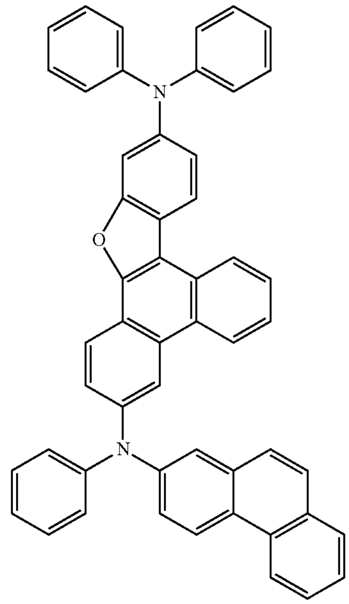
27A
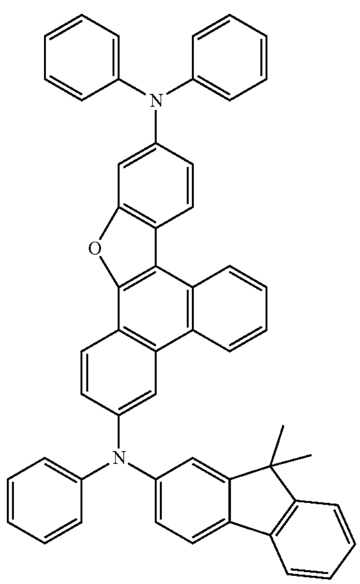
28A
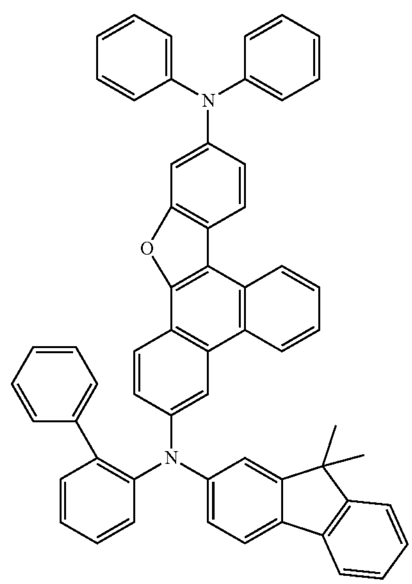

-continued
29A
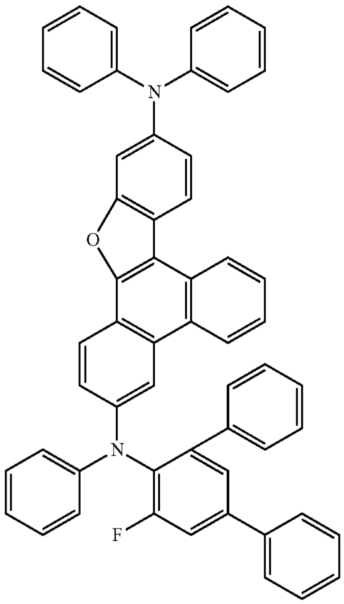
30A
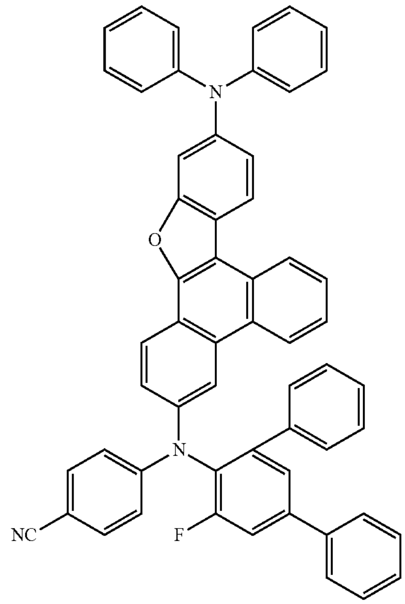
31A
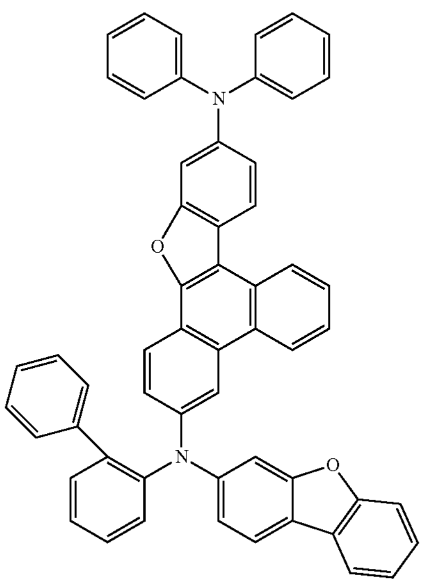
32A
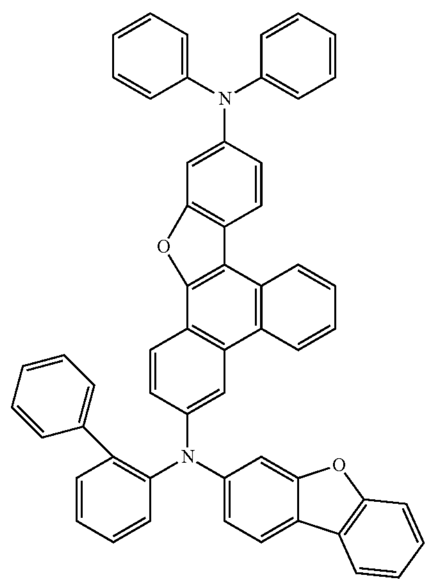

-continued
33A
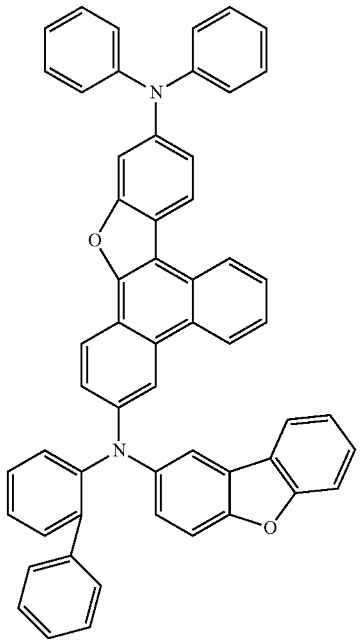
34A
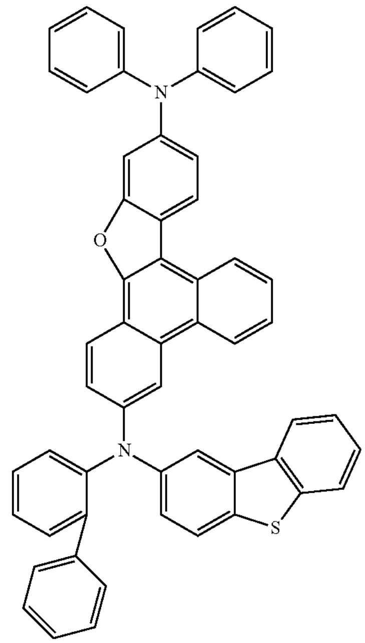
35A
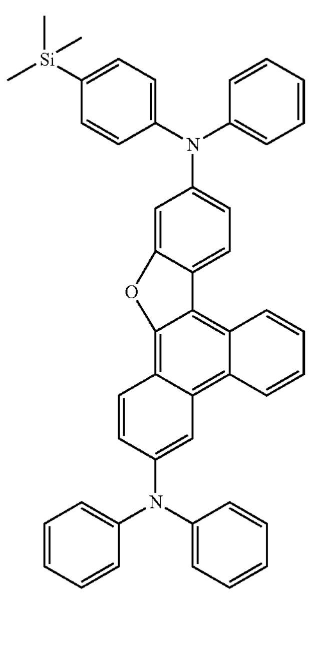
36A
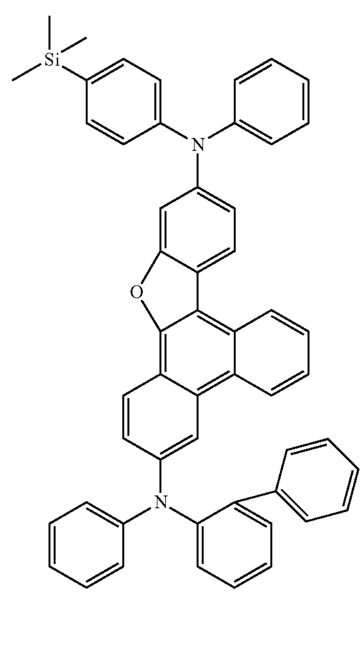

-continued
37A
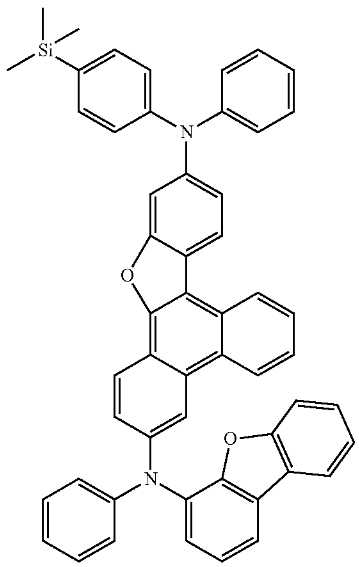
38A
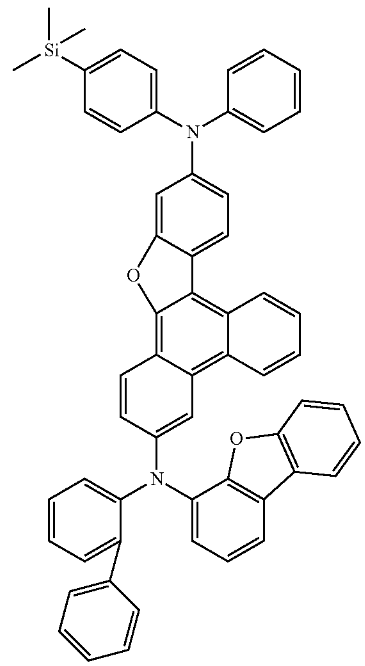
39A
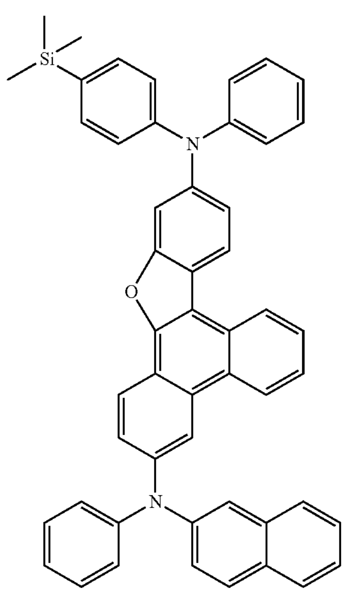
40A
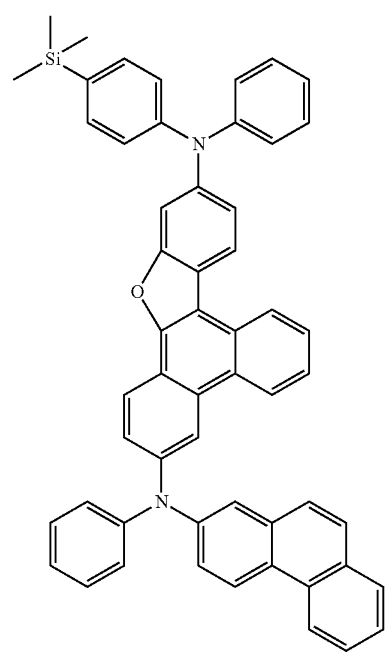

-continued
41A
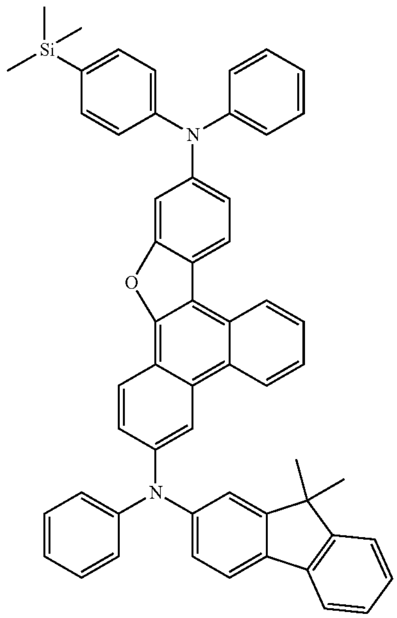
42A
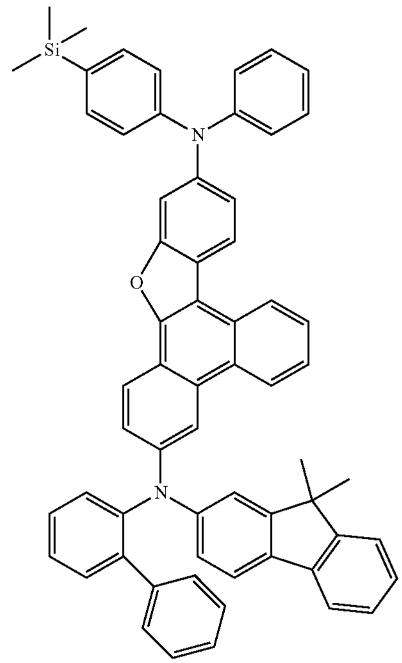
43A
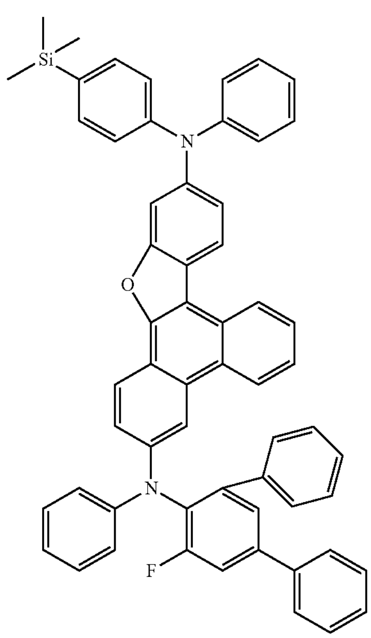
44A
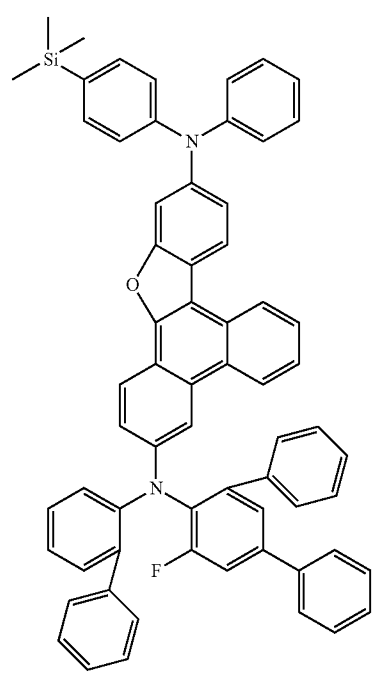

-continued
45A
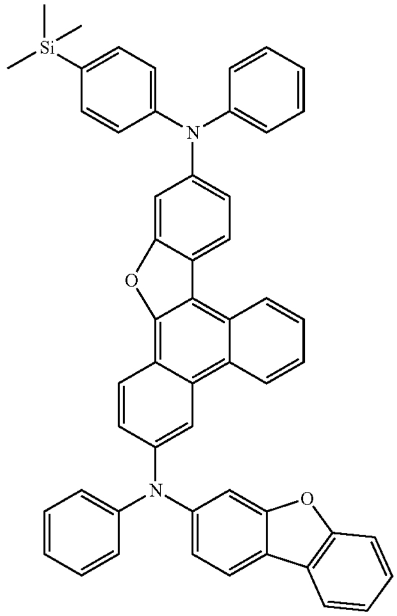
46A
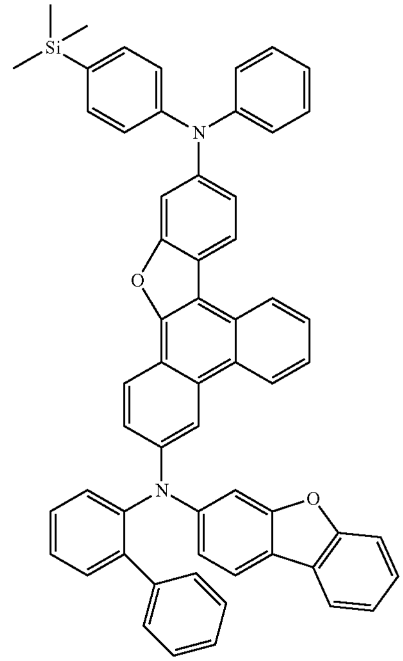
47A
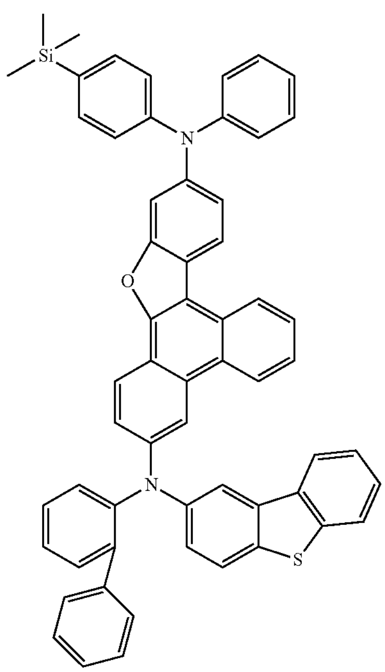
48A
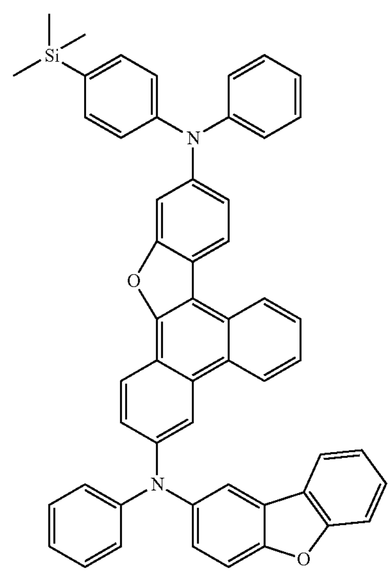

-continued
49A
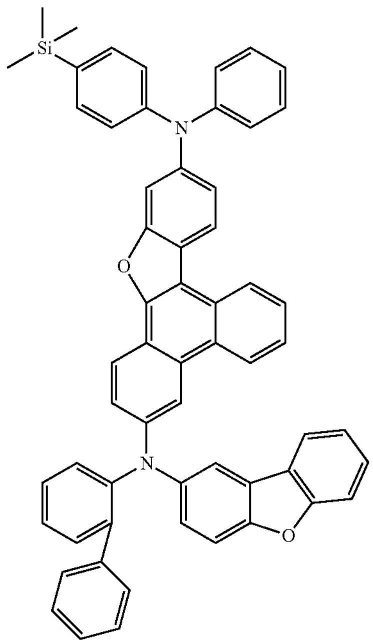
50A
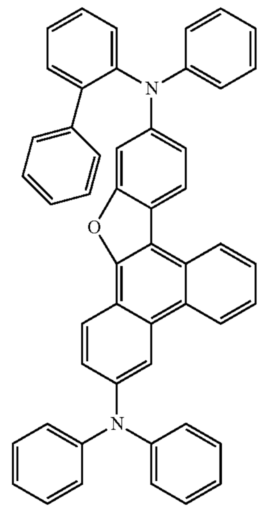
51A
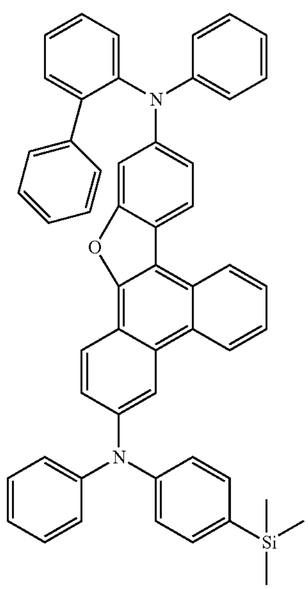
52A
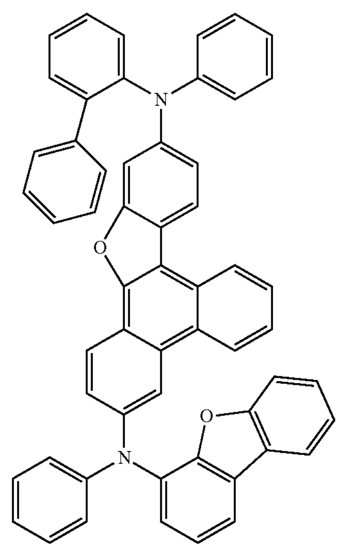

-continued
53A
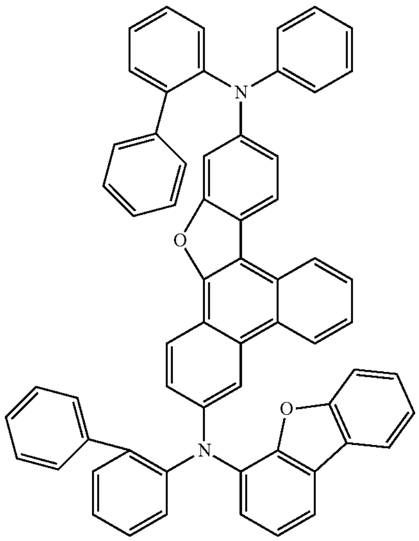
54A
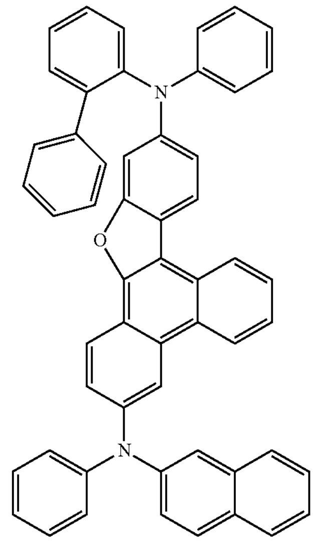
55A
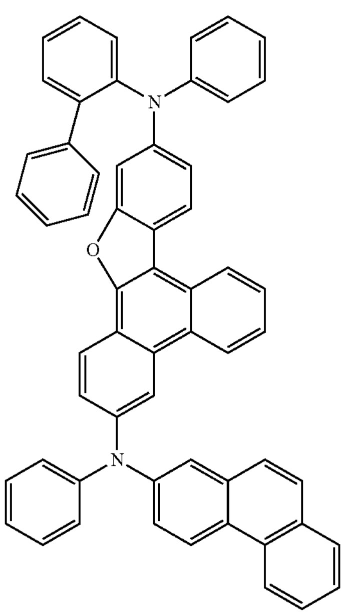
56A
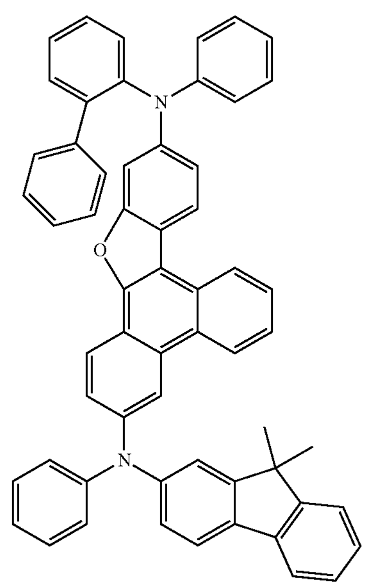

-continued
57A
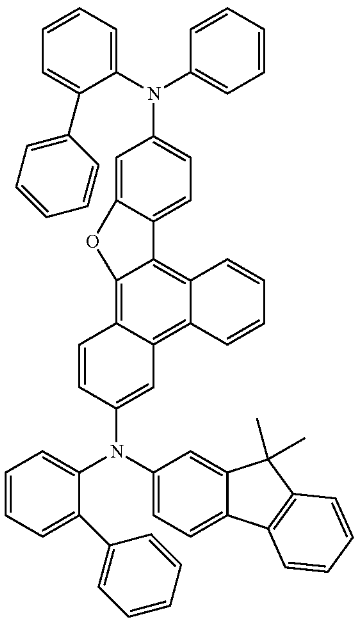
58A
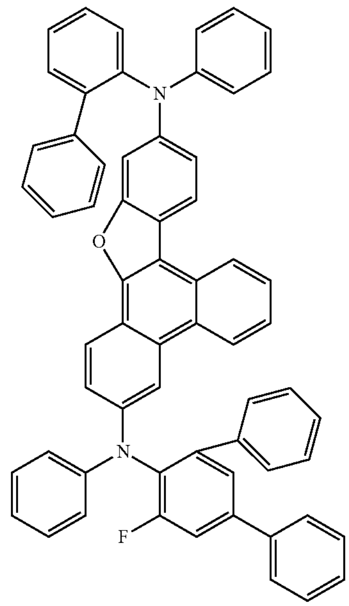
59A
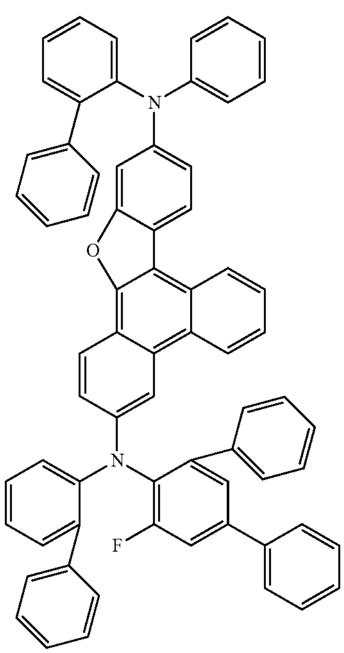
60A
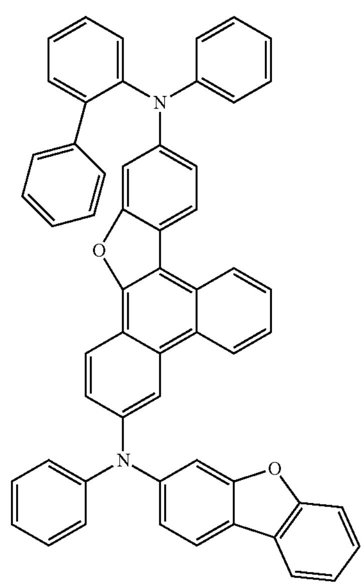

-continued
61A
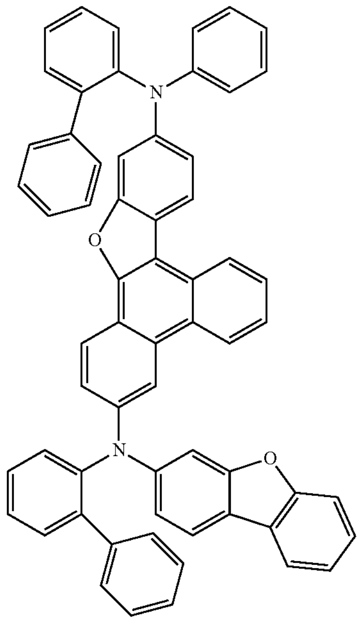
62A
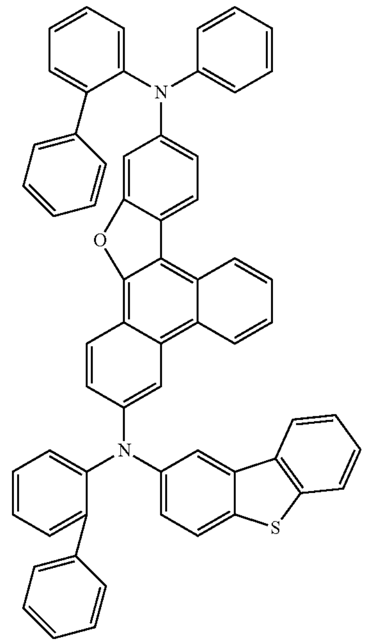
63A
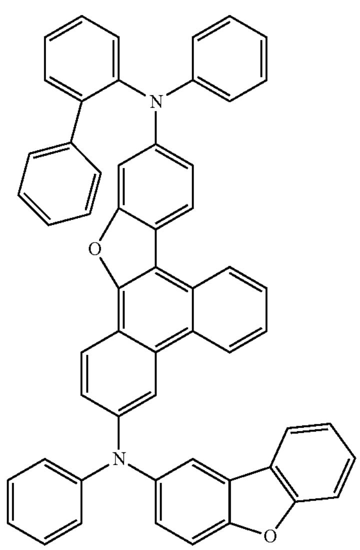
64A
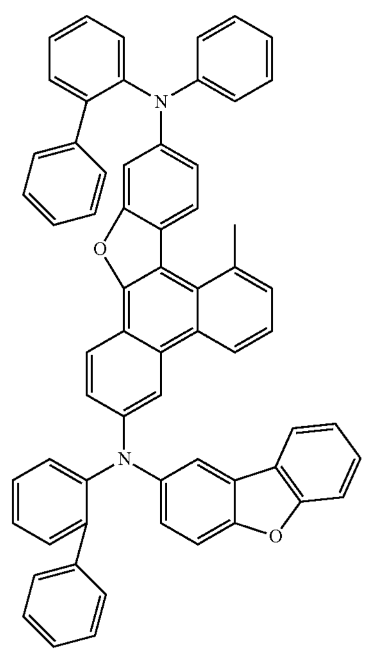

-continued
65A
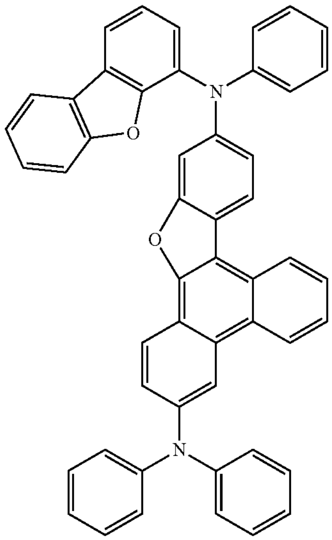
66A
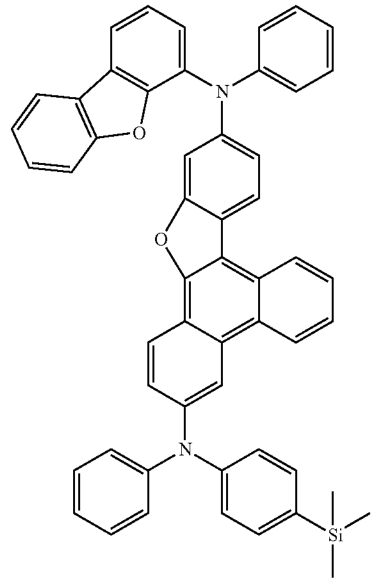
67A
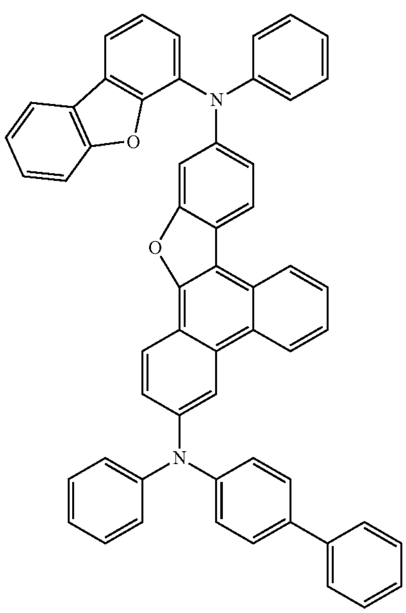
68A
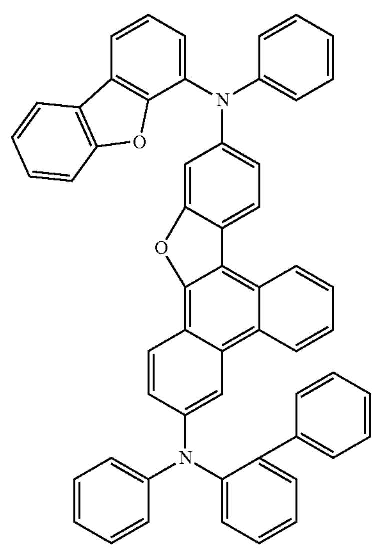

-continued
69A
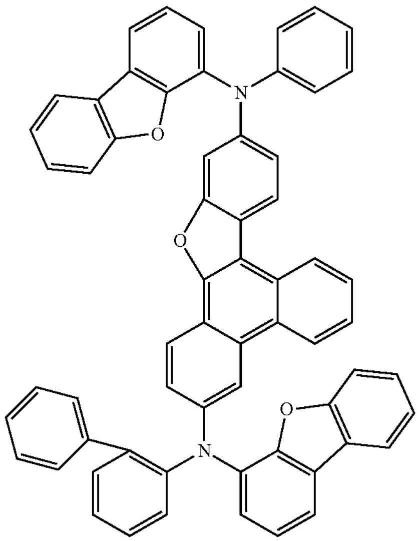
70A
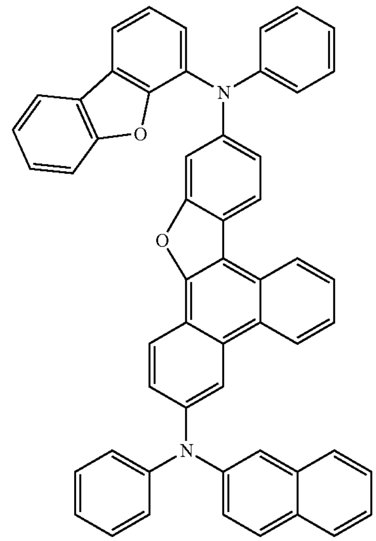
71A
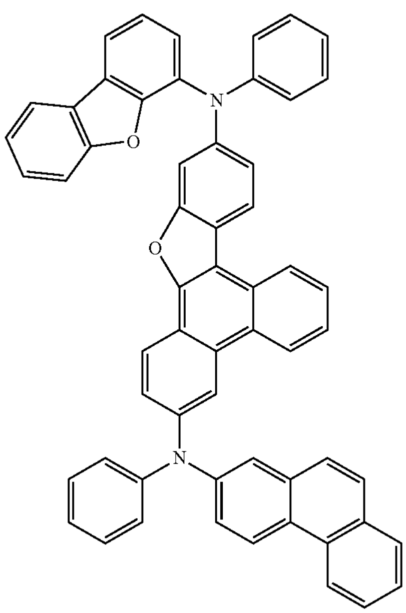
72A
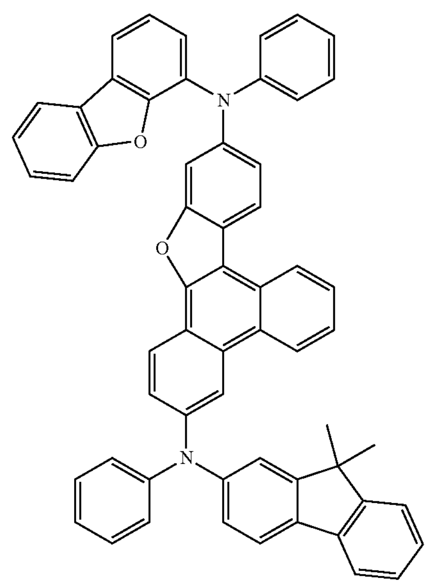

-continued
73A
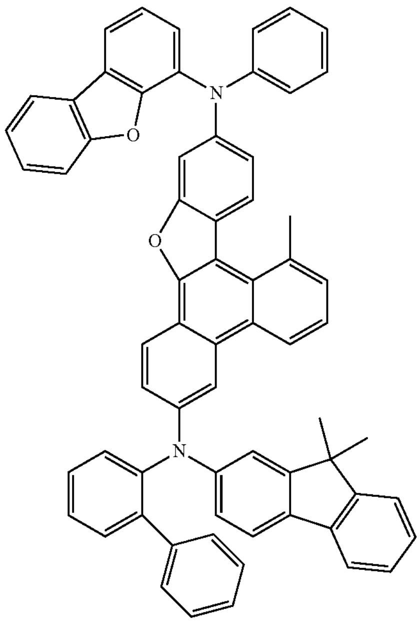
74A
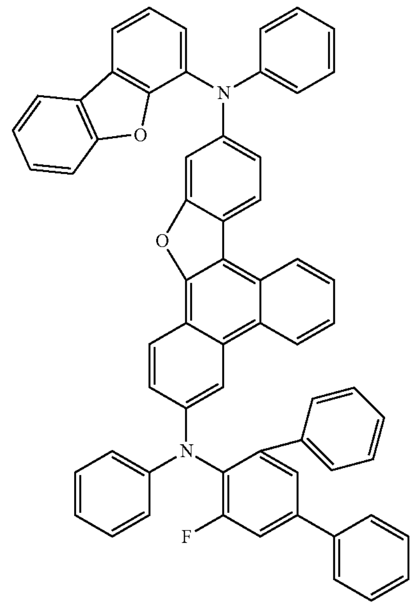
75A
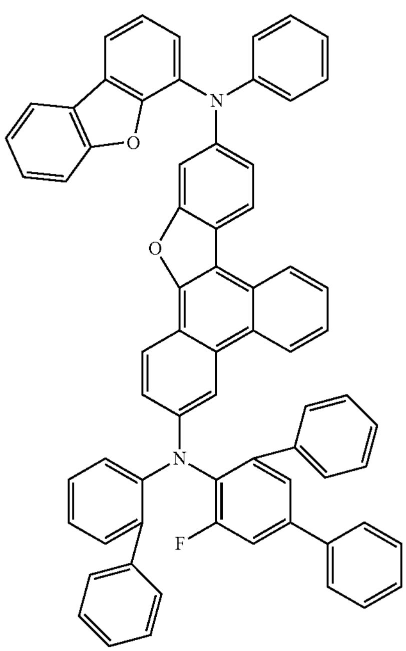
76A
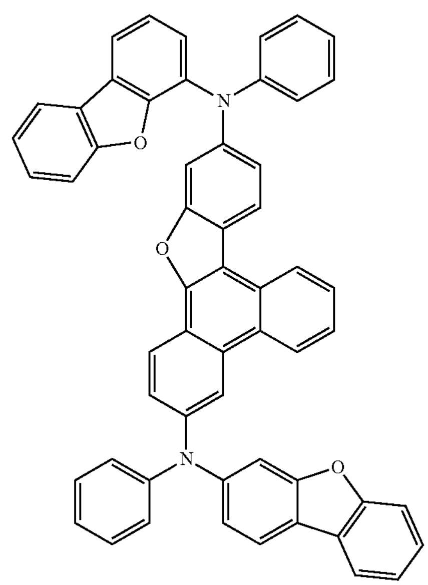

-continued
77A
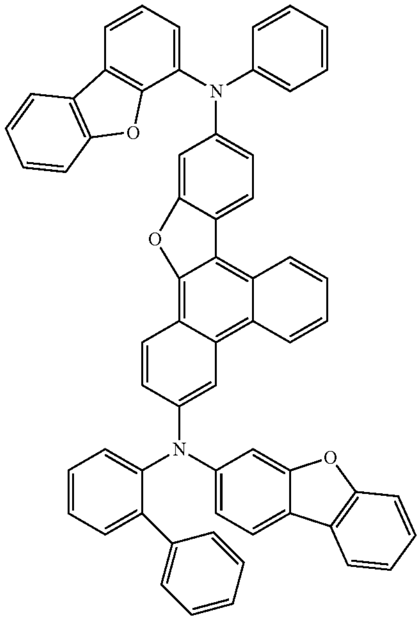
78A
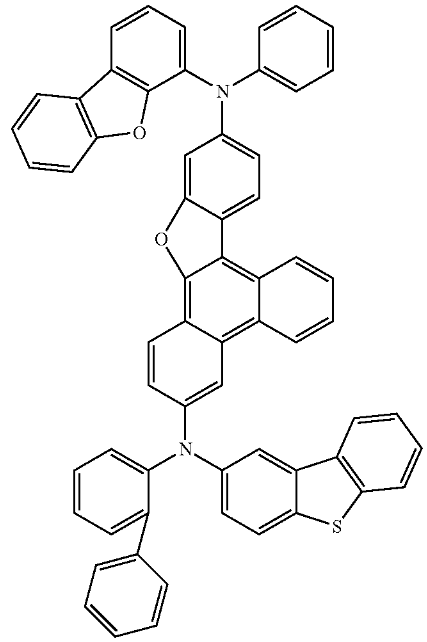
79A
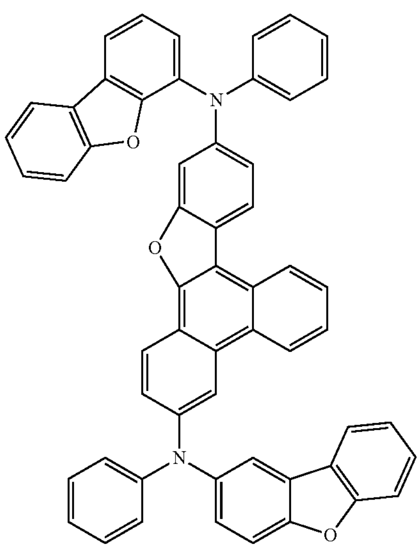
80A
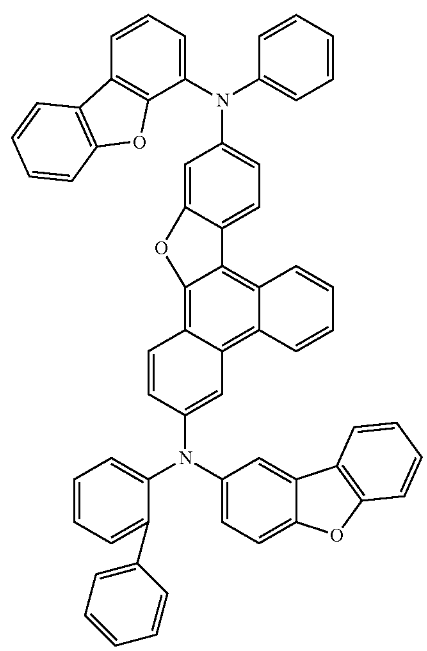

-continued
81A
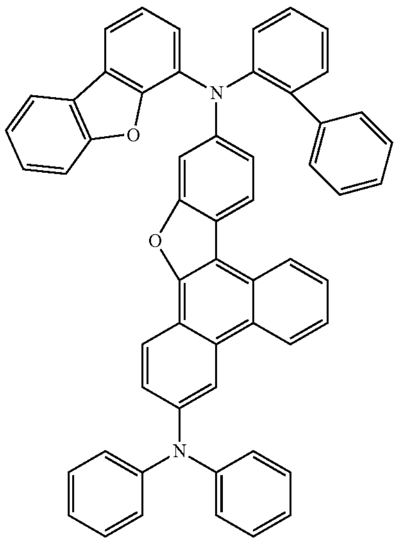
82A
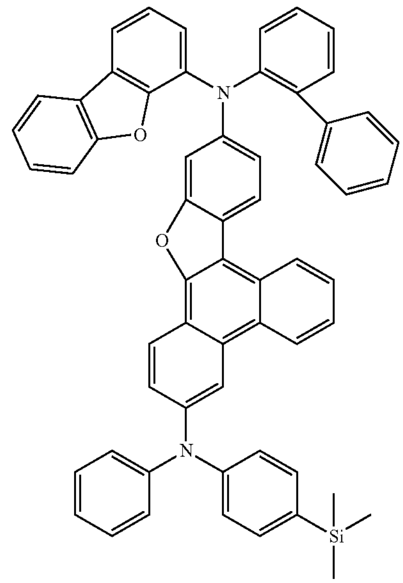
83A
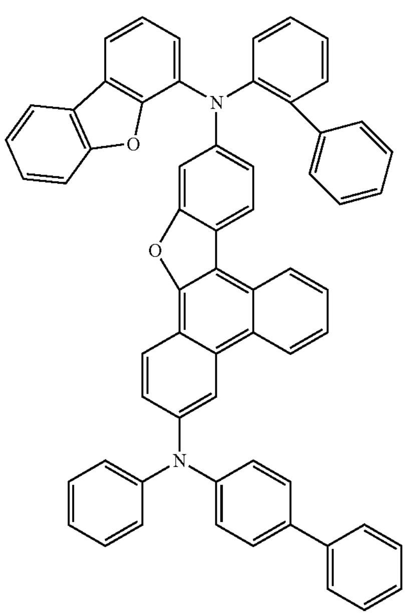
84A
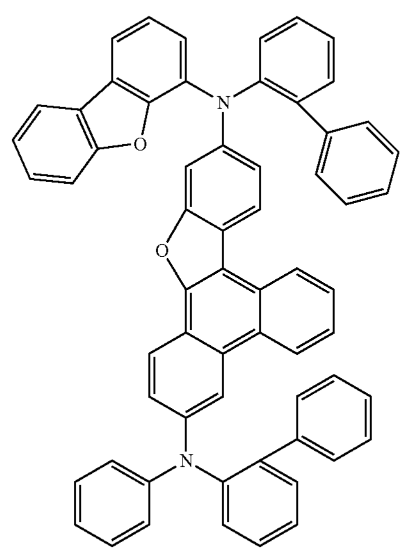

-continued
85A
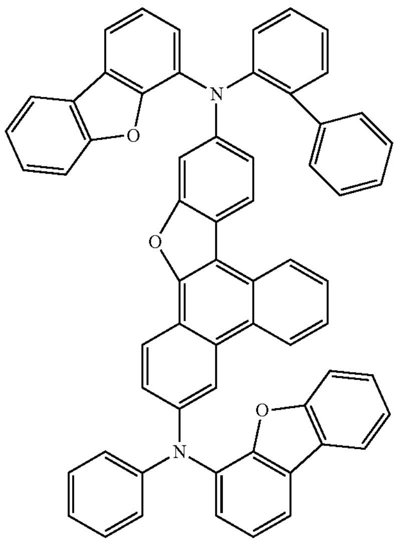
86A
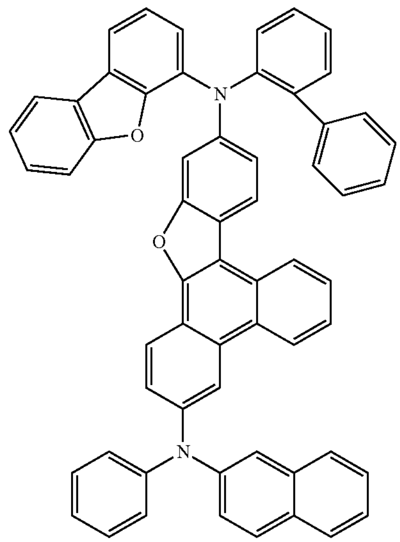
87A
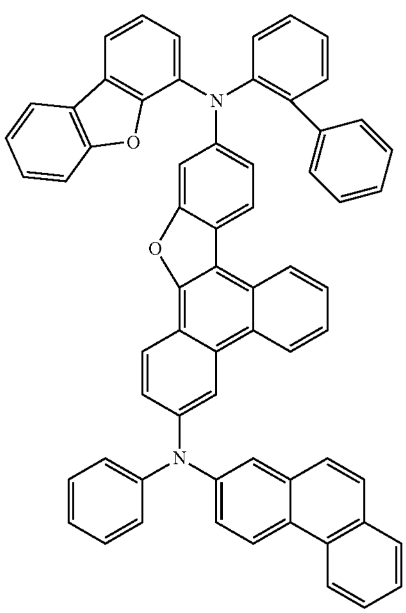
88A
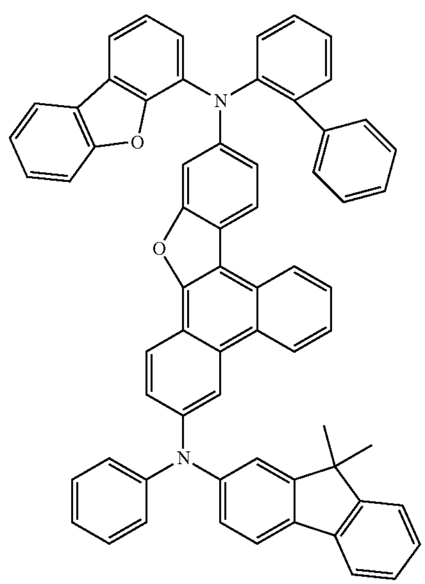

-continued
89A
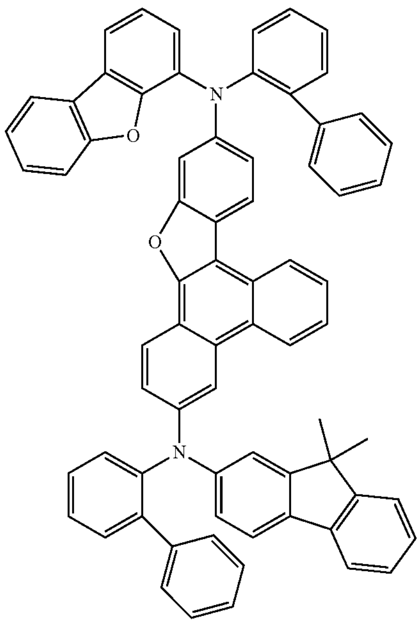
90A
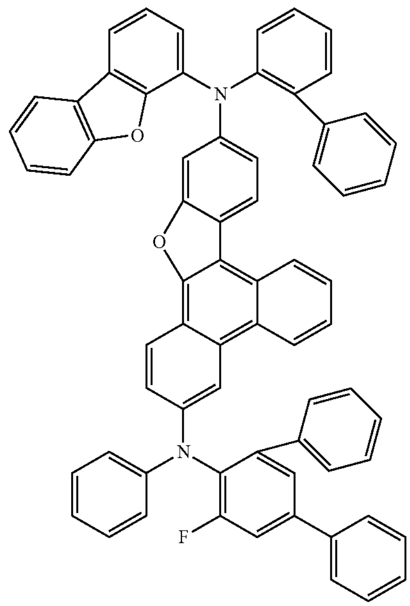
91A
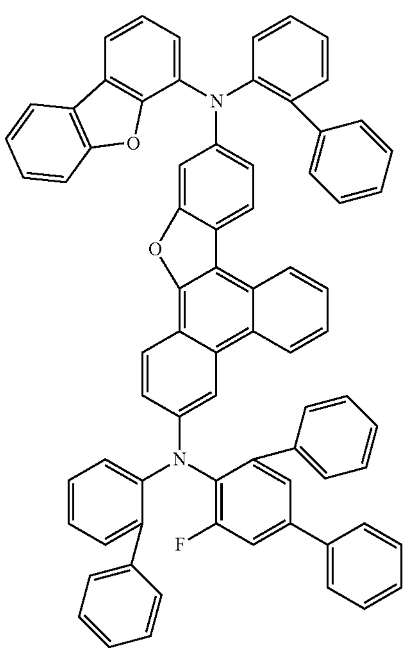
92A
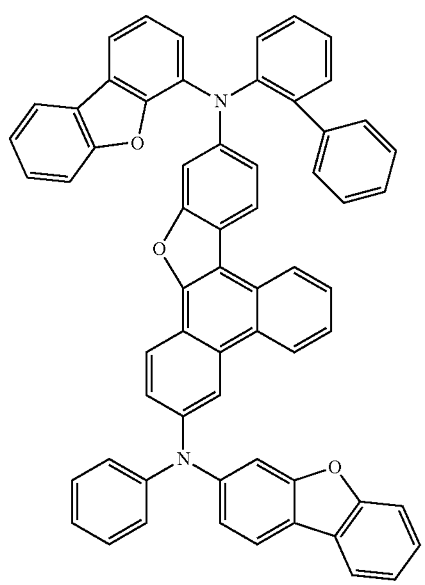

-continued
93A
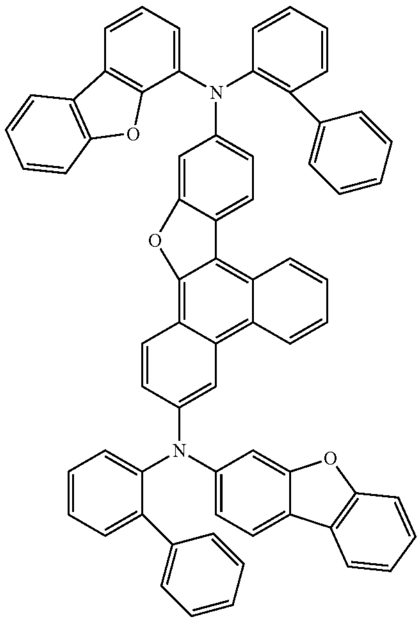
94A
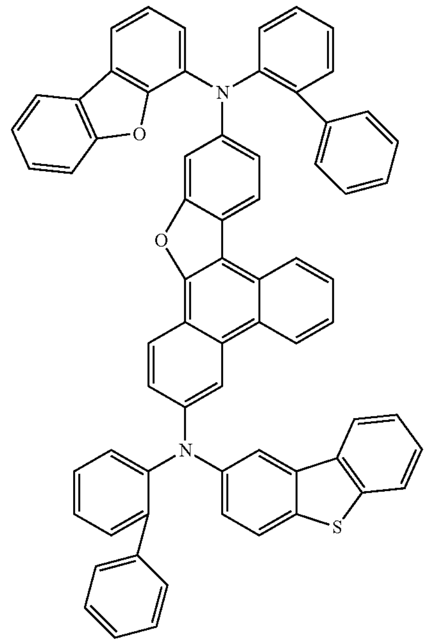
95A
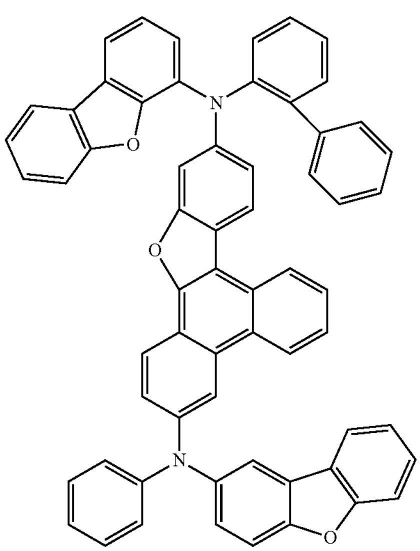
96A
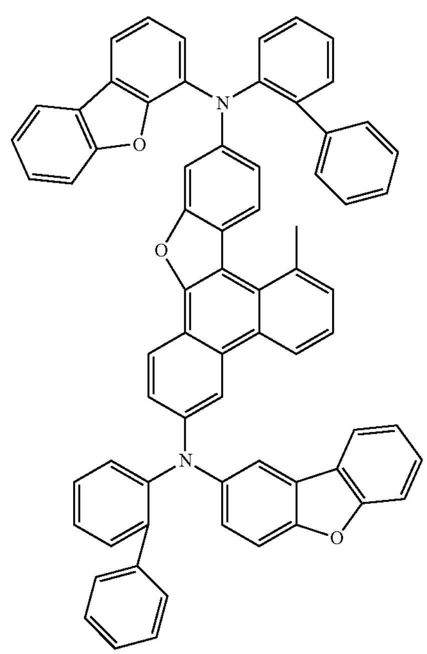

-continued
97A
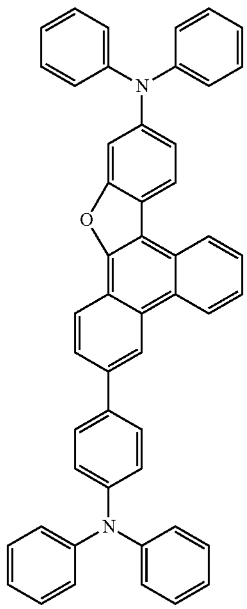
98A
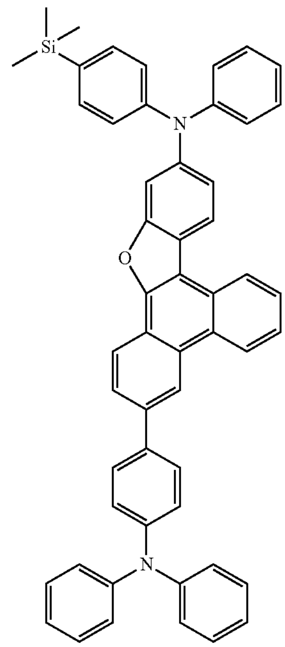
99A
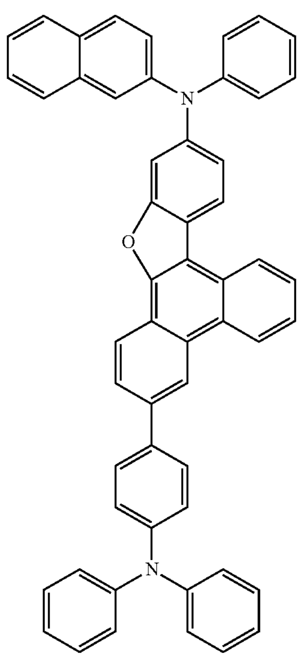
100A
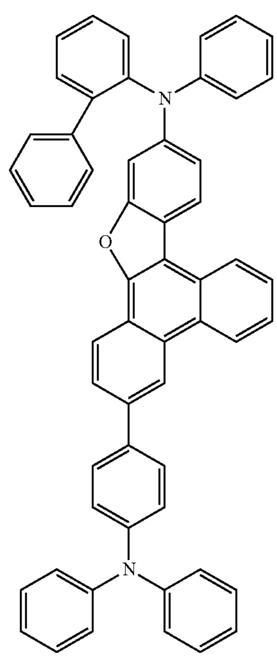

-continued
101A
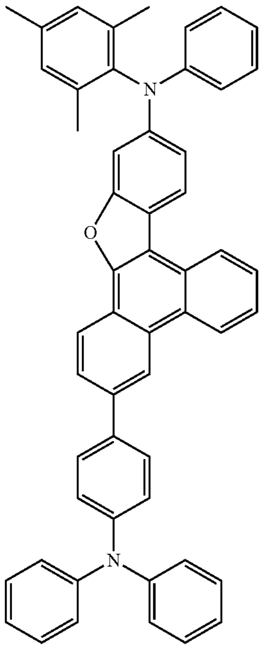
102A
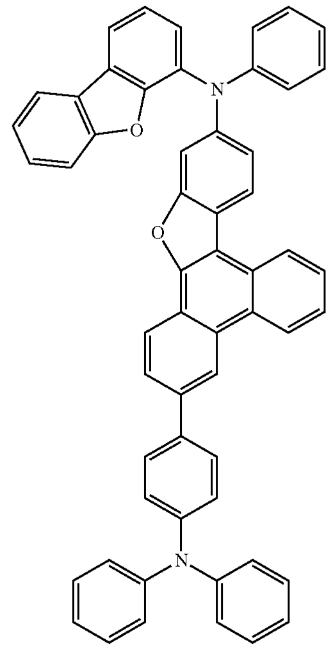
103A
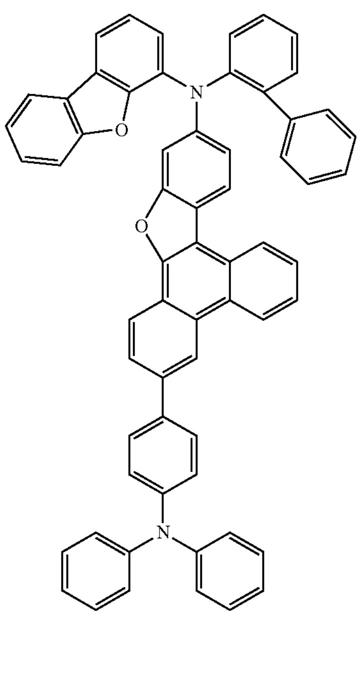
104A
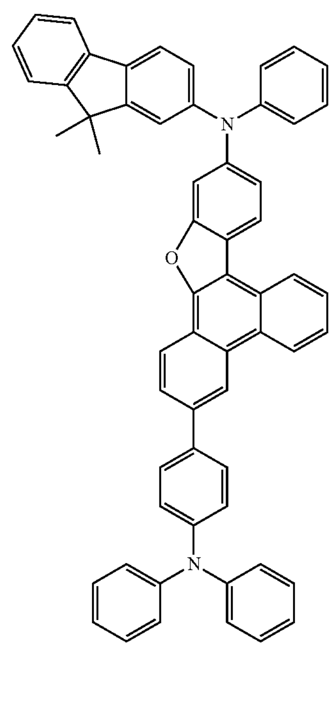

-continued
105A
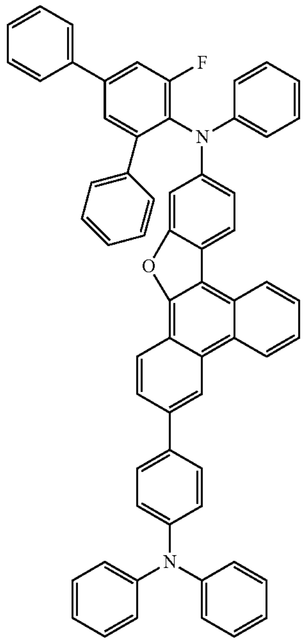
106A
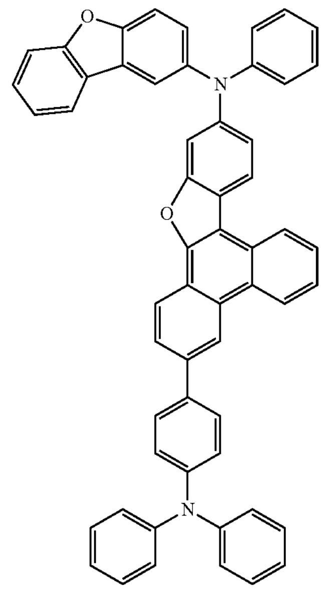
107A
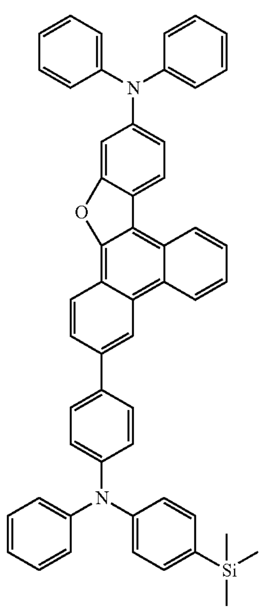
108A
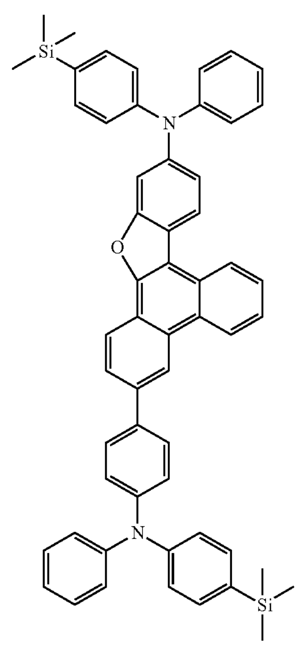

-continued
109A
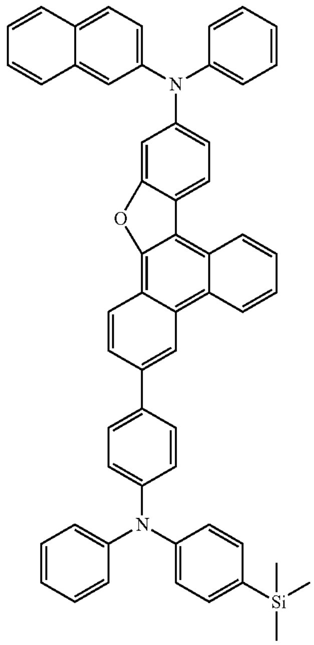
110A
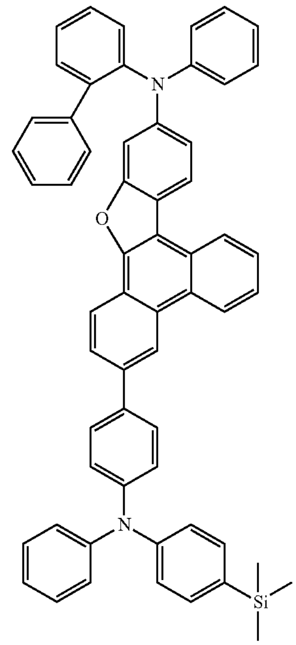
111A
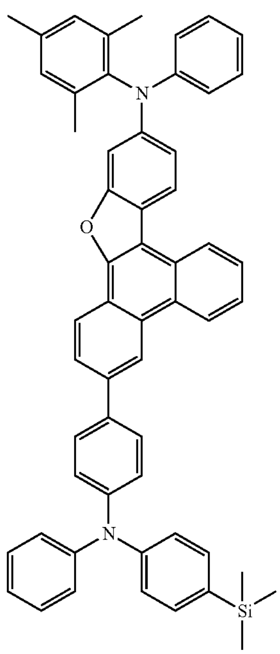
112A
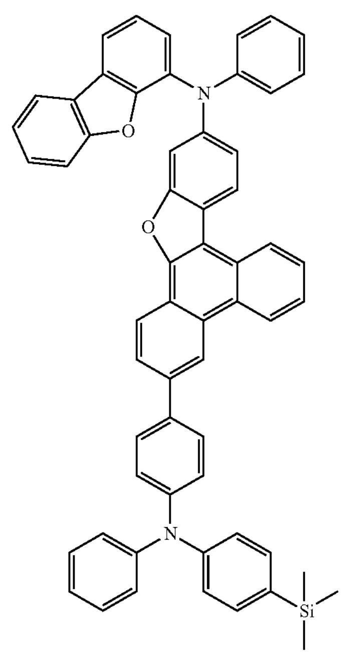

-continued
113A
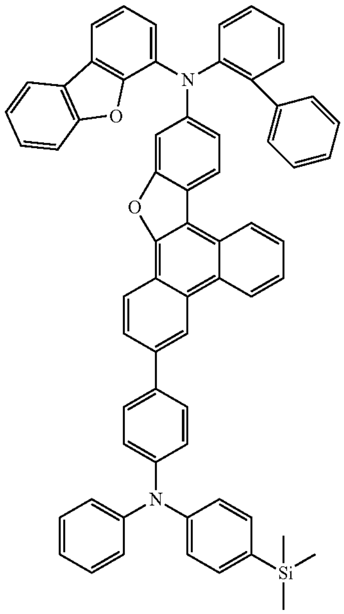
114A
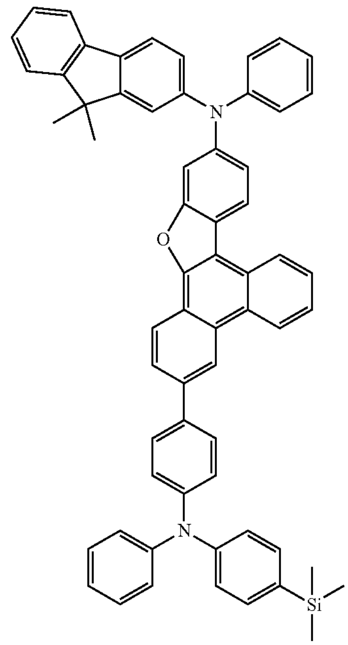
115A
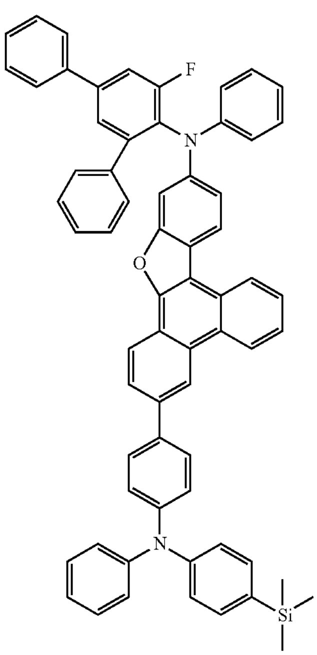
116A
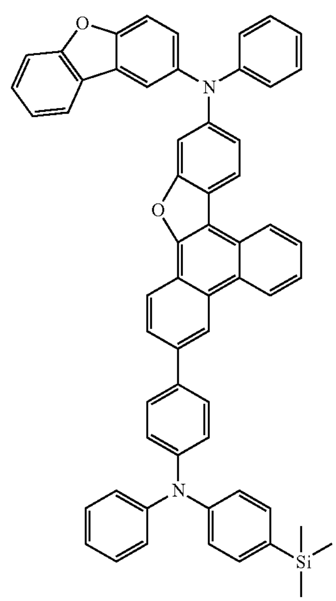

-continued
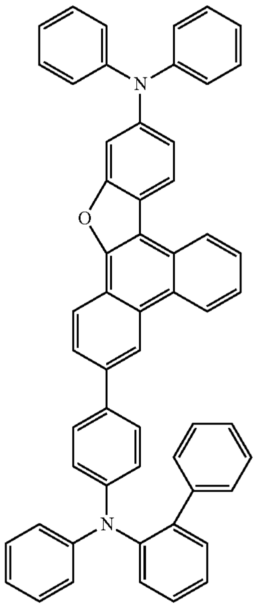
117A
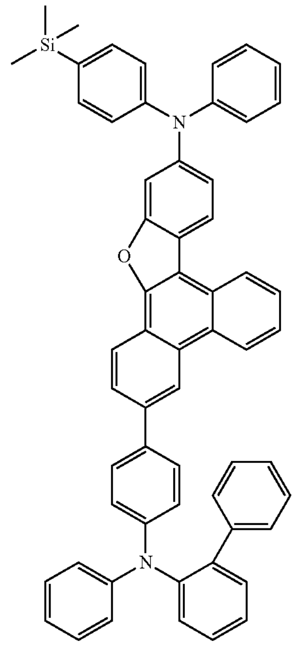
118A
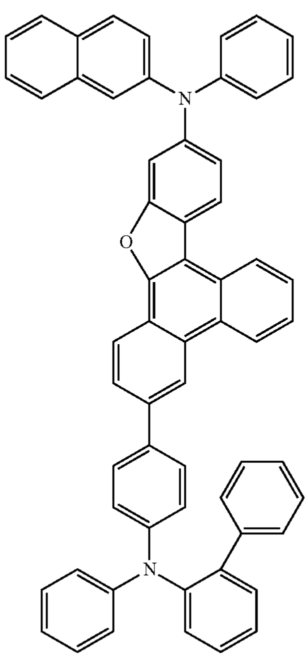
119A
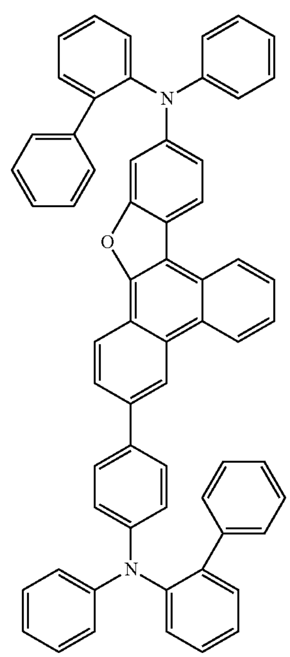
120A -continued
121A
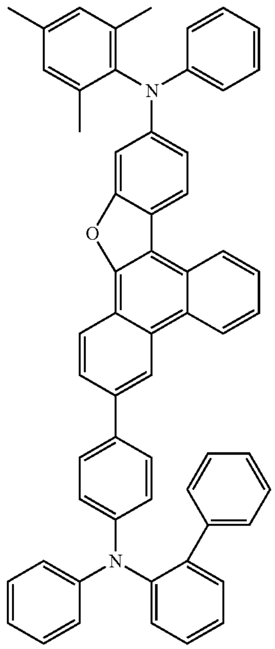
122A
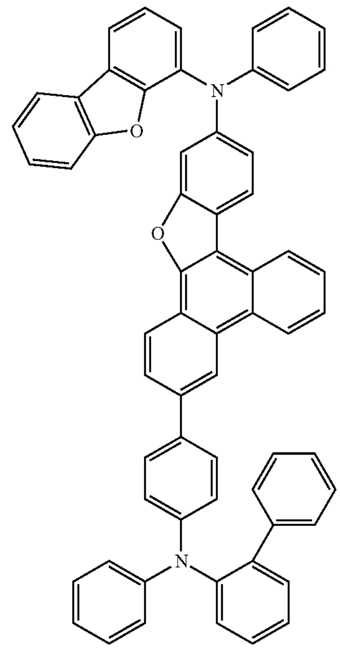
123A
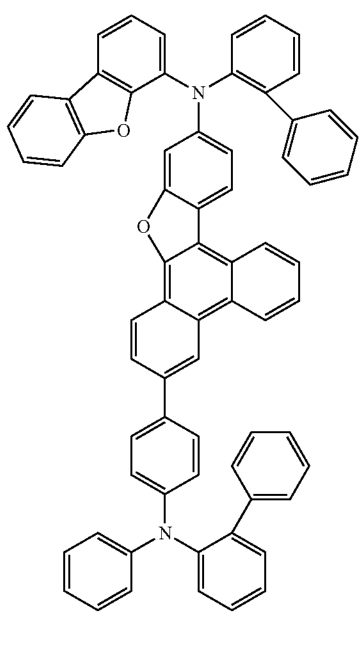
124A
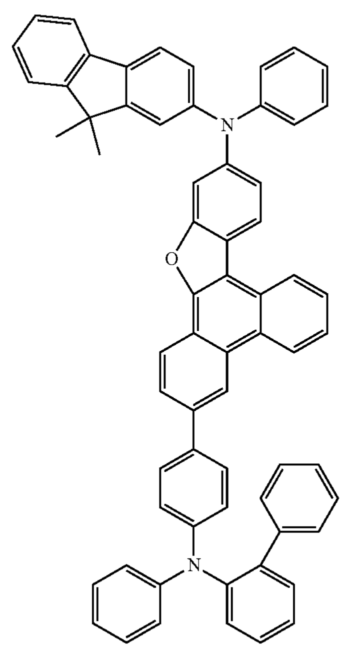

-continued
125A
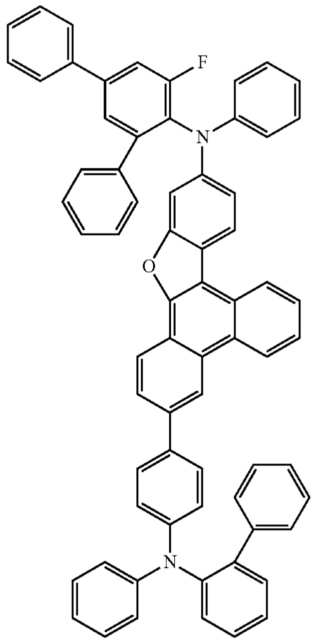
126A
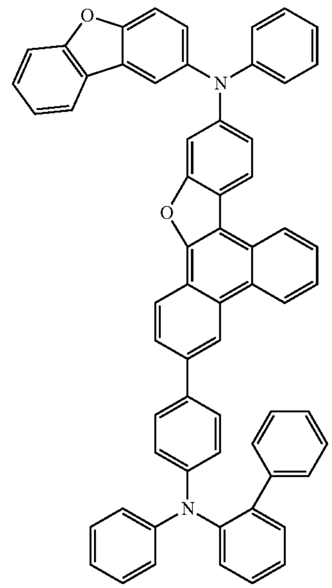
127A
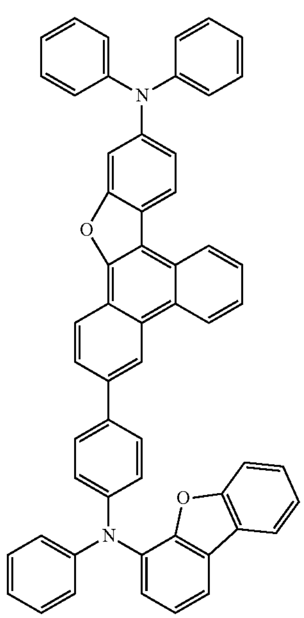
128A
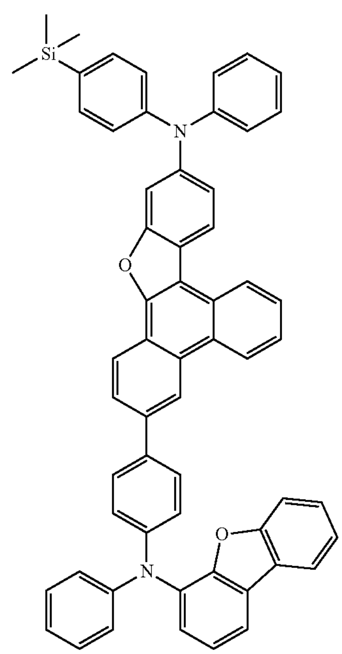

-continued
129A
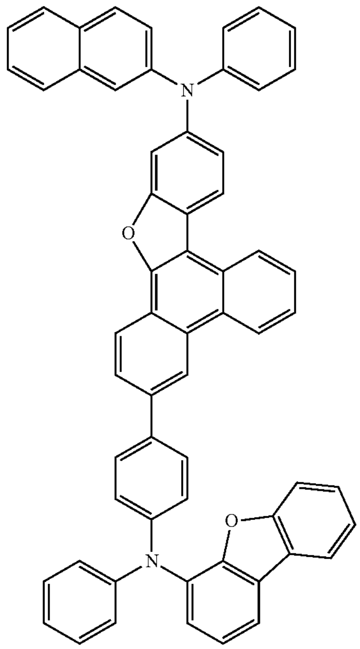
130A
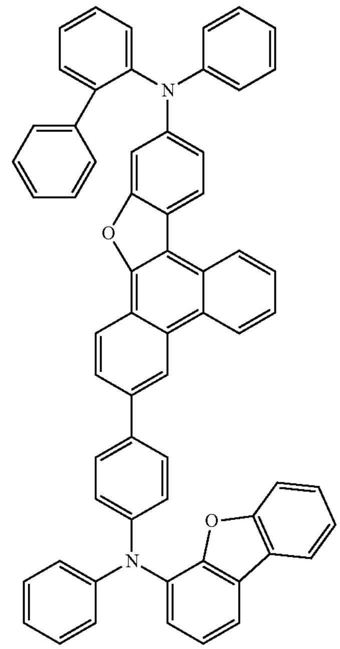
131A
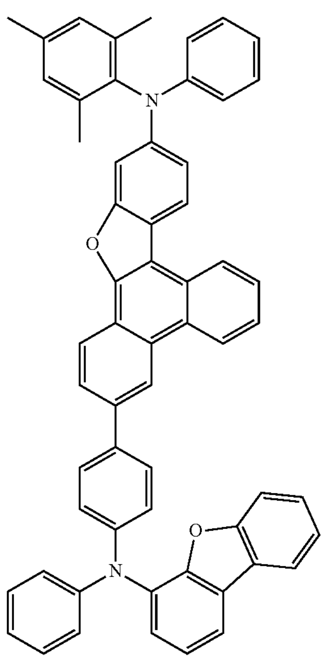
132A
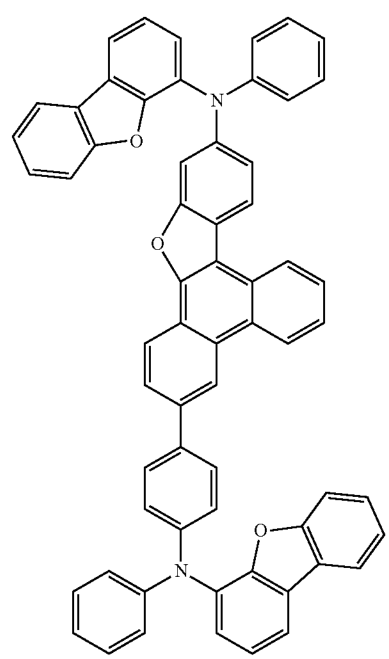

-continued
133A
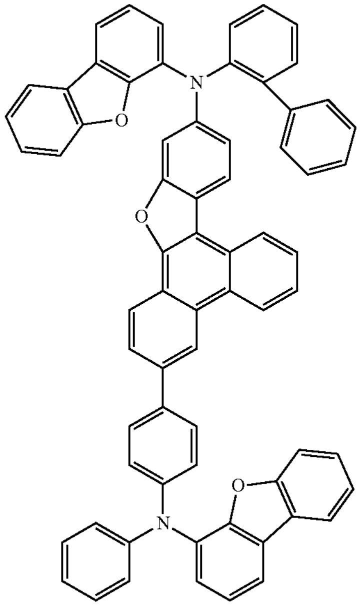
134A
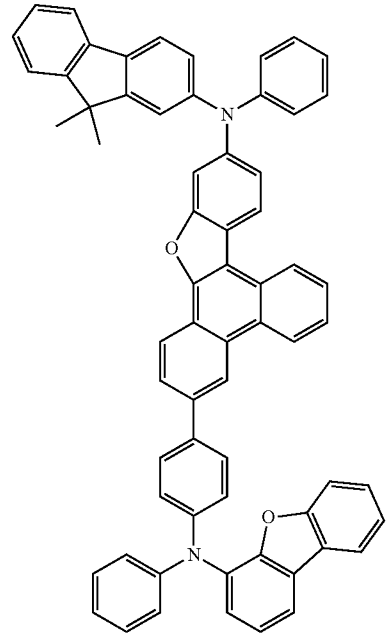
135A
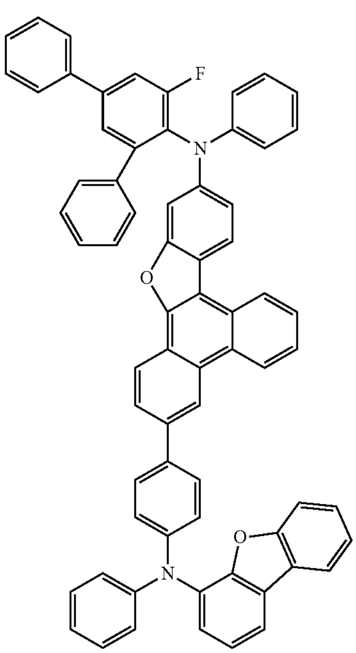
136A
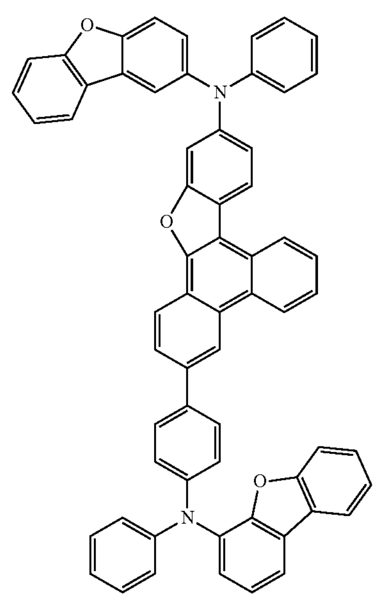

-continued
137A
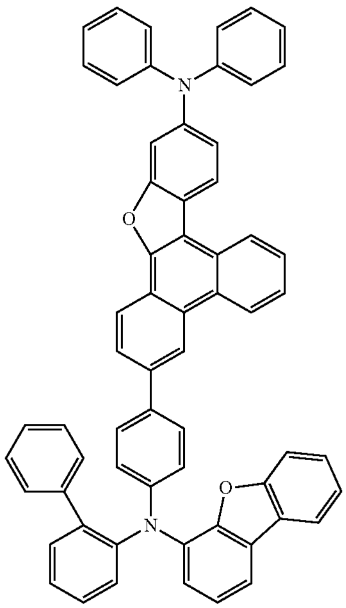
138A
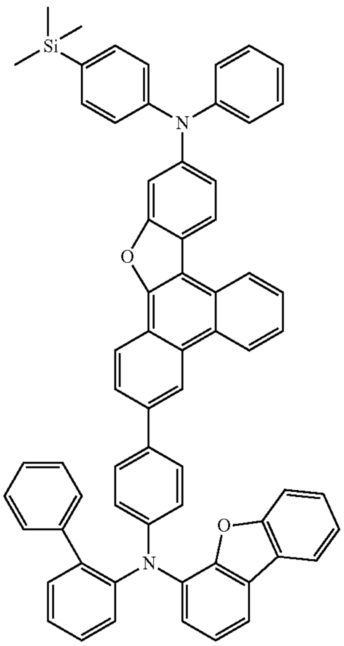
139A
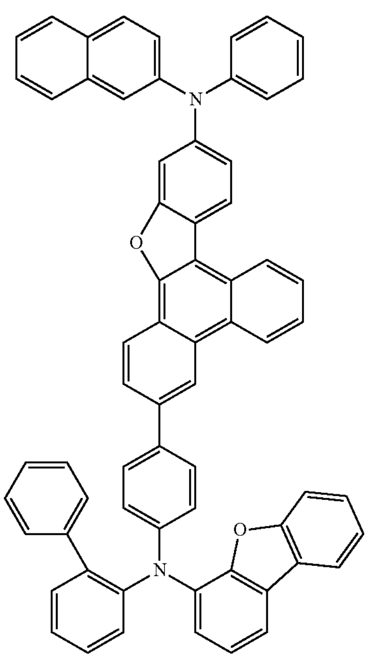
140A
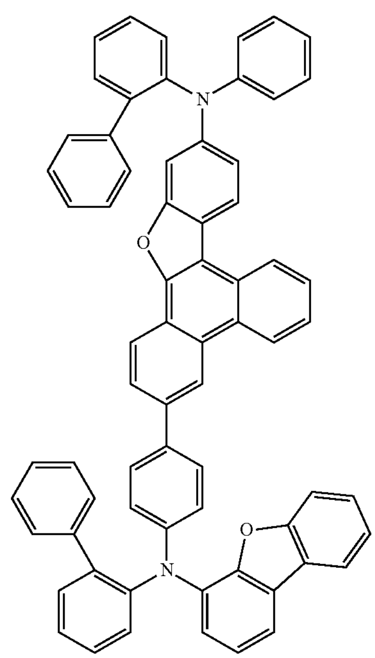

-continued
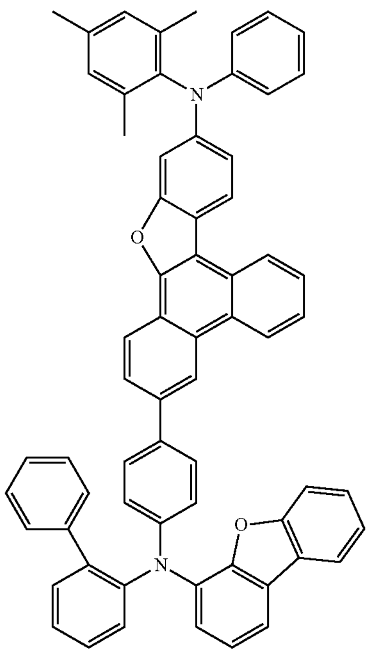
141A
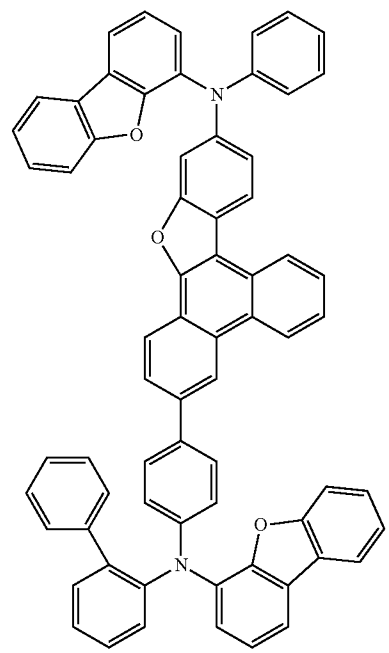
142A
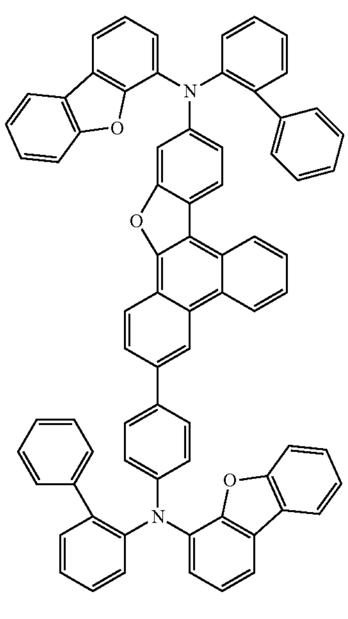
143A
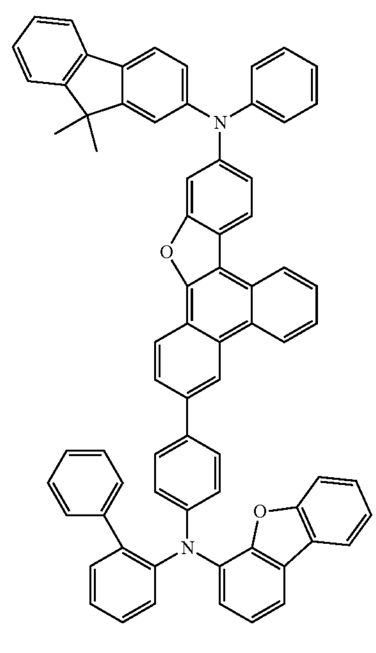
144A -continued
145A
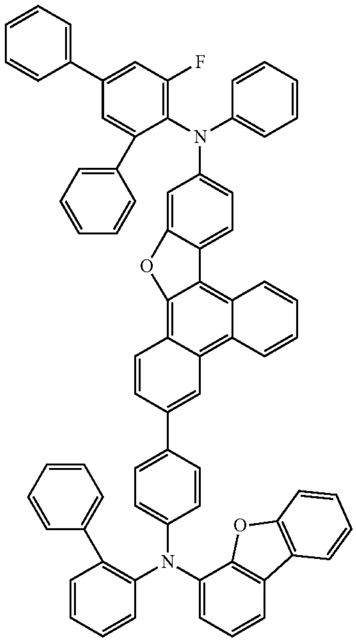
146A
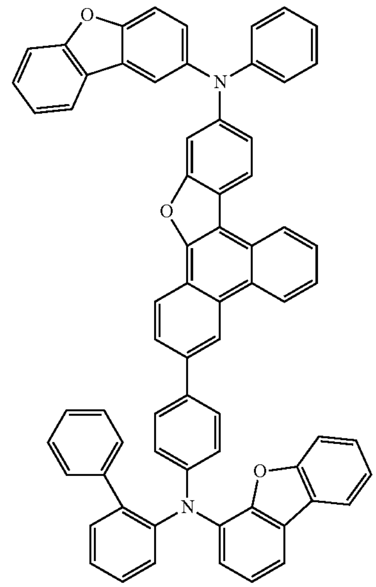
147A
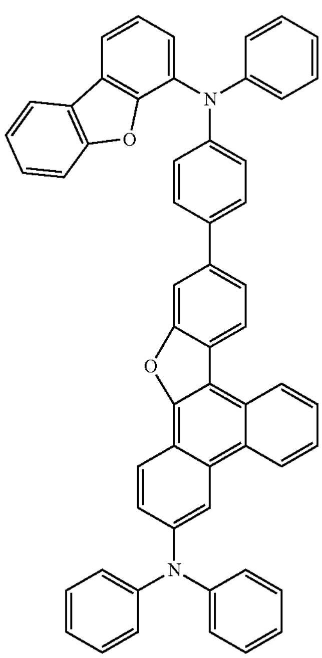
148A
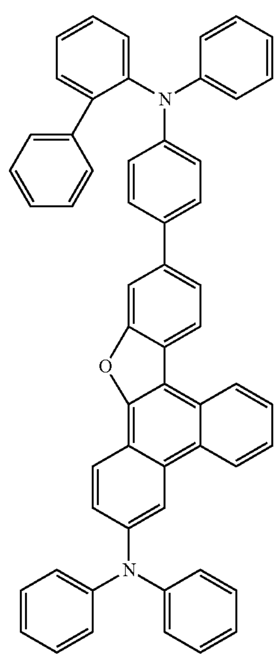

-continued
149A
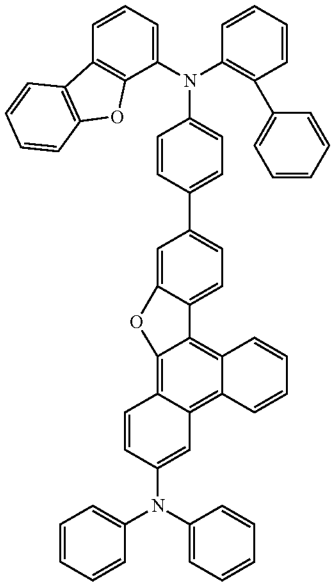
150A
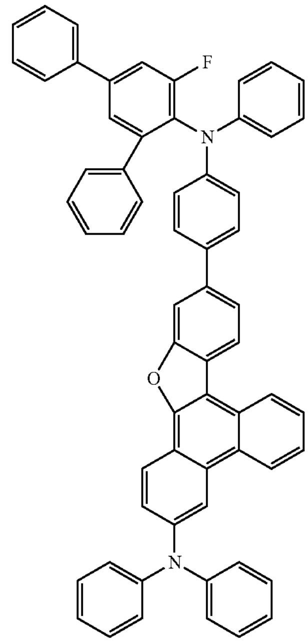
151A
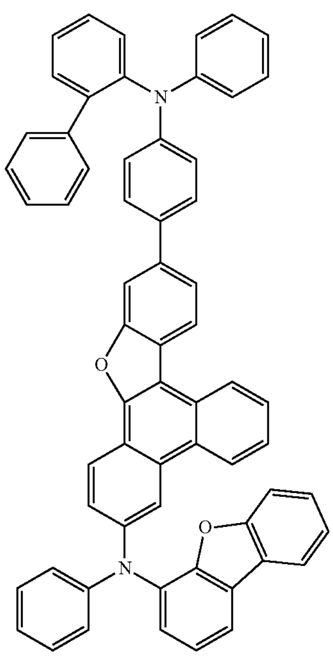
152A
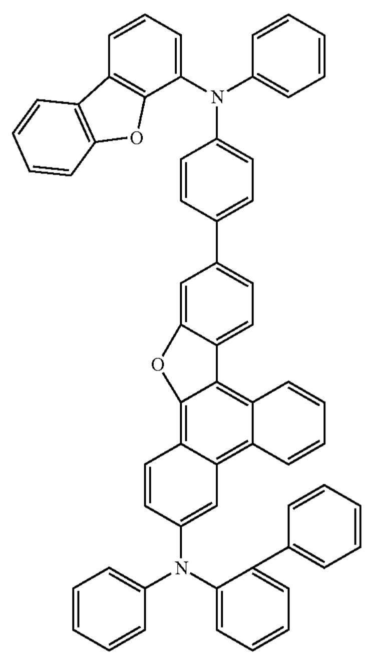

-continued
153A
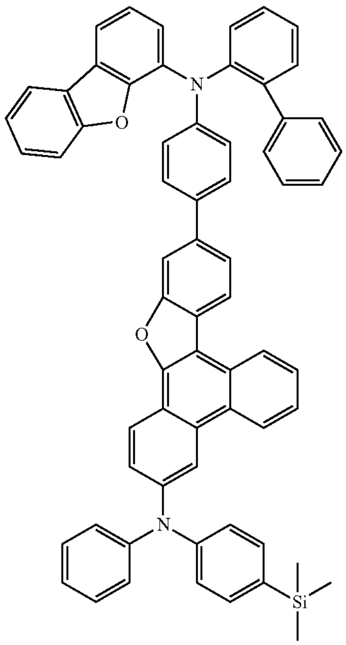
154A
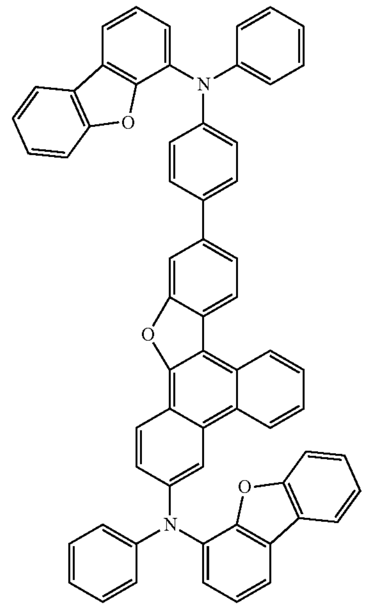
155A
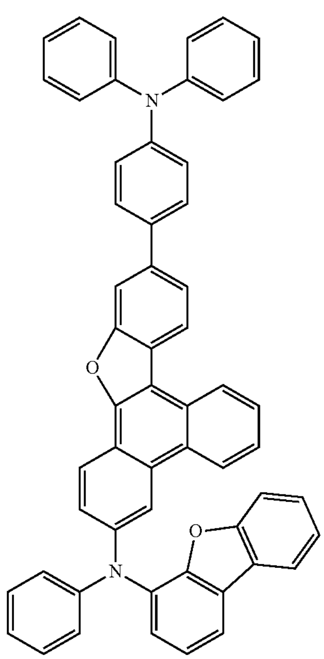
156A
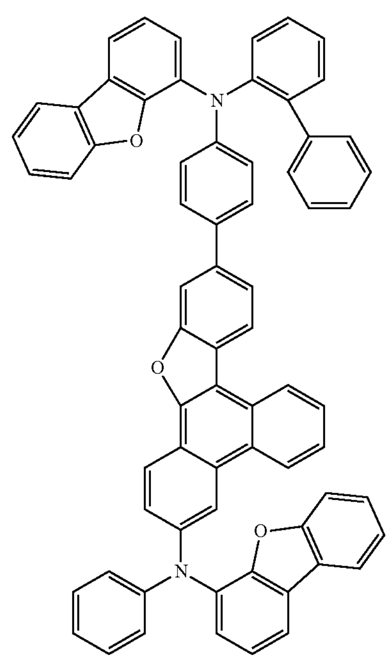

-continued
157A
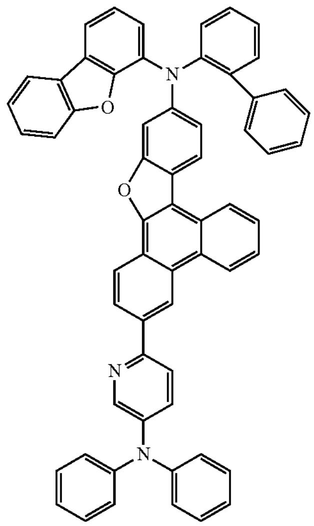
158A
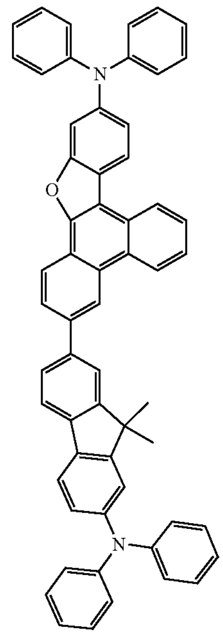
159A
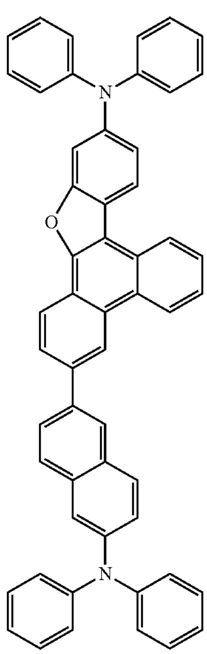
160A
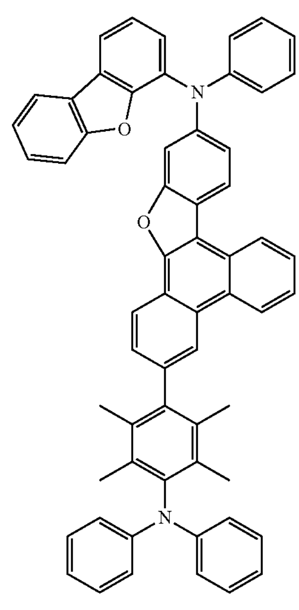

-continued
161A
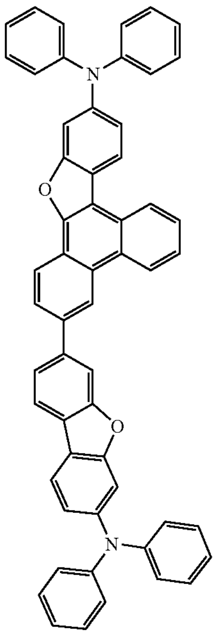
162A
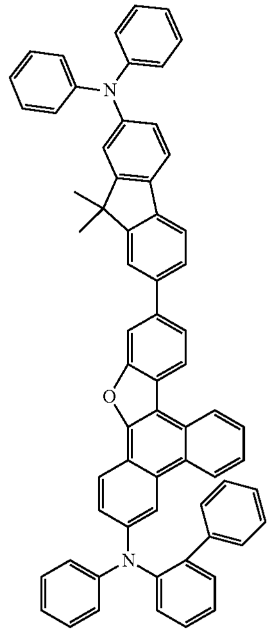
163A
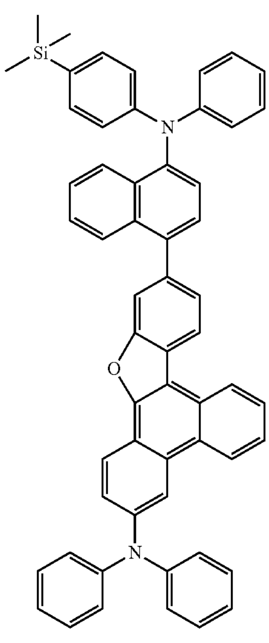
164A
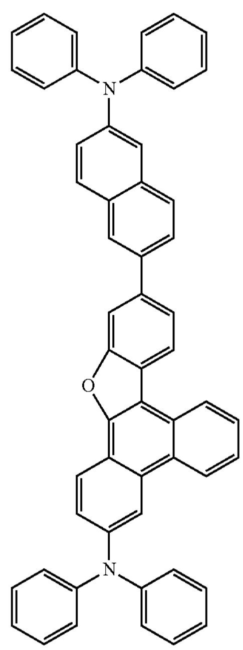

-continued
165A
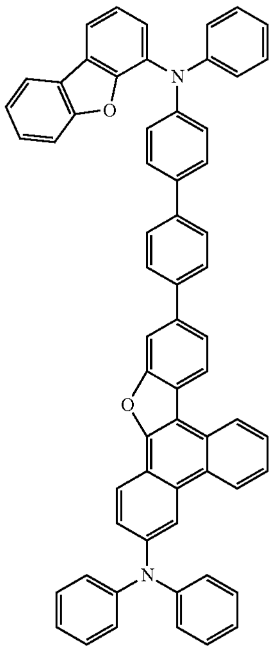
166A
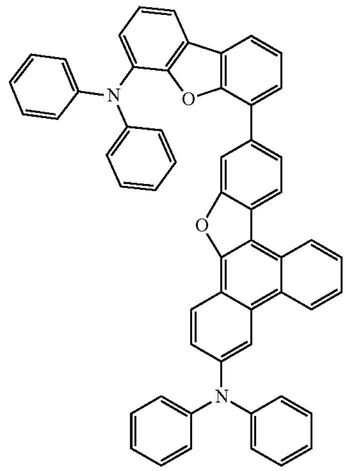
167A
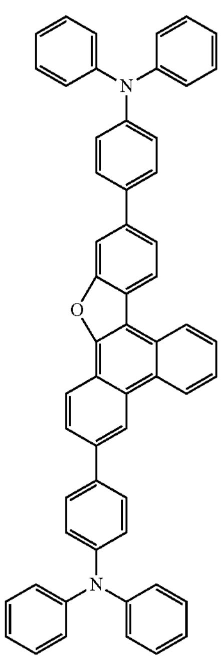
168A
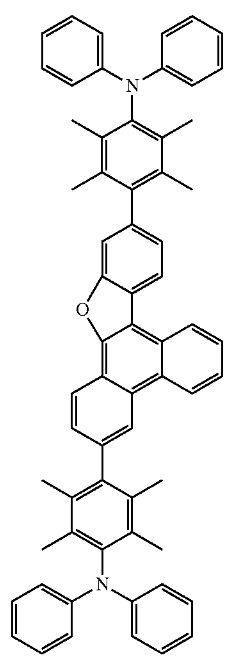

-continued
169A
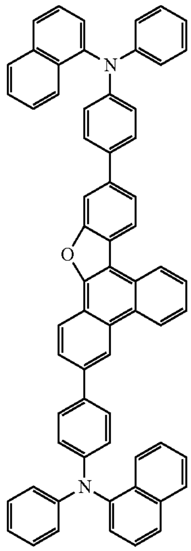
170A
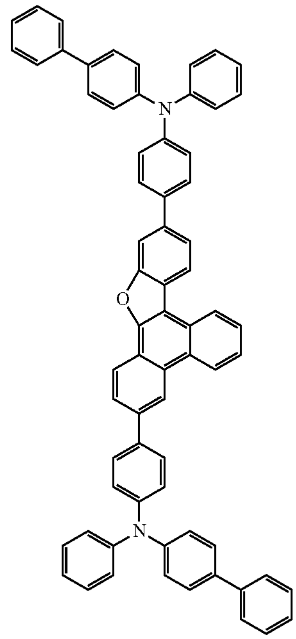
171A
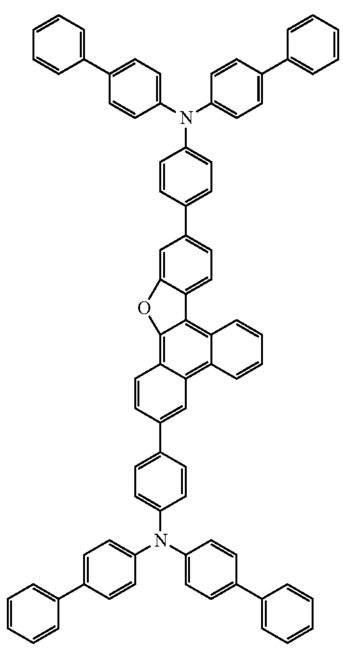
172A
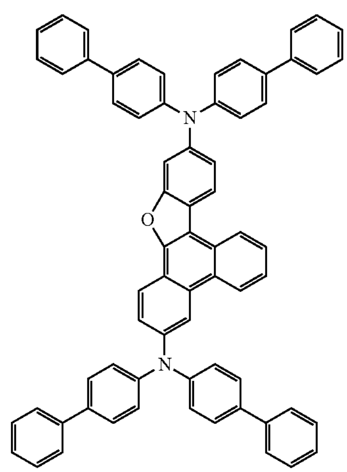

-continued
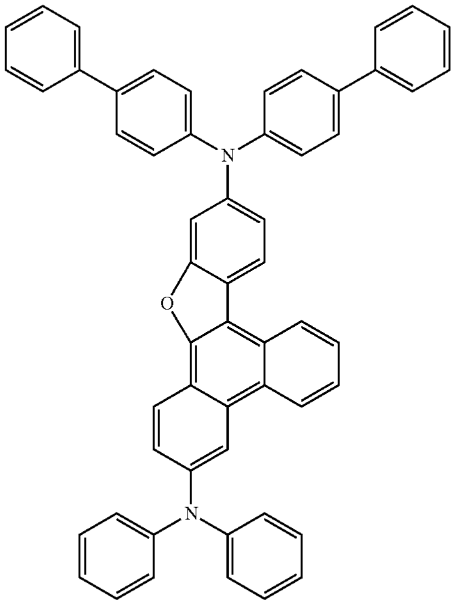
173A
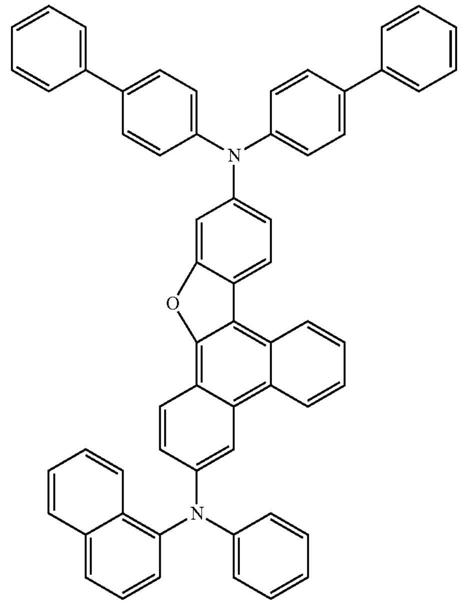
174A
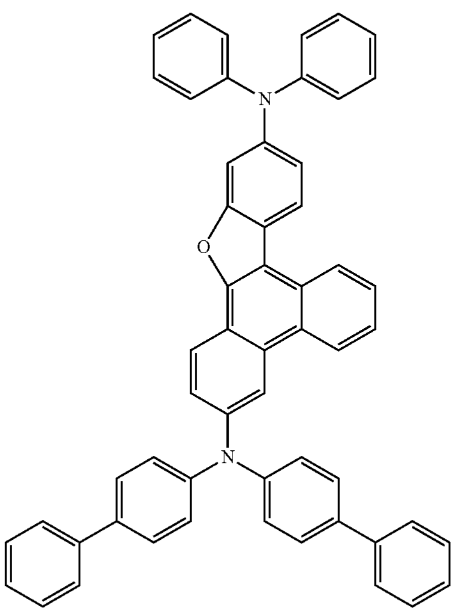
175A
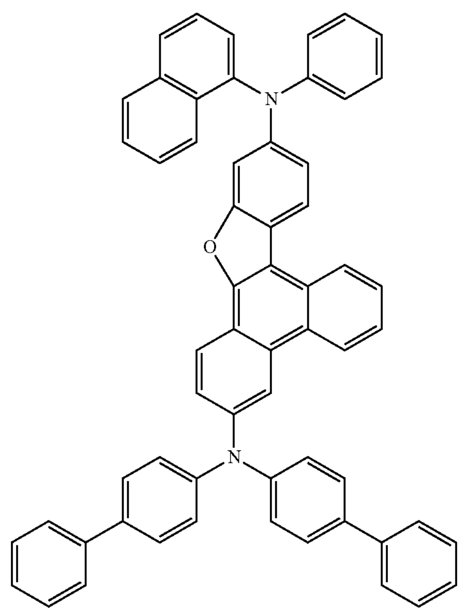
176A -continued
177A
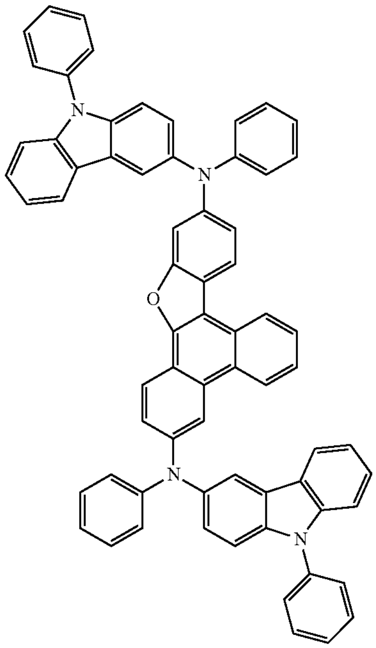
178A
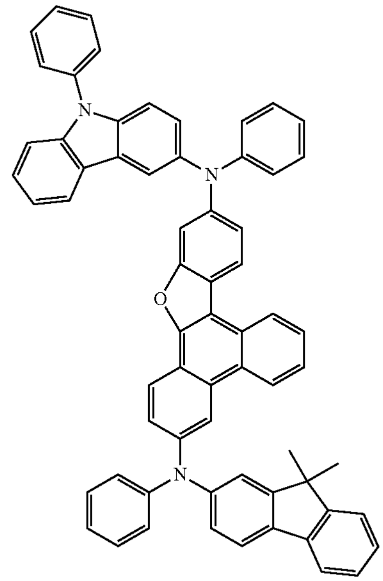
179A
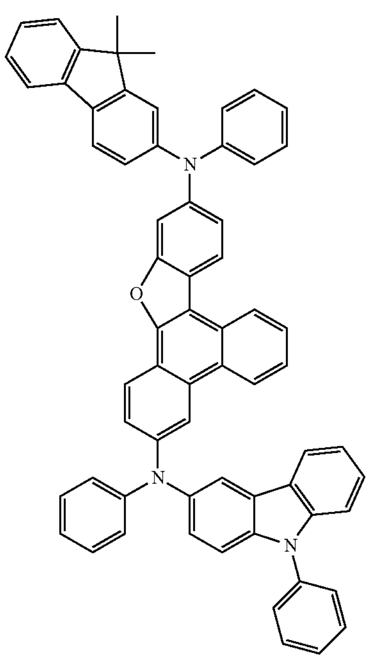
180A
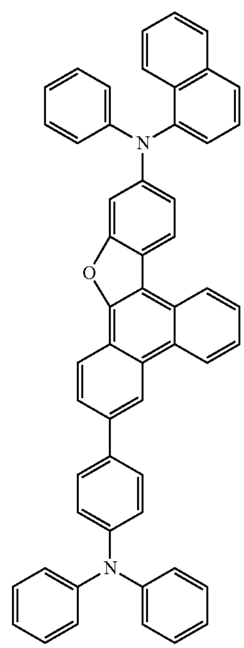

-continued
181A
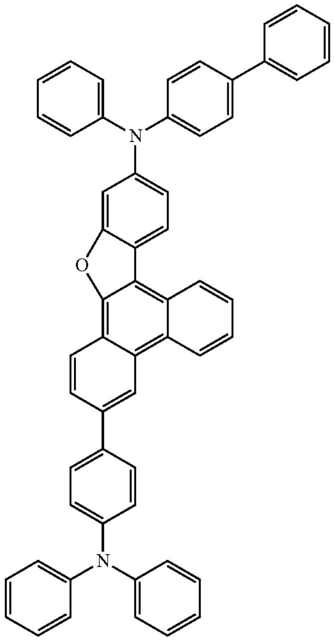
182A
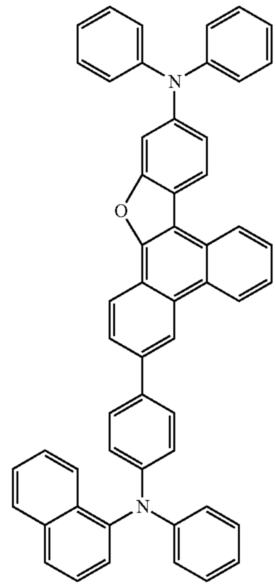
183A
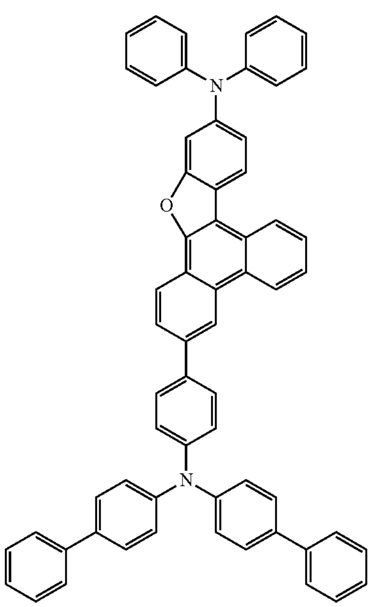
184A
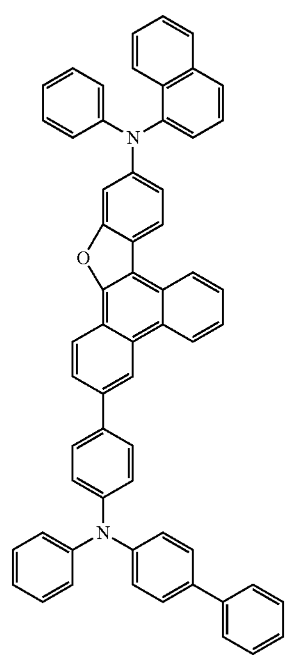

-continued
185A
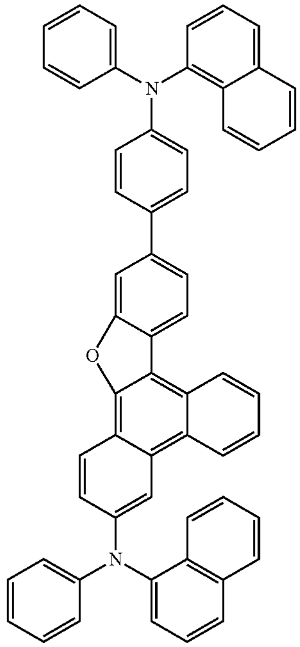
186A
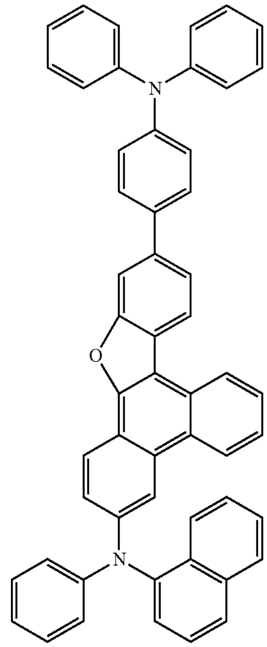
187A
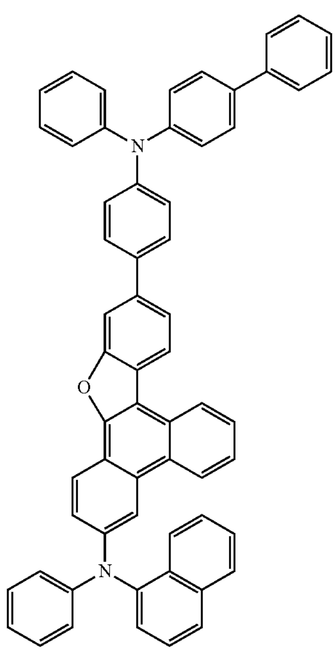
188A
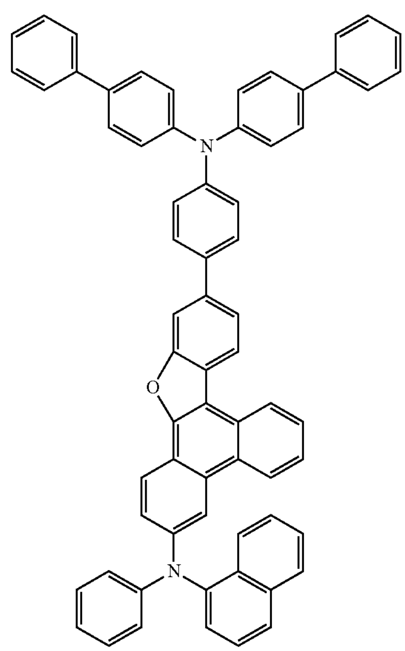

-continued
189A
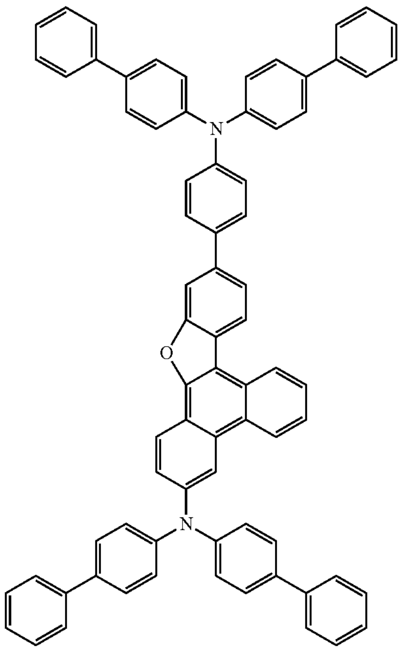
190A
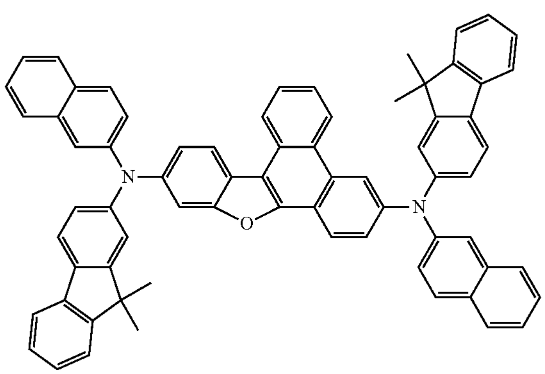
191A
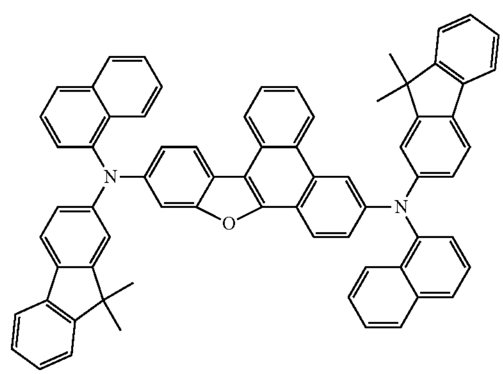
192A
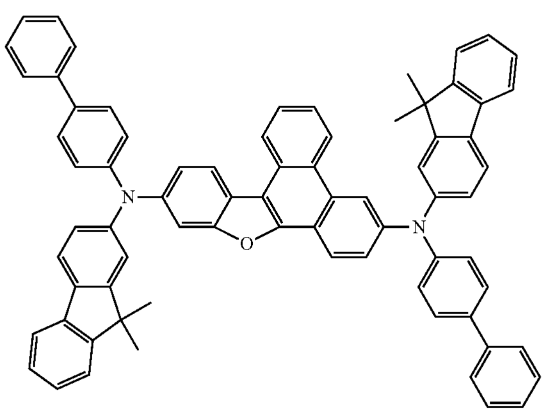
193A
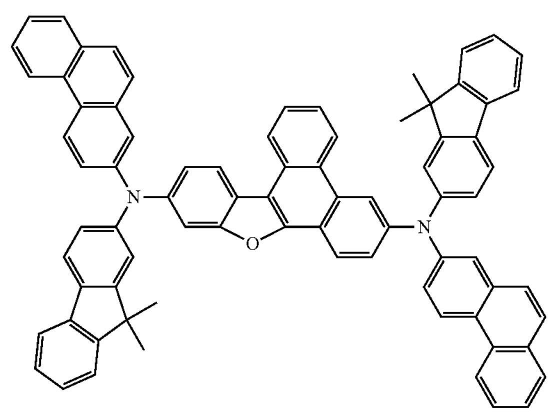

-continued
194A
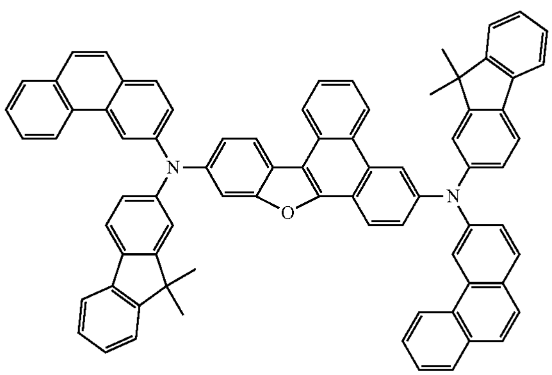
195A
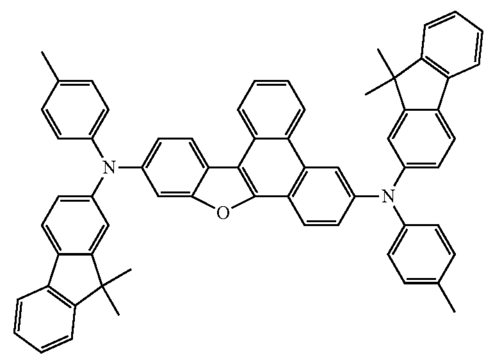
196A
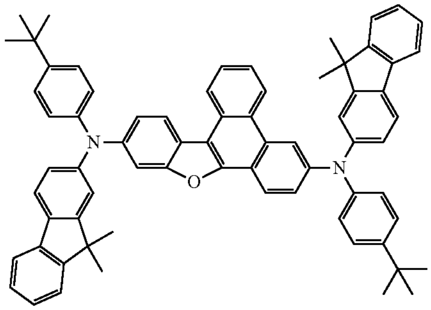
197A
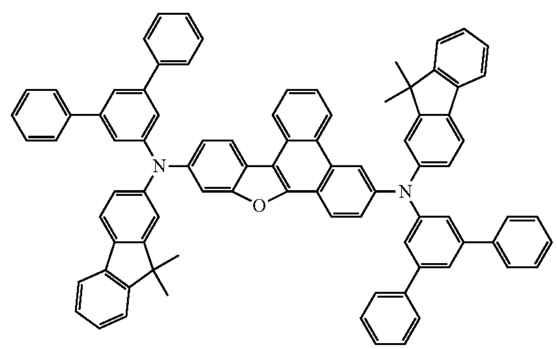
198A
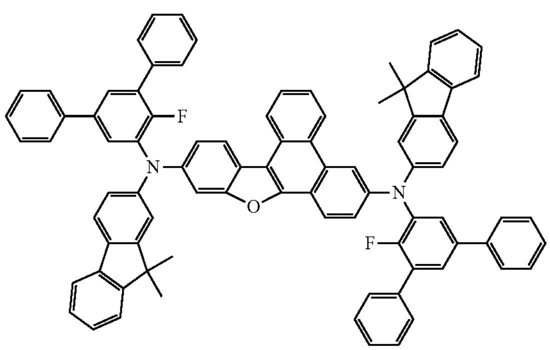
199A
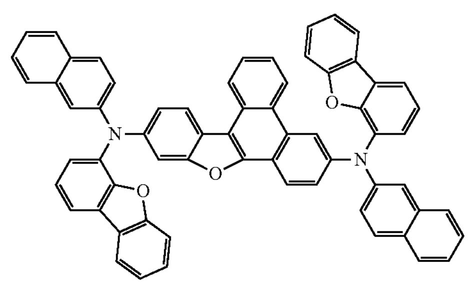
200A
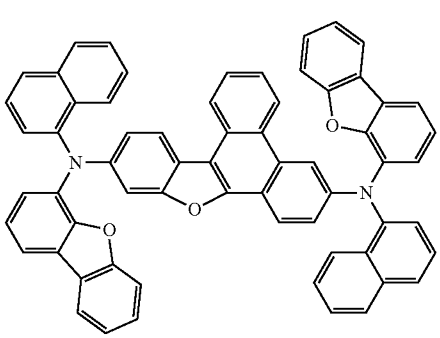
201A
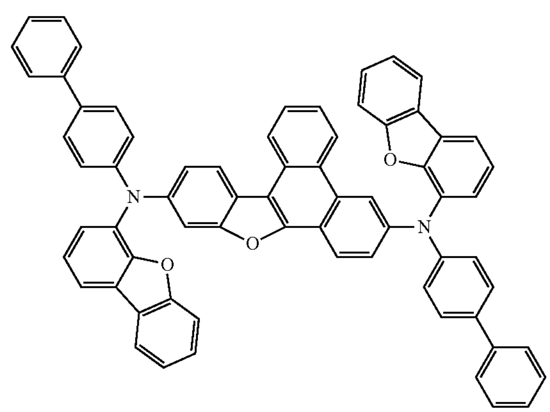

-continued
202A
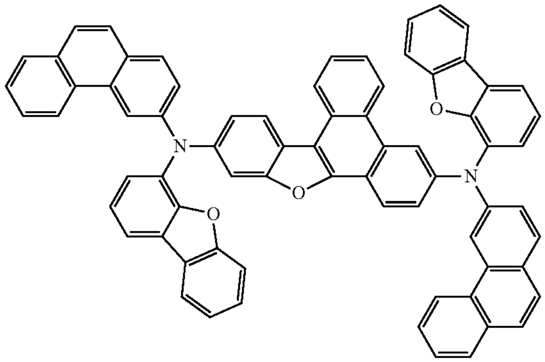
203A
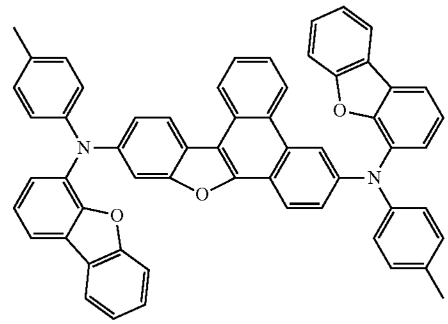
204A
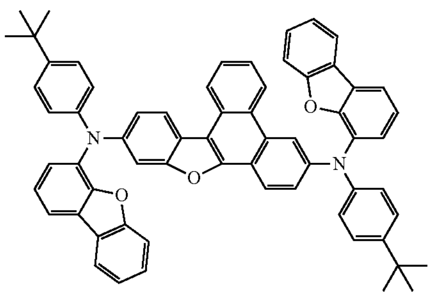
205A
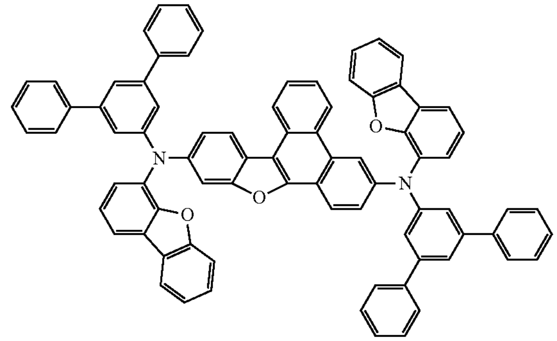
206A
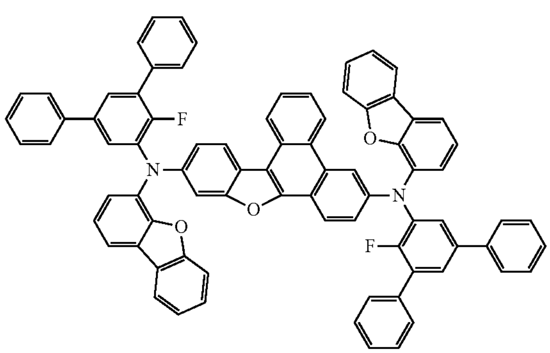
207A
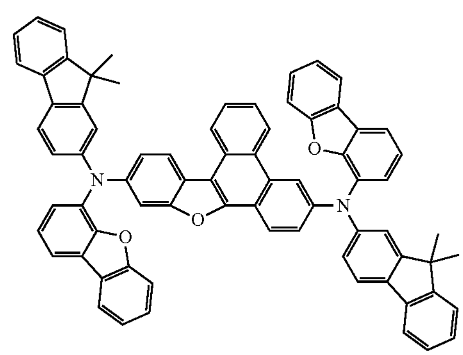
208A
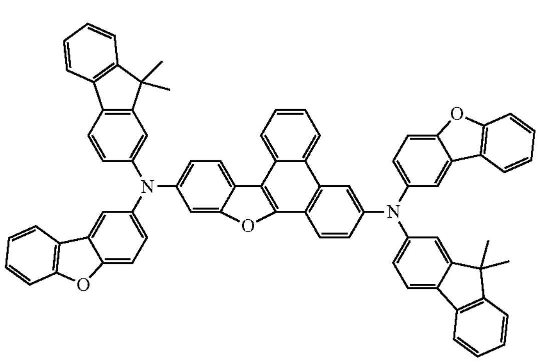
209A
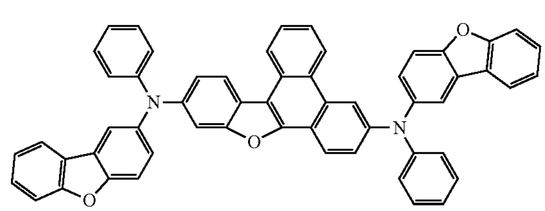

-continued
210A
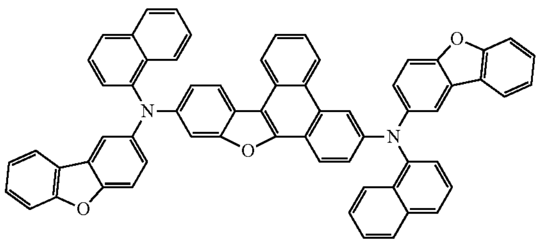
211A
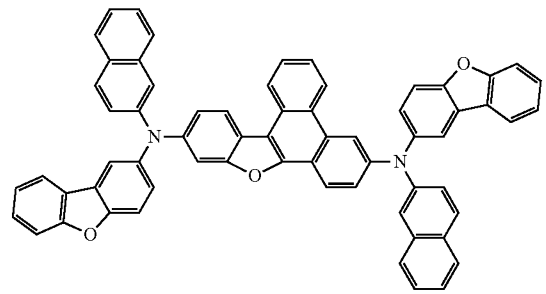
212A
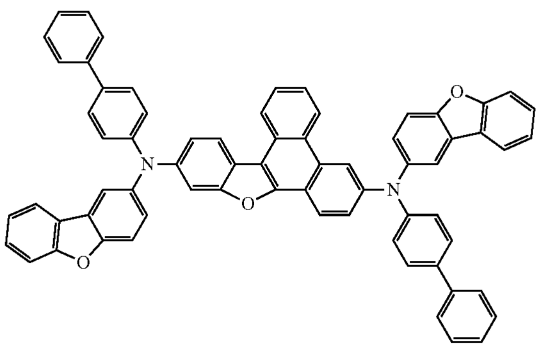
213A
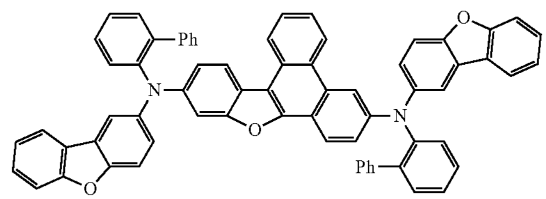
214A
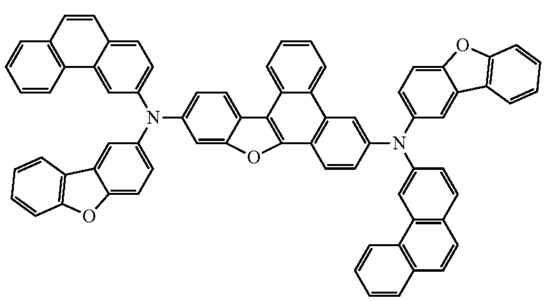
215A
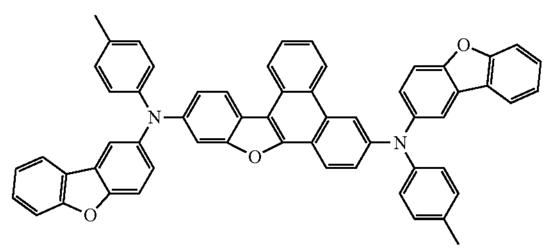
216A
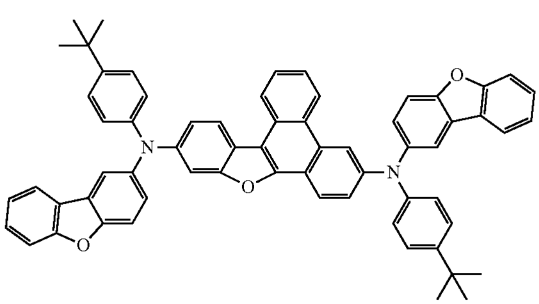
217A
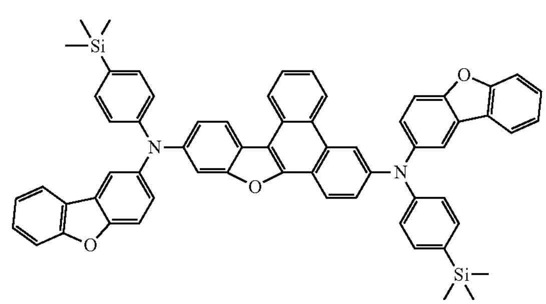

-continued
218A
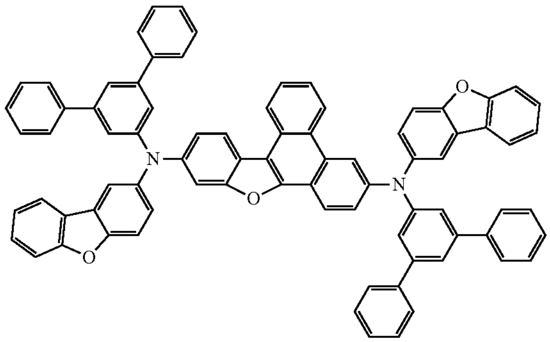
219A
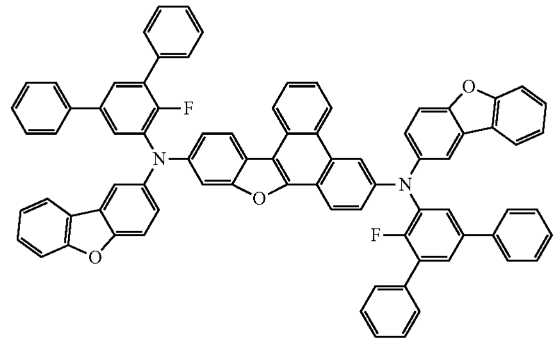
220A
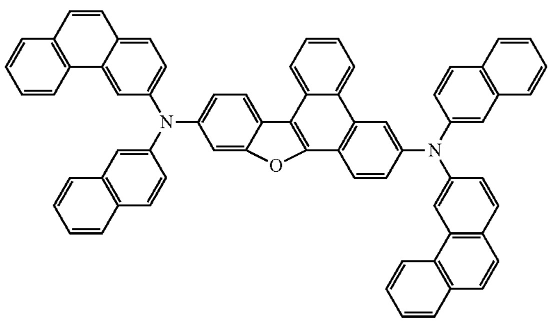
221A
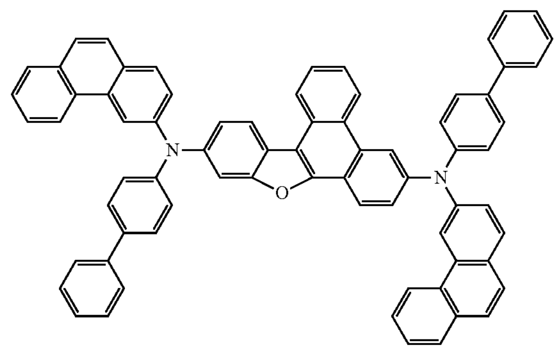
222A
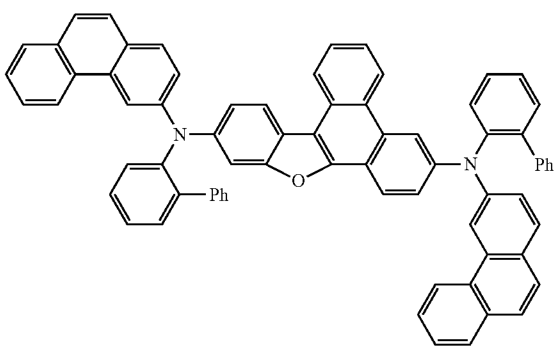
223A
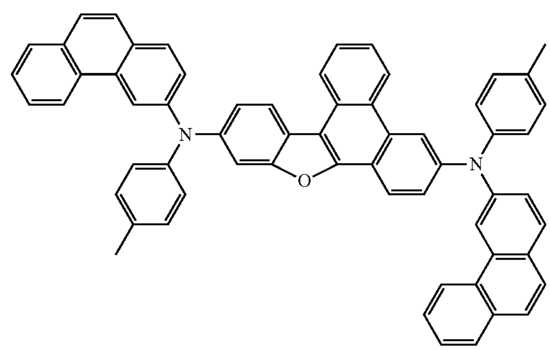
224A
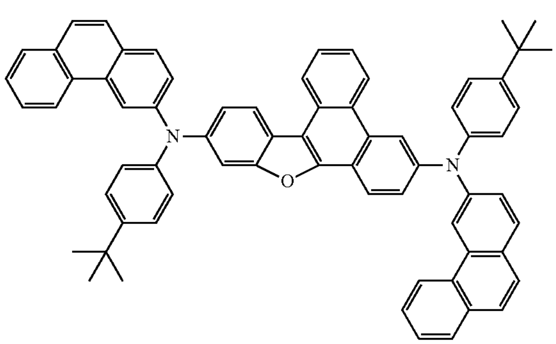
225A
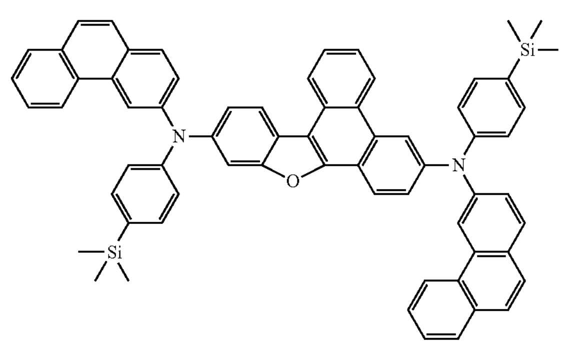

-continued
226A
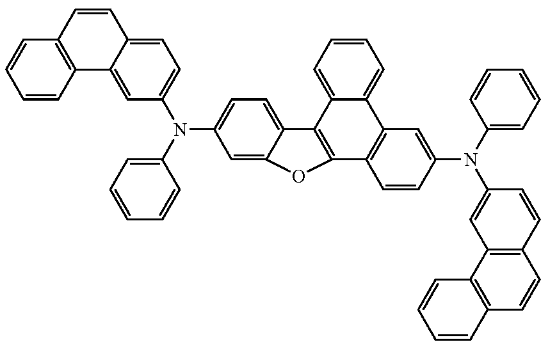
227A
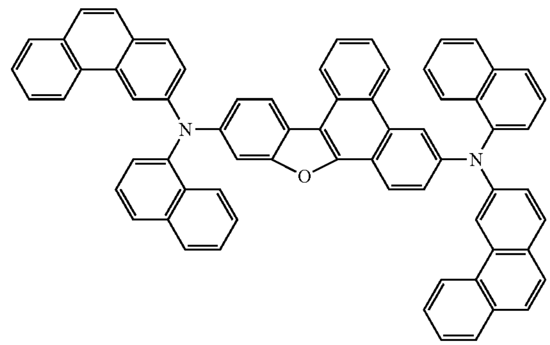
228A
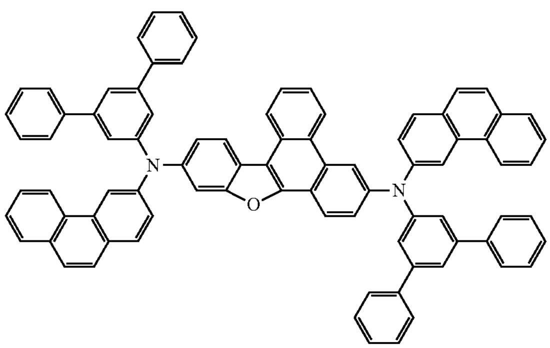
229A
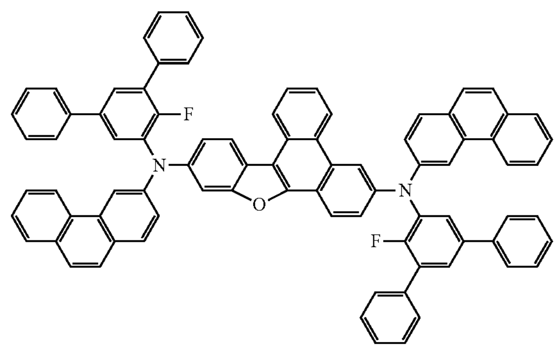
230A
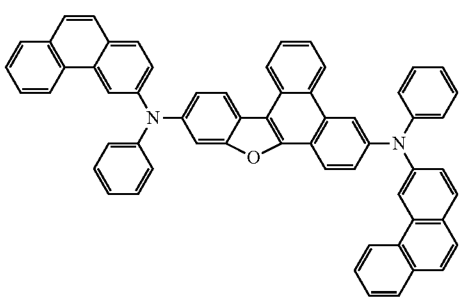
231A
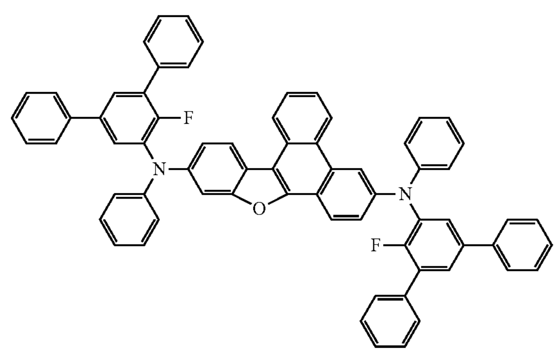
232A
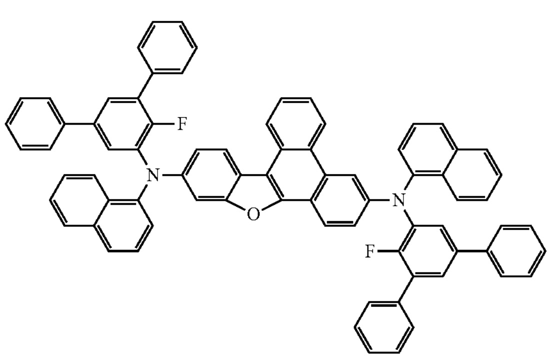
233A
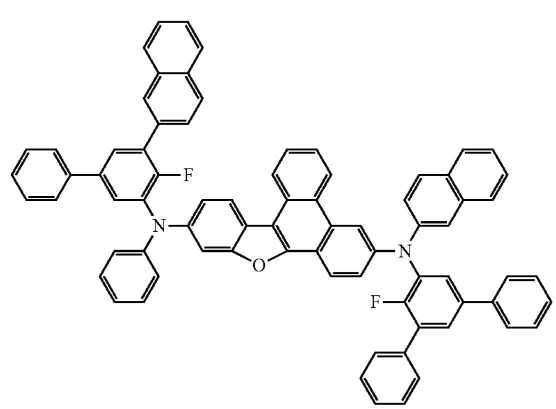

-continued
234A
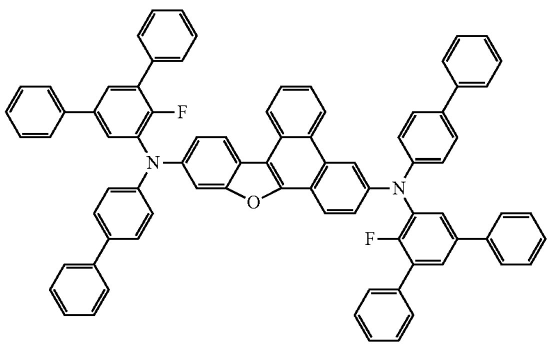
235A
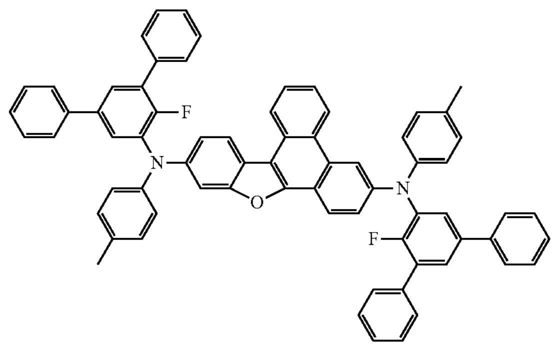
236A
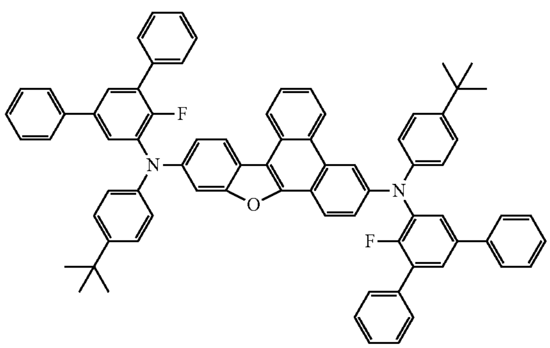
237A
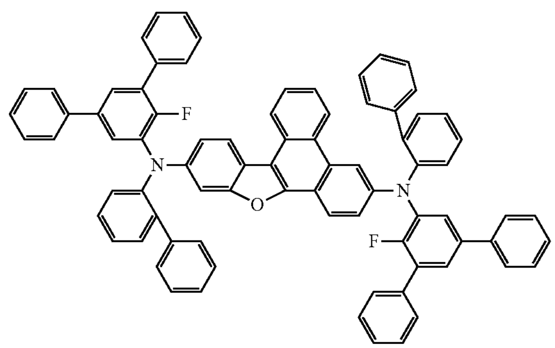
238A
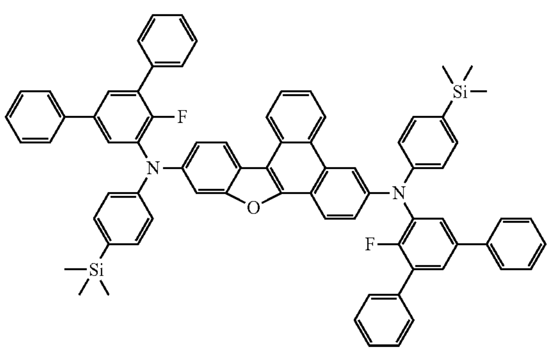
239A
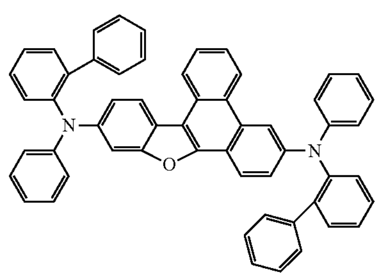
240A
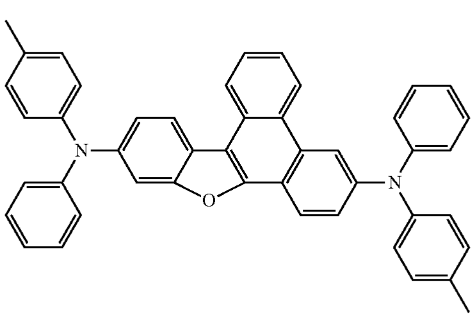
241A
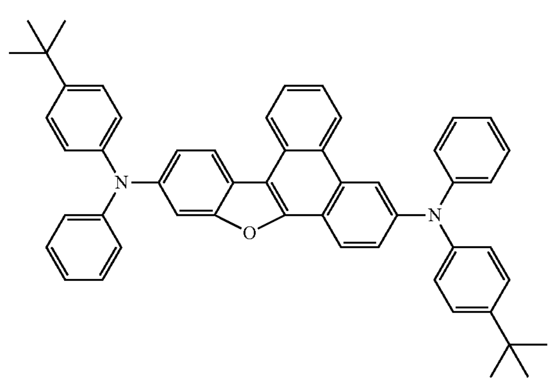

-continued
242A
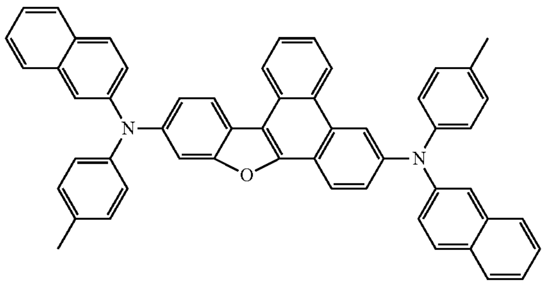
243A
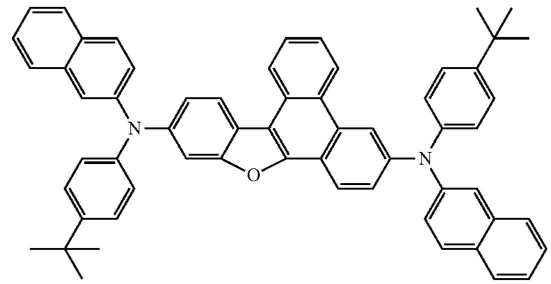
244A
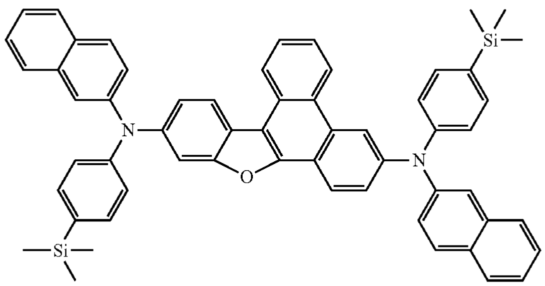
245A
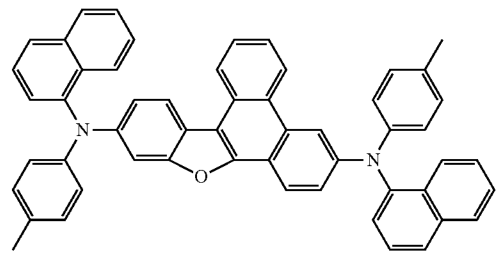
246A
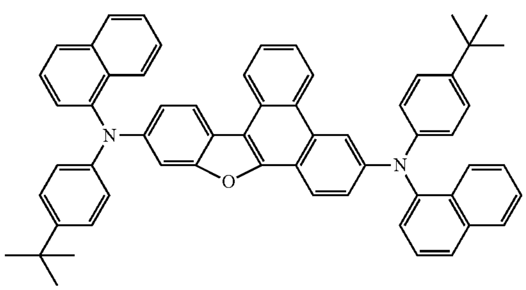
247A
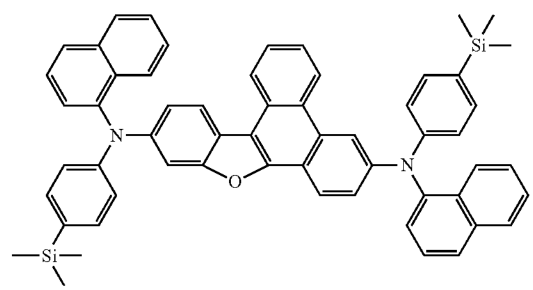
248A
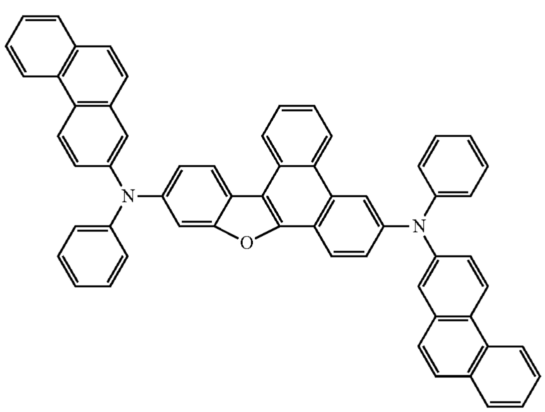
249A
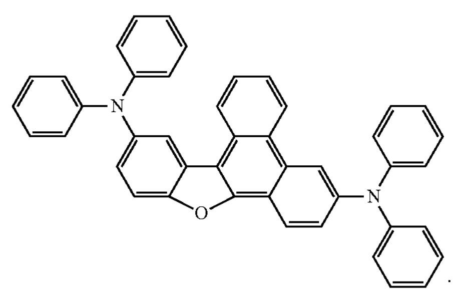

17. The organic light-emitting device of claim 1, wherein the first compound, the second compound, and the third compound are each independently selected from Compounds H-1 to H-65:
H-1
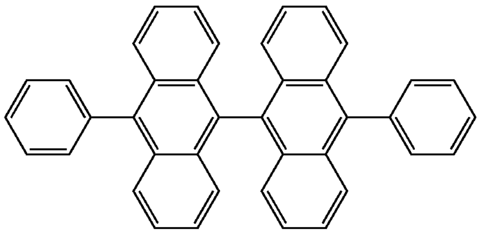
H-2
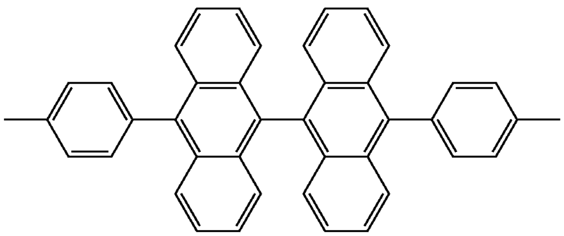
H-3
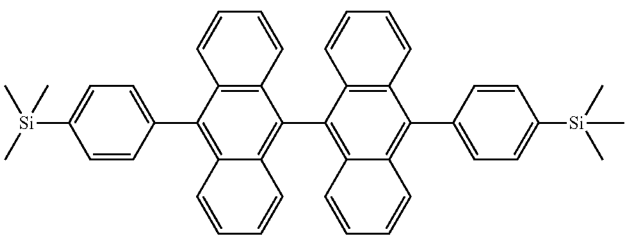
H-4
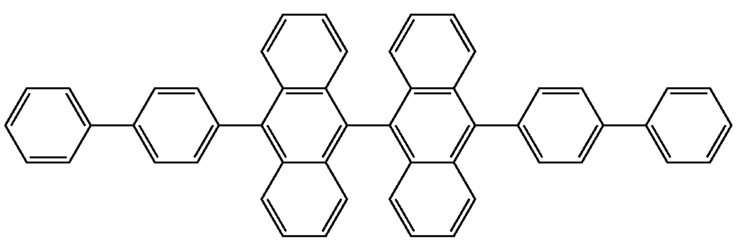
H-5
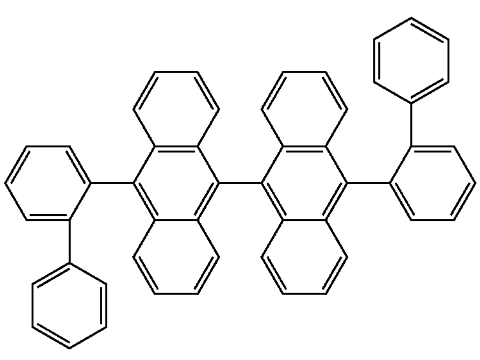

-continued
H-6
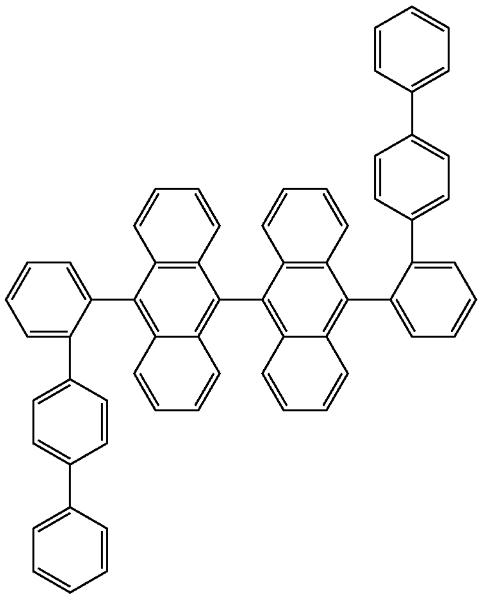
H-7
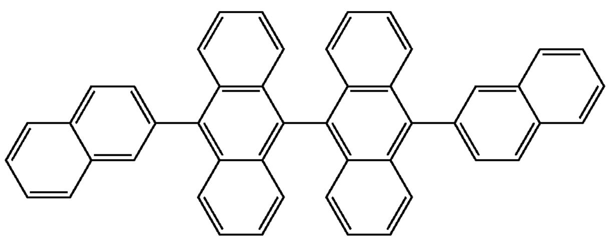
H-8
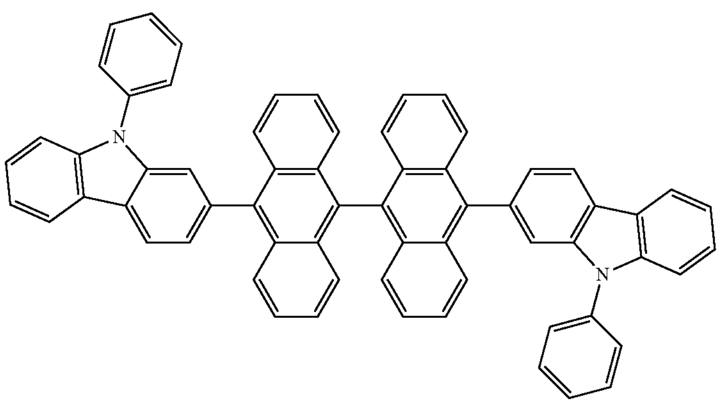
H-9
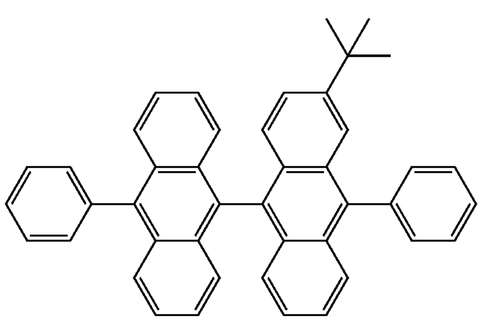

-continued
H-10
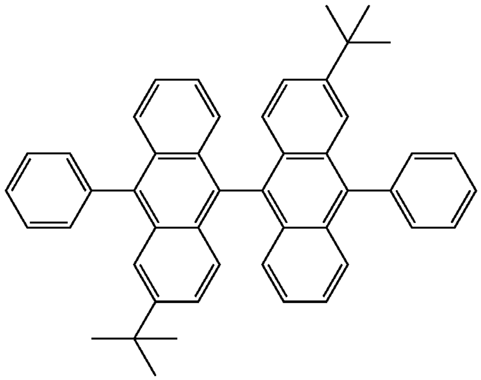
H-11
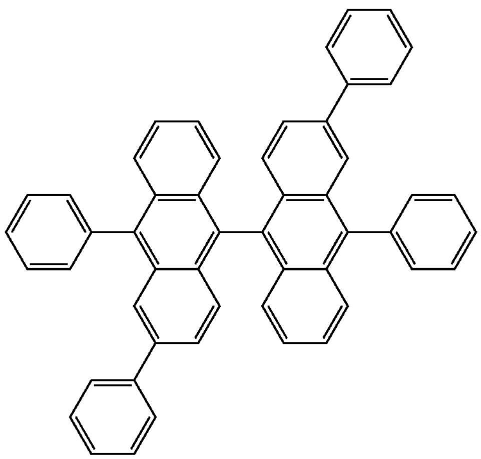
H-12
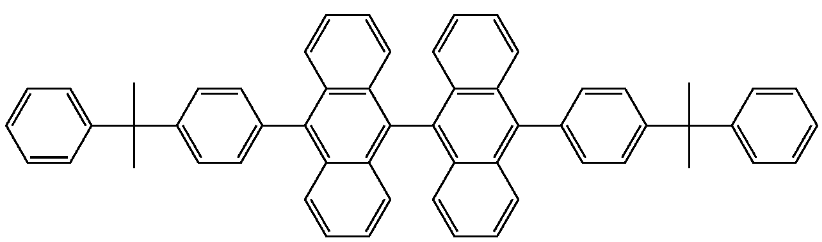
H-13
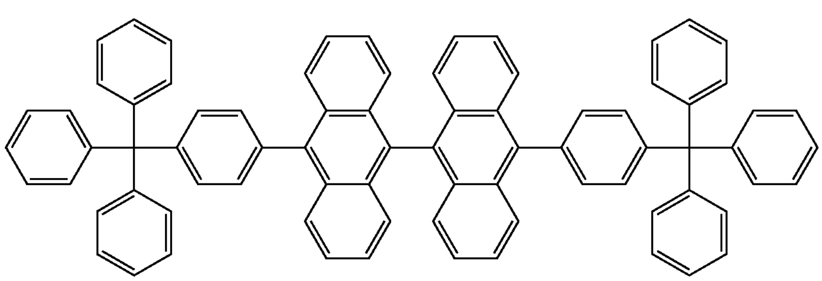

-continued
H-14
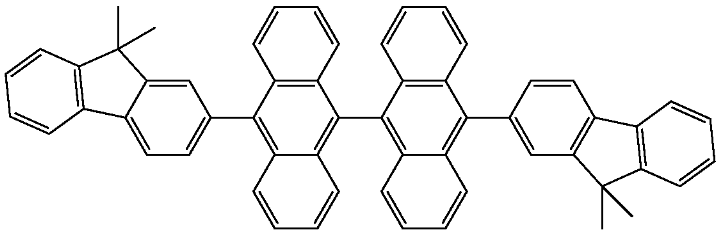
H-15
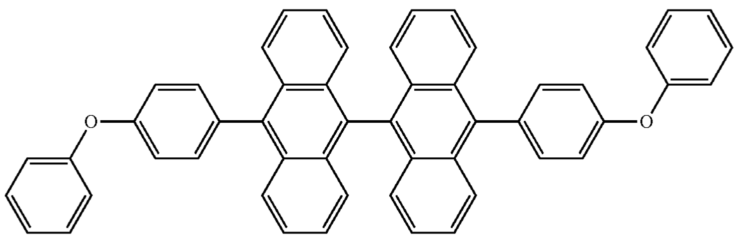
H-16
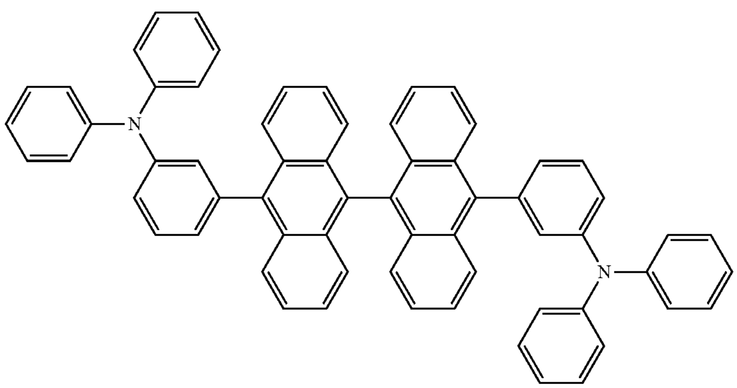
H-17
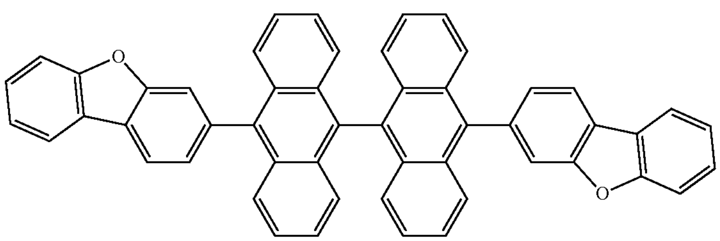
H-18
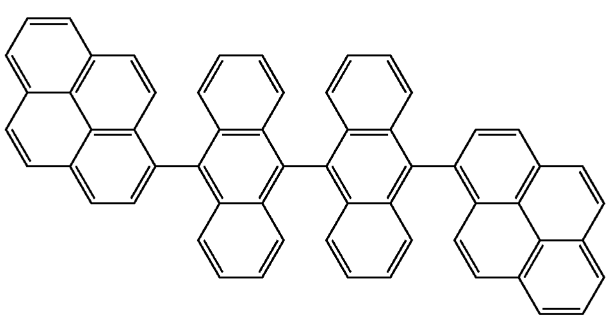

-continued
H-19
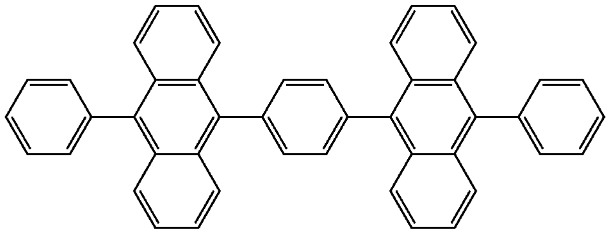
H-20
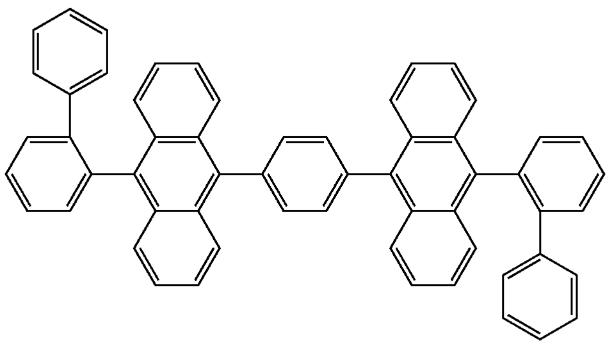
H-21
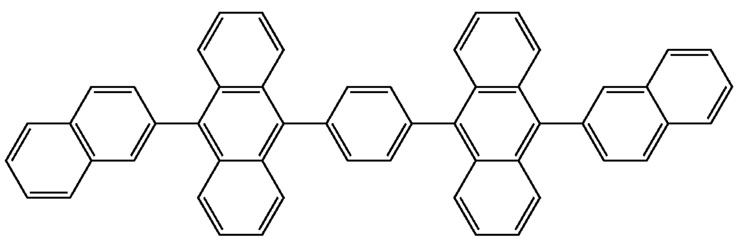
H-22
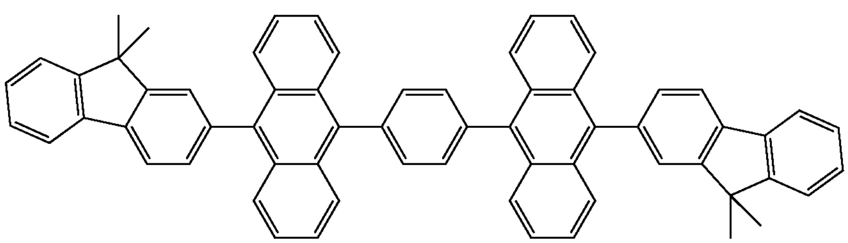
H-23
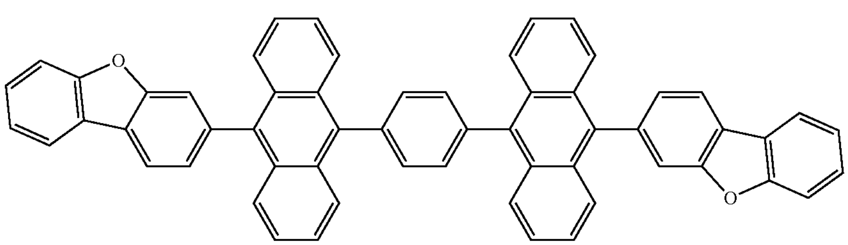

-continued
H-24
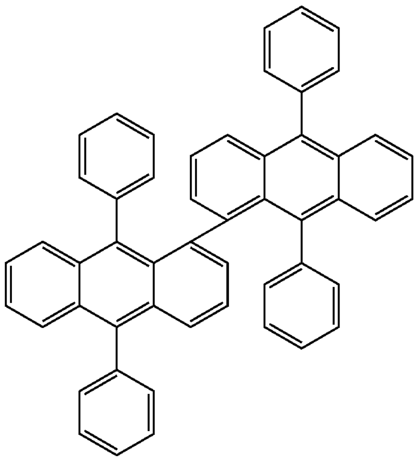
H-25
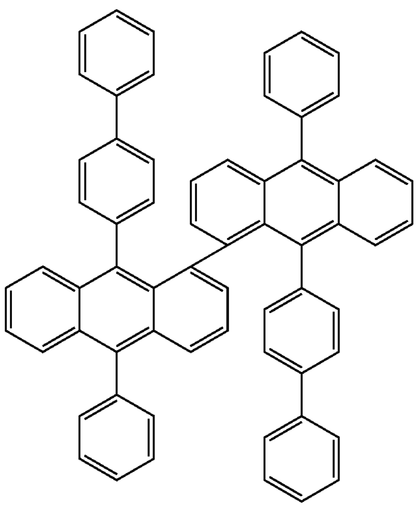
H-26
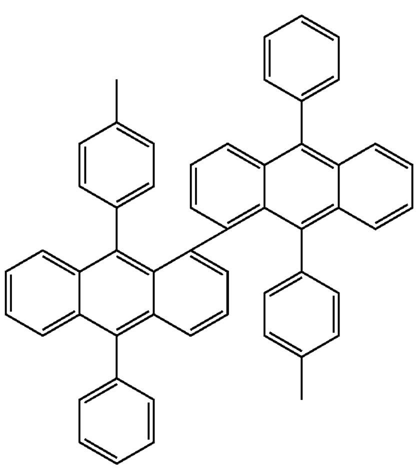

-continued
H-27
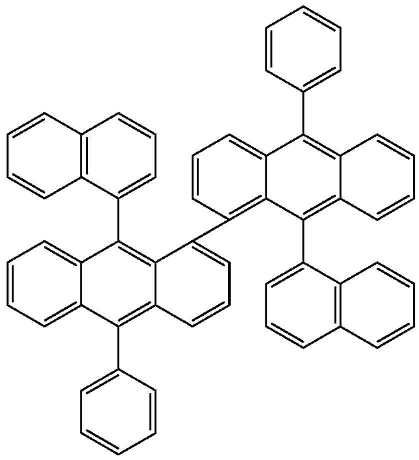
H-28
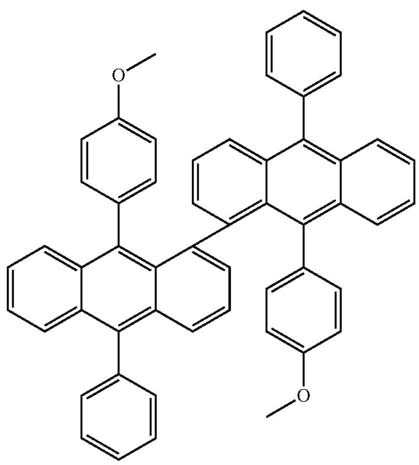
H-29
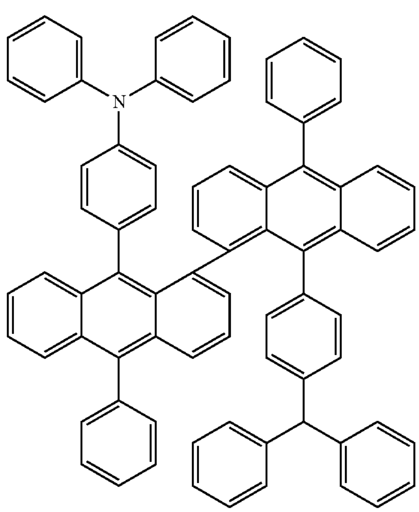

-continued
H-30
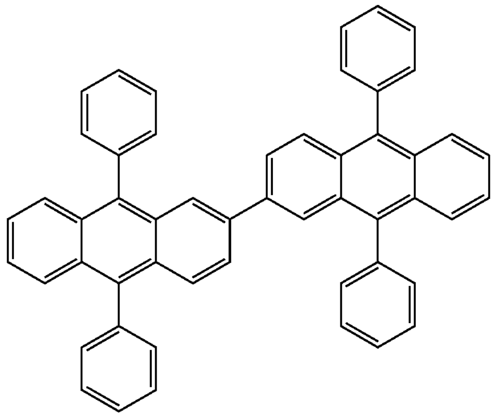
H-31
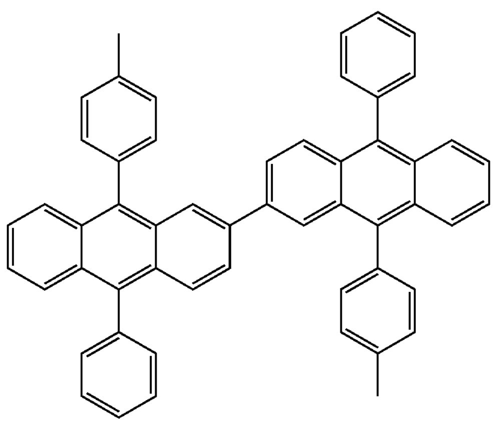
H-32
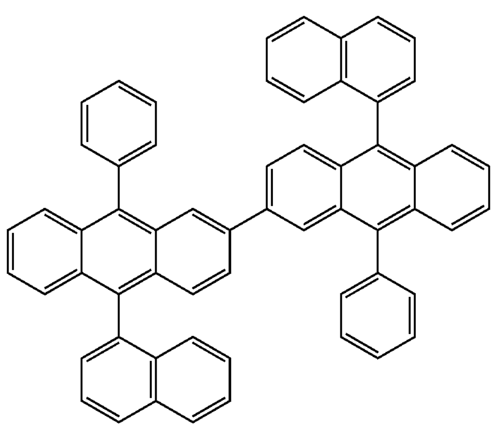

-continued
H-33
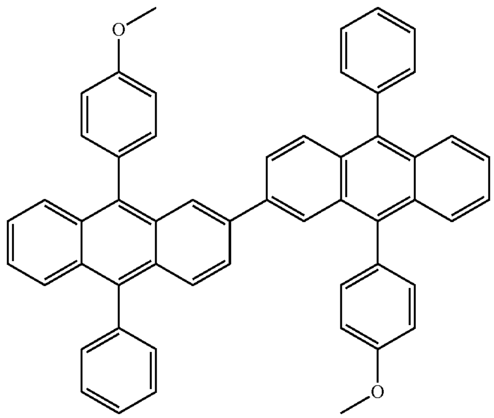
H-34
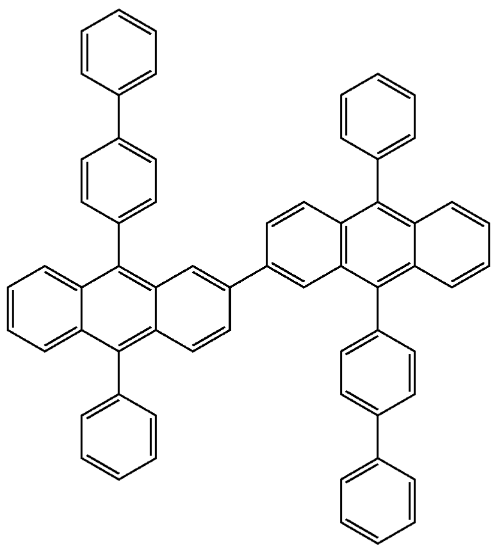
H-35
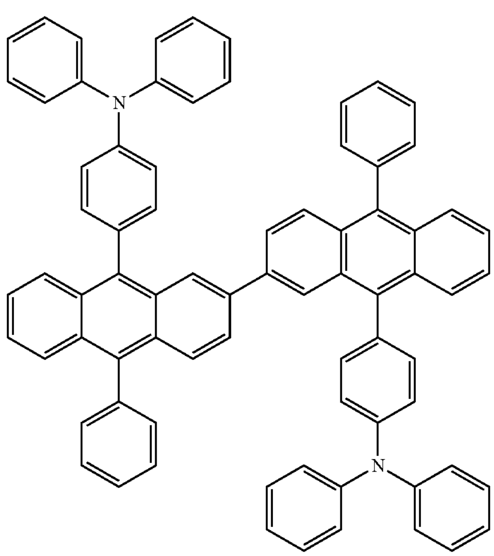

-continued
H-36
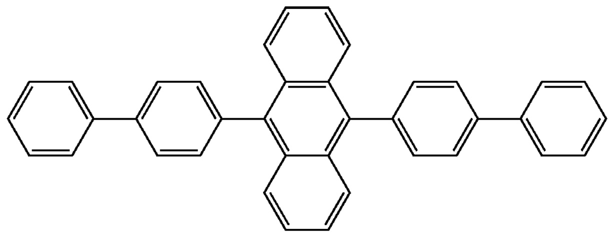
H-37
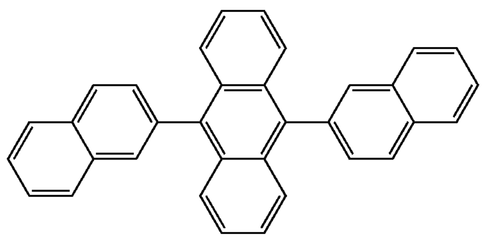
H-38
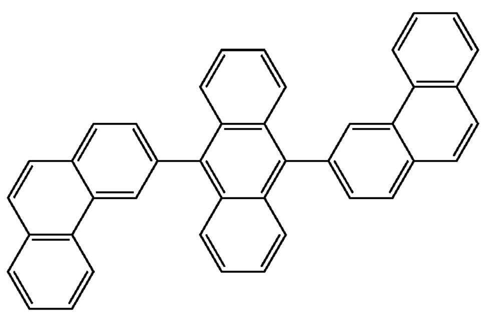
H-39
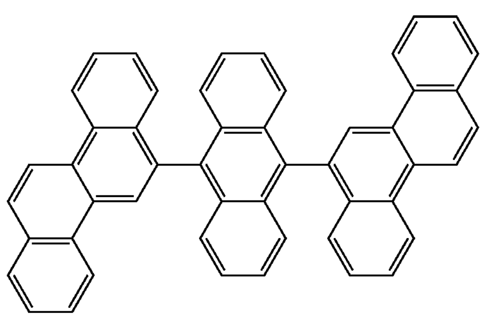
H-40
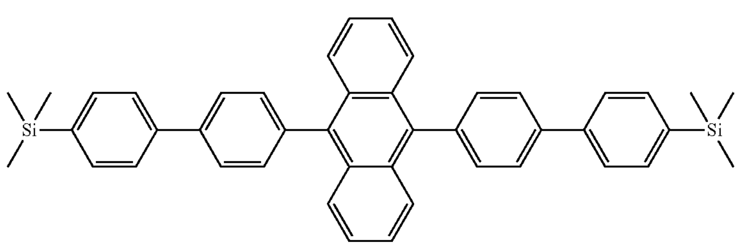

-continued
H-41
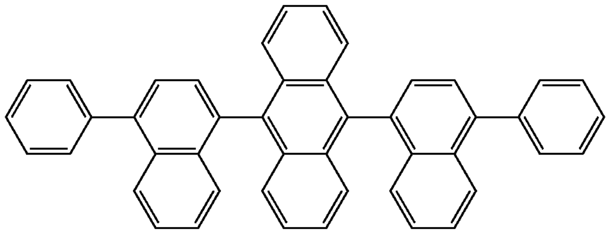
H-42
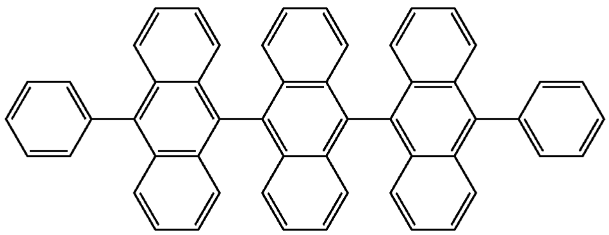
H-43
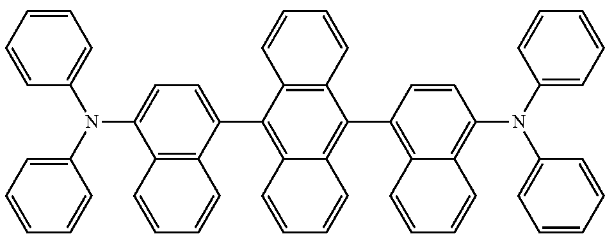
H-44
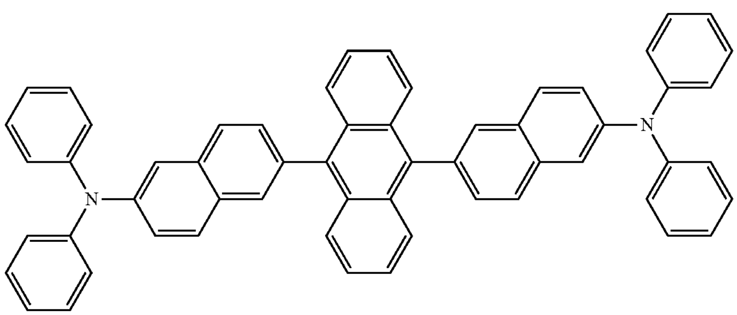
H-45
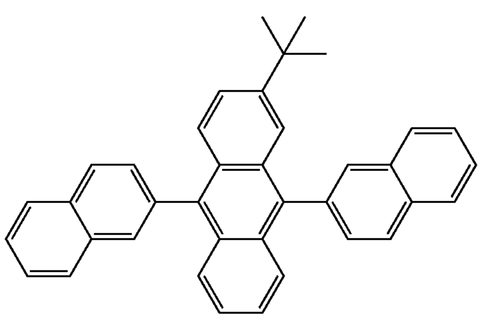

-continued
H-46
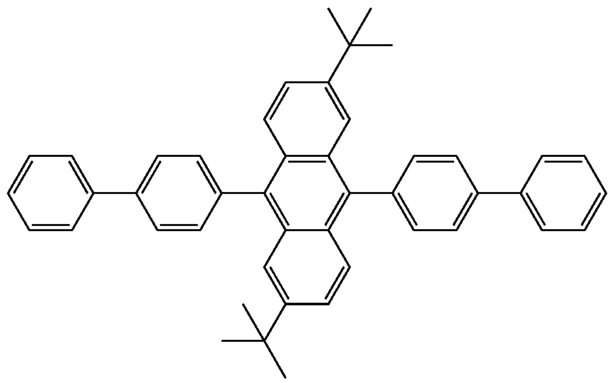
H-47
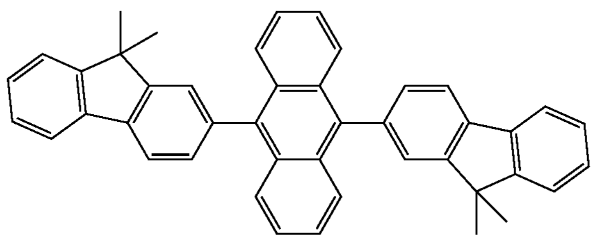
H-48
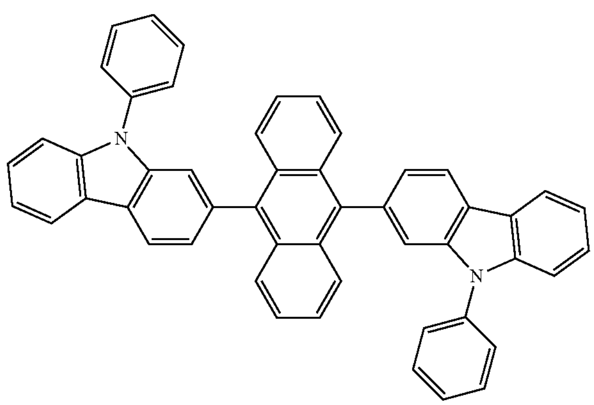
H-49
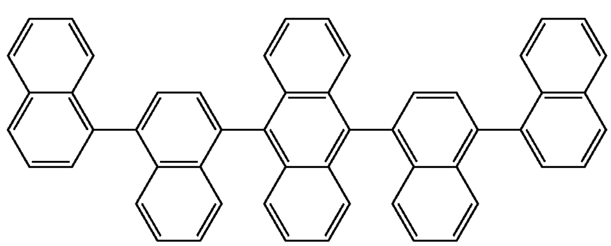

-continued
H-50
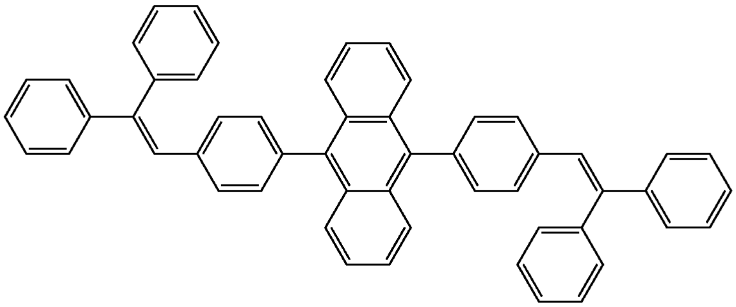
H-51
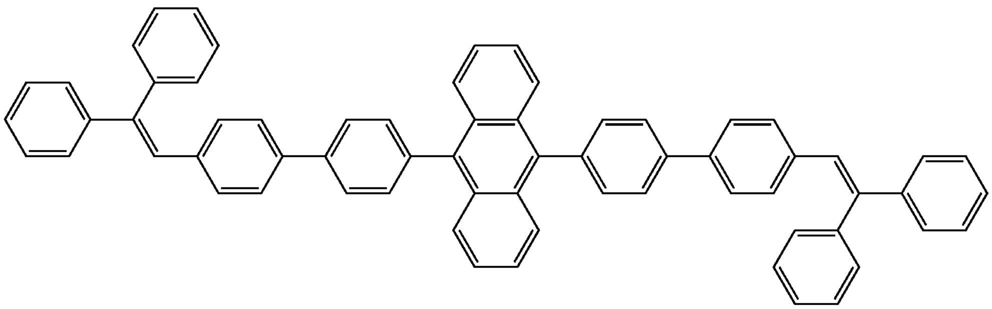
H-52
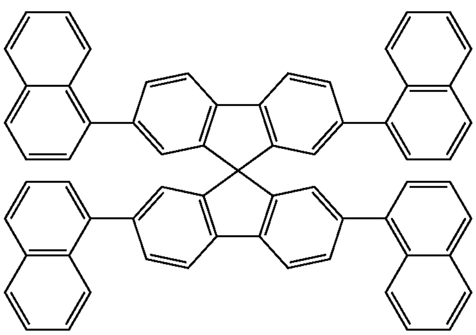
H-53
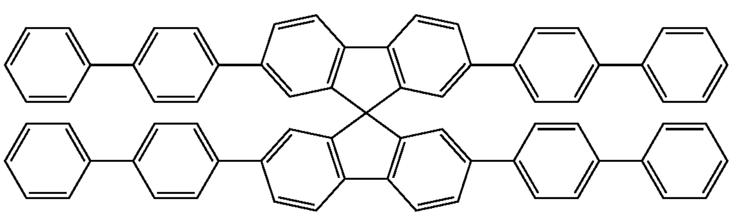
H-54
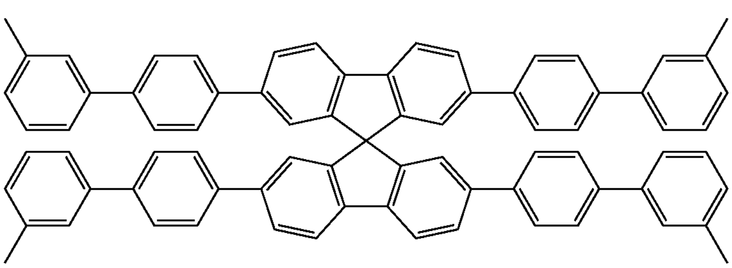

-continued
H-55
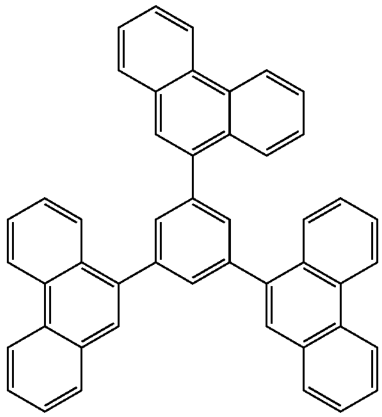
H-56
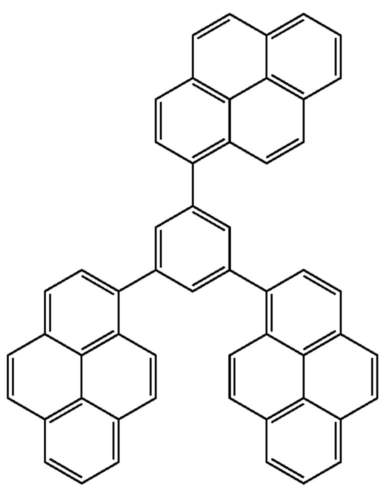
H-57
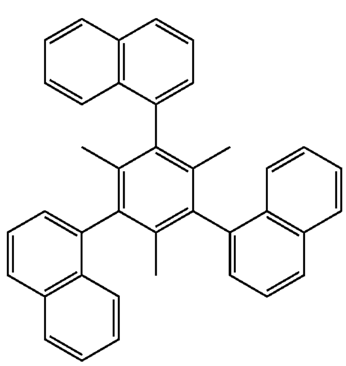

-continued
H-58
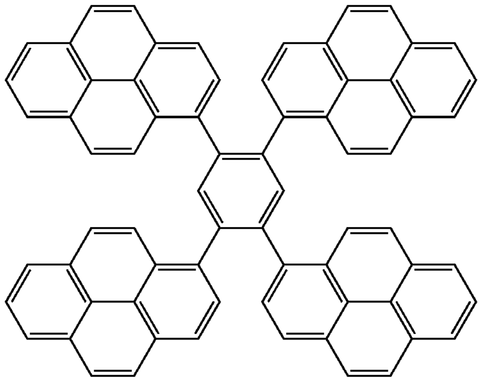
H-59
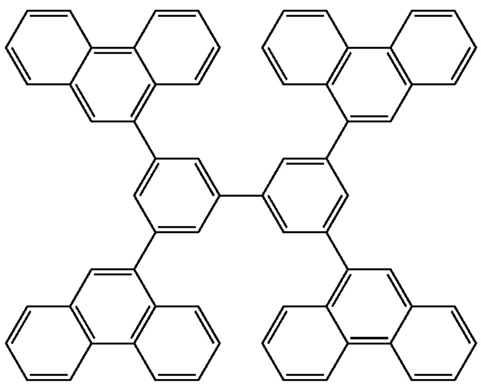
H-60
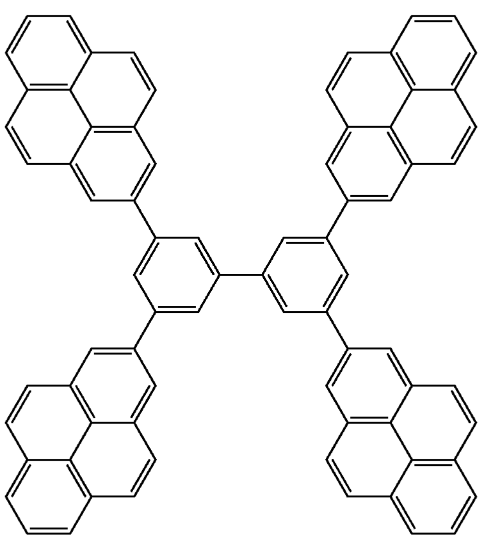

-continued
H-61
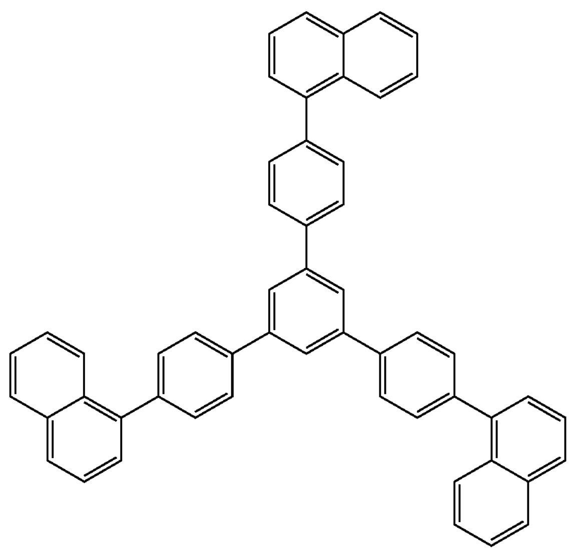
H-62
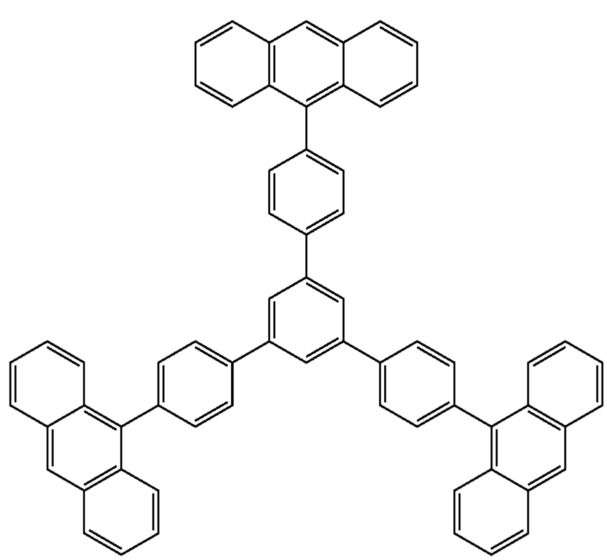

-continued
H-63
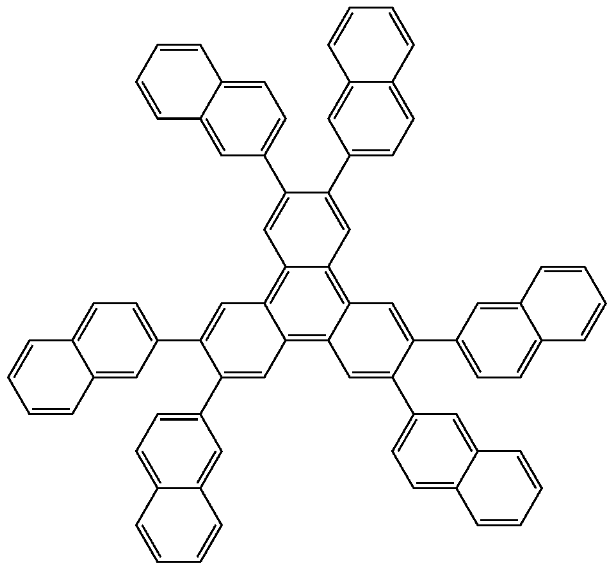
H-64
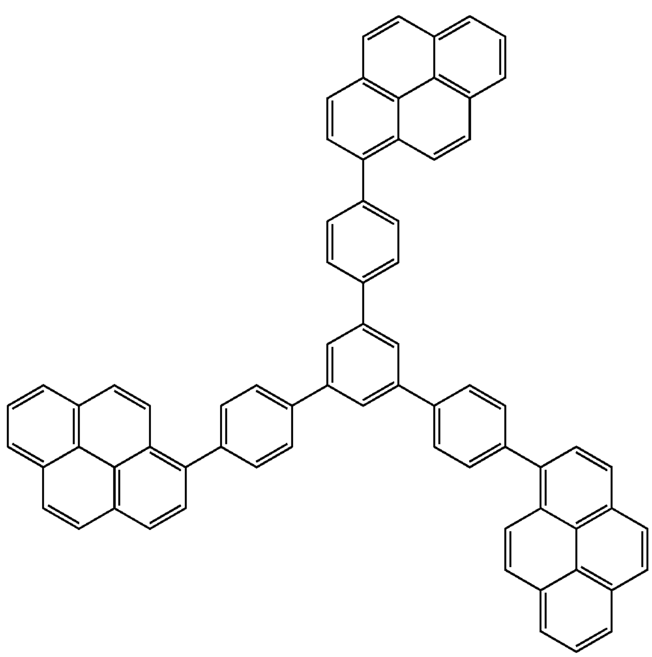

-continued

H-65

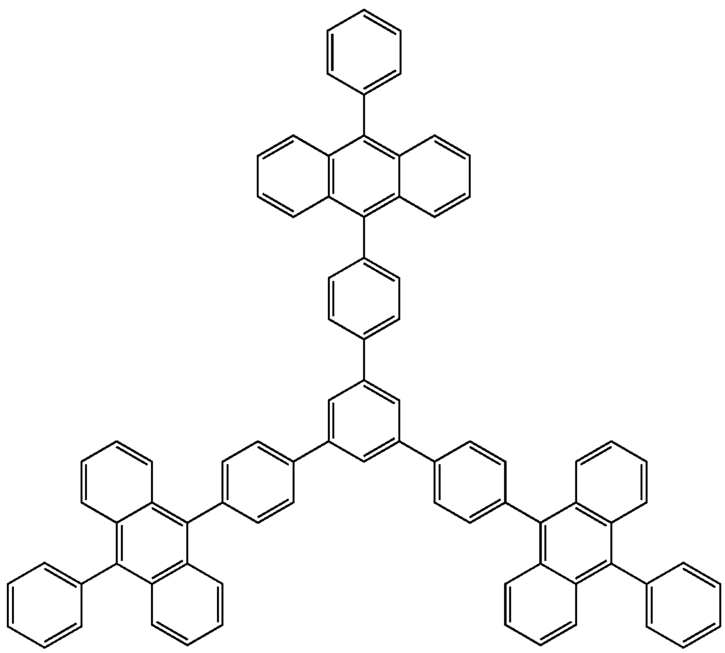

18. The organic light-emitting device of claim 1, wherein the emission layer comprises:

i) the condensed cyclic compound represented by Formula 1; and ii) at least one selected from the first compound represented by Formula 11, the second compound represented by Formula 12, and the third compound represented by Formula 13; and wherein a weight ratio of i) the condensed cyclic compound represented by Formula 1 to ii) the at least one selected from the first compound represented by Formula 11, the second compound represented by Formula 12, and the third compound represented by Formula 13 is in a range of about 1:99 to about 20:80.

19. The organic light-emitting device of claim 1, wherein the first electrode is an anode, the second electrode is a cathode, the organic layer comprises a hole transport region between the first electrode and the emission layer and an electron transport region between the emission layer and the second electrode, the hole transport region comprises at least one selected from a hole injection layer, a hole transport layer, a buffer layer, and an electron blocking layer, and the electron transport region comprises at least one selected from a hole blocking layer, an electron transport layer, and an electron injection layer.

20. The organic light-emitting device of claim 19, wherein the hole transport region comprises the hole transport layer, and the hole transport layer comprises the condensed cyclic compound represented by Formula 1, wherein the condensed cyclic compound comprised in the hole transport layer and the condensed cyclic compound comprised in the emission layer are different from each other.

21. An organic light-emitting device comprising:

a first electrode;

a second electrode facing the first electrode; and an organic layer between the first electrode and the second electrode, the organic layer comprising an emission layer, wherein the organic layer comprises:

i) a condensed cyclic compound represented by Formula 1; and ii) at least one selected from a first compound represented by Formula 11, a second compound represented by Formula 12, and a third compound represented by Formula 13:

Formula 1

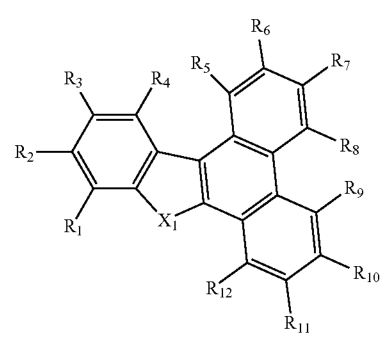

Formula 2

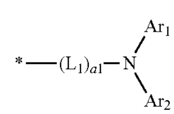

Formula 11

$$R_{301}-L_{301}-An_{1}-(L_{301})_{xb1}-An_{2}-L_{302}-R_{302}$$

Formula 12

$$R_{303}-L_{303}-An_{3}-L_{304}-R_{304}$$

-continued

Formula 13

$$Ar_{311}-[(L_{311})_{xb11}-R_{311}]_{xb20},$$

wherein, in Formulae 1, 2, and 11 to 13, $X_1$ is O or S, $L_1$ is selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{301}$ to $L_{304}$, $L_{310}$, and $L_{311}$ are each independently selected from a substituted or unsubstituted $C_3$-$C_{10}$ cycloalkylene group, a substituted or unsubstituted $C_3$-$C_{10}$ cycloalkenylene group, a substituted or unsubstituted $C_6$-$C_{60}$ arylene group, a substituted or unsubstituted divalent non-aromatic condensed polycyclic group, a substituted or unsubstituted thiophenylene group, a substituted or unsubstituted furanylene group, a substituted or unsubstituted pyrrolylene group, a substituted or unsubstituted benzothiophenylene group, a substituted or unsubstituted benzofuranylene group, a substituted or unsubstituted indolylene group, a substituted or unsubstituted dibenzothiophenylene group, a substituted or unsubstituted dibenzofuranylene group, and a substituted or unsubstituted carbazolylene group, a1, xb1, and xb11 are each independently selected from 0, 1, 2, and 3, wherein when a1 is 2 or more, a plurality of $L_1$(s) are identical to or different from each other, when xb1 is 2 or more, a plurality of $L_{310}$(s) are identical to or different from each other, and when xb11 is 2 or more, a plurality of $L_{311}$(s) are identical to or different from each other, $An_1$ to $An_3$ are each independently a substituted or unsubstituted anthracenylene group, $Ar_{311}$ is selected from a substituted or unsubstituted aromatic ring and a substituted or unsubstituted non-aromatic condensed polycyclic ring, $Ar_1$ and $Ar_2$ are each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, $R_1$ to $R_{12}$ are each independently selected from groups represented by Formula 2, hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, and —$B(Q_4)(Q_5)$, wherein at least one selected from $R_1$ to $R_4$ is represented by Formula 2 and at least one selected from $R_5$ to $R_{12}$ is represented by Formula 2, $R_{301}$ to $R_{304}$, and $R_{311}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted monovalent non-aromatic condensed polycyclic group, a substituted or unsubstituted thiophenyl group, a substituted or unsubstituted furanyl group, a substituted or unsubstituted pyrrolyl group, a substituted or unsubstituted benzothiophenyl group, a substituted or unsubstituted benzofuranyl group, a substituted or unsubstituted indolyl group, a substituted or unsubstituted dibenzothiophenyl group, a substituted or unsubstituted dibenzofuranyl group, a substituted or unsubstituted carbazolyl group, —$Si(Q_1)(Q_2)(Q_3)$, —$B(Q_4)(Q_5)$, and —$N(Q_6)(Q_7)$, xb20 is an integer selected from 1 to 10, and at least one substituent of the substituted anthracenylene group, substituted aromatic ring, substituted non-aromatic condensed polycyclic ring, substituted thiophenylene group, substituted furanylene group, substituted pyrrolylene group, substituted benzothiophenylene group, substituted benzofuranylene group, substituted indolylene group, substituted dibenzothiophenylene group, substituted dibenzofuranylene group, substituted carbazolylene group, substituted thiophenyl group, substituted furanyl group, substituted pyrrolyl group, substituted benzothiophenyl group, substituted benzofuranyl group, substituted indolyl group, substituted dibenzothiophenyl group, substituted dibenzofuranyl group, substituted carbazolyl group, substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group is selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{11})(Q_{12})(Q_{13})$, and —$B(Q_{14})(Q_{15})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{21})(Q_{22})(Q_{23})$, and —$B(Q_{24})(Q_{25})$; and —$Si(Q_{31})(Q_{32})(Q_{33})$ and —$B(Q_{34})(Q_{35})$, wherein $Q_1$ to $Q_7$, $Q_{11}$ to $Q_{15}$, $Q_{21}$ to $Q_{25}$, and $Q_{31}$ to $Q_{35}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

22. An organic light-emitting device comprising:

a first electrode;

a second electrode facing the first electrode; and an organic layer between the first electrode and the second electrode, the organic layer comprising an emission layer, wherein the emission layer comprises:

i) a condensed cyclic compound represented by Formula 1; and ii) at least one selected from a first compound represented by Formula 11, a second compound represented by Formula 12, and a third compound represented by Formula 13:

Formula 1

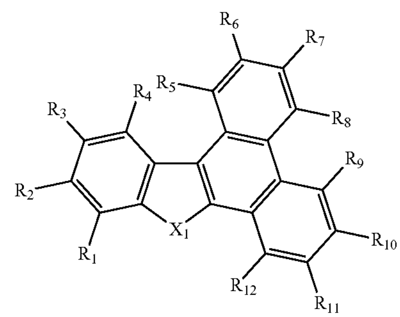

Formula 2

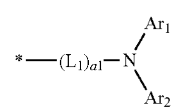

Formula 11

$$R_{301}—L_{301}—An_1—(L_{310})_{xb1}—An_2—L_{302}—R_{302}$$

Formula 12

$$R_{303}—L_{303}—An_3—L_{304}—R_{304}$$

Formula 13

$$Ar_{311}—[(L_{311})_{xb11}—R_{311}]_{xb20},$$

wherein, in Formulae 1, 2, and 11 to 13, $X_1$ is O or S, $L_1$ is selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{301}$ to $L_{304}$, $L_{310}$, and $L_{311}$ are each independently selected from a substituted or unsubstituted $C_3$-$C_{10}$ cycloalkylene group, a substituted or unsubstituted $C_3$-$C_{10}$ cycloalkenylene group, a substituted or unsubstituted $C_6$-$C_{60}$ arylene group, a substituted or unsubstituted divalent non-aromatic condensed polycyclic group, a substituted or unsubstituted thiophenylene group, a substituted or unsubstituted furanylene group, a substituted or unsubstituted pyrrolylene group, a substituted or unsubstituted benzothiophenylene group, a substituted or unsubstituted benzofuranylene group, a substituted or unsubstituted indolylene group, a substituted or unsubstituted dibenzothiophenylene group, a substituted or unsubstituted dibenzofuranylene group, and a substituted or unsubstituted carbazolylene group, a1, xb1, and xb11 are each independently selected from 0, 1, 2, and 3, wherein when a1 is 2 or more, a plurality of $L_1$(s) are identical to or different from each other, when xb1 is 2 or more, a plurality of $L_{310}$(s) are identical to or different from each other, and when xb11 is 2 or more, a plurality of $L_{311}$(s) are identical to or different from each other, $An_1$ to $An_3$ are each independently a substituted or unsubstituted anthracenylene group, $Ar_{311}$ is selected from a substituted or unsubstituted aromatic ring and a substituted or unsubstituted non-aromatic condensed polycyclic ring, $Ar_1$ and $Ar_2$ are each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, $R_1$ to $R_{12}$ are each independently selected from groups represented by Formula 2, hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), and —B($Q_4$)($Q_5$), wherein at least two selected from $R_1$ to $R_{12}$ are each independently a group represented by Formula 2, $R_{301}$ to $R_{304}$, and $R_{311}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted monovalent non-aromatic condensed polycyclic group, a substituted or unsubstituted thiophenyl group, a substituted or unsubstituted furanyl group, a substituted or unsubstituted pyrrolyl group, a substituted or unsubstituted benzothiophenyl group, a substituted or unsubstituted benzofuranyl group, a substituted or unsubstituted indolyl group, a substituted or unsubstituted dibenzothiophenyl group, a substituted or unsubstituted dibenzofuranyl group, a substituted or unsubstituted carbazolyl group, —Si($Q_1$)($Q_2$)($Q_3$), —B($Q_4$)($Q_5$), and —N($Q_6$)($Q_7$), xb20 is an integer selected from 1 to 10, and at least one substituent of the substituted anthracenylene group, substituted aromatic ring, substituted non-aromatic condensed polycyclic ring, substituted thiophenylene group, substituted furanylene group, substituted pyrrolylene group, substituted benzothiophenylene group, substituted benzofuranylene group, substituted indolylene group, substituted dibenzothiophenylene group, substituted dibenzofuranylene group, substituted carbazolylene group, substituted thiophenyl group, substituted furanyl group, substituted pyrrolyl group, substituted benzothiophenyl group, substituted benzofuranyl group, substituted indolyl group, substituted dibenzothiophenyl group, substituted dibenzofuranyl group, substituted carbazolyl group, substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group is selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), and —B($Q_{14}$)($Q_{15}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), and —B($Q_{24}$)($Q_{25}$); and —Si($Q_{31}$)($Q_{32}$)($Q_{33}$) and —B($Q_{34}$)($Q_{35}$), wherein $Q_1$ to $Q_7$, $Q_{11}$ to $Q_{15}$, $Q_{21}$ to $Q_{25}$, and $Q_{31}$ to $Q_{35}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

* * * * *